US012428600B2

(12) United States Patent
Oh et al.

(10) Patent No.: US 12,428,600 B2
(45) Date of Patent: Sep. 30, 2025

(54) LIGHT-EMITTING DEVICE INCLUDING FUSED-CYCLIC COMPOUND AND ELECTRONIC APPARATUS INCLUDING THE SAME

(71) Applicant: Samsung Display Co., Ltd., Yongin-si (KR)

(72) Inventors: Chanseok Oh, Yongin-si (KR); Seran Kim, Yongin-si (KR); Taeil Kim, Yongin-si (KR); Sunyoung Pak, Yongin-si (KR); Junha Park, Yongin-si (KR); Jangyeol Baek, Yongin-si (KR); Kyoung Sunwoo, Yongin-si (KR); Munki Sim, Yongin-si (KR); Minjung Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 807 days.

(21) Appl. No.: 17/673,713

(22) Filed: Feb. 16, 2022

(65) Prior Publication Data

US 2022/0271228 A1 Aug. 25, 2022

(30) Foreign Application Priority Data

Feb. 17, 2021 (KR) ........................ 10-2021-0021310

(51) Int. Cl.

*H01L 51/50* (2006.01)
*C07F 5/02* (2006.01)

(Continued)

(52) U.S. Cl.

CPC .............. *C09K 11/06* (2013.01); *C07F 5/027* (2013.01); *H10K 59/12* (2023.02); *H10K 85/322* (2023.02);

(Continued)

(58) Field of Classification Search

None

See application file for complete search history.

(56) References Cited

U.S. PATENT DOCUMENTS

2020/0058885 A1 2/2020 Hong et al.
2020/0144513 A1 5/2020 Hatakeyama et al.
2020/0190115 A1 6/2020 Hatakeyama et al.

FOREIGN PATENT DOCUMENTS

KR 10-2016-0119683 10/2016
KR 10-2018-0122298 11/2018

(Continued)

OTHER PUBLICATIONS

Pershin, Anton, et al. "Highly Emissive Excitons with Reduced Exchange Energy in Thermally Activated Delayed Fluorescent Molecules." Nature Communications, vol. 10, No. 1, 2019.

*Primary Examiner* — Gregory D Clark

(74) *Attorney, Agent, or Firm* — Womble Bond Dickinson (US) LLP

(57) ABSTRACT

A light-emitting device includes: a first electrode; a second electrode facing the first electrode, and an interlayer between the first electrode and the second electrode and including an emission layer, and at least one fused cyclic compound of Formula 1:

(Continued)

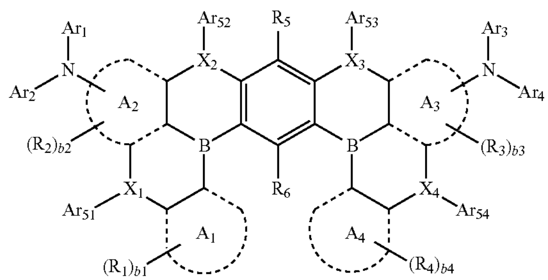

wherein, in Formula 1, the variables are defined herein.

20 Claims, 3 Drawing Sheets

(51) Int. Cl.

| | |
|---|---|
| ***C09K 11/06*** | (2006.01) |
| ***H10K 59/12*** | (2023.01) |
| ***H10K 85/30*** | (2023.01) |
| ***H10K 85/60*** | (2023.01) |
| *H10K 50/11* | (2023.01) |
| *H10K 101/10* | (2023.01) |
| *H10K 101/20* | (2023.01) |
| *H10K 101/30* | (2023.01) |

(52) U.S. Cl.

CPC .... *H10K 85/658* (2023.02); *C09K 2211/1018* (2013.01); *H10K 50/11* (2023.02); *H10K 2101/10* (2023.02); *H10K 2101/20* (2023.02); *H10K 2101/30* (2023.02)

(56) References Cited

FOREIGN PATENT DOCUMENTS

| | | | |
|---|---|---|---|
| KR | 10-2058028 | 12/2019 | |
| KR | 10-2020-0004248 | 1/2020 | |
| KR | 10-2020-0006965 | 1/2020 | |
| WO | 2018212169 | 11/2018 | |
| WO | WO 2020040298 A1 * | 2/2020 | ............. H02L 51/50 |

* cited by examiner

LIGHT-EMITTING DEVICE INCLUDING FUSED-CYCLIC COMPOUND AND ELECTRONIC APPARATUS INCLUDING THE SAME

CROSS-REFERENCE TO RELATED APPLICATION

This application claims priority from and the benefit of Korean Patent Application No. 10-2021-0021310, filed on Feb. 17, 2021, which is hereby incorporated by reference for all purposes as if fully set forth herein BACKGROUND

FIELD

Embodiments of the invention relate generally to display devices, and more particularly, to a light-emitting device including a fused cyclic compound and an electronic apparatus including the same.

DISCUSSION OF THE BACKGROUND

One type of light-emitting devices, a self-emissive device has, in addition to a wide viewing angle and a high contrast ratio, a short response time and excellent characteristics in terms of luminance, driving voltage, and response speed.

In light-emitting devices, a first electrode is located on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transet from an excited state to a ground state to thereby generate light.

The above information disclosed in this Background section is only for understanding of the background of the inventive concepts, and, therefore, it may contain information that does not constitute prior art.

SUMMARY

Light-emitting devices and electronic apparatuses constructed according to the principles and illustrative implementations of the invention include a fused cyclic compound and have high efficiency and long lifespan. Although not wanting to be bound by theory, it is believed that because fused cyclic compounds made according to the principles and embodiments of the invention have high stability and can have improved delayed fluorescent characteristics, a light-emitting device including such a fused cyclic compound can have high efficiency and long lifespan.

Additional features of the inventive concepts will be set forth in the description which follows, and in part will be apparent from the description, or may be learned by practice of the inventive concepts.

According to one aspect of the invention, a light-emitting device includes: a first electrode; a second electrode facing the first electrode, and an interlayer between the first electrode and the second electrode and including an emission layer, and at least one fused cyclic compound of Formula 1:

Formula 1

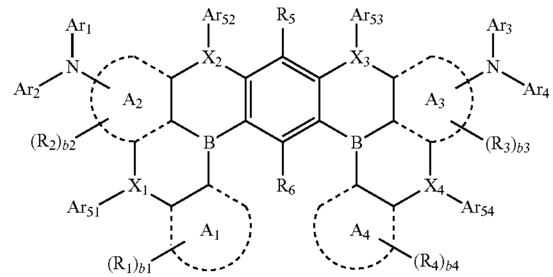

2A

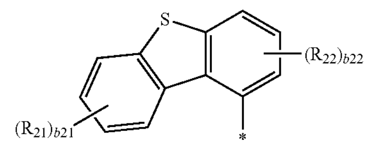

2B

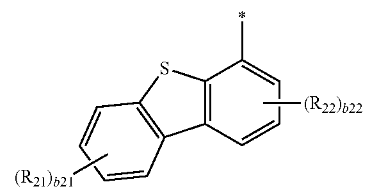

wherein, in Formulae 1, 2A, and 2B, the variables are defined herein.

The emission layer may include the at least one fused cyclic compound of Formula 1.

The emission layer may include a host and a dopant, an amount of the host in the emission layer may be greater than an amount of the dopant in the emission layer, and the dopant may include the at least one fused cyclic compound of Formula 1.

The at least one fused cyclic compound of Formula 1 may include a thermally activated delayed fluorescence emitter.

The emission layer may be configured to emit blue light having a maximum emission wavelength of about 410 nm to about 480 nm.

The first electrode may include an anode, the second electrode may include a cathode, the interlayer, may further include a hole transport region between the first electrode and the emission layer and an electron transport region between the emission layer and the second electrode, the hole transport region may include a hole injection layer, a hole transport layer, an emission auxiliary layer, an electron-blocking layer, or any combination thereof, and the electron transport region may include a buffer layer, an electron control layer, a hole-blocking layer, an electron transport layer, an electron injection layer, or any combination thereof.

The first electrode may include an anode, the second electrode may include a cathode, the interlayer may further include a hole transport region between the first electrode and the emission layer, the hole transport region may include a compound of Formula 201, a compound of Formula 202, or any combination thereof, the emission layer may include the at least one fused cyclic compound of Formula 1:

Formula 201

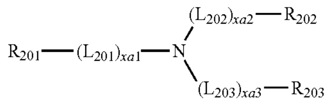

Formula 202

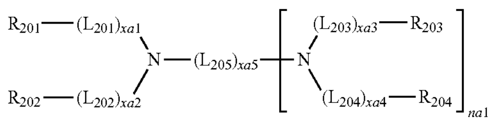

wherein, in Formulae 201 and 202, the variables may be as defined herein.

In Formula 1, each of the variables $X_1$ to $X_4$ may be as defined herein.

Each of ring $A_1$ to ring $A_4$ in Formula 1 may be a benzene group.

The at least one fused cyclic compound of Formula 1 may include any two, three, four, five, or six groups of at least one of Formula 2A and Formula 2B.

In Formula 1, the variables $Ar_1$ or $Ar_2$ may be a group of Formula 2A or 2B, and the variables $Ar_3$ or $Ar_4$ may be a group of Formula 2A or 2B, as defined herein.

The variables $Ar_1$ to $Ar_4$ and $Ar_{51}$ to $Ar_{54}$ in Formula 1 may each, independently from one another, be a group of one of Formulae 2A, 2B, and 5-1 to 5-17, as defined herein.

The variables $Ar_1$ to $Ar_4$ and $Ar_{51}$ to $Ar_{54}$ in Formula 1 may each, independently from one another, be a group of one of Formulae 2A-1, 2B-1, and 6-1 to 6-22, and at least two of $Ar_1$ to $Ar_4$ and $Ar_{51}$ to $Ar_{54}$ may each, independently from one another, be a group of Formula 2A-1 or 2B-1, as defined herein.

The variables $Ar_1$ to $Ar_4$ and $Ar_{51}$ to $Ar_{54}$ in Formula 1 may each, independently from one another, be a group of one of Formulae 2A-1, 2B-1, and 7-1 to 7-3, and at least two of $Ar_1$ to $Ar_4$ and $Ar_{51}$ to $Ar_{54}$ may each, independently from one another, be a group of Formula 2A-1 or 2B-1, as defined herein.

The variables $R_1$ to $R_6$ in Formula 1 may each be hydrogen.

The at least one fused cyclic compound of Formula 1 is of Formula 1-1:

Formula 1-1

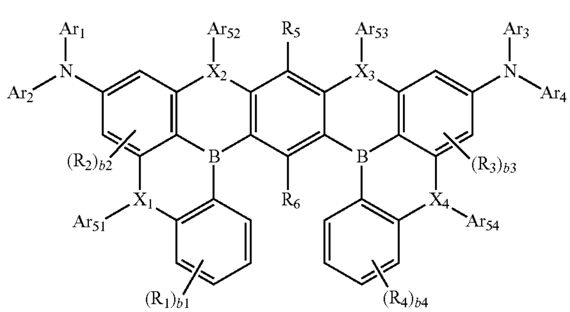

wherein, in Formula 1-1, the variables are defined herein.

The at least one fused cyclic compound of Formula 1 is of one of Formulae 1-1A to 1-1E:

1-1A

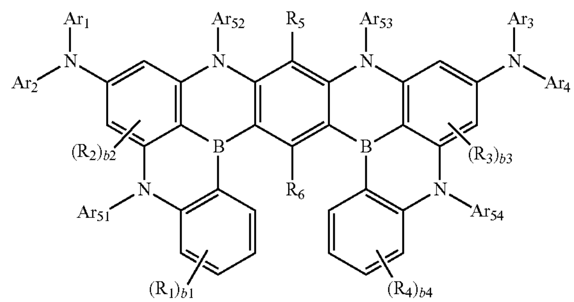

1-1B

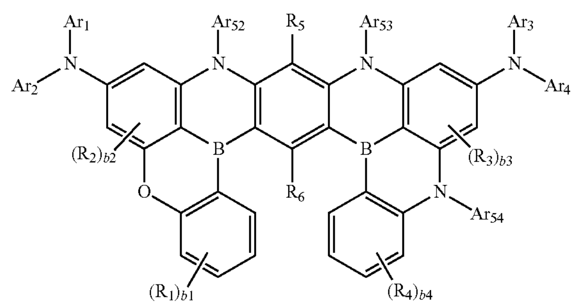

1-1C

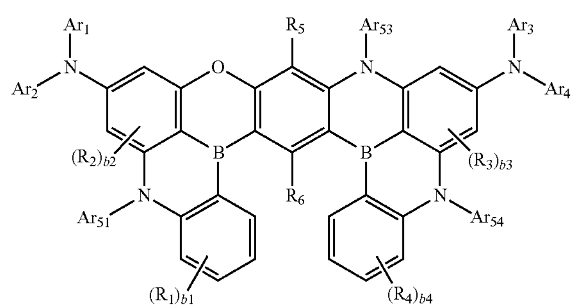

1-1D

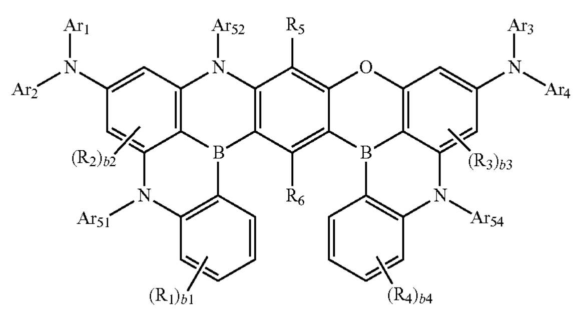

1-1E

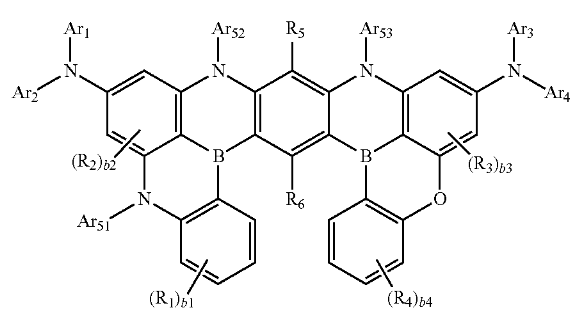

wherein, in Formulae 1-1A to 1-1E, the variables are defined herein.

The at least one fused cyclic compound of Formula 1 may be one of the following Compounds, as defined herein.

An electronic apparatus may include the light-emitting device as disclosed above.

The electronic apparatus may further include a color filter, a color conversion layer, a touch screen layer, a polarizing layer, or any combination thereof.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
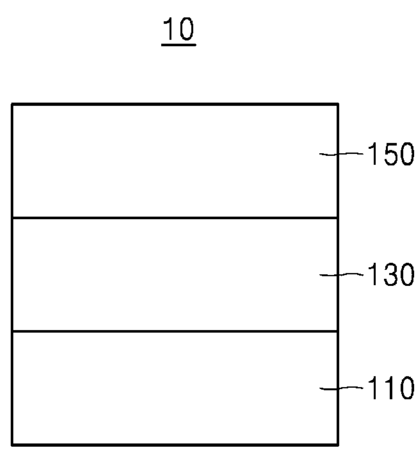
FIG. 1 is a schematic cross-sectional view of an embodiment of a light-emitting device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be per formed substantially at the same time or performed in an order opposite to the described or der. Also, like reference numerals denote like elements, and redundant explanations are omit ted to avoid redundancy.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A fused cyclic compound according to an embodiment may be represented by Formula 1:

Formula 1

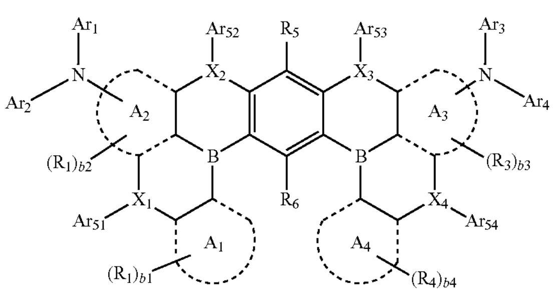

2A

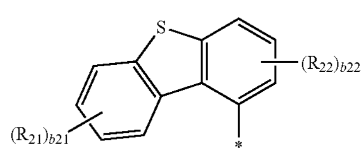

2B

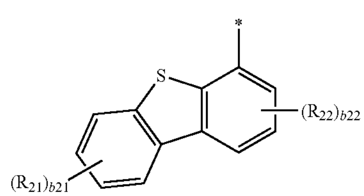

$X_1$ to $X_4$ in Formula 1 may each independently be N, O, S, or Se, provided that at least one of $X_1$ to $X_4$ is N.

When $X_1$ to $X_4$ is O, S, or Se, $Ar_{51}$, $Ar_{52}$, $Ar_{53}$ and $Ar_{54}$ may not exist, when $Ar_{51}$ is present, $X_1$ may be N, when $Ar_{52}$ is present, $X_2$ may be N, and when $Ar_{53}$ is present, $X_3$ may be N, and when $Ar_{54}$ is present, $X_4$ may be N.

In an embodiment, each of $X_1$ to $X_4$ in Formula 1 may be N, $X_1$ may be O and each of $X_2$ to $X_4$ may be N, $X_2$ may be O and each of $X_1$, $X_3$, and $X_4$ may be N, $X_3$ may be O and each of $X_1$, $X_2$, and $X_4$ may be N, and $X_4$ may be O and each of $X_1$ to $X_3$ may be N. Ring $A_1$ to ring $A_4$ in Formula 1 may each independently be a $C_5$-$C_{20}$ carbocyclic group or a $C_1$-$C_{20}$ heterocyclic group. For example, ring $A_1$ to ring $A_4$ may each independently be a benzene group, a naphthalene group, a pyridine group, a pyrimidine group, a pyridazine group, or a pyrazine group. In an embodiment, ring $A_1$ to ring $A_4$ may each be a benzene group, but embodiments are not limited thereto.

$Ar_1$ to $Ar_4$ and $Ar_{51}$ to $Ar_{54}$ in Formula 1 may each independently be a group represented by Formula 2A, a group represented by Formula 2B, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, provided that at least two of $Ar_1$ to $Ar_4$ and $Ar_{51}$ to $Ar_{54}$ may each independently be a group represented by Formula 2A or Formula 2B.

In an embodiment, the fused cyclic compound represented by Formula 1 may include any two, three, four, five, or six groups selected from groups represented by Formula 2A and groups represented by Formula 2B. For example, i) $Ar_1$ or $Ar_2$ may be a group represented by Formula 2A or 2B, and $Ar_3$ or $Ar_4$ may be a group represented by Formula 2A or 2B, ii) two of $Ar_{51}$ to $Ar_{54}$ may each independently be a group represented by Formula 2A or 2B, iii) three of $Ar_{51}$ to $Ar_{54}$ may each independently be a group represented by Formula 2A or 2B, iv) one of $Ar_1$ to $Ar_4$ may be a group represented by Formula 2A or 2B, and one of $Ar_{51}$ to $Ar_{54}$ may be a group represented by Formula 2A or 2B, v) one of $Ar_1$ to $Ar_4$ may be a group represented by Formula 2A or 2B, and two of $Ar_{51}$ to $Ar_{54}$ may each independently be a group represented by Formula 2A or 2B, vi) one of $Ar_1$ to $Ar_4$ may be a group represented by Formula 2A or 2B, and three of $Ar_{51}$ to $Ar_{54}$ may each independently be a group represented by Formula 2A or 2B, vii) one of $Ar_1$ to $Ar_4$ may be a group represented by Formula 2A or 2B, and $Ar_{51}$ to $Ar_{54}$ may each independently be a group represented by Formula 2A or 2B, viii) $Ar_1$ or $Ar_2$ may be a group represented by Formula 2A or 2B, $Ar_3$ or $Ar_4$ may be a group represented by Formula 2A or 2B, and one of $Ar_{51}$ to $Ar_{54}$ may be a group represented by Formula 2A or 2B, ix) $Ar_1$ or $Ar_2$ may be a group represented by Formula 2A or 2B, $Ar_3$ or $Ar_4$ may be a group represented by Formula 2A or 2B, and two of $Ar_{51}$ to $Ar_{54}$ may each independently be a group represented by Formula 2A or 2B, x) $Ar_1$ or $Ar_2$ may be a group represented by Formula 2A or 2B, $Ar_3$ or $Ar_4$ may be a group represented by Formula 2A or 2B, and three of $Ar_{51}$ to $Ar_{54}$ may each independently be a group represented by Formula 2A or 2B, or xi) $Ar_1$ or $Ar_2$ may be a group represented by Formula 2A or 2B, $Ar_3$ or $Ar_4$ may be a group represented by Formula 2A or 2B, and $Ar_{51}$ to $Ar_{54}$ may each independently be a group represented by Formula 2A or 2B.

In an embodiment, $Ar_1$ to $Ar_4$ and $Ar_{51}$ to $Ar_{54}$ may each independently be: a group represented by Formula 2A, or a group represented by Formula 2B; or a cyclopentyl group, a cyclohexyl group, a cycloheptyl group, an adamantyl group, a norbornyl group, a norbornenyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thienyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothienyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothienyl group, a dibenzosilolyl group, a benzocarbazolyl group, a naphthobenzofuranyl group, a naphthobenzothienyl group, a naphthobenzosilolyl group, a dibenzocarbazolyl group, a dinaphthofuranyl group, a dinaphthothienyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothienyl group, an azadibenzosilolyl group, an indenopyrrolyl group, an indolopyrrolyl group, an indenocarbazolyl group, or an indolocarbazolyl group, unsubstituted or substituted with deuterium, —F, —Cl, —Br, —I, $—CH_2D$, $—CHD_2$, $—CD_3$, $—CH_2F$, $—CHF_2$, $—CF_3$, a hydroxyl group, a cyano group, a nitro group, a $C_1$-$C_{60}$ alkyl group, a $C_1$-$C_{60}$ alkoxy group, a cyclopentyl group, a cyclohexyl group, a cycloheptyl group, an adamantyl group, a norbornyl group, a norbornenyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thienyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothienyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothienyl group, a dibenzosilolyl group, a benzocarbazolyl group, a naphthobenzofuranyl group, a naphthobenzothienyl group, a naphthobenzosilolyl group, a dibenzocarbazolyl group, a dinaphtho furanyl group, a dinaphtho thienyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothienyl group, an azadibenzosilolyl group, an indenopyrrolyl group, an indolopyrrolyl group, an indenocarbazolyl group, an indolocarbazolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, wherein $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

For example, $Ar_1$ to $Ar_4$ and $Ar_{51}$ to $Ar_{54}$ may each independently be a group represented by one of Formulae 2A, 2B, and 5-1 to 5-17:

5-1

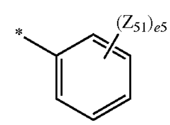

5-2

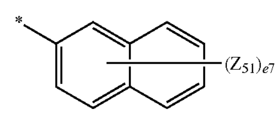

5-3

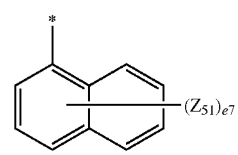

5-4

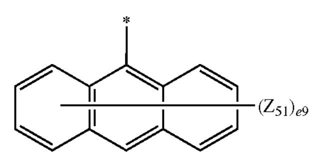

5-5

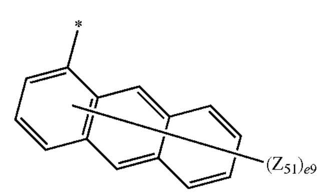

5-6

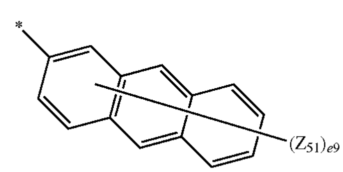

-continued 5-7

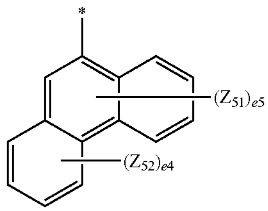

5-8

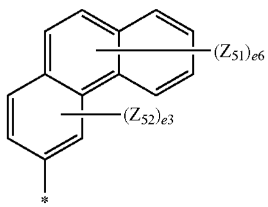

5-9

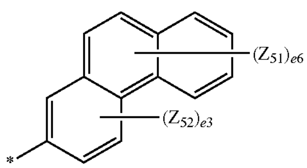

5-10

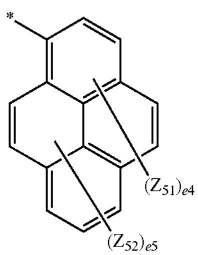

5-11

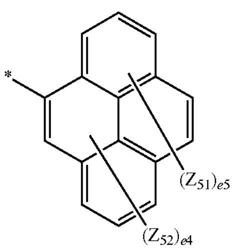

5-12

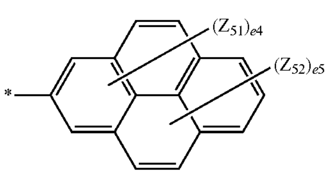

5-13

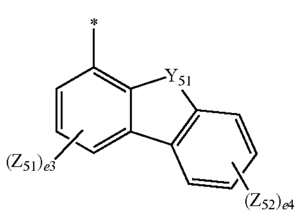

-continued 5-14

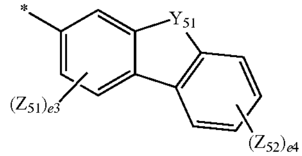

5-15

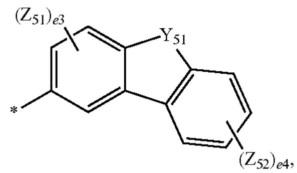

5-16

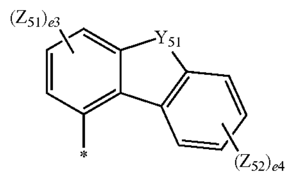

5-17

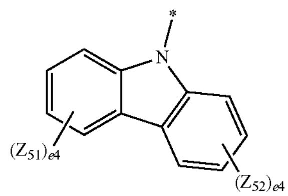

wherein, in Formulae 5-1 to 5-17, $Y_{51}$ may be O, $N(Z_{53})$, $C(Z_{54})(Z_{55})$, or $Si(Z_{56})(Z_{57})$, $Z_{51}$ to $Z_{57}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a pyridinyl group, a pyrazinyl group, a pyrimidinyl group, a pyridazinyl group, a triazinyl group, an isoquinolinyl group, a benzimidazolyl group, a dibenzosilolyl group, a dibenzofuranyl group, a dibenzothienyl group, a carbazolyl group, a quinolinyl group, $—Si(Q_{31})(Q_{32})(Q_{33})$, $—N(Q_{31})(Q_{32})$, or $—B(Q_{31})(Q_{32})$, e3 may be an integer from 1 to 3, e4 may be an integer from 1 to 4, e5 may be an integer from 1 to 5, e6 may be an integer from 1 to 6, e7 may be an integer from 1 to 7, e9 may be an integer from 1 to 9, $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group, and

* indicates a binding site to a neighboring atom.

In one or more embodiments, $Ar_1$ to $Ar_4$ and $Ar_{51}$ to $Ar_{54}$ may each independently be a group represented by one of Formulae 2A-1, 2B-1 and 6-1 to 6-22, and at least two of $Ar_1$ to $Ar_4$ and $Ar_{51}$ to $Ar_{54}$ may each independently be a group represented by Formula 2A-1 or 2B-1:

2A-1
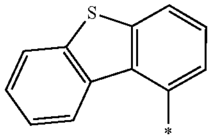
2B-1
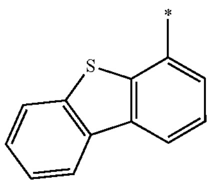
6-1
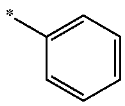
6-2
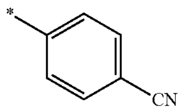
6-3
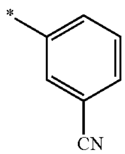
6-4
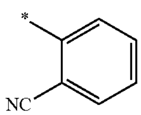
6-5
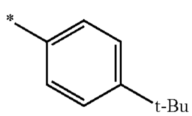
6-6
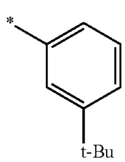
6-7
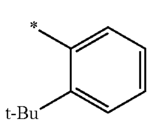
6-8
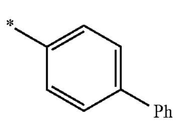
6-9
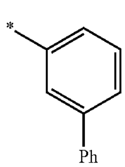
-continued
6-10
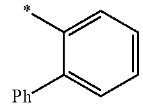
6-11
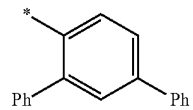
6-12
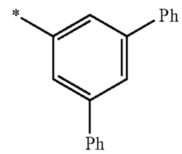
6-13
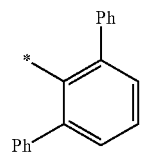
6-14
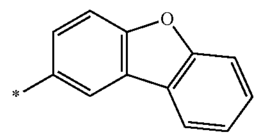
6-15
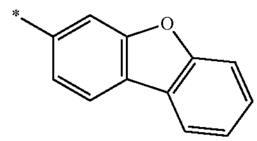
6-16
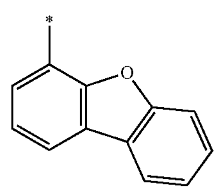
6-17
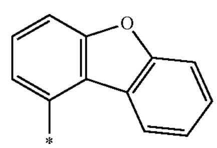
6-18
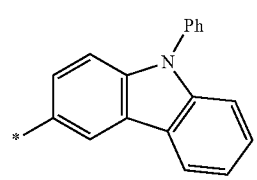
6-19
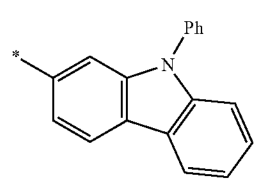

-continued 6-20

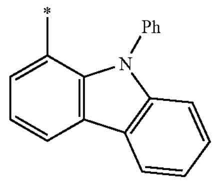

6-21

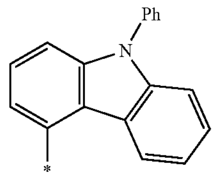

6-22

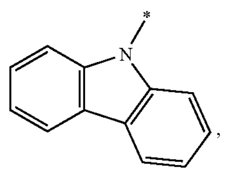

wherein, in Formulae 2A-1, 2B-1 and 6-1 to 6-22, t-Bu may be a tert-butyl group, Ph may be a phenyl group, and

* indicates a binding site to a neighboring atom.

In an embodiment, $Ar_1$ to $Ar_4$ and $Ar_{51}$ to $Ar_{54}$ may each independently be a group represented by one of Formulae 2A-1, 2B-1 and 7-1 to 7-3, and at least two of $Ar_1$ to $Ar_4$ and $Ar_{51}$ to $Ar_{54}$ may each independently be a group represented by Formula 2A-1 or 2B-1:

2A-1

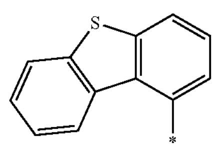

2B-1

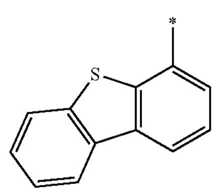

7-1

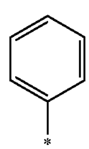

7-2

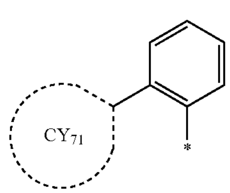

-continued 7-3

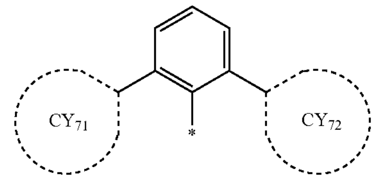

wherein, in Formulae 2A-1, 2B-1 and 7-1 to 7-3, $CY_{71}$ and $CY_{72}$ may each independently be a $C_3$-$C_{20}$carbocyclic group unsubstituted or substituted with at least one $R_{10a}$ or a $C_1$-$C_{20}$ heterocyclic group unsubstituted or substituted with at least one $R_{10a}$, and * indicates a binding site to a neighboring atom. For example, $CY_{71}$ and $CY_{72}$ in Formula 7-2 and 7-3 may each independently be a benzene group, a naphthalene group, a pyridine group, a pyrimidine group, a pyridazine group, a pyrazine group, or a triazine group.

The variables $R_1$ to $R_6$, $R_{21}$, and $R_{22}$ in Formulae 1, 2A and 2B may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b1 to b4 may each independently be an integer from 1 to 10, b21 may be an integer from 1 to 4, and b22 may be an integer from 1 to 3.

For example, $R_1$ to $R_6$, $R_{21}$, and $R_{22}$ may each independently be:

hydrogen, deuterium, —F, —Cl, —Br, —I, —$CH_2D$, —$CHD_2$, —$CD_3$, —$CH_2F$, —$CHF_2$, —$CF_3$, a hydroxyl group, a cyano group, or a nitro group;

a $C_1$-$C_{60}$ alkyl group or a $C_1$-$C_{60}$ alkoxy group, unsubstituted or substituted with deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, a cyclopentyl group, a cyclohexyl group, a cycloheptyl group, an adamantyl group, a norbornyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof, a cyclopentyl group, a cyclohexyl group, a cycloheptyl group, an adamantyl group, a norbornyl group, a norbornenyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thienyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothienyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothienyl group, a dibenzosilolyl group, a benzocarbazolyl group, a naphthobenzofuranyl group, a naphthobenzothienyl group, a naphthobenzosilolyl group, a dibenzocarbazolyl group, a dinaphthofuranyl group, a dinaphthothienyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothienyl group, an azadibenzosilolyl group, an indenopyrrolyl group, an indolopyrrolyl group, an indenocarbazolyl group, or an indolocarbazolyl group, unsubstituted or substituted with deuterium, —F, —Cl, —Br, —I, $—CH_2D$, $—CHD_2$, $—CD_3$, $—CH_2F$, $—CHF_2$, $—CF_3$, a hydroxyl group, a cyano group, a nitro group, a $C_1$-$C_{60}$ alkyl group, a $C_1$-$C_{60}$ alkoxy group, a cyclopentyl group, a cyclohexyl group, a cycloheptyl group, an adamantyl group, a norbornyl group, a norbornenyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thienyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothienyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothienyl group, a dibenzosilolyl group, a benzocarbazolyl group, a naphthobenzofuranyl group, a naphthobenzothienyl group, a naphthobenzosilolyl group, a dibenzocarbazolyl group, a dinaphtho furanyl group, a dinaphtho thienyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothienyl group, an azadibenzosilolyl group, an indenopyrrolyl group, an indolopyrrolyl group, an indenocarbazolyl group, an indolocarbazolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, or $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, wherein $Q_1$ to $Q_3$ and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

In an embodiment, $R_1$ to $R_6$ in Formula 1 may each be hydrogen.

In an embodiment, $R_{21}$ and $R_{22}$ in Formulae 2A and 2B may each be hydrogen.

In an embodiment, the fused cyclic compound represented by Formula 1 may be represented by Formula 1-1:

Formula 1-1

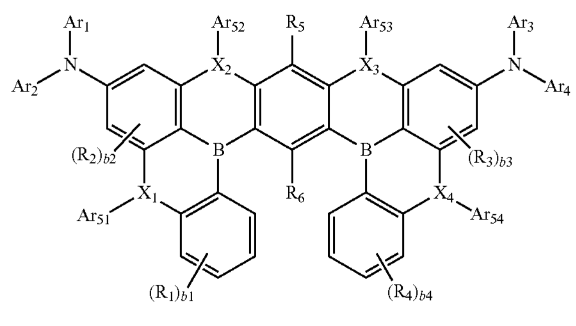

wherein, in Formula 1-1, $X_1$ to $X_4$, $Ar_1$ to $Ar_4$, $Ar_{51}$ to $Ar_{54}$ and $R_1$ to $R_6$ are the same as described herein, b1 and b4 may each independently be an integer from 1 to 4, and b2 and b3 may each independently be 1 or 2.

In an embodiment, the fused cyclic compound represented by Formula 1 may be represented by one of Formulae 1-1A to 1-1E:

1-1A

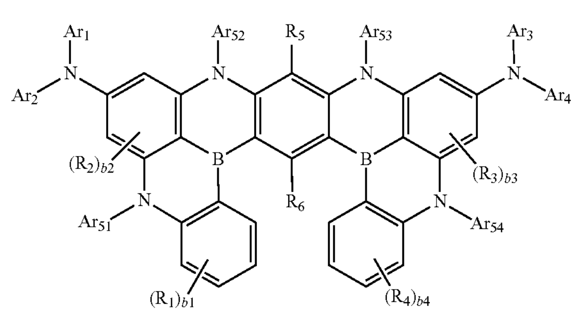

-continued 1-1B

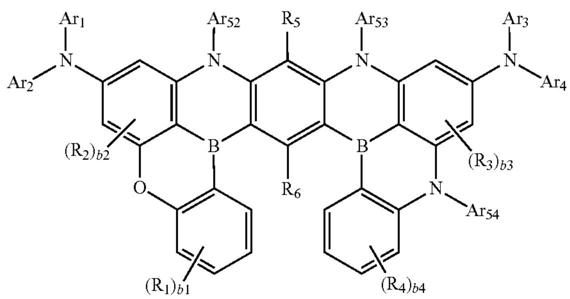

1-1C

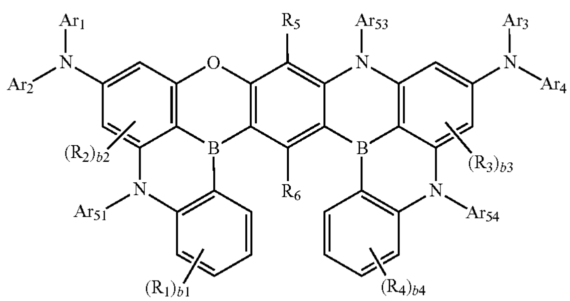

1-1D

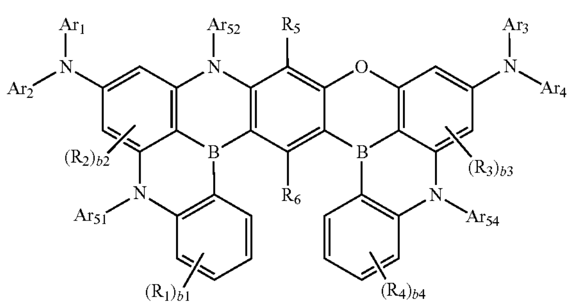

1-1E

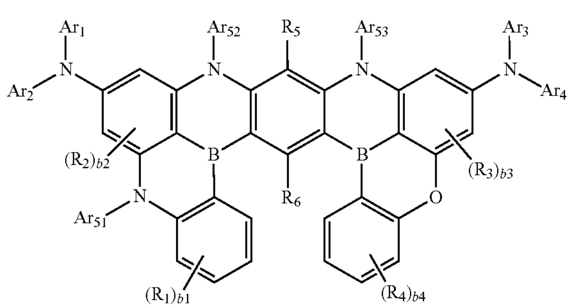

wherein, in Formulae 1-1A to 1-1E, $Ar_1$ to $Ar_4$, $Ar_{51}$ to $Ar_{54}$ and $R_1$ to $R_6$ are the same as described herein.

b1 and b4 may each be independently an integer from 1 to 4, and b2 and b3 may each independently be 1 or 2.

In an embodiment, in Formula 1-2A, $Ar_1$ or $Ar_2$ may be a group represented by Formula 2A or 2B, and $Ar_3$ or $Ar_4$ may be a group represented by Formula 2A or 2B, two of $Ar_{51}$ to $Ar_{54}$ may each independently be a group represented by Formula 2A or 2B, three of $Ar_{51}$ to to $Ar_4$ may each independently be a group represented by Formula 2A or 2B, $Ar_{51}$ to $Ar_{54}$ may each independently be a group represented by Formula 2A or 2B3, $Ar_1$ or $Ar_2$ may be a group represented by Formula 2A or 2B3, and one of $Ar_{51}$ to $Ar_{54}$ may be a group represented by Formula 2A or 2B3, $Ar_1$ or $Ar_2$ may be a group represented by Formula 2A or 2B3, and two of $Ar_{51}$ to $Ar_{54}$ may each independently be a group represented by Formula 2A or 2B3, $Ar_1$ or $Ar_2$ may be a group represented by Formula 2A or 2B, and three of $Ar_{51}$ to $Ar_{54}$ may each independently be a group represented by Formula 2A or 2B, $Ar_1$ or $Ar_2$ may be a group represented by Formula 2A or 2B, and $Ar_{51}$ to $Ar_{54}$ may each independently be a group represented by Formula 2A or 2B, $Ar_1$ or $Ar_2$ may be a group represented by Formula 2A or 2B, $Ar_3$ or $Ar_4$ may be a group represented by Formula 2A or 2B, and one of $Ar_{51}$ to $Ar_{54}$ may be a group represented by Formula 2A or 2B, $Ar_1$ or $Ar_2$ may be a group represented by Formula 2A or 2B, $Ar_3$ or $Ar_4$ may be a group represented by Formula 2A or 2B, and two of $Ar_{51}$ to $Ar_{54}$ may each independently be a group represented by Formula 2A or 2B, $Ar_1$ or $Ar_2$ may be a group represented by Formula 2A or 2B, $Ar_3$ or $Ar_4$ may be a group represented by Formula 2A or 2B, and three of $Ar_{51}$ to $Ar_{54}$ may each independently be a group represented by Formula 2A or 2B, or $Ar_1$ or $Ar_2$ may be a group represented by Formula 2A or 2B, $Ar_3$ or $Ar_4$ may be a group represented by Formula 2A or 2B, and $Ar_{51}$ to $Ar_{54}$ may each independently be a group represented by Formula 2A or 2B.

In an embodiment, in Formula 1-1B, $Ar_1$ or $Ar_2$ may be a group represented by Formula 2A or 2B, and $Ar_3$ or $Ar_4$ may be a group represented by Formula 2A or 2B, two of $Ar_{52}$ to $Ar_{54}$ may each independently be a group represented by Formula 2A or 2B, $Ar_{52}$ to $Ar_{54}$ may each independently be a group represented by Formula 2A or 2B, $Ar_1$ or $Ar_2$ may be a group represented by Formula 2A or 2B, and one of $Ar_{52}$ to $Ar_{54}$ may be a group represented by Formula 2A or 2B, $Ar_1$ or $Ar_2$ may be a group represented by Formula 2A or 2B, and two of $Ar_{52}$ to $Ar_{54}$ may each independently be a group represented by Formula 2A or 2B, $Ar_1$ or $Ar_2$ may be a group represented by Formula 2A or 2B, and $Ar_{52}$ to $Ar_{54}$ may each independently be a group represented by Formula 2A or 2B, $Ar_1$ or $Ar_2$ may be a group represented by Formula 2A or 2B, $Ar_3$ or $Ar_4$ may be a group represented by Formula 2A or 2B, and one of $Ar_{52}$ to $Ar_{54}$ may be a group represented by Formula 2A or 2B, $Ar_1$ or $Ar_2$ may be a group represented by Formula 2A or 2B, $Ar_3$ or $Ar_4$ may be a group represented by Formula 2A or 2B, and two of $Ar_{52}$ to $Ar_{54}$ may each independently be a group represented by Formula 2A or 2B, $Ar_1$ or $Ar_2$ may be a group represented by Formula 2A or 2B, $Ar_3$ or $Ar_4$ may be a group represented by Formula 2A or 2B, and $Ar_{52}$ to $Ar_{54}$ may each independently be a group represented by Formula 2A or 2B.

In an embodiment, in Formula 1-1C, $Ar_1$ or $Ar_2$ may be a group represented by Formula 2A or 2B, and $Ar_3$ or $Ar_4$ may be a group represented by Formula 2A or 2B, two of $Ar_{51}$, $Ar_{53}$, and $Ar_{54}$ may each independently be a group represented by Formula 2A or 2B, $Ar_{51}$, $Ar_{53}$, and $Ar_{54}$ may each independently be a group represented by Formula 2A or 2B, $Ar_1$ or $Ar_2$ may be a group represented by Formula 2A or 2B, and one of $Ar_{51}$, $Ar_{53}$, and $Ar_{54}$ may be a group represented by Formula 2A or 2B, $Ar_1$ or $Ar_2$ may be a group represented by Formula 2A or 2B, and two of $Ar_{51}$, $Ar_{53}$, and $Ar_{54}$ may each independently be a group represented by Formula 2A or 2B, $Ar_1$ or $Ar_2$ may be a group represented by Formula 2A or 2B, and $Ar_{51}$, $Ar_{53}$, and $Ar_{54}$ may each independently be a group represented by Formula 2A or 2B, $Ar_1$ or $Ar_2$ may be a group represented by Formula 2A or 2B, $Ar_3$ or $Ar_4$ may be a group represented by Formula 2A or 2B, and one of $Ar_{51}$, $Ar_{53}$, and $Ar_{54}$ may be a group represented by Formula 2A or 2B, An or $Ar_2$ may be a group represented by Formula 2A or 2B, $Ar_3$ or $Ar_4$ may be a group represented by Formula 2A or 2B, and two of $Ar_{51}$, $Ar_{53}$, and $Ar_{54}$ may each independently be a group represented by Formula 2A or 2B, and $Ar_1$ or $Ar_2$ may be a group represented by Formula 2A or 2B, $Ar_3$ or $Ar_4$ may be a group represented by Formula 2A or 2B, $Ar_{51}$, $Ar_{53}$, and $Ar_{54}$ may each independently be a group represented by Formula 2A or 2B.

In an embodiment, in Formula 1-1D, $Ar_1$ or $Ar_2$ may be a group represented by Formula 2A or 2B, and $Ar_3$ or $Ar_4$ may be a group represented by Formula 2A or 2B, two of $Ar_{51}$, $Ar_{52}$, and $Ar_{54}$ may each independently be a group represented by Formula 2A or 2B, $Ar_{51}$, $Ar_{52}$, and $Ar_{54}$ may each independently be a group represented by Formula 2A or 2B, $Ar_1$ or $Ar_2$ may be a group represented by Formula 2A or 2B, and one of $Ar_{51}$, $Ar_{52}$, and $Ar_{54}$ may be a group represented by Formula 2A or 2B, $Ar_1$ or $Ar_2$ may be a group represented by Formula 2A or 2B, and two of $Ar_{51}$, $Ar_{52}$, and $Ar_{54}$ may each independently be a group represented by Formula 2A or 2B, $Ar_1$ or $Ar_2$ may be a group represented by Formula 2A or 2B, and $Ar_{51}$, $Ar_{52}$, and $Ar_{54}$ may each independently be a group represented by Formula 2A or 2B, $Ar_1$ or $Ar_2$ may be a group represented by Formula 2A or 2B, $Ar_3$ or $Ar_4$ may be a group represented by Formula 2A or 2B, and one of $Ar_{51}$, $Ar_{52}$, and $Ar_{54}$ may be a group represented by Formula 2A or 2B, An or $Ar_2$ may be a group represented by Formula 2A or 2B, $Ar_3$ or $Ar_4$ may be a group represented by Formula 2A or 2B, and two of $Ar_{51}$, $Ar_{52}$, and $Ar_{54}$ may each independently be a group represented by Formula 2A or 2B, and $Ar_1$ or $Ar_2$ may be a group represented by Formula 2A or 2B, $Ar_3$ or $Ar_4$ may be a group represented by Formula 2A or 2B, $Ar_{51}$, $Ar_{52}$, and $Ar_{54}$ may each independently be a group represented by Formula 2A or 2B.

In an embodiment, in Formula 1-1E, $Ar_1$ or $Ar_2$ may be a group represented by Formula 2A or 2B, and $Ar_3$ or $Ar_4$ may be a group represented by Formula 2A or 2B, two of $Ar_{51}$ to $Ar_{53}$ may each independently be a group represented by Formula 2A or 2B, $Ar_{51}$ to $Ar_{53}$ may each independently be a group represented by Formula 2A or 2B, $Ar_1$ or $Ar_2$ may be a group represented by Formula 2A or 2B, and one of $Ar_{51}$ to $Ar_{53}$ may be a group represented by Formula 2A or 2B, $Ar_1$ or $Ar_2$ may be a group represented by Formula 2A or 2B, and two of $Ar_{51}$ to $Ar_{53}$ may each independently be a group represented by Formula 2A or 2B, $Ar_1$ or $Ar_2$ may be a group represented by Formula 2A or 2B, and $Ar_{51}$ to $Ar_{53}$ may each independently be a group represented by Formula 2A or 2B, $Ar_1$ or $Ar_2$ may be a group represented by Formula 2A or 2B, $Ar_3$ or $Ar_4$ may be a group represented by Formula 2A or 2B, and one of $Ar_{51}$ to $Ar_{53}$ may be a group represented by Formula 2A or 2B, $Ar_1$ or $Ar_2$ may be a group represented by Formula 2A or 2B, $Ar_3$ or $Ar_4$ may be a group represented by Formula 2A or 2B, and two of $Ar_{51}$ to $Ar_{53}$ may each independently be a group represented by Formula 2A or 2B, and $Ar_1$ or $Ar_2$ may be a group represented by Formula 2A or 2B, $Ar_1$ or An may be a group represented by Formula 2A or 2B, and $Ar_{51}$ to $Ar_{53}$ may each independently be a group represented by Formula 2A or 2B.

For example, the fused cyclic compound represented by Formula 1 may be one of the following Compounds:

1

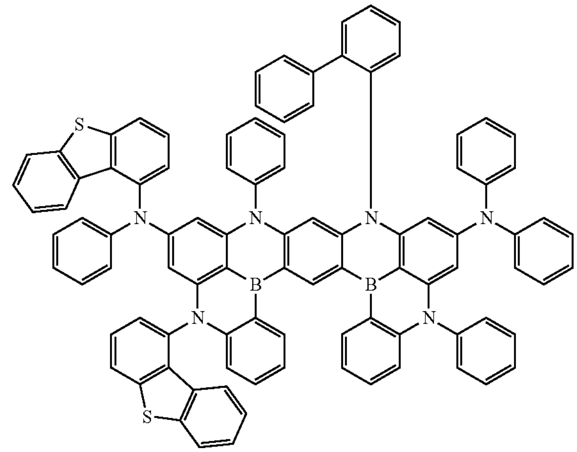

2

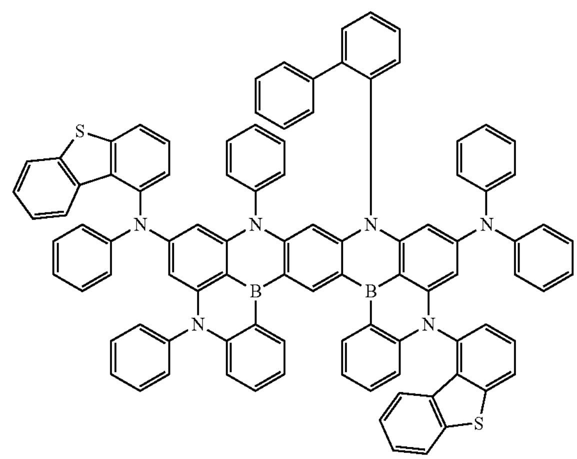

3

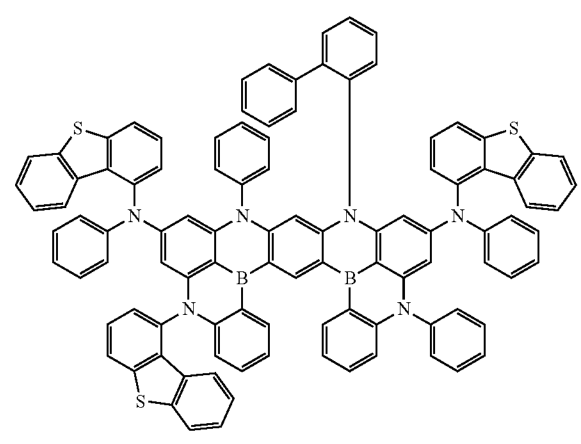

-continued
4
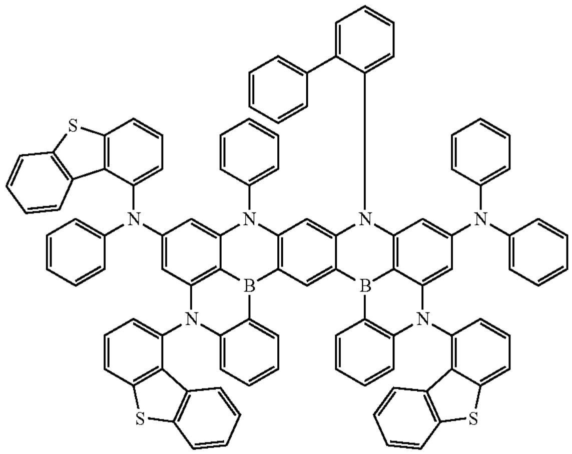
5
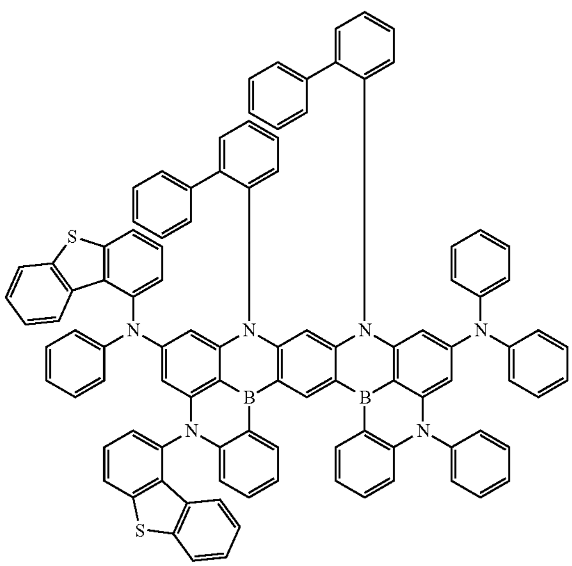
6
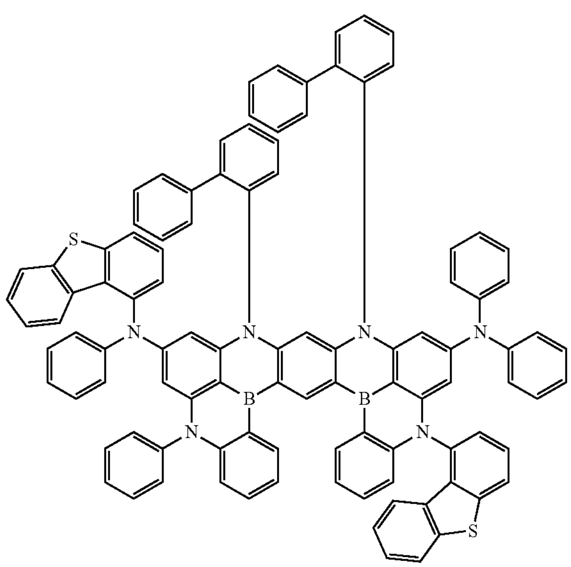
-continued
7
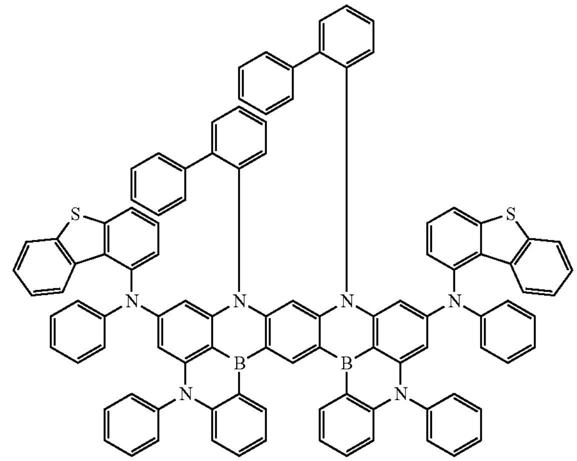
8
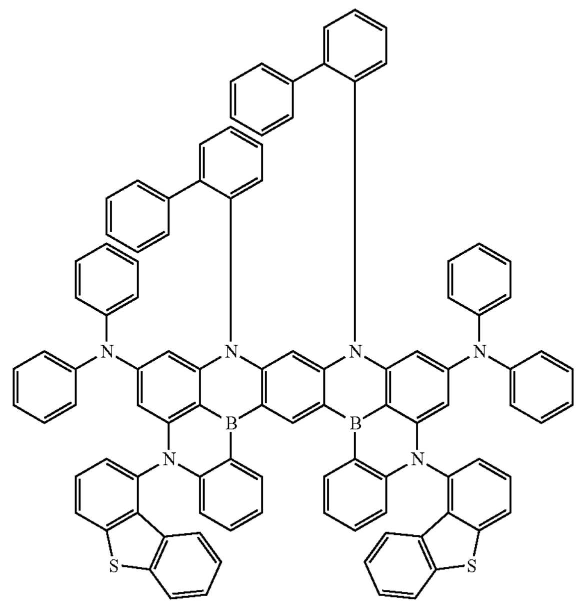
9
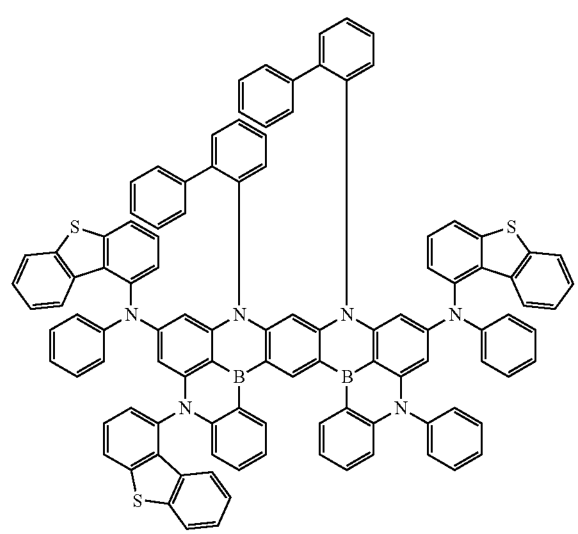

-continued
10
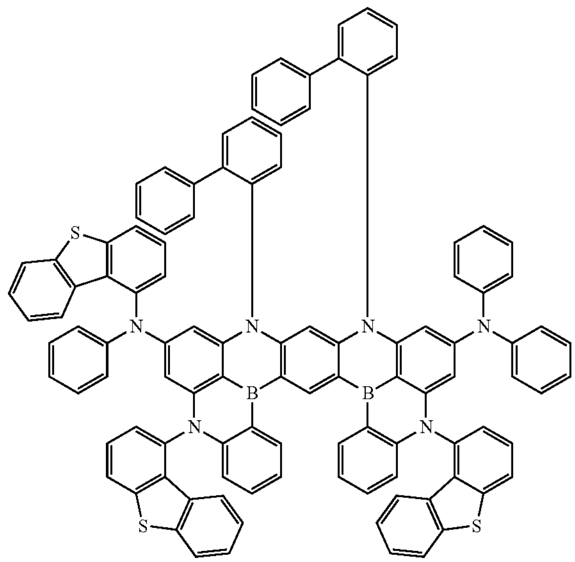
11
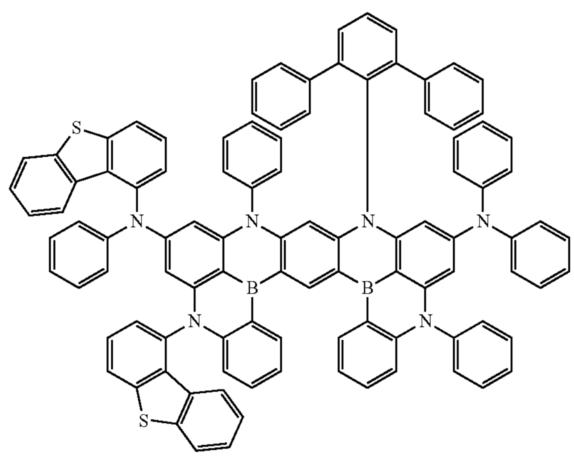
12
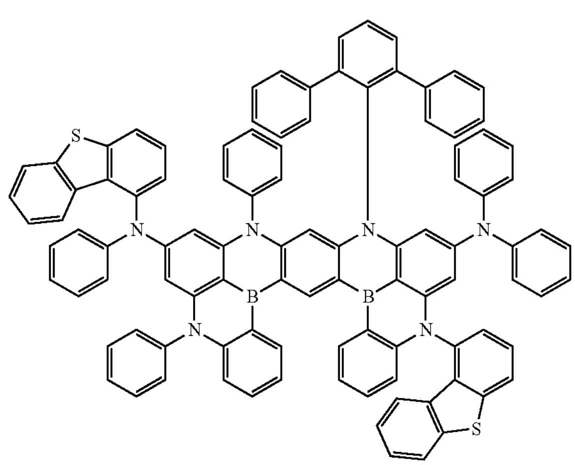
-continued
13
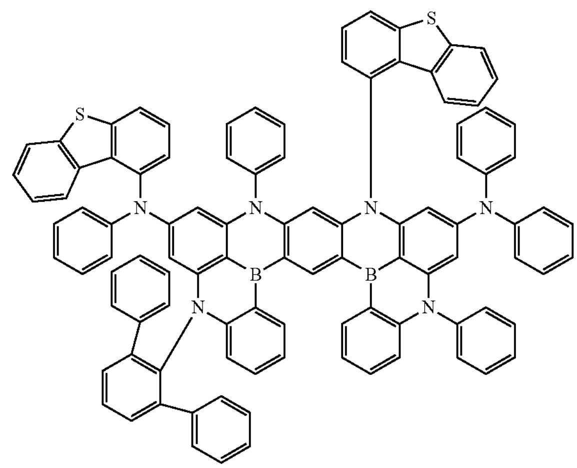
14
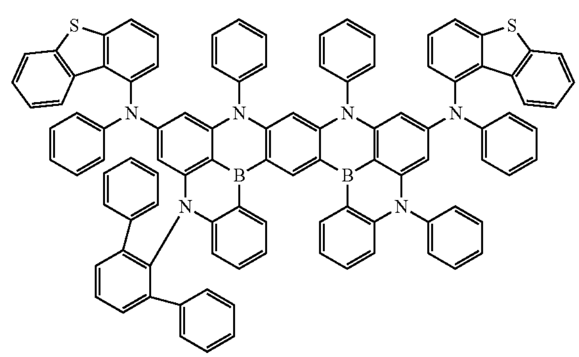
15
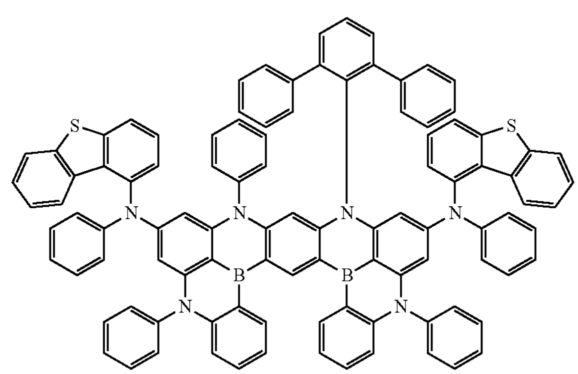

-continued
16
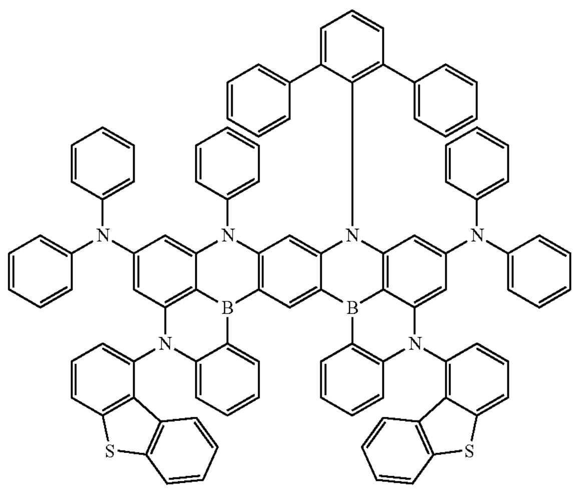
17
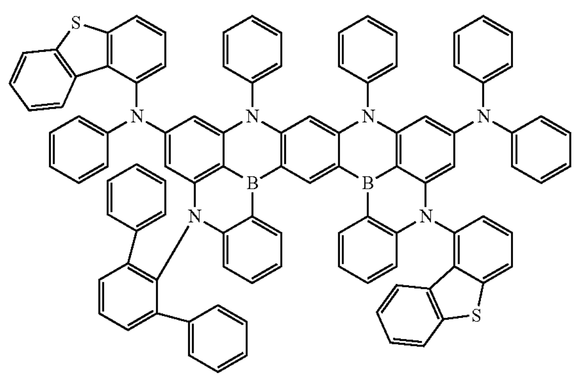
18
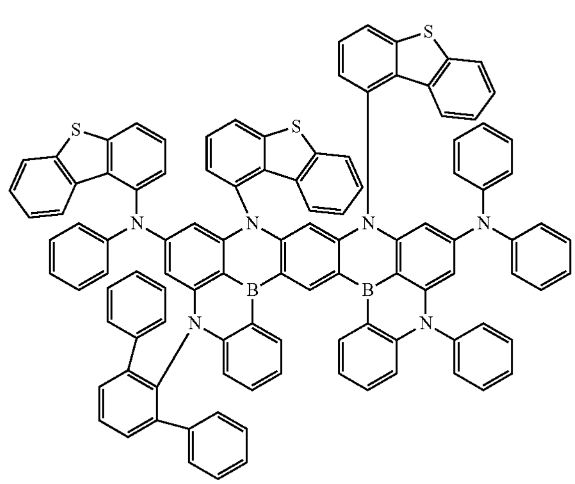
-continued
19
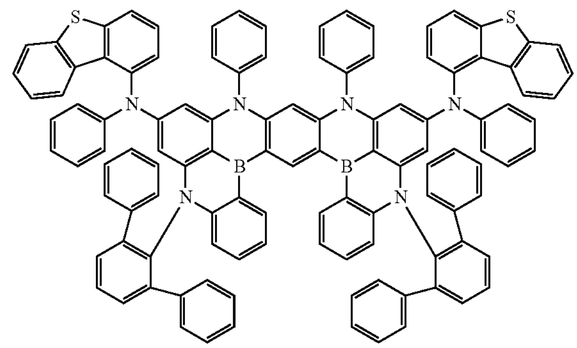
20
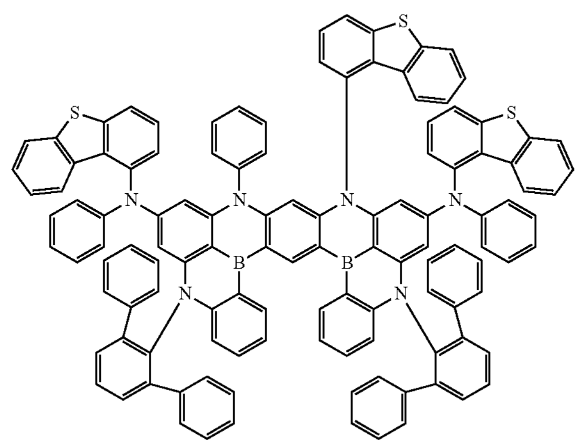
21
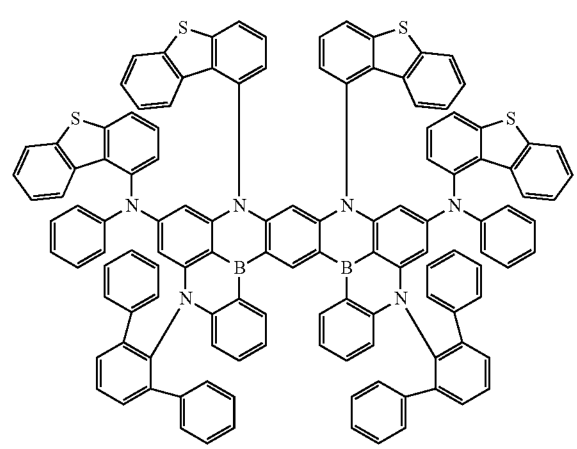

-continued
22
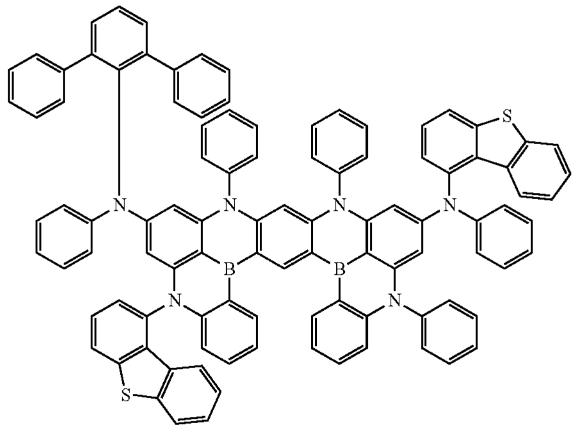
23
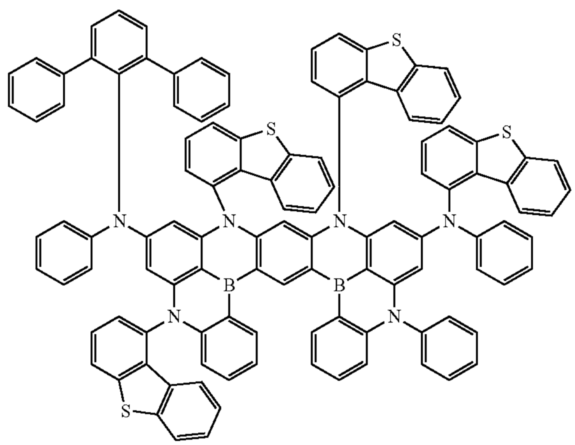
24
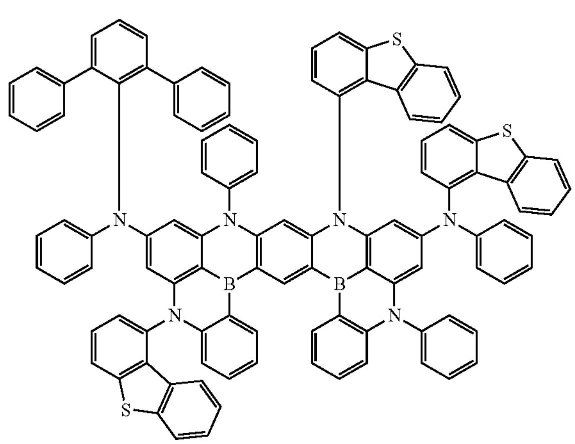
-continued
25
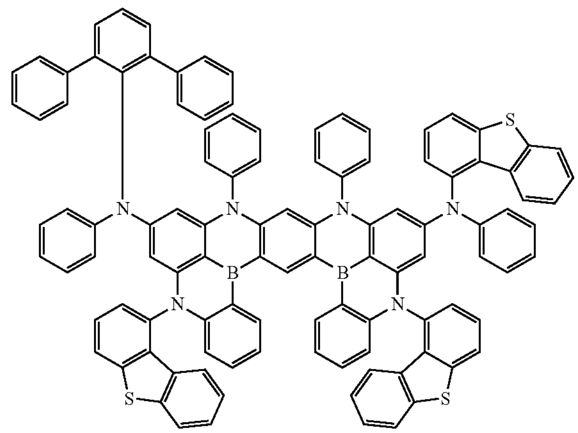
26
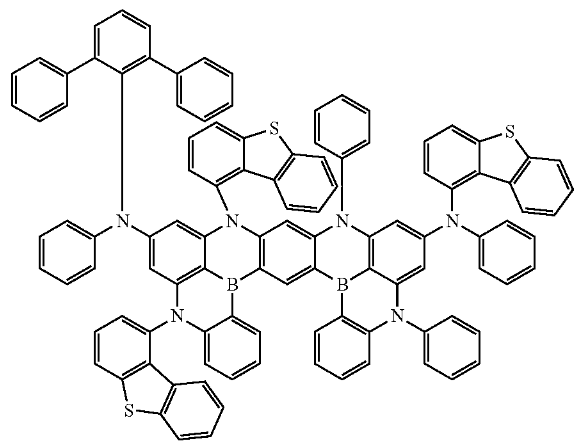
27
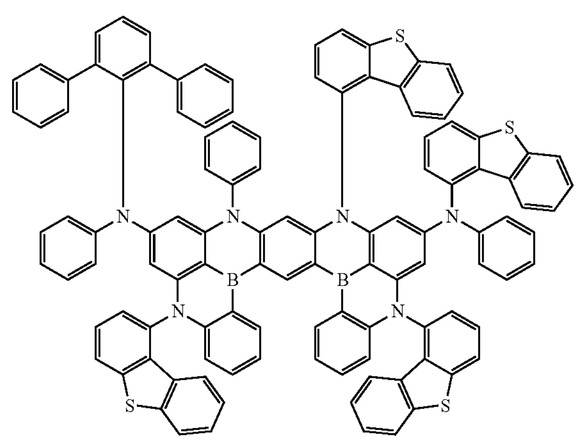

-continued
28
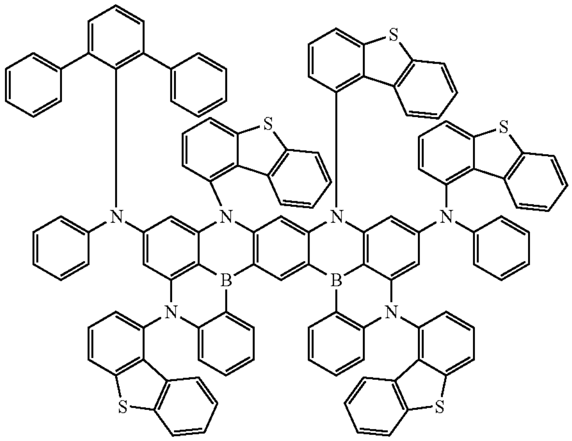
29
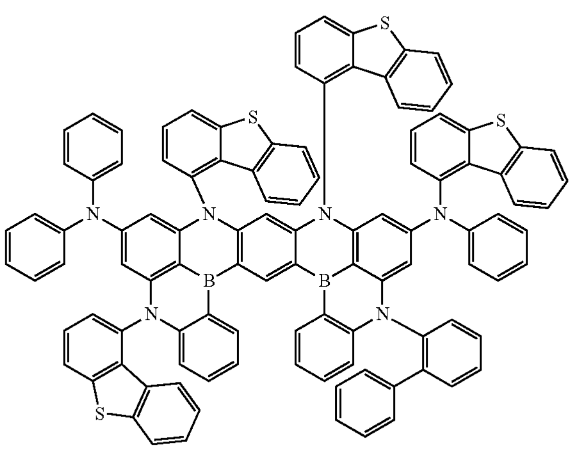
30
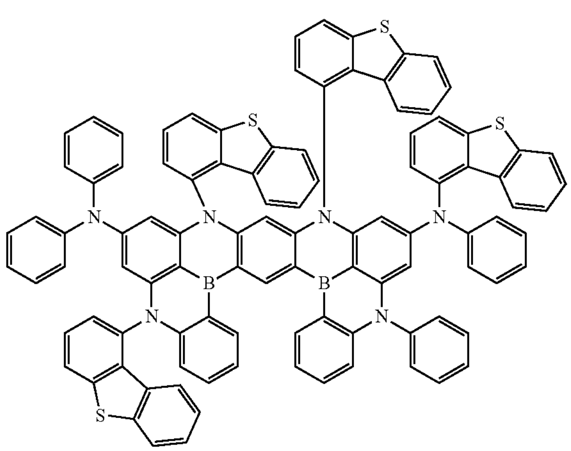
-continued
31
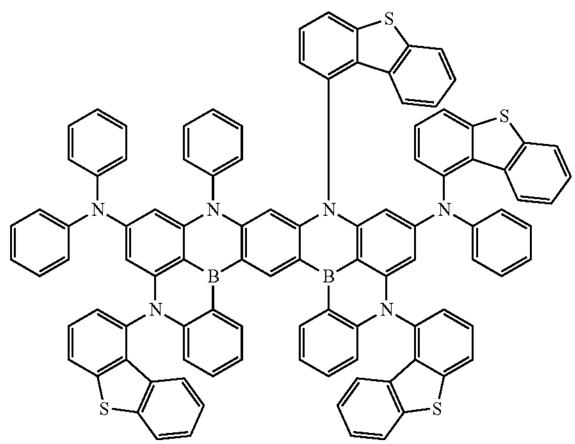
32
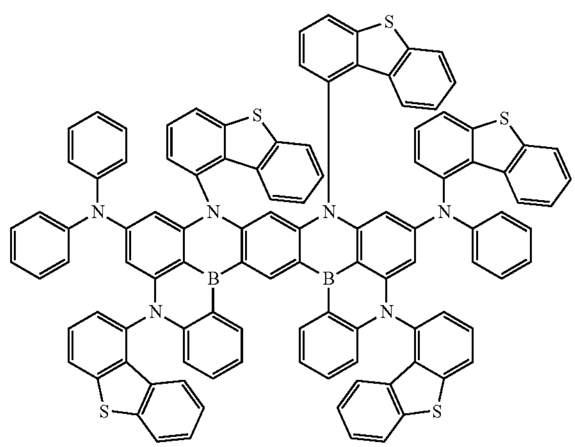
33
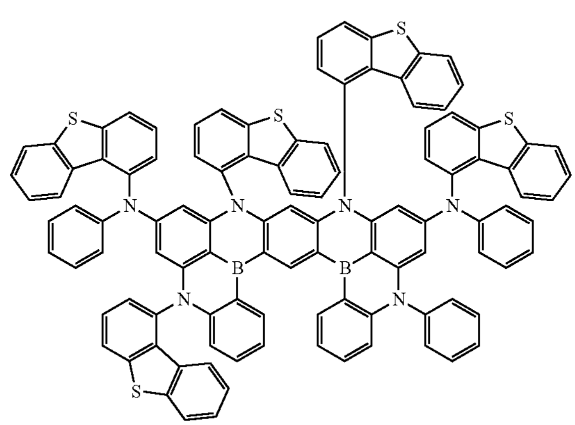

-continued
34
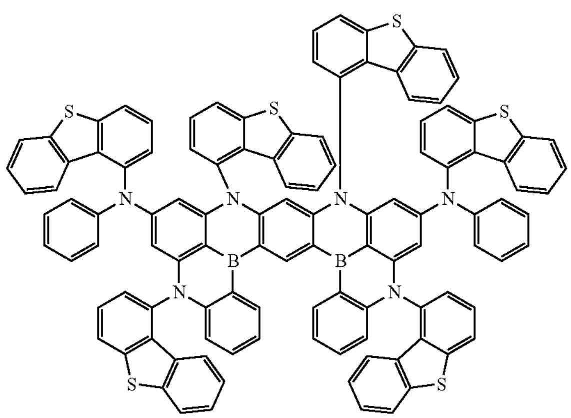
35
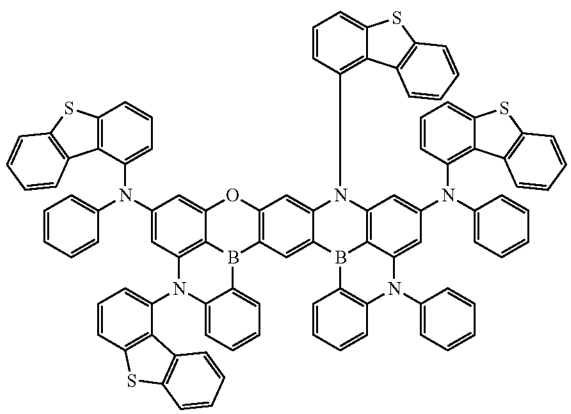
36
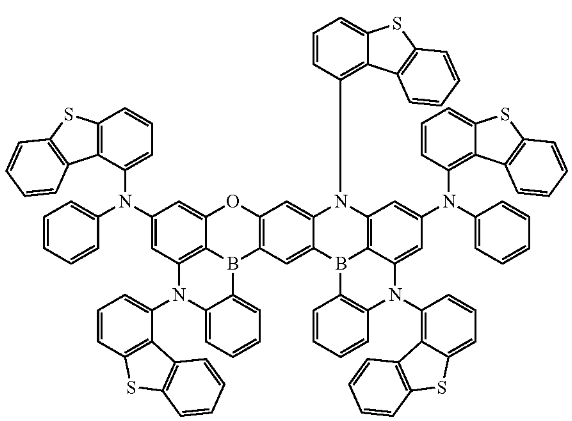
37
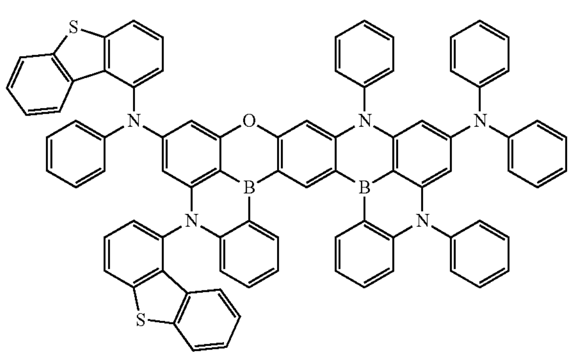
-continued
38
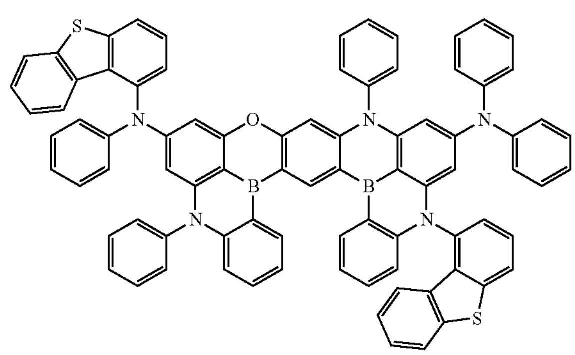
39
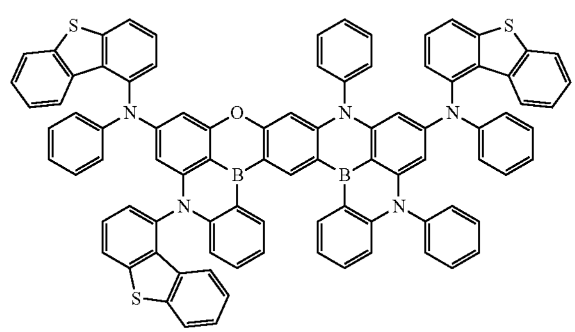
40
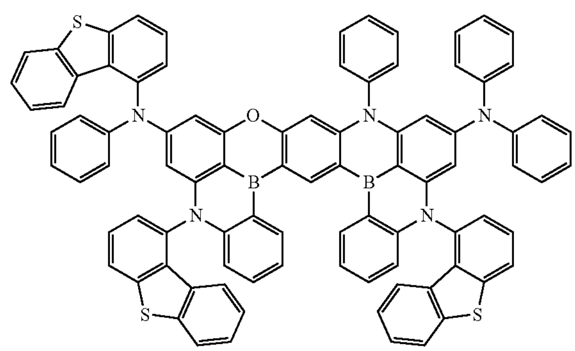
41
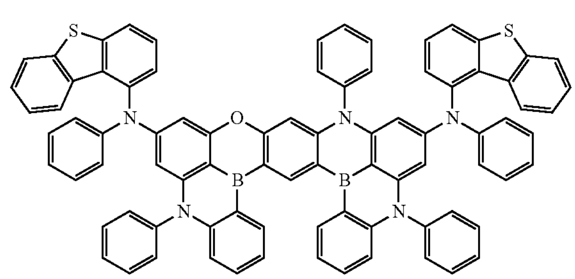

-continued
42
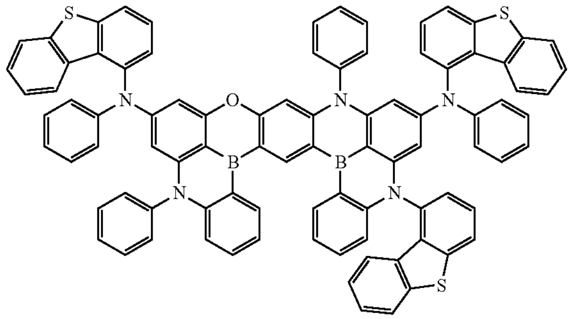
43
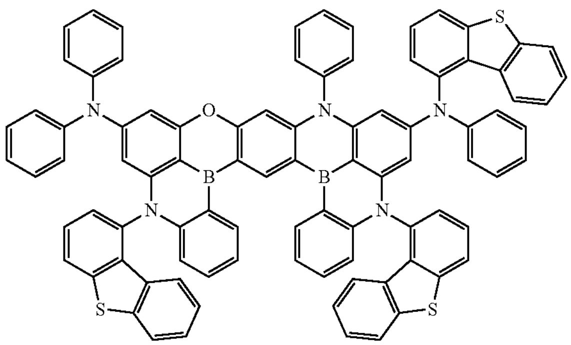
44
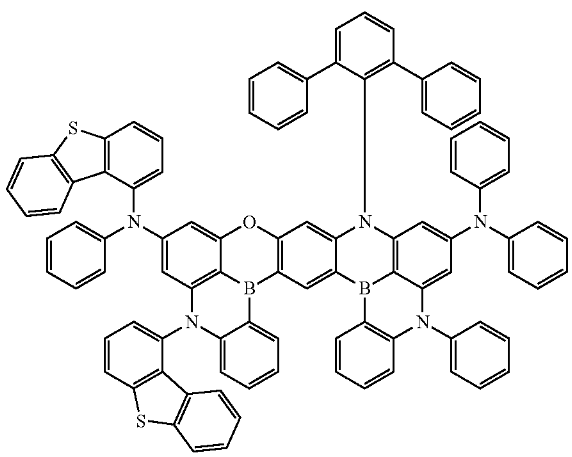
45
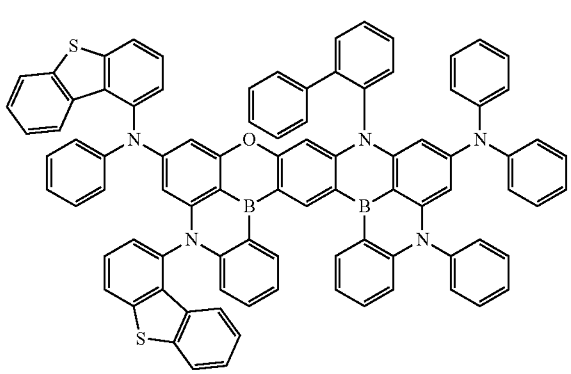
-continued
46
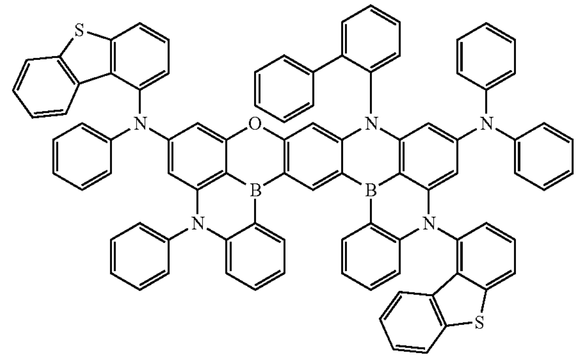
47
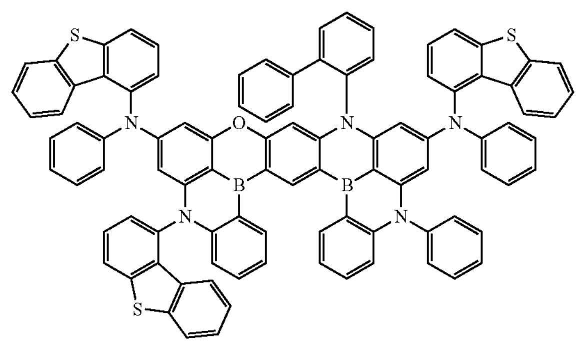
48
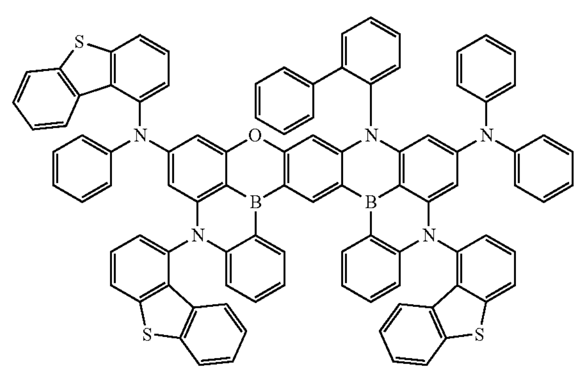
49
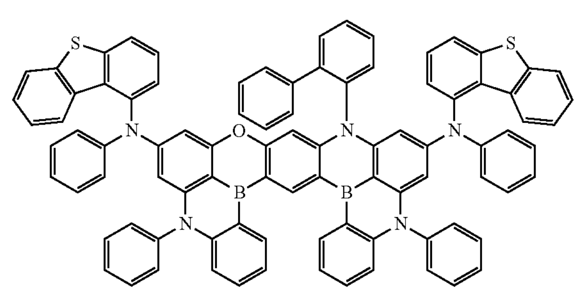

-continued
50
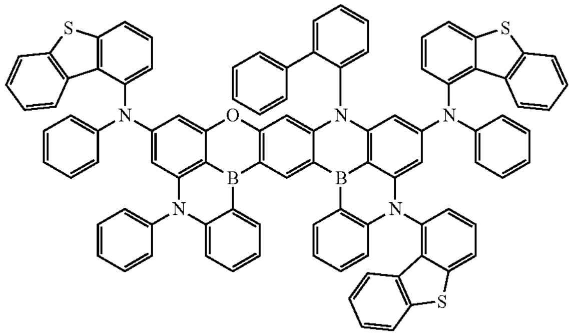
51
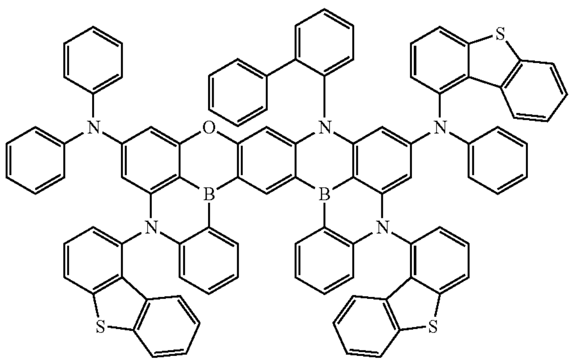
52
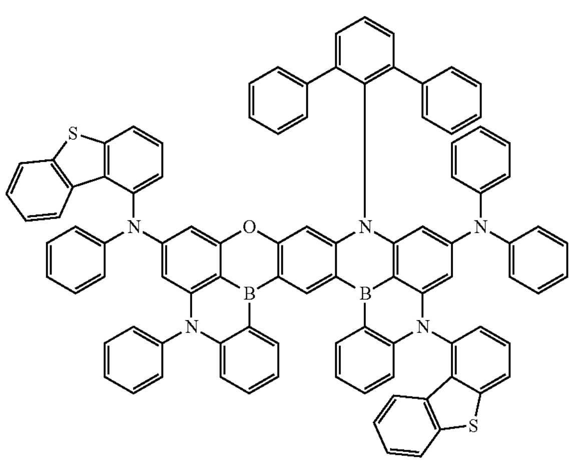
-continued
53
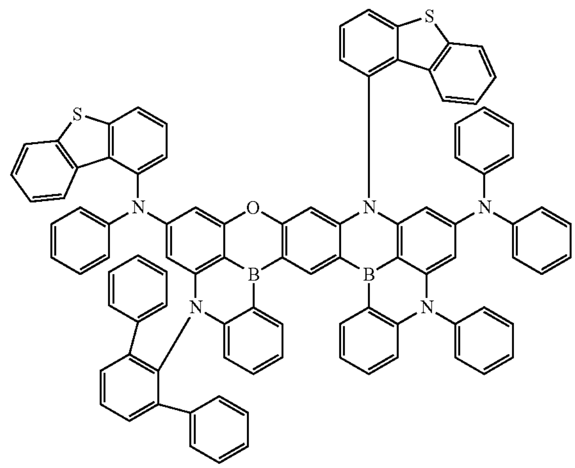
54
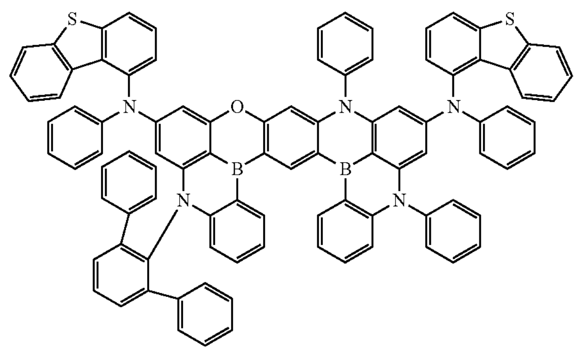
55
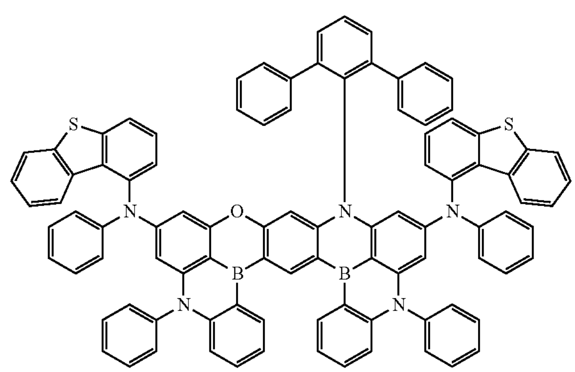

-continued
56
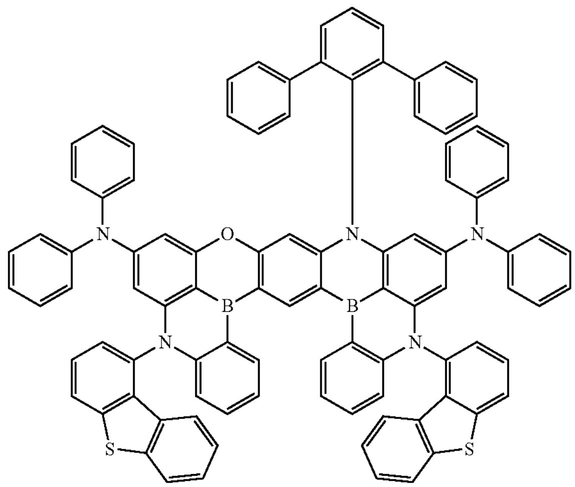
57
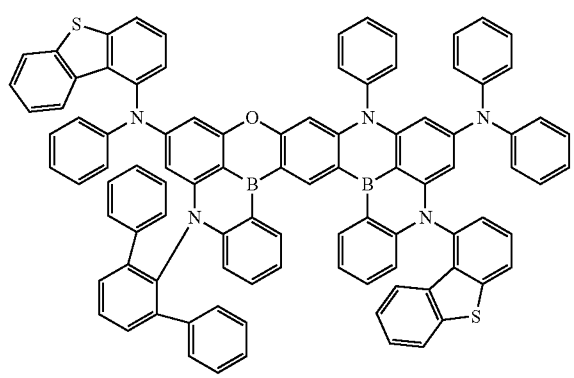
59
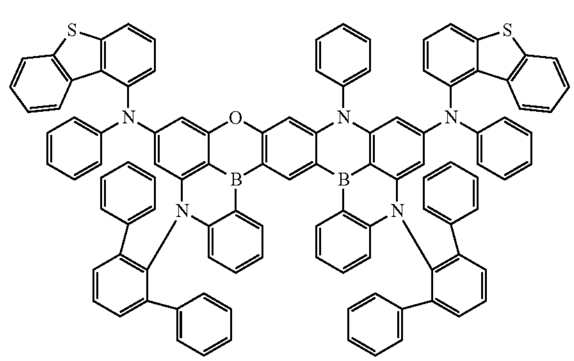
-continued
60
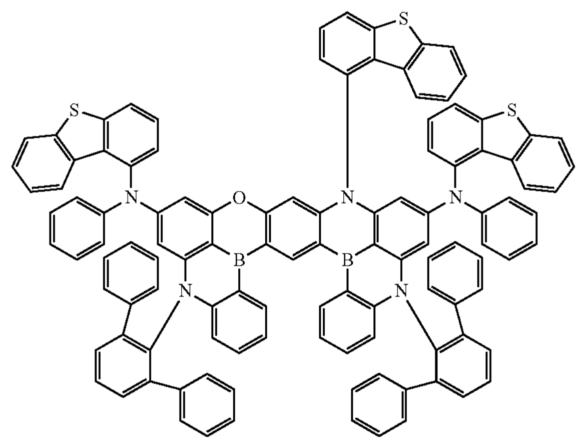
62
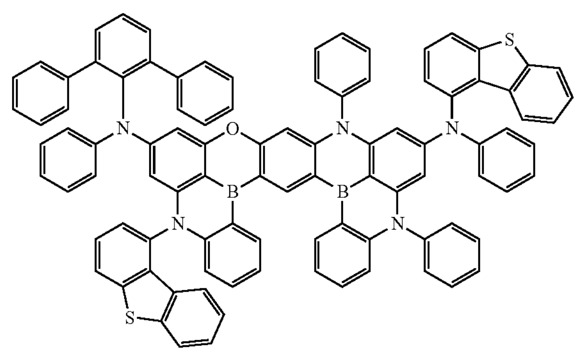
63
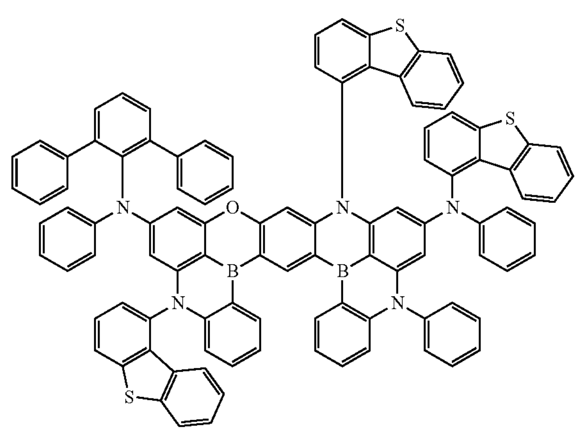

64
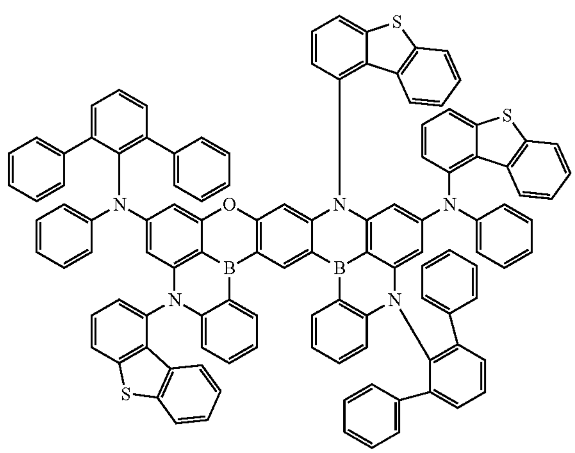
65
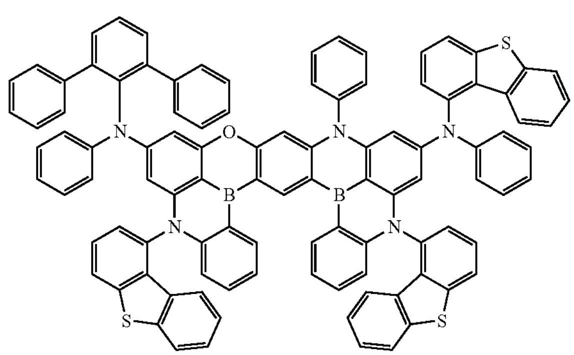
67
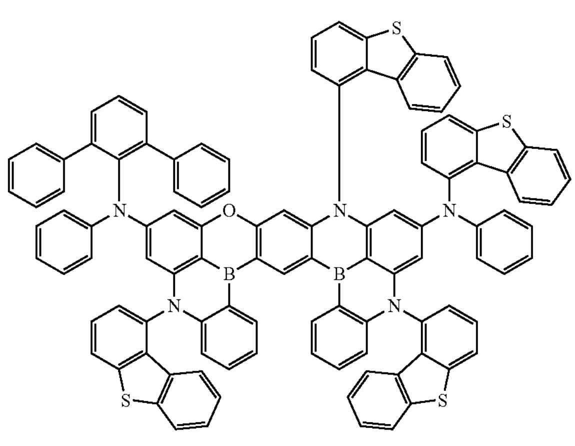
69
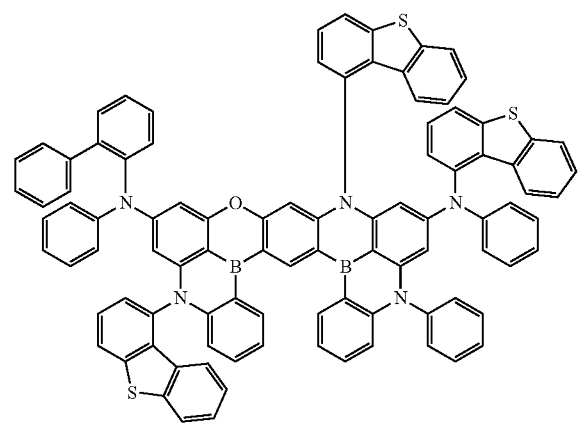
70
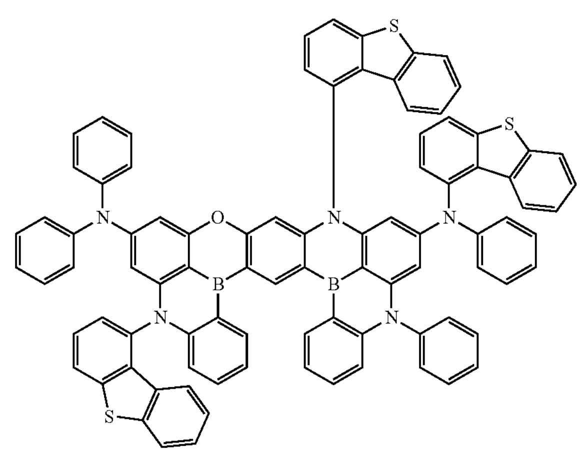
71
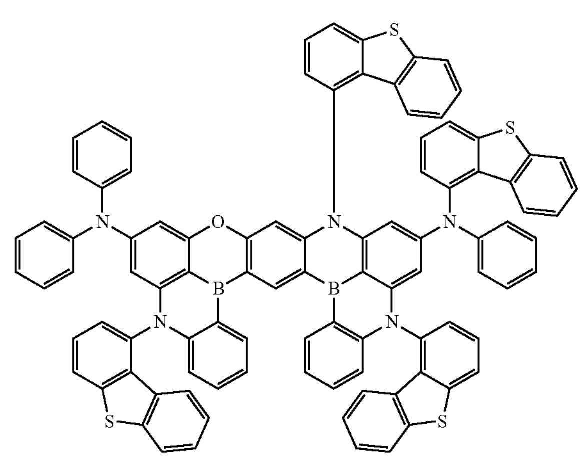

-continued
72
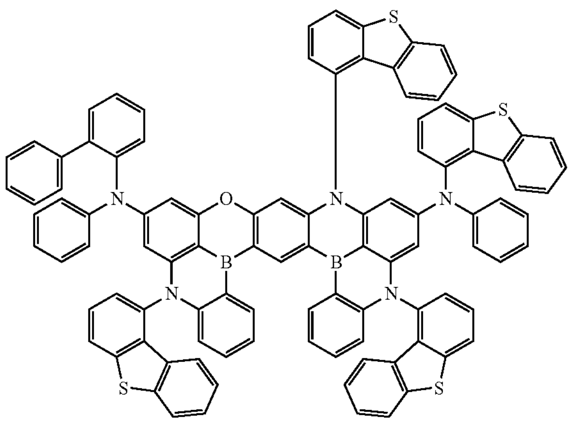
73
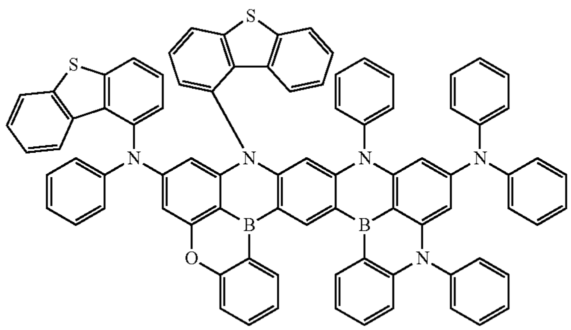
74
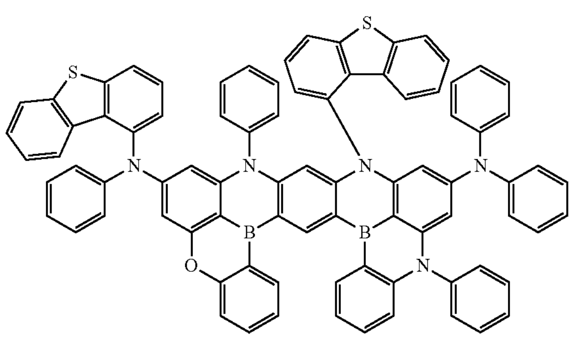
75
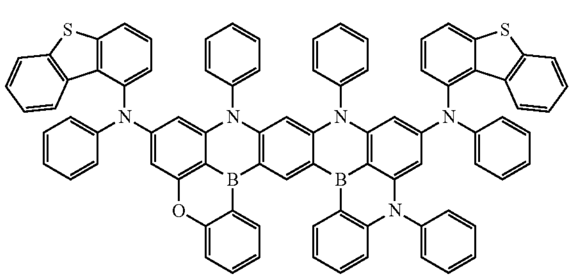
-continued
76
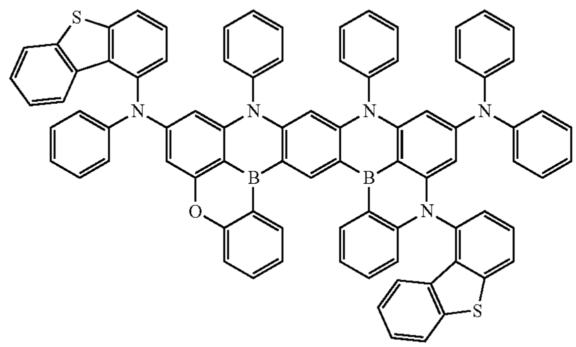
77
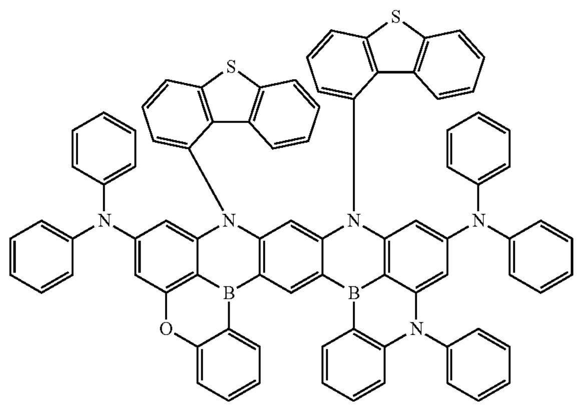
78
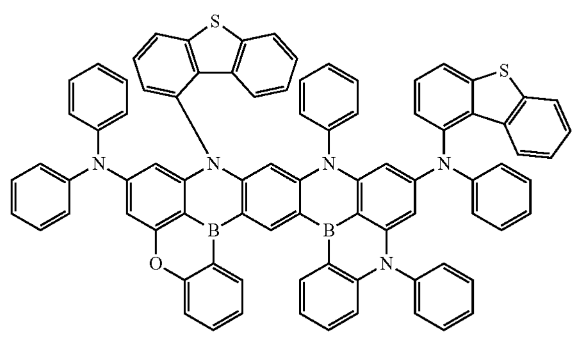
79
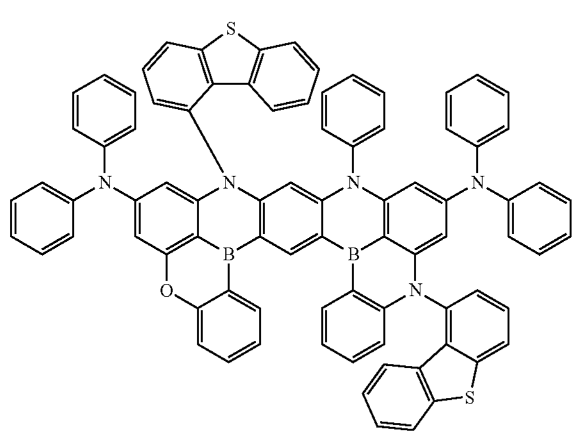

-continued
80
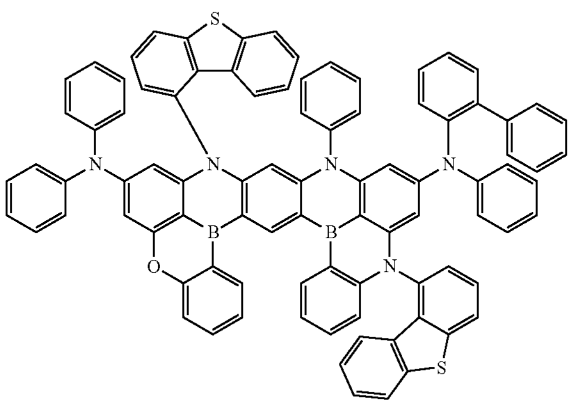
81
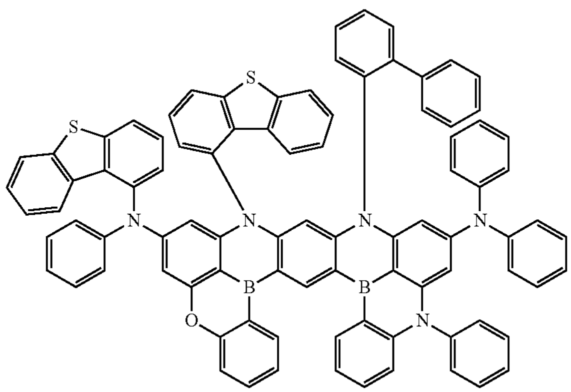
82
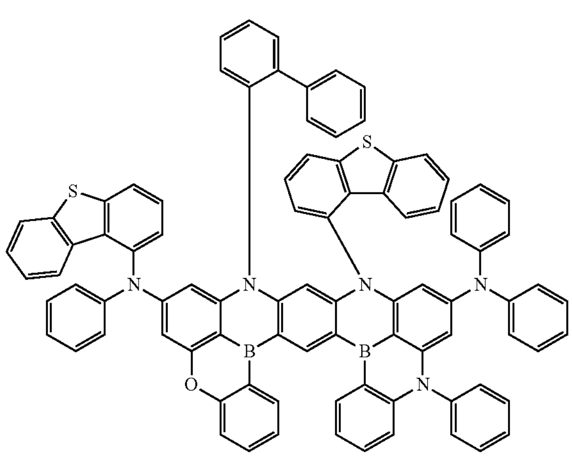
-continued
83
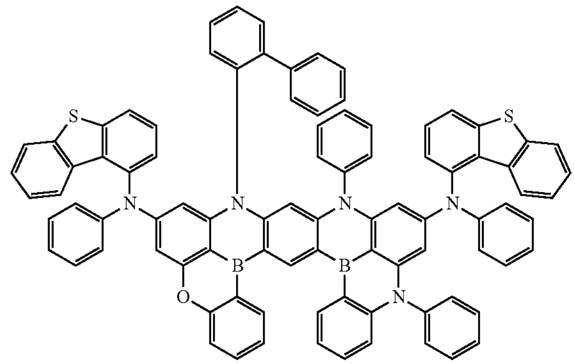
84
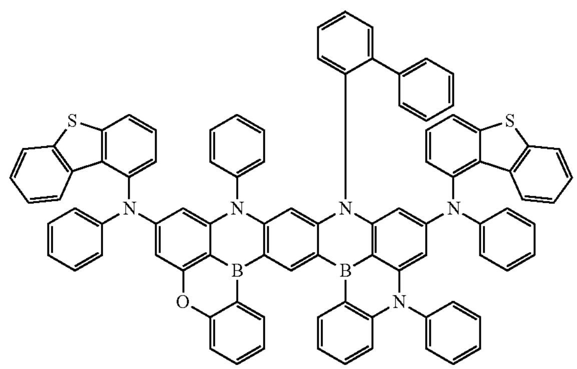
85
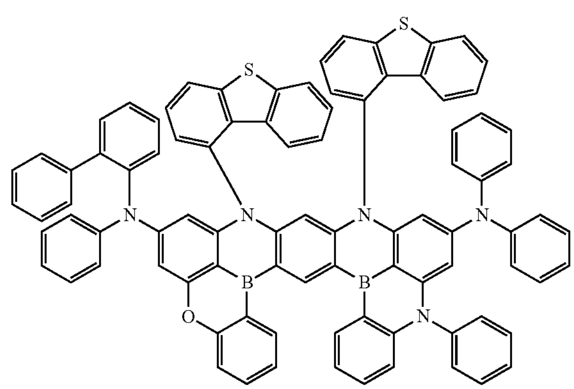
86
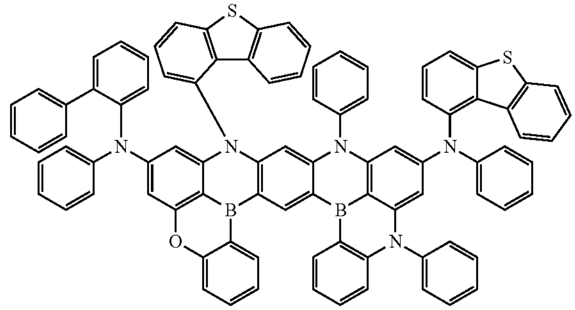

-continued
87
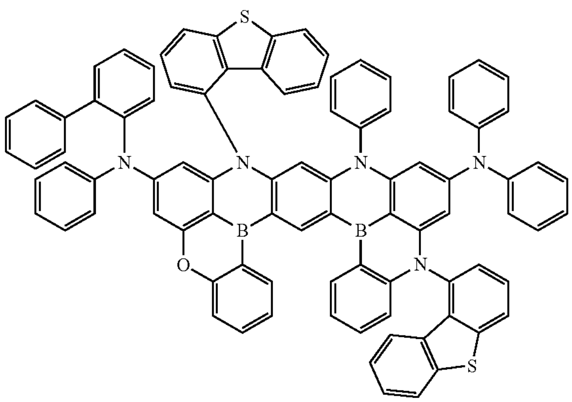
88
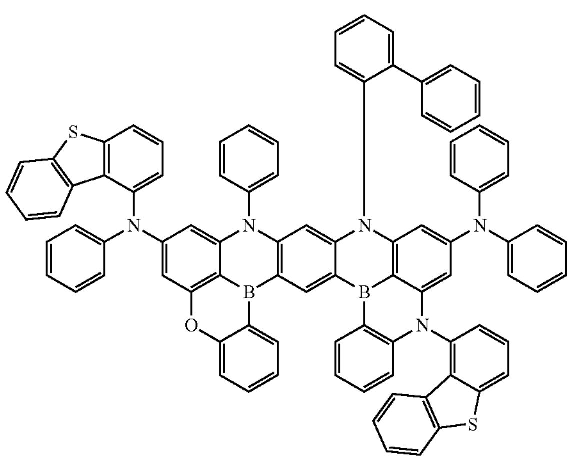
89
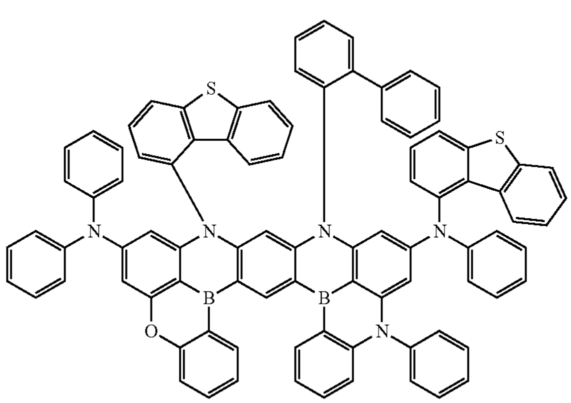
-continued
90
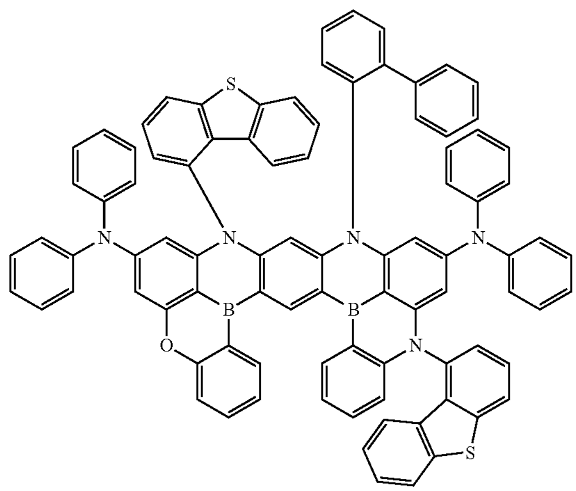
91
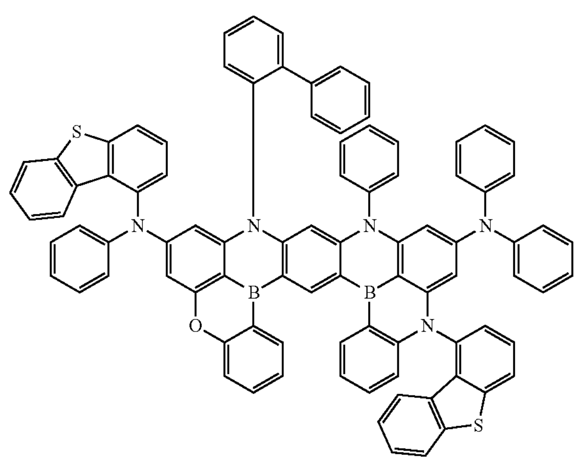
92
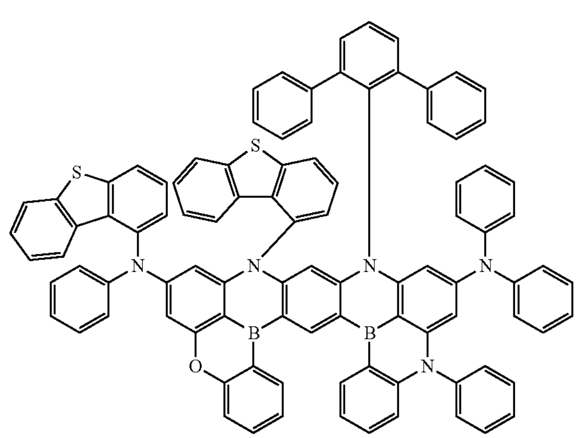

93
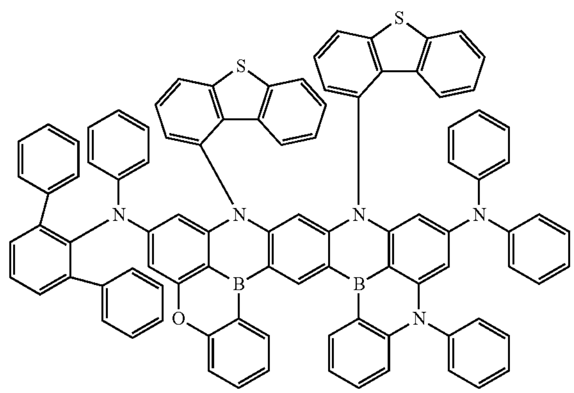
94
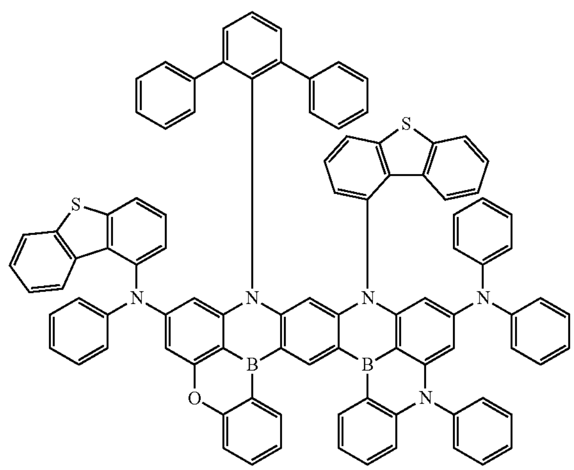
95
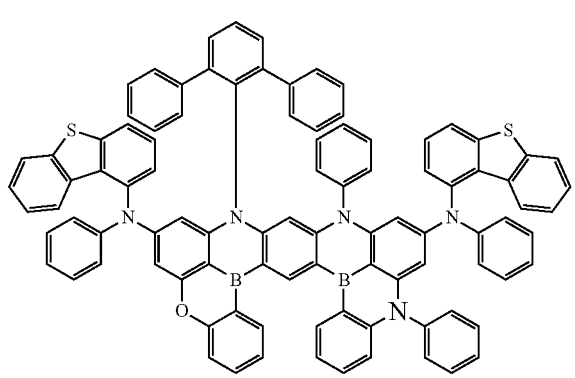
96
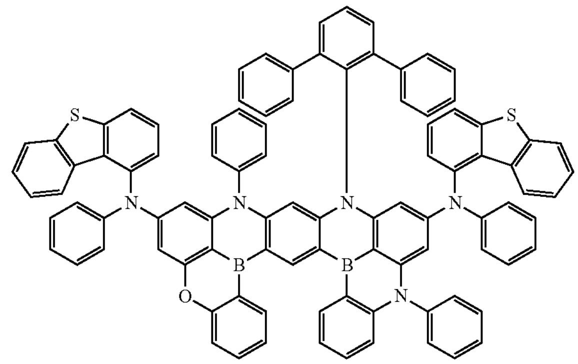
97
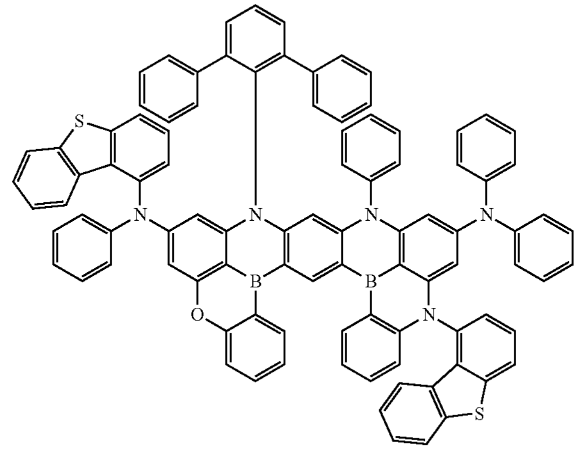
98
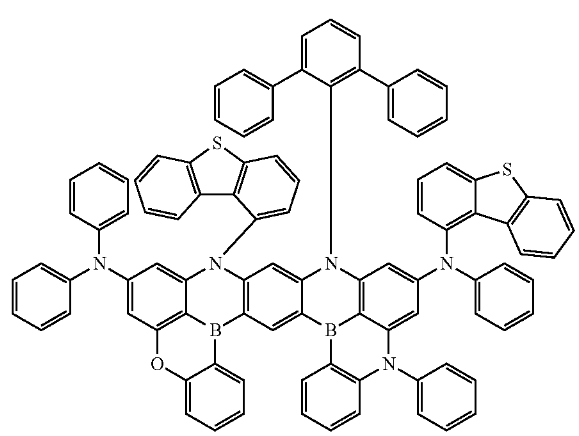

-continued
99
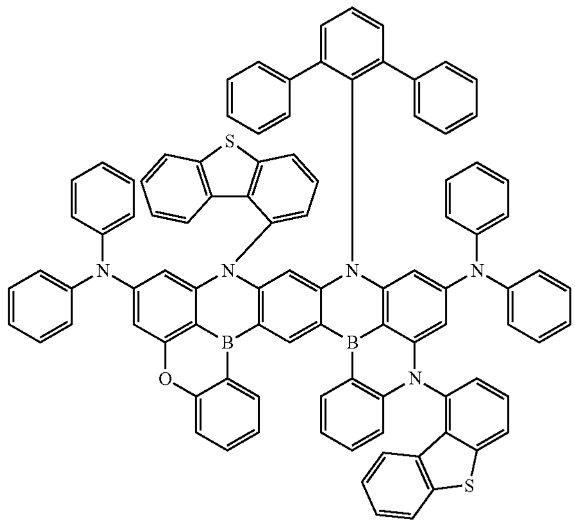
100
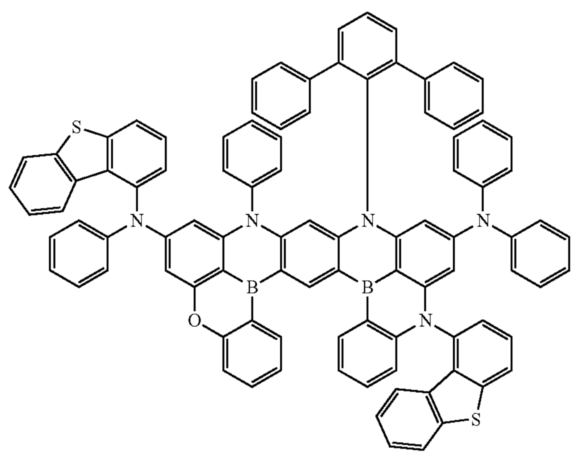
101
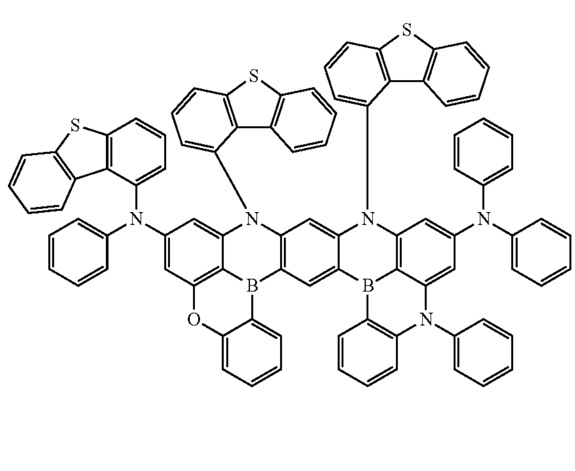
-continued
103
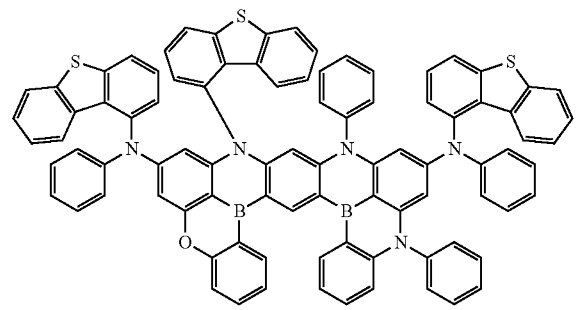
104
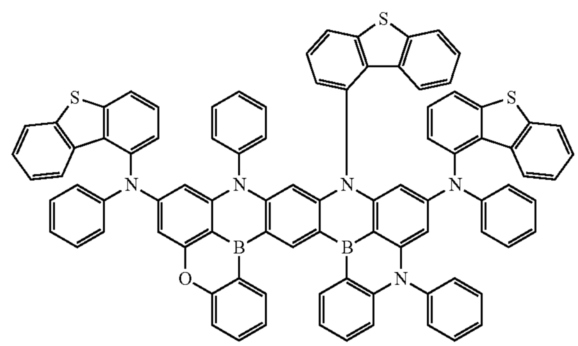
107
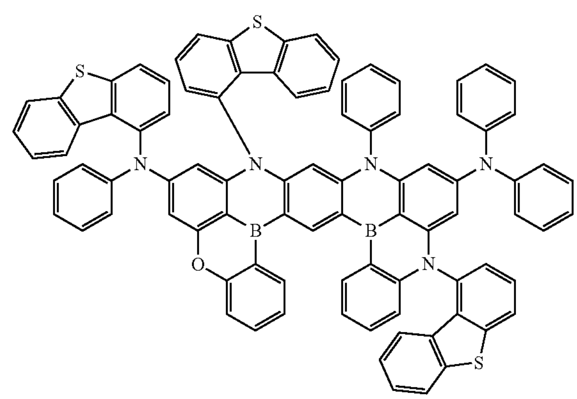
108
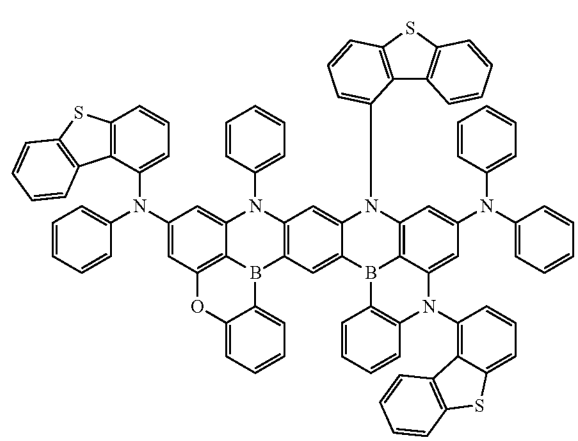

-continued
109
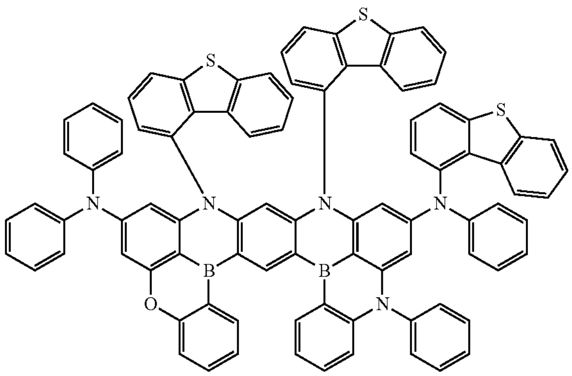
110
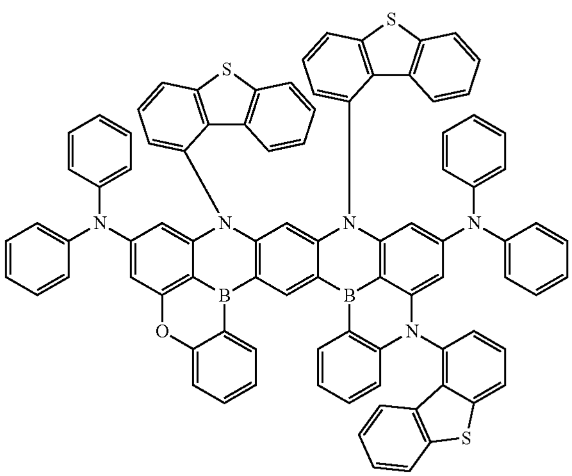
111
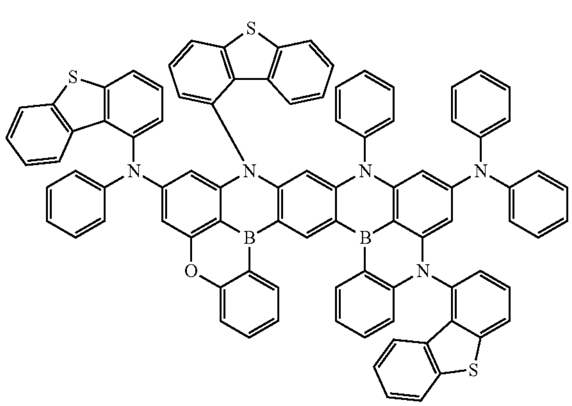
-continued
112
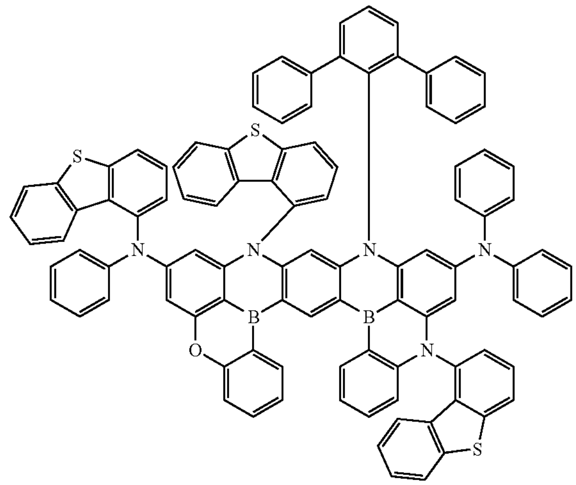
113
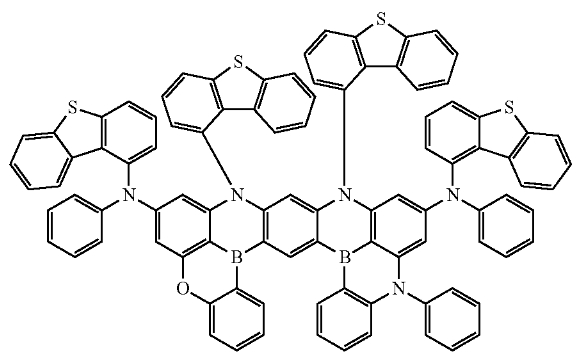
114
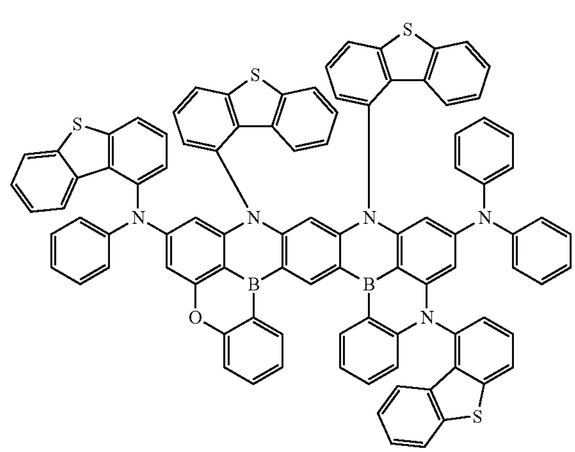

-continued
115
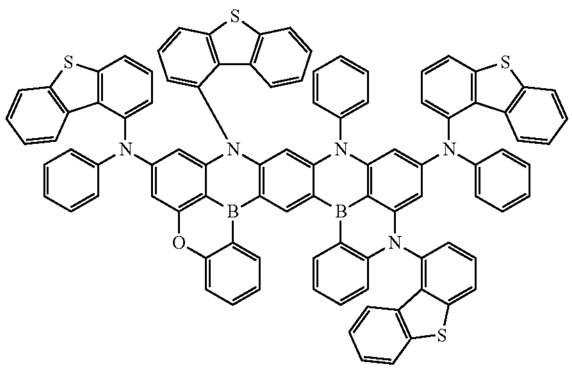
116
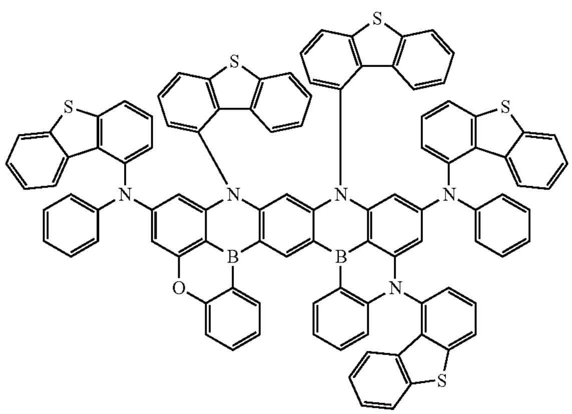
117
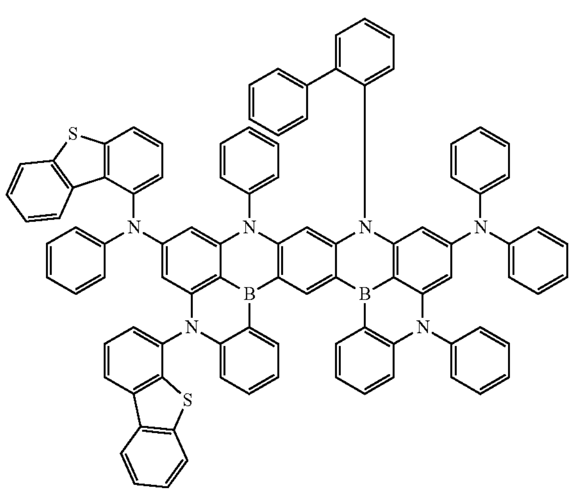
-continued
118
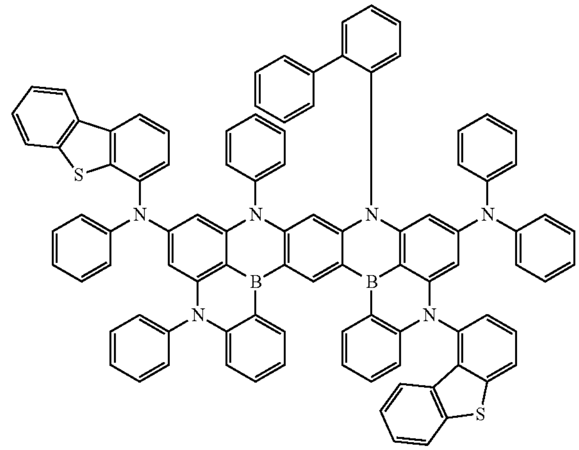
119
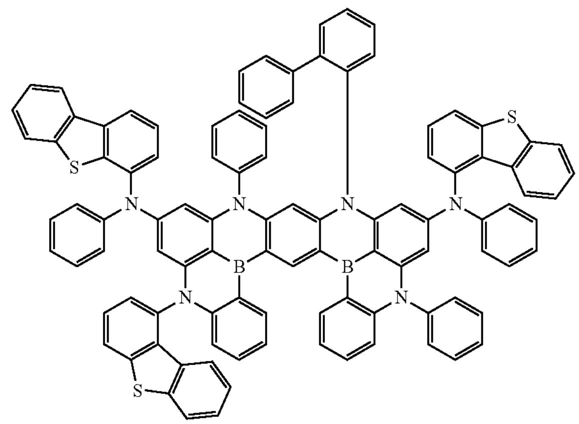
120
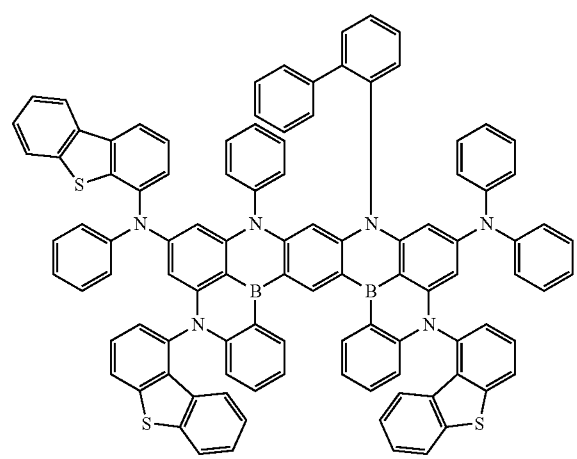

-continued
121
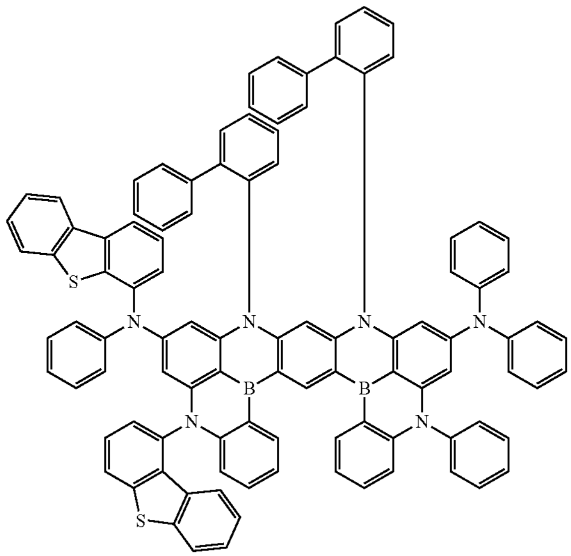
122
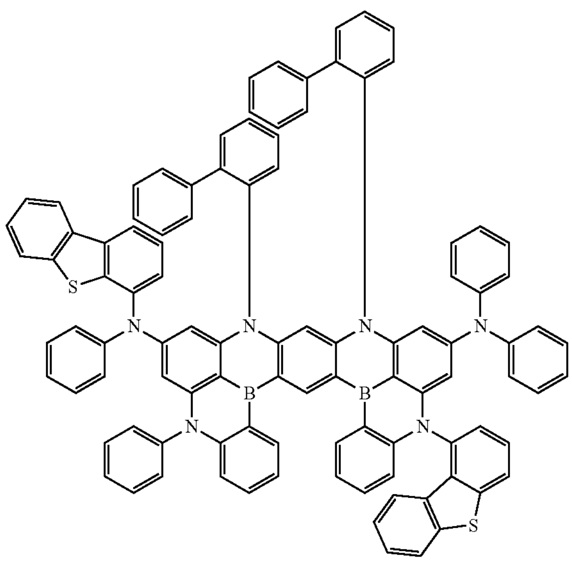
123
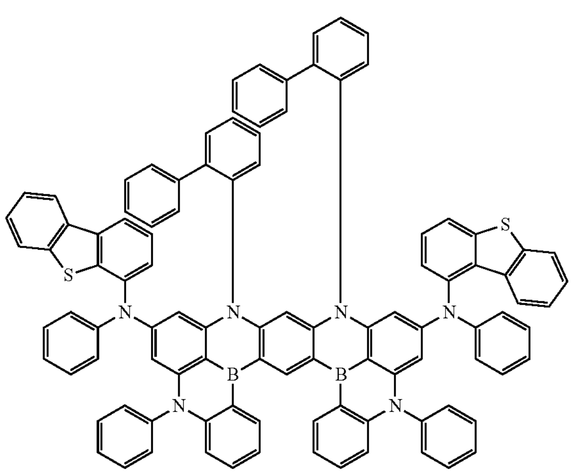
-continued
124
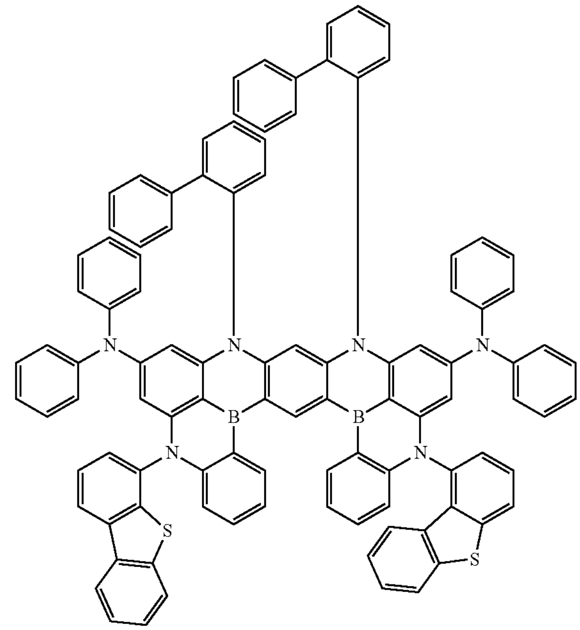
125
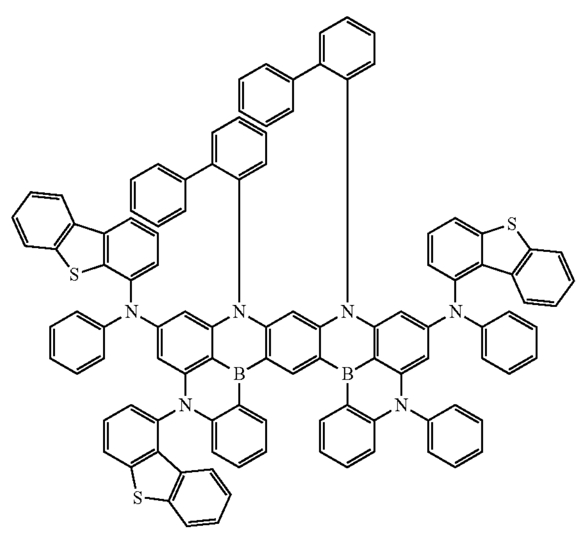

-continued
126
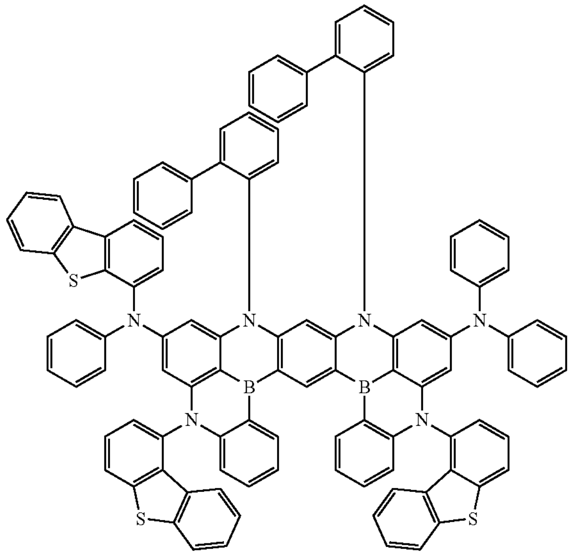
127
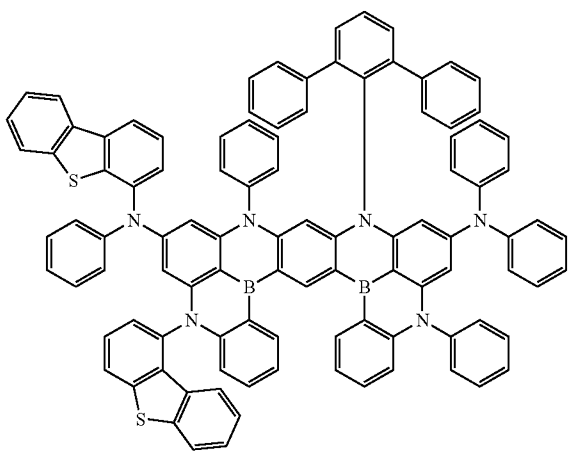
128
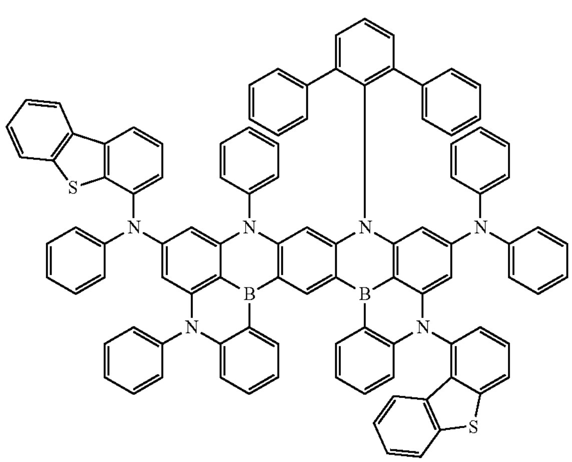
-continued
129
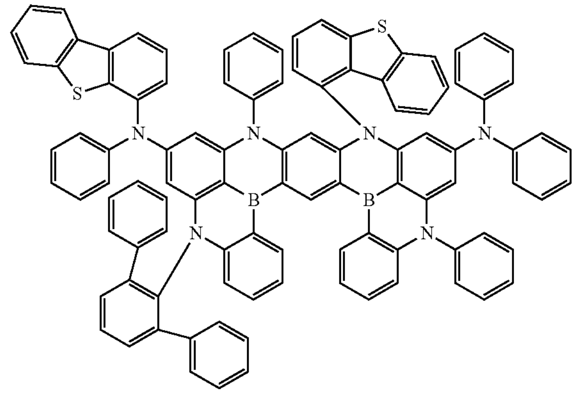
130
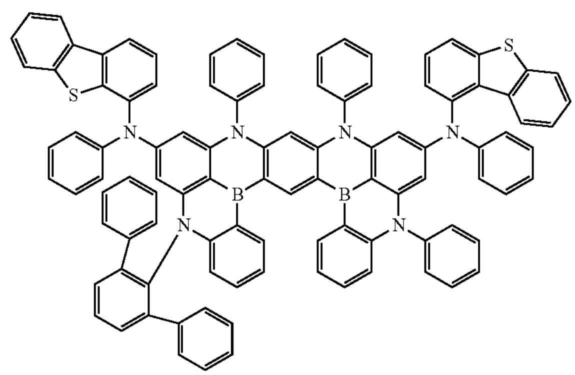
131
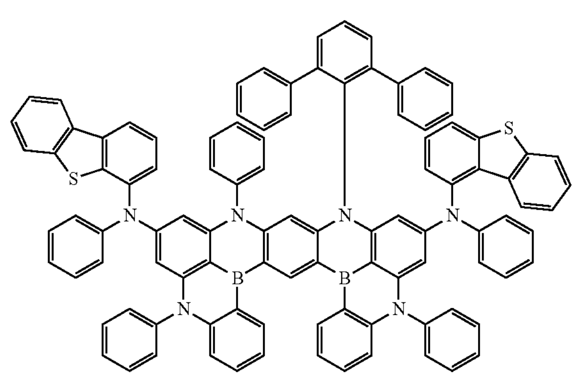

132
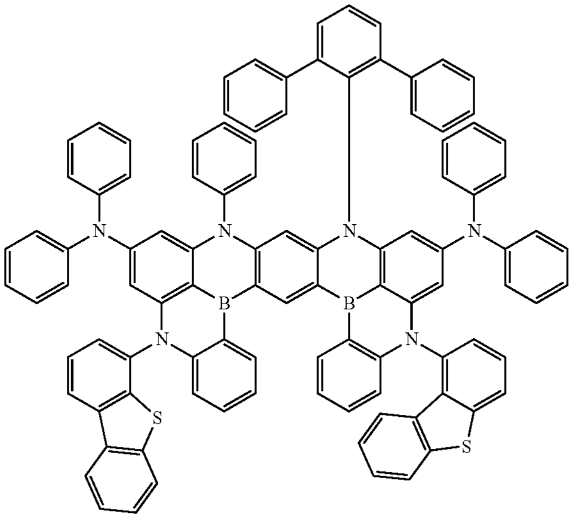
133
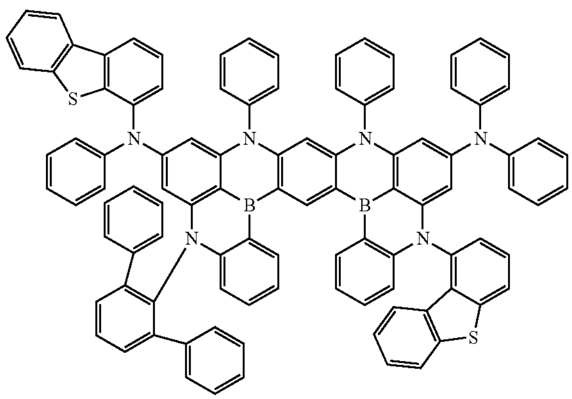
134
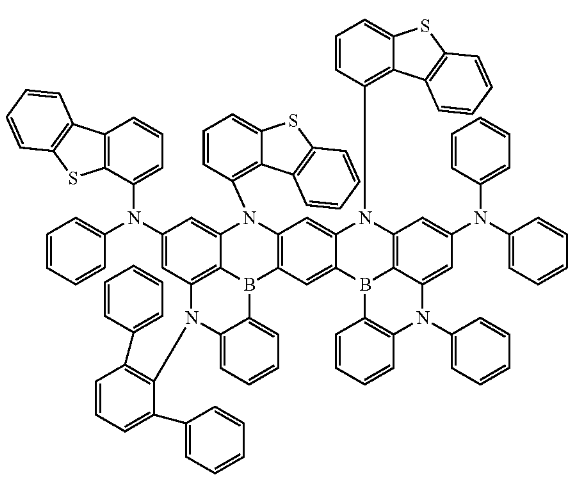
135
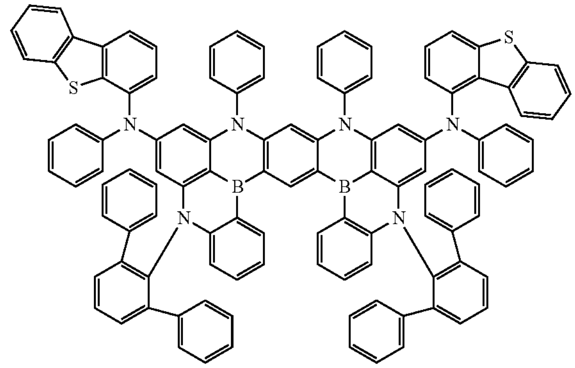
136
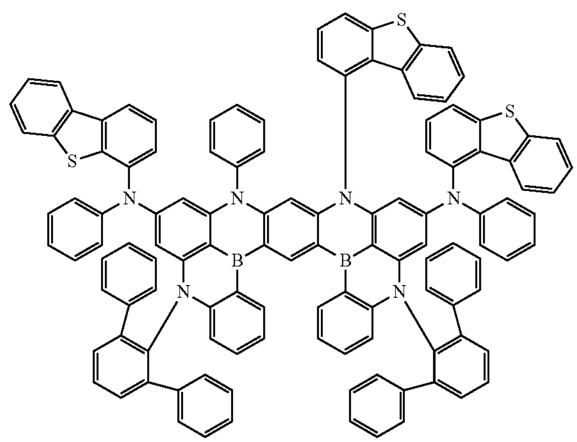
137
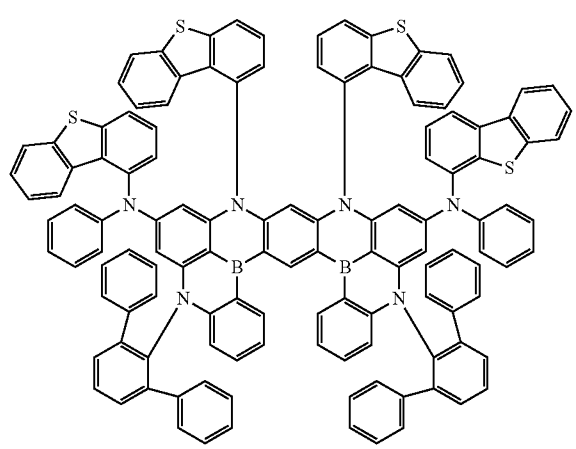

-continued
138
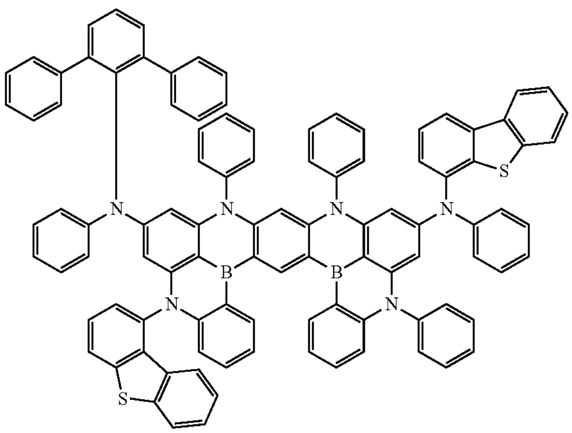
139
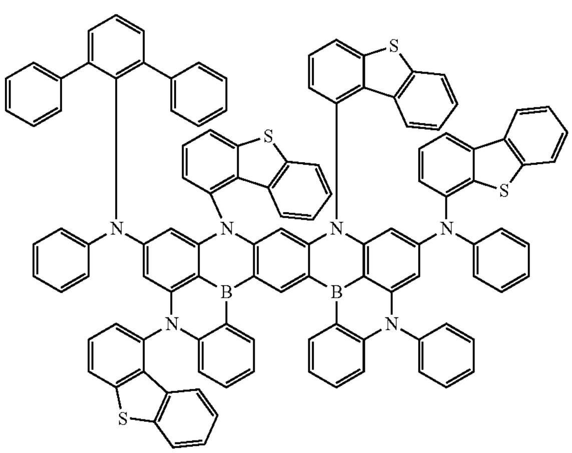
140
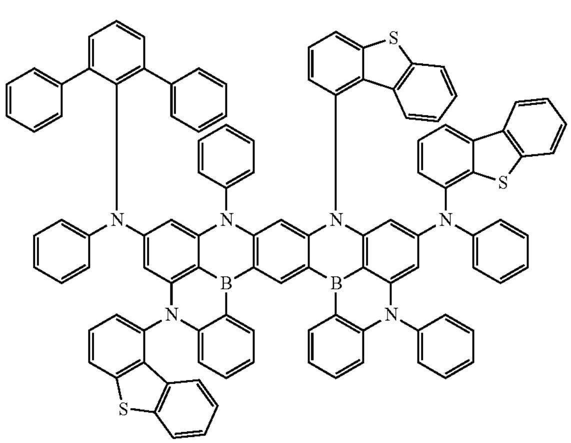
-continued
141
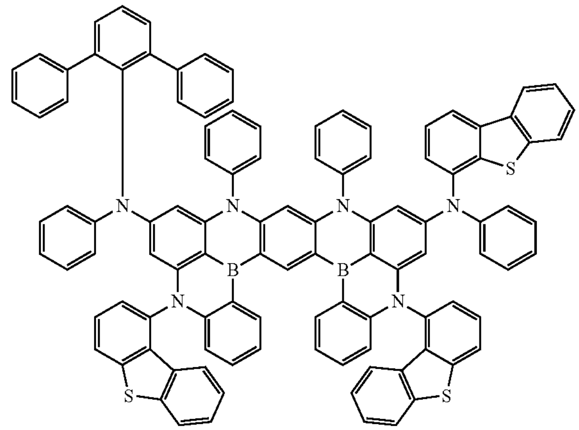
142
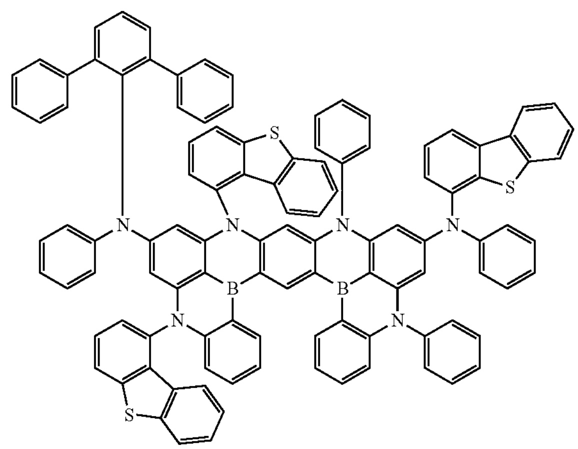
143
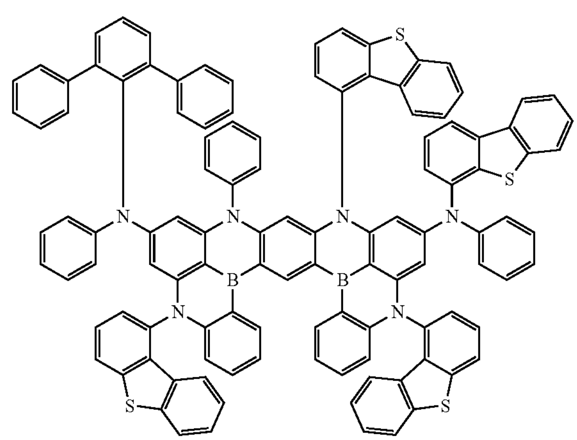

-continued
144
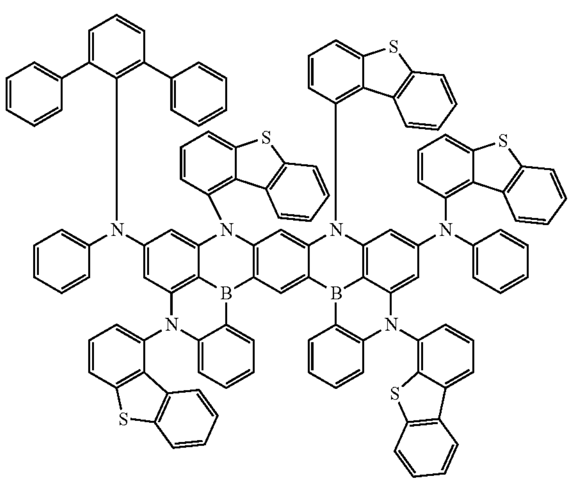
145
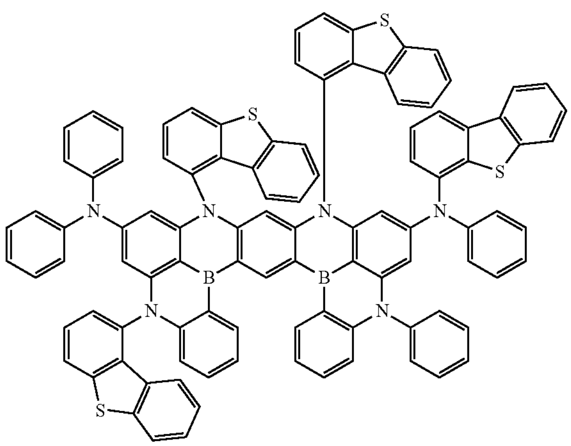
-continued
147
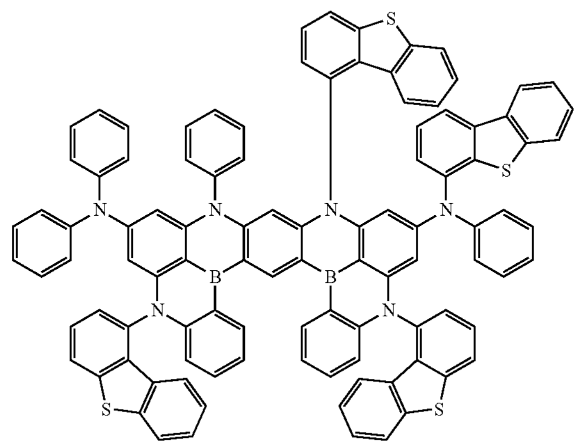
148
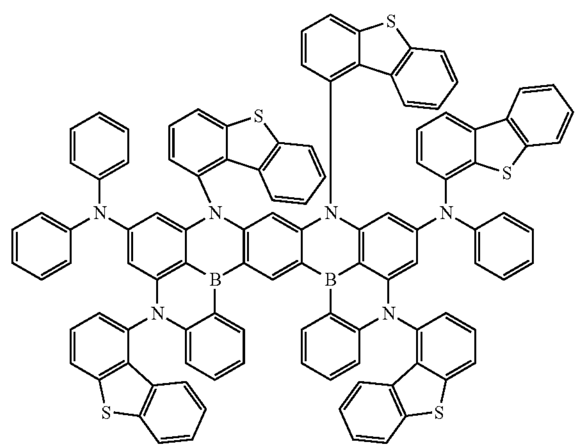
149
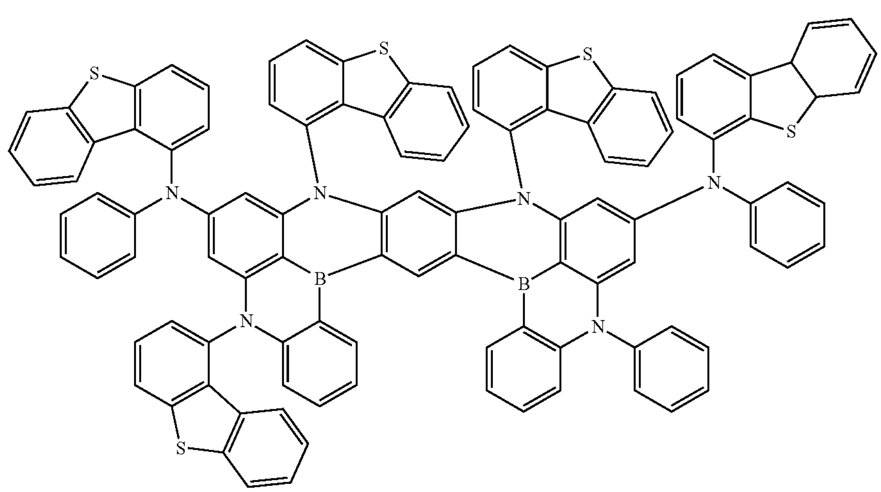

-continued
150
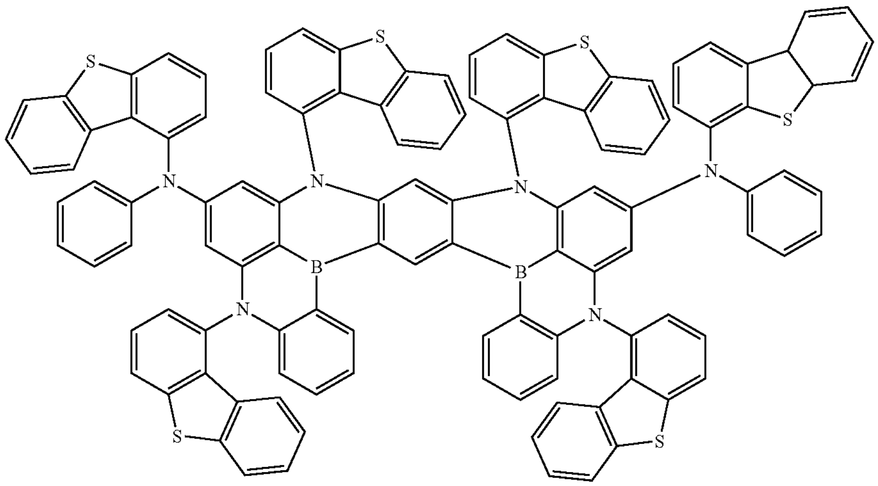
151
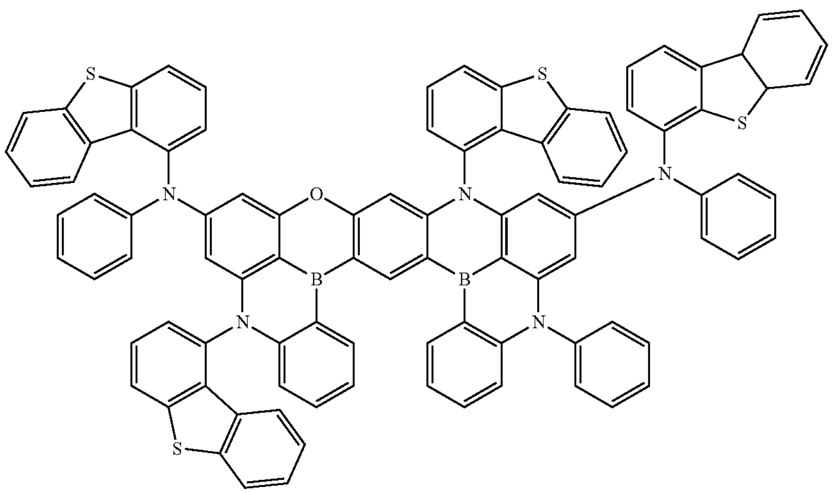
152
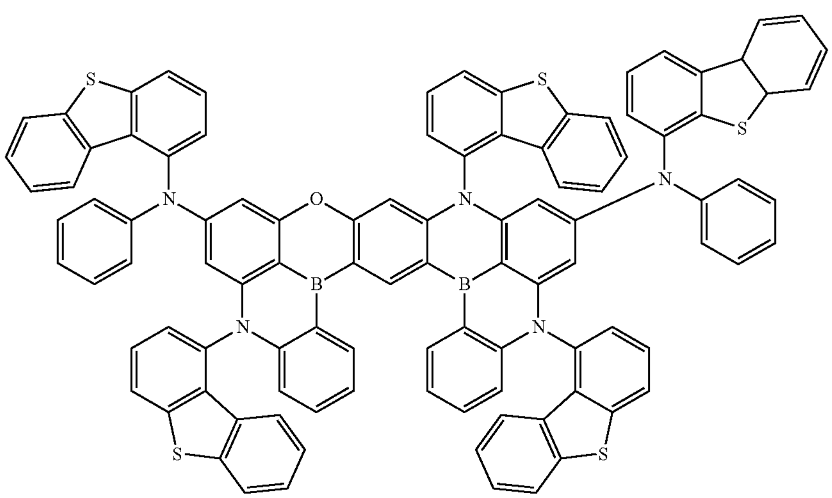

-continued
153
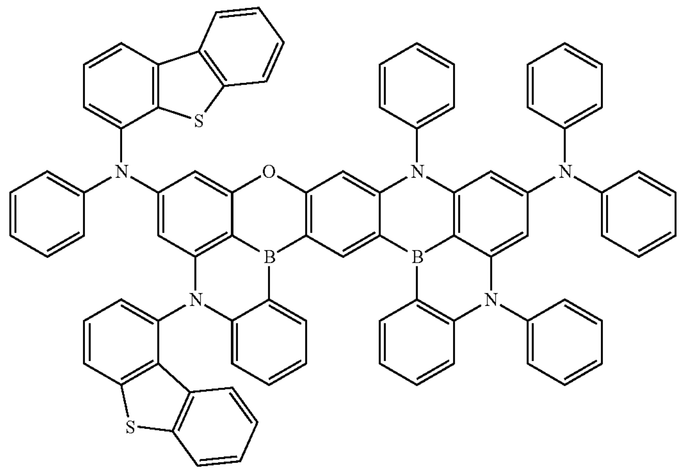
154
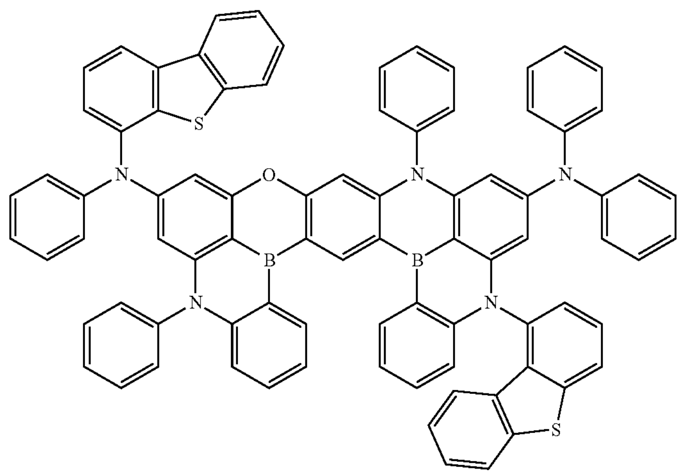
155
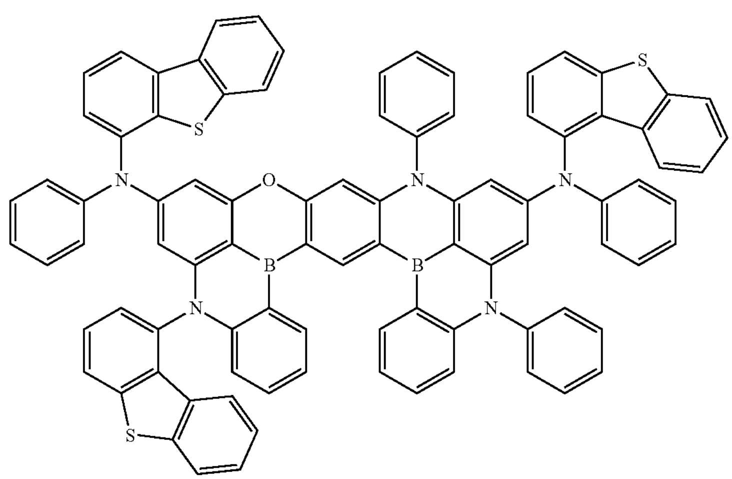

-continued
156
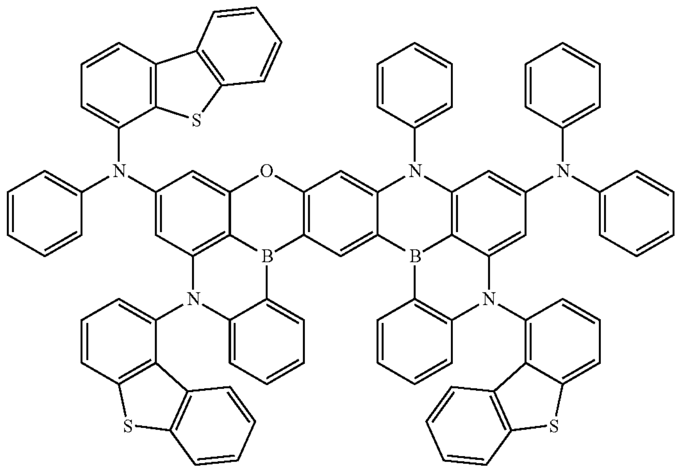
157
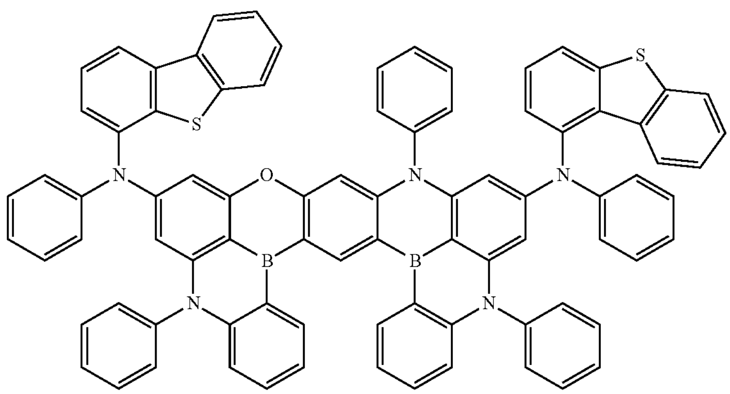
158
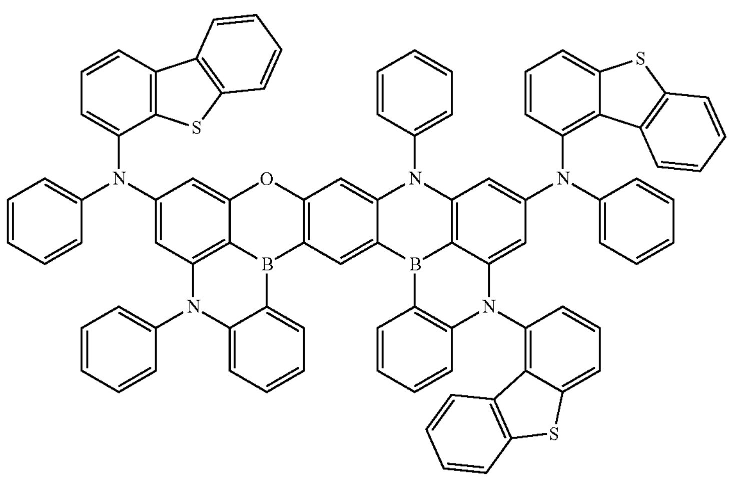

-continued
159
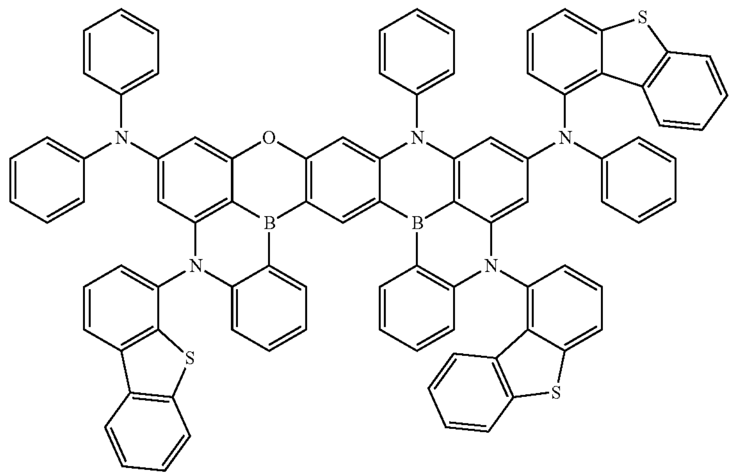
160
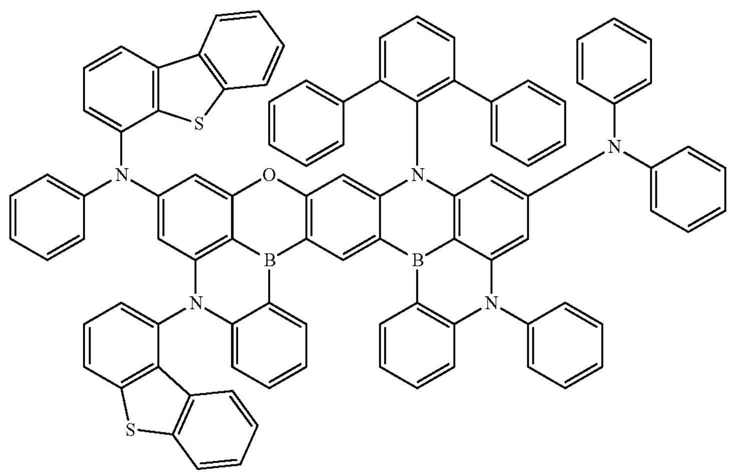
161
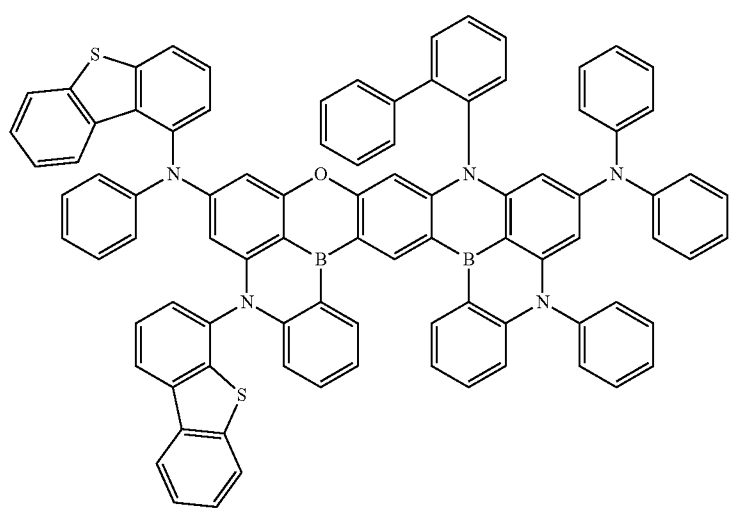

-continued
162
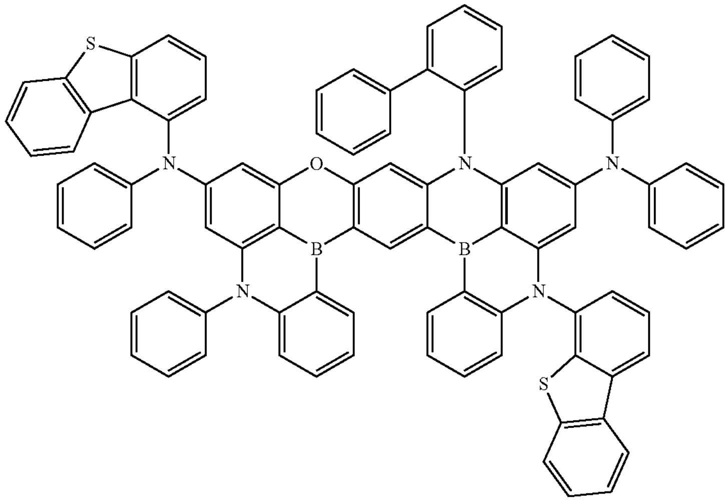
163
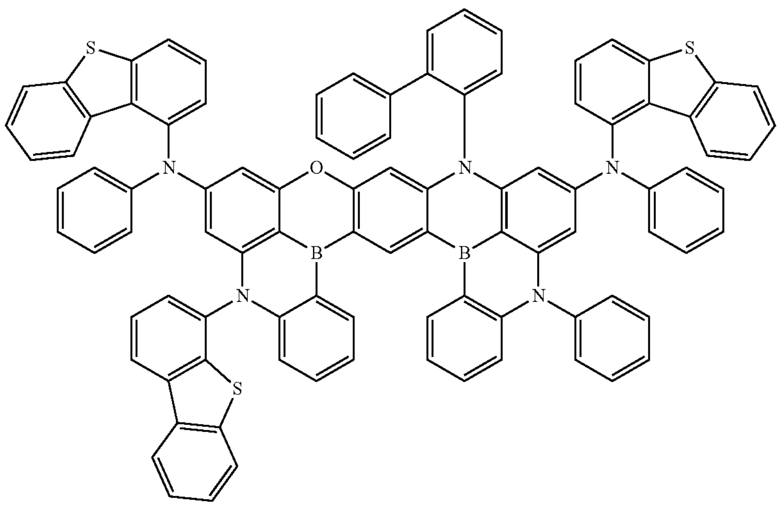
164
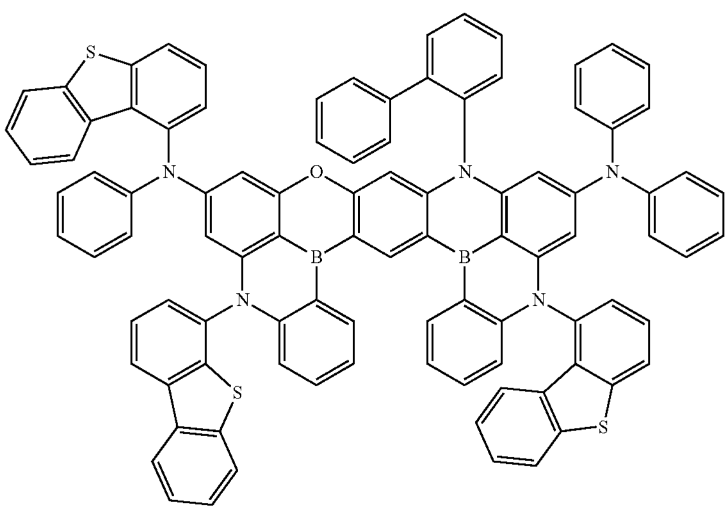

-continued
165
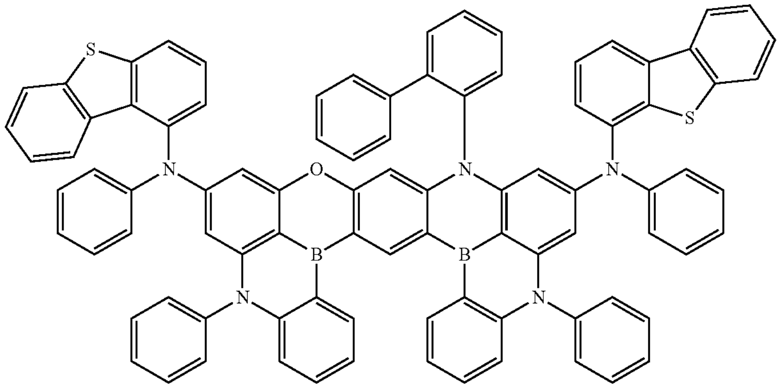
166
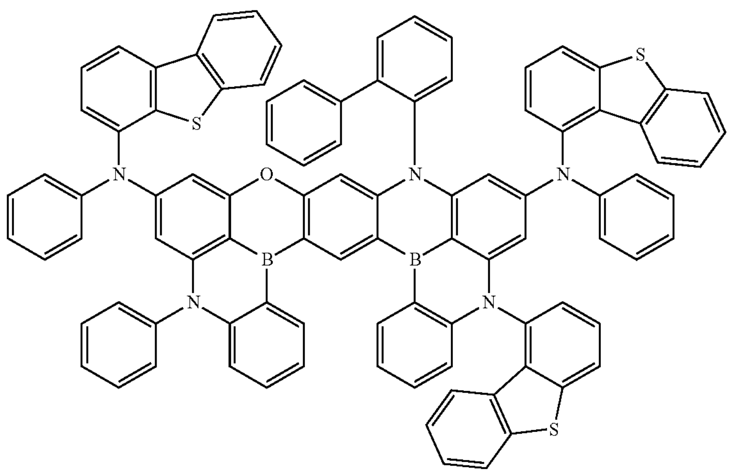
167
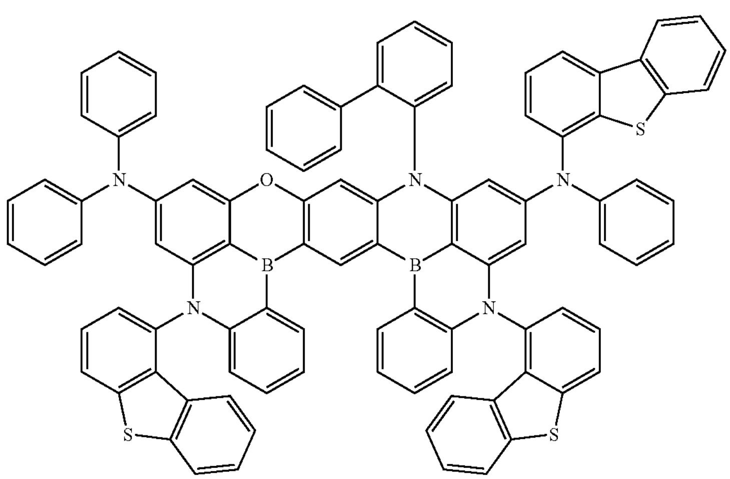

-continued
168
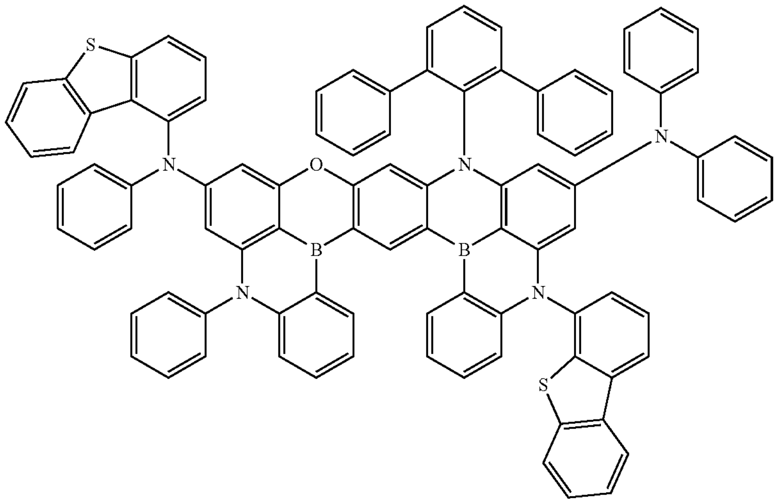
169
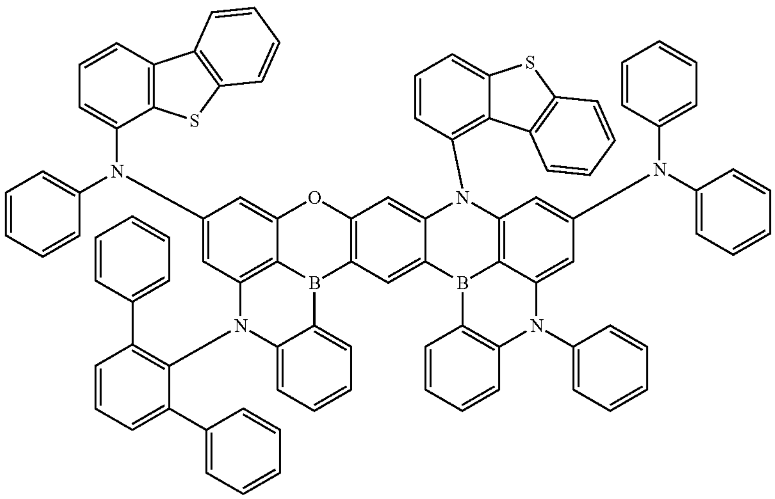
170
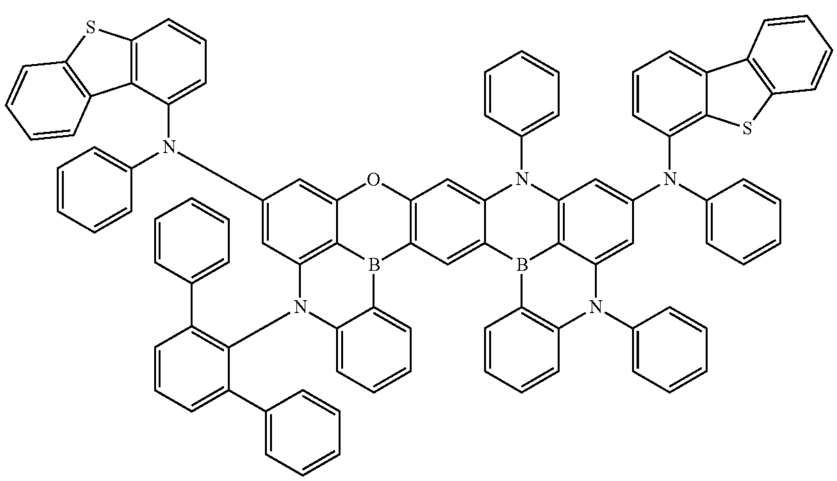

-continued
171
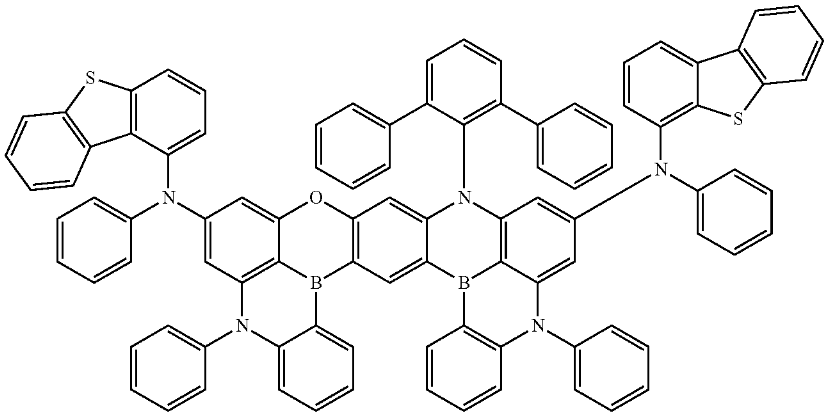
172
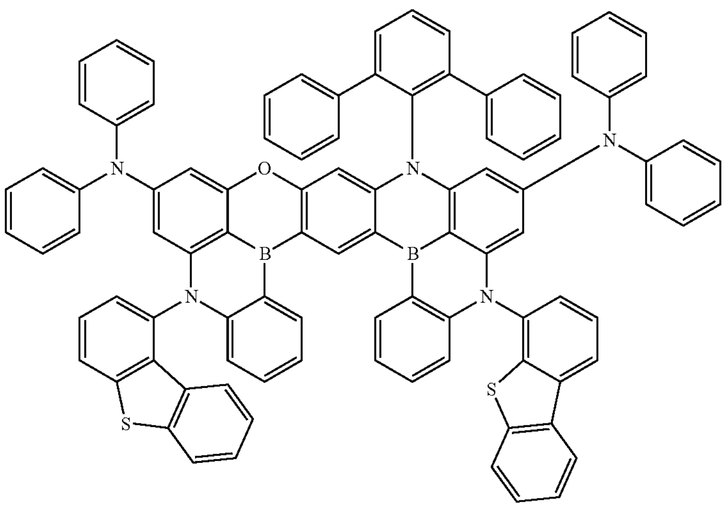
173
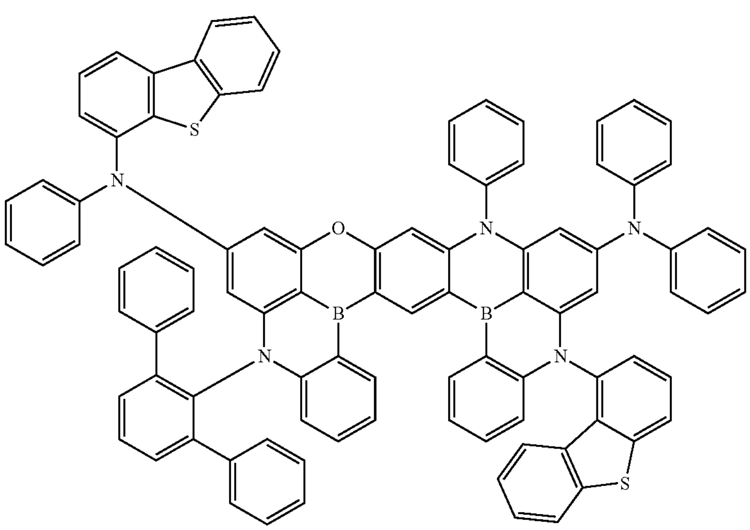

-continued
175
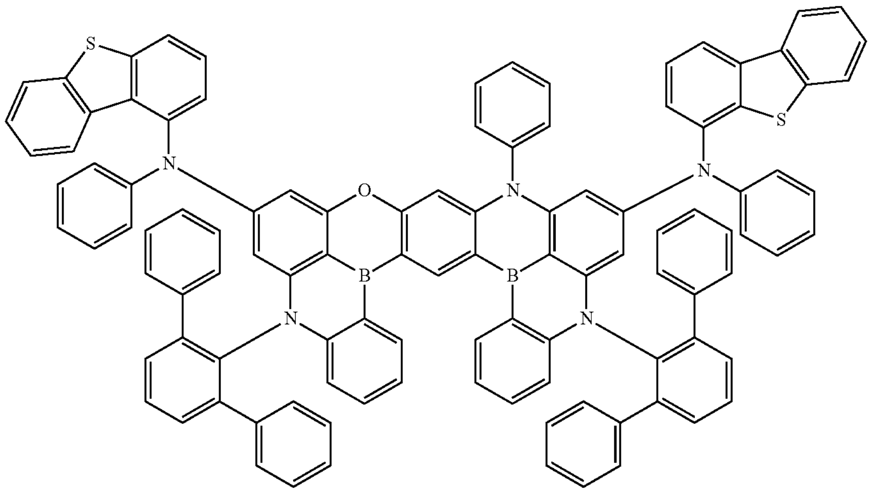
176
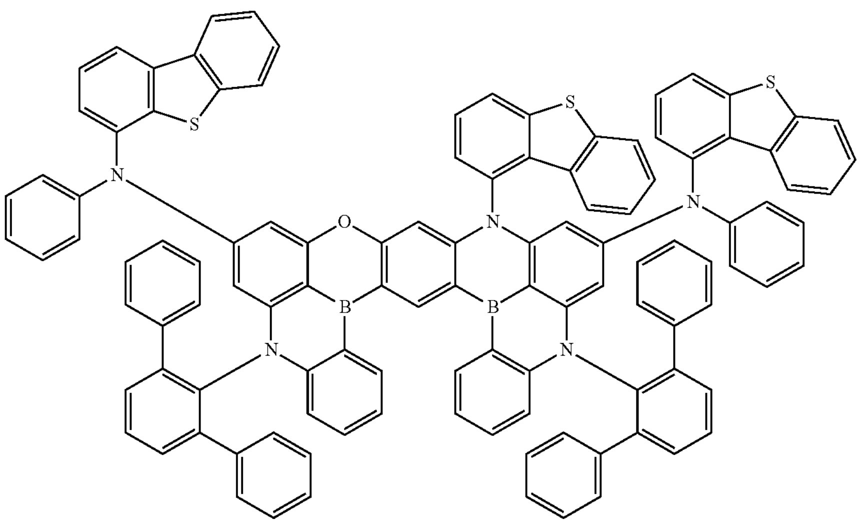
178
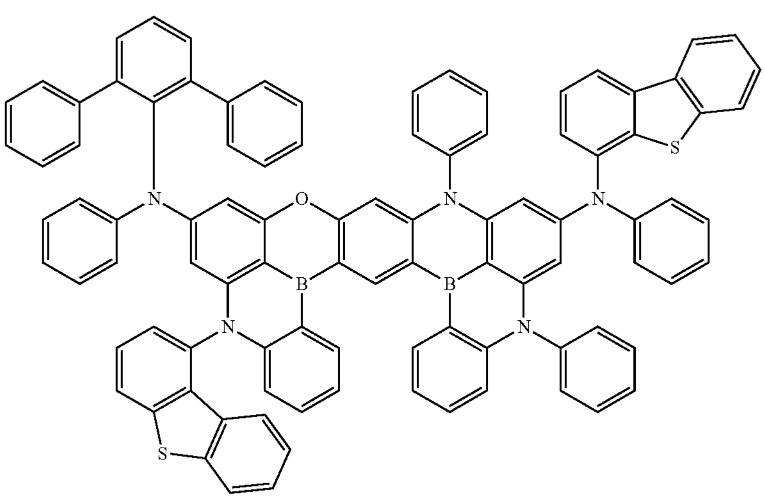

-continued
179
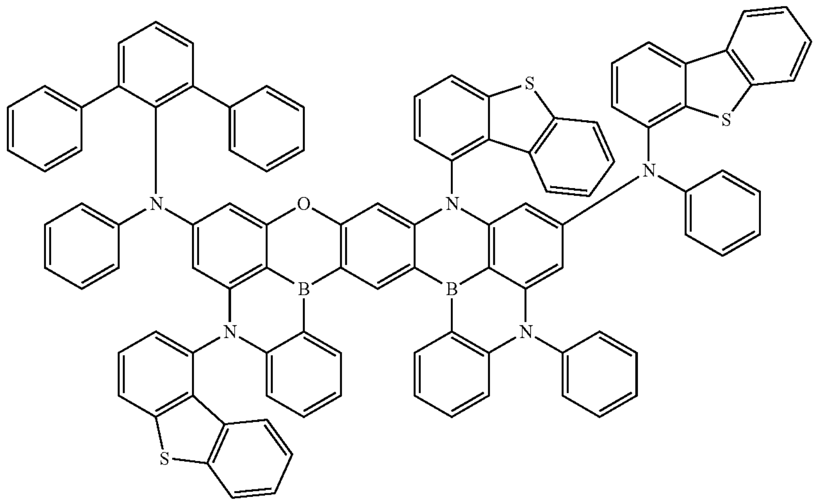
180
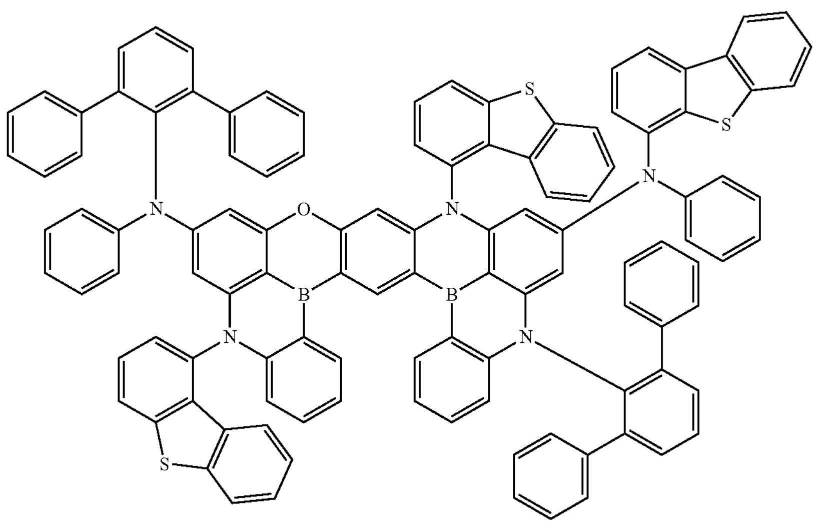
181
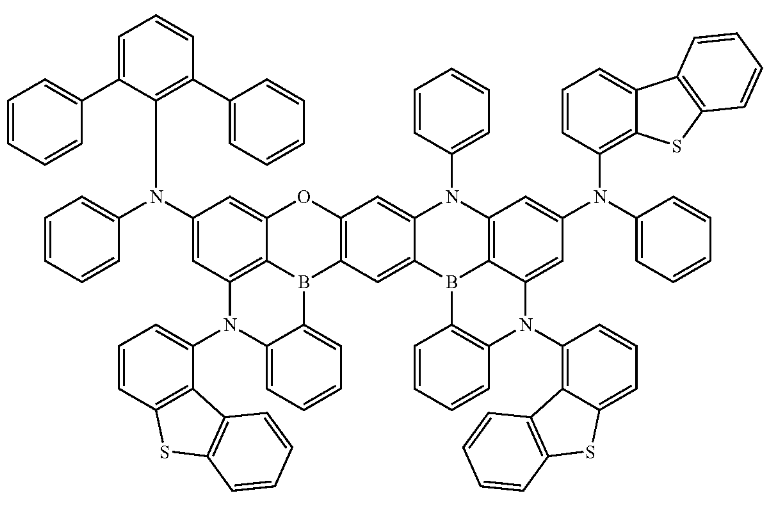

-continued
182
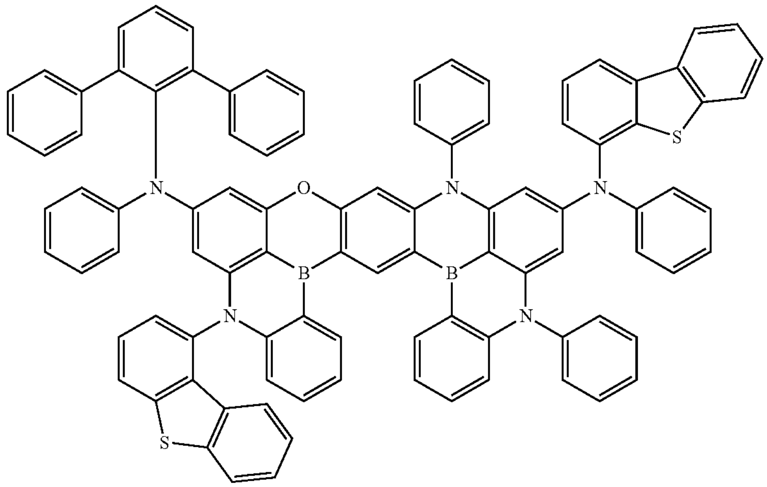
183
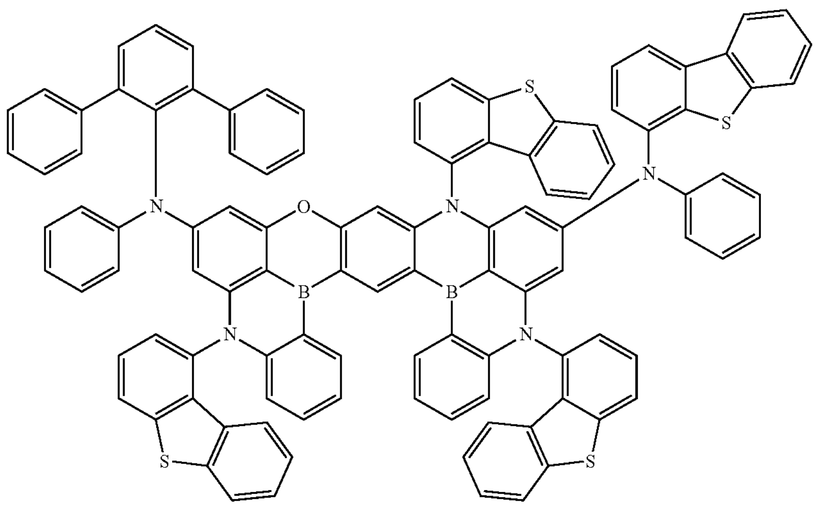
185
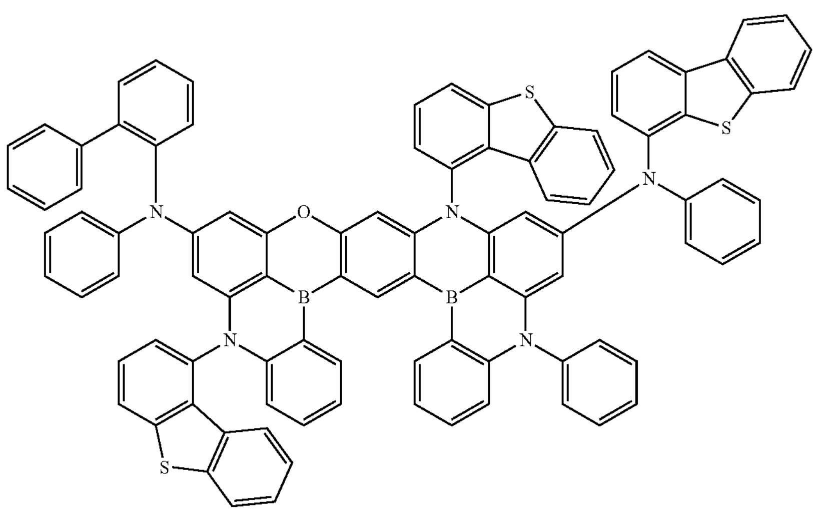

-continued
186
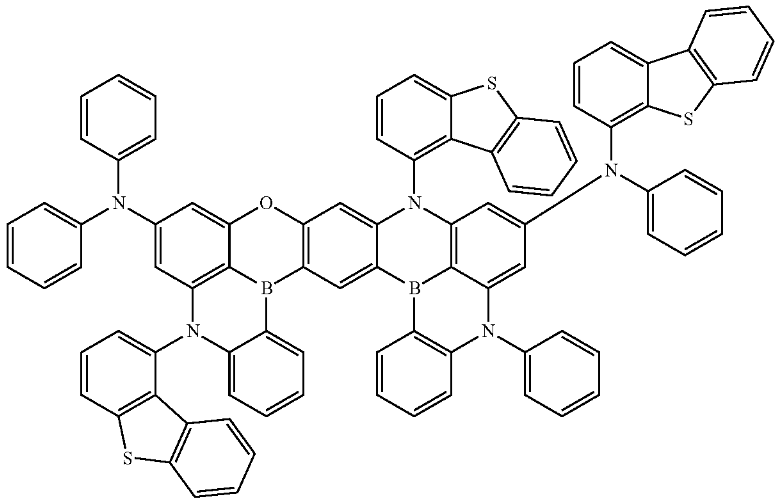
187
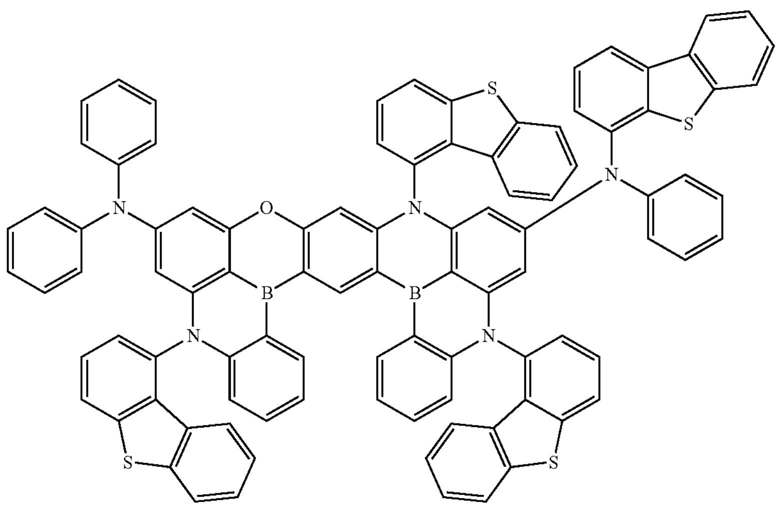
188
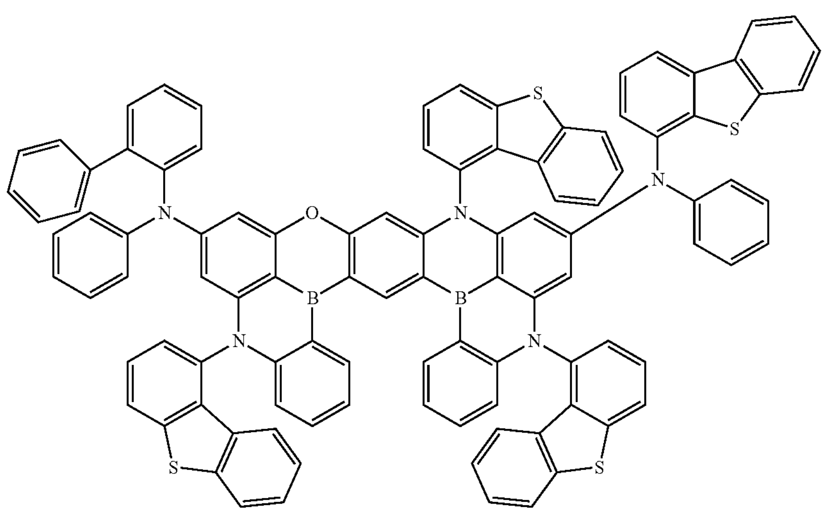

-continued
189
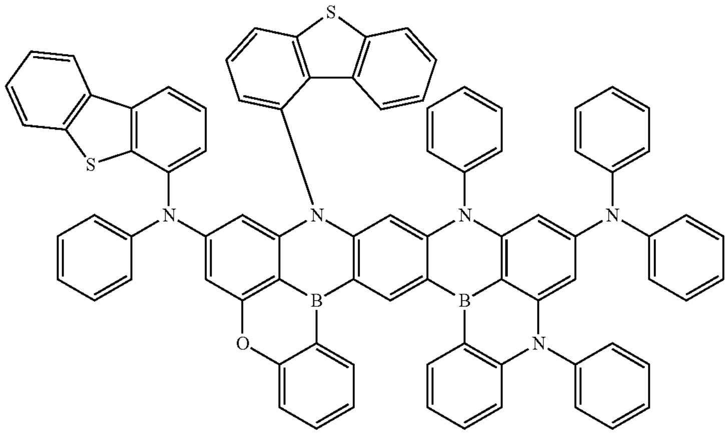
190
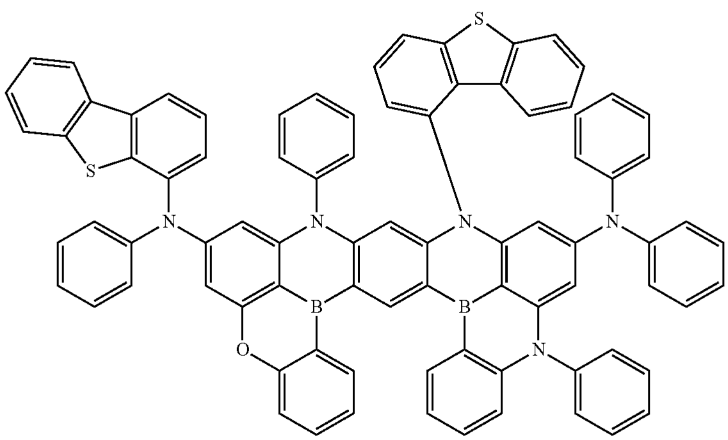
191
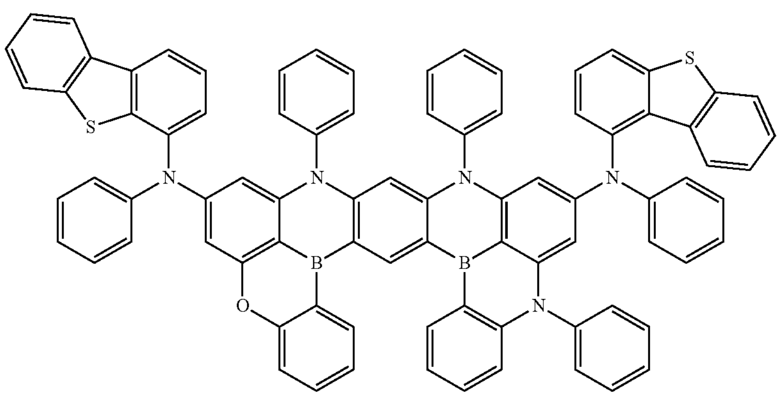

-continued
192
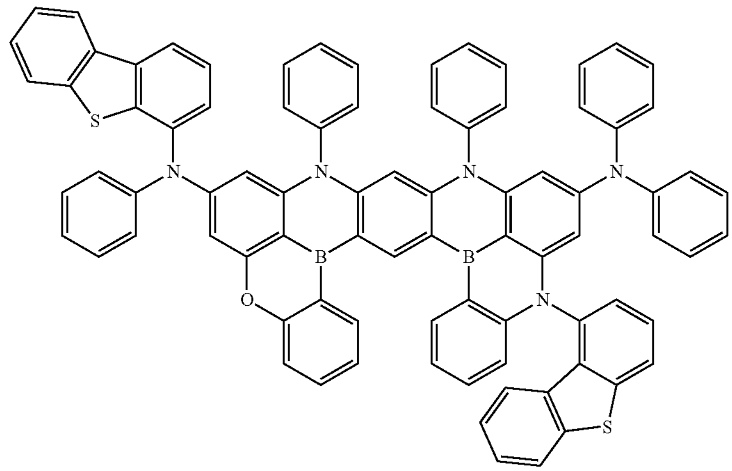
193
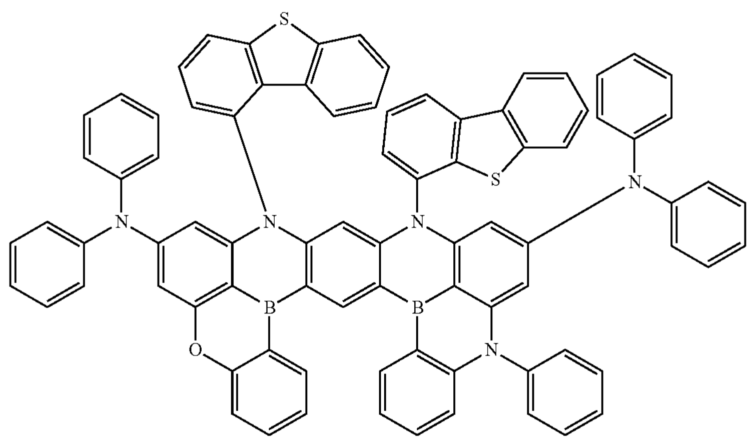
194
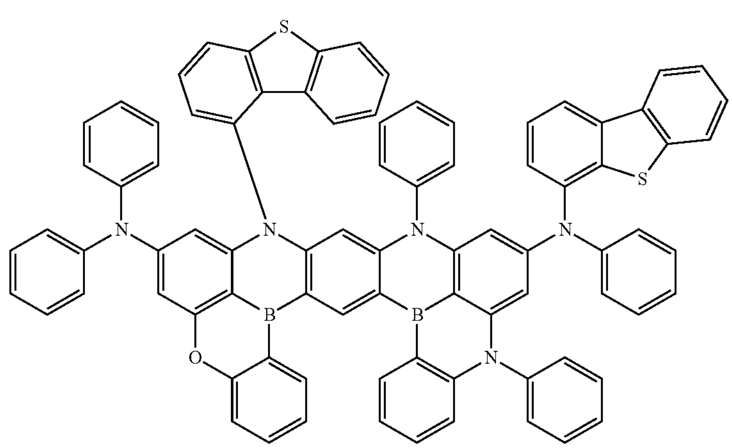

-continued
195
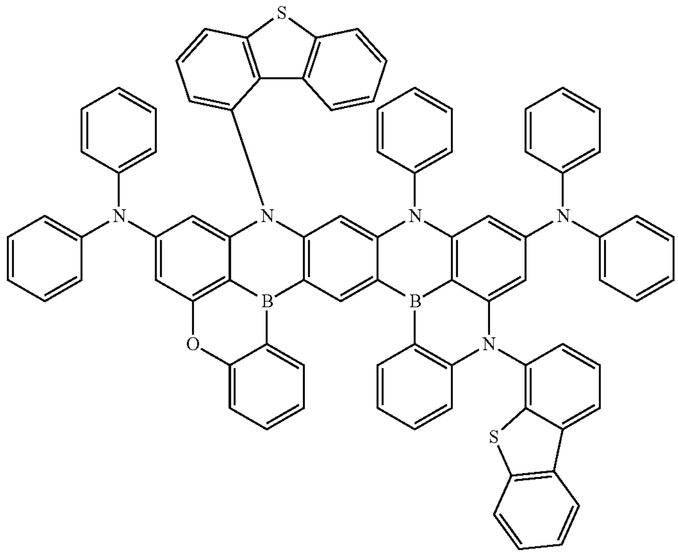
196
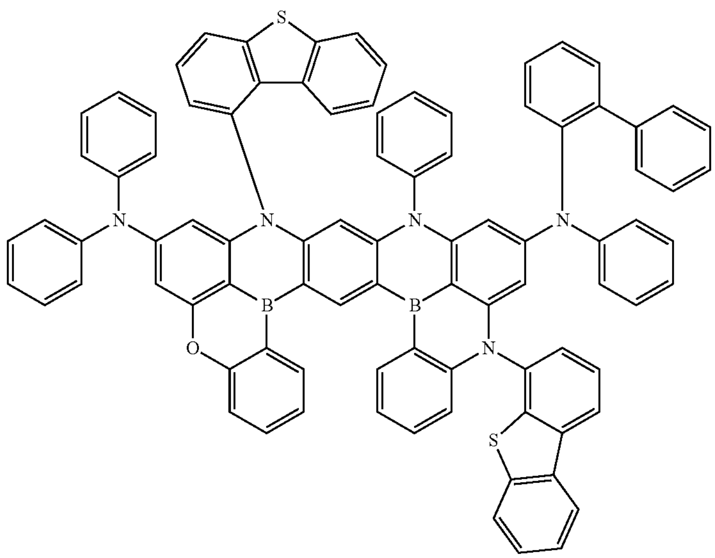
197
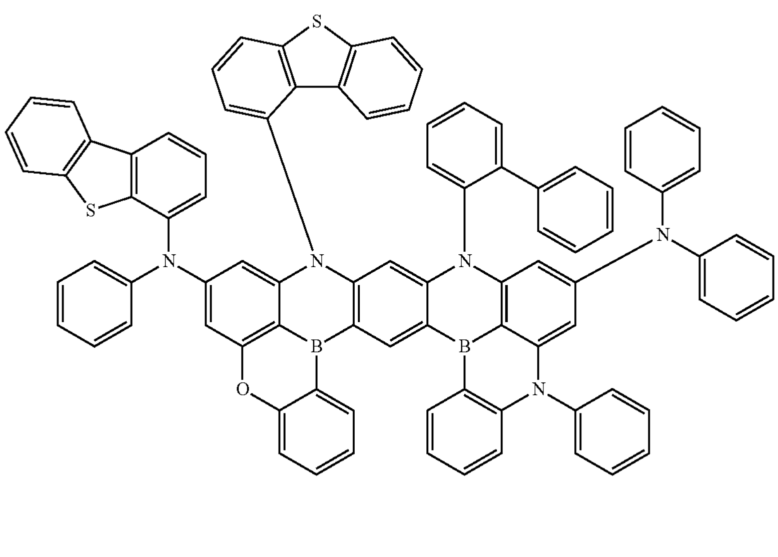

-continued
198
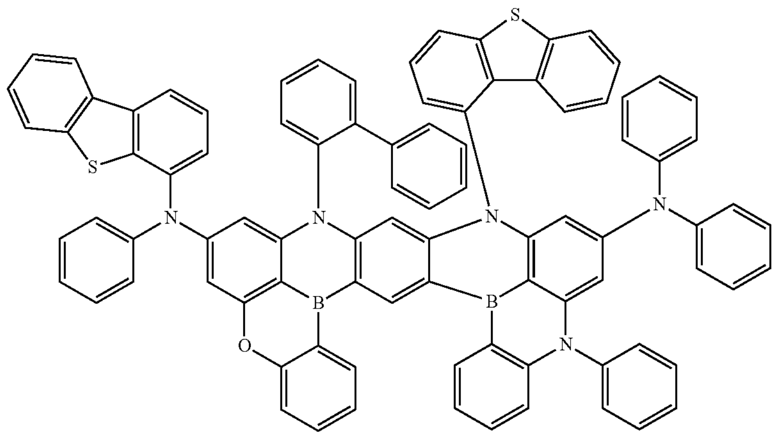
199
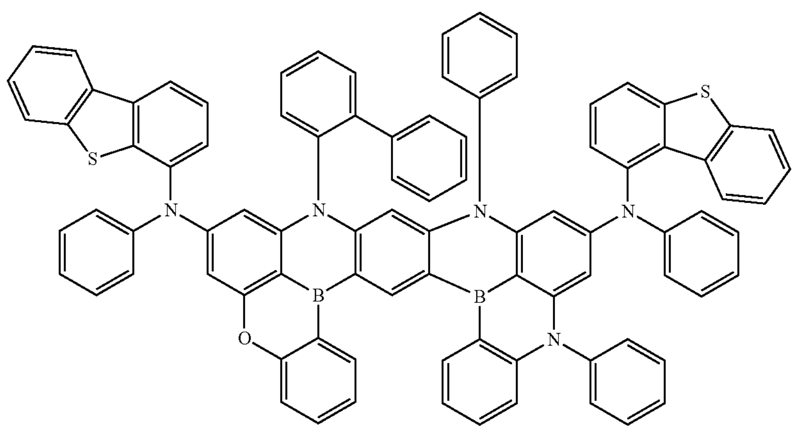
200
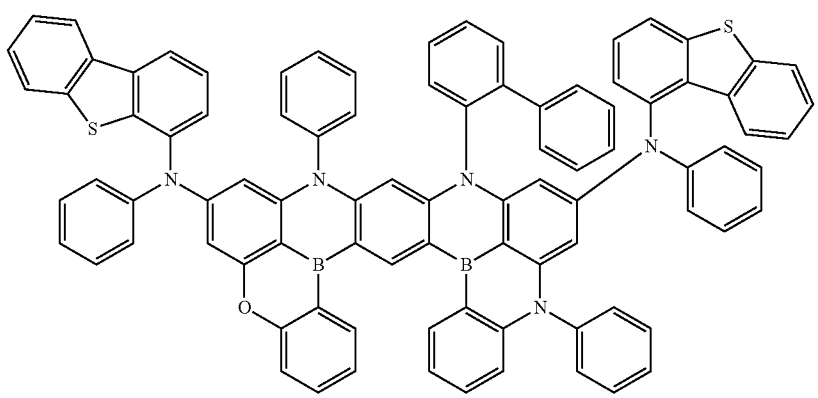
201
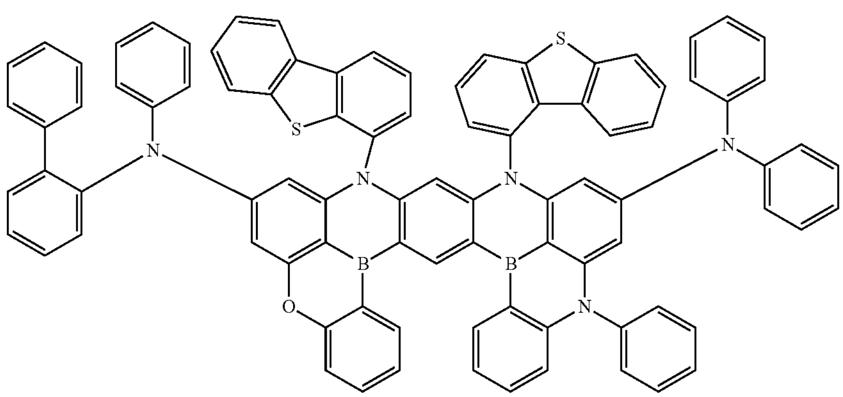

-continued
202
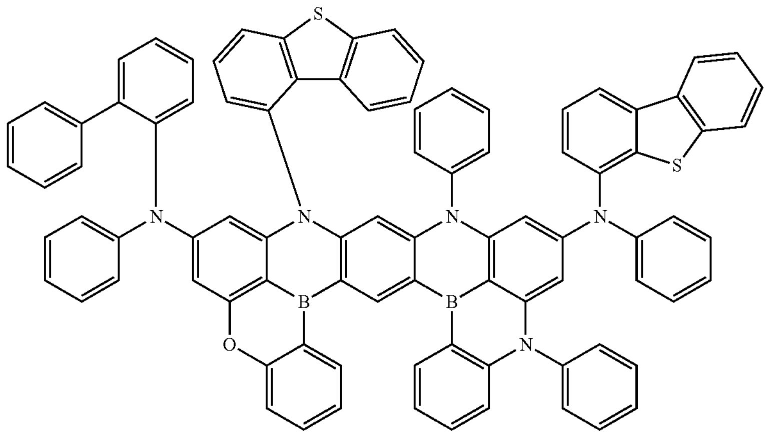
203
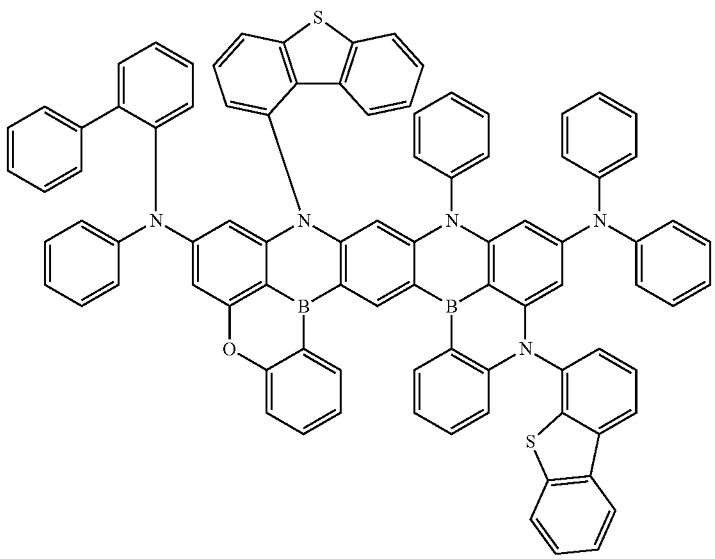
204
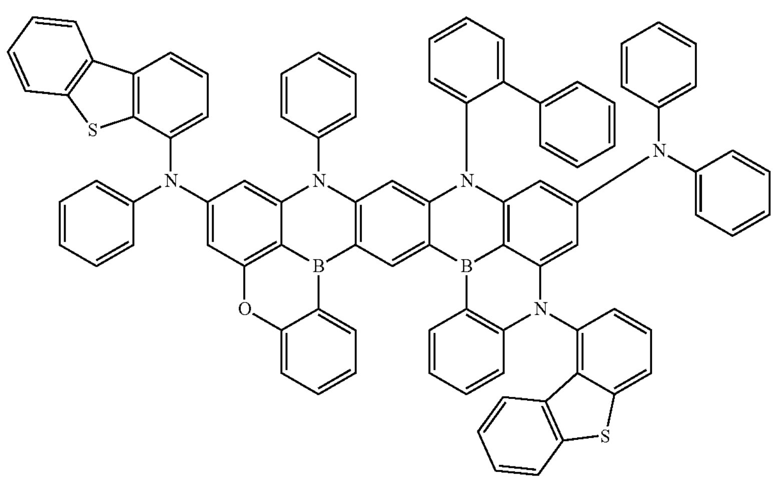

-continued
205
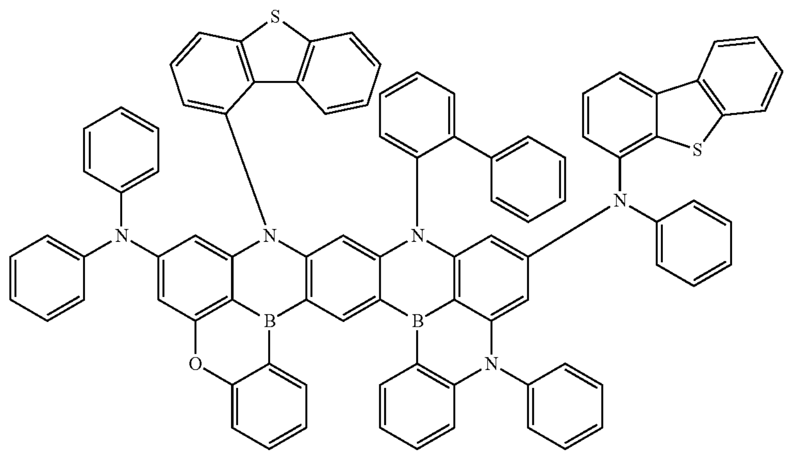
206
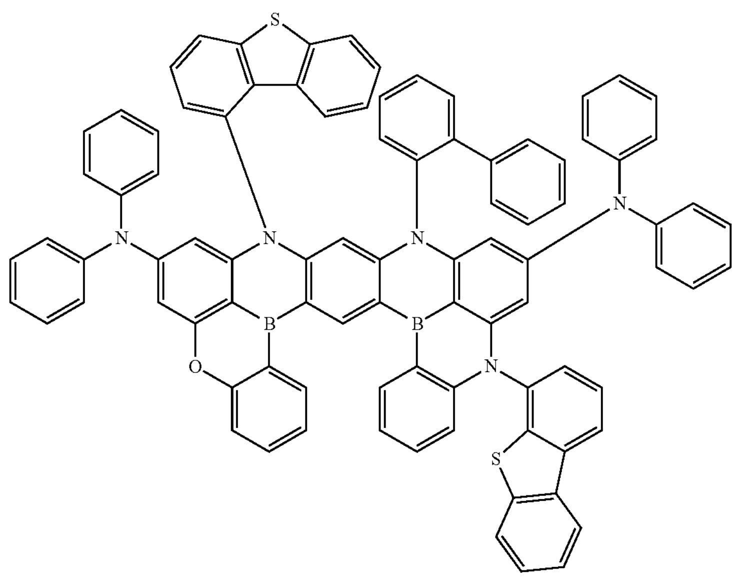
207
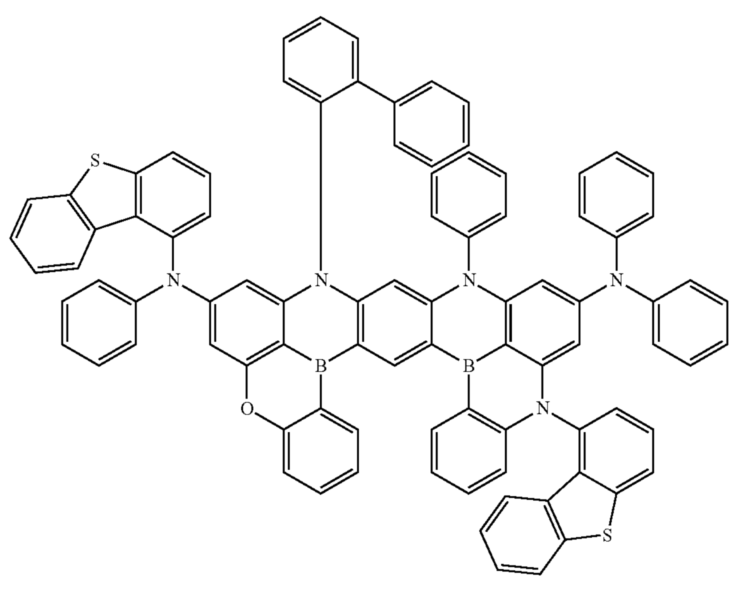

-continued
208
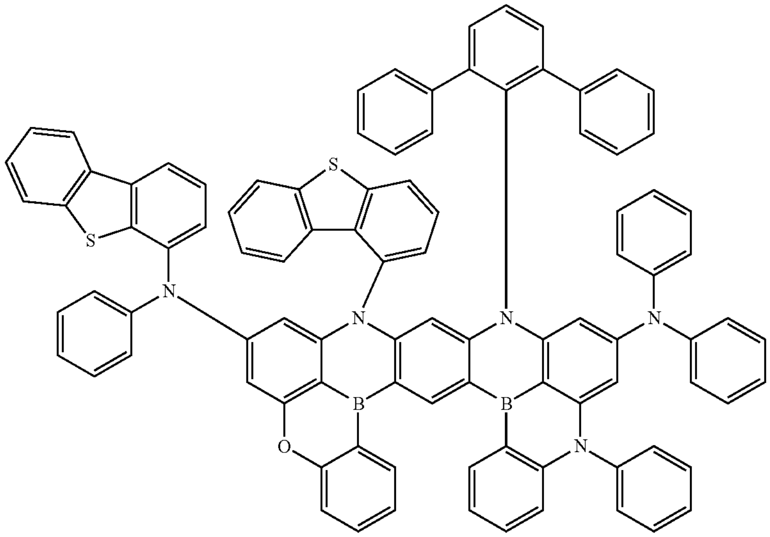
209
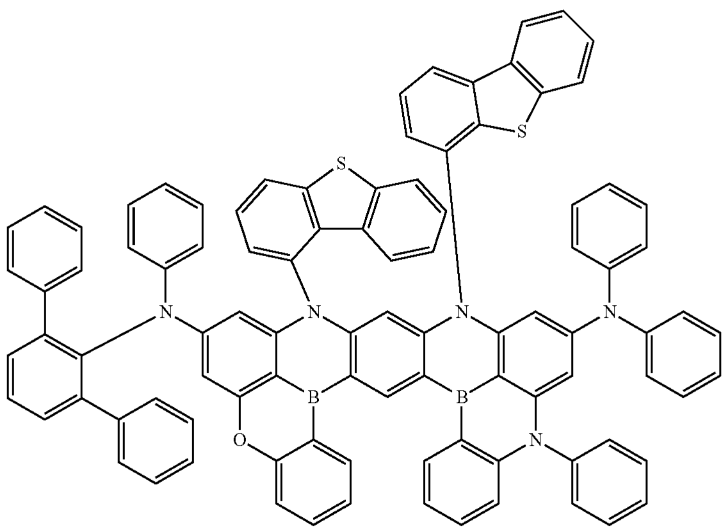
210
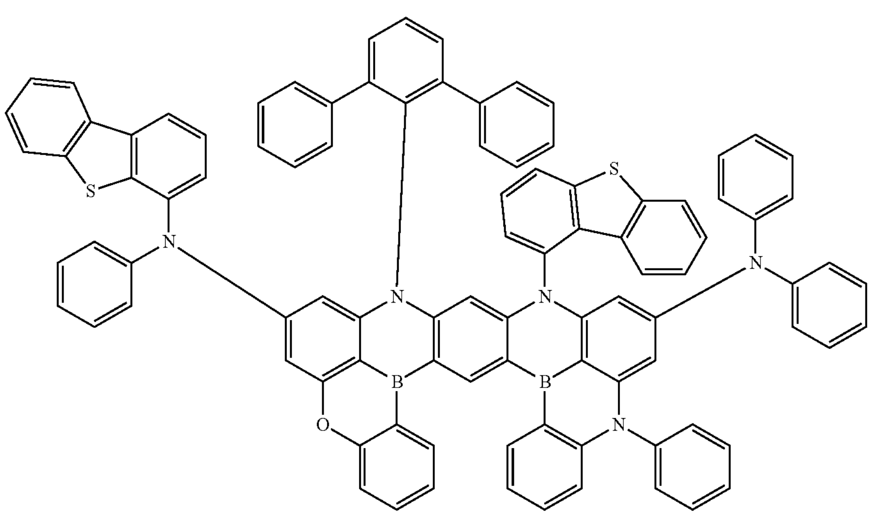

-continued
211
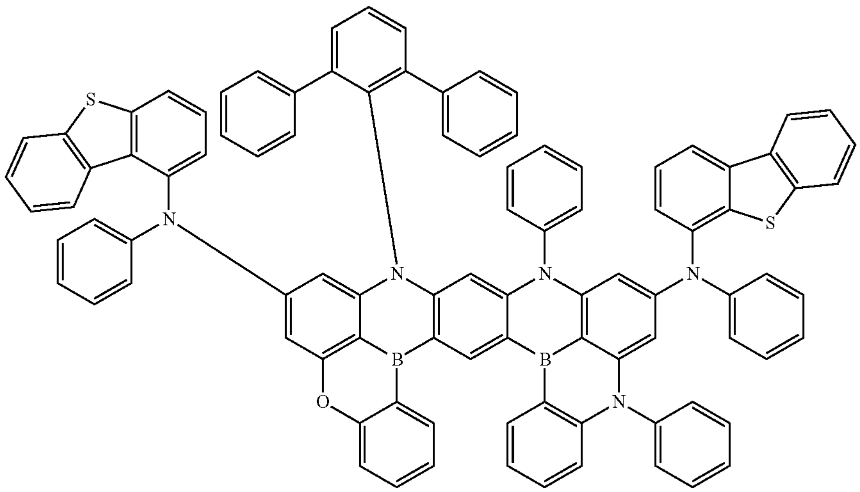
212
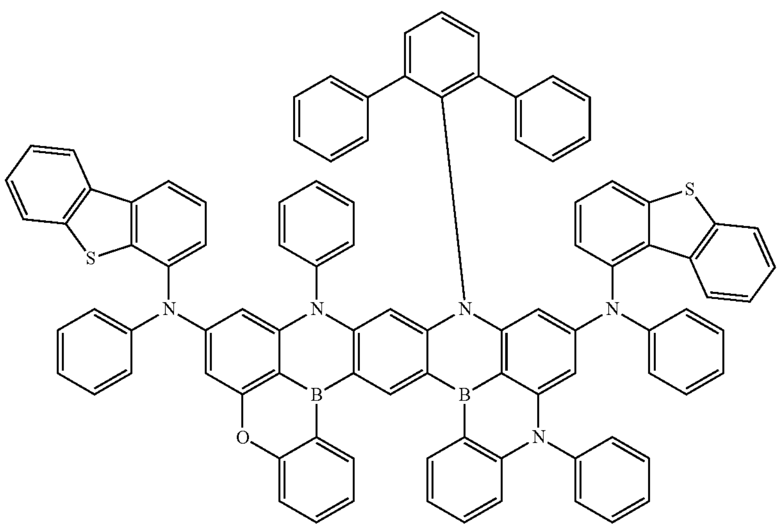
213
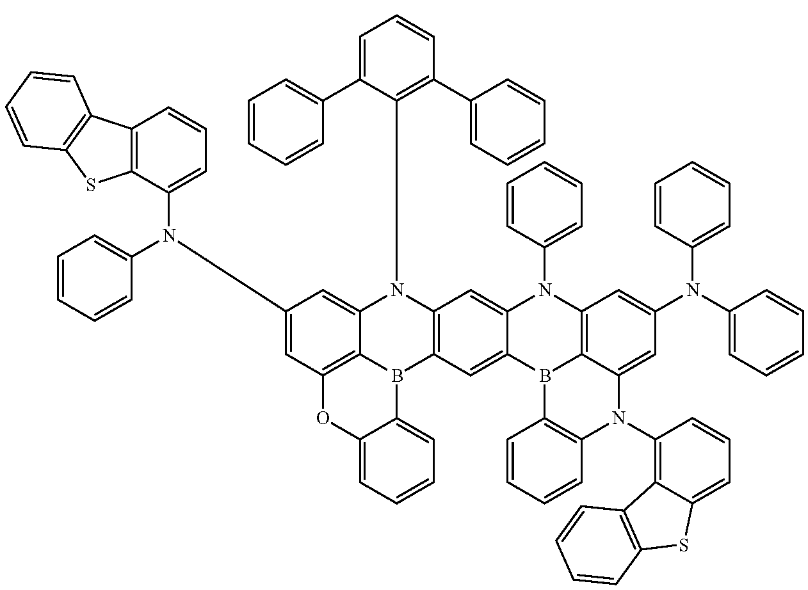

-continued
214
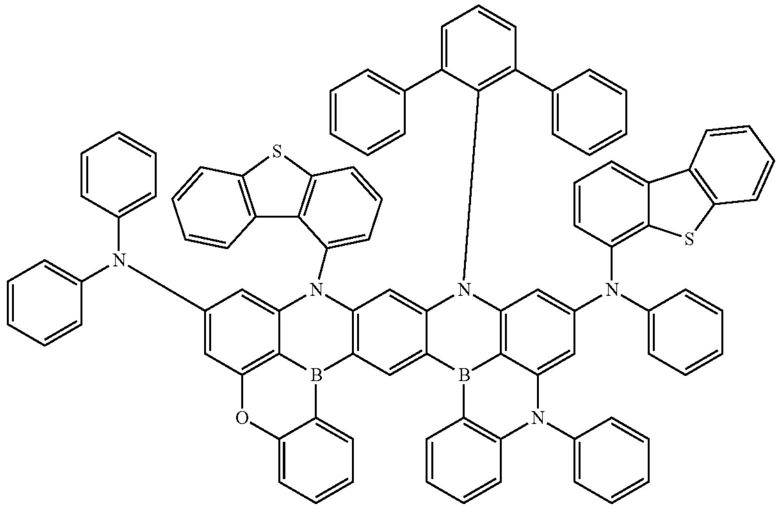
215
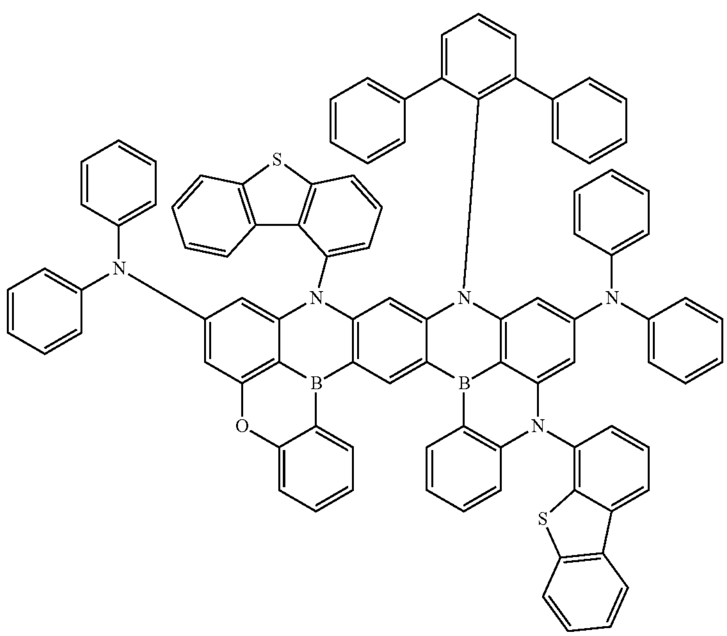

-continued
216
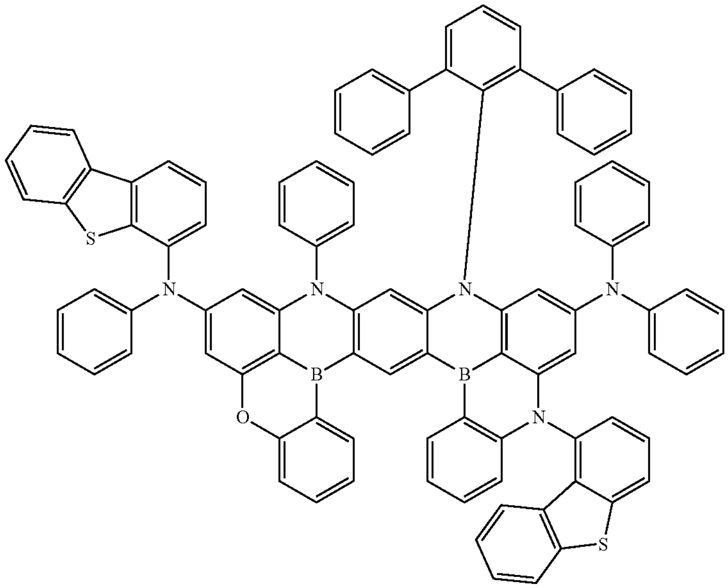
217
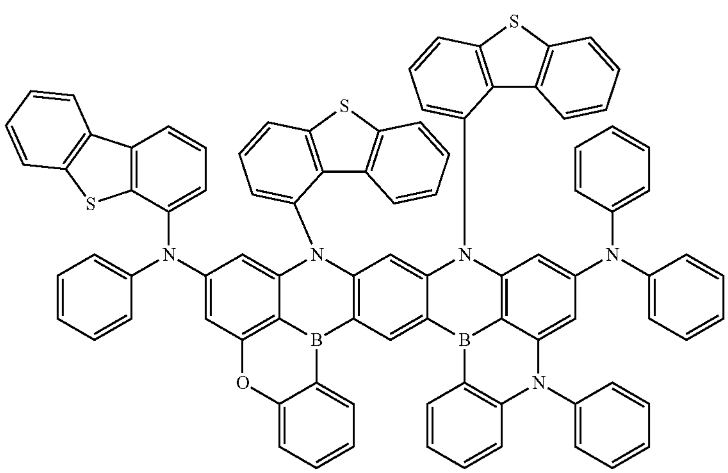
219
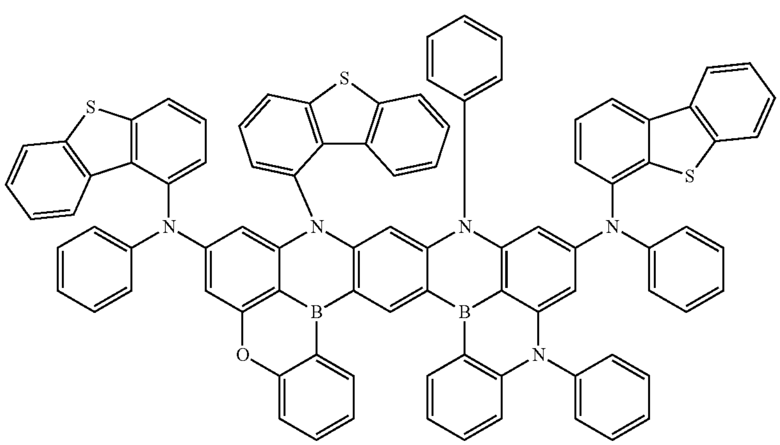

-continued
220
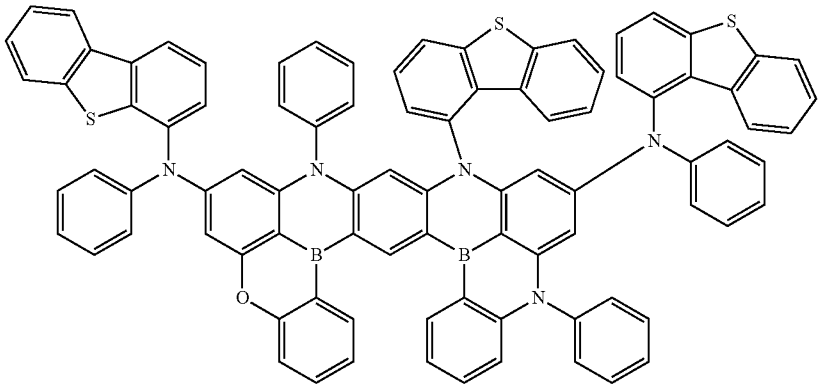
221
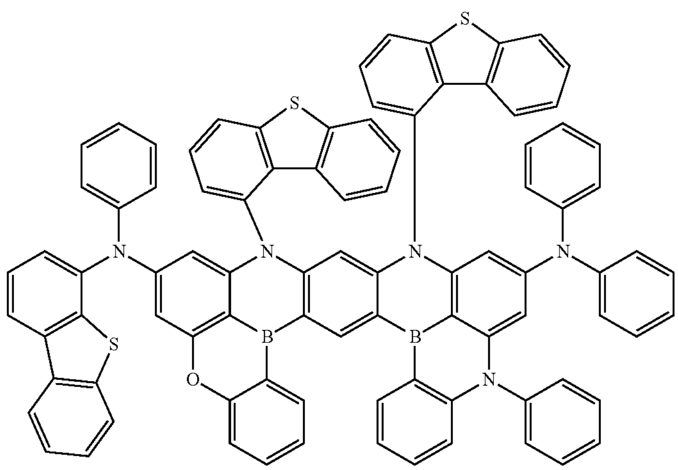
222
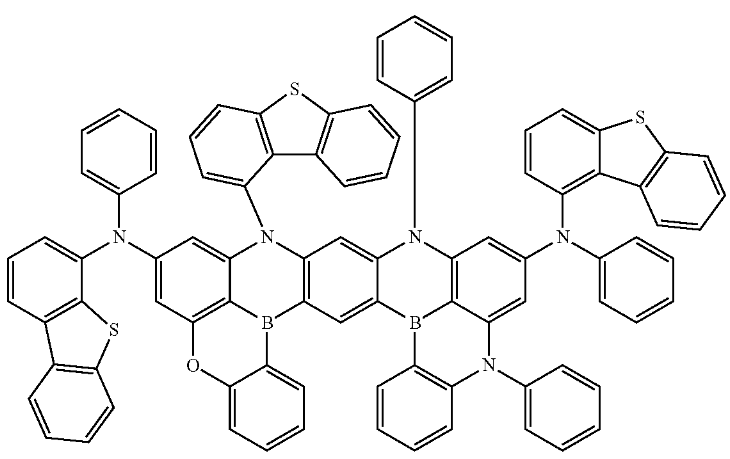

-continued
223
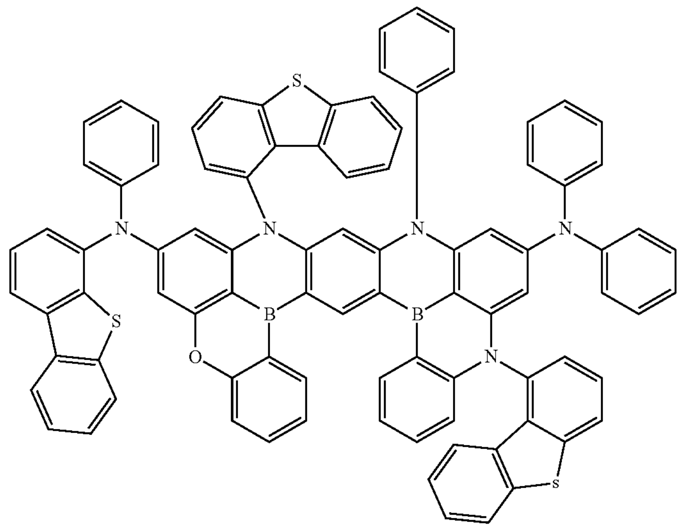
224
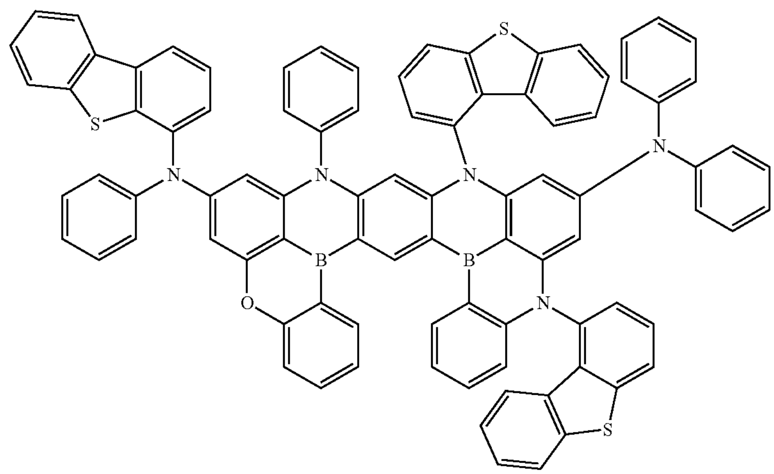
225
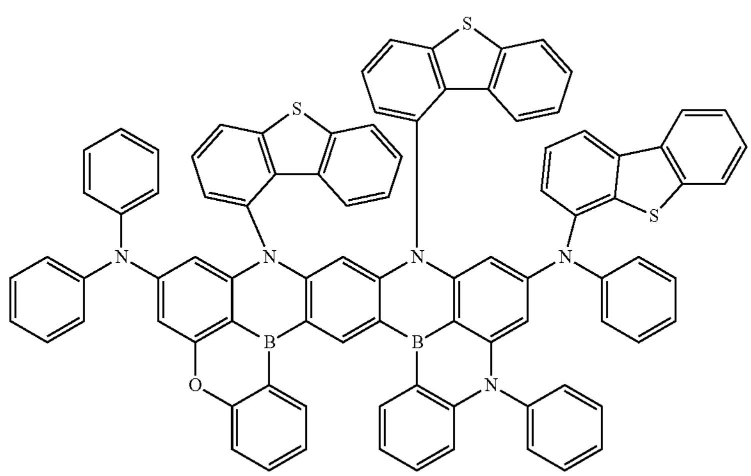

-continued
226
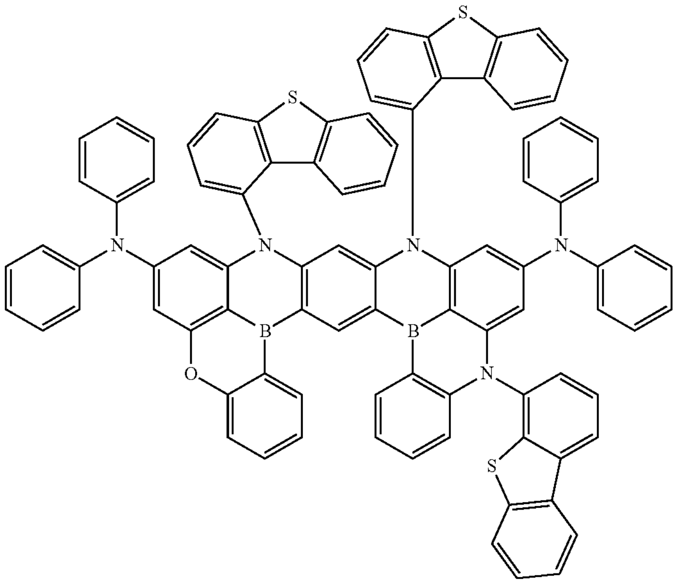
227
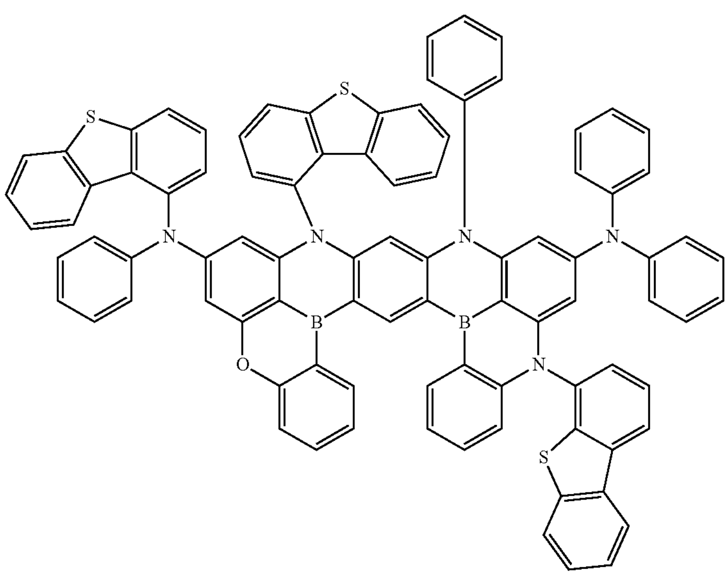

-continued
228
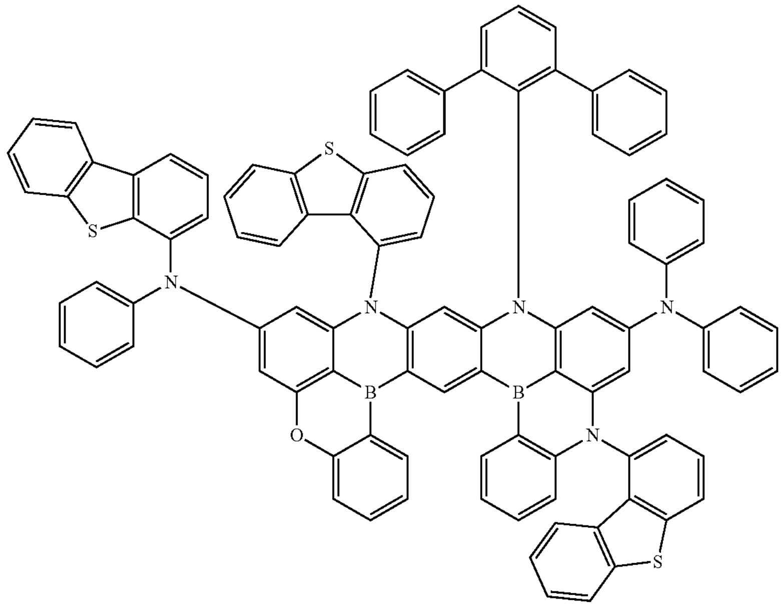
229
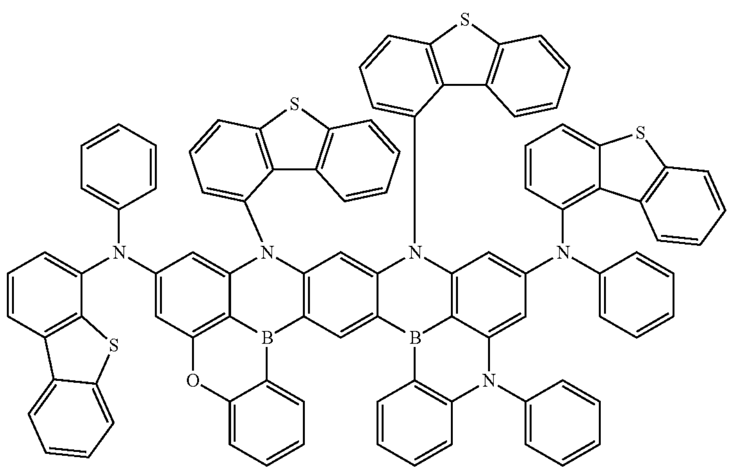
230
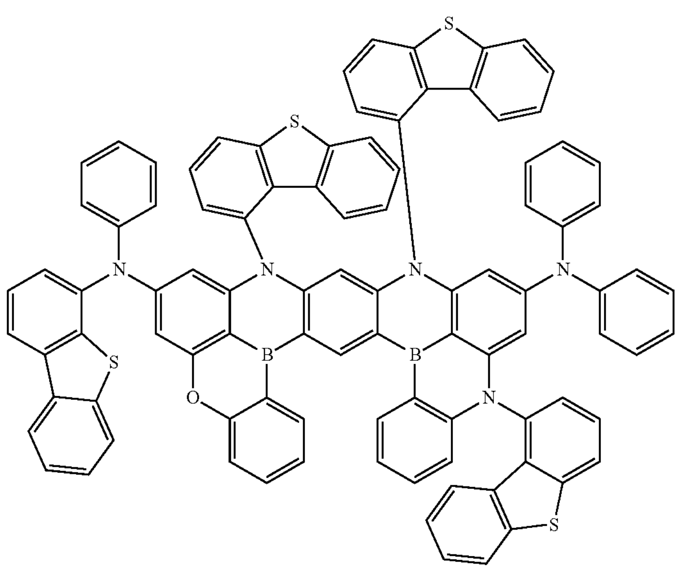

-continued
231
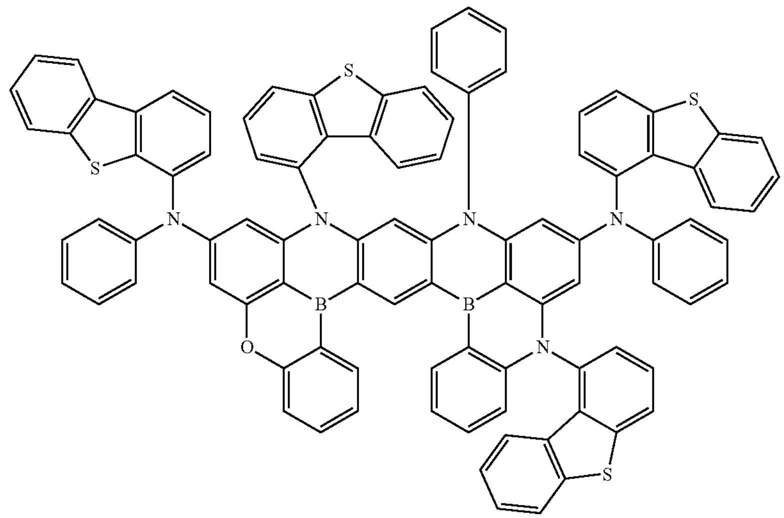
232
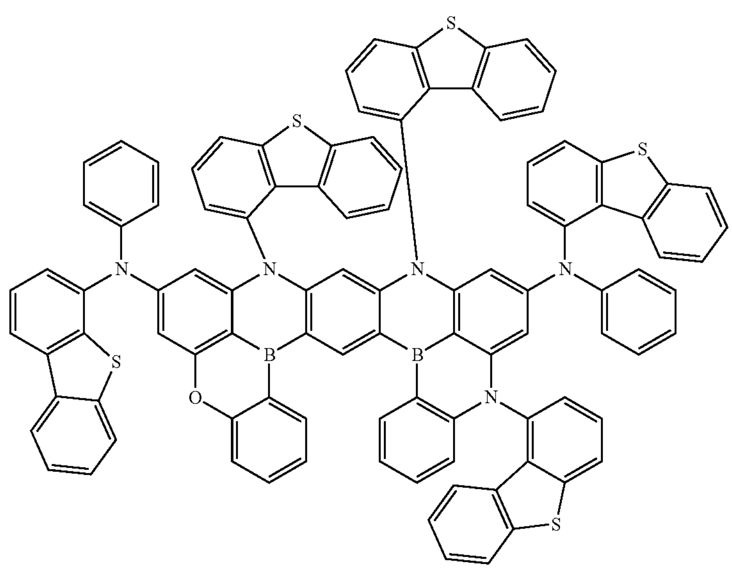

-continued
233
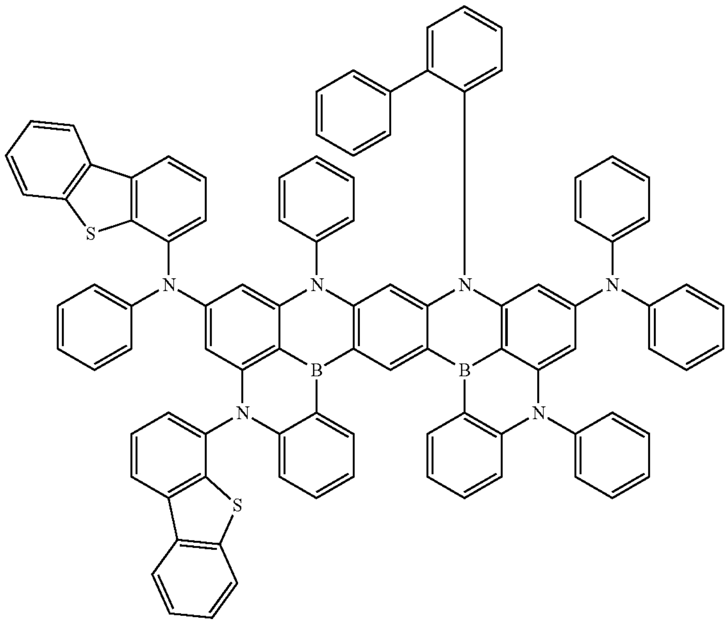
234
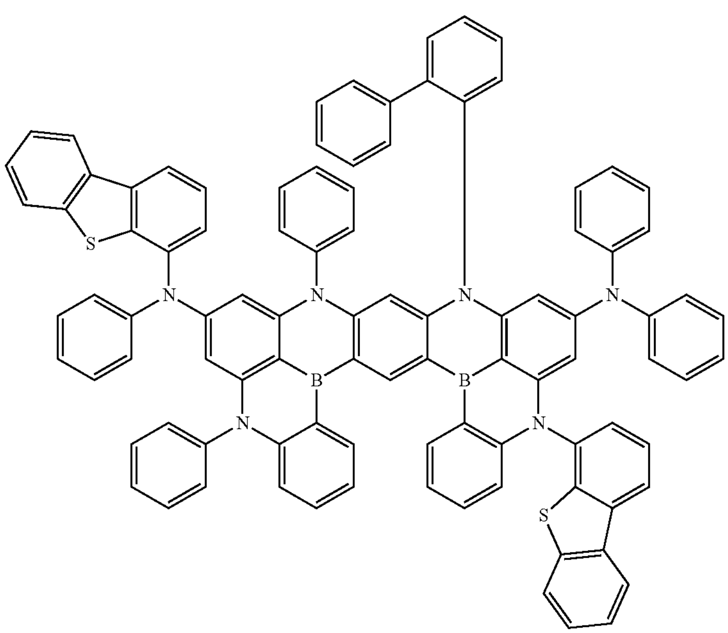

-continued
235
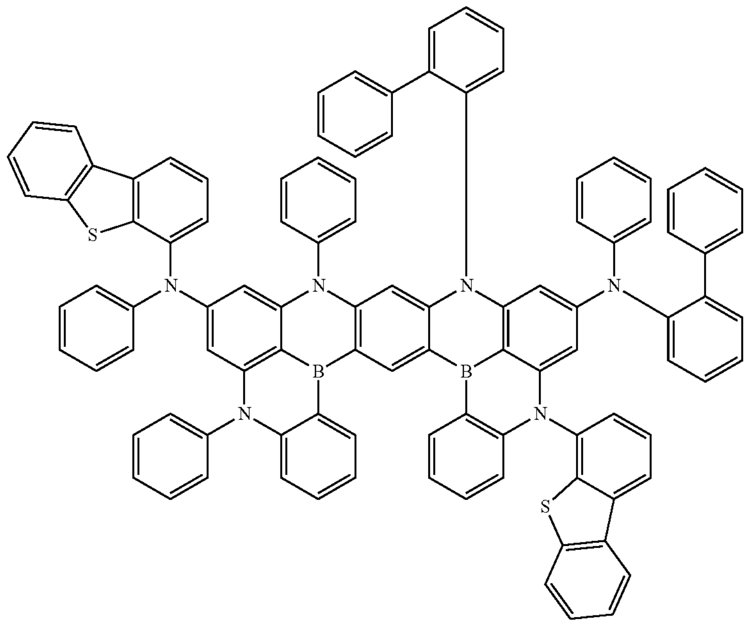
236
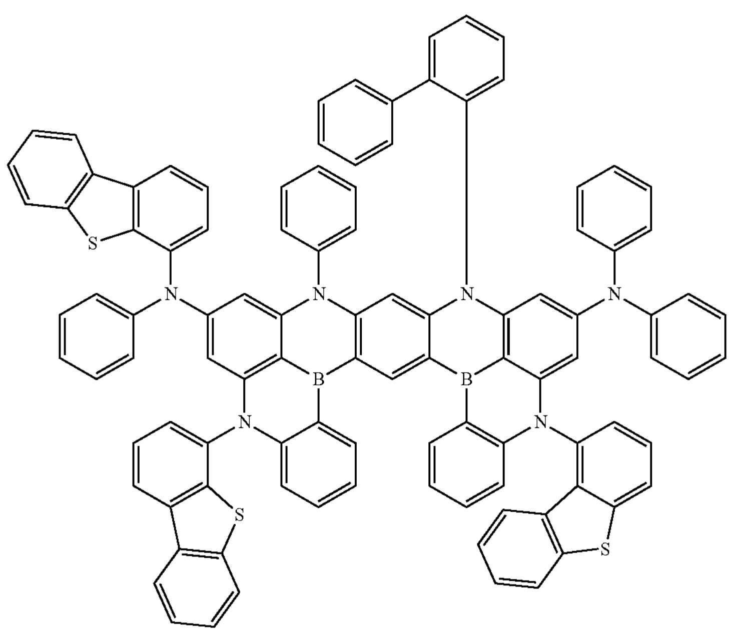

-continued
237
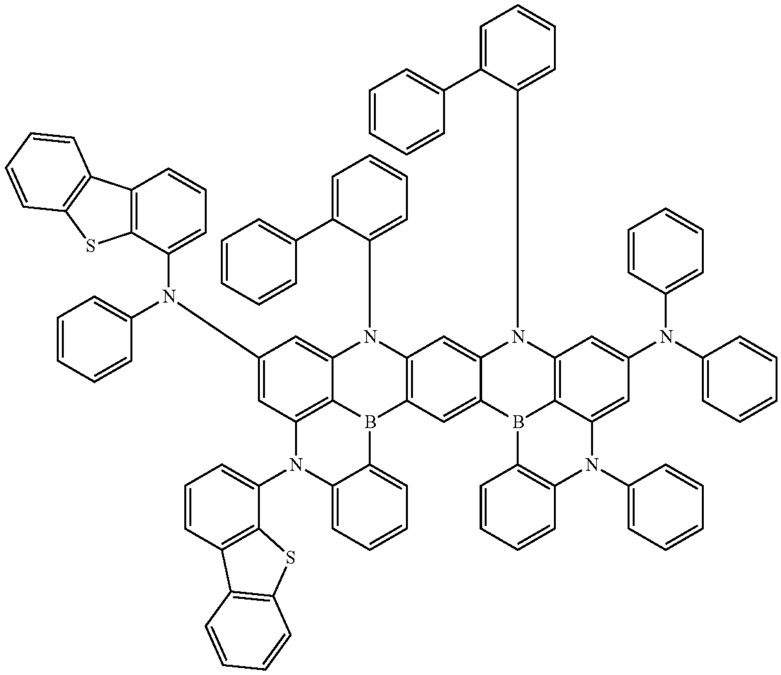
238
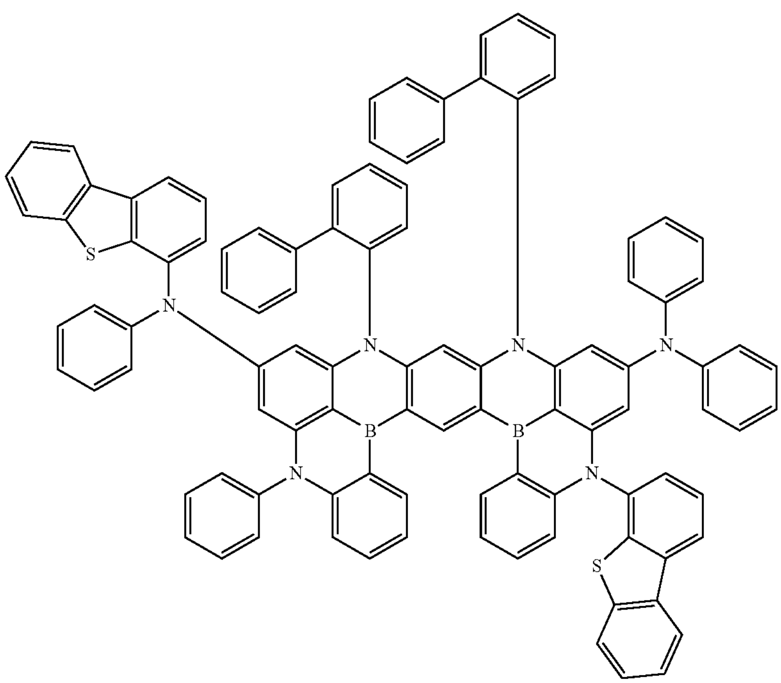

-continued
239
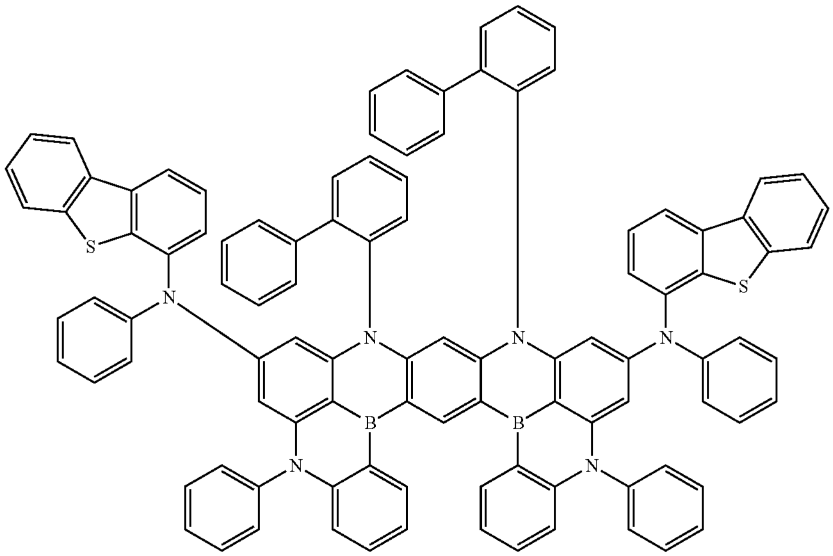
240
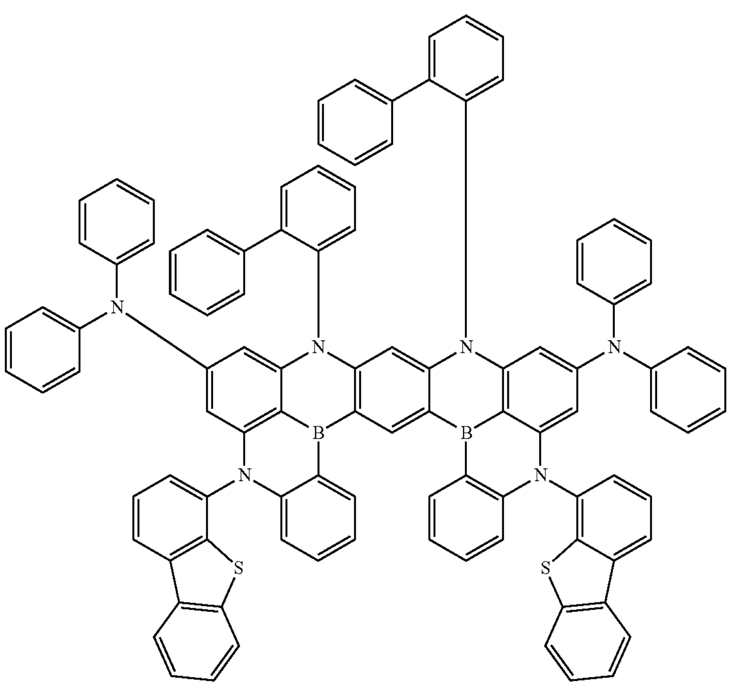

-continued
241
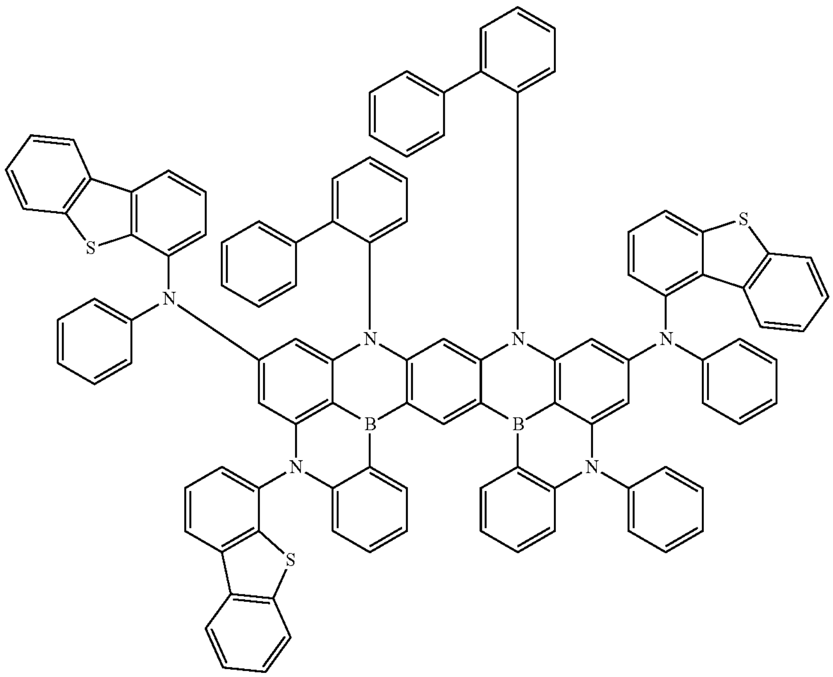
242
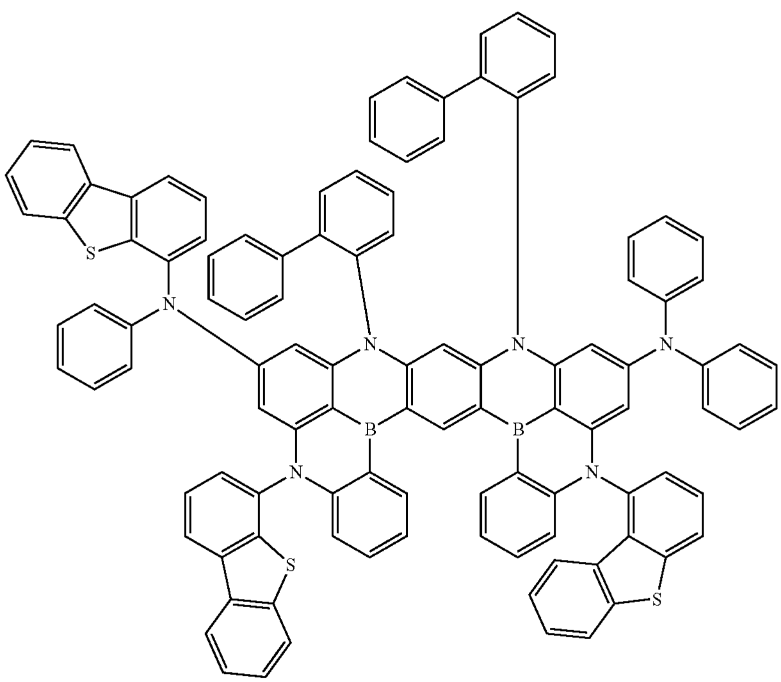

-continued
243
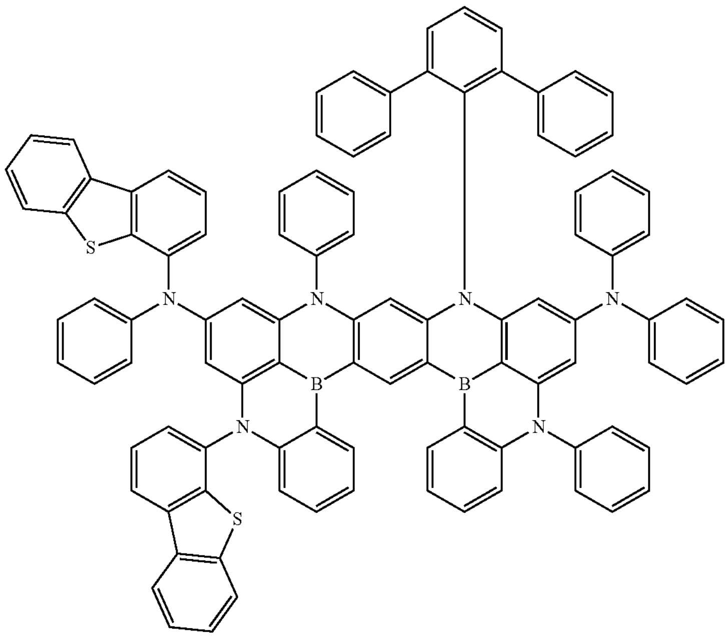
244
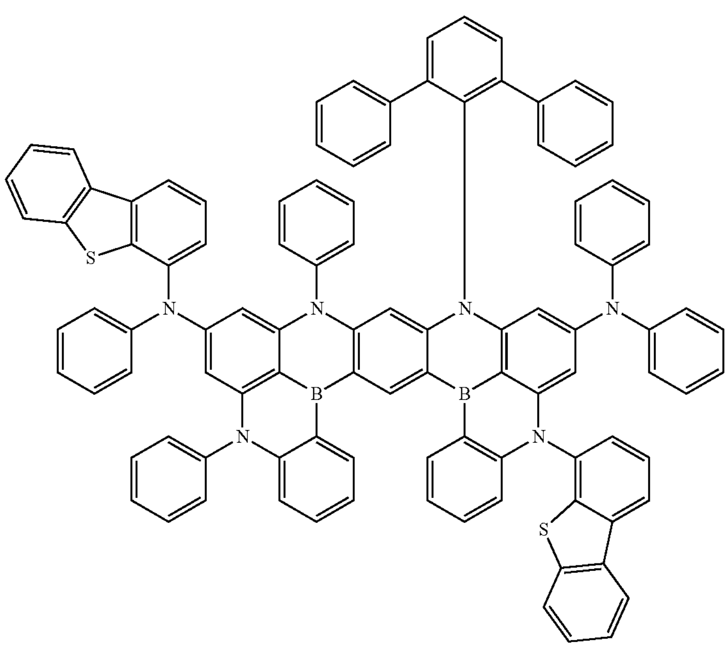

-continued
245
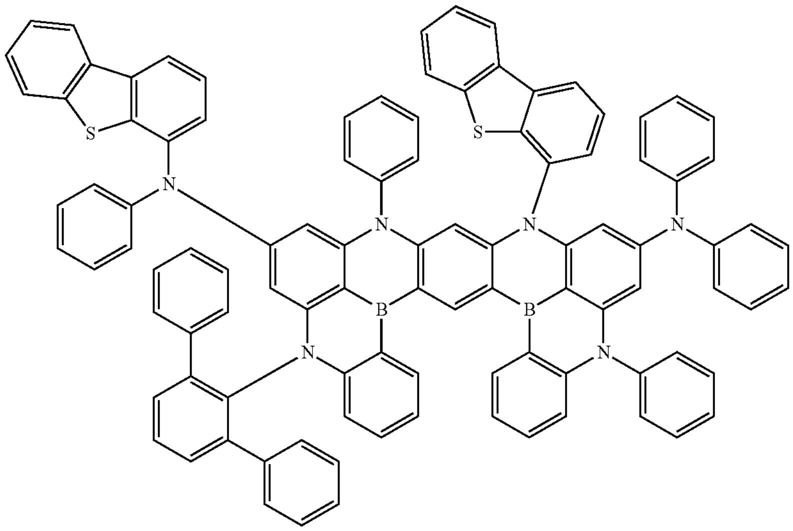
246
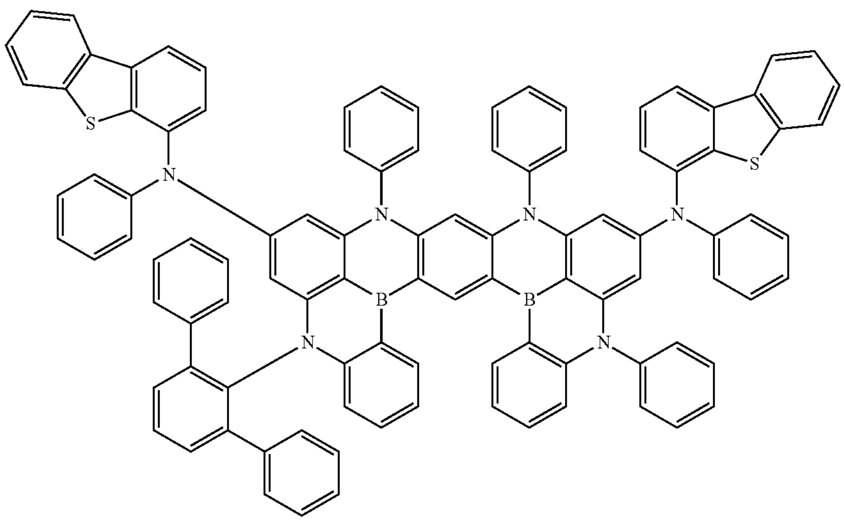
247
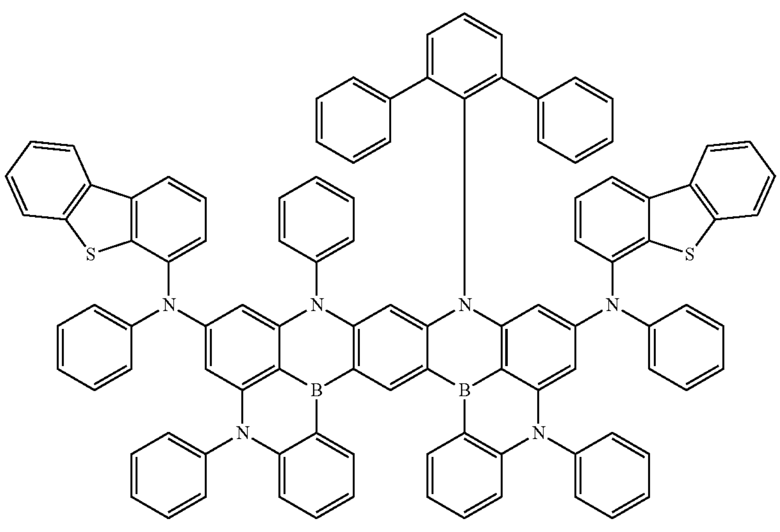

-continued
248
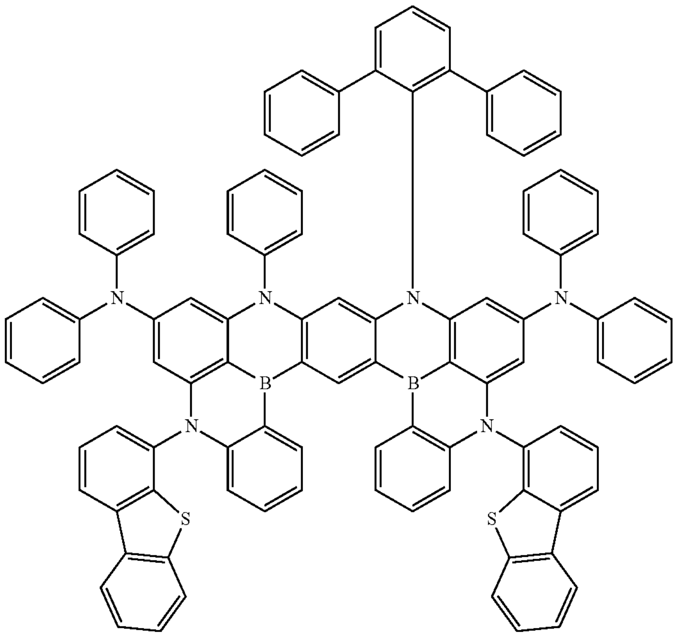
249
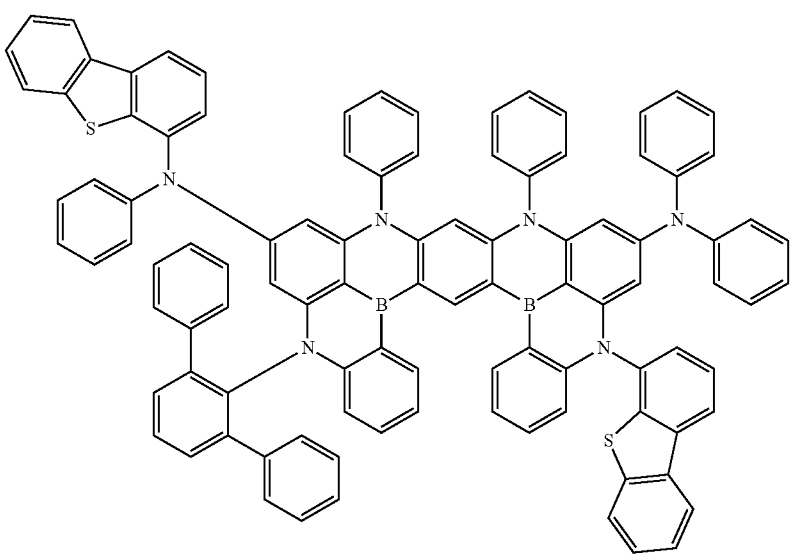

-continued
250
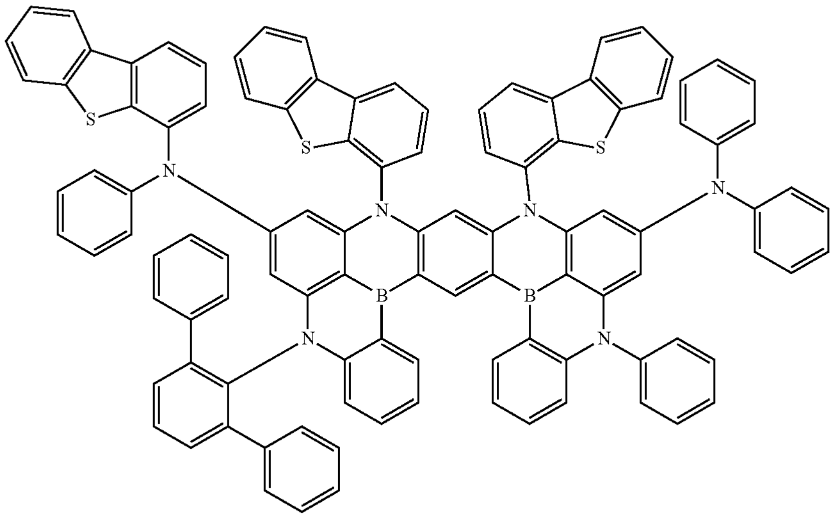
251
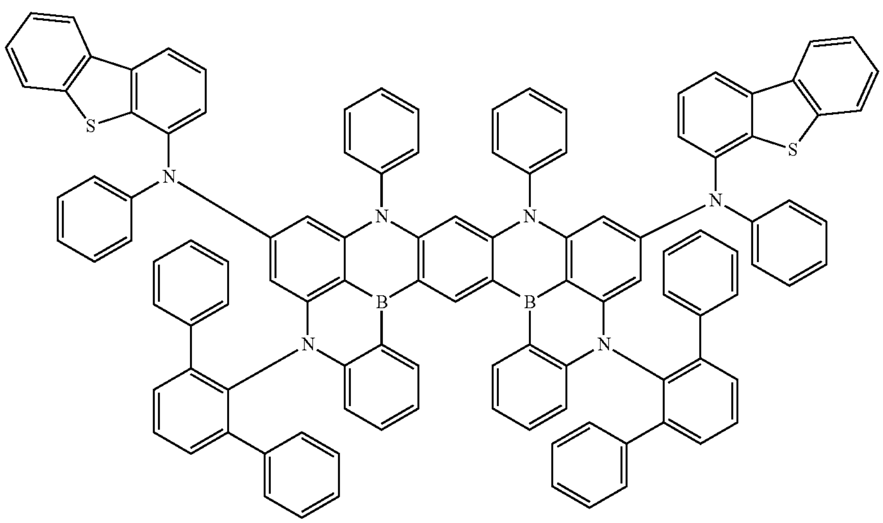
252
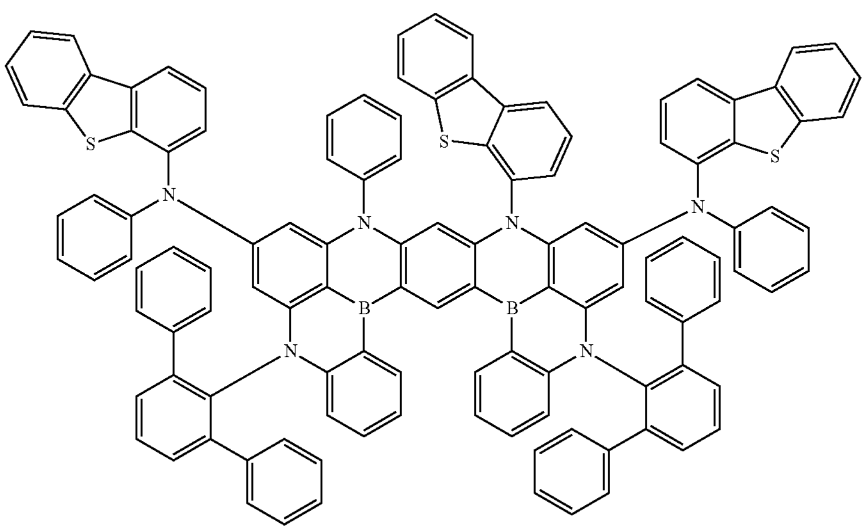

-continued
253
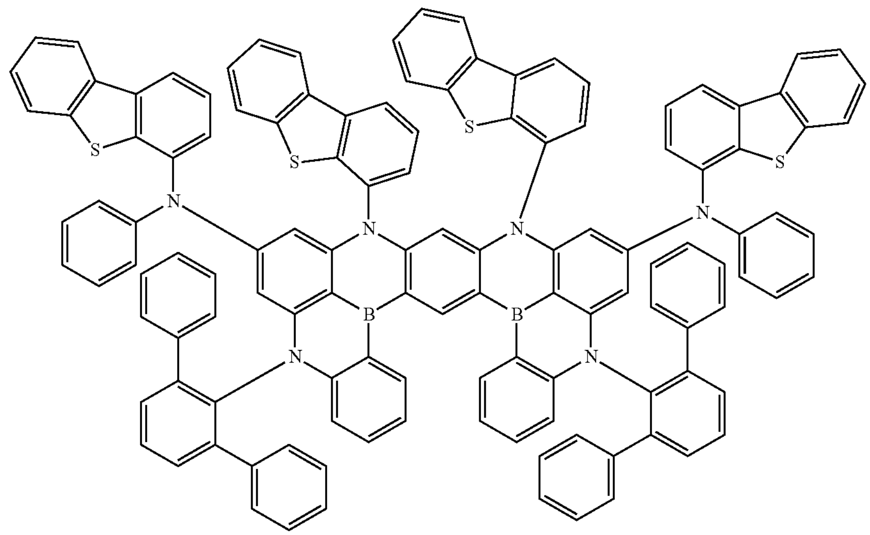
254
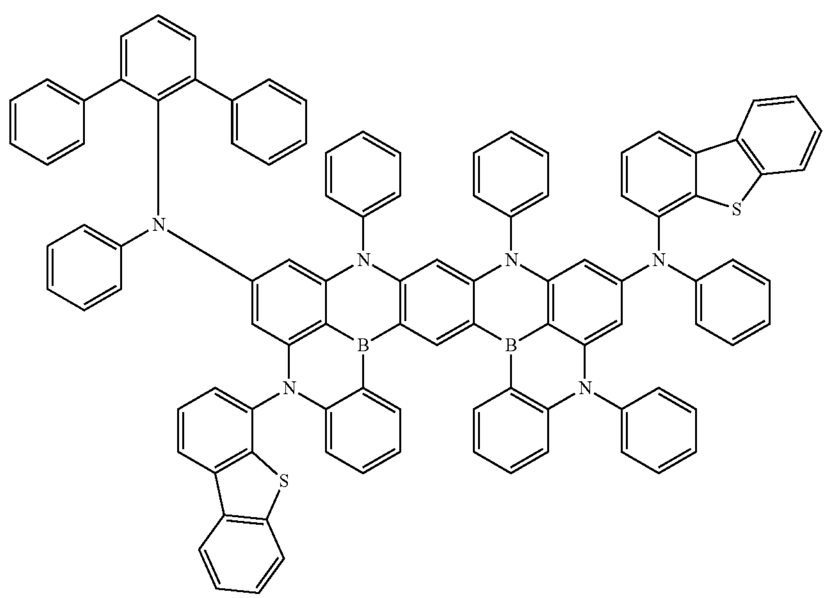

-continued
255
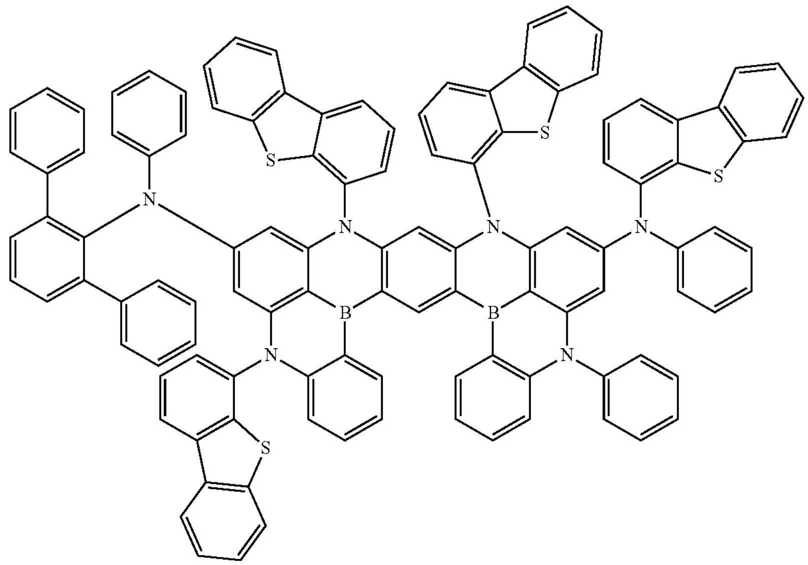
256
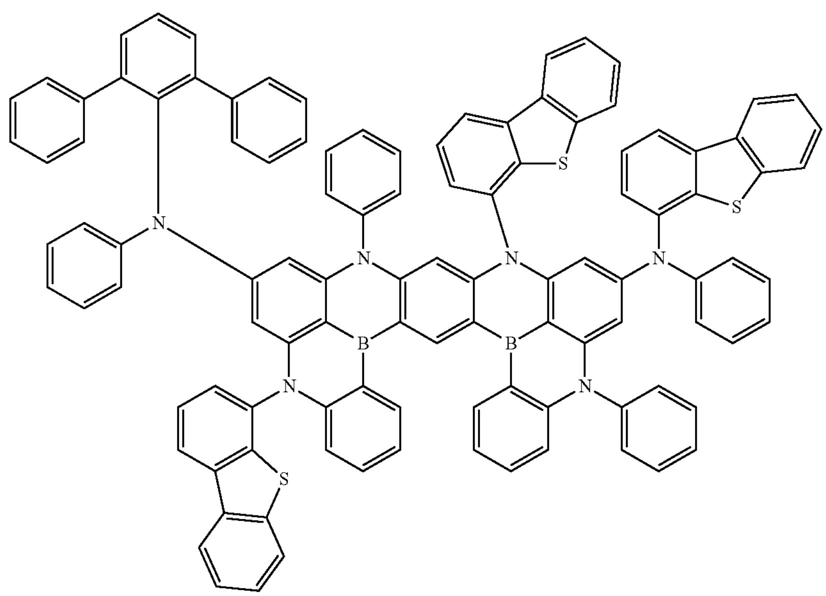

-continued
257
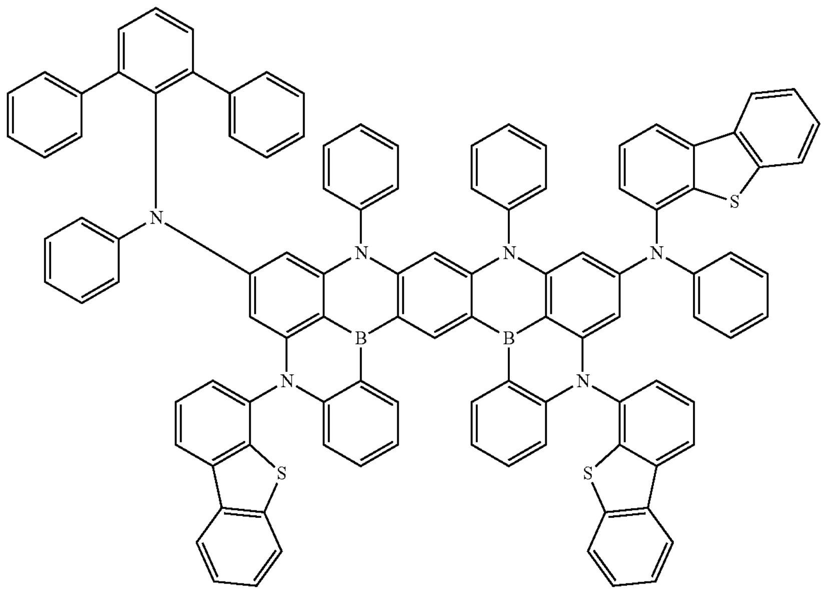
258
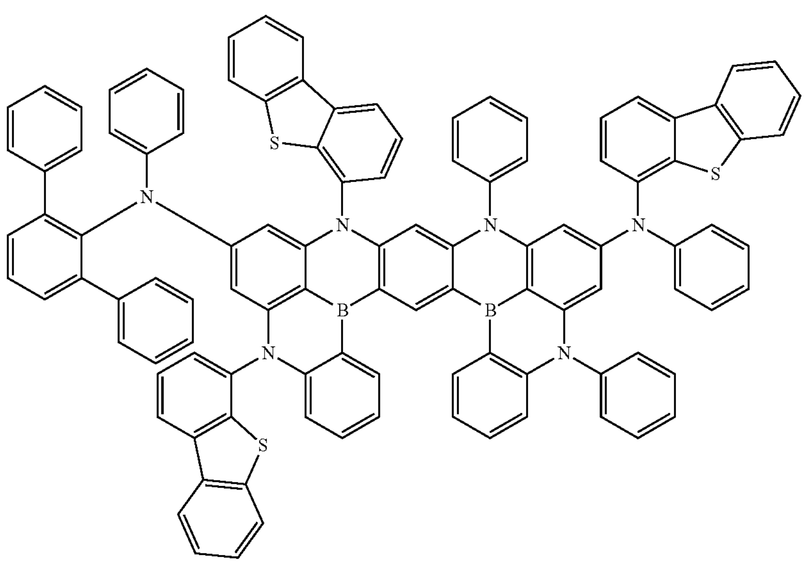

-continued
259
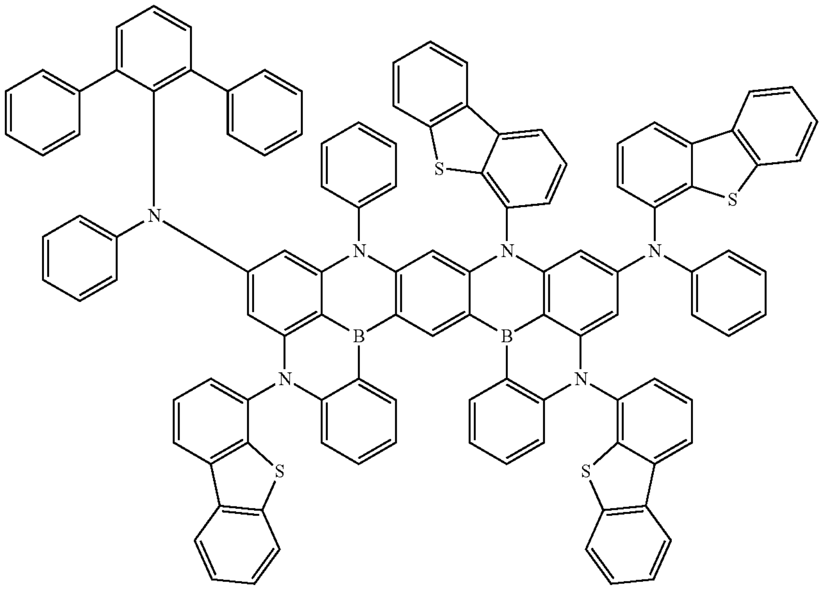
260
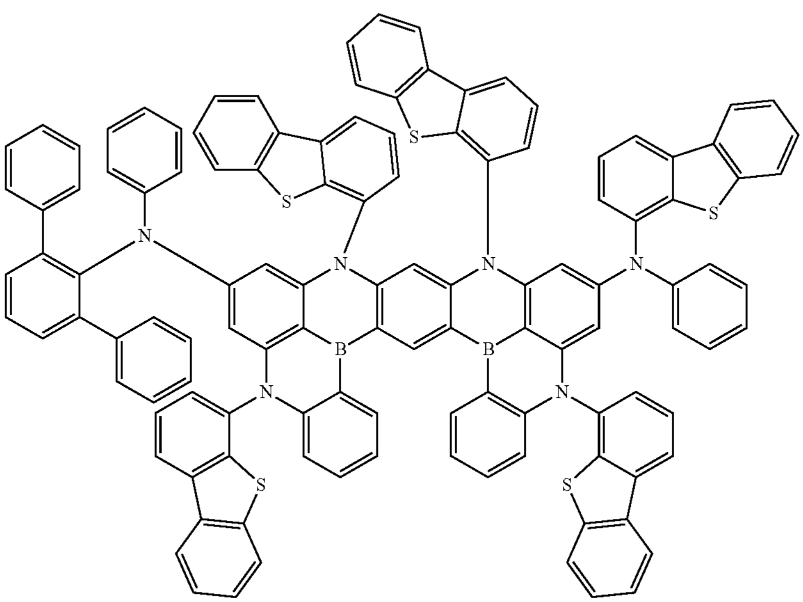

-continued
261
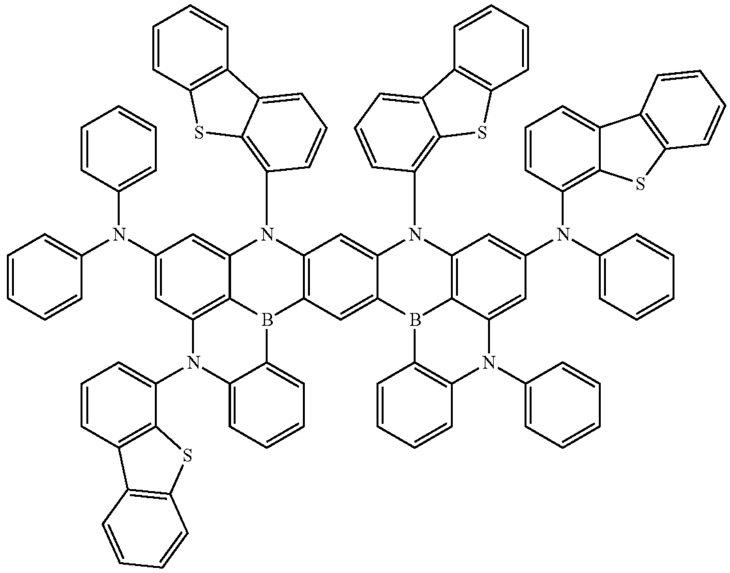
263
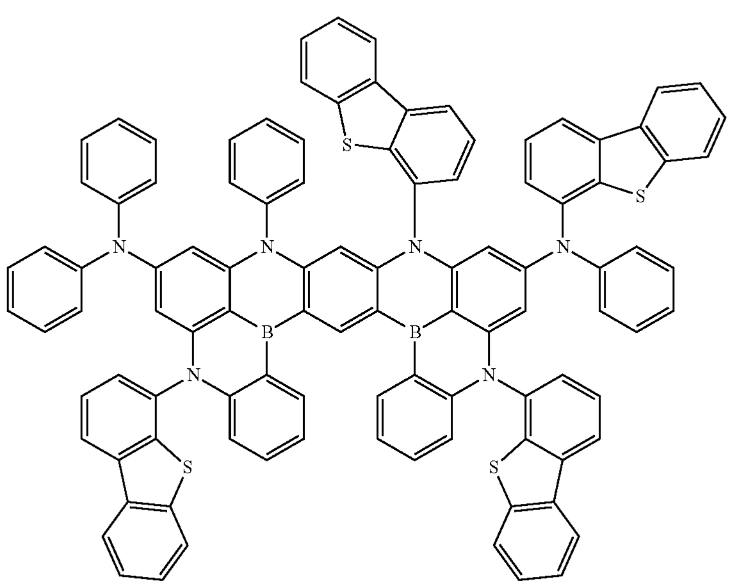

-continued
264
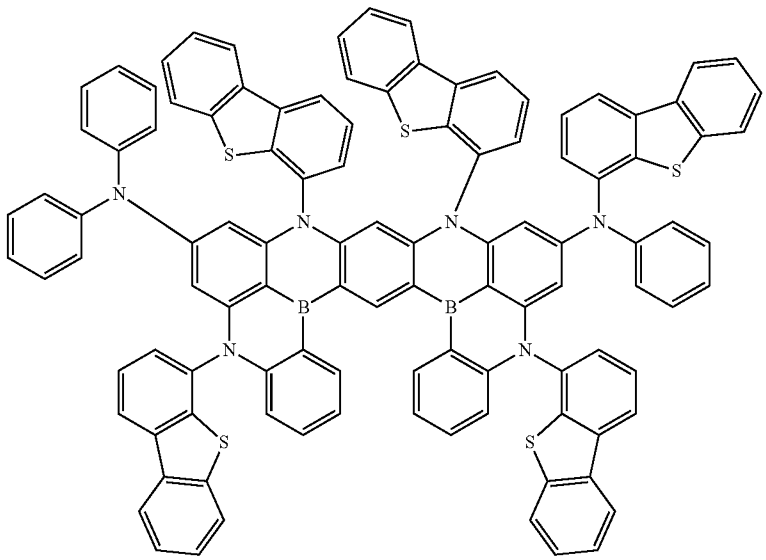
265
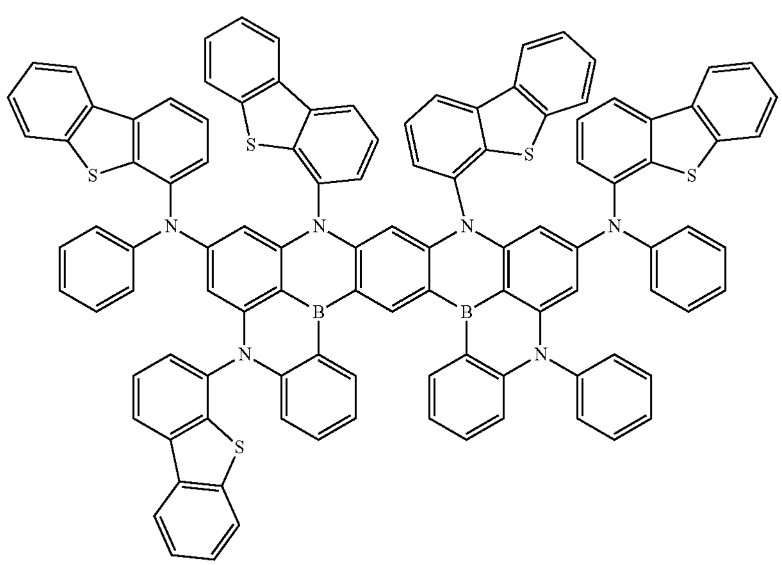

-continued
266
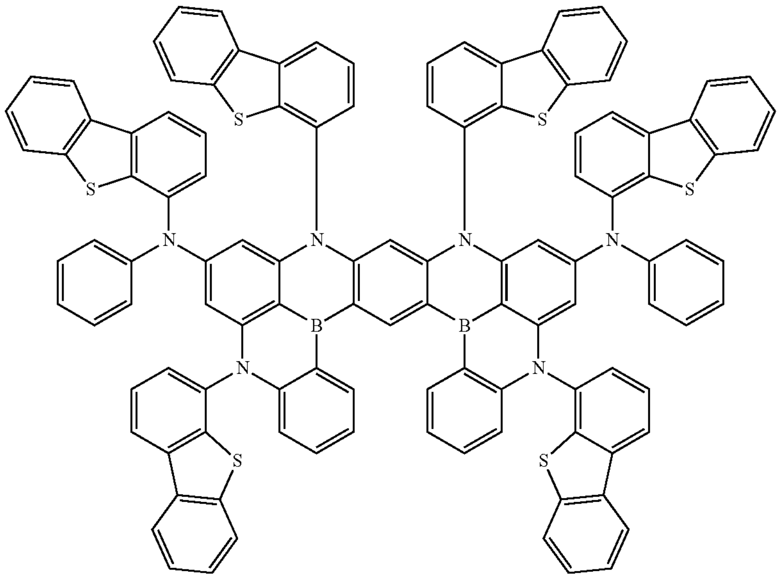
267
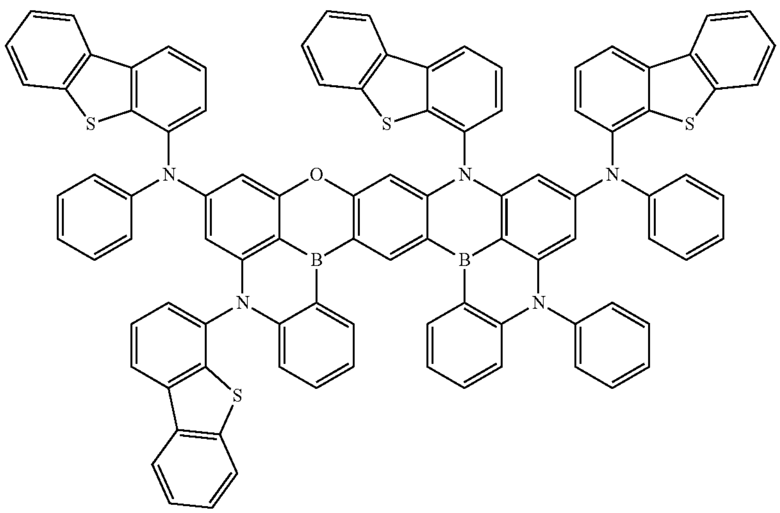
268
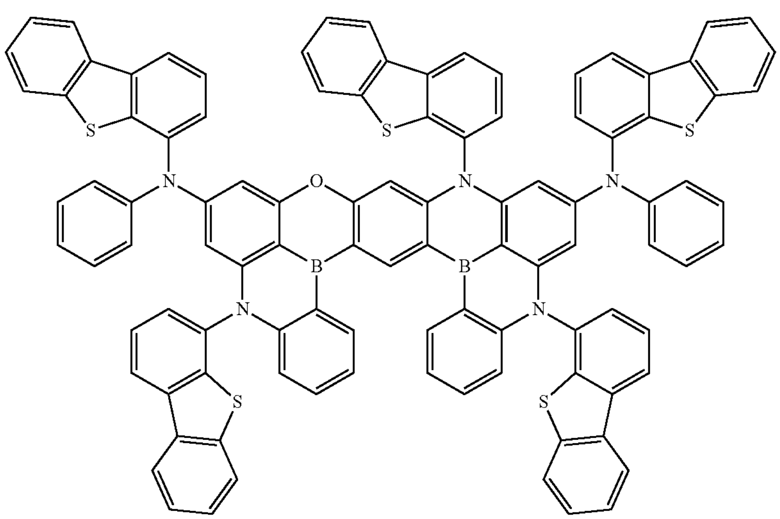

-continued
269
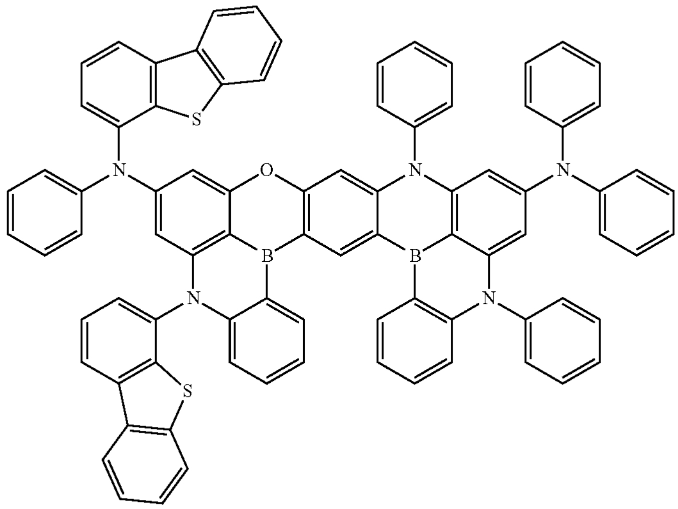
270
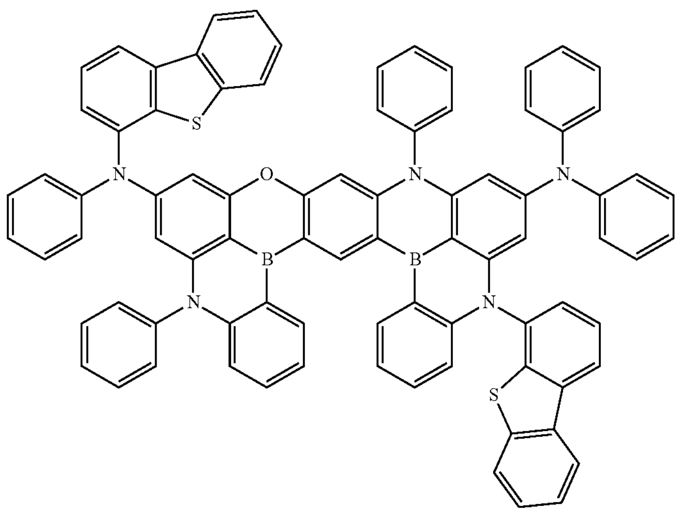
271
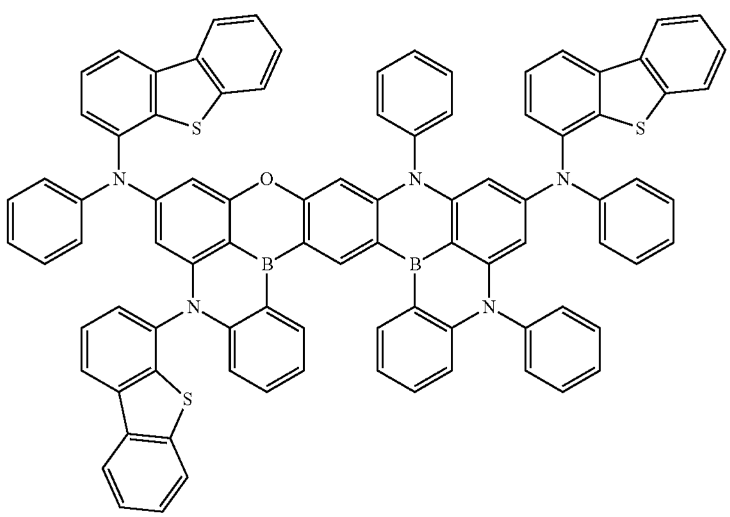

-continued
272
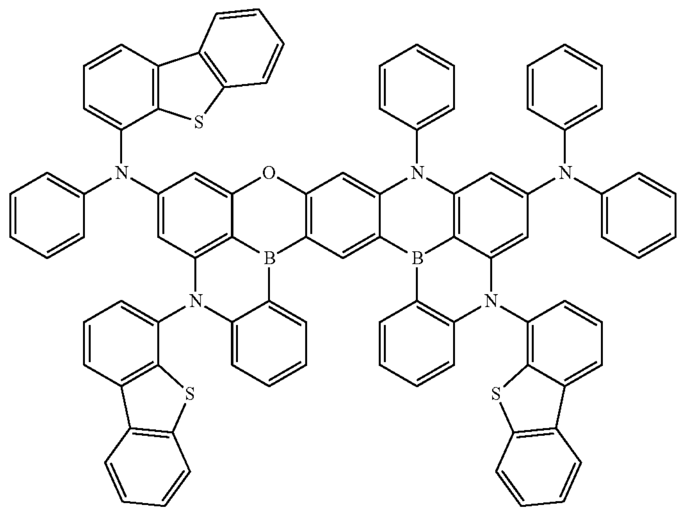
273
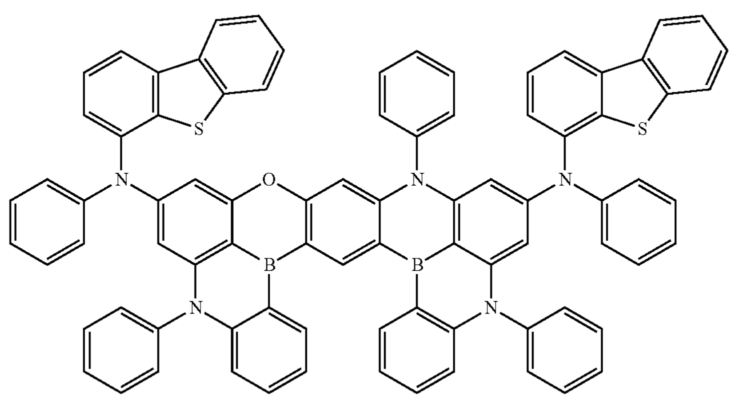
274
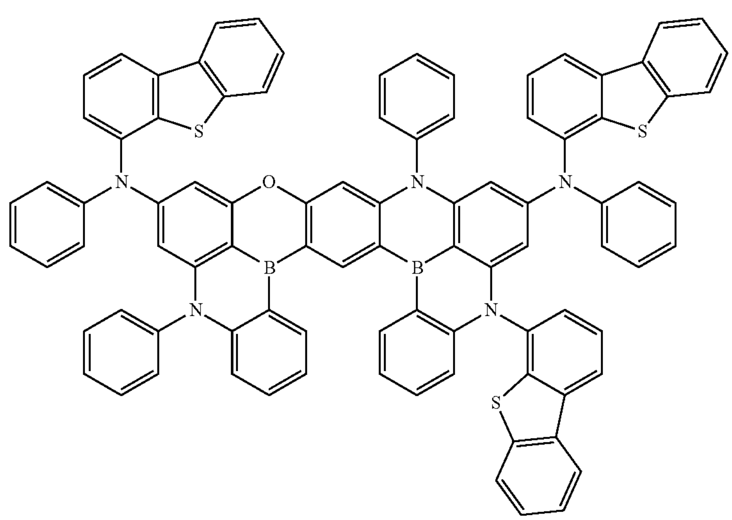

-continued
275
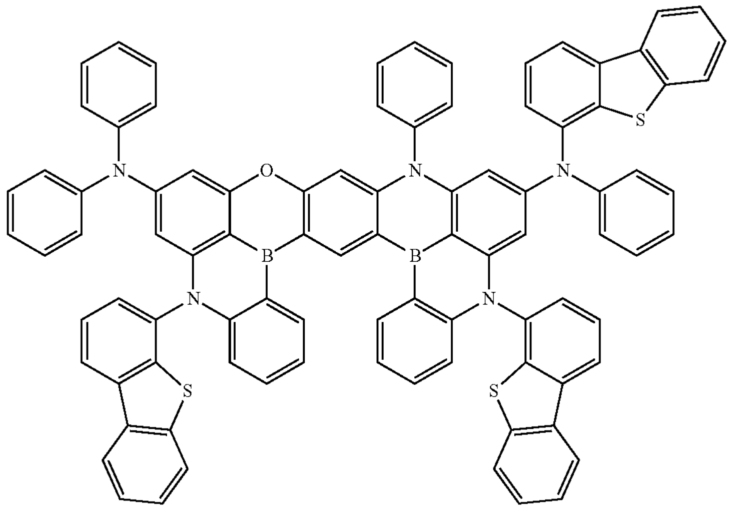
276
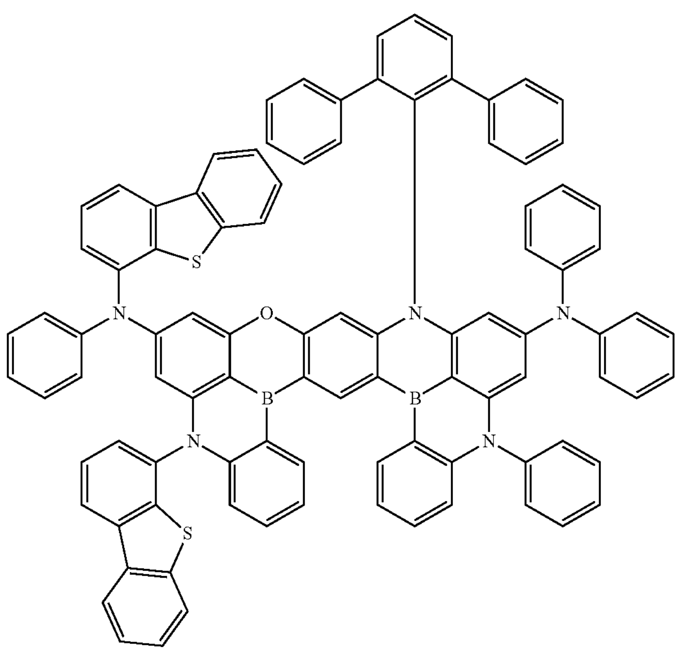

-continued
277
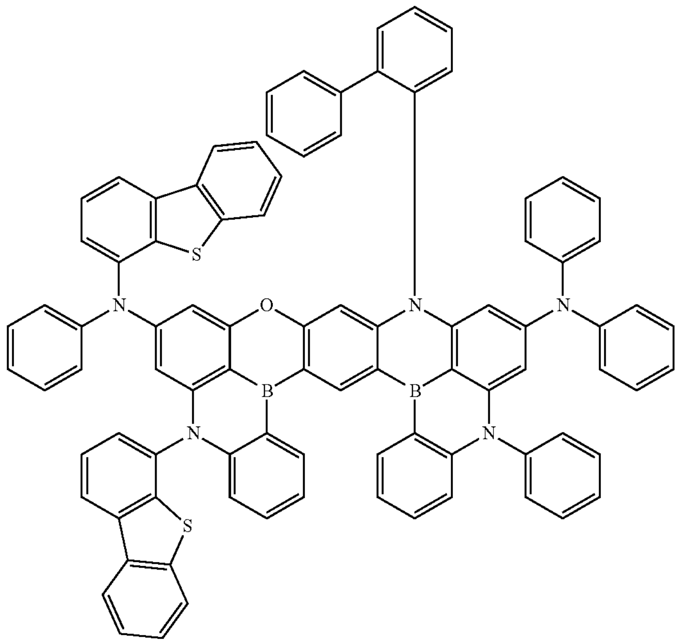
278
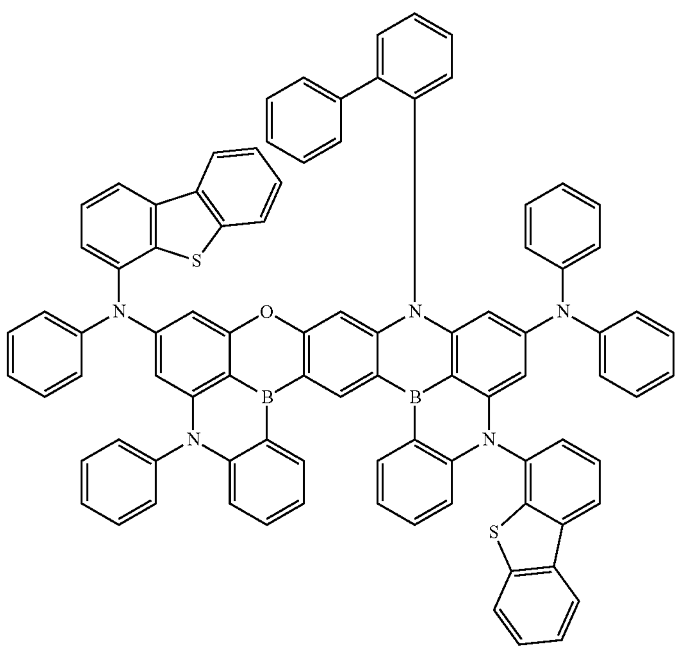

-continued
279
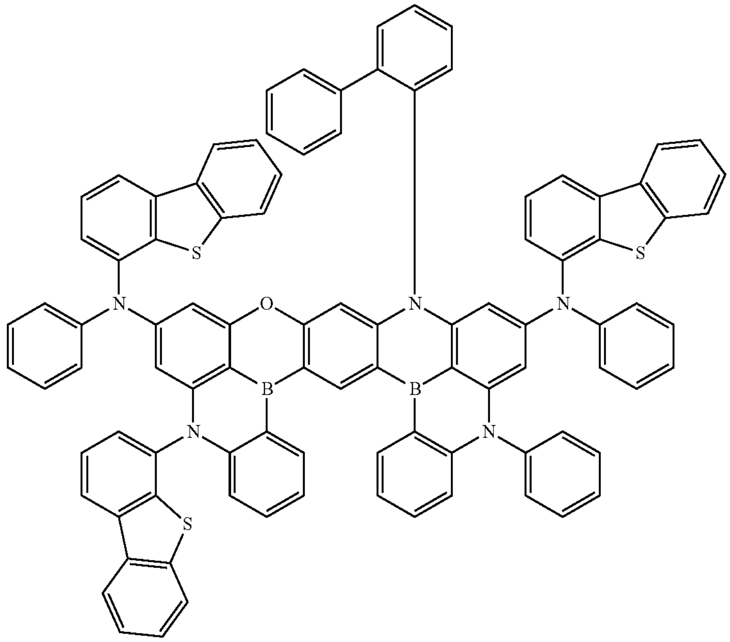
280
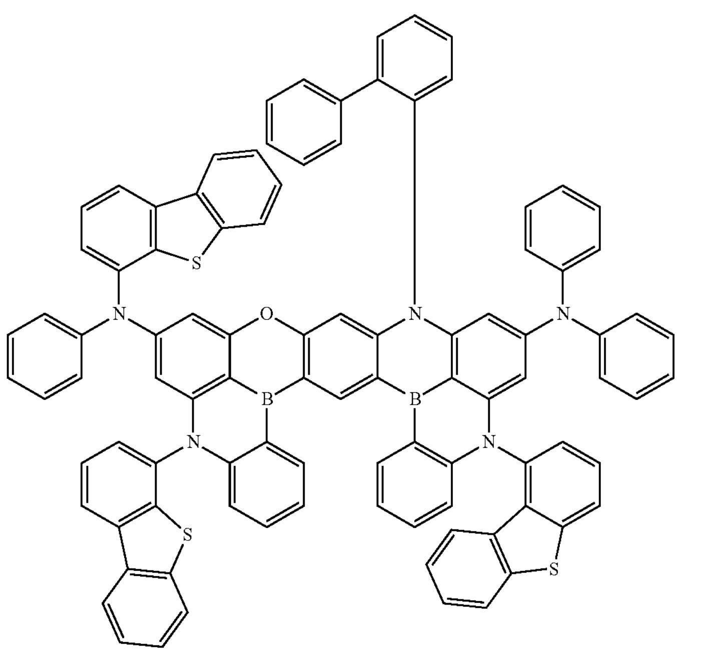

-continued
281
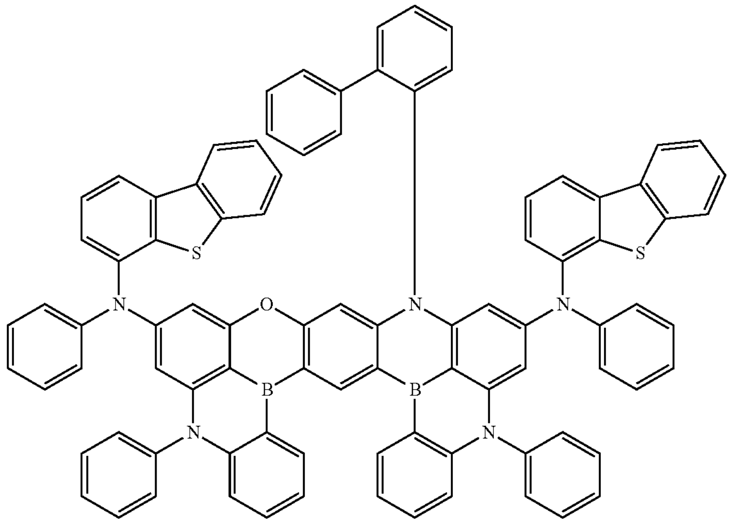
282
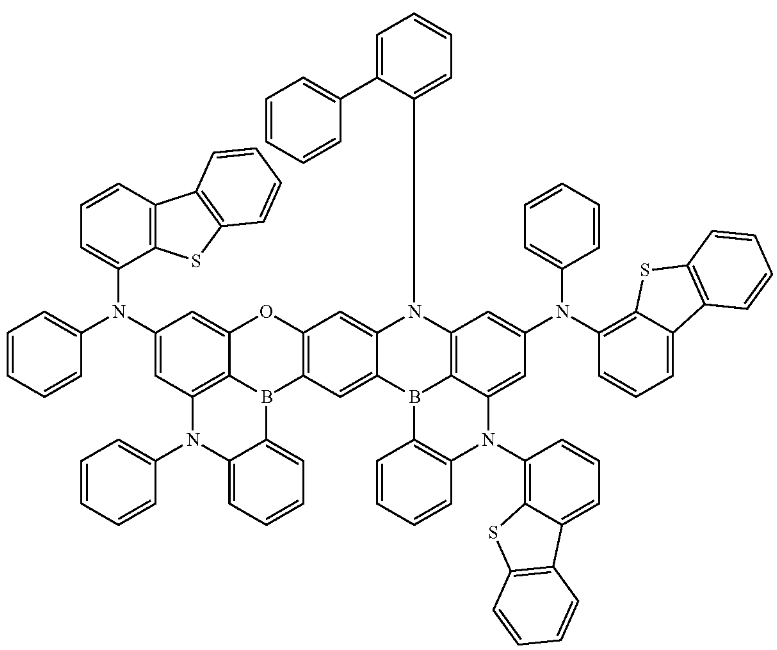

-continued
283
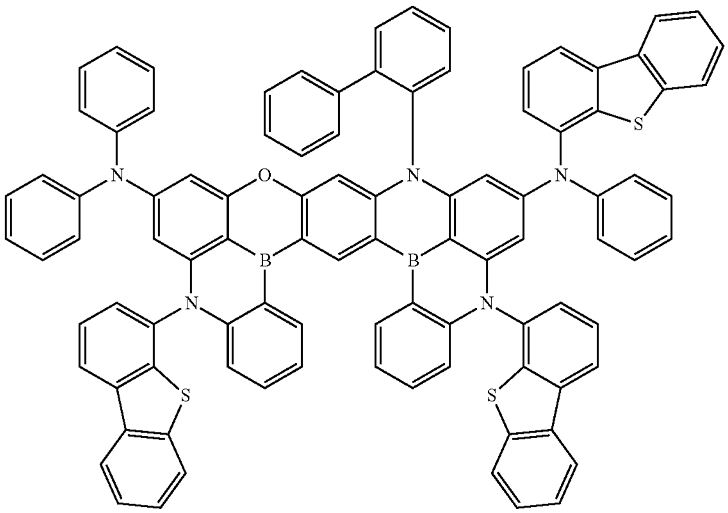
284
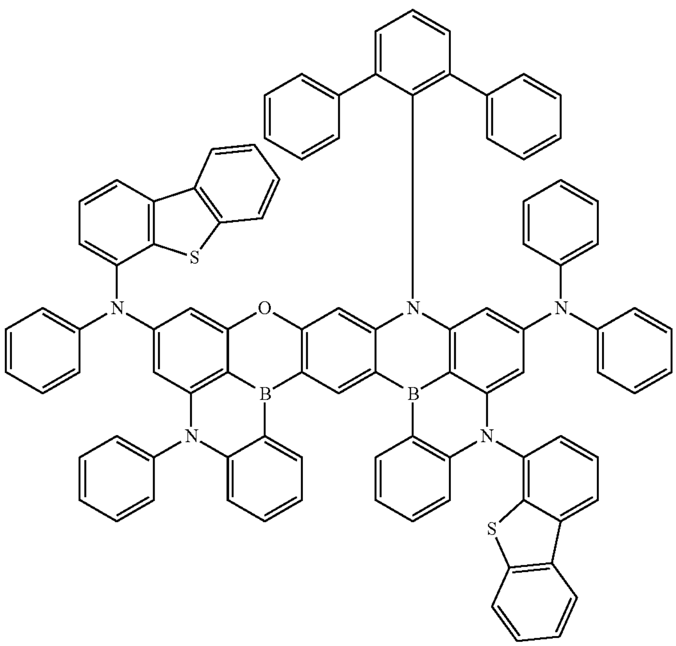
285
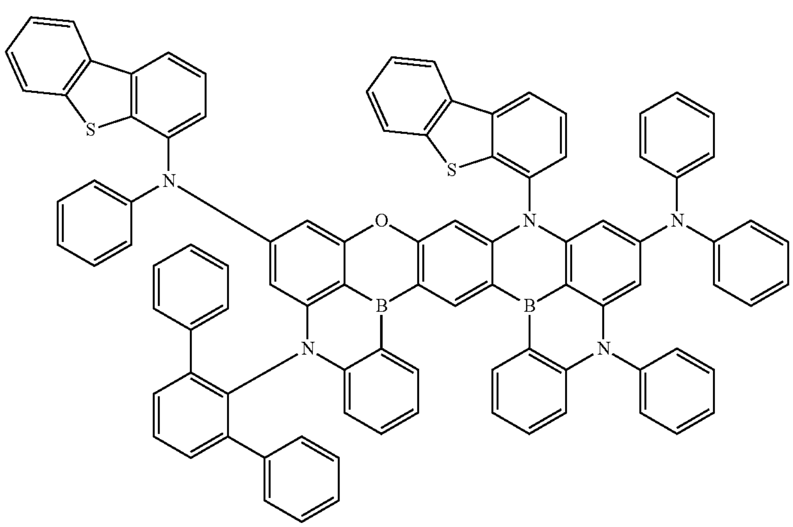

-continued
286
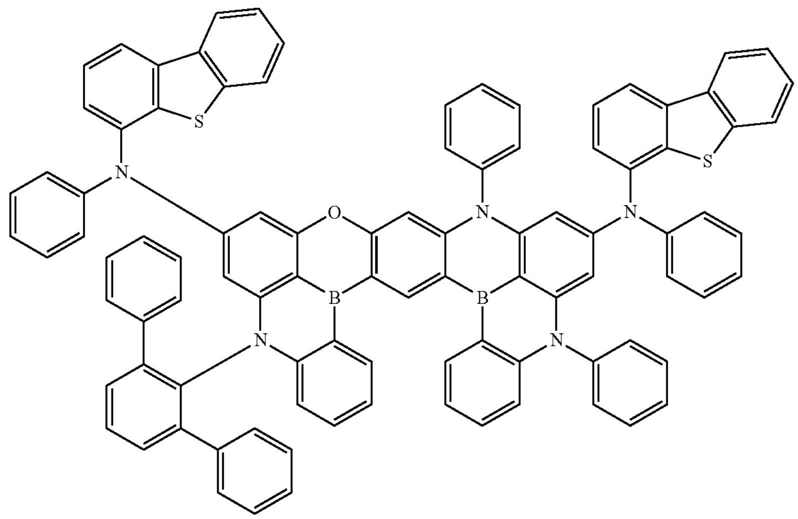
287
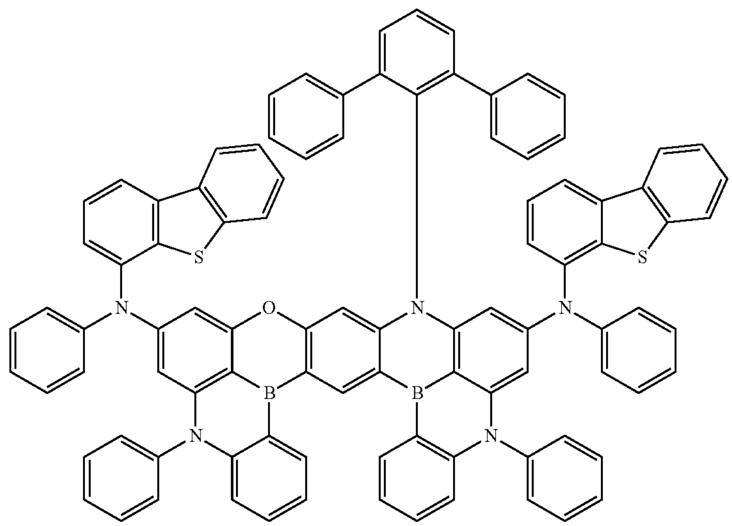
288
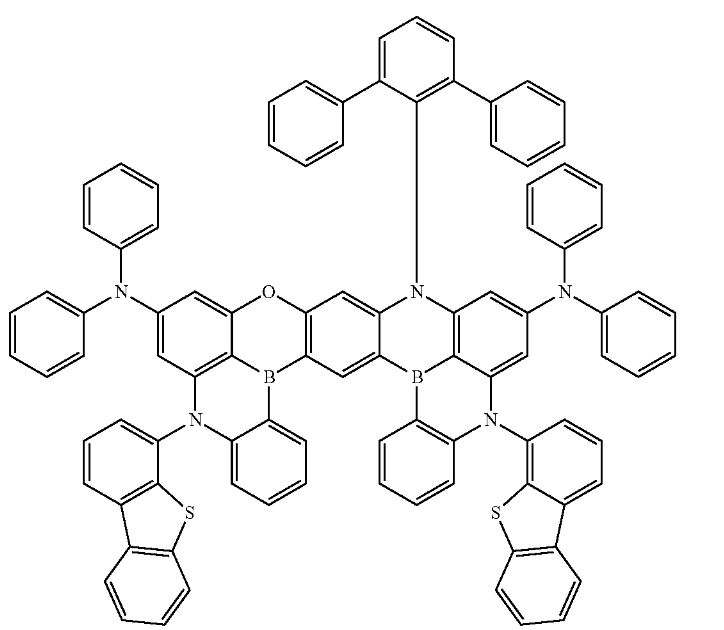

-continued
289
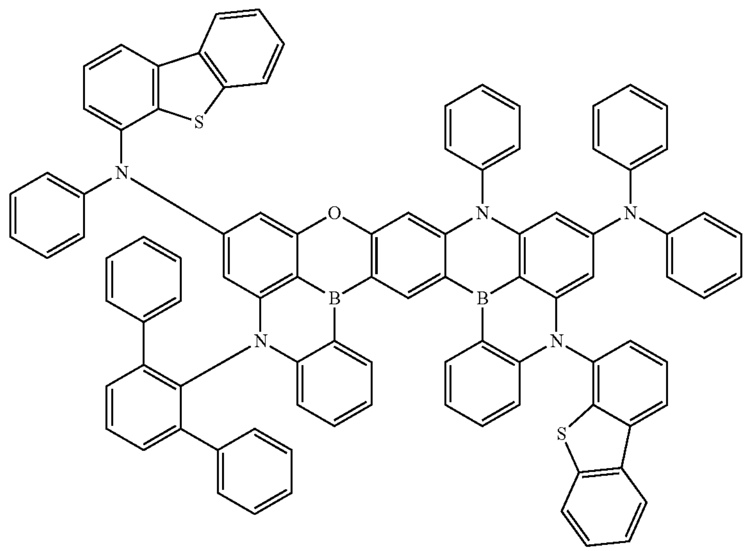
291
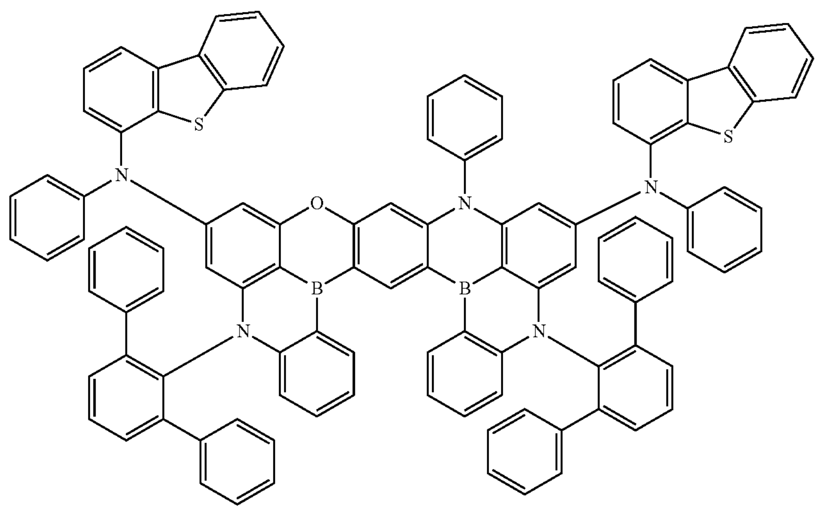
292
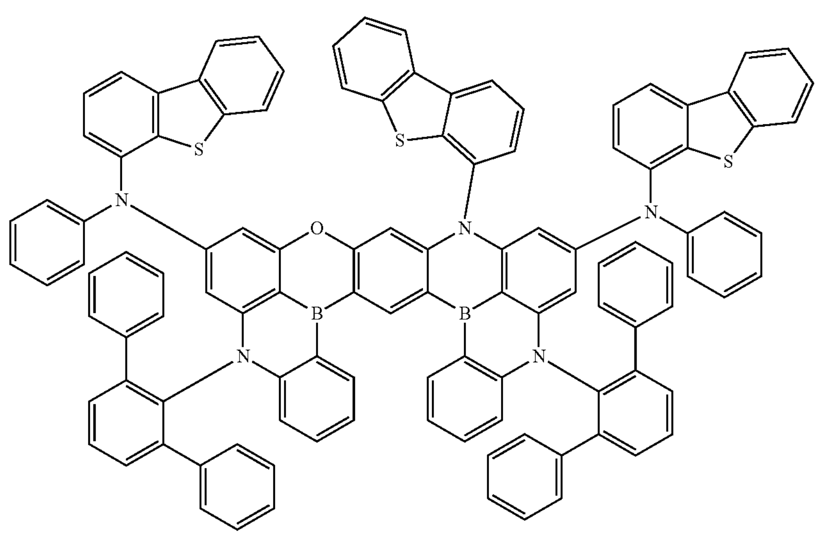

-continued
293
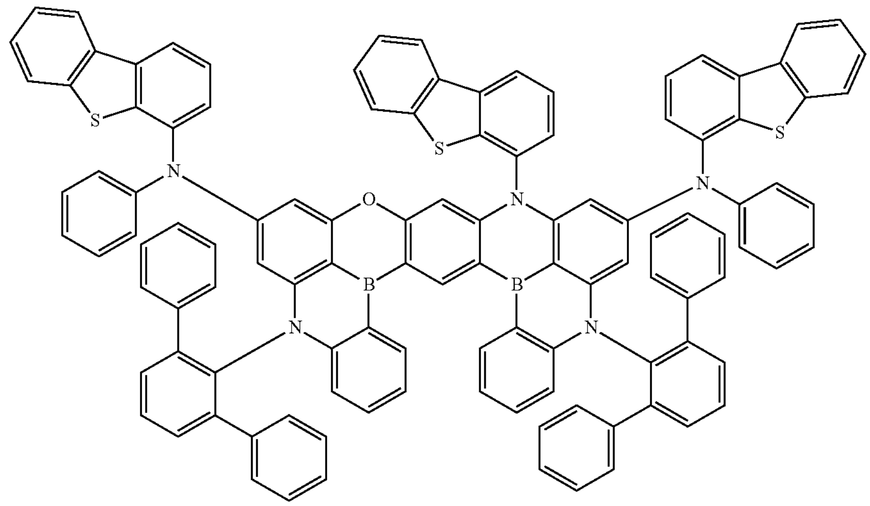
294
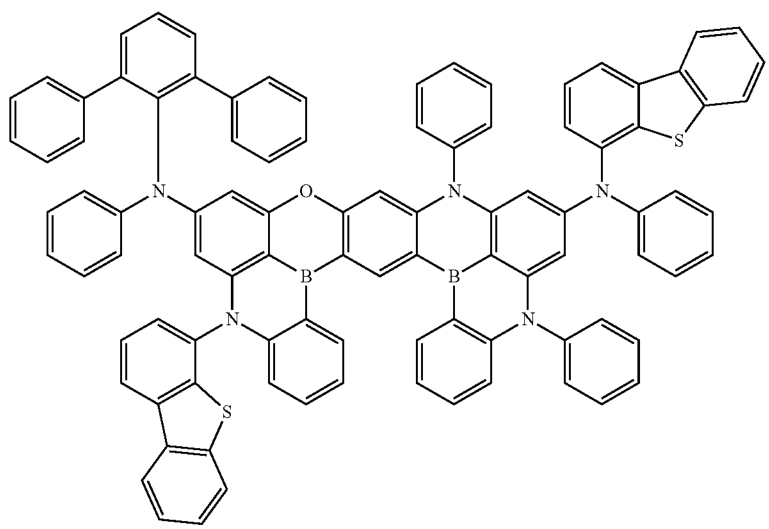
295
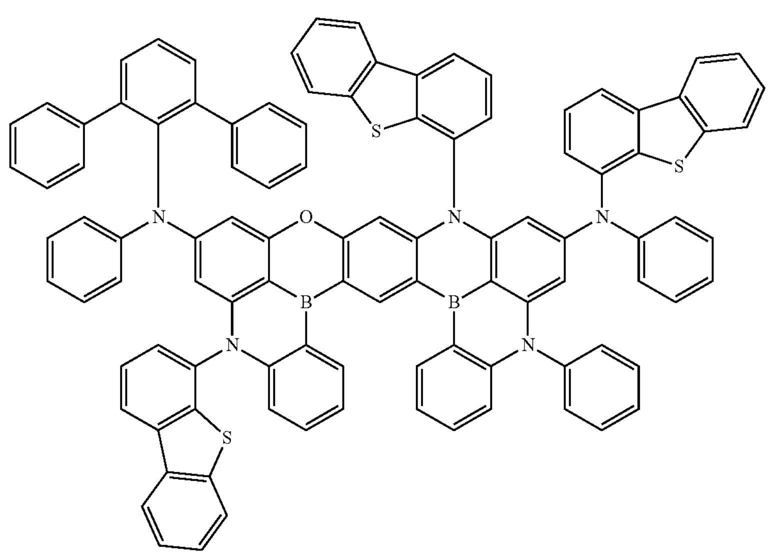

-continued
296
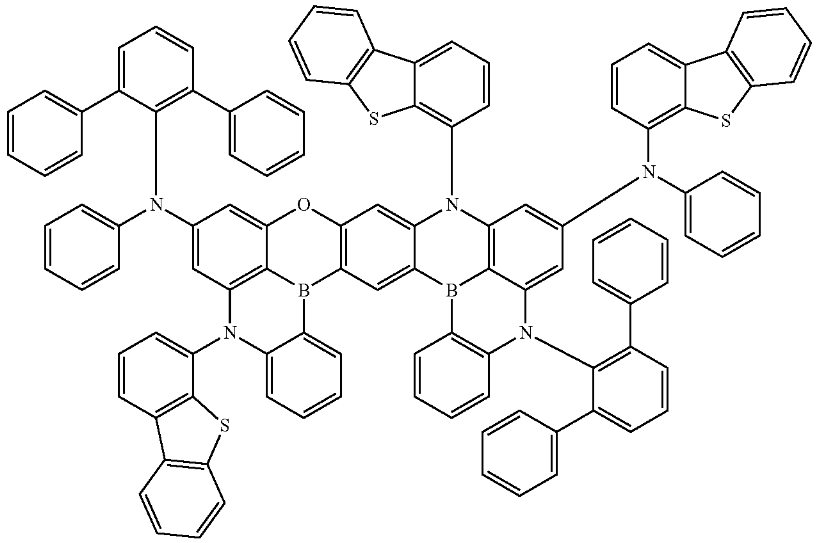
297
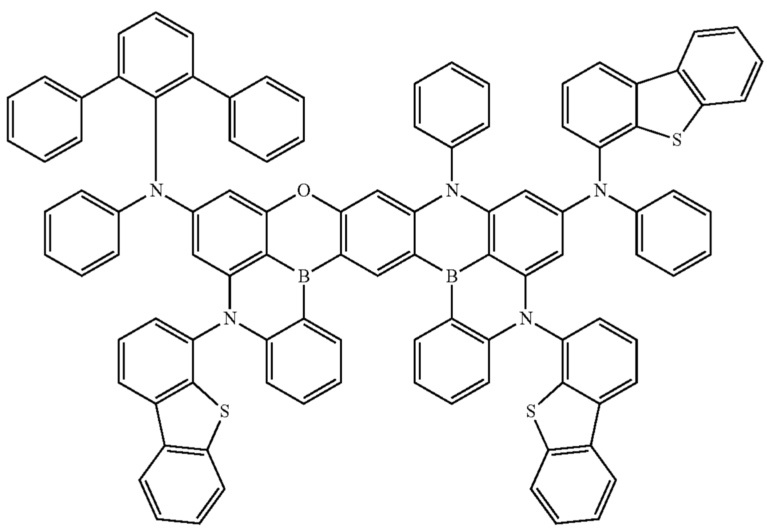
298
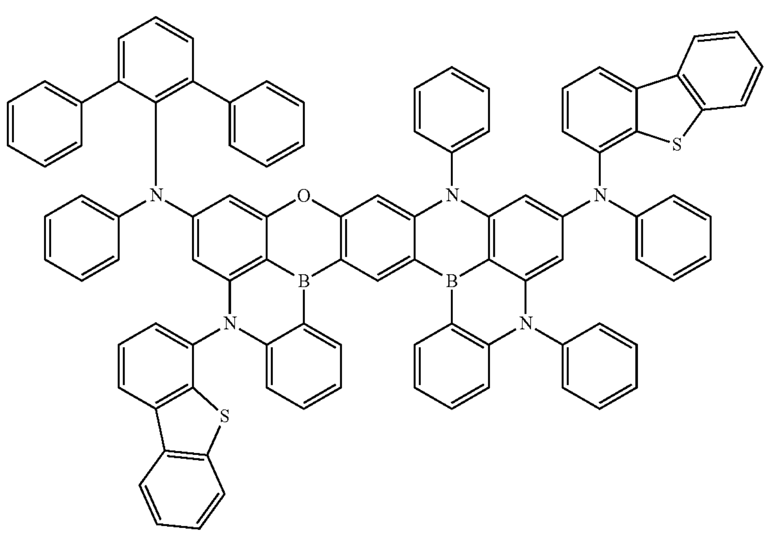

-continued
299
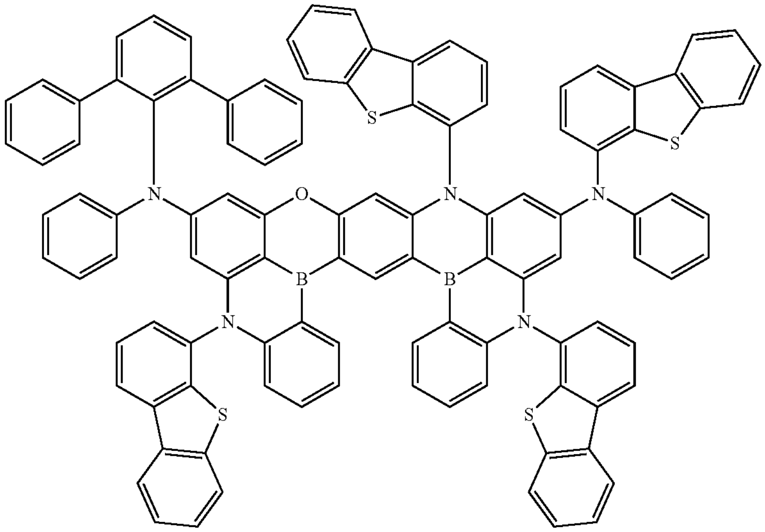
300
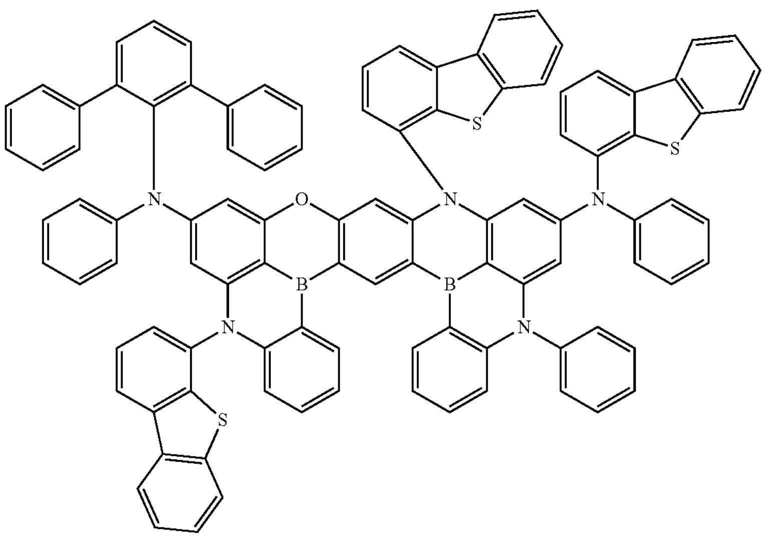
301
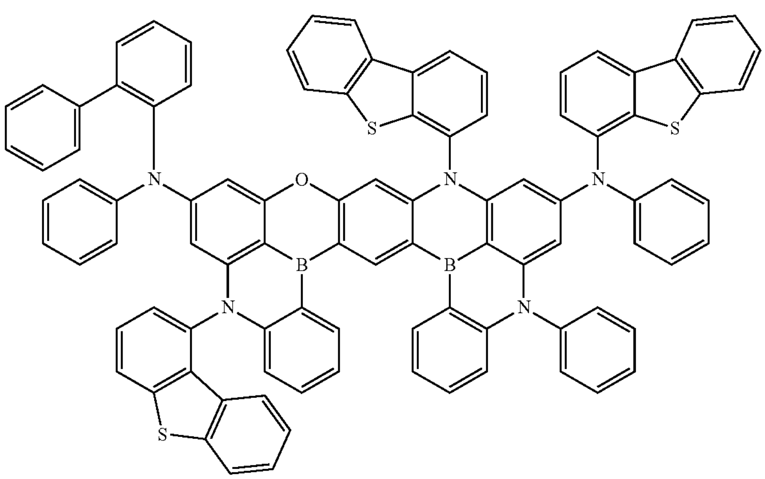

-continued
302
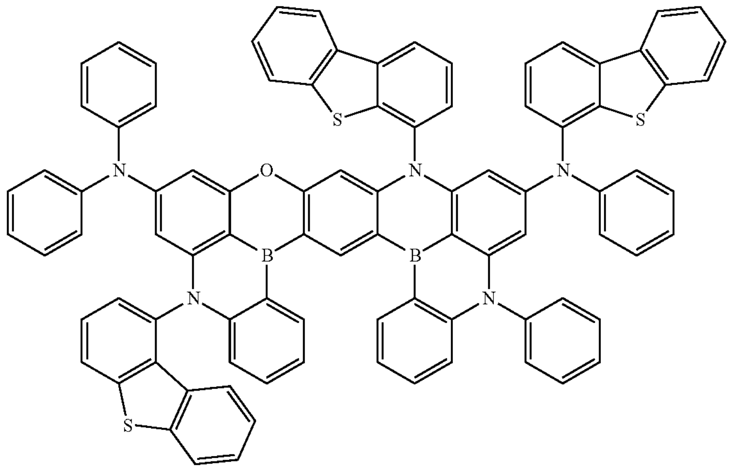
303
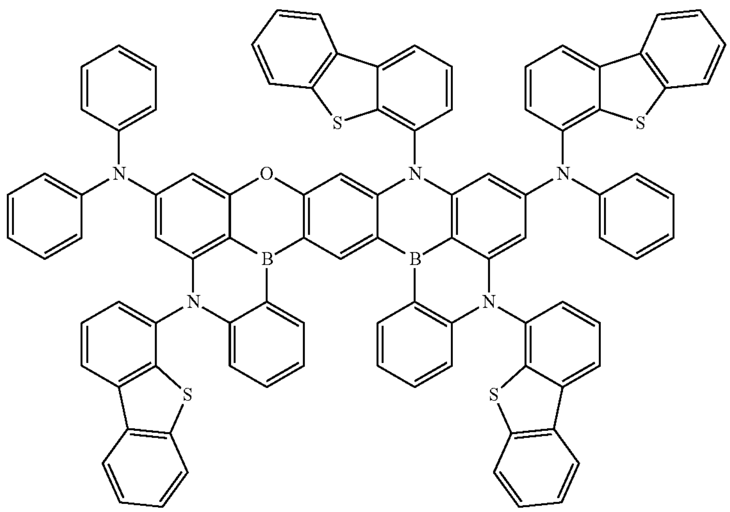
304
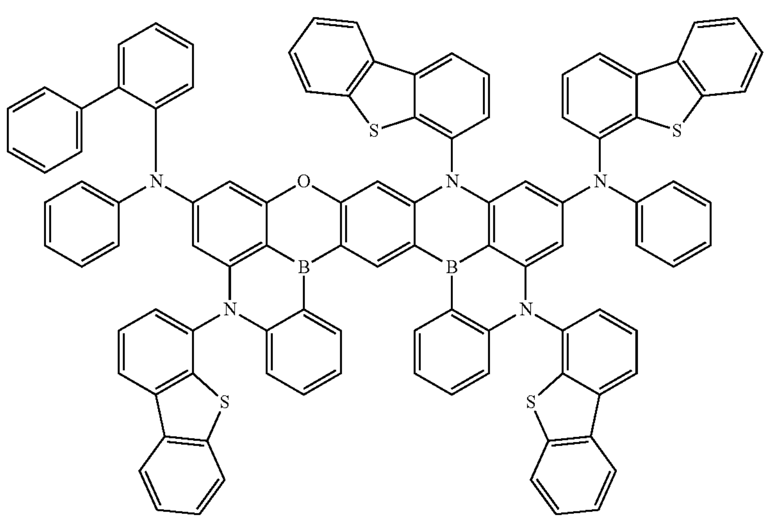

-continued
305
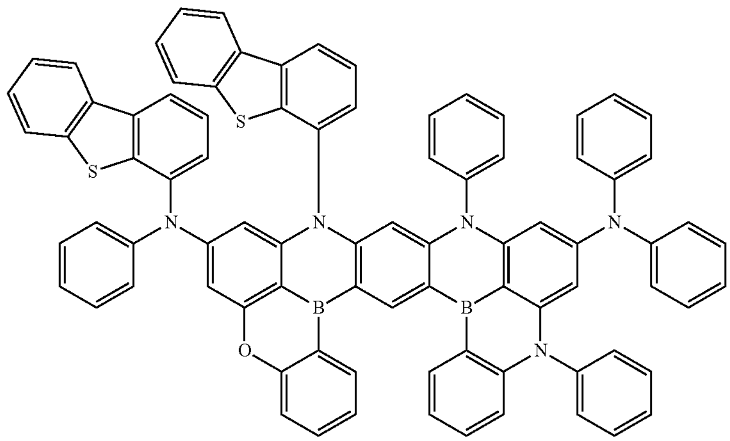
306
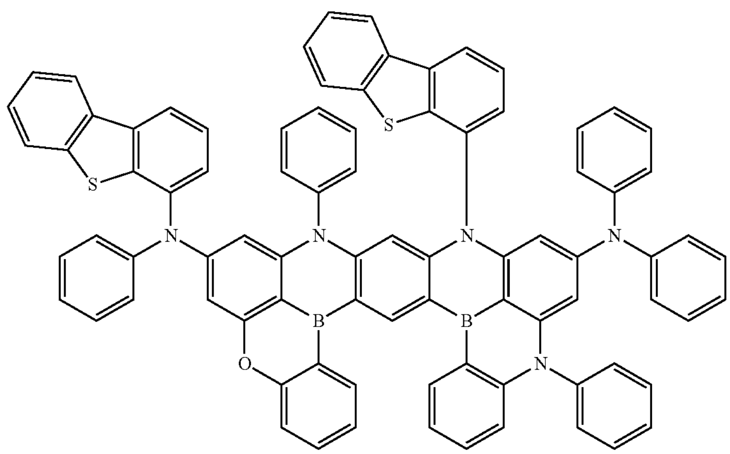
307
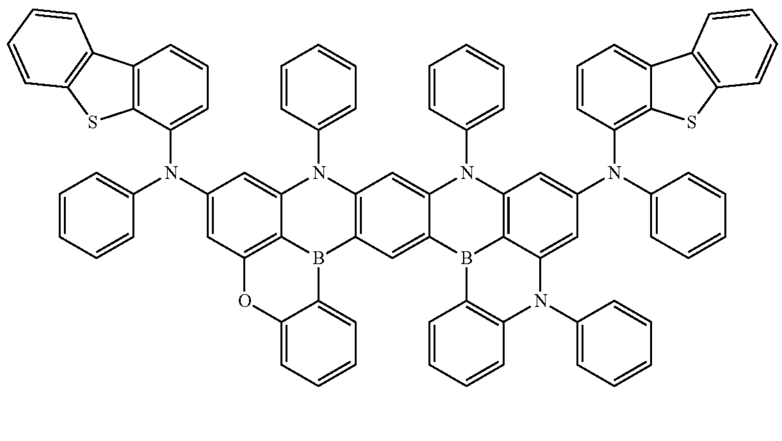

-continued
308
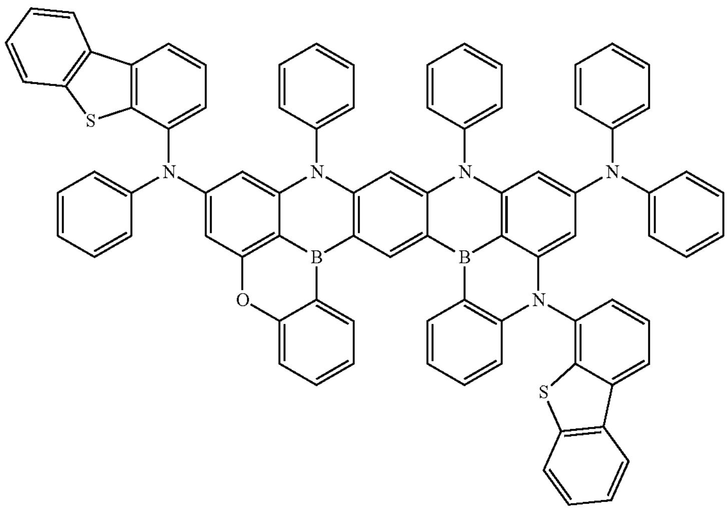
309
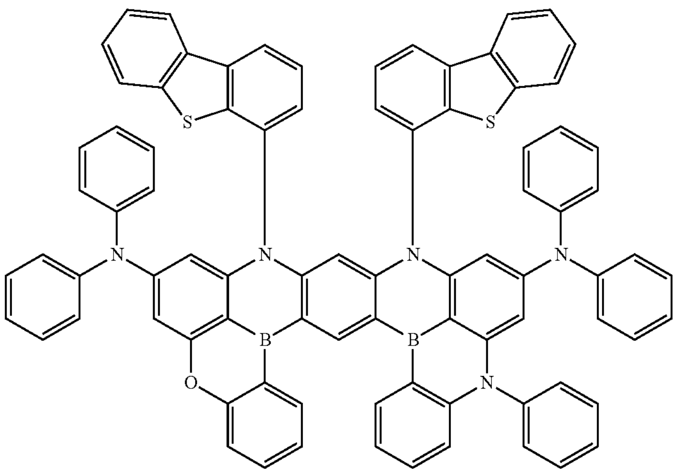
310
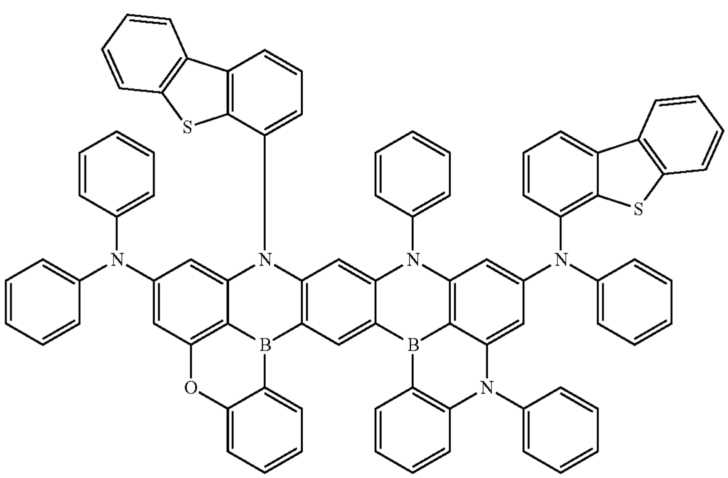

-continued
311
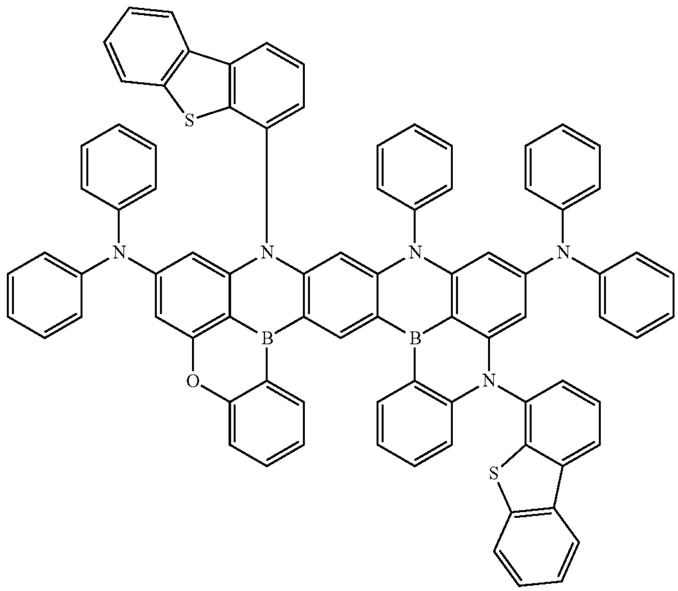
312
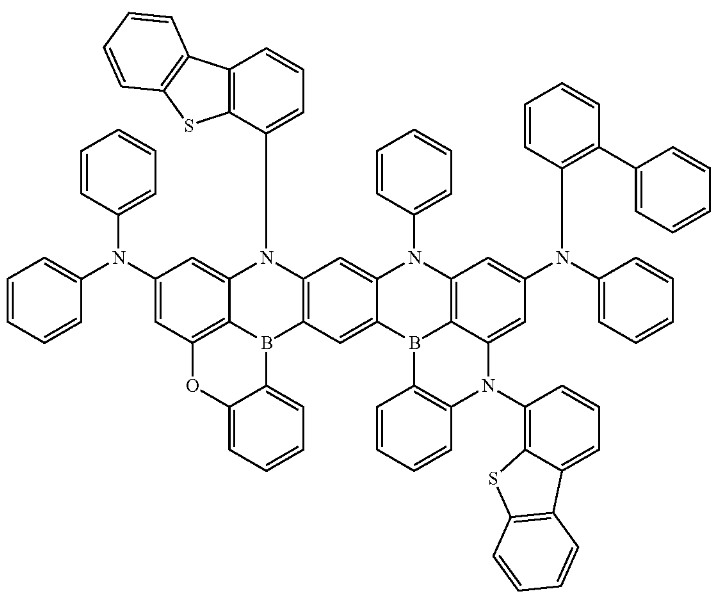
313
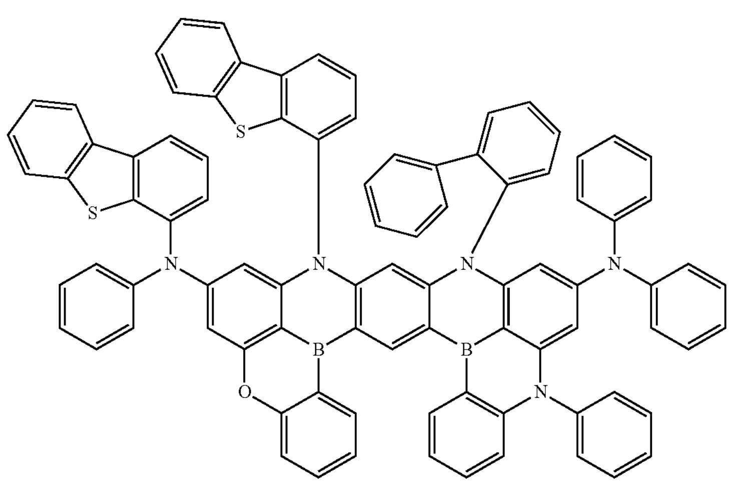

-continued
314
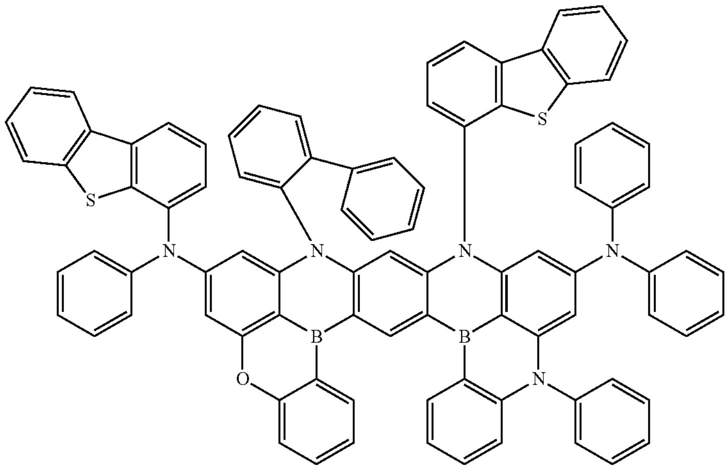
315
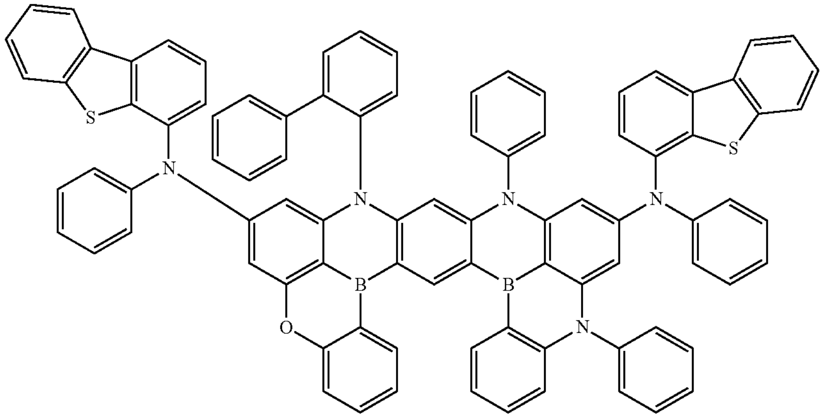
316
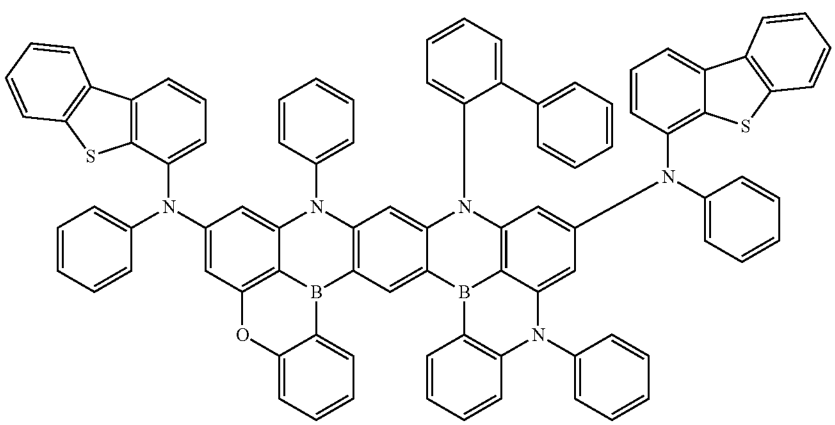

-continued
317
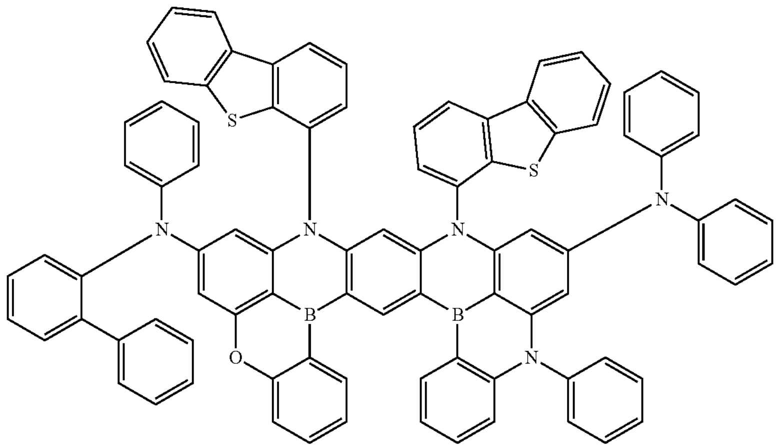
318
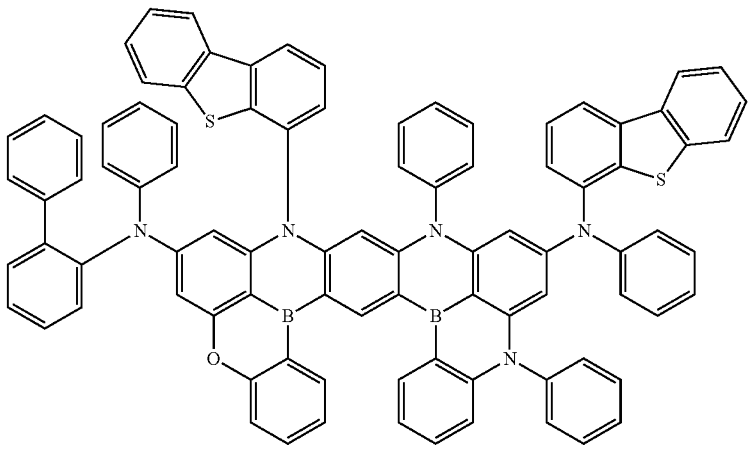
319
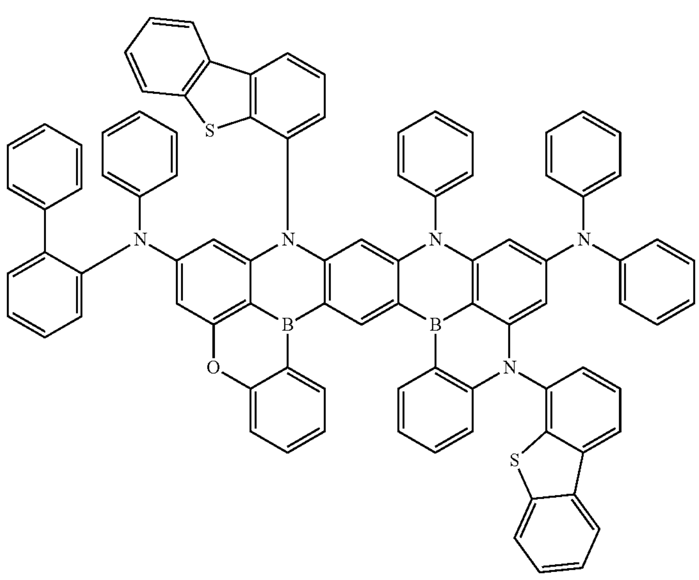

-continued
320
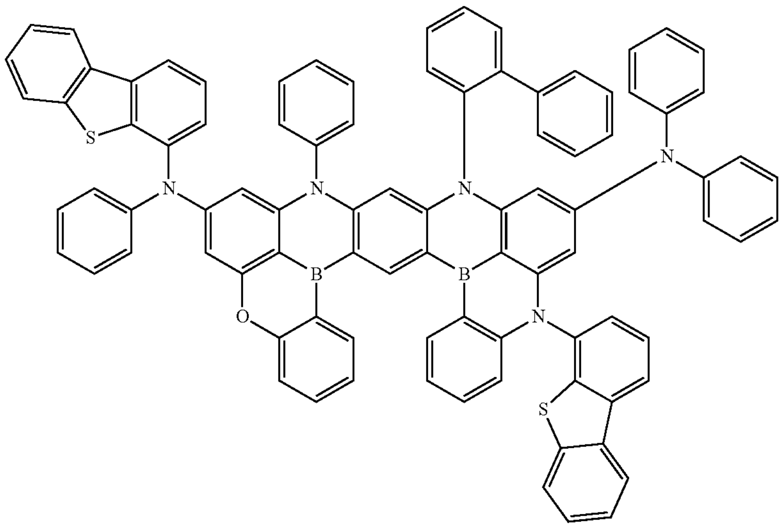
321
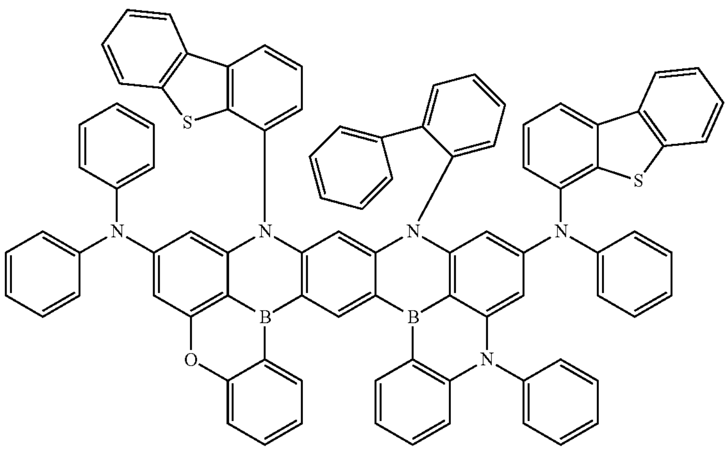
322
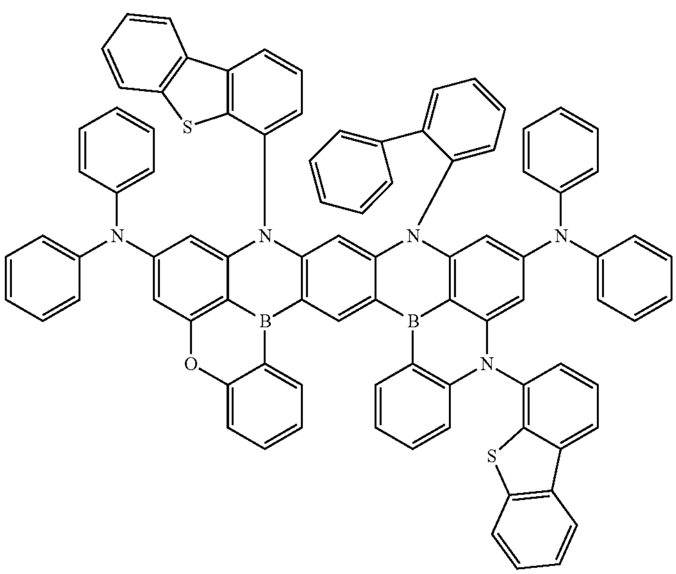

-continued
323
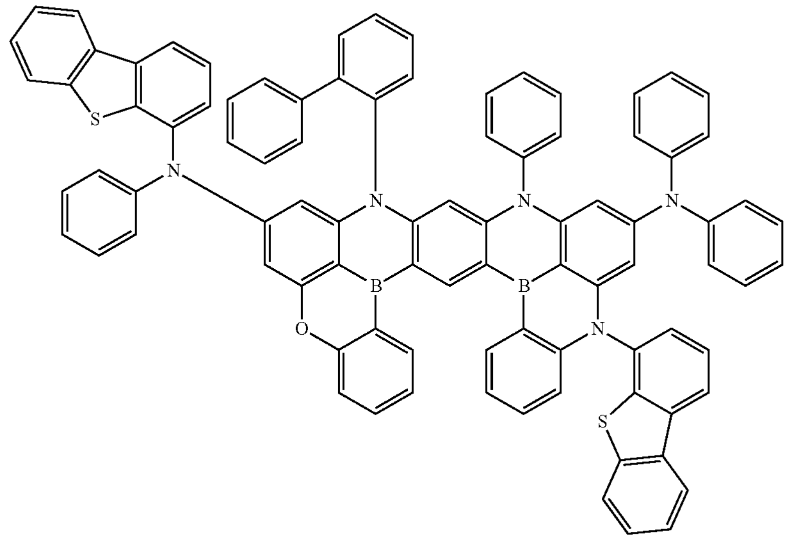
324
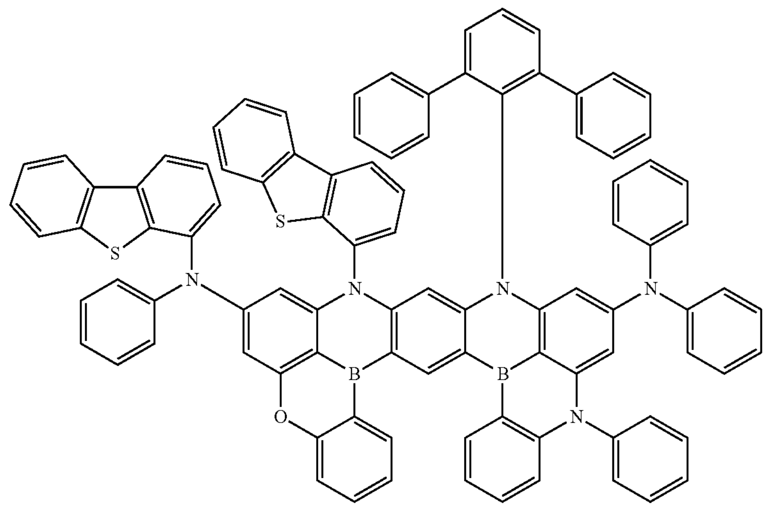
325
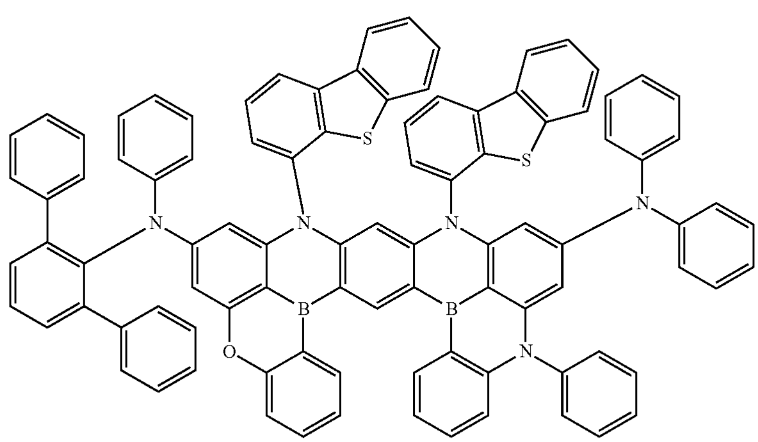

-continued
326
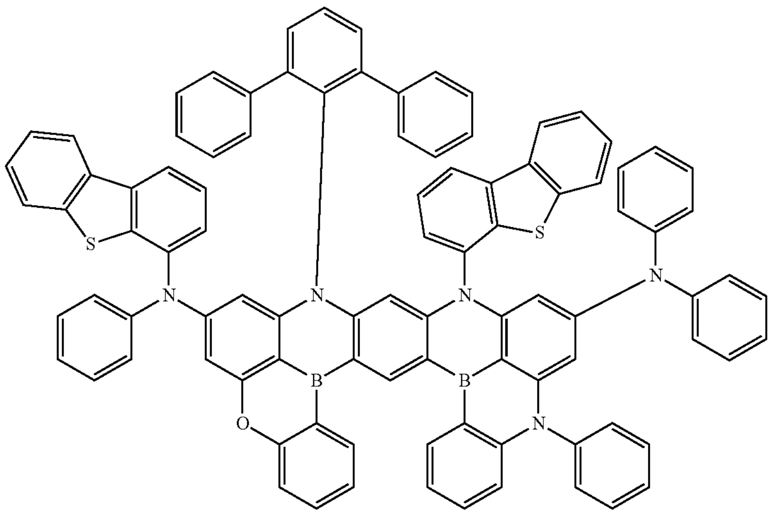
327
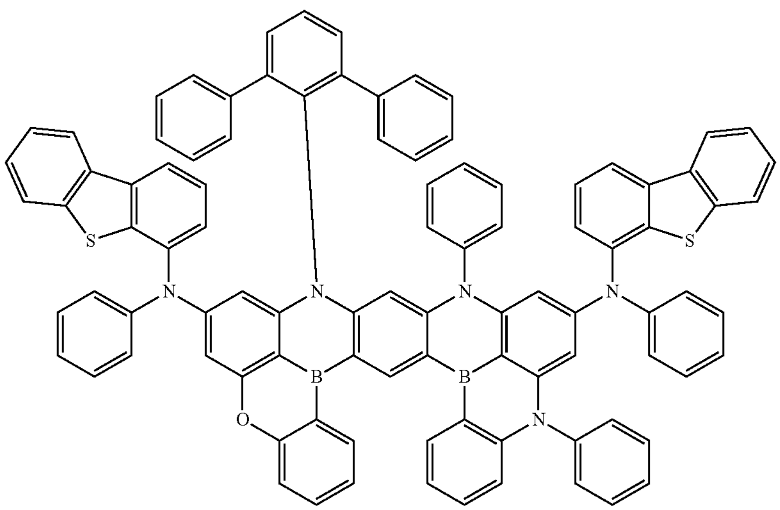
328
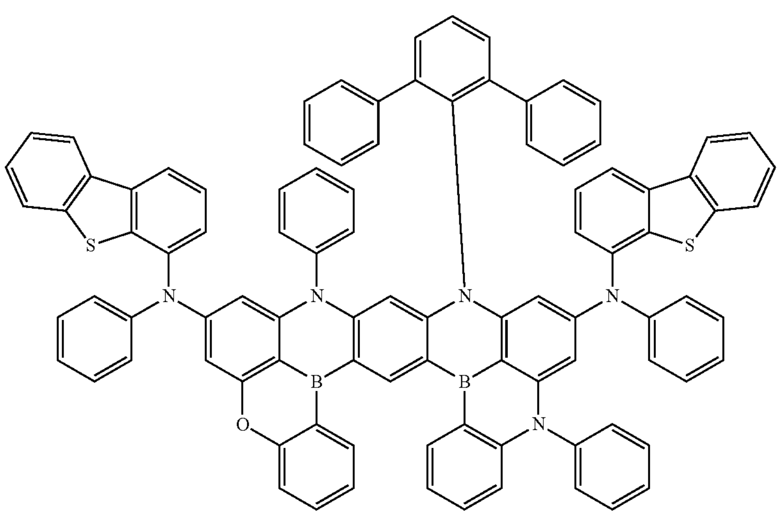

-continued
329
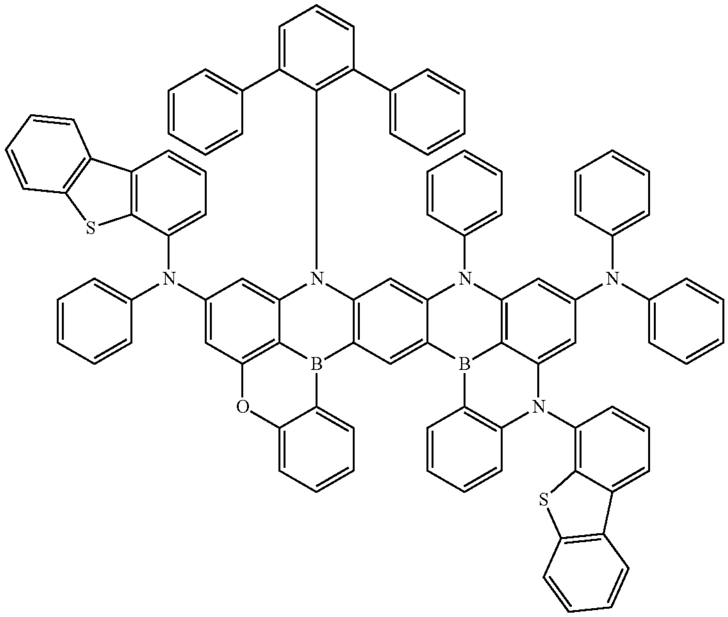
330
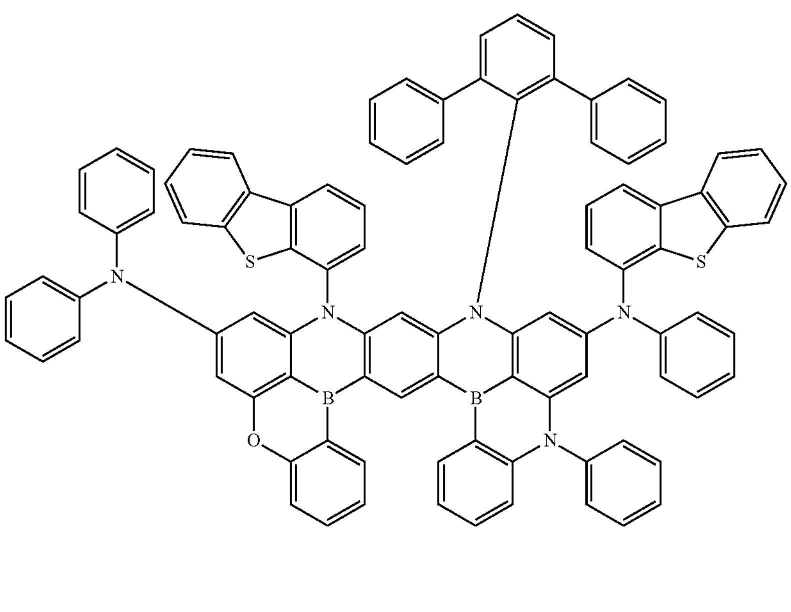

-continued
331
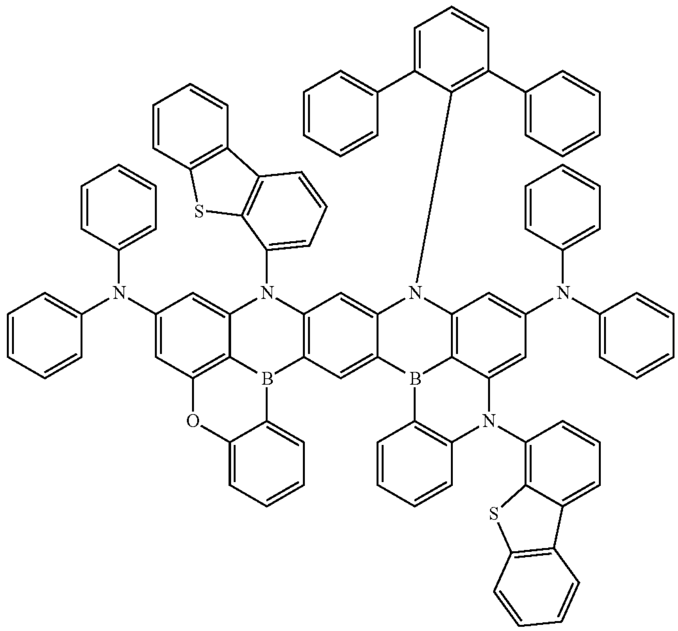
332
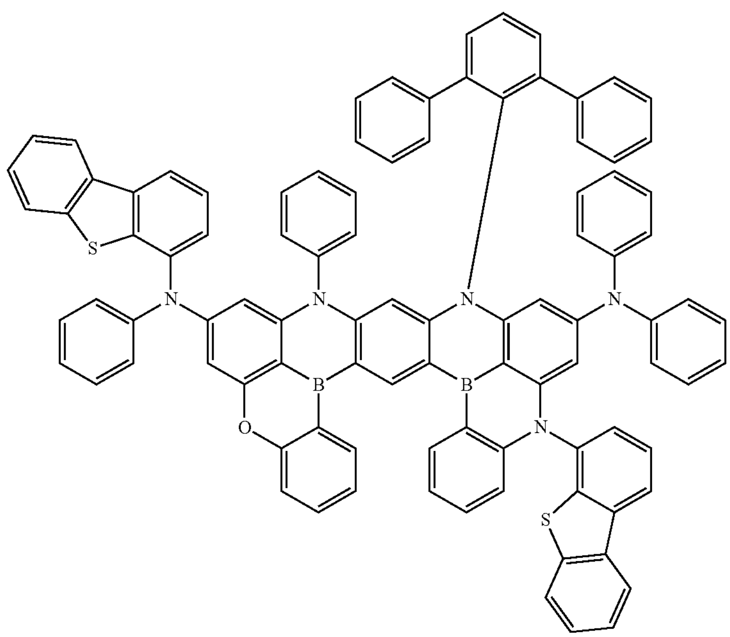

-continued
333
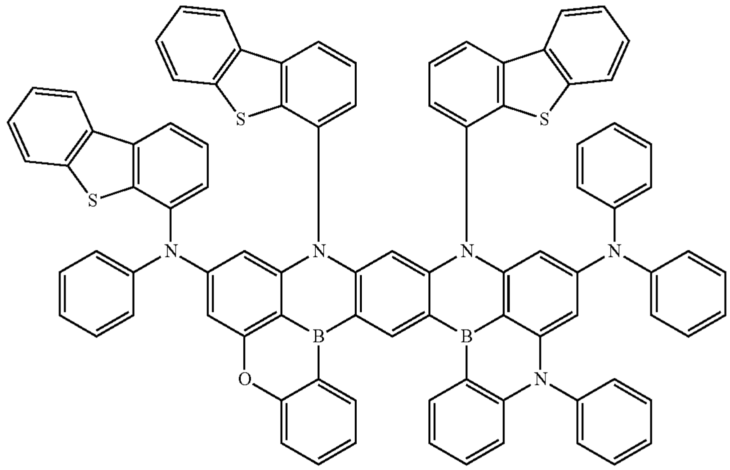
335
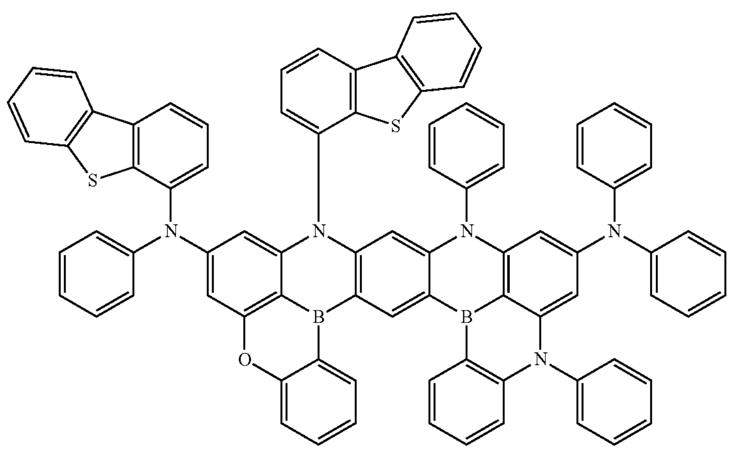
336
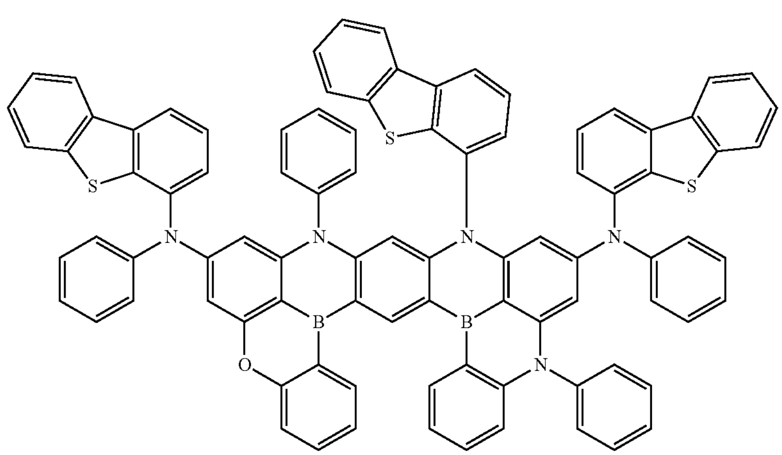

-continued
337
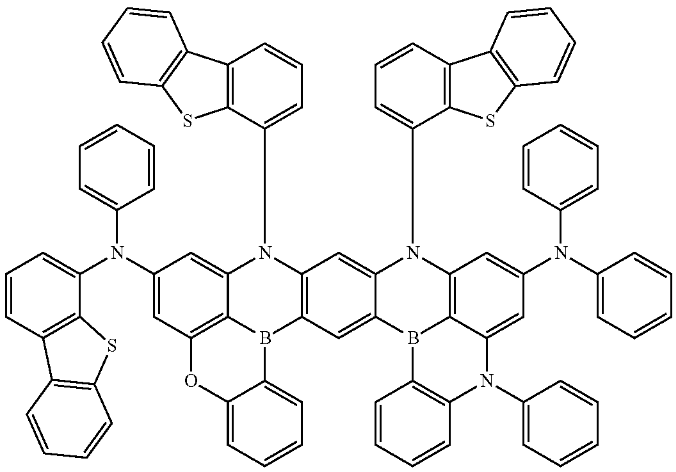
338
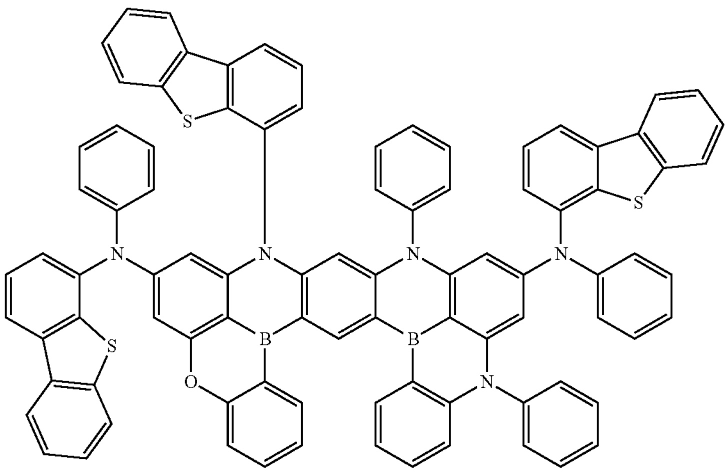
339
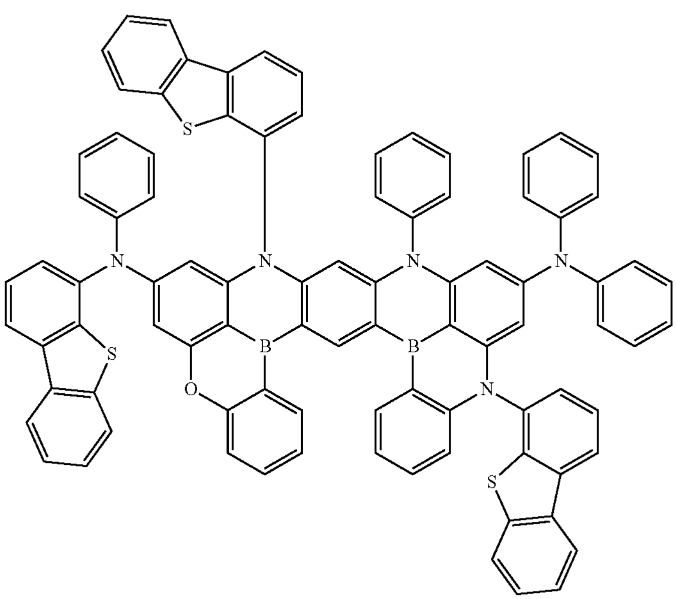

-continued
340
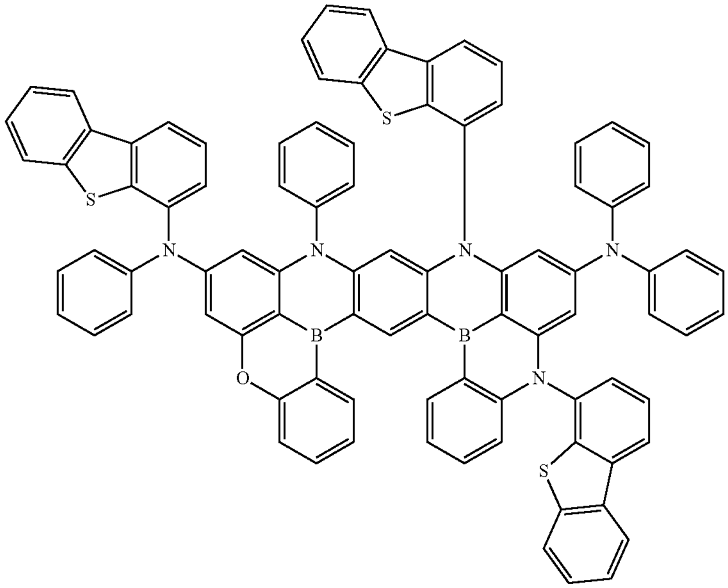
341
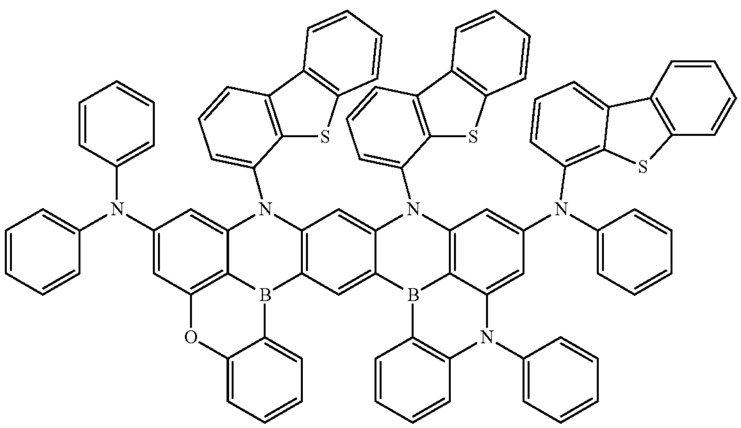
342
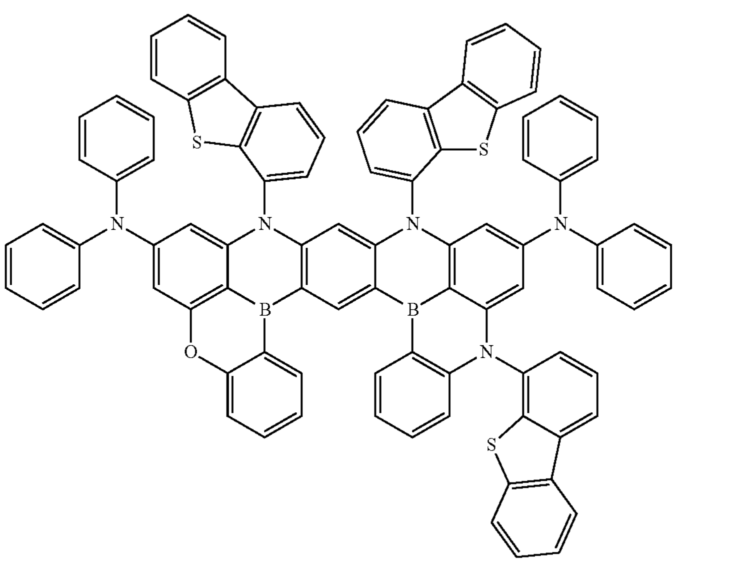

-continued
343
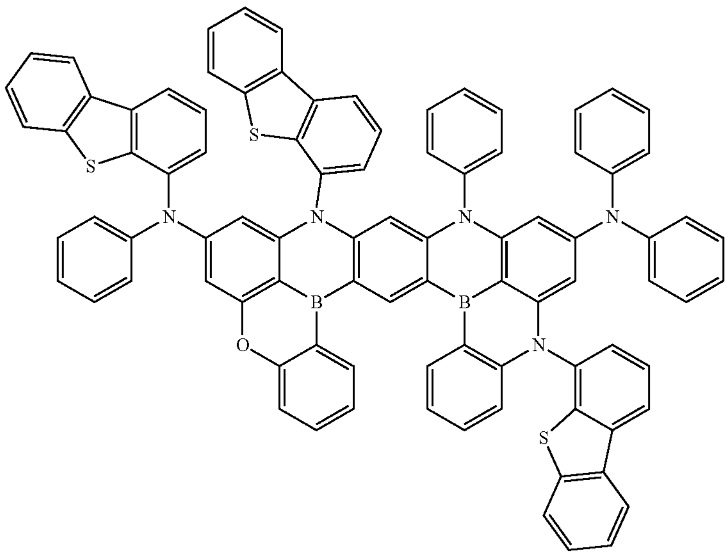
344
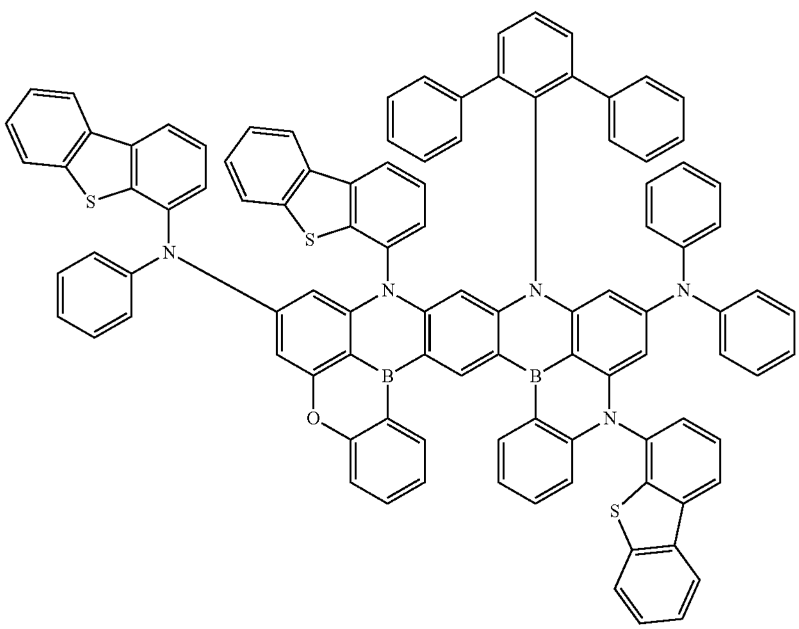
345
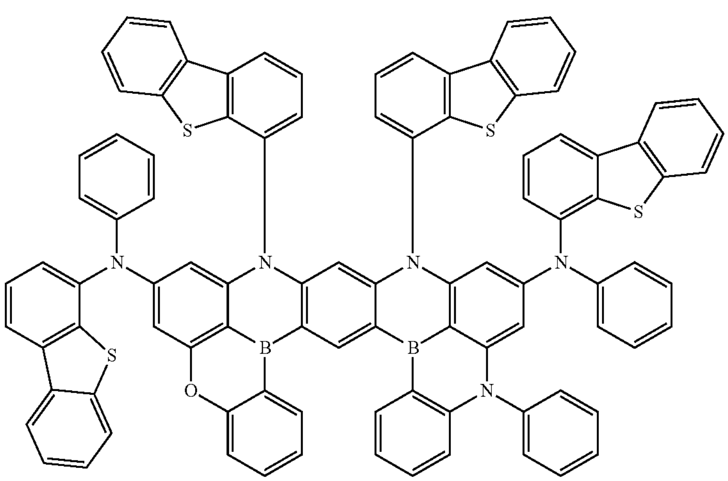

-continued
346
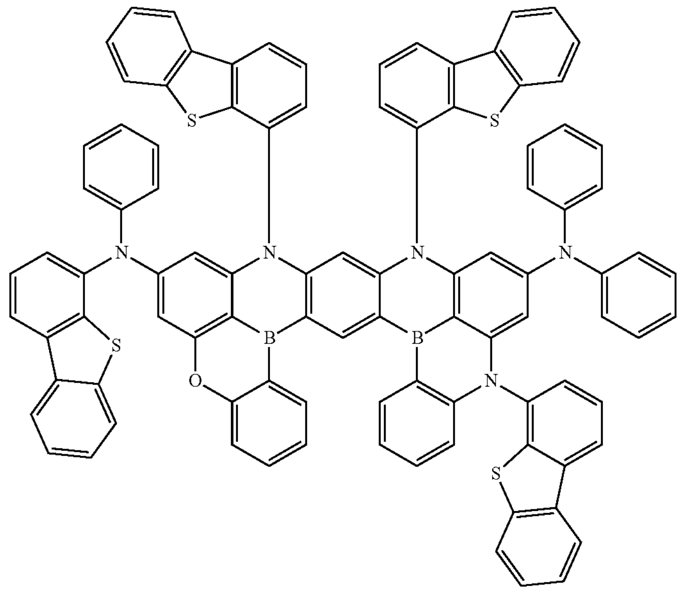
347
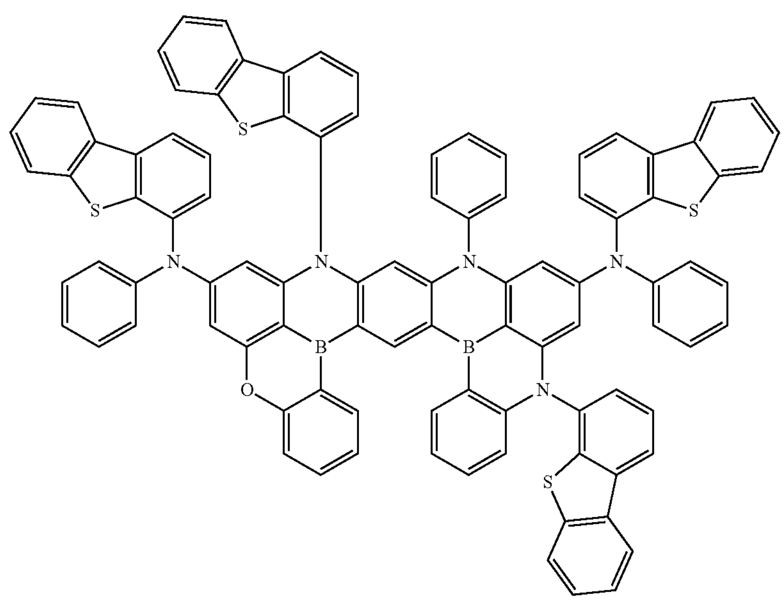

-continued

348

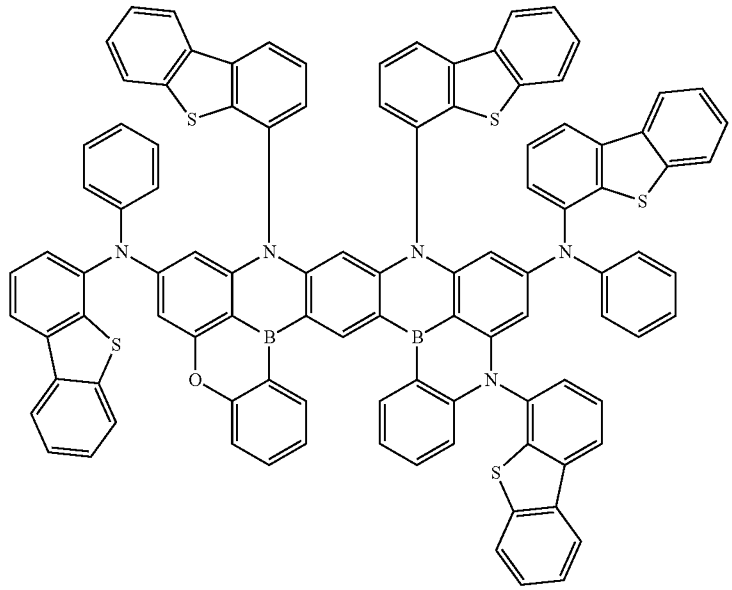

The fused cyclic compound according to an embodiment includes the condensed cyclic structure represented by Formula 1, highest occupied molecular orbital (HOMO) and lowest unoccupied molecular orbital (LUMO) are separated by multiple resonance between an N atom and a B atom, and thus thermally activated delayed fluorescent (TADF) characteristics may be obtained. In addition, the fused cyclic compound contains two boron atoms and has a wide plate-like skeleton, and such a structure is suitable for multiple resonance. Accordingly, the fused cyclic compound has a high oscillator strength (f) and a low $\Delta E_{ST}$ (a difference between a singlet energy level and a triplet energy level of the fused cyclic compound represented by Formula 1). Therefore, the fused cyclic compound may exhibit improved TADF characteristics.

The fused cyclic compound represented by Formula 1 includes at least two dibenzothiophene groups connected to an N atom. Although not wanting to be bound by theory, due to the inclusion thereof, the bond dissociation energy of a C—N bond may be increased and the stability of the fused cyclic compound may be enhanced, and additionally, the dibenzothiophene group may further increase the multiple resonance of a boron-containing core. Accordingly, the fused cyclic compound may have a greater oscillator strength and a lower $\Delta E_{ST}$, and thus, TADF characteristics may be further improved. Therefore, a light-emitting device including the fused cyclic compound may have high luminescence efficiency.

In addition, although not wanting to be bound by theory, due to the distortion of a plane containing the dibenzothiophene group and a boron-containing main plane, an intermolecular interaction may be reduced. As a result, energy transfer according to a Dexter energy transfer mechanism may be reduced, and characteristics of a light-emitting device, for example, luminescence efficiency thereof may be improved.

The fused cyclic compound represented by Formula 1 includes N on at least one of $X_1$ to $X_4$, and thus due to the difference in electronegativity between N and C, multiple resonance characteristics may occur. Accordingly, the light-emitting device including the fused cyclic compound may have a luminescence efficiency that is at least about two times greater than that of a light-emitting device including a compound that does not contain N in $X_1$ to $X_4$. The synthesis method of the fused cyclic compound represented by Formula 1 may be recognized by those skilled in the art with reference to Synthesis Examples and/or Examples described below. The fused cyclic compound represented by Formula 1 may be used in a light-emitting device (for example, an organic light-emitting device).

Thus, is a light-emitting device constructed according to the principles and an embodiment of the invention may include a first electrode, a second electrode facing the first electrode, an interlayer that is located between the first electrode and the second electrode and includes an emission layer, and at least one fused cyclic compound represented by Formula 1. In an embodiment, the interlayer of the light-emitting device may include the fused cyclic compound represented by Formula 1. For example, the emission layer may include the fused cyclic compound. In an embodiment, the emission layer may include a host and a dopant, the amount of the host in the emission layer is greater than the amount of the dopant in the emission layer, and the dopant may include the fused cyclic compound. For example, the fused cyclic compound contained in the emission layer is a thermally activated delayed fluorescence emitter. For example, the emission layer may emit delayed fluorescence. For example, the host in the emission layer may include a carbazole-containing compound.

In an embodiment, the amount of dopant in the emission layer may be from about 0.01 weight percent (wt %) to about 20 wt % based on the total weight of the emission layer. In an embodiment, the emission layer may emit blue light having a maximum emission wavelength of about 410 nm to about 480 nm. In an embodiment, the first electrode of the light-emitting device may be an anode, the second electrode of the light-emitting device may be a cathode, the interlayer may further include a hole transport region located between the first electrode and the emission layer and an electron transport region located between the emission layer and the second electrode, the hole transport region includes a hole injection layer, a hole transport layer, an emission auxiliary layer, an electron-blocking layer, or any combination thereof, and the electron transport region may include a buffer layer, an electron control layer, a hole-blocking layer, an electron transport layer, an electron injection layer, or any combination thereof.

In one or more embodiments, the first electrode of the light-emitting device may be an anode, the second electrode of the light-emitting device may be a cathode, the interlayer may further include a hole transport region located between the first electrode and the emission layer, the hole transport region may include a compound represented by Formula 201, a compound represented by Formula 202, or any combination thereof, and the emission layer may include at least one fused cyclic compound represented by Formula 1:

Formula 201

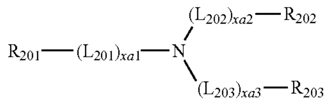

Formula 202

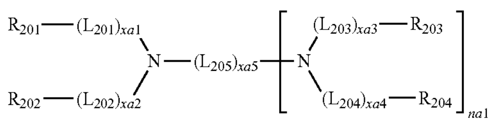

wherein, in Formulae 201 and 202, $L_{201}$ to $L_{204}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ is *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 are each independently an integer from 0 to 5, xa5 is an integer from 1 to 10, $R_{201}$ to $R_{204}$ and $Q_{201}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ are optionally linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and the like) unsubstituted or substituted with at least one $R_{10a}$ (for example, Compound HT16), $R_{203}$ and $R_{204}$ are optionally linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, the hole transport region may include a compound including an amine moiety in the form of an amine-group containing compound, a compound including a carbazole moiety in the form of a carbazole-containing compound, a compound including a silicon moiety in the form of a silicon-containing compound, or any combination thereof. In an embodiment, the electron transport region may include a compound including a silicon moiety in the form of a silicon-containing compound, a compound including a phosphine moiety in the form of a phosphine oxide-containing compound, a compound including a benzimidazole moiety in the form of a benzimidazole-containing compound, or any combination thereof. In an embodiment, the light-emitting device may include a capping layer located outside the first electrode or outside the second electrode. For example, the light-emitting device may further include at least one of a first capping layer located outside the first electrode and a second capping layer located outside the second electrode, and at least one of the first capping layer and the second capping layer may contain the fused cyclic compound represented by Formula 1. The first capping layer and/or the second capping layer will be described in detail below.

For example, the interlayer may include only Compound 1 as the fused cyclic compound. In this regard, Compound 1 may be present in the emission layer of the light-emitting device. In an embodiment, the interlayer may include, as the fused cyclic compound, Compound 1 and Compound 2. In this regard, Compound 1 and Compound 2 may be present in the same layer (for example, both Compound 1 and Compound 2 may be present in the emission layer) or in different layers (for example, Compound 1 is present in the emission layer and Compound 2 may exist in the electron transport region).

According to another aspect of the invention an electronic apparatus may include the light-emitting device. The electronic apparatus may further include a thin-film transistor. In one or more embodiments, the electronic apparatus may further include a thin-film transistor including a source electrode and a drain electrode, and the first electrode of the light-emitting device may be electrically connected to the source electrode or the drain electrode. In an embodiment, the electronic apparatus may further include a color filter, a color conversion layer, a touch screen layer, a polarizing layer, or any combination thereof. More details on the electronic apparatus are the same as described herein.

Description of FIG. 1

FIG. 1 is a schematic cross-sectional view of an embodiment of a light-emitting device constructed according to the principles of the invention.

Particularly, FIG. 1 is a schematic cross-sectional view of a light-emitting device according to an embodiment. The light-emitting device 10 includes a first electrode 110, an interlayer 130, and a second electrode 150. Hereinafter, the structure of the light-emitting device according to an embodiment and an illustrative method of manufacturing the light-emitting device 10 will be described in connection with FIG. 1.

First Electrode 110

In FIG. 1, a substrate may be additionally located under the first electrode 110 or above the second electrode 150. As the substrate, a glass substrate or a plastic substrate may be used. In one or more embodiments, the substrate may be a flexible substrate, and may include plastics with excellent heat resistance and durability, such as a polyimide, a polyethylene terephthalate (PET), a polycarbonate, a polyethylene naphthalate, a polyarylate (PAR), a polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include an indium tin oxide (ITO), an indium zinc oxide (IZO), a tin oxide (SnO2), a zinc oxide (ZnO), or any combinations thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode 110. The first electrode 110 may have a single-layered structure consisting of a single layer or a multilayer structure including a plurality of layers. For example, the first electrode 110 may have a three-layered structure of an ITO/Ag/ITO.

Interlayer 130

The interlayer 130 may be located on the first electrode 110. The interlayer 130 may include an emission layer. The interlayer 130 may further include a hole transport region placed between the first electrode 110 and the emission layer and an electron transport region placed between the emission layer and the second electrode 150. The interlayer 130 may further include, in addition to various organic materials, metal-containing compounds such as organometallic compounds, inorganic materials such as quantum dots, and the like.

In one or more embodiments, the interlayer 130 may include, i) two or more emitting units sequentially stacked between the first electrode 110 and the second electrode 150 and ii) a charge generation layer located between the two emitting units. When the interlayer 130 includes the emitting unit and the charge generation layer as described above, the light-emitting device 10 may be a tandem light-emitting device.

Hole Transport Region in Interlayer 130

The hole transport region may have: i) a single-layered structure consisting of a single layer consisting of a single material, ii) a single-layered structure consisting of a single layer consisting of a plurality of different materials, or iii) a multi-layered structure including a plurality of layers including a plurality of different materials. The hole transport region may include a hole injection layer, a hole transport layer, an emission auxiliary layer, an electron-blocking layer, or any combination thereof. For example, the hole transport region may have a multi-layered structure of a hole injection layer/hole transport layer structure, a hole injection layer/hole transport layer/emission auxiliary layer structure, a hole injection layer/emission auxiliary layer structure, a hole transport layer/emission auxiliary layer or hole injection layer/hole transport layer/electron-blocking layer structure, wherein, in each structure, constituting layers are sequentially stacked from the first electrode 110.

The hole transport region may include a compound represented by Formula 201, a compound represented by Formula 202, or any combination thereof.

Formula 201

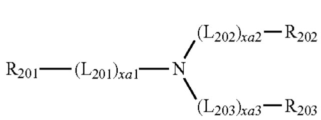

-continued

Formula 202

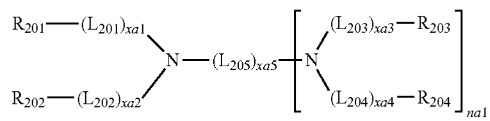

$L_{201}$ to $L_{205}$, xa1 to xa5, $R_{201}$ to $R_{204}$, $Q_{201}$ and na1 in Formulae 201 and 202 are the same as described above.

In one or more embodiments, each of Formulae 201 and 202 may include at least one of groups represented by Formulae CY201 to CY217.

CY201

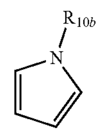

CY202

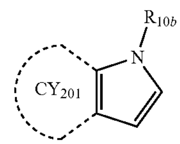

CY203

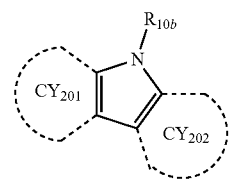

CY204

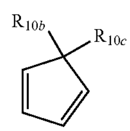

CY205

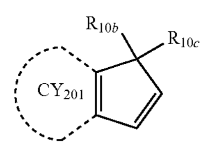

CY206

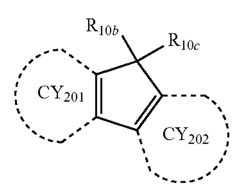

CY207

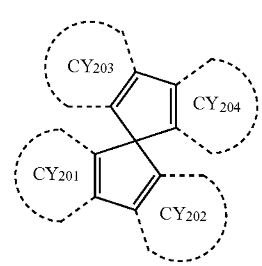

-continued

CY208

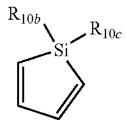

CY209

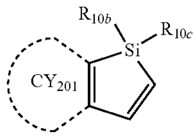

CY210

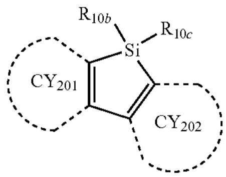

CY211

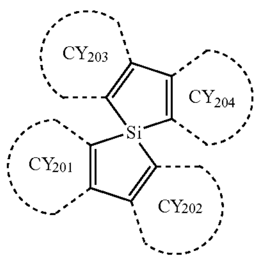

CY212

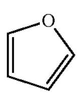

CY213

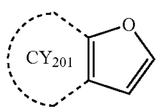

CY214

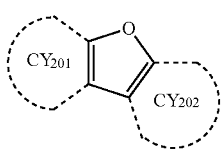

CY215

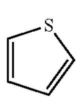

CY216

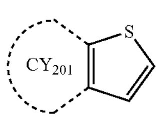

-continued

CY217

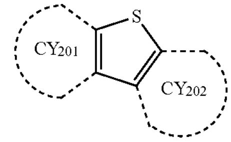

The variables $R_{10b}$ and $R_{10c}$ in Formulae CY201 to CY217 are the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$. In an embodiment, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one of groups represented by Formulae CY201 to CY203. In one or more embodiments, Formula 201 may include at least one of groups represented by Formulae CY201 to CY203 and at least one of groups represented by Formulae CY204 to CY217. In one or more embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207. In one or more embodiments, each of Formulae 201 and 202 may not include a group represented by one of Formulae CY201 to CY203. In one or more embodiments, each of Formulae 201 and 202 may not include a group represented by one of Formulae CY201 to CY203, and may include at least one of groups represented by Formulae CY204 to CY217. In one or more embodiments, each of Formulae 201 and 202 may not include a group represented by one of Formulae CY201 to CY217.

In an embodiment, the hole transport region may include one of Compounds HT1 to HT46, 4,4',4"-tris[phenyl(m-tolyl)amino]triphenylamine (m-MTDATA), 1-N,1-N-bis[4-(diphenylamino)phenyl]-4-N,4-N-diphenylbenzene-1,4-diamine (TDATA), 4,4',4"-tris[2-naphthyl(phenyl)amino]triphenylamine (2-TNATA), bis(naphthalen-1-yl)-N,N'-bis(phenyl)benzidine (NPB or NPD), N4,N4'-di(naphthalen-2-yl)-N4,N4'-diphenyl-[1,1'-biphenyl]-4,4'-diamine (P-NPB), N,N'-bis(3-methylphenyl)-N,N'-diphenylbenzidine (TPD), N,N'-bis(3-methylphenyl)-N,N'-diphenyl-9,9-spirobifluorene-2,7-diamine (Spiro-TPD), N2,N7-di-1-naphthalenyl-N2,N7-diphenyl-9,9'-spirobi[9H-fluorene]-2,7-diamine (Spiro-NPB), N,N'-di(1-naphthyl)-N,N'-diphenyl-2,2'-dimethyl-(1,1'-biphenyl)-4,4'-diamine (methylated NPB), 4,4'-cyclohexylidenebis[N,N-bis(4-methylphenyl)benzenamine] (TAPC), N,N,N',N'-tetrakis(3-methylphenyl)-3,3'-dimethylbenzidine (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
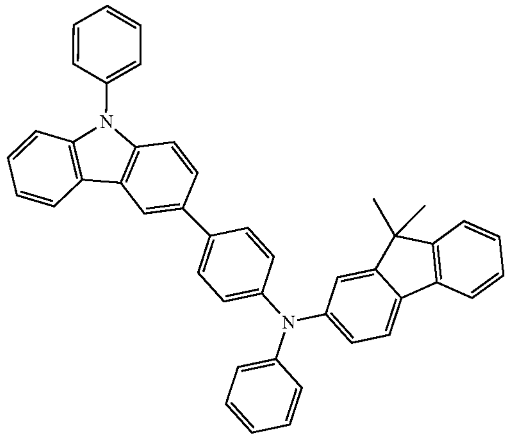
HT2
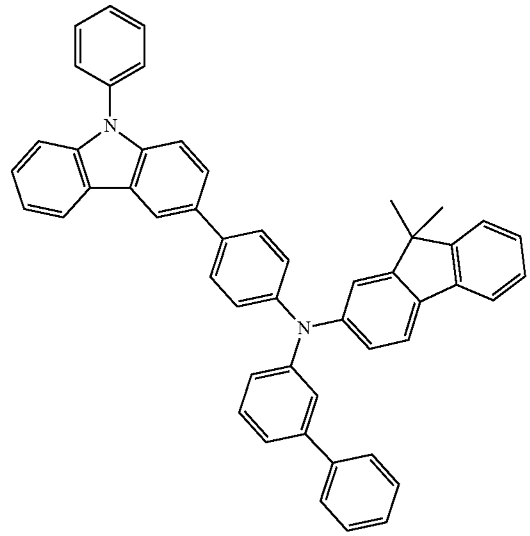
HT3
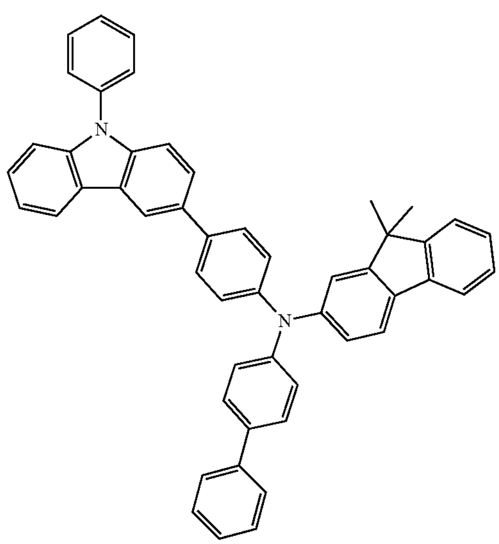
HT4
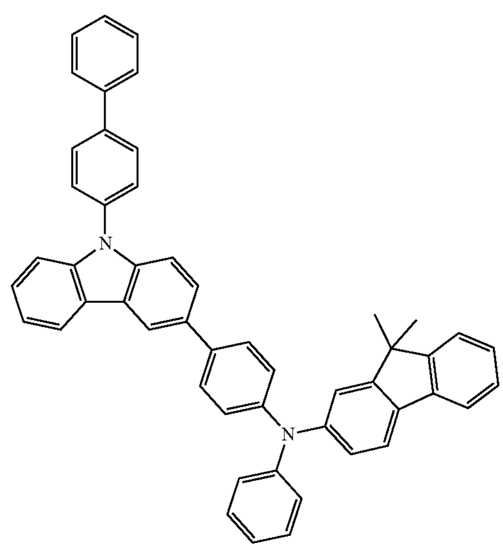

-continued
HT5
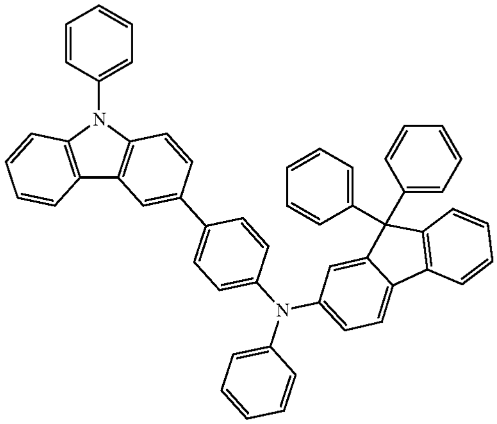
HT6
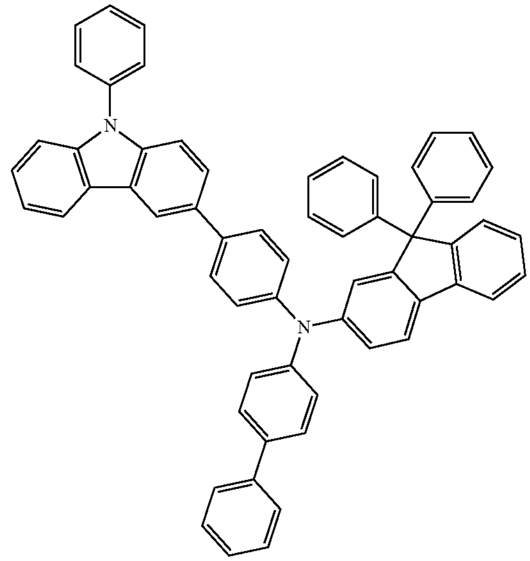
HT7
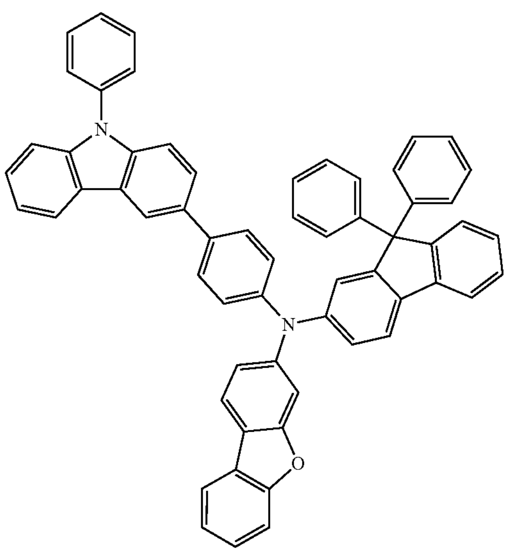
HT8
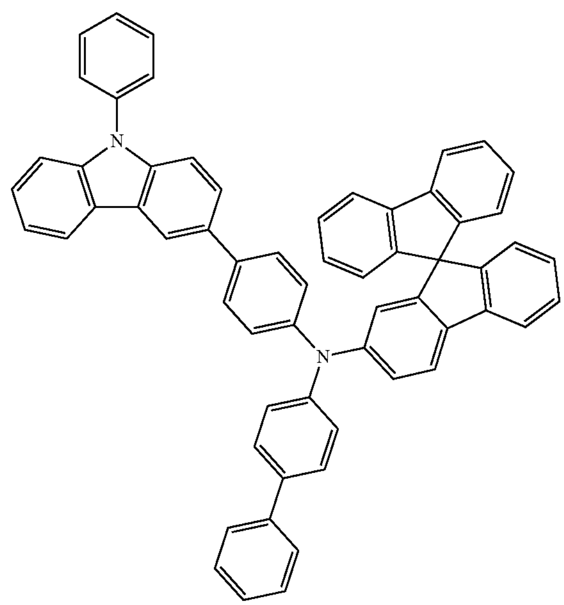

-continued
HT9
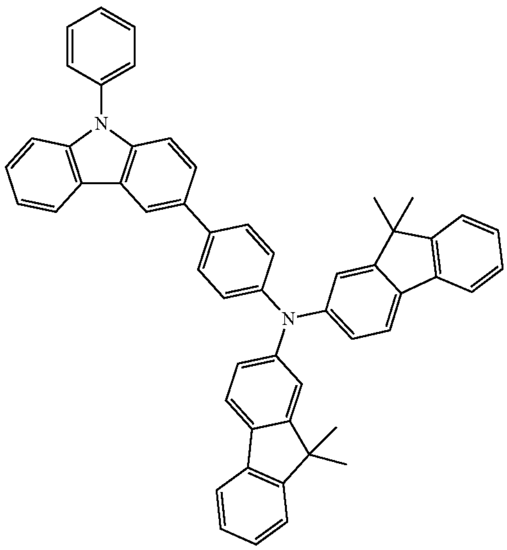
HT10
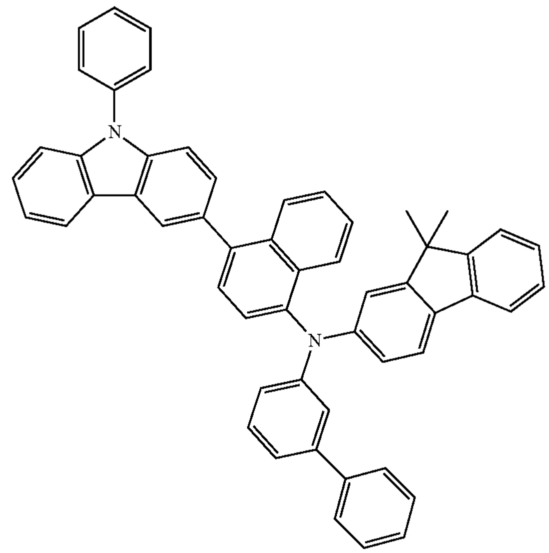
HT11
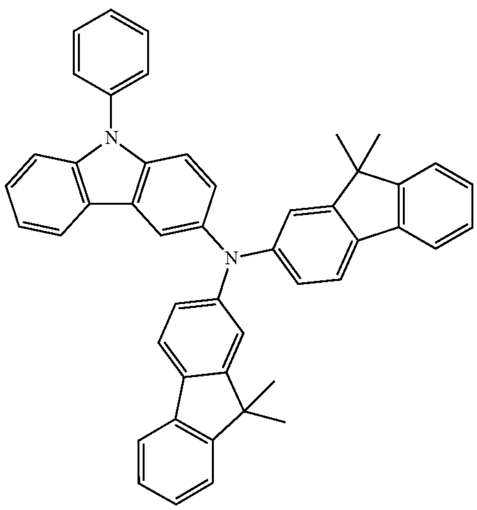
HT12
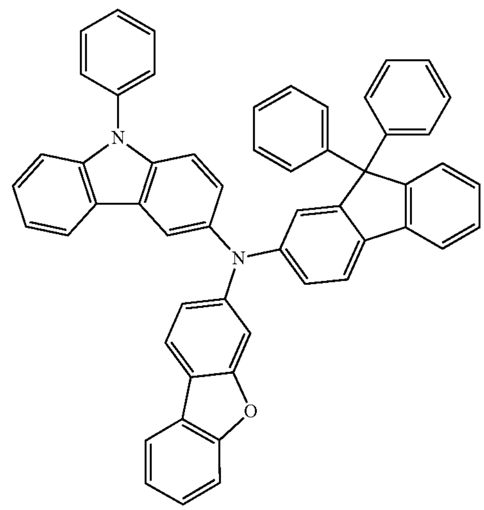
HT13
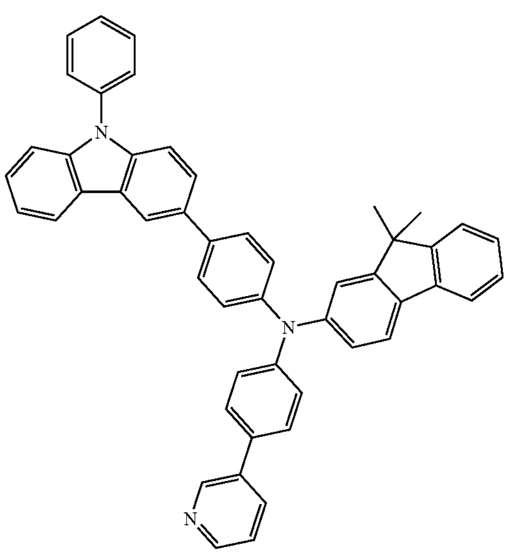
HT14
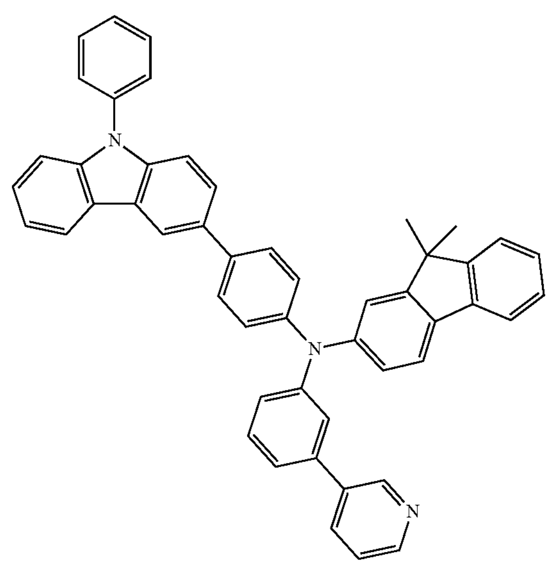

-continued
HT15
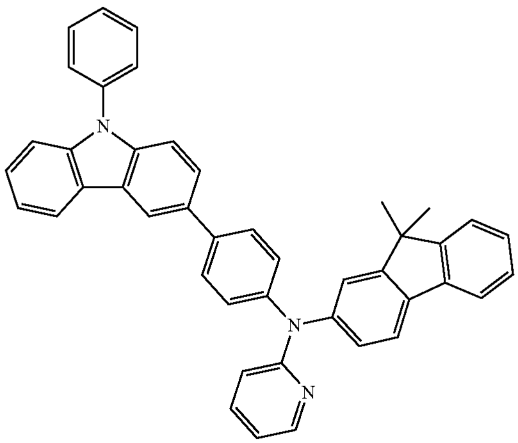
HT16
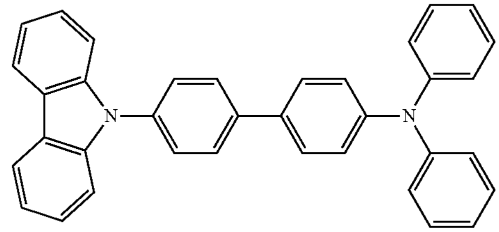
HT17
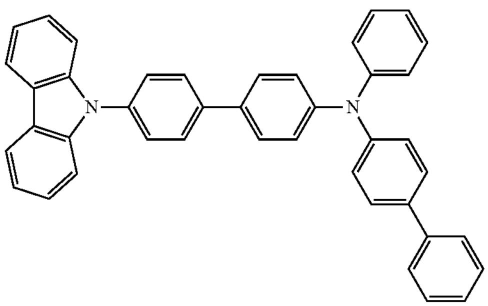
HT18
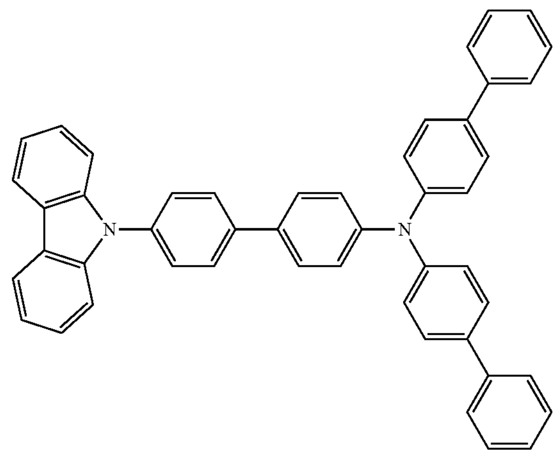
HT19
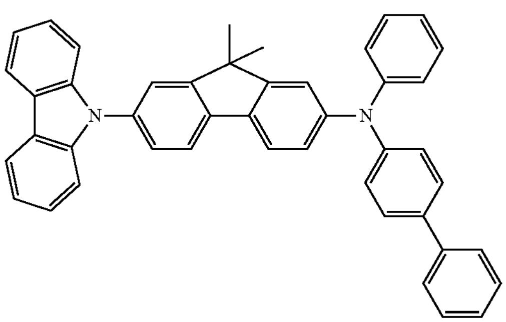
HT20
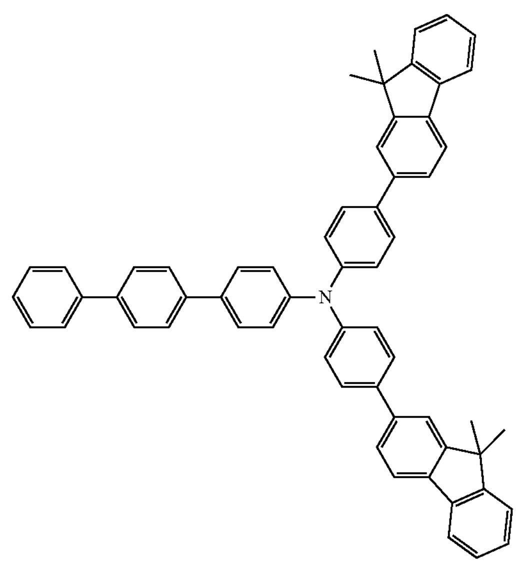

-continued
HT21
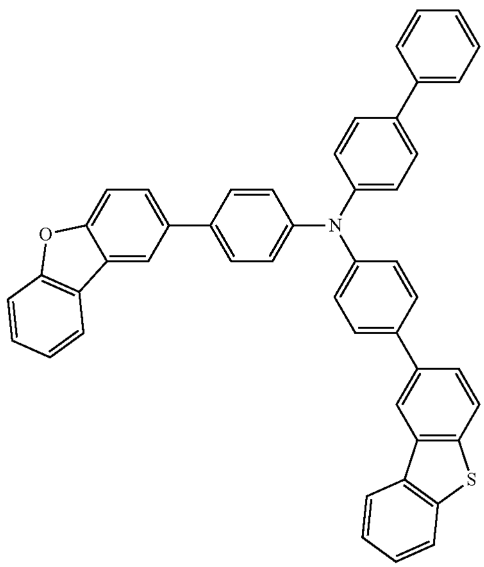
HT22
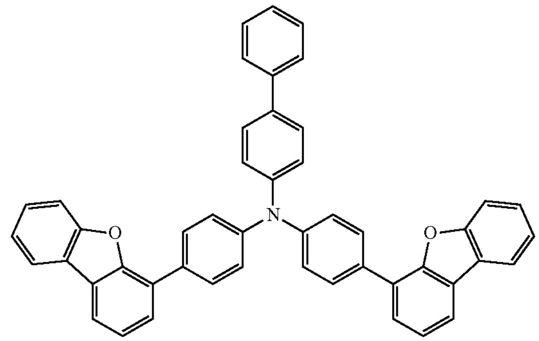
HT23
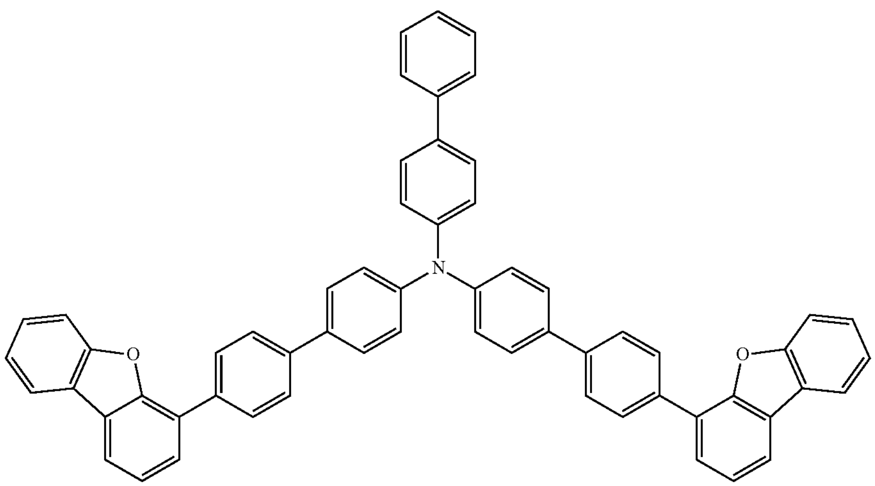
HT24
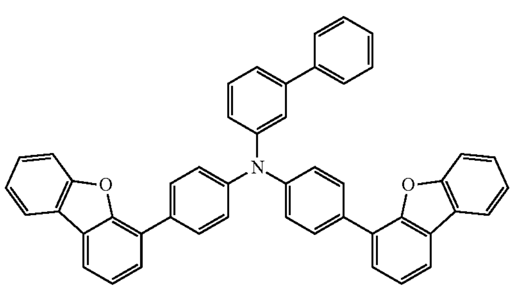
HT25
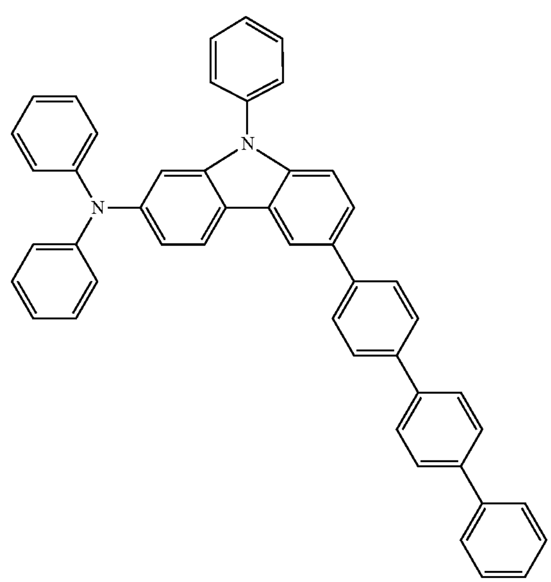

-continued
HT26
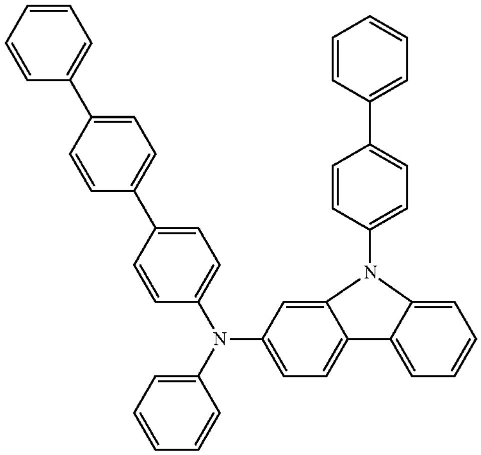
HT27
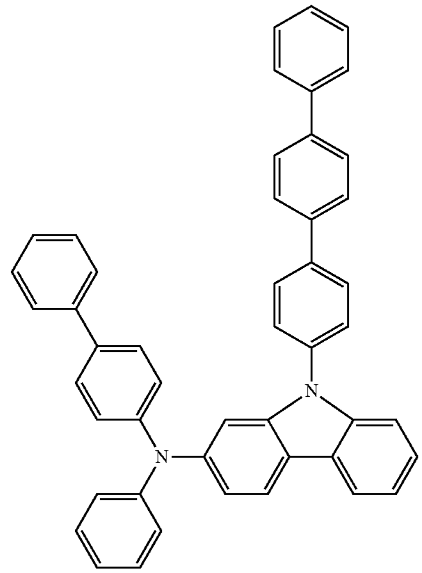
HT28
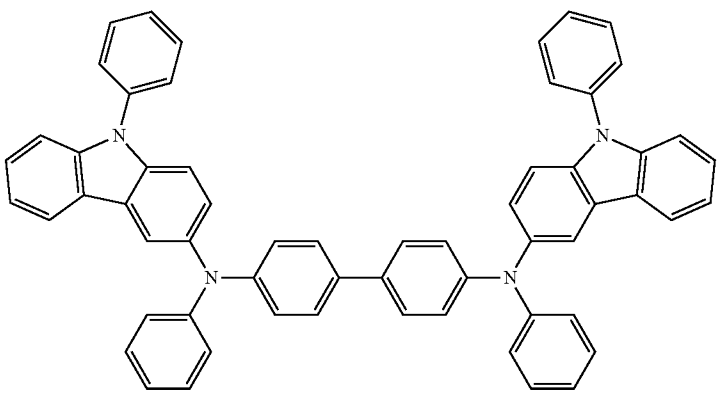
HT29
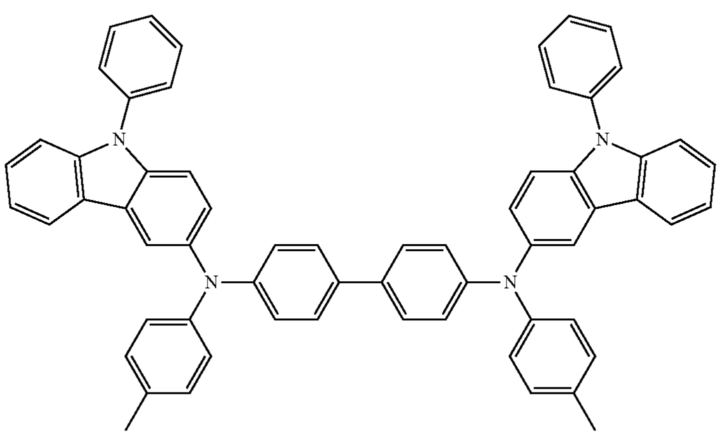

-continued
HT30
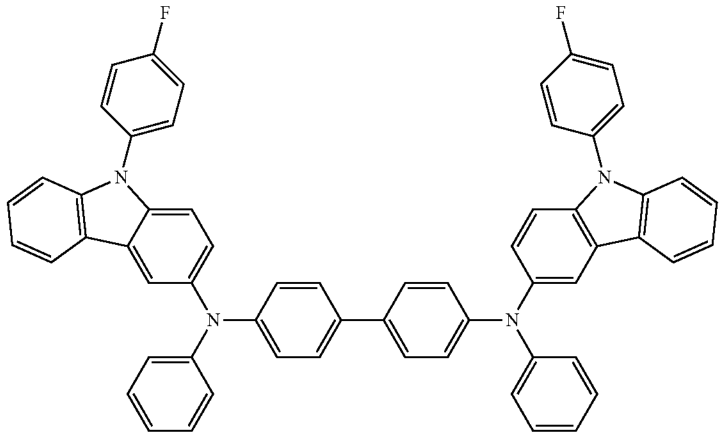
HT31
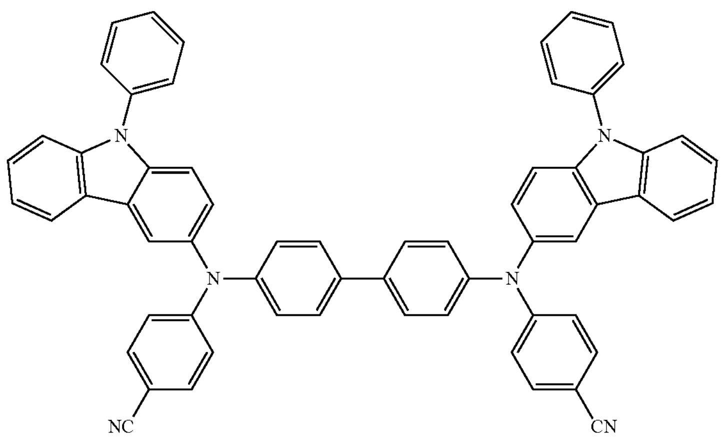
HT32
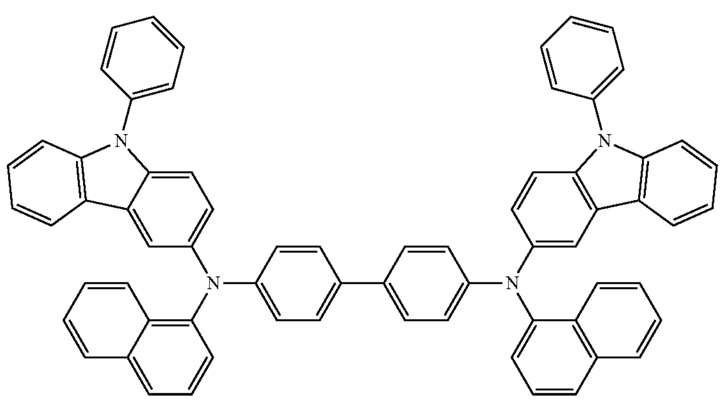

-continued
HT33
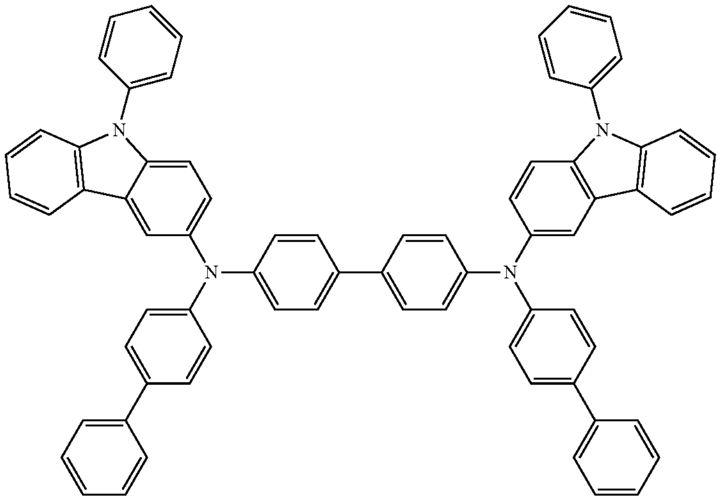
HT34
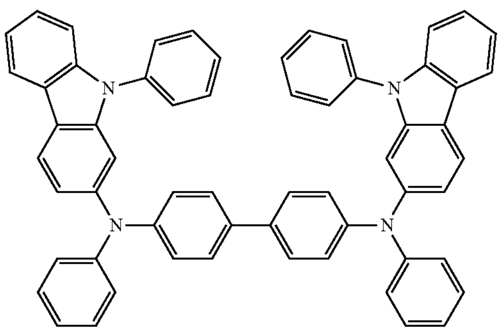
HT35
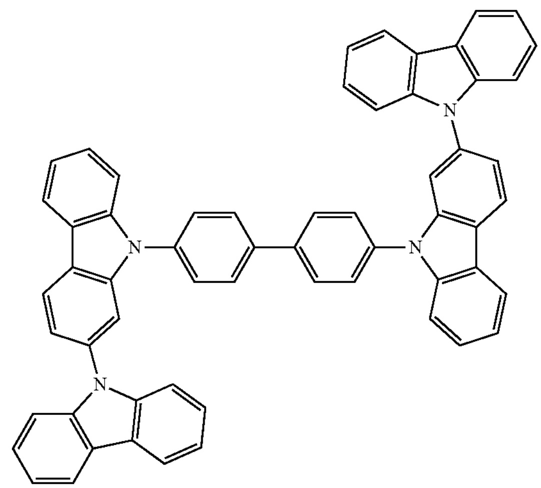
HT36
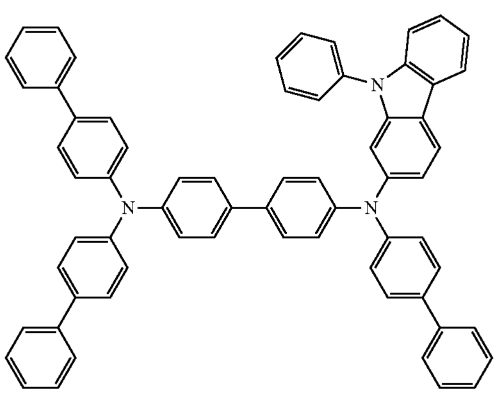
HT37
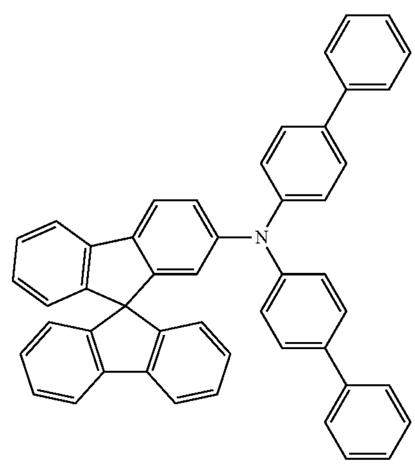

-continued
HT38
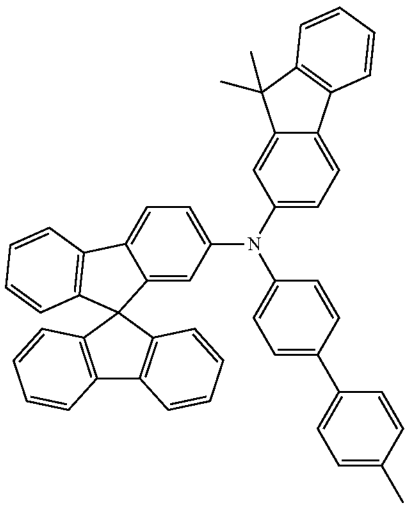
HT39
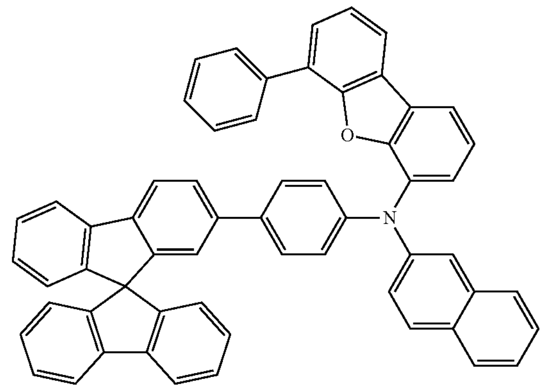
HT40
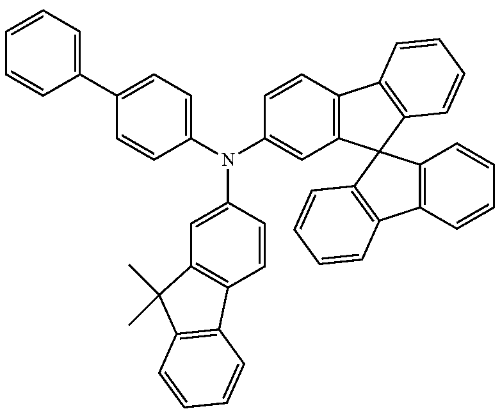
HT41
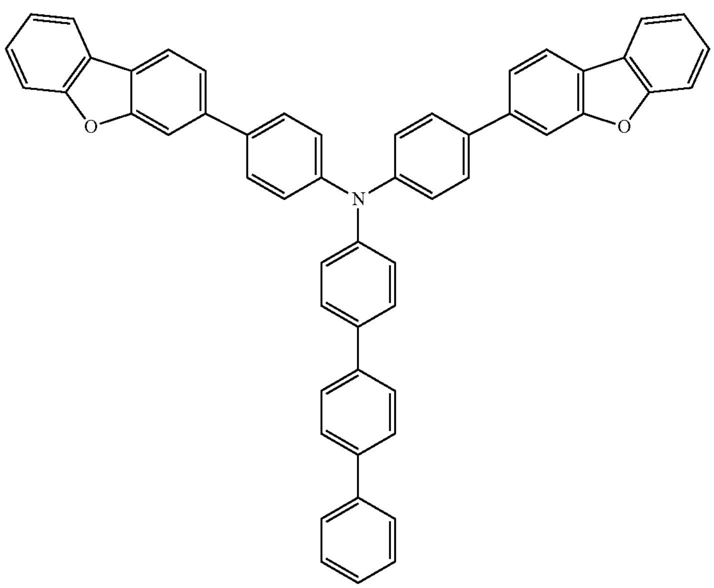

-continued
HT42
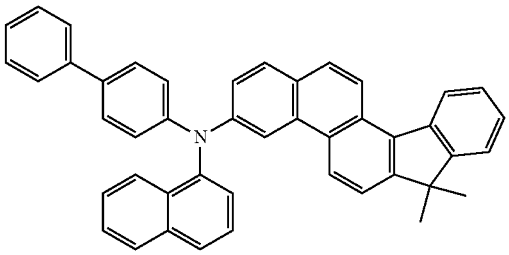
HT43
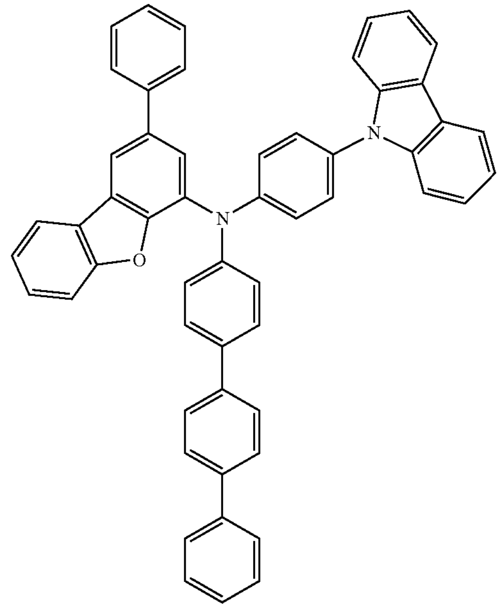
HT44
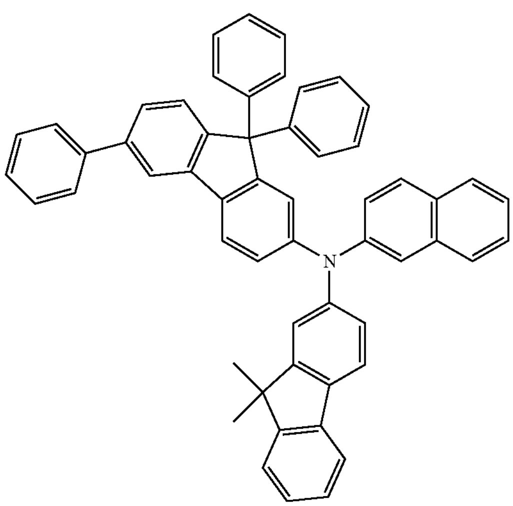
HT45
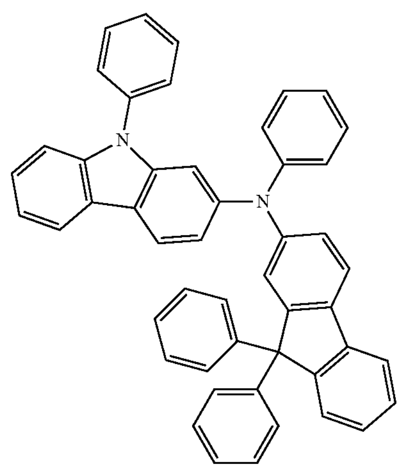

-continued
HT46
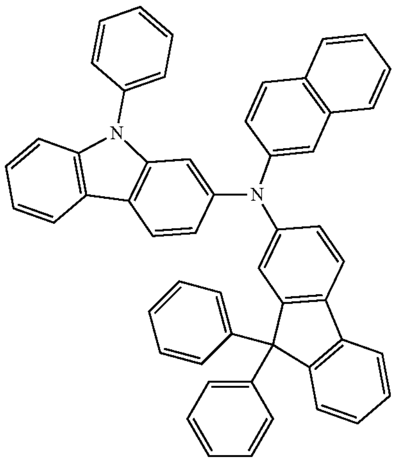
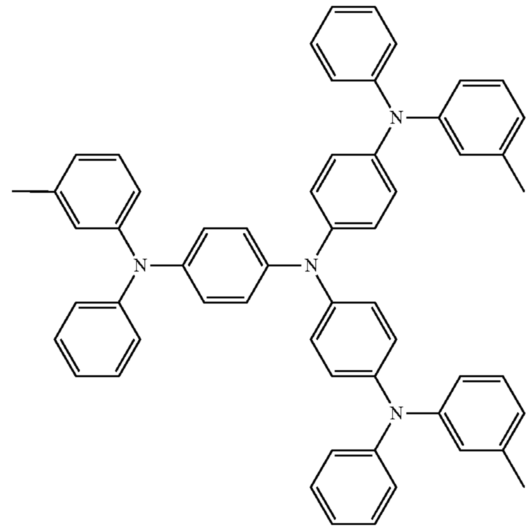
m-MTDATA
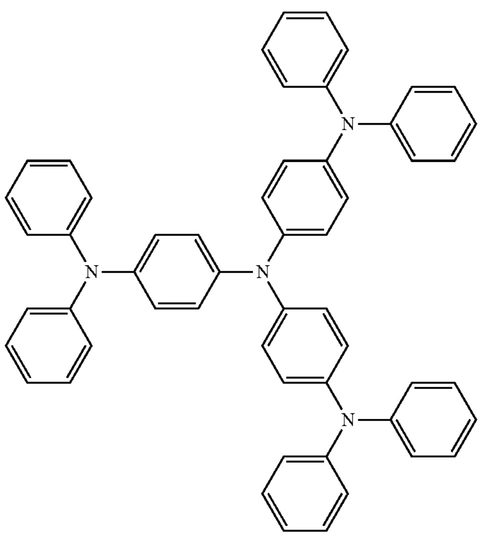
TDATA
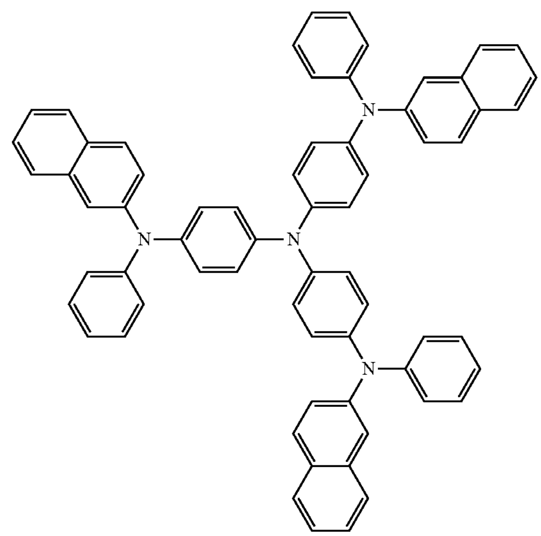
2-TNATA
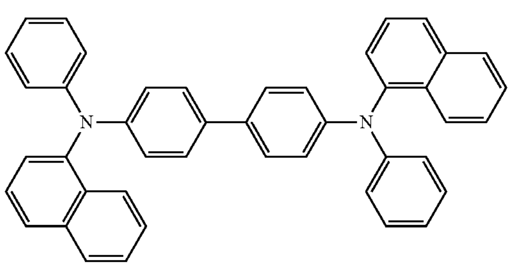
NPB
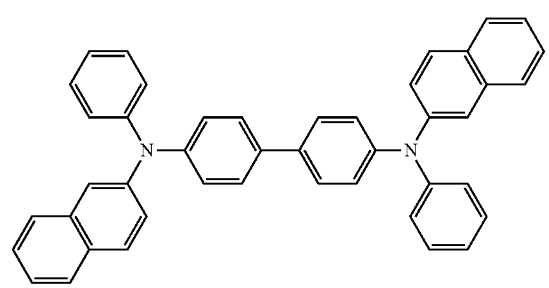
β-NPB -continued

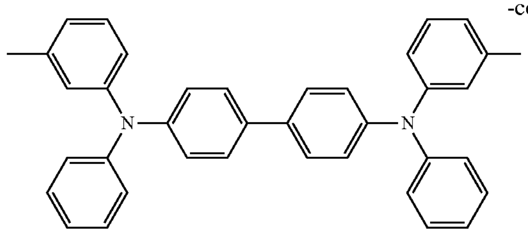

TPD

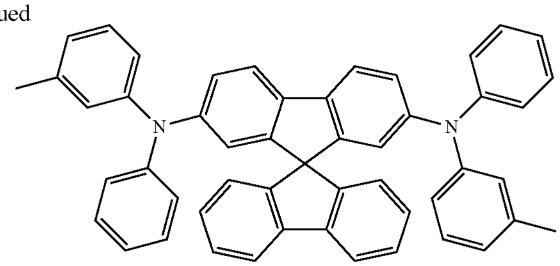

Spiro-TPD

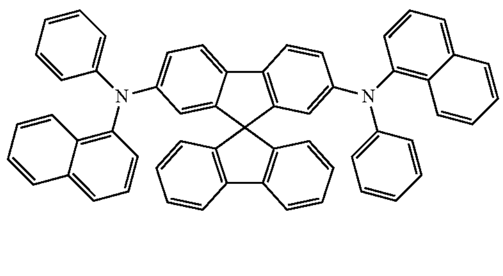

Spiro-NPB

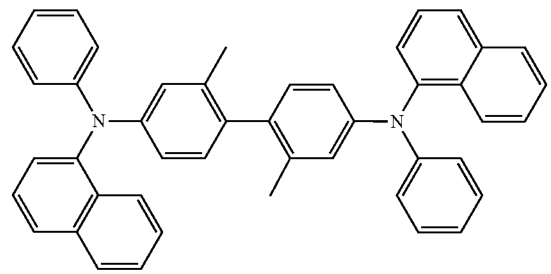

methylated-NPB

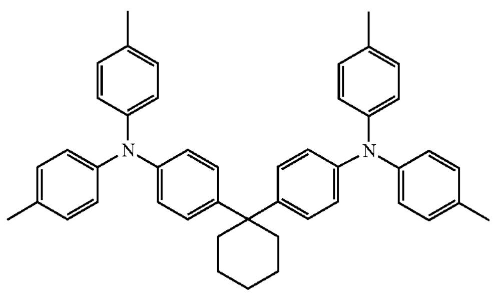

TAPC

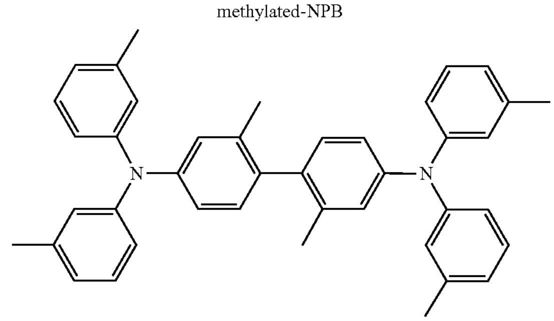

HMTPD

The thickness of the hole transport region may be in a range of about 50 Å to about 10,000 Å, for example, about 100 Å to about 4,000 Å. When the hole transport region includes a hole injection layer, a hole transport layer, or any combination thereof, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron-blocking layer may block the leakage of electrons from an emission layer to a hole transport region. Materials that may be included in the hole transport region may be included in the emission auxiliary layer and the electron-blocking layer.

p-Dopant

The hole transport region may further include, in addition to these materials, a charge-generation material for the improvement of conductive properties. The charge-generation material may be uniformly or non-uniformly distributed in the hole transport layer (for example, in the form of a single layer consisting of a charge-generation material).

The charge-generation material may be, for example, a p-dopant.

In one or more embodiments, the lowest unoccupied molecular orbital (LUMO) energy level of the p-dopant may be about −3.5 eV or less.

In one or more embodiments, the p-dopant may include a quinone derivative, a cyano group-containing compound, a compound containing element EL1 and element EL2, or any combination thereof.

Examples of the quinone derivative are tetracyanoquinodimethane (TCNQ), 2,3,5,6-tetrafluoro-7,7,8,8-tetracyanoquinodimethane (F4-TCNQ), and the like.

Examples of the cyano group-containing compound are 1,4,5,8,9,12-hexaazatriphenylene-hexacarbonitrile (HAT-CN), and a compound represented by Formula 221 below.

Formula 221

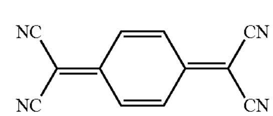

TCNQ

-continued

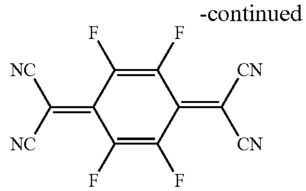

F4-TCNQ

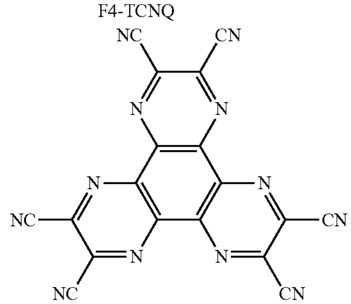

HAT-CN

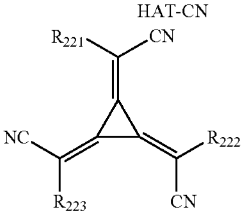

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or any combination thereof, and element EL2 may be a non-metal, a metalloid, or any combination thereof.

Examples of the metal are an alkali metal (for example, lithium (Li), sodium (Na), potassium (K), rubidium (Rb), cesium (Cs), and the like); an alkaline earth metal (for example, beryllium (Be), magnesium (Mg), calcium (Ca), strontium (Sr), barium (Ba), and the like); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and the like); a post-transition metal (for example, zinc (Zn), indium (In), tin (Sn), and the like); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and the like).

Examples of the metalloid may include silicon (Si), antimony (Sb), tellurium (Te) and the like. Examples of the non-metal may include oxygen (O), a halogen (for example, F, Cl, Br, I, and the like).

In one or more embodiments, examples of the compound containing element EL1 and element EL2 may include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide may include a tungsten oxide (for example, WO, $W_2O_3$, $WO_2$, $WO_3$, $W_2O_5$, and the like), a vanadium oxide (for example, VO, $V_2O_3$, $VO_2$, $V_2O_5$, and the like), a molybdenum oxide (MoO, $Mo_2O_3$, $MoO_2$, $MoO_3$, $Mo_2O_5$, and the like), and a rhenium oxide (for example, $ReO_3$, and the like). Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI. Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include a titanium halide (for example, $TiF_4$, $TiCl_4$, $TiBr_4$, $TiI_4$, and the like), a zirconium halide (for example, $ZrF_4$, $ZrCl_4$, $ZrBr_4$, $ZrI_4$, and the like), a hafnium halide (for example, $HfF_4$, $HfCl_4$, $HfBr_4$, $Hff_4$, and the like), a vanadium halide (for example, $VF_3$, $VCl_3$, $VBr_3$, $VI_3$, and the like), a niobium halide (for example, $NbF_3$, $NbCl_3$, $NbBr_3$, $NbI_3$, and the like), a tantalum halide (for example, $TaF_3$, $TaCl_3$, $TaBr_3$, $TaI_3$, and the like), a chromium halide (for example, $CrF_3$, $CrCl_3$, $CrBr_3$, $CrI_3$, and the like), a molybdenum halide (for example, $MoF_3$, $MoCl_3$, $MoBr_3$, $MoI_3$, and the like), a tungsten halide (for example, $WF_3$, $WCl_3$, $WBr_3$, $WI_3$, and the like), a manganese halide (for example, $MnF_2$, $MnCl_2$, $MnBr_2$, $MnI_2$, and the like), a technetium halide (for example, $TcF_2$, $TcCl_2$, $TcBr_2$, $TcI_2$, and the like), a rhenium halide (for example, $ReF_2$, $ReCl_2$, $ReBr_2$, $ReI_2$, and the like), an iron halide (for example, $FeF_2$, $FeCl_2$, $FeBr_2$, $FeI_2$, and the like), a ruthenium halide (for example, $RuF_2$, $RuCl_2$, $RuBr_2$, $RuI_2$, and the like), an osmium halide (for example, $OsF_2$, $OsCl_2$, $OsBr_2$, $OsI_2$, and the like), a cobalt halide (for example, $CoF_2$, $CoCl_2$, $CoBr_2$, $CoI_2$, and the like), a rhodium halide (for example, $RhF_2$, $RhCl_2$, $RhBr_2$, $RhI_2$, and the like), an iridium halide (for example, $IrF_2$, $IrCl_2$, $IrBr_2$, $IrI_2$, and the like), a nickel halide (for example, $NiF_2$, $NiCl_2$, $NiBr_2$, $NiI_2$, and the like), a palladium halide (for example, $PdF_2$, $PdCl_2$, $PdBr_2$, $PdI_2$, and the like), a platinum halide (for example, $PtF_2$, $PtCl_2$, $PtBr_2$, $PtI_2$, and the like), a copper halide (for example, CuF, CuCl, CuBr, CuI, and the like), a silver halide (for example, AgF, AgCl, AgBr, AgI, and the like), and a gold halide (for example, AuF, AuCl, AuBr, AuI, and the like).

Examples of the post-transition metal halide may include a zinc halide (for example, $ZnF_2$, $ZnCl_2$, $ZnBr_2$, $ZnI_2$, and the like), an indium halide (for example, $InI_3$, and the like), and a tin halide (for example, $SnI_2$, and the like). Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

An example of the metalloid halide may include an antimony halide (for example, $SbCl_5$, and the like). Examples of the metal telluride may include an alkali metal telluride (for example, $Li_2Te$, $Na_2Te$, $K_2Te$, $Rb_2Te$, $Cs_2Te$, and the like), an alkaline earth metal telluride (for example, BeTe, MgTe, CaTe, SrTe, BaTe, and the like), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and the like), a post-transition metal telluride (for example, ZnTe, and the like), and a lanthanide metal telluride (for example, LaTe, CeTe, PrTe, NdTe, PmTe, EuTe, GdTe, TbTe, DyTe, HoTe, ErTe, TmTe, YbTe, LuTe, and the like).

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact each other or are separated from each other. In one or more embodiments, the emission layer may include two or more materials of a red light-emitting material, a green light-emitting material, and a blue light-emitting material, in which the two or more materials are mixed with each other in a single layer to emit white light.

In one or more embodiments, the emission layer may include a quantum dot. The emission layer may include a delayed fluorescence material. The delayed fluorescence material may act as a host or a dopant in the emission layer.

The thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

Host

In one or more embodiments, the host may include a compound represented by Formula 301 below:

$$[Ar_{301}]_{xb11}\text{-}[(L_{301})_{xb1}\text{-}R_{301}]_{xb21} \qquad \text{Formula 301}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ are the same as described in connection with $Q_1$.

For example, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or any combination thereof:

Formula 301-1

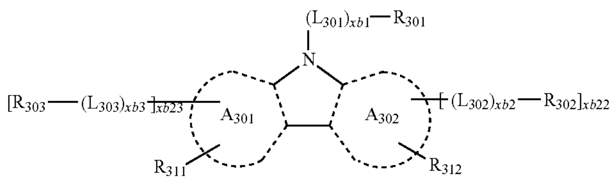

Fomrula 301-2

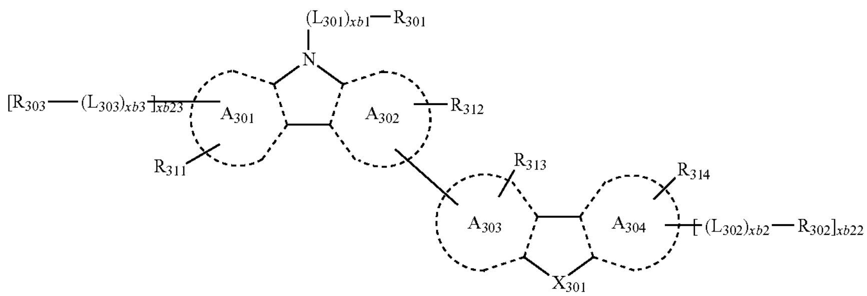

In Formulae 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-$[(L_{304})_{xb4}$-$R_{304}]$, $C(R_{304})(R_{305})$, or $Si(R_{304})(R_{305})$, xb22 and xb23 may each independently be 0, 1, or 2, $L_{301}$, xb1, and $R_{301}$ are each independently the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ are the same as described in connection with $R_{301}$.

In one or more embodiments, the host may include an alkali earth metal complex, a post-transition metal complex, or any combination thereof. In one or more embodiments, the host may include a Be complex (for example, Compound H55), an Mg complex, a Zn complex, or any combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di(carbazol-9-yl)benzene (mCP), 1,3,5-tri(carbazol-9-yl)benzene (TCP), or any combination thereof:

H1

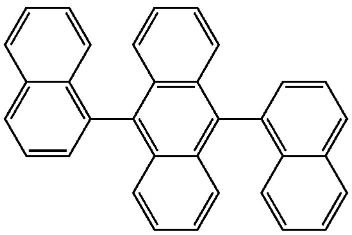

H2

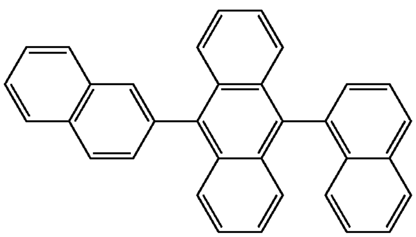

H3

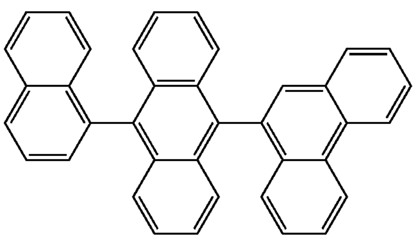

H4

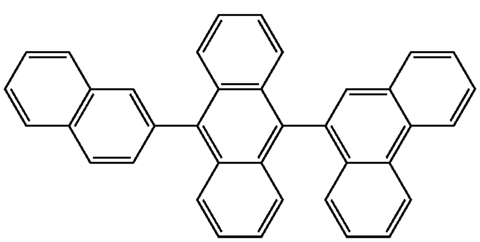

H4

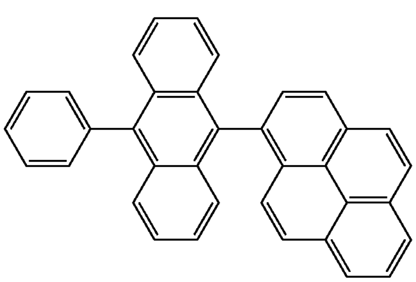

-continued

H5

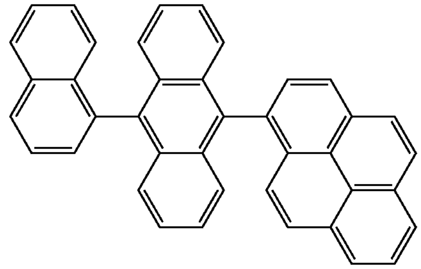

H7

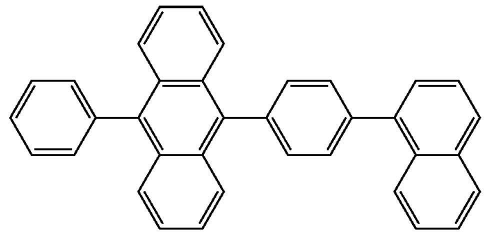

H8

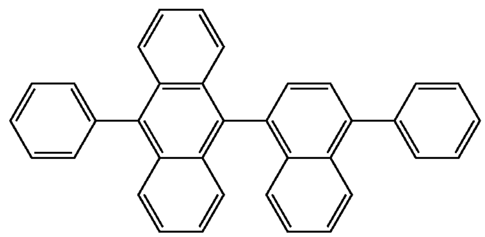

H9

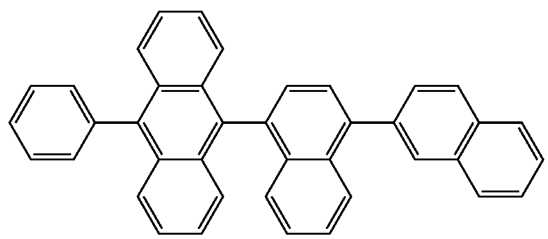

H10

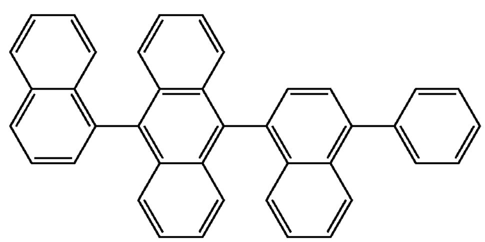

H11

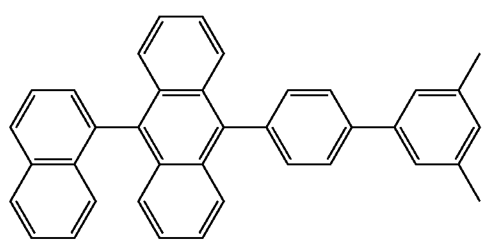

-continued
H12
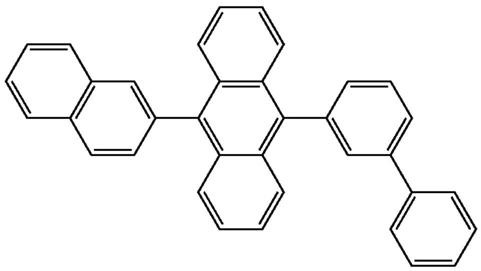
H13
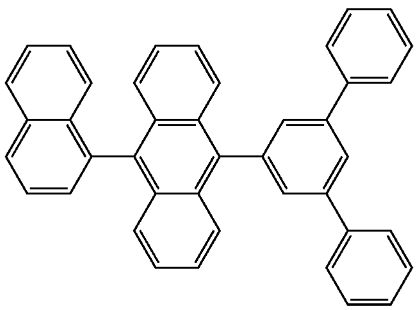
H14
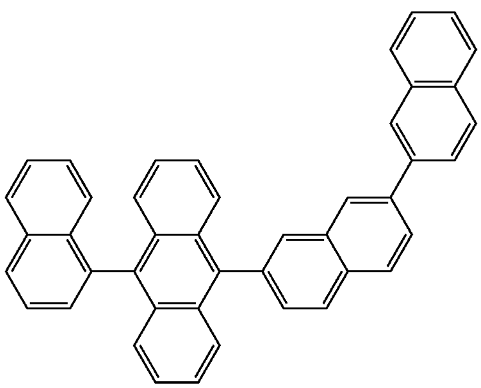
H15
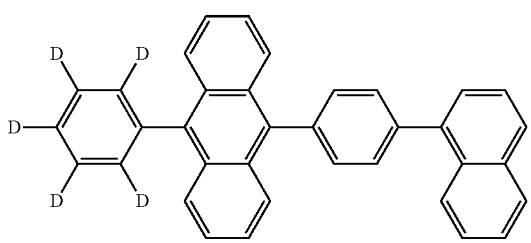
H16
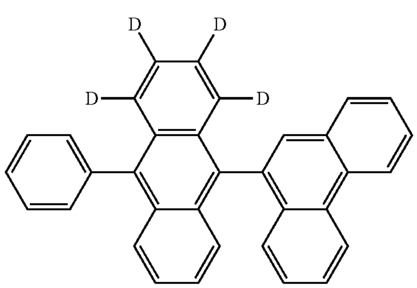
-continued
H17
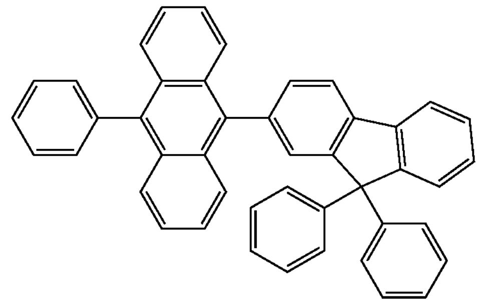
H18
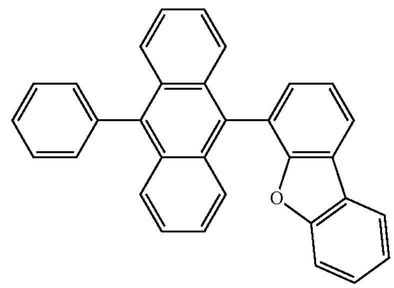
H19
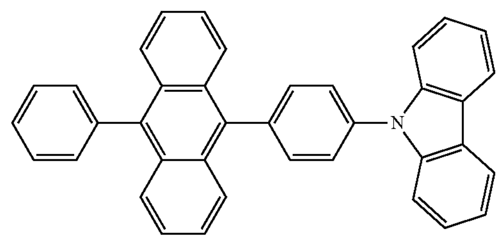
H20
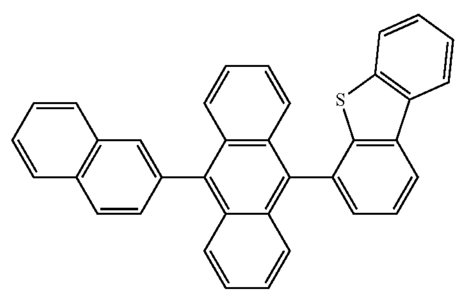
H21
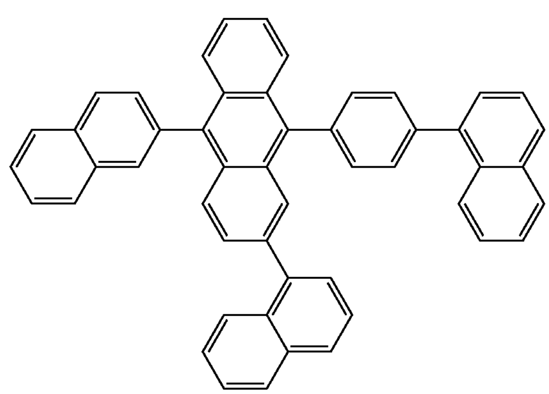

-continued
H22
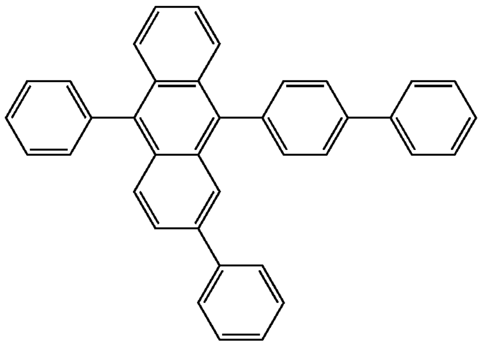
H23
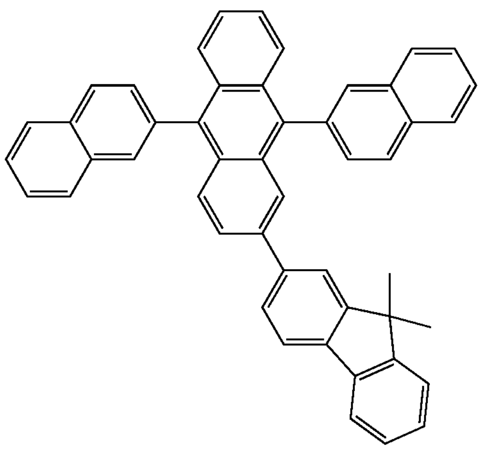
H24
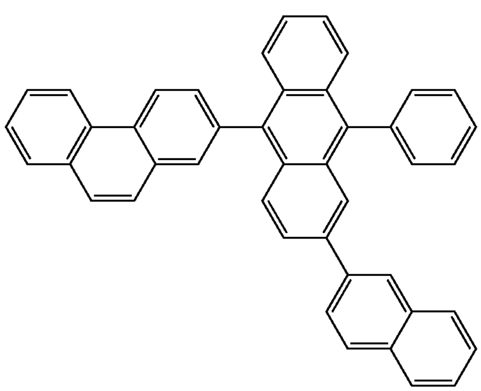
-continued
H25
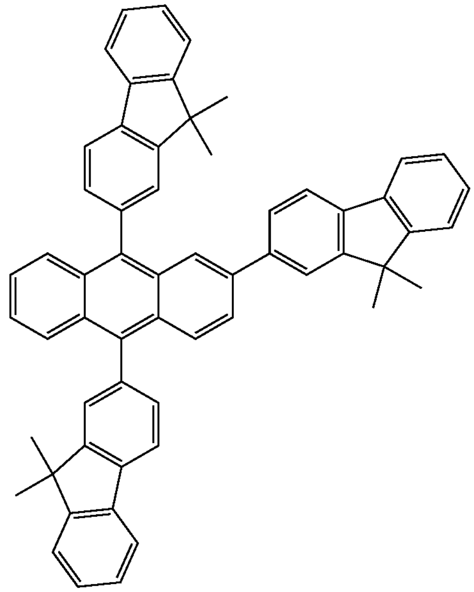
H26
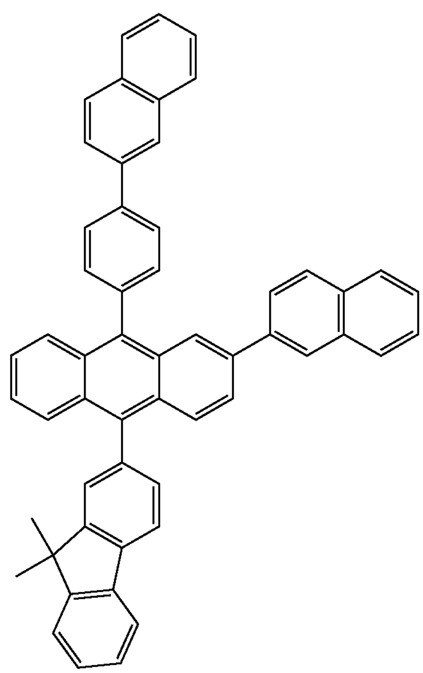

-continued
H27
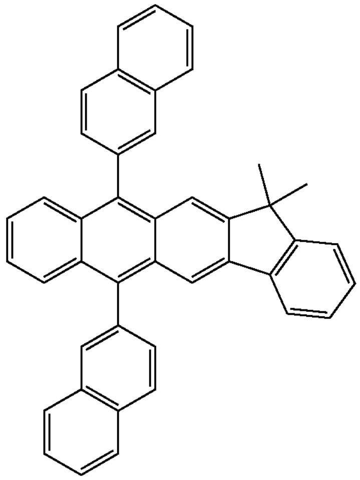
H28
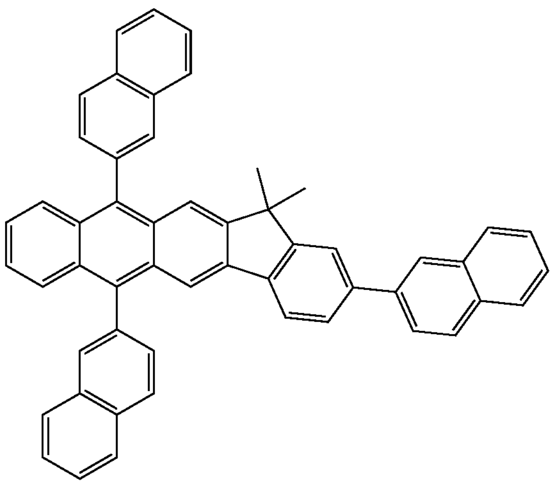
H29
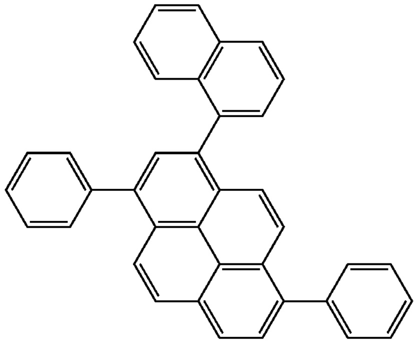
-continued
H30
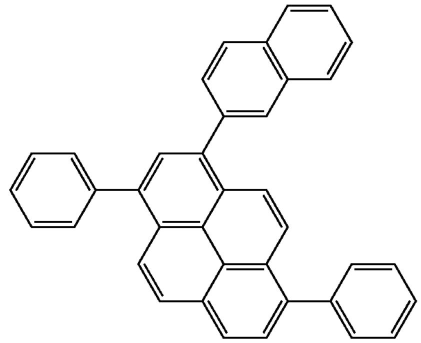
H31
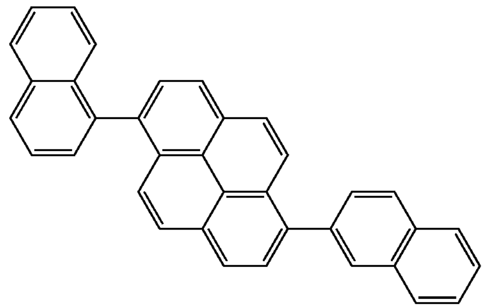
H32
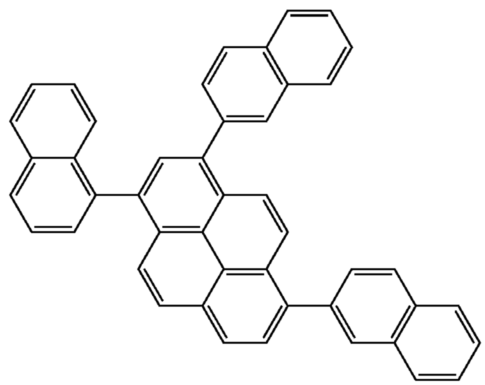
H33
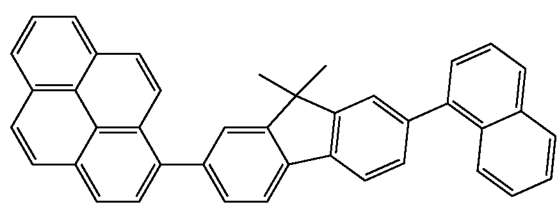
H34
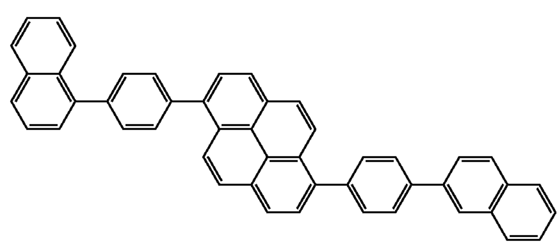

-continued
H35
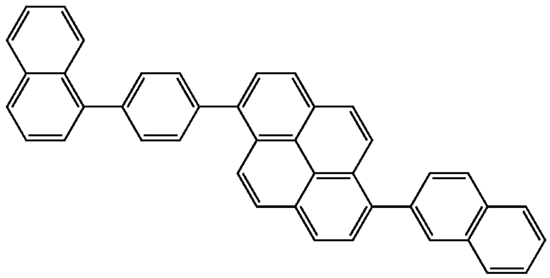
H36
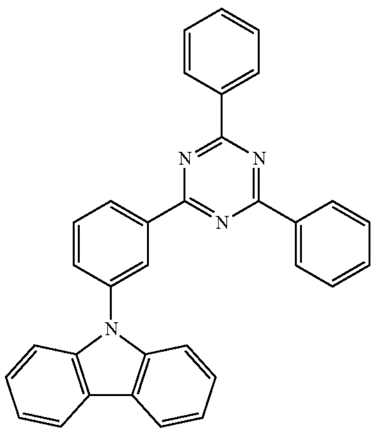
H37
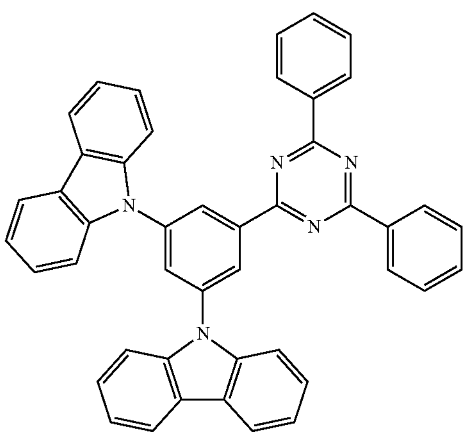
H38
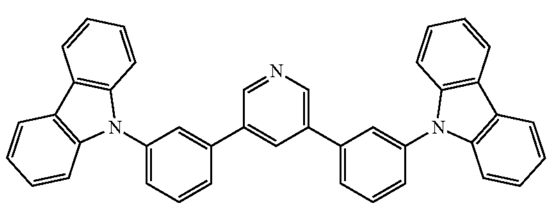
-continued
H39
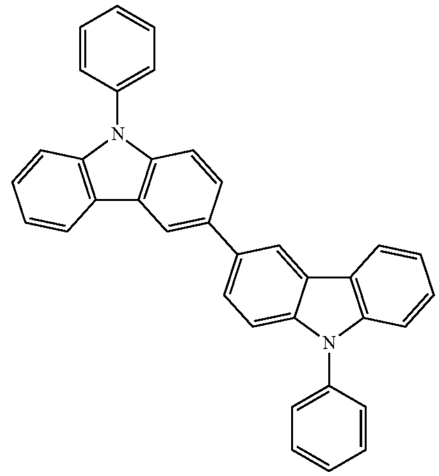
H40
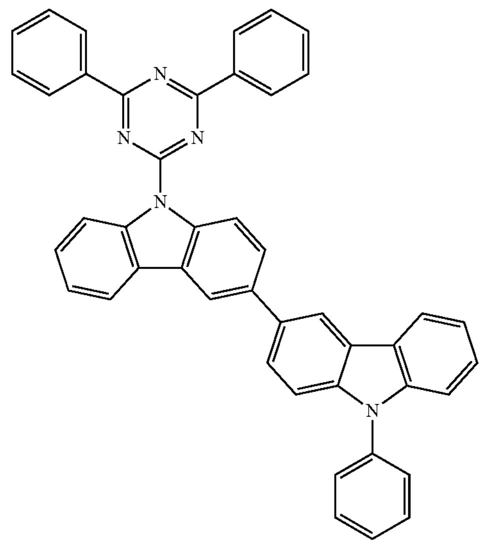
H41
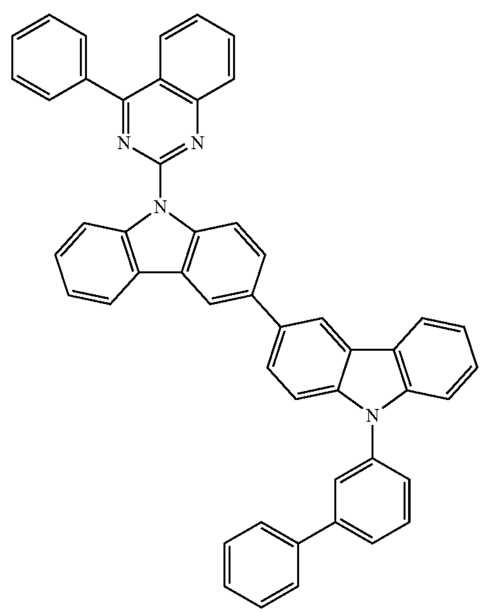

H42
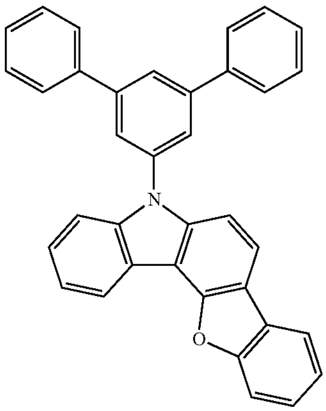
H43
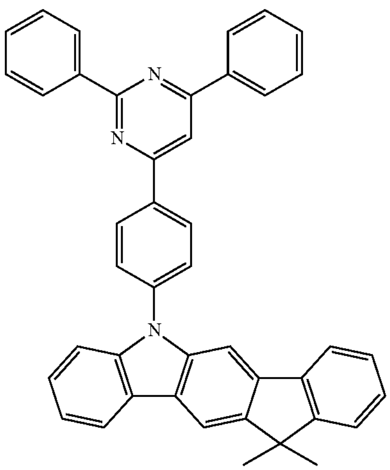
H44
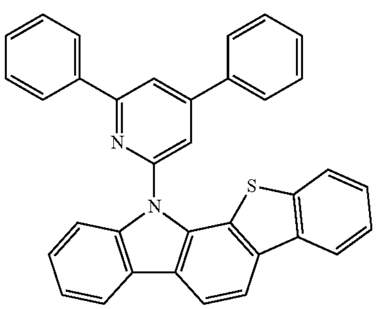
H45
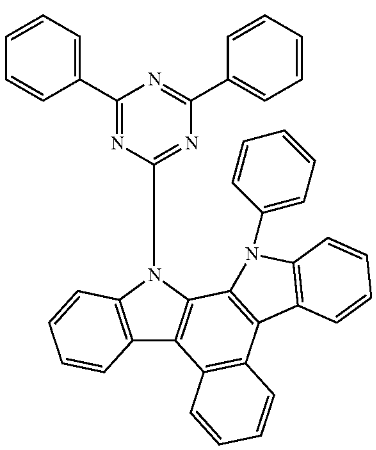
H46
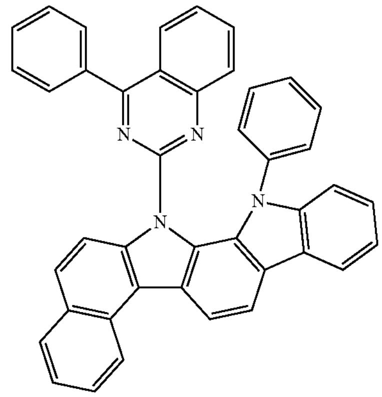
H47
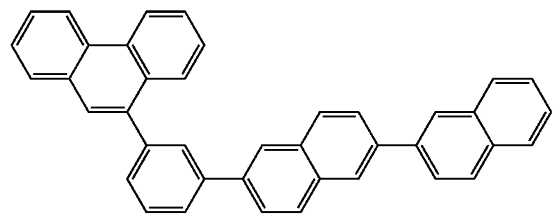
H48
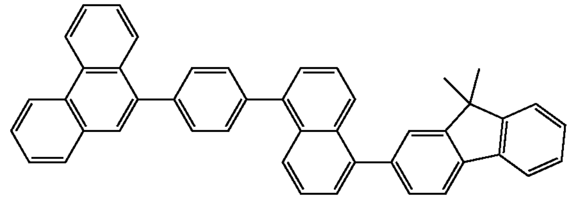
H49
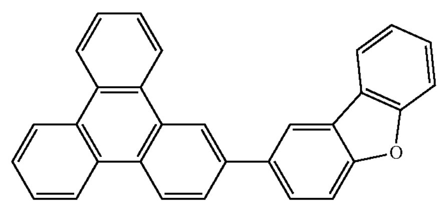
H50
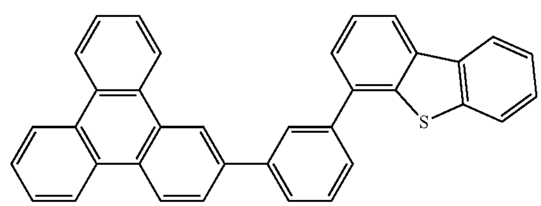
H51
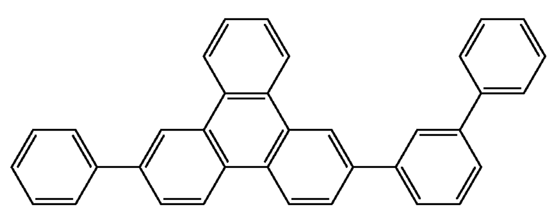

-continued
H52
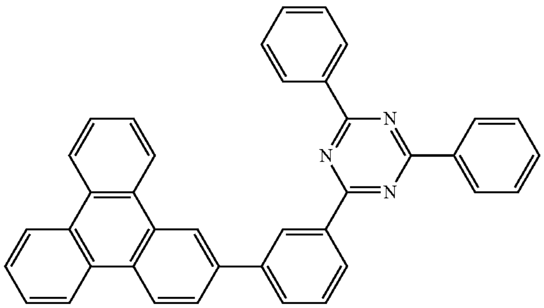
H53
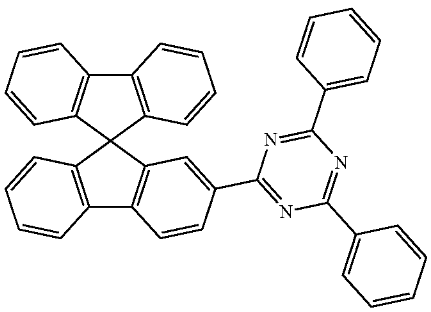
H54
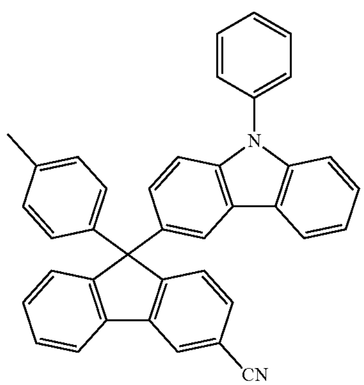
H55
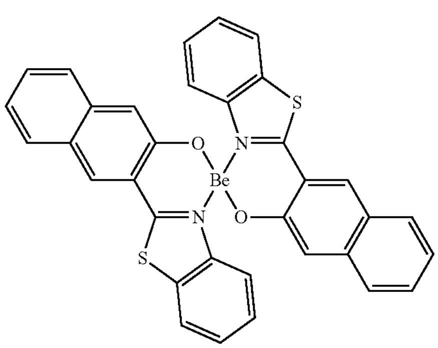
-continued
H56
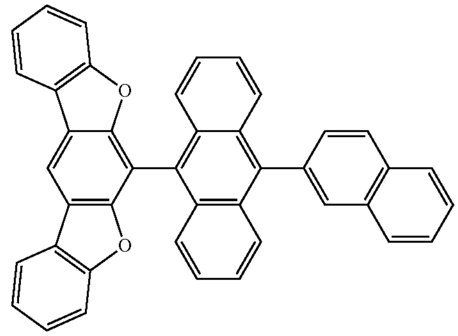
H57
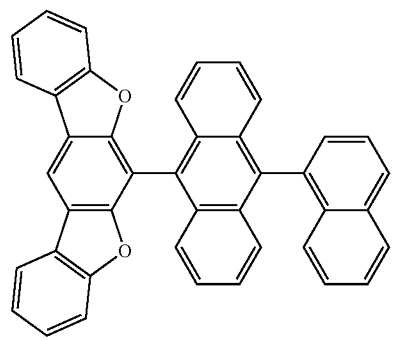
H58
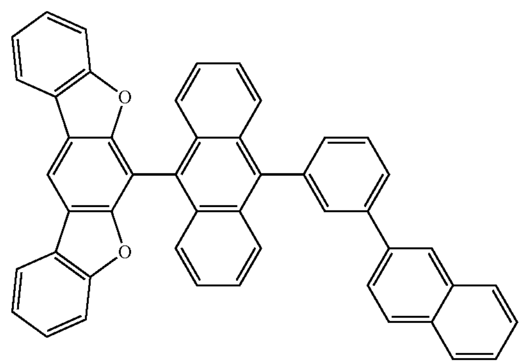
H59
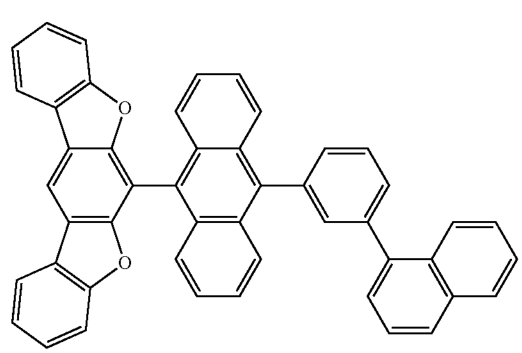

-continued
H60
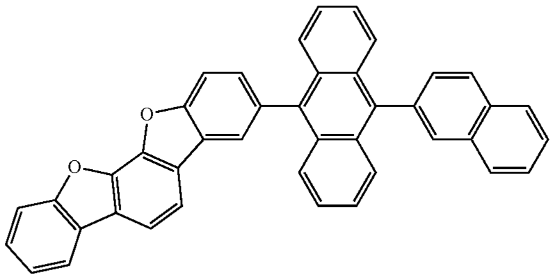
H61
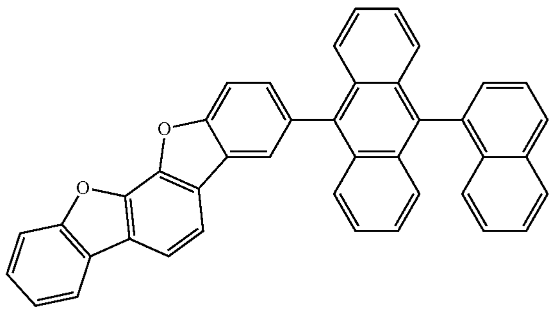
H62
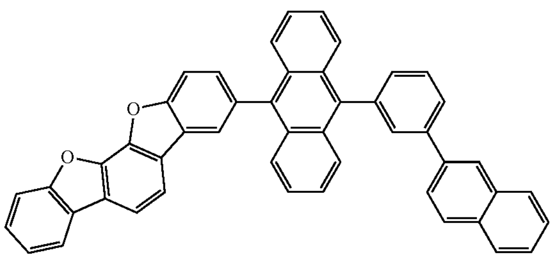
H63
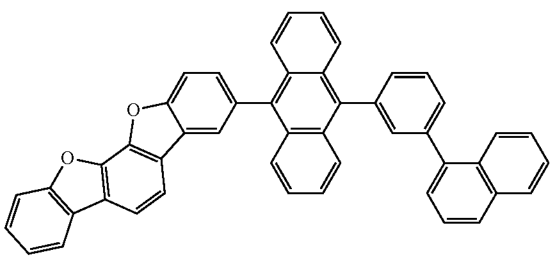
H64
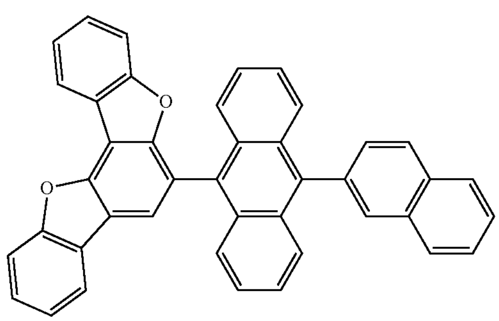
-continued
H65
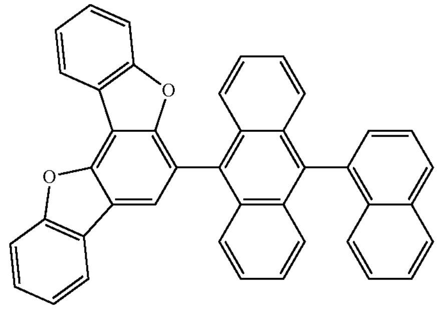
H66
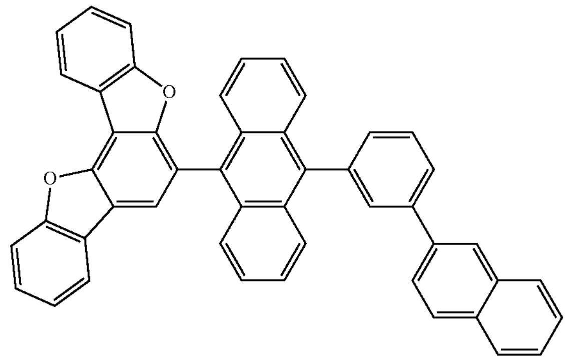
H67
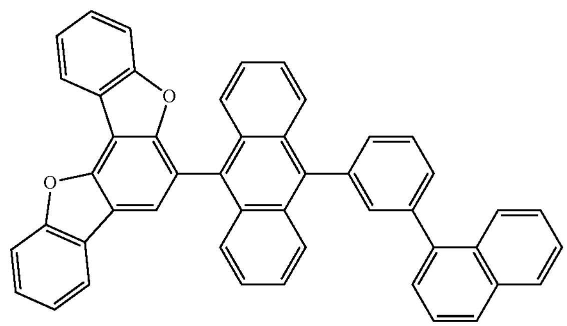
H68
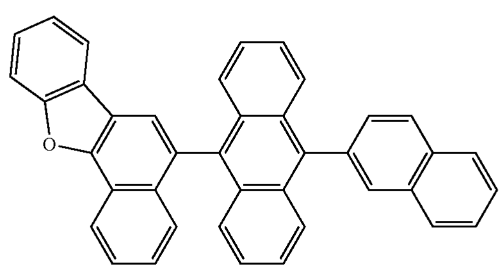
H69
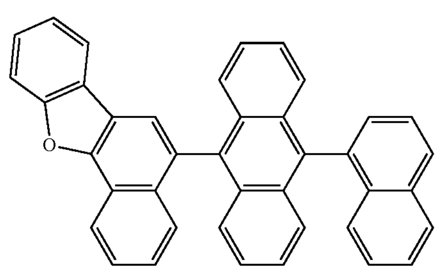

H70
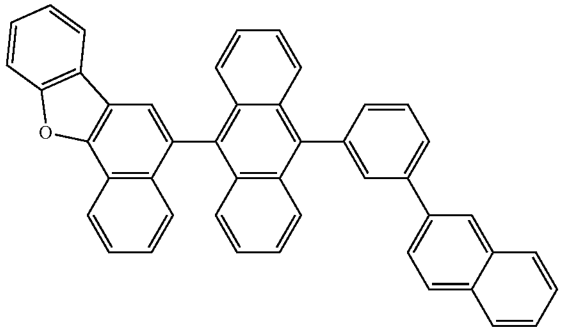
H71
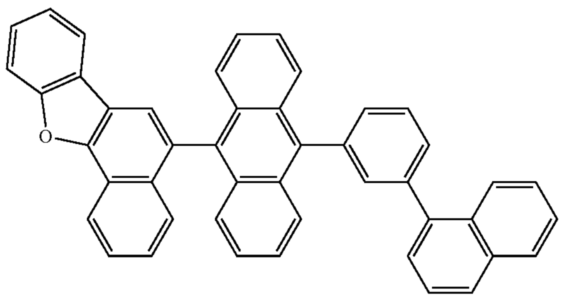
H72
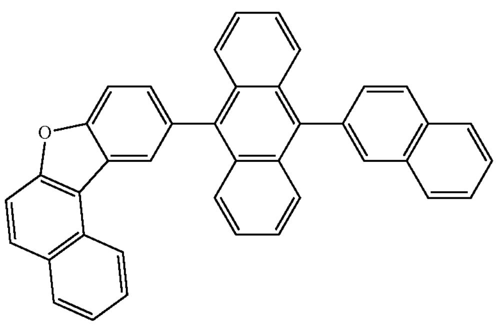
H73
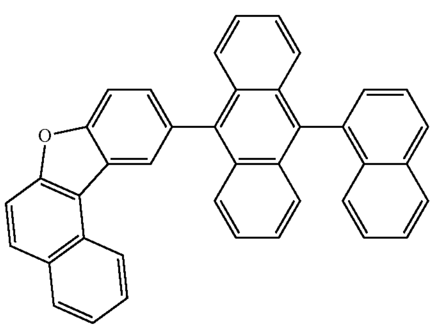
H74
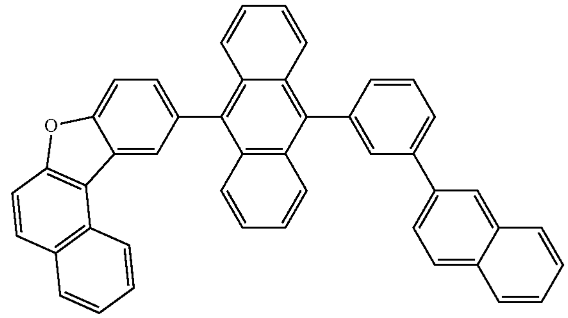
H75
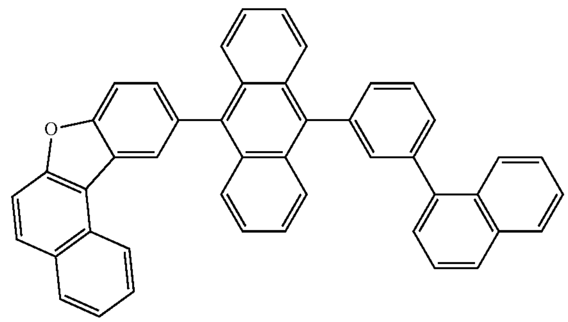
H76
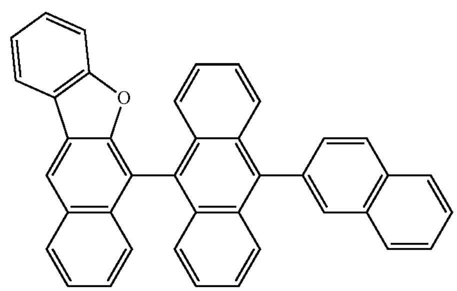
H77
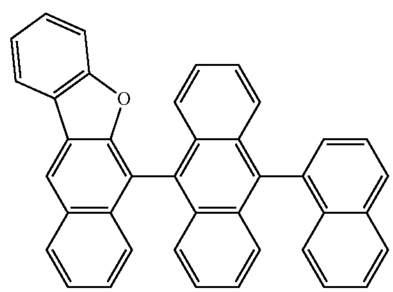
H78
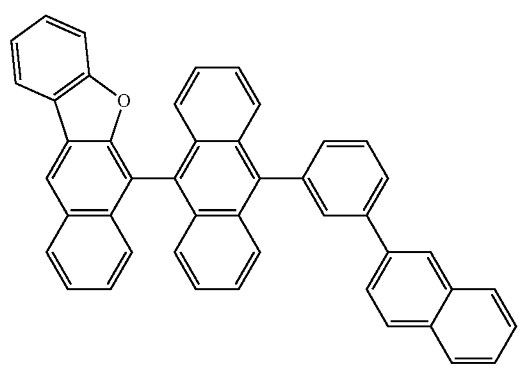

H79
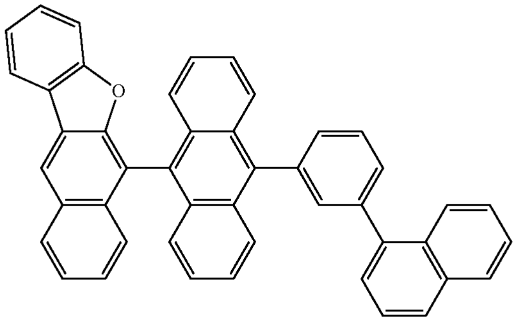
H80
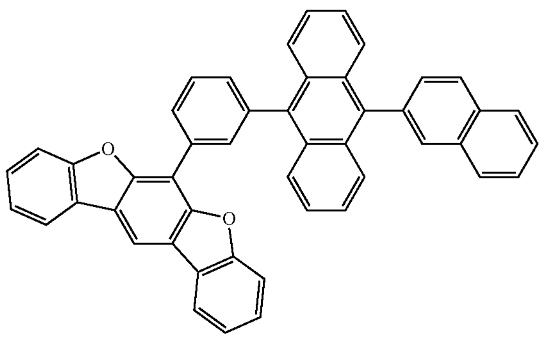
H81
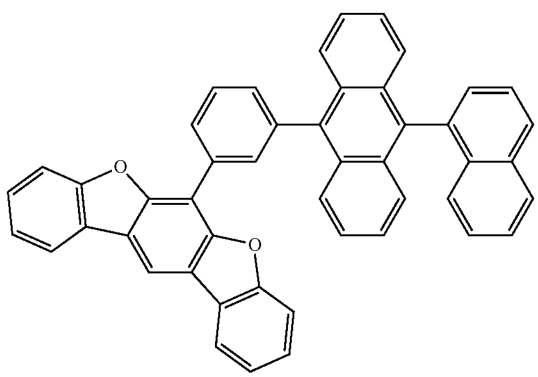
H82
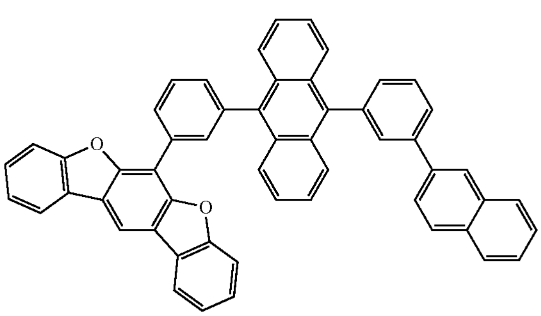
H83
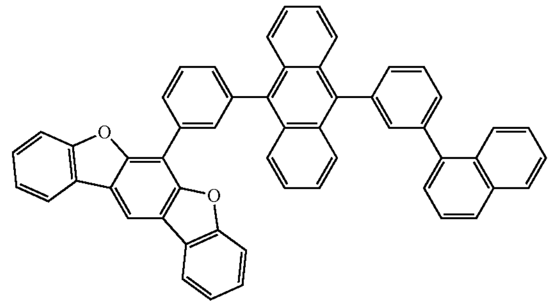
H84
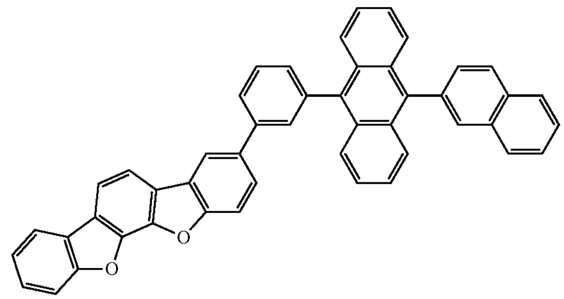
H85
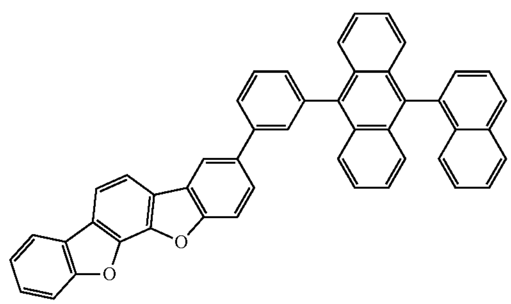
H86
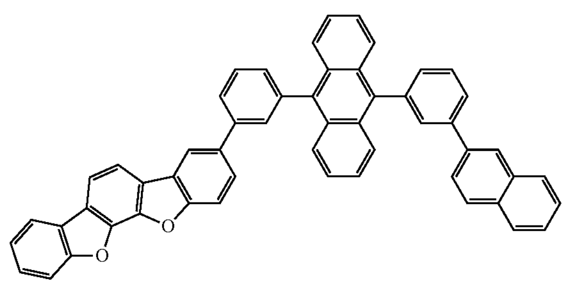
H87
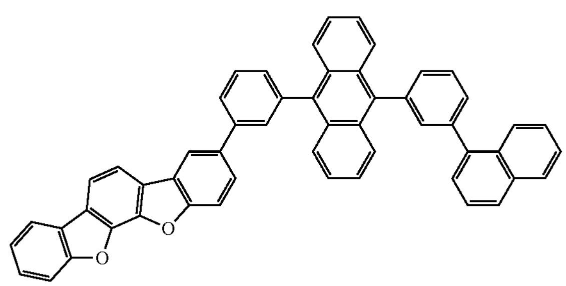

-continued
H88
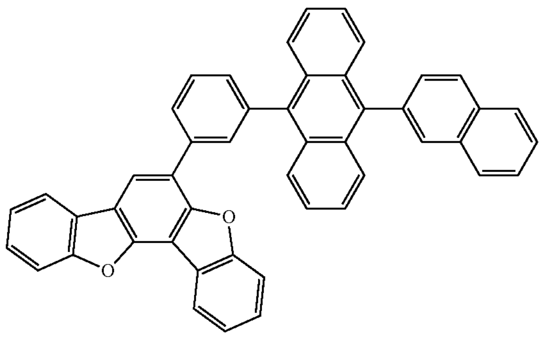
H89
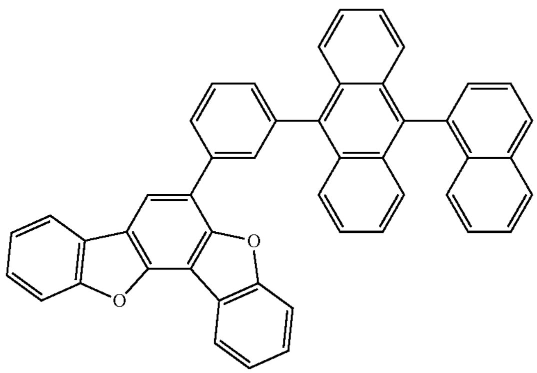
H90
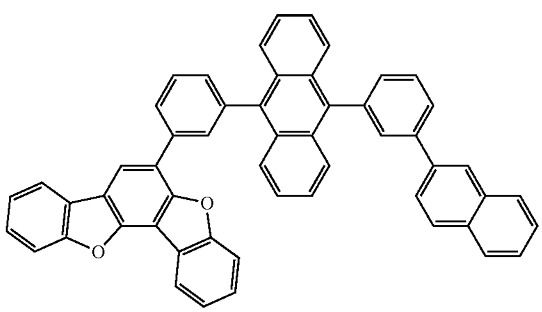
H91
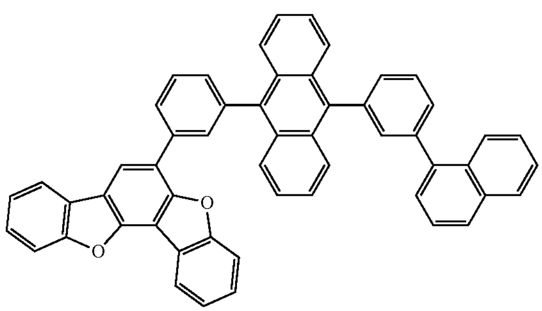
-continued
H92
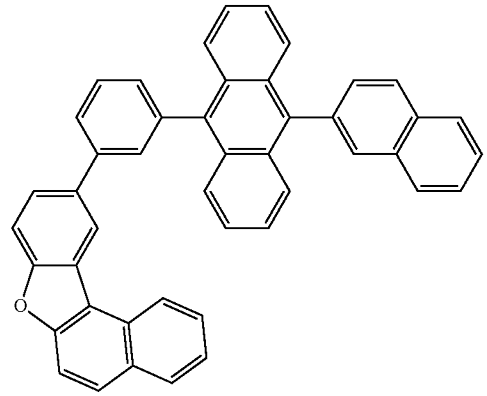
H93
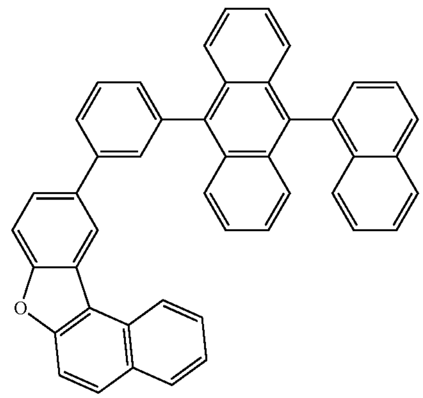
H94
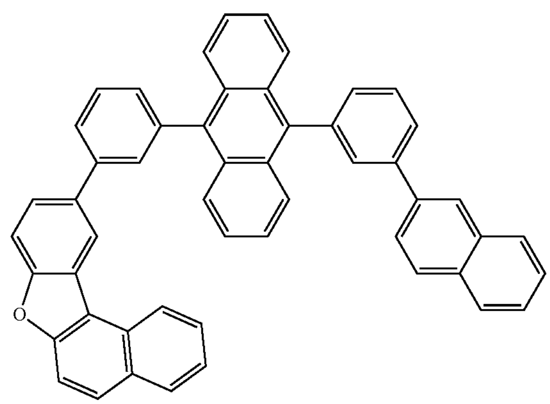
H95
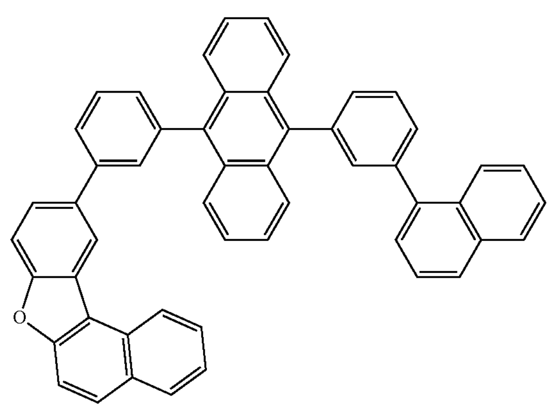

-continued
H96
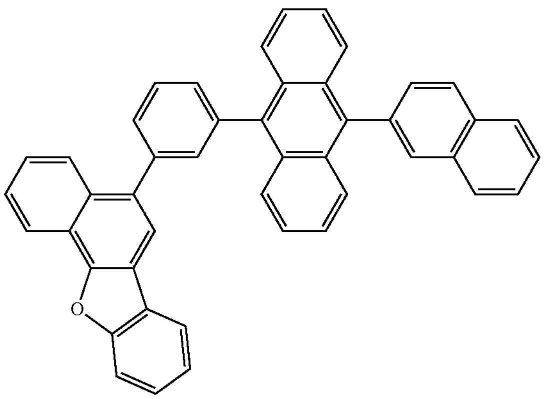
H97
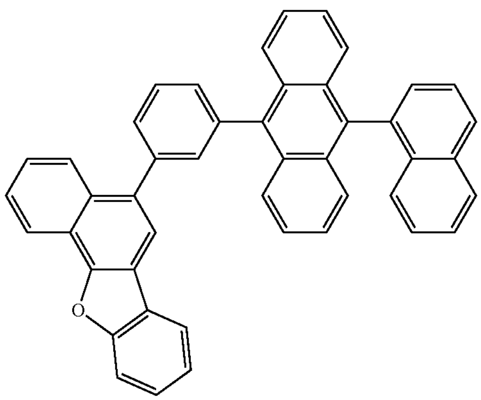
H98
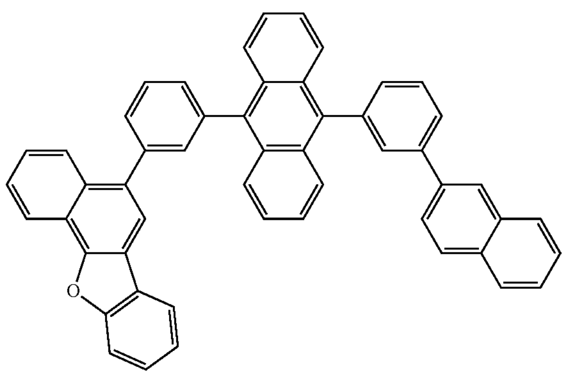
H99
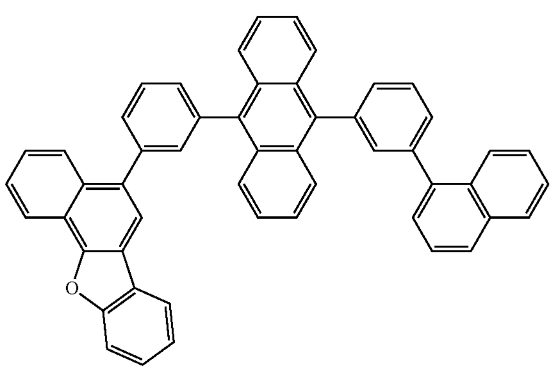
-continued
H100
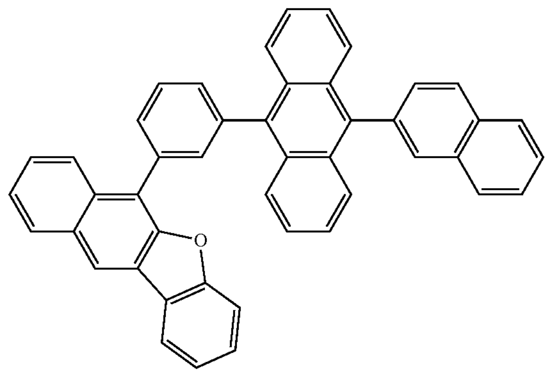
H101
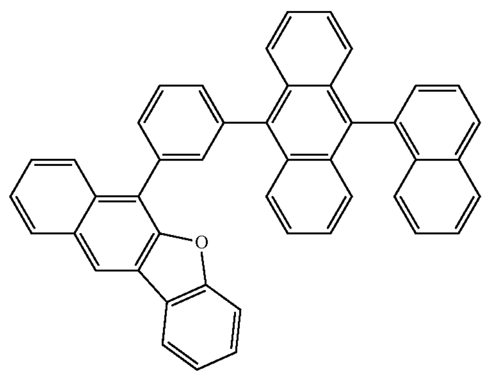
H102
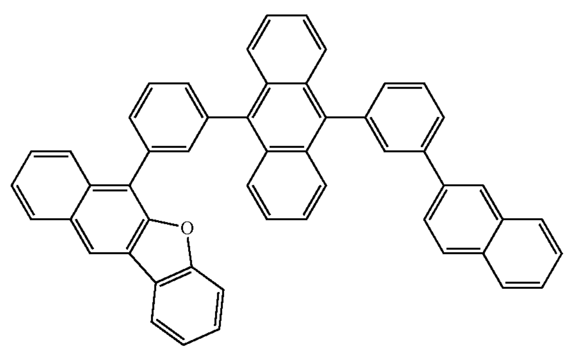
H103
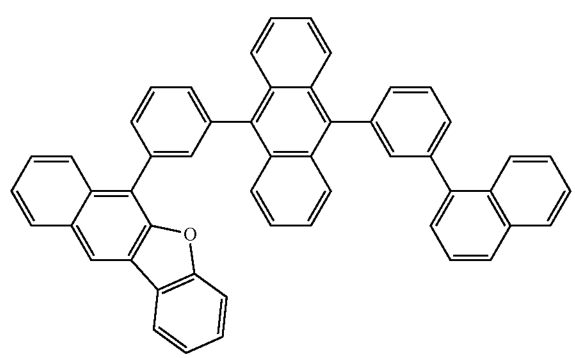

-continued
H104
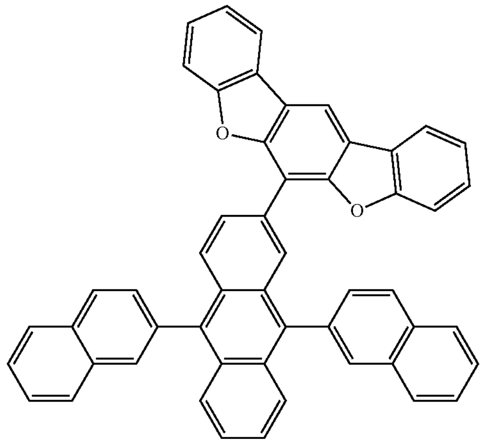
H105
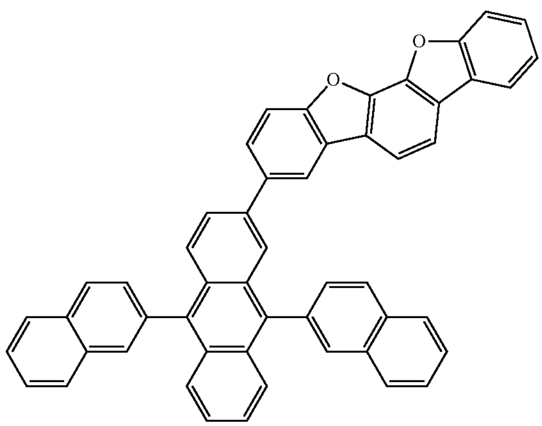
H106
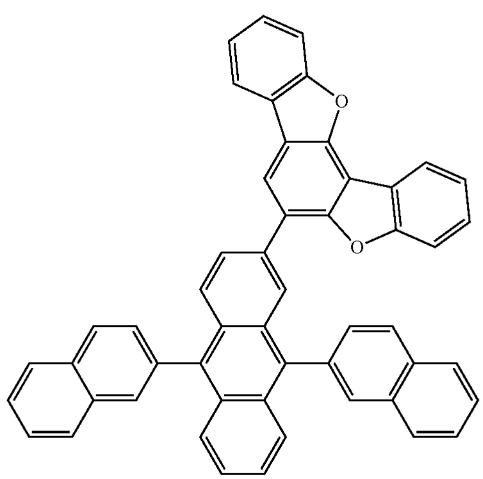
-continued
H107
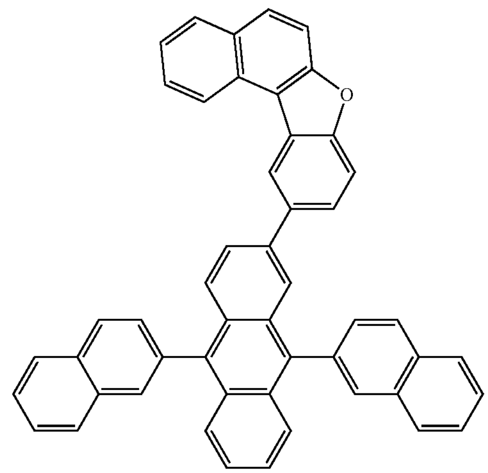
H108
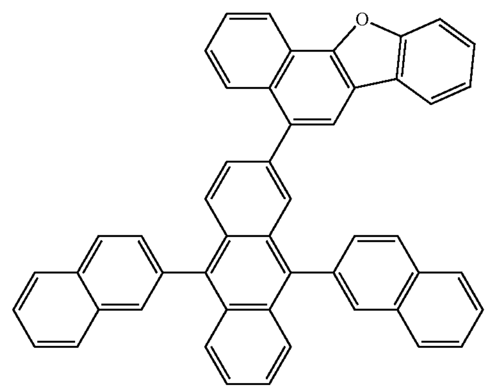
H109
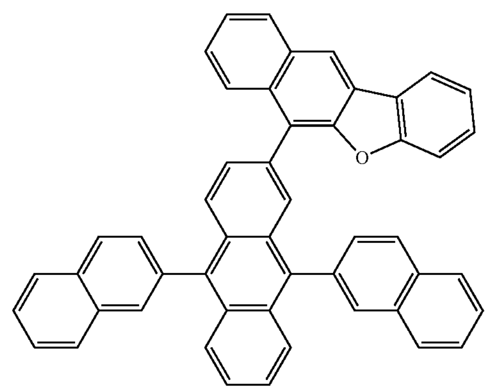
H110
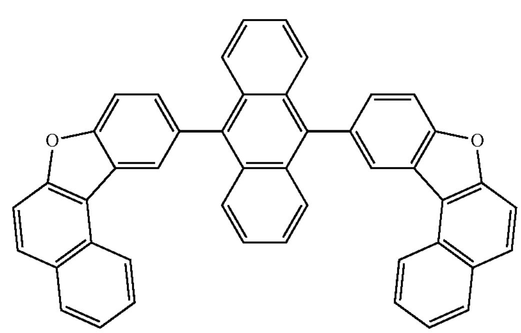

-continued
H111
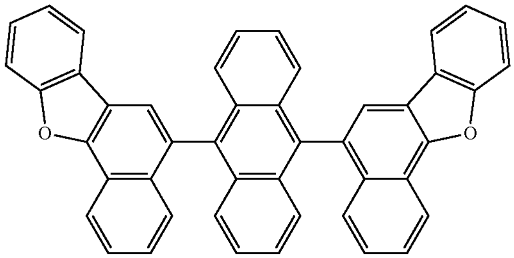
H112
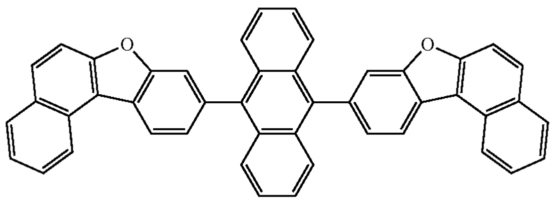
H113
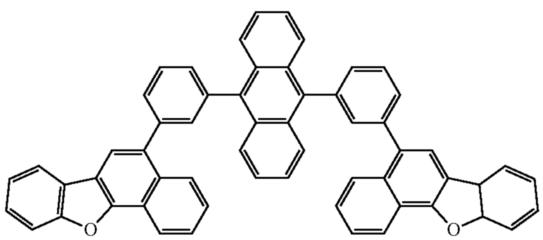
H114
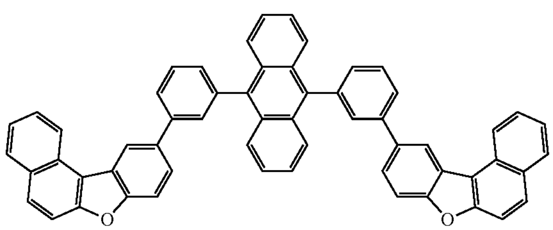
H115
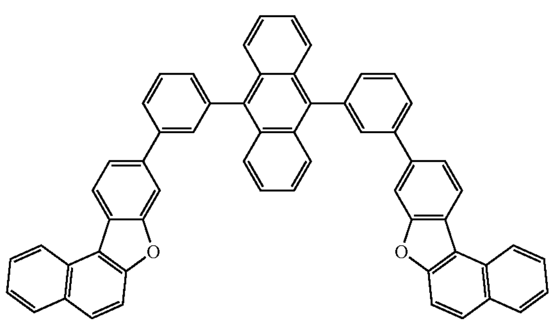
-continued
H116
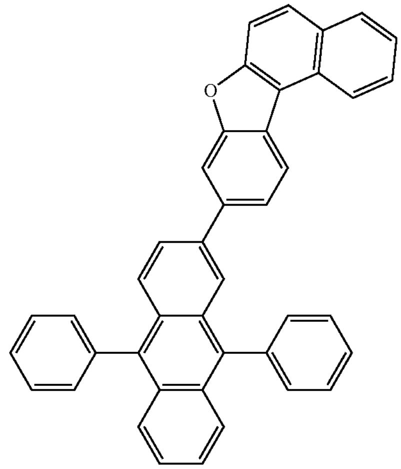
H117
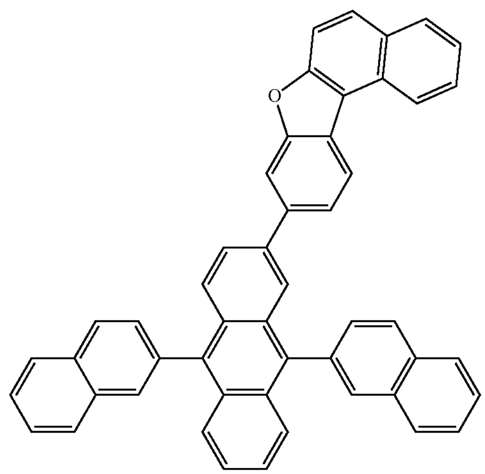
H118
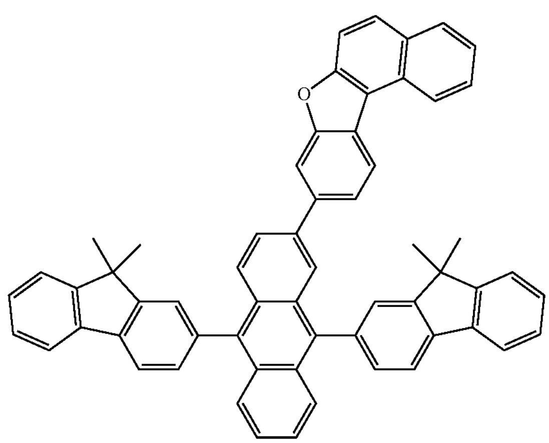

-continued

H119

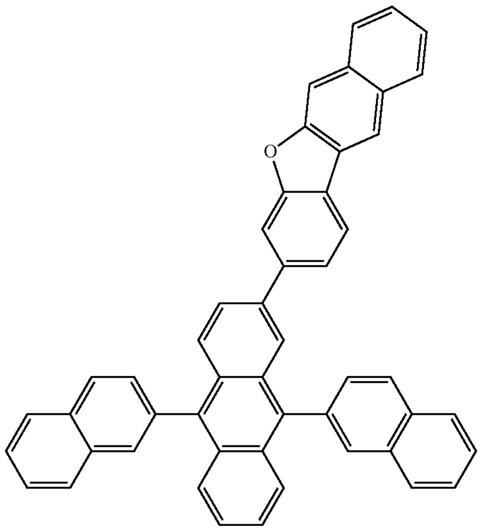

H120

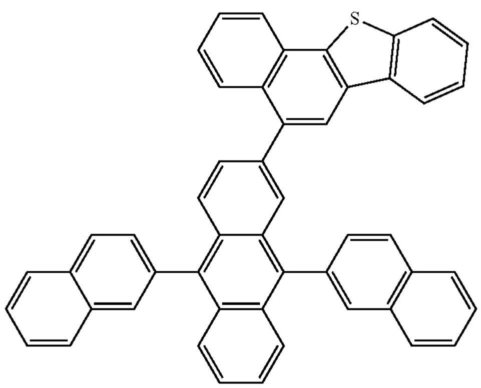

H121

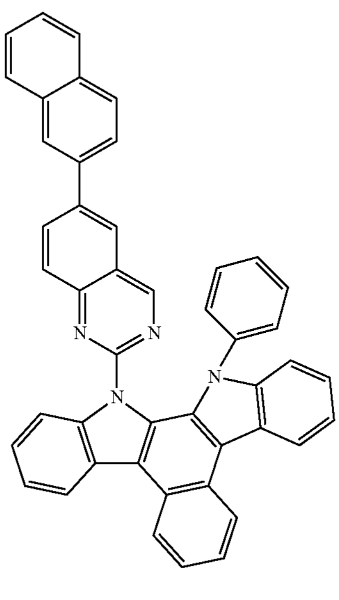

-continued

H122

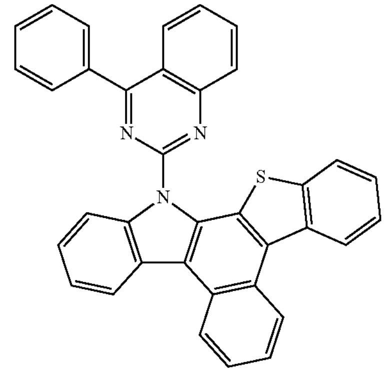

H123

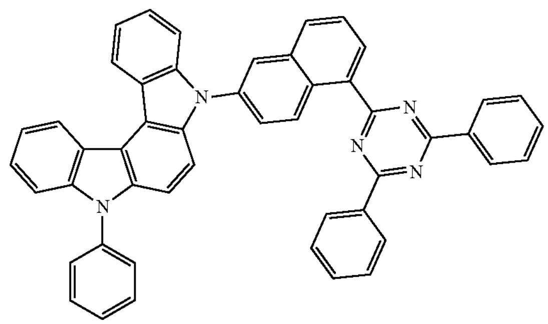

H124

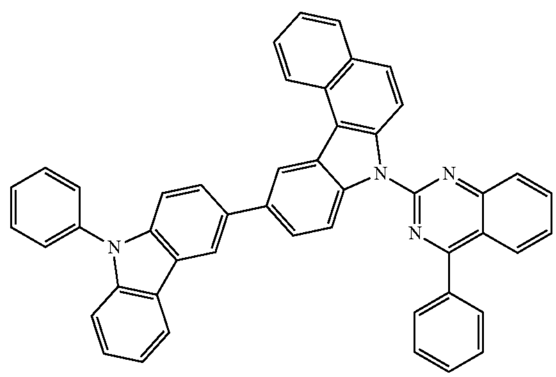

Phosphorescent Dopant

In one or more embodiments, the phosphorescent dopant may include at least one transition metal as a central metal. The phosphorescent dopant may include a monodentate ligand, a bidentate ligand, a tridentate ligand, a tetradentate ligand, a pentadentate ligand, a hexadentate ligand, or any combination thereof. The phosphorescent dopant may be electrically neutral. For example, the phosphorescent dopant may include an organometallic compound represented by Formula 401:

Formula 401

$$M(L_{401})_{xc1}(L_{402})_{xc2}$$

-continued

Formula 402

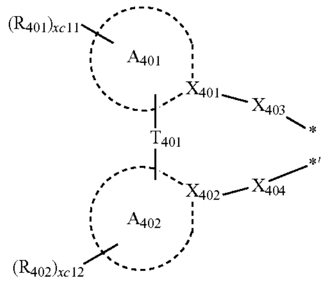

In Formulae 401 and 402,

M may be a transition metal (for example, iridium (Ir), platinum (Pt), palladium (Pd), osmium (Os), titanium (Ti), gold (Au)hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(═O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_4O_4$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), $Q_{401}$ to $Q_{403}$ are the same as described in connection with $Q_1$, xc11 and xc12 may each independently be an integer from 0 to 10,

* and *' in Formula 402 each indicate a binding site to M in Formula 401.

For example, in Formula 402, i) $X_{401}$ is nitrogen, and $X_{402}$ is carbon, or ii) each of $X_{401}$ and $X_{402}$ is nitrogen. In one or more embodiments, when xc1 in Formula 401 is 2 or more, two ring $A_{401}$ in two or more of $L_{401}$(s) may be optionally linked to each other via $T_{402}$, which is a linking group, and two ring $A_{402}$ are optionally linked to each other via $T_{403}$, which is a linking group (see Compounds PD1 to PD4 and PD7). The variables $T_{402}$ and $T_{403}$ are the same as described in connection with $T_{401}$.

The variable $L_{402}$ in Formula 401 may be an organic ligand. For example, $L_{402}$ may include a halogen group, a diketone group (for example, an acetylacetonate group), a carboxylic acid group (for example, a picolinate group), a —C(═O) group, an isonitrile group, a —CN group, a phosphorus-containing group (for example, a phosphine group, a phosphite group, and the like), or any combination thereof.

The phosphorescent dopant may include, for example, one of compounds PD1 to PD25, or any combination thereof:

PD1

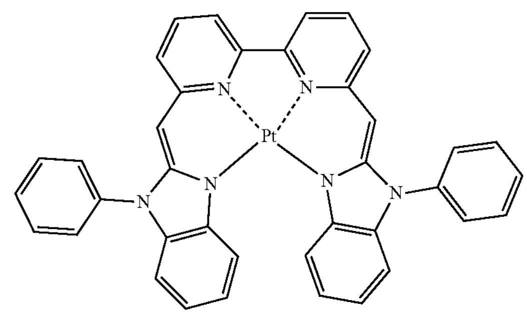

PD2

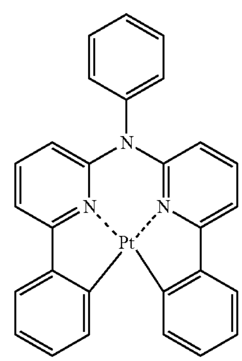

PD3

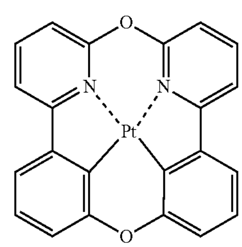

PD4

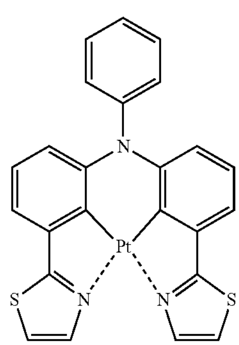

-continued
PD5
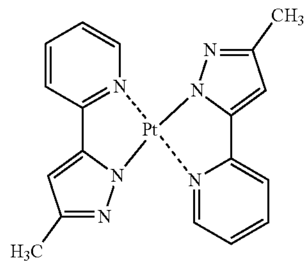
PD6
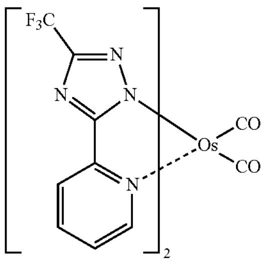
PD7
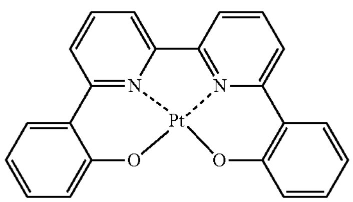
PD8
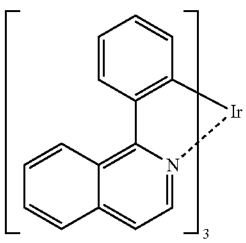
PD9
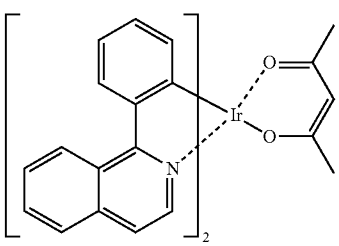
PD10
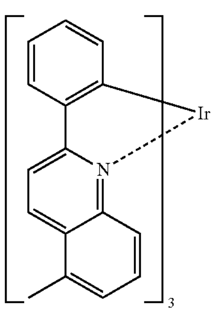
-continued
PD11
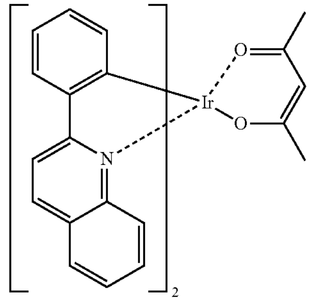
PD12
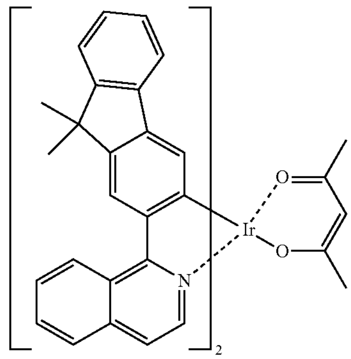
PD13
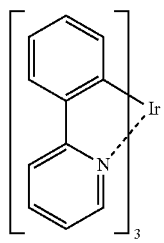
PD14
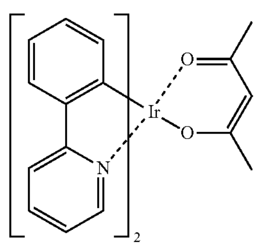
PD15
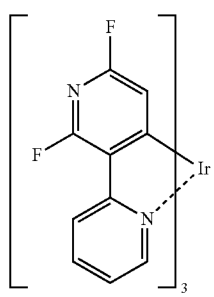

-continued
PD16
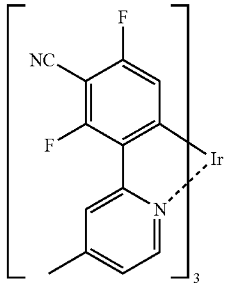
PD17
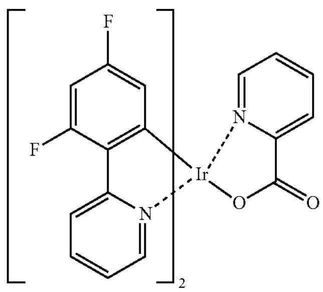
PD18
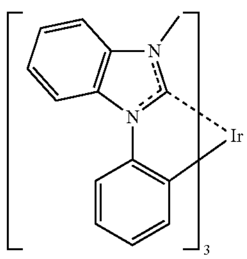
PD19
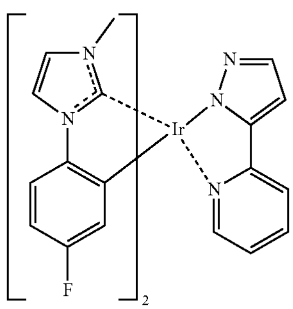
PD20
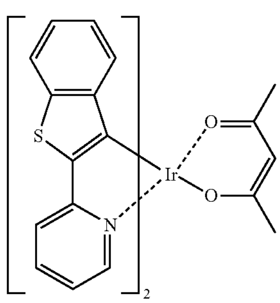
-continued
PD21
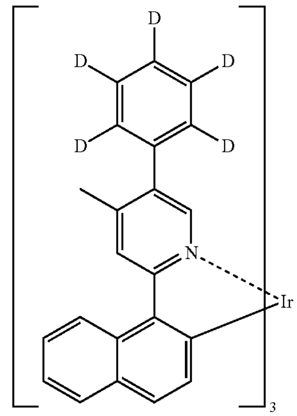
PD22
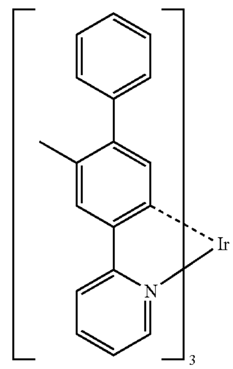
PD23
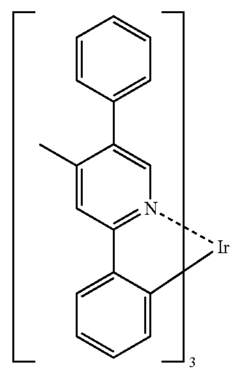
PD24
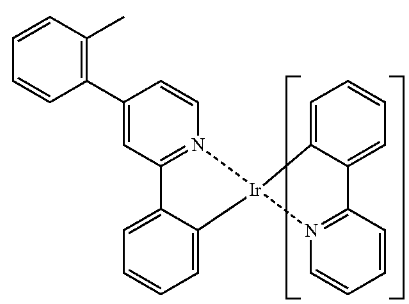

-continued

PD25

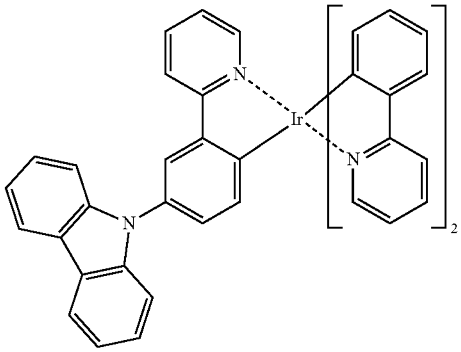

Fluorescent Dopant

The fluorescent dopant may include an amine group-containing compound, a styryl group-containing compound, or any combination thereof. In one or more embodiments, the fluorescent dopant may include a compound represented by Formula 501:

Formula 501

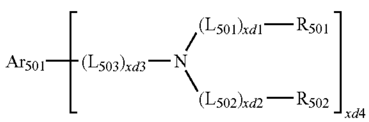

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In one or more embodiments, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

In one or more embodiments, the fluorescent dopant may include: one of Compounds FD1 to FD36; DPVBi; DPAVBi; or any combination thereof:

FD1

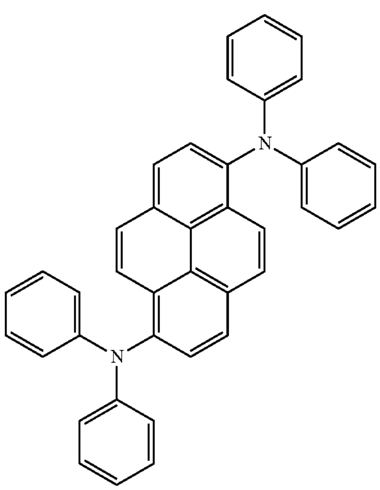

-continued

FD2

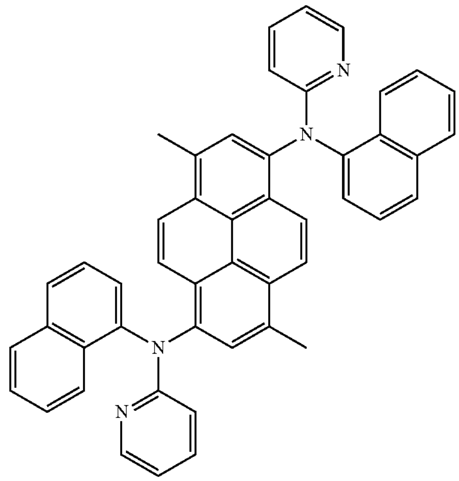

FD3

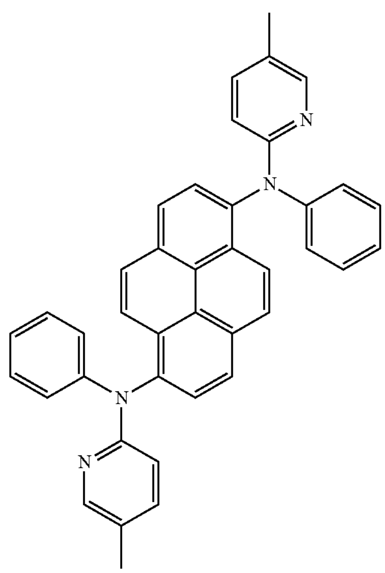

-continued
FD4
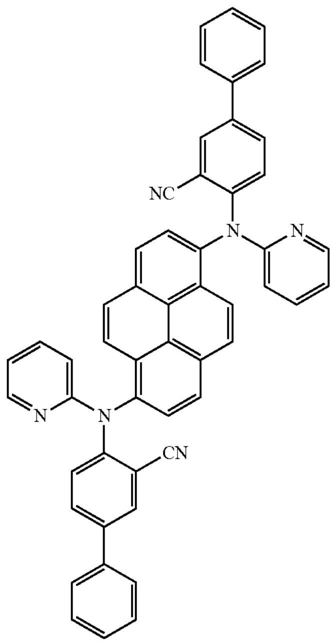
FD5
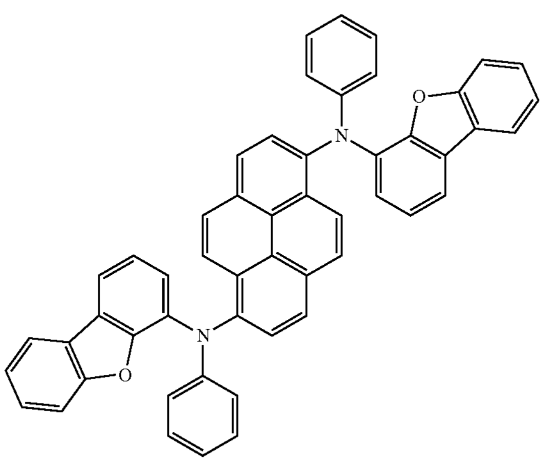
FD6
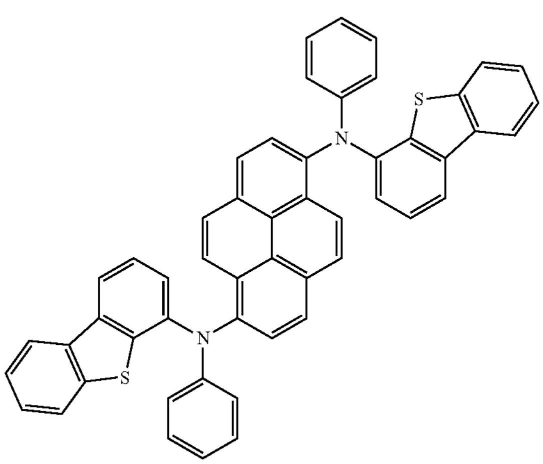
-continued
FD7
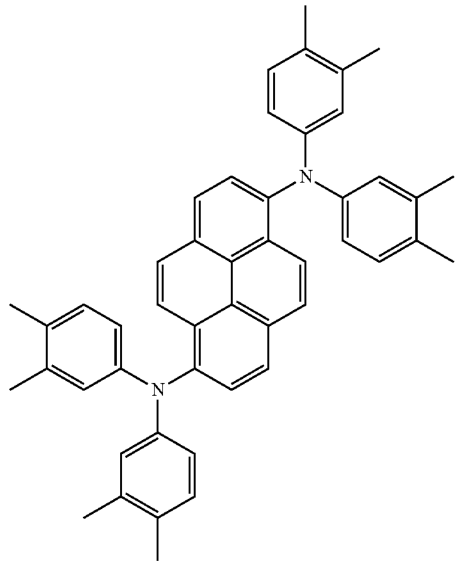
FD8
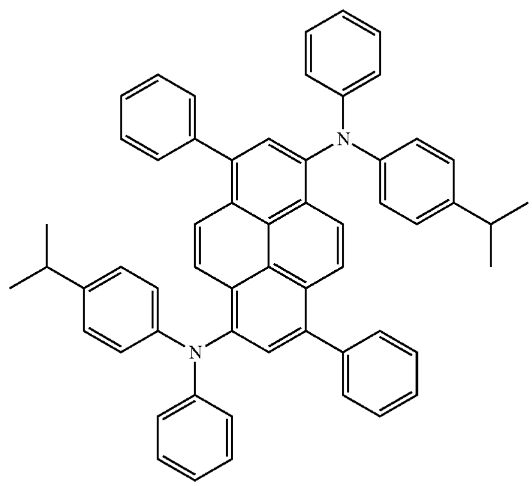
FD9
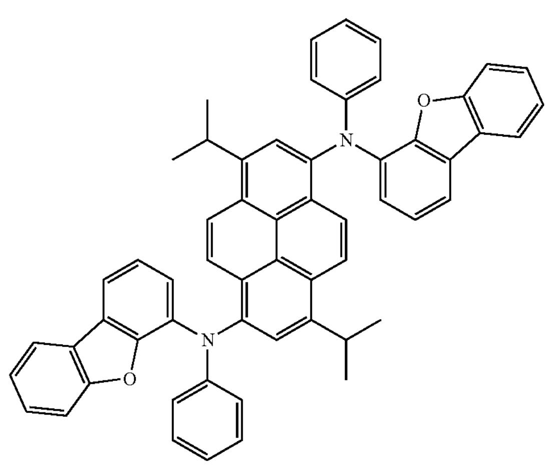

FD10
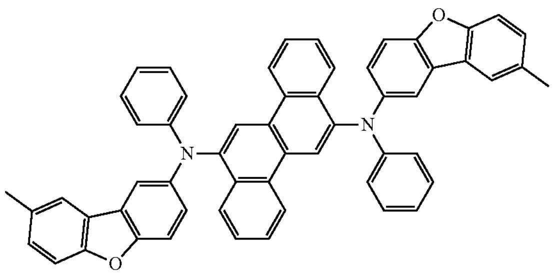
FD11
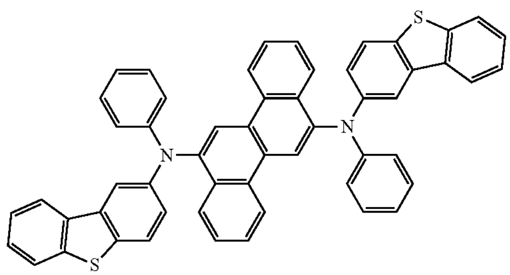
FD12
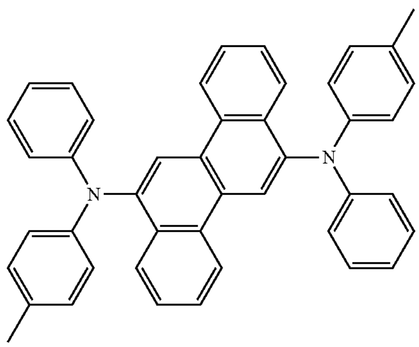
FD13
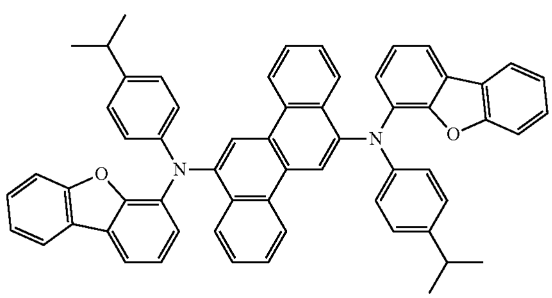
FD14
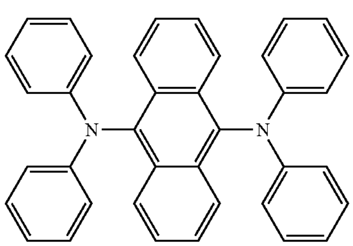
FD15
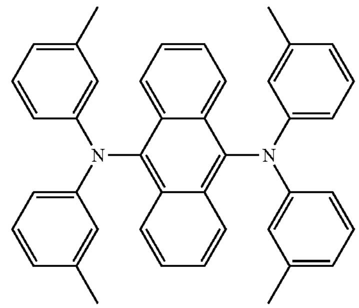
FD16
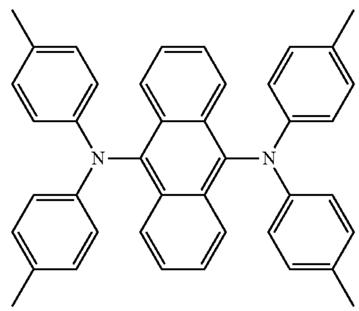
FD17
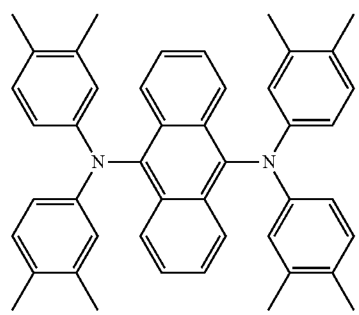
FD18
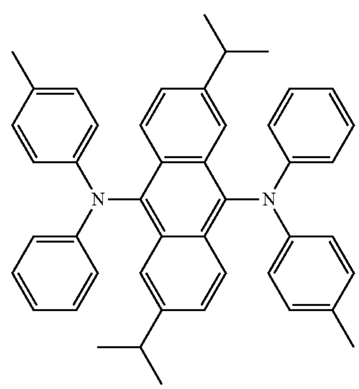

-continued
FD19
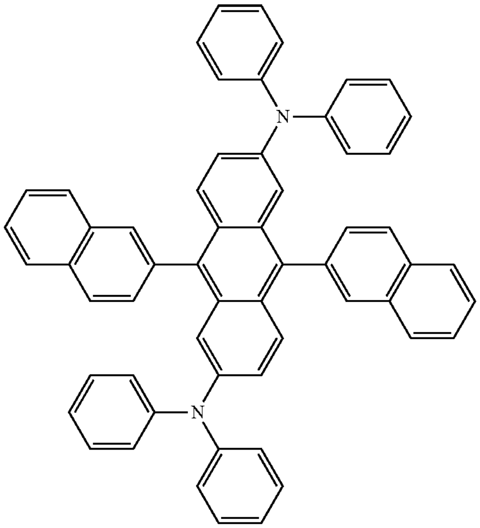
FD20
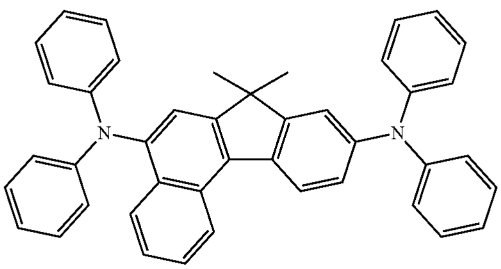
FD21
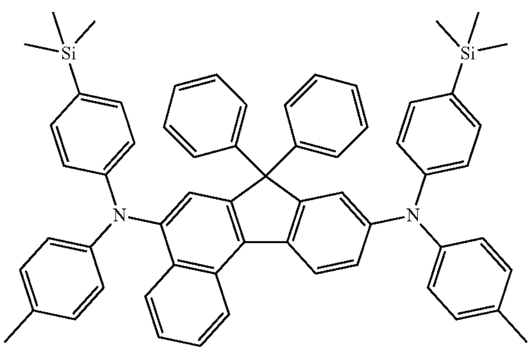
FD22
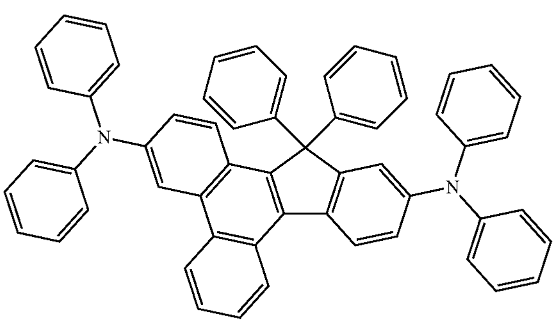
-continued
FD23
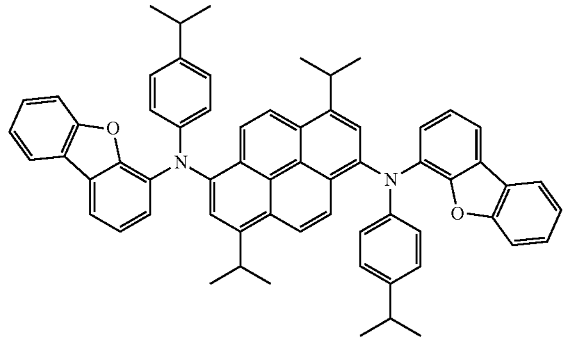
FD24
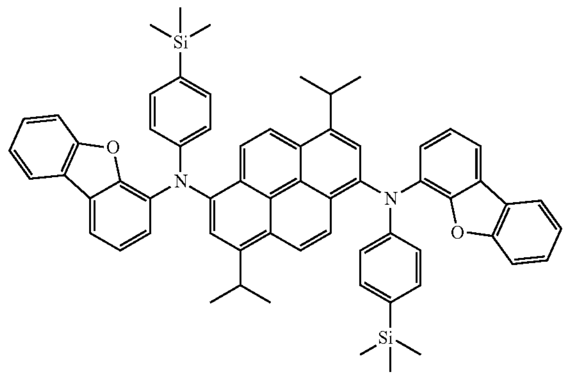
FD25
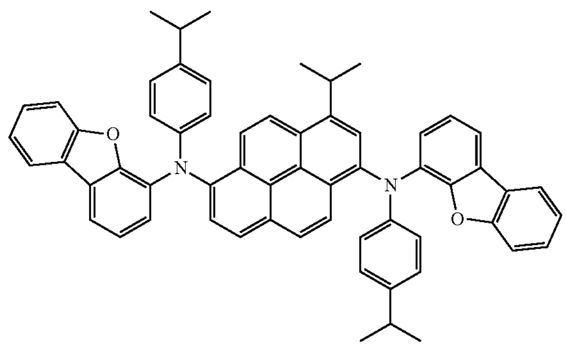
FD26
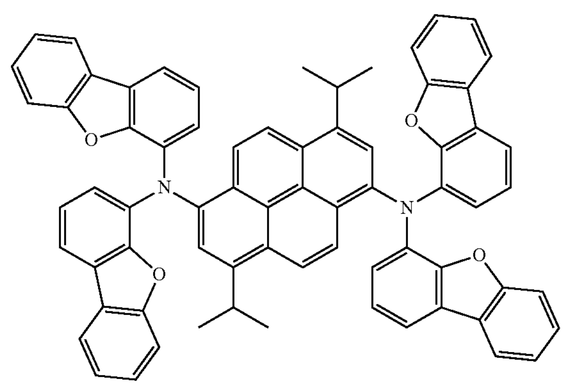

-continued
FD27
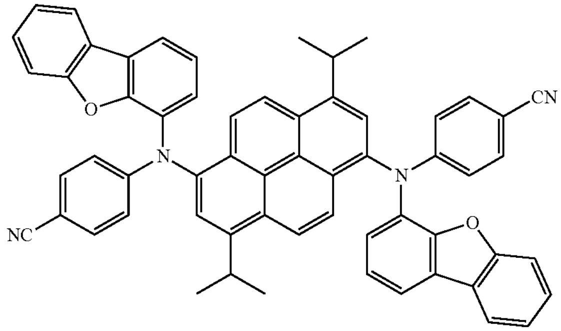
FD28
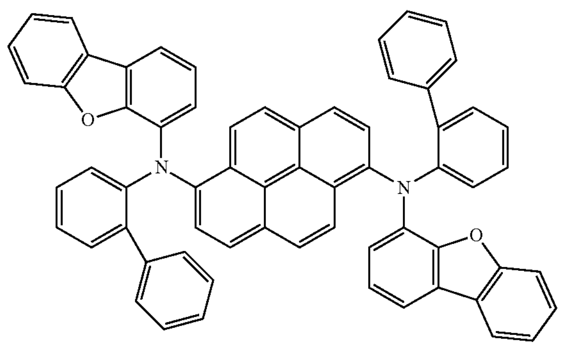
FD29
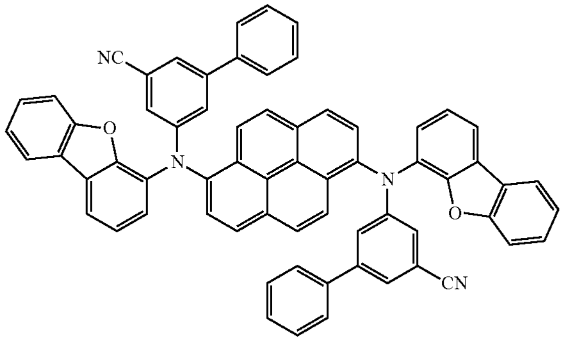
FD30
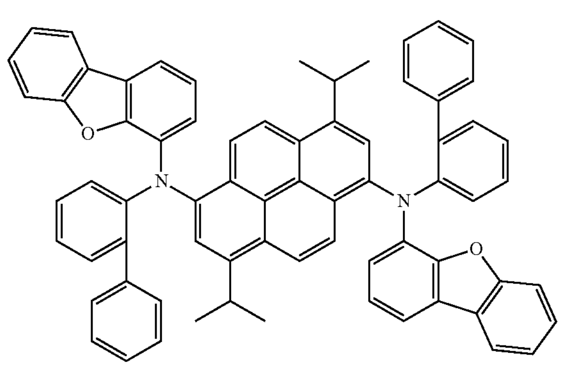
-continued
FD31
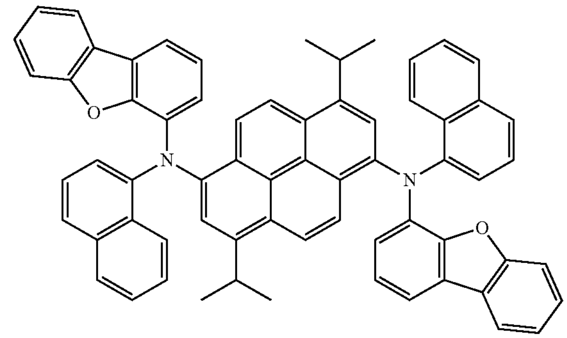
FD32
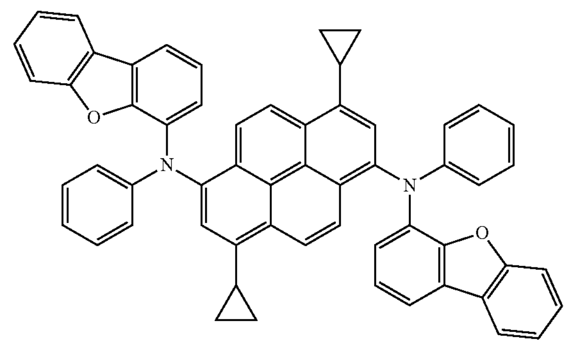
FD33
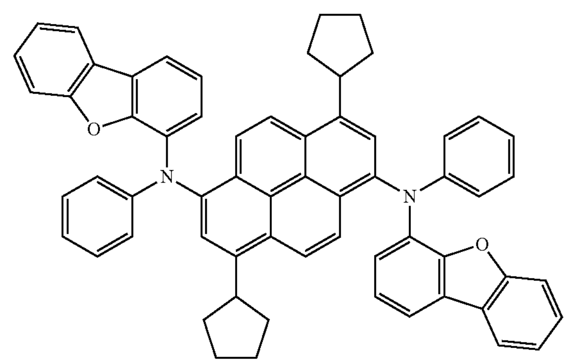
FD34
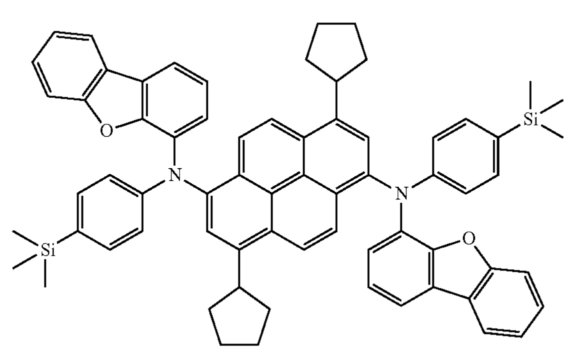

-continued

FD35

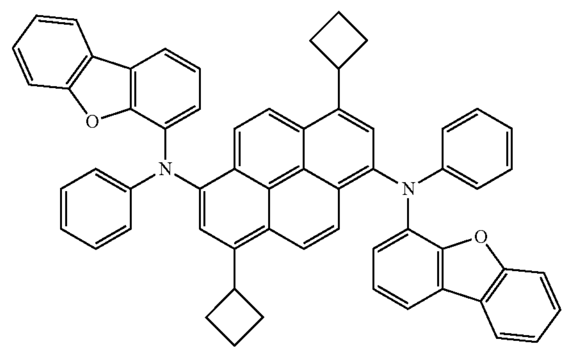

FD36

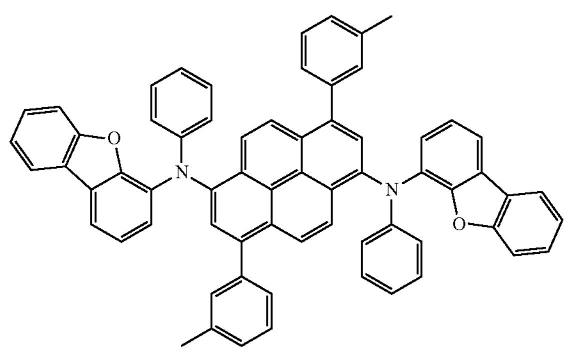

DPVBi

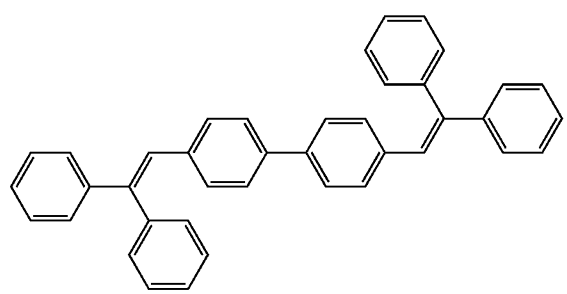

DPAVBi

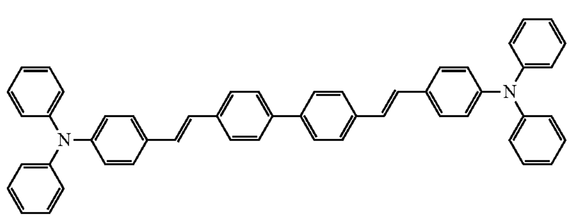

Delayed Fluorescence Material

The emission layer may include a delayed fluorescence material. The delayed fluorescence material described herein may be selected from compounds capable of emitting delayed fluorescence light based on a delayed fluorescence emission mechanism. The delayed fluorescent material included in the emission layer may act as a host or a dopant depending on the type of other materials included in the emission layer.

In one or more embodiments, the difference between the triplet energy level in electron volt (eV) of the delayed fluorescence material and the singlet energy level in electron volt (eV) of the delayed fluorescence material may be greater than or equal to about 0 eV and less than or equal to about 0.5 eV. When the difference between the triplet energy level in electron volt (eV) of the delayed fluorescent material and the singlet energy level in electron volt (eV) of the delayed fluorescent material satisfies the above-described range, up-conversion from the triplet state to the singlet state of the delayed fluorescent materials may effectively occur, and thus, the emission efficiency of the light-emitting device 10 may be improved. For example, the delayed fluorescence material may include the fused cyclic compound represented by Formula 1.

Quantum Dot

The emission layer may include a quantum dot. The diameter of the quantum dot may be, for example, in a range of about 1 nm to about 10 nm. The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more easily performed than vapor deposition methods, such as metal organic chemical vapor deposition (MOCVD) or molecular beam epitaxy (MBE), and which requires low costs.

The quantum dot may include semiconductor compounds of Groups II-VI, semiconductor compounds of Groups III-V, semiconductor compounds of Groups III-VI, semiconductor compounds of Groups I-III-VI, semiconductor compounds of Groups IV-VI, an element or a compound of Group IV; or any combination thereof. Examples of the semiconductor compound of Groups II-VI may include a binary compound, such as CdSe, CdTe, ZnS, ZnSe, ZnTe, ZnO, HgS, HgSe, HgTe, MgSe, MgS, and the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and the like; a quaternary compound, such as CdZnSeS, CdZnSeTe, CdZnSTe, CdHgSeS, CdHgSeTe, CdHgSTe, HgZnSeS, HgZnSeTe, HgZnSTe, and the like; or any combination thereof.

Examples of the semiconductor compound of the Groups III-V may include a binary compound, such as GaN, GaP, GaAs, GaSb, AlN, AlP, AlAs, AlSb, InN, InP, InAs, InSb, and the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the like; or any combination thereof. The semiconductor compound of Groups III-V may further include Group II elements. Examples of the semiconductor compound of Groups III-V further including Group II elements are InZnP, InGaZnP, InAlZnP, and the like Examples of the semiconductor compound of Groups III-VI may include: a binary compound, such as GaS, GaSe, $Ga_2Se_3$, GaTe, InS, InSe, $In_2S_3$, $In_2Se_3$, InTe, and the like; a ternary compound, such as $InGaS_3$, $InGaSe_3$, and the like; or any combination thereof. Examples of the semiconductor compound of Groups I-III-VI may include a ternary compound, such as AgInS, $AgInS_2$, CuInS, $CuInS_2$, $CuGaO_2$, $AgGaO_2$, $AgAlO_2$, and the like; or any combination thereof. Examples of the semiconductor compound of Groups IV-VI may include a binary compound, such as SnS, SnSe, SnTe, PbS, PbSe, PbTe, and the like; a ternary compound, such as SnSeS, SnSeTe, SnSTe, PbSeS, PbSeTe, PbSTe, SnPbS, SnPbSe, SnPbTe, and the like; a quaternary compound, such as SnPbSSe, SnPbSeTe, SnPbSTe, and the like; or any combination thereof. The element or compound of Group IV may include a single element material, such as Si or Ge; a binary compound, such as SiC or SiGe; or any combination thereof.

Each element included in a multi-element compound such as the binary compound, ternary compound and quaternary compound, may exist in a particle with a uniform concentration or non-uniform concentration. The quantum dot may have a single structure or a core-shell dual structure. In the case of the quantum dot having a single structure, the concentration of each element included in the corresponding quantum dot is uniform. In one or more embodiments, the material contained in the core and the material contained in the shell may be different from each other.

The shell of the quantum dot may act as a protective layer to prevent chemical degeneration of the core to maintain semiconductor characteristics and/or as a charging layer to impart electrophoretic characteristics to the quantum dot. The shell may be a single layer or a multi-layer. The interface between the core and the shell may have a concentration gradient in which the concentration of the element present in the shell decreases toward the center.

Examples of the shell of the quantum dot may be an oxide of a metal, a metalloid, or a non-metal, a semiconductor compound, and any combination thereof. Examples of the oxide of the metal, metalloid, or non-metal are a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; and any combination thereof. Examples of the semiconductor compound are, as described herein, semiconductor compounds of Groups II-VI; semiconductor compounds of Groups III-V; semiconductor compounds of Groups III-VI; semiconductor compounds of Groups I-III-VI; semiconductor compounds of Groups IV-VI; and any combination thereof. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The full width at half maximum (FWHM) of an emission wavelength spectrum of the quantum dot may be about 45 nm or less, for example, about 40 nm or less, for example, about 30 nm or less, and within these ranges, color purity or color gamut may be increased. In addition, since the light emitted through the quantum dot is emitted in all directions, the wide viewing angle can be improved. In addition, the quantum dot may be a generally spherical nanoparticle, a generally pyramidal nanoparticle, a generally multi-armed nanoparticle, a generally cubic nanoparticle, a generally nanotube-shaped particle, a generally nanowire-shaped particle, a generally nanofiber-shaped particle, or a generally nanoplate-shaped particle.

Because the energy band gap can be adjusted by controlling the size of the quantum dot, light having various wavelength bands can be obtained from the quantum dot emission layer. Therefore, by using quantum dots of different sizes, a light-emitting device that emits light of various wavelengths may be implemented. In one or more embodiments, the size of the quantum dot may be selected to emit red, green and/or blue light. In addition, the size of the quantum dot may be configured to emit white light by combining light of various colors.

Electron Transport Region in Interlayer 130

The electron transport region may have: i) a single-layered structure consisting of a single layer consisting of a single material, ii) a single-layered structure consisting of a single layer consisting of a plurality of different materials, or iii) a multi-layered structure including a plurality of layers including a plurality of different materials. The electron transport region may include a buffer layer, a hole-blocking layer, an electron control layer, an electron transport layer, an electron injection layer, or any combination thereof.

In an embodiment, the electron transport region may have an electron transport layer/electron injection layer structure, a hole-blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from an emission layer.

In an embodiment, the electron transport region (for example, the buffer layer, the hole-blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601 below:

$$[Ar_{601}]_{xe11}\text{-}[(L_{601})_{xe1}\text{-}R_{601}]_{xe21} \qquad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(═O)($Q_{601}$), —S(═O)$_2$($Q_{601}$), or —P(═O)($Q_{601}$)($Q_{602}$), $Q_{601}$ to $Q_{603}$ are the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked via a single bond. In one or more embodiments, $Ar_{601}$ in Formula 601 may be a substituted or unsubstituted anthracene group. In an embodiment, the electron transport region may include a compound represented by Formula 601-1:

Formula 601-1

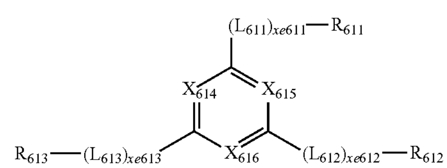

In Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_{611}$ to $L_{613}$ are the same as described in connection with $L_{601}$, xe611 to xe613 are the same as described in connection with xe1, $R_{611}$ to $R_{613}$ are the same as described in connection with $R_{601}$, $R_{614}$ to $R_{16}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), tris-(8-hydroxyquinoline)aluminum ($Alq_3$), bis(2-methyl-8-quinolinolato-N1,O8)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), or any combination thereof.

ET1

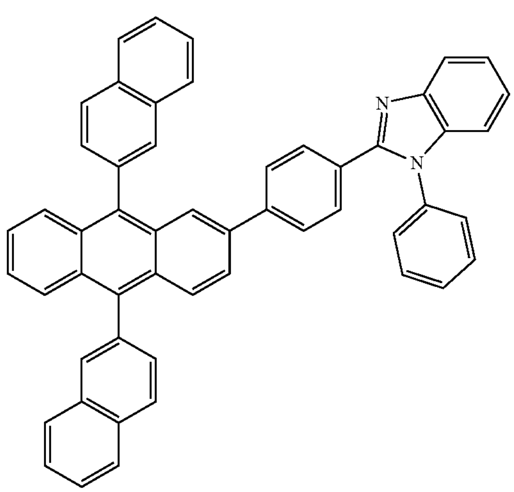

-continued

ET2

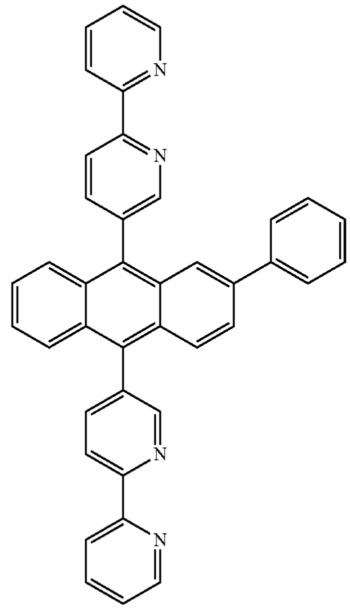

ET3

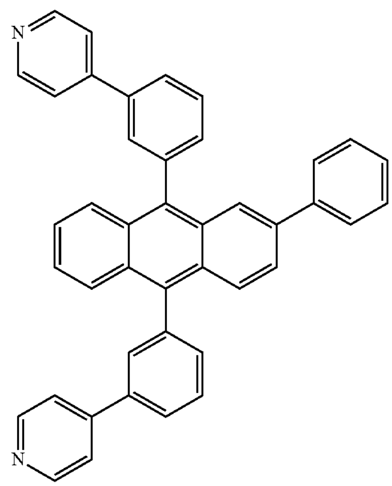

ET4

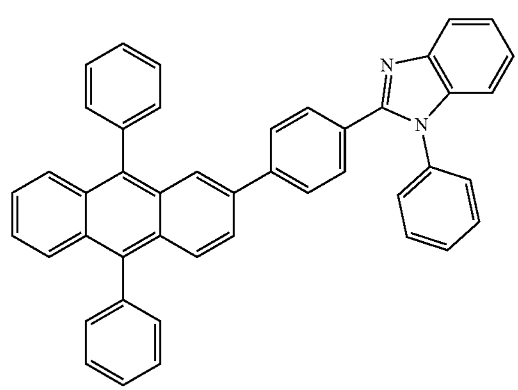

-continued
ET5
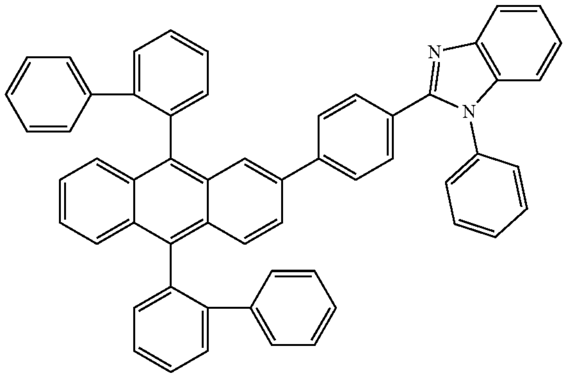
ET6
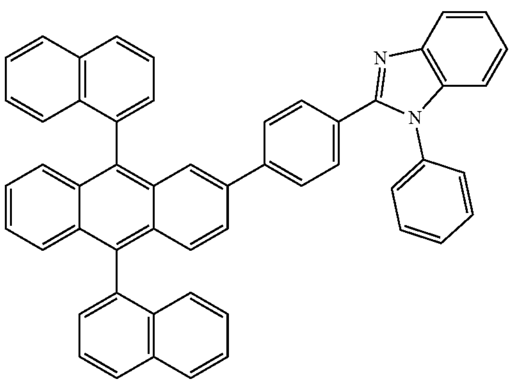
ET7
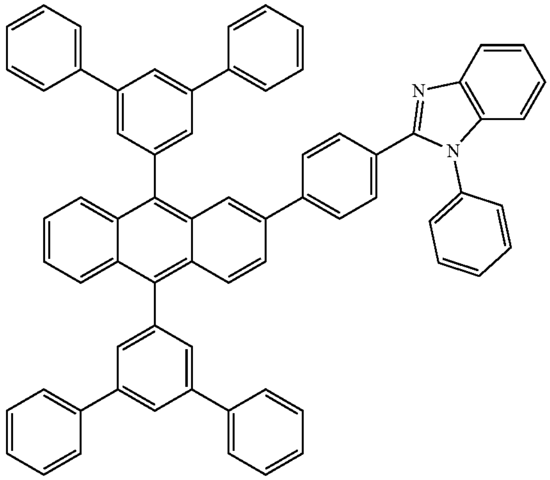
-continued
ET8
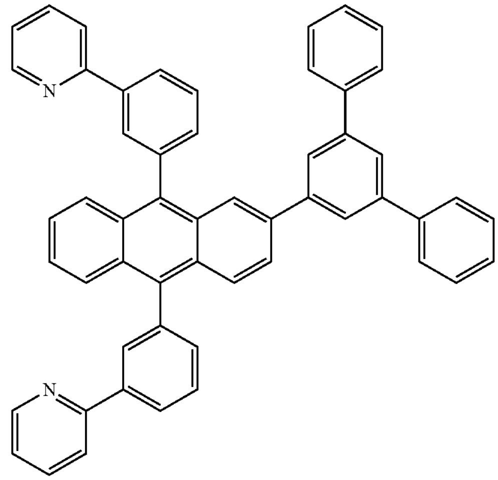
ET9
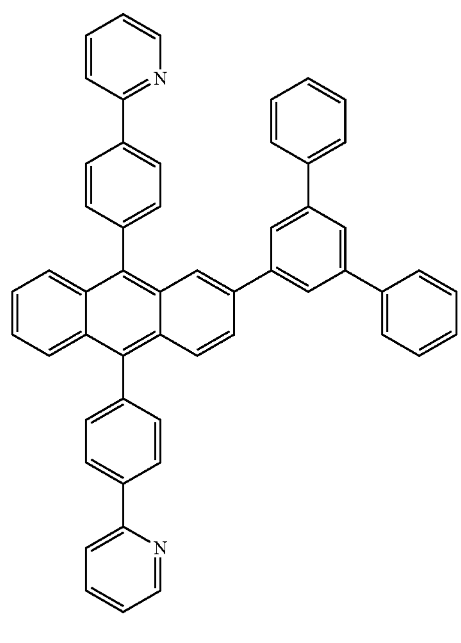

ET10
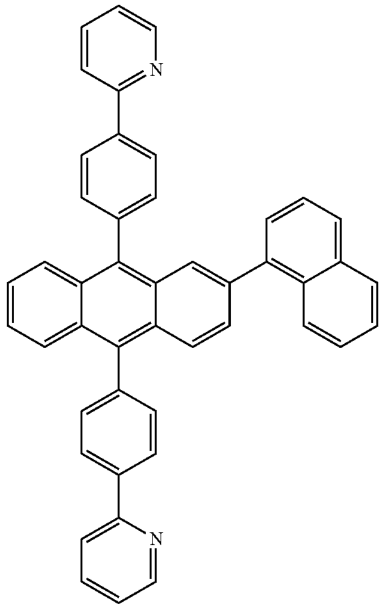
ET11
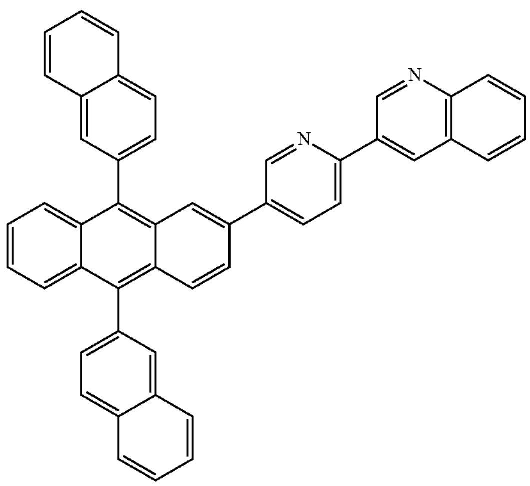
ET12
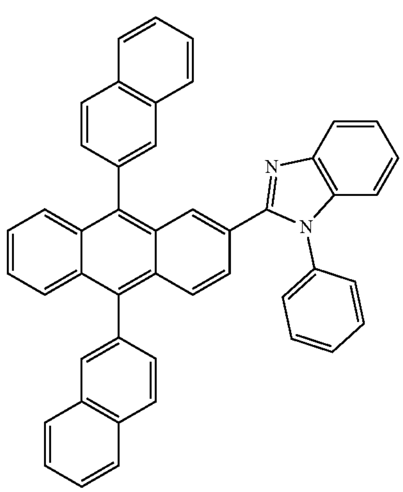
ET13
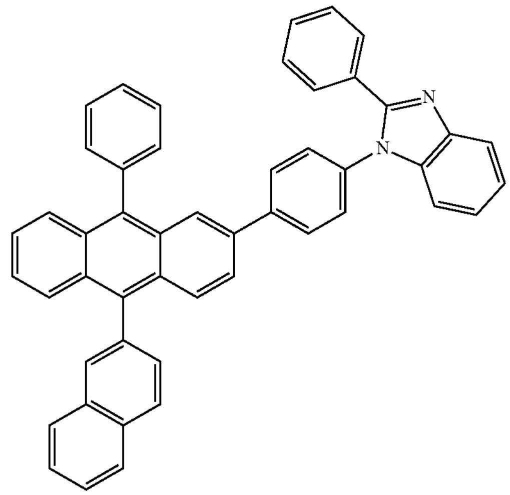
ET14
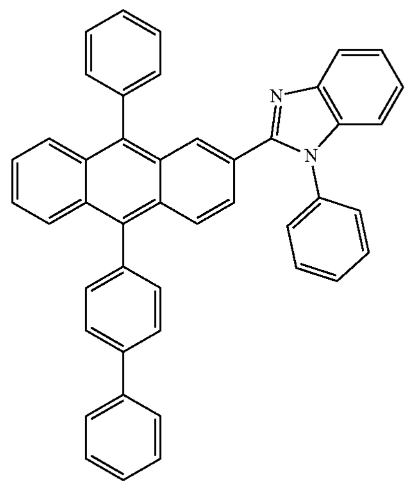
ET15
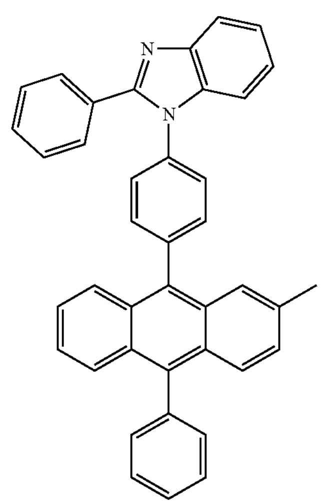

-continued
ET16
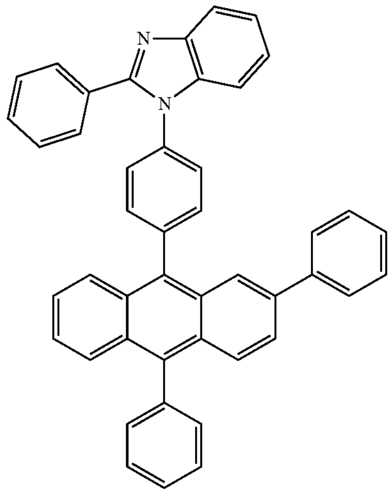
ET17
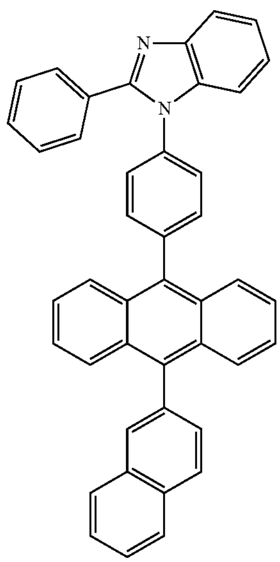
ET18
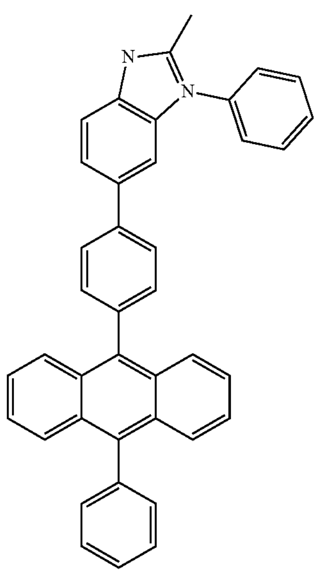
-continued
ET19
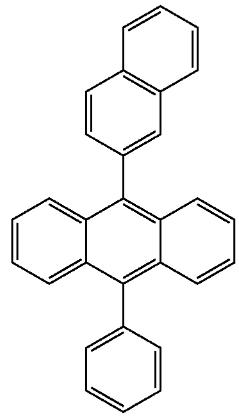
ET20
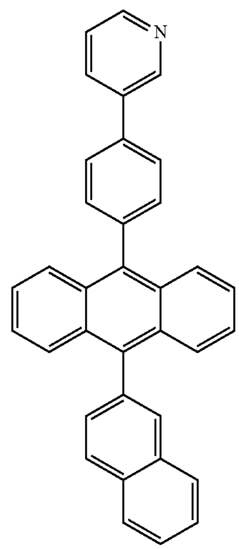
ET21
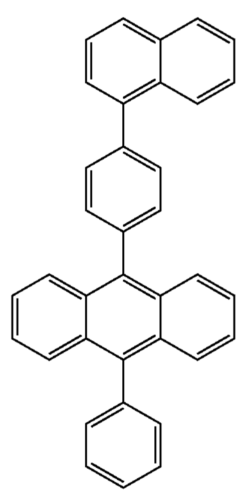

-continued
ET22
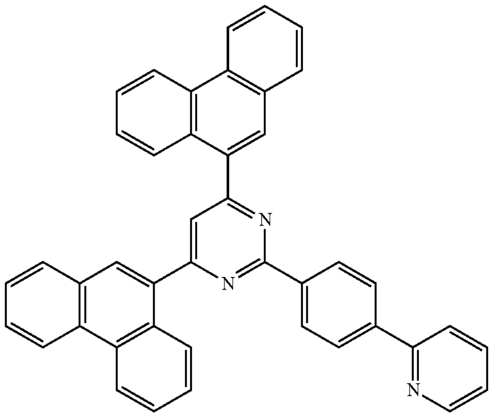
ET23
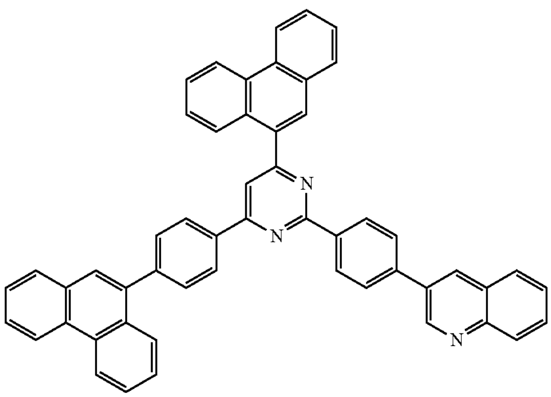
ET24
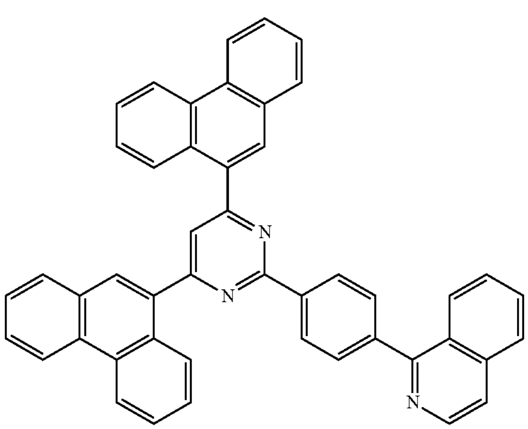
-continued
ET25
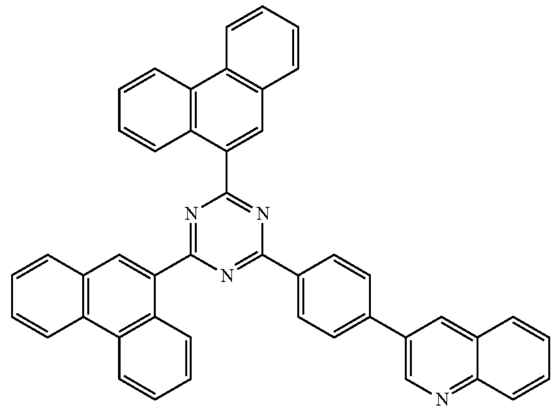
ET26
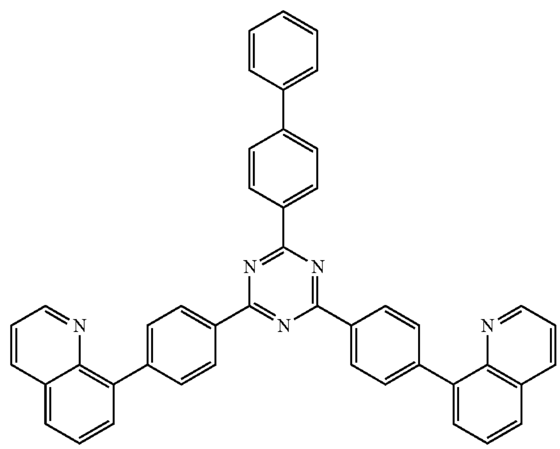
ET27
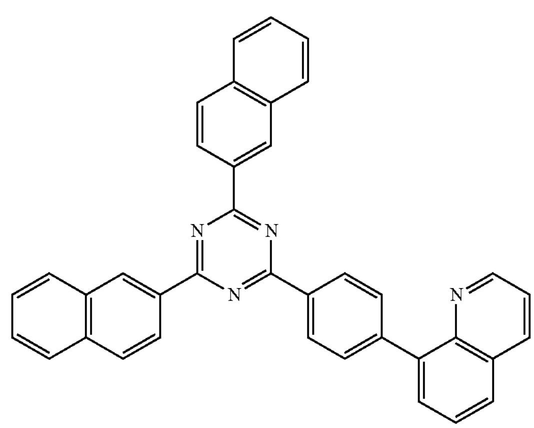

ET28
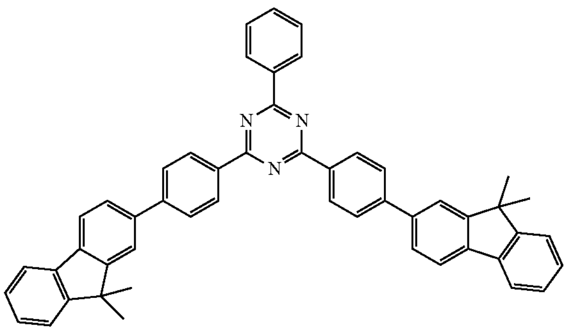
ET29
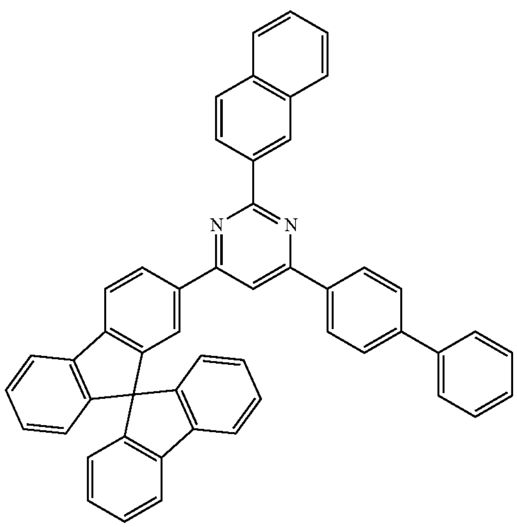
ET30
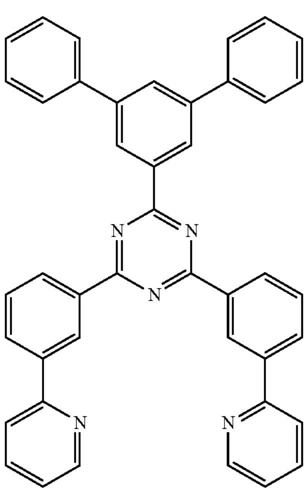
ET31
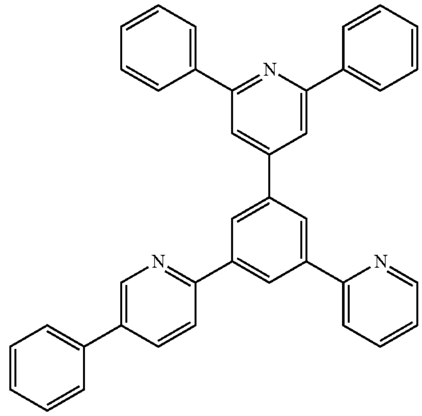
ET32
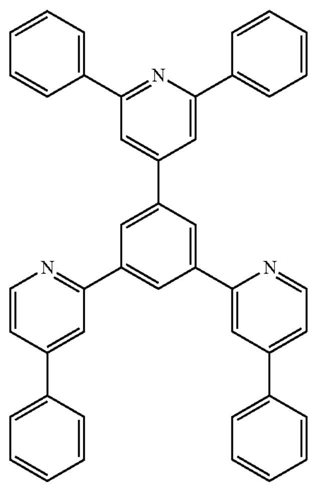
ET33
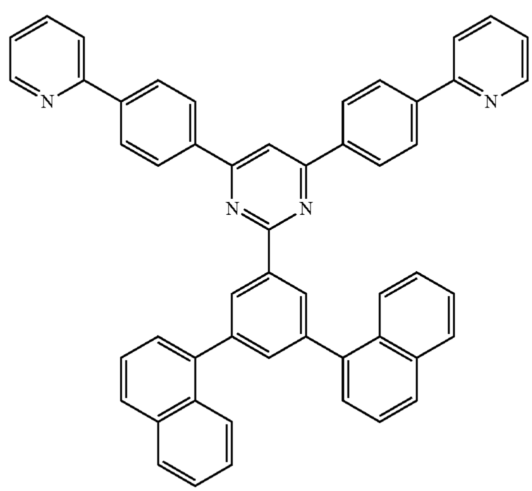

ET34
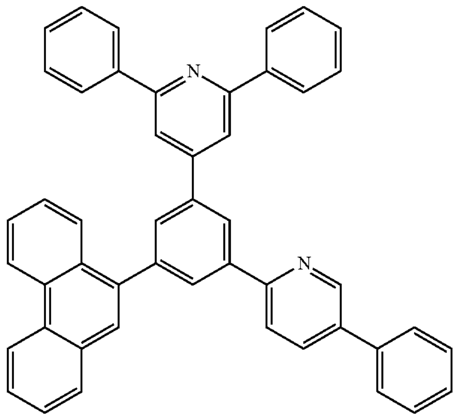
ET35
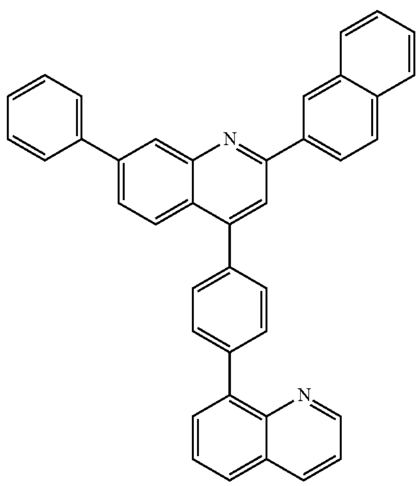
ET36
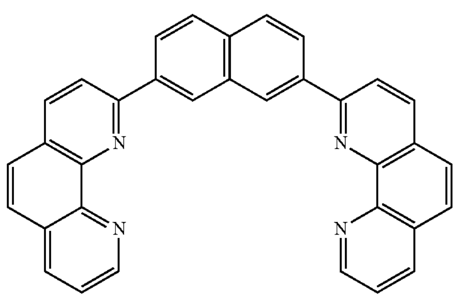
ET37
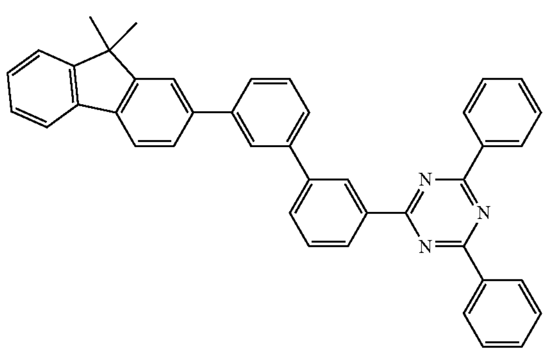
ET38
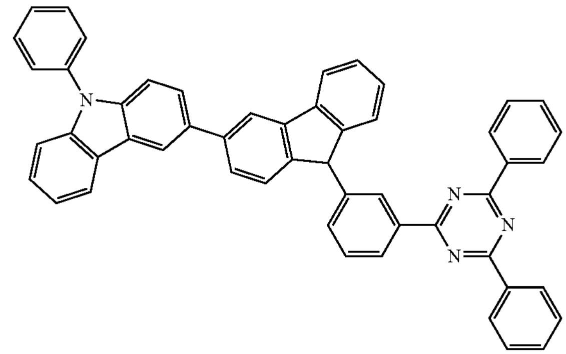
ET39
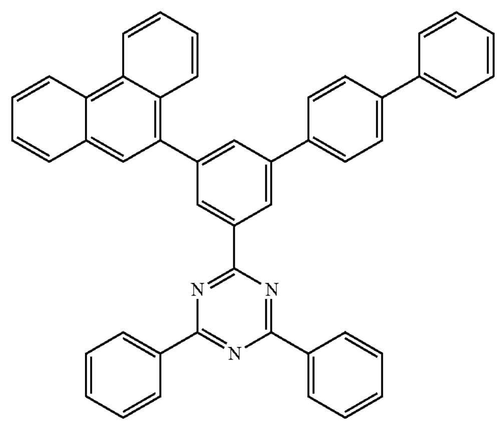
ET40
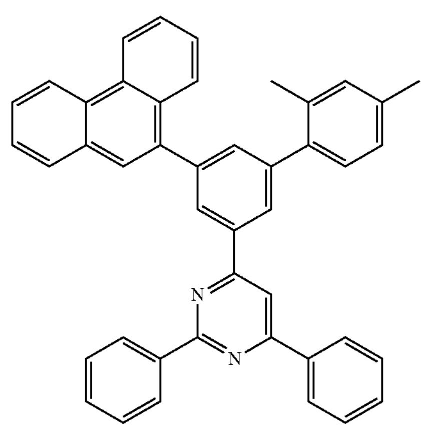

-continued
ET41
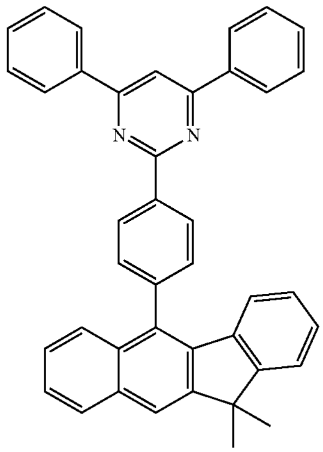
ET42
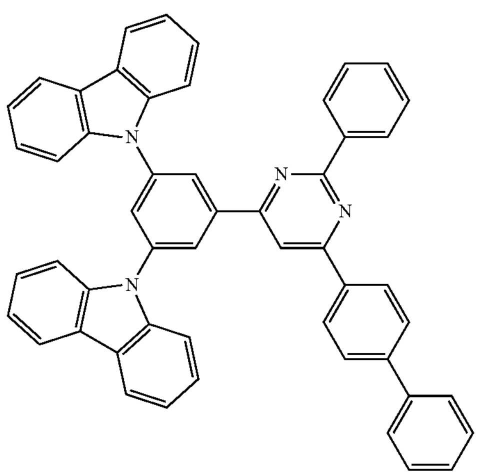
ET43
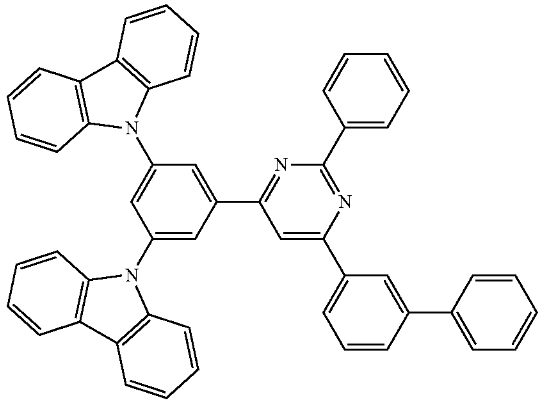
-continued
ET44
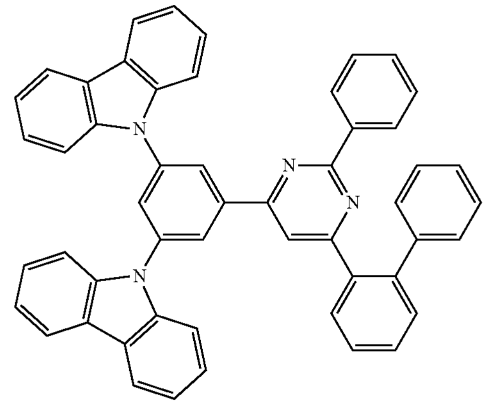
ET45
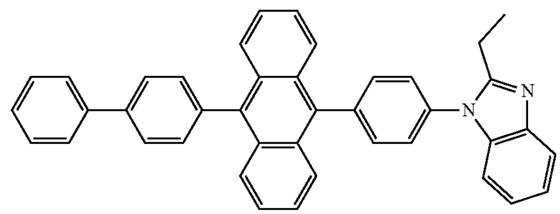
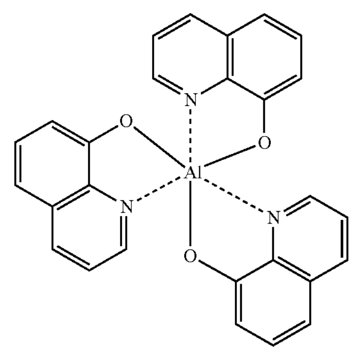
$Alq_3$
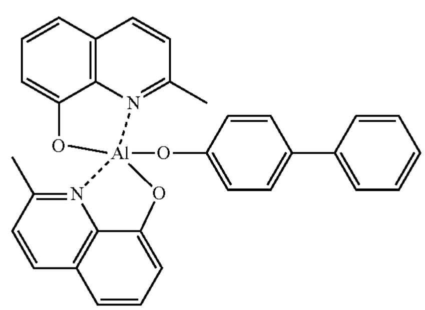
BAlq
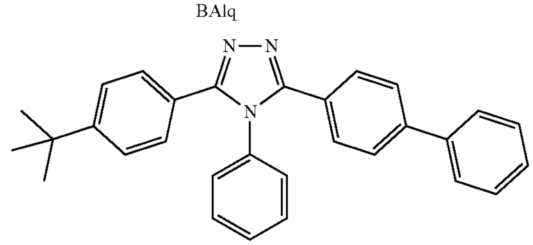
TAZ -continued

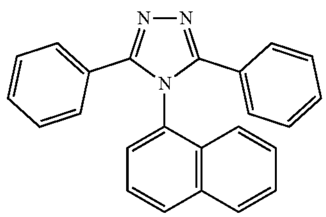

NTAZ

The thickness of the electron transport region may be from about 100 Å to about 5,000 Å, for example, from about 160 Å to about 4,000 Å. When the electron transport region includes the buffer layer, the hole-blocking layer, the electron control layer, the electron transport layer, or any combination thereof, the thickness of the buffer layer, the hole-blocking layer, or the electron control layer may each independently be from about 20 Å to about 1000 Å, for example, about 30 Å to about 300 Å, and the thickness of the electron transport layer may be from about 100 Å to about 1000 Å, for example, about 150 Å to about 500 Å. When the thicknesses of the buffer layer, hole-blocking layer, electron control layer, electron transport layer and/or electron transport region are within these ranges, satisfactory electron transporting characteristics may be obtained without a substantial increase in driving voltage. The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of an alkali metal complex may be a Li ion, a Na ion, a K ion, a Rb ion, or a Cs ion, and the metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (8-hydroxyquinolinolato-lithium, Liq) or ET-D2:

ET-D1

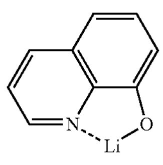

-continued

ET-D2

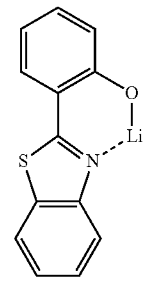

The electron transport region may include an electron injection layer that facilitates the injection of electrons from the second electrode 150. The electron injection layer may directly contact the second electrode 150. The electron injection layer may have: i) a single-layered structure consisting of a single layer consisting of a single material, ii) a single-layered structure consisting of a single layer consisting of a plurality of a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof. The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides, such as $Li_2O$, $Cs_2O$, or $K_{20}$, alkali metal halides, such as LiF, NaF, CsF, KF, LiI, NaI, CsI, or KI, or any combination thereof. The alkaline earth metal-containing compound may include an alkaline earth metal oxide, such as BaO, SrO, CaO, $Ba_xSr_{1-x}O$ (x is a real number satisfying the condition of 0<x<1), $Ba_xCa_{1-x}O$ (x is a real number satisfying the condition of 0<x<l), and the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include a lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of metal ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may consist of i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. In one or more embodiments, the electron injection layer may be a KI:Yb co-deposited layer, an RbI:Yb co-deposited layer, and the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

The thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be used.

In one or more embodiments, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), an ITO, an IZO, or any combination thereof. The second electrode 150 may be a transmissive electrode, a semi-transmissive electrode, or a reflective electrode. The second electrode 150 may have a single-layered structure or a multi-layered structure including two or more layers.

Capping Layer

A first capping layer may be located outside the first electrode 110, and/or a second capping layer may be located outside the second electrode 150. In detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110, which is a semi-transmissive electrode or a transmissive electrode, and the first capping layer or light generated in an emission layer of the interlayer 130 of the light-emitting device 10 may be extracted toward the outside through the second electrode 150, which is a semi-transmissive electrode or a transmissive electrode, and the second capping layer.

Although not wanting to be bound by theory, the first capping layer and the second capping layer may increase external emission efficiency according to the principle of constructive interference. Accordingly, the light extraction efficiency of the light-emitting device is increased, so that the luminescence efficiency of the light-emitting device 10 may be improved. Each of the first capping layer and second capping layer may include a material having a refractive index (at 589 nm) of about 1.6 or more.

The first capping layer and the second capping layer may each independently be an organic capping layer including an organic material, an inorganic capping layer including an inorganic material, or an organic-inorganic composite capping layer including an organic material and an inorganic material.

At least one selected from the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof. In one or more embodiments, at least one of the first capping layer and the second capping layer may each independently include an amine group-containing compound. In one or more embodiments, at least one of the first capping layer and the second capping layer may each independently include a compound represented by Formula 201, a compound represented by Formula 202, or any combination thereof.

In one or more embodiments, at least one of the first capping layer and the second capping layer may each independently include one of Compounds HT28 to HT33, one of Compounds CP1 to CP6, N4,N4'-di(naphthalen-2-yl)-N4,N4'-diphenyl-[1,1'-biphenyl]-4,4'-diamine (β-NPB), or any combination thereof:

CP1

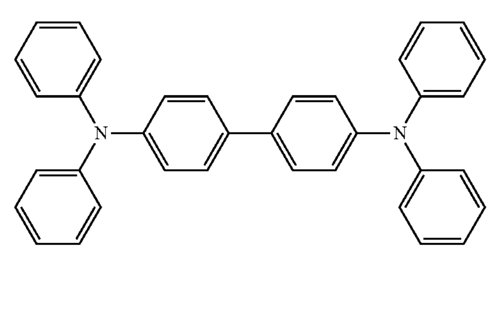

-continued

CP2

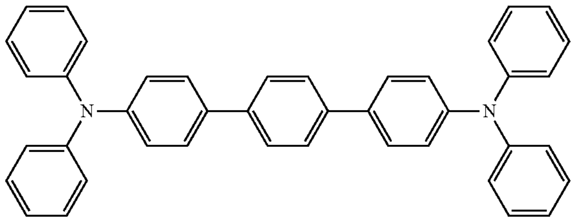

CP3

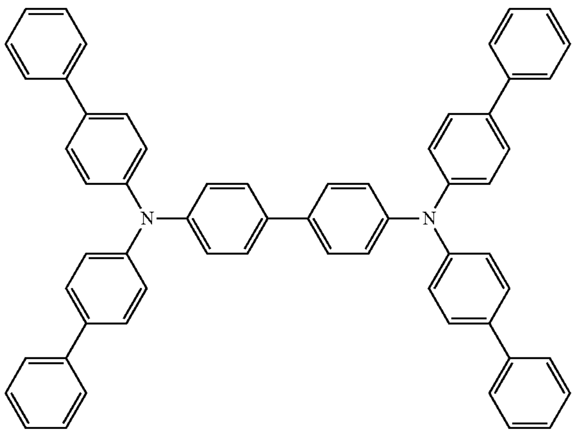

CP4

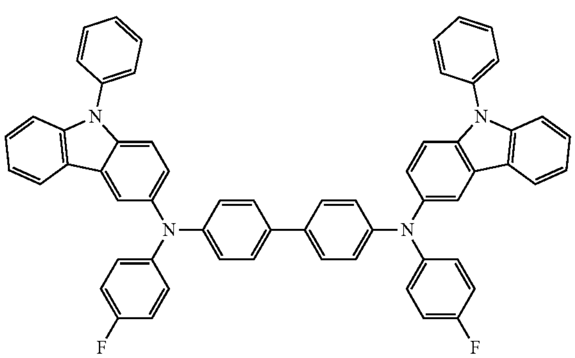

CP5

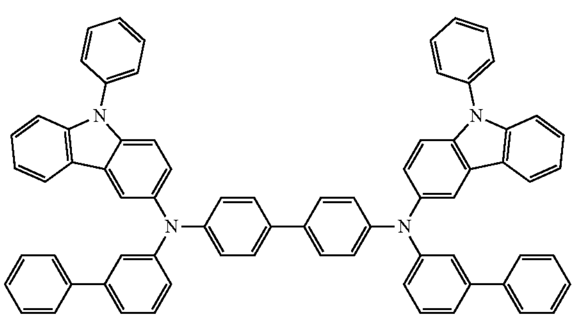

-continued

CP6

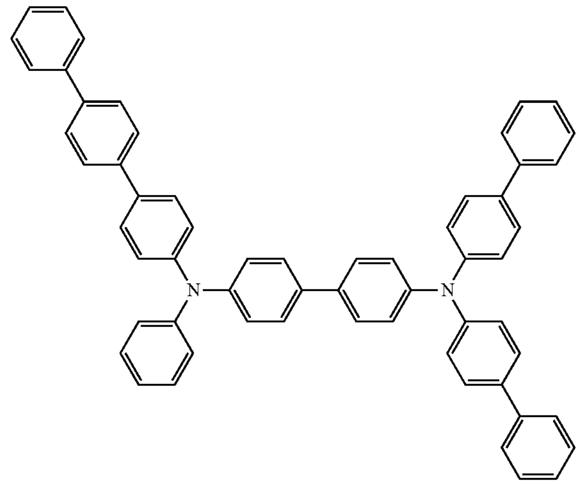

β-NPB

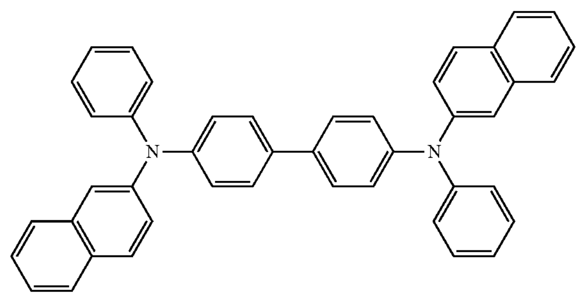

Film

The fused cyclic compound represented by Formula 1 may be included in various films. Thus, according to another aspect, a film including the fused cyclic compound represented by Formula 1 may be provided. The film may be, for example, an optical member (or, a light control member) (for example, a color filter, a color conversion member, a capping layer, a light extraction efficiency enhancement layer, an optional light absorbing layer, a polarizing layer, a quantum dot-containing layers, and the like), a light-blocking member (for example, a light reflective layer, a light absorbing layer, and the like), a protection member (for example, an insulating layers, a dielectric layers, and the like), and the like.

Electronic Apparatus

The light-emitting device 10 may be included in various electronic apparatuses. In one or more embodiments, the electronic apparatuses including the light-emitting device 10 may be a light-emitting apparatus, an authentication apparatus, and the like.

The electronic apparatus (for example, light-emitting apparatus) may further include, in addition to the light-emitting device 10, i) a color filter, ii) a color conversion layer, or iii) a color filter and a color conversion layer. The color filter and/or the color conversion layer may be located in at least one traveling direction of light emitted from the light-emitting device 10. In one or more embodiments, the light emitted from the light-emitting device 10 may be blue light or white light. The light-emitting device 10 may be the same as described above. In one or more embodiments, the color conversion layer may include quantum dots. The quantum dot may be, for example, a quantum dot as described herein. The electronic apparatus may include a first substrate. The first substrate may include a plurality of subpixel areas, the color filter may include a plurality of color filter areas respectively corresponding to the plurality of subpixel areas, and the color conversion layer may include a plurality of color conversion areas respectively corresponding to the plurality of subpixel areas.

A pixel-defining layer may be located among the plurality of subpixel areas to define each of the plurality of subpixel areas. The color filter may further include a plurality of color filter areas and light-shielding patterns located among the plurality of color filter areas, and the color conversion layer may include a plurality of color conversion areas and light-shielding patterns located among the plurality of color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In one or more embodiments, the first color light may be red light, the second color light may be green light, and the third color light may be blue light. In one or more embodiments, the color filter areas (or the color conversion areas) may include quantum dots. In detail, the first area may include a red quantum dot, the second area may include a green quantum dot, and the third area may not include a quantum dot. The quantum dot is the same as described herein. The first area, the second area, and/or the third area may each include a scatterer.

In one or more embodiments, the light-emitting device 10 may emit a first light, the first area may absorb the first light to emit first first-color light, the second area may absorb the first light to emit second first-color light, and the third area may absorb the first light to emit is third first-color light. In this regard, the first first-color light, the second first-color light, and the third first-color light may have different maximum emission wavelengths. In detail, the first light may be blue light, the first first-color light may be red light, the second first-color light may be green light, and the third first-color light may be blue light.

The electronic apparatus may further include a thin-film transistor in addition to the light-emitting device 10 as described above. The thin-film transistor may include a source electrode, a drain electrode, and an activation layer, wherein any one of the source electrode and the drain electrode may be electrically connected to any one of the first electrode and the second electrode of the light-emitting device 10.

The thin-film transistor may further include a gate electrode, a gate insulating film, and the like. The activation layer may include a crystalline silicon, an amorphous silicon, an organic semiconductor, an oxide semiconductor, and the like.

The electronic apparatus may further include a sealing portion for sealing the light-emitting device 10. The sealing portion may be placed between the color filter and/or the color conversion layer and the light-emitting device 10. The sealing portion allows light from the light-emitting device 10 to be extracted to the outside, while simultaneously preventing ambient air and moisture from penetrating into the light-emitting device 10. The sealing portion may be a sealing substrate including a transparent glass substrate or a plastic substrate. The sealing portion may be a thin-film encapsulation layer including at least one organic layer and/or at least one inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, and the like). The authentication apparatus may further include, in addition to the light-emitting device 10, a biometric information collector.

The electronic apparatuses may take the form of or be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
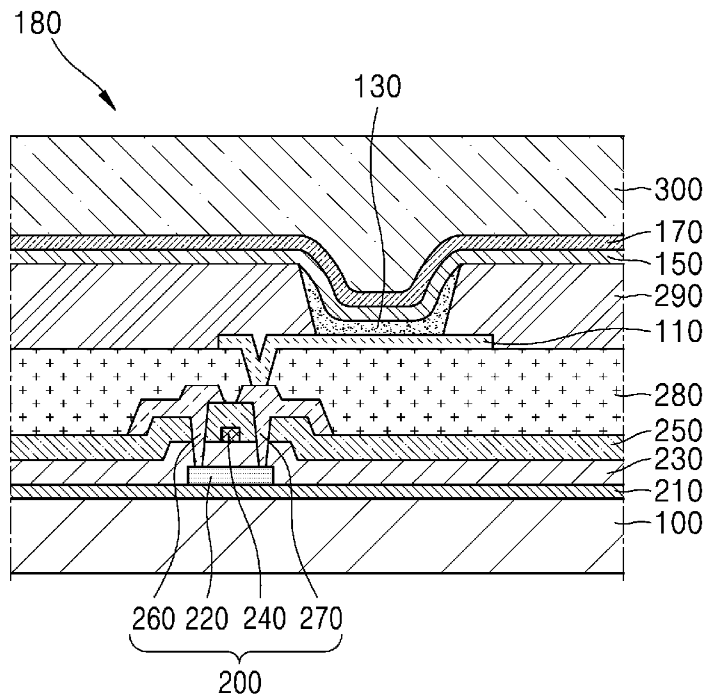
FIG. 2 is a schematic cross-sectional view of an embodiment of a light-emitting apparatus including a light-emitting device constructed according to the principles of the invention.
Figure 3:
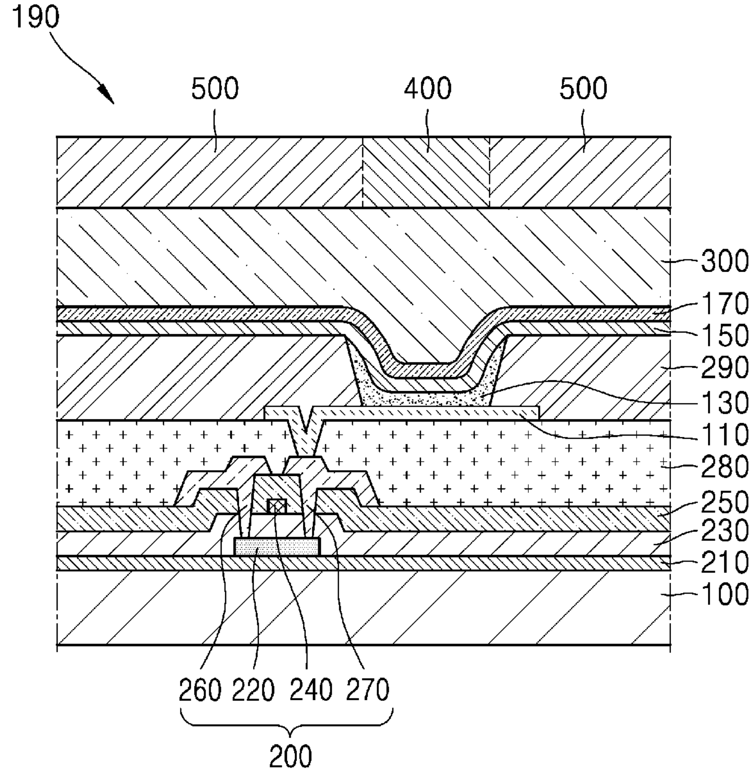
FIG. 3 is a schematic cross-sectional view of another embodiment of a light-emitting apparatus including a light-emitting device constructed according to the principles of the invention.

Description of FIGS. 2 and 3

FIG. 2 is a schematic cross-sectional view of an embodiment of a light-emitting apparatus including a light-emitting device constructed according to the principles of the invention.

The light-emitting apparatus 180 of FIG. 2 includes a substrate 100, a thin-film transistor (TFT) 200, a light-emitting device, and an encapsulation portion 300 that seals the light-emitting device.

The substrate 100 may be a flexible substrate, a glass substrate, and/or a metal substrate. A buffer layer 210 may be formed on the substrate 100. The buffer layer 210 may prevent penetration of impurities through the substrate 100 and may provide a substantially flat surface on the substrate 100. The TFT 200 may be located on the buffer layer 210. The TFT 200 may include an activation layer 220, a gate electrode 240, a source electrode 260, and a drain electrode 270.

The activation layer 220 may include an inorganic semiconductor such as a silicon or a polysilicon, an organic semiconductor, or an oxide semiconductor, and may include a source region, a drain region and a channel region. A gate insulating film 230 for insulating the activation layer 220 from the gate electrode 240 may be located on the activation layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT 200 is electrically connected to a light-emitting device 10 to drive the light-emitting device 10, and is covered by a passivation layer 280. The passivation layer 280 may include an inorganic insulating film, an organic insulating film, or any combination thereof. The light-emitting device 10 is provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and exposes a portion of the drain electrode 270, and the first electrode 110 is connected to the exposed portion of the drain electrode 270.

A pixel defining layer 290 containing an insulating material may be located on the first electrode 110. The pixel defining layer 290 exposes a region of the first electrode 110, and an interlayer 130 may be formed in the exposed region of the first electrode 110. The pixel defining layer 290 may be a polyimide or a polyacrylic organic film. At least some layers of the interlayer 130 may extend beyond the upper portion of the pixel defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device 10 to protect the light-emitting device from moisture or oxygen. The encapsulation portion 300 may include: an inorganic film including a silicon nitride ($SiN_x$), a silicon oxide ($SiO_x$), an indium tin oxide, an indium zinc oxide, or any combination thereof, an organic film including a polyethylene terephthalate, a polyethylene naphthalate, a polycarbonate, a polyimide, a polyethylene sulfonate, a polyoxymethylene, a polyarylate, a hexamethyldisiloxane, an acrylic resin (for example, a polymethyl methacrylate, a polyacrylic acid, and the like), an epoxy-based resin (for example, an aliphatic glycidyl ether (AGE), and the like), or any combination thereof, or any combination of the inorganic film and the organic film.

FIG. 3 is a schematic cross-sectional view of another embodiment of a light-emitting apparatus including a light-emitting device constructed according to the principles of the invention.

The light-emitting apparatus 190 of FIG. 3 is substantially the same as the light-emitting apparatus 180 of FIG. 2, except that a light-shielding pattern 500 and a functional region 400 are additionally located on the encapsulation portion 300. The functional region 400 may be i) a color filter area, ii) a color conversion area, or iii) a combination of the color filter area and the color conversion area. In one or more embodiments, the light-emitting device 10 included in the light-emitting apparatus 190 of FIG. 3 may be a tandem light-emitting device.

Manufacture Method

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

As used herein, the term "interlayer" as used herein refers to a single layer and/or all of a plurality of layers located between a first electrode and a second electrode of a light-emitting device.

As used herein, the wording "an (interlayer and/or capping layer) includes a condensed cyclic compound" may be interpreted as a case in which "an (interlayer and/or capping layer) includes at least one identical fused cyclic compound represented by Formula 1 or an (interlayer and/or capping layer) includes two or more different fused cyclic compounds represented by Formula 1."

As used herein, the "Dexter energy transfer" may refer to short-range, collisional, or exchange energy transfer that is a non-radiative process with electron exchange.

The term "$C_3$-$C_{60}$ carbocyclic group" as used herein refers to a cyclic group consisting of carbon only as a ring-forming atom and having three to sixty carbon atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are fused with each other. For example, the $C_1$-$C_{60}$ heterocyclic group has 3 to 61 ring-forming atoms.

As used herein, the term "thermal activated delayed fluorescence" may be abbreviated "TADF".

As described herein, a quantum dot refers to a crystal of a semiconductor compound, and may include any material capable of emitting light of various emission wavelengths according to the size of the crystal.

As used herein, the term "atom" may mean an element or its corresponding radical bonded to one or more other atoms.

The terms "hydrogen" and "deuterium" refer to their respective atoms and corresponding radicals with the deuterium radical abbreviated "-D", and the terms "—F, —Cl, —Br, and —I" are radicals of, respectively, fluorine, chlorine, bromine, and iodine.

As used herein, a substituent for a monovalent group, e.g., alkyl, may also be, independently, a substituent for a corresponding divalent group, e.g., alkylene.

The "cyclic group" as used herein may include the $C_3$-$C_{60}$ carbocyclic group, and the $C_1$-$C_{60}$ heterocyclic group.

The term "n electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) a group TG1 or ii) a fused cyclic group in which two or more groups TG1 are fused with each other, for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spirobifluorene group, a benzofluorene group, an indenophenanthrene group, or an indenoanthracene group).

The $C_1$-$C_{60}$ heterocyclic group may be i) a group TG2, ii) a fused cyclic group in which two or more groups TG2 are fused with each other, or iii) a fused cyclic group in which at least one group TG2 and at least one group TG1 are fused with each other, for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like.

The π electron-rich $C_3$-$C_{60}$ cyclic group may be i) a group TG1, ii) a fused cyclic group in which two or more groups TG1 are fused with each other, iii) a group TG3, iv) a fused cyclic group in which two or more groups TG3 are fused with each other, or v) a fused cyclic group in which at least one group TG3 and at least one group TG1 are fused with each other, for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, and the like.

The n electron-deficient nitrogen-containing $C_1$-$C_{60}$ cyclic group may be i) a group TG4, ii) a fused cyclic group in which two or more groups TG4 are fused with each other, iii) a fused cyclic group in which at least one group TG4 and at least one group TG1 are fused with each other, iv) a fused cyclic group in which at least one group TG4 and at least one group TG3 are fused with each other, or v) a fused cyclic group in which at least one group TG4, at least one group TG1, and at least one group TG3 are fused with one another, for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like.

The group TG1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group.

The group TG2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group.

The group TG3 may be a furan group, a thiophene group, a 1H-pyrrole group, a silole group, or a borole group.

The group TG4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group fused to any cyclic group or a polyvalent group (for example, a divalent group, a trivalent group, a tetravalent group, and the like), depending on the structure of a formula in connection with which the terms are used. In one or more embodiments, "a benzene group" may be a benzene ring, a phenyl group, a phenylene group, and the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, and a monovalent non-aromatic fused heteropolycyclic group, and examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic fused polycyclic group, and a substituted or unsubstituted divalent non-aromatic fused heteropolycyclic group.

The term "$C_1$-$C_{60}$ alkyl group" as used herein refers to a linear or a branched aliphatic hydrocarbon monovalent group that has one to sixty carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof are an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{10i}$(wherein $A_{10i}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantyl group, a norbornyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof are a 1,2,3,4-oxatriazolidinyl group, a tetrahydrofuranyl group, and a tetrahydrothienyl group. The term "$C_1$-$C_{10}$ heterocycloalkylene group" as used herein refers to a divalent group having a structure corresponding to the $C_1$-$C_{10}$ heterocycloalkyl group.

The term $C_3$-$C_{10}$ cycloalkenyl group used herein refers to a monovalent cyclic group that has three to ten carbon atoms and at least one carbon-carbon double bond in the ring thereof and no aromaticity, and examples thereof are a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothienyl group. The term "$C_1$-$C_{10}$ heterocycloalkenylene group" as used herein refers to a divalent group having a structure corresponding to the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be fused with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be fused with each other.

The monovalent non-aromatic fused polycyclic group used herein includes two or more rings fused with each other, and contains only carbon (for example, having 8 to 60 carbon atoms) as a ring-forming atom. When the entire molecular structure is taken into consideration, the monovalent non-aromatic fused polycyclic group refers to a monovalent group having non-aromaticity. Examples of the monovalent non-aromatic fused polycyclic group are an indenyl group, a fluorenyl group, a spiro-bifluorenyl group, a benzofluorenyl group, an indenophenanthrenyl group, and an indeno anthracenyl group. The term "divalent non-aromatic fused polycyclic group" as used herein refers to a divalent group having a structure corresponding to a monovalent non-aromatic fused polycyclic group.

The monovalent non-aromatic fused heteropolycyclic group used herein includes two or more rings fused with each other, and contains, as a ring-forming atom, in addition to carbon atoms (for example, having 1 to 60 carbon atoms), at least one heteroatom. When the entire molecular structure is taken into consideration, the monovalent non-aromatic fused heteropolycyclic group refers to a monovalent group having non-aromaticity. Examples of the monovalent non-aromatic fused heteropolycyclic group are an azaadamantyl group and a 9H-xanthenyl group. The term "divalent non-aromatic fused heteropolycyclic group" as used herein refers to a divalent group having a structure corresponding to a monovalent non-aromatic fused heteropolycyclic group.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$C_7$-$C_{60}$ aryl alkyl group" as used herein refers to a monovalent group represented by -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" used herein refers to a monovalent group represented by -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as used herein refers to:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof, or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

The variables $Q_1$ to $Q_3$, $Q_{11}$ to $Q_{13}$, $Q_{21}$ to $Q_{23}$ and $Q_{31}$ to $Q_{33}$ as used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, a $C_7$-$C_{60}$ aryl alkyl group; or a $C_2$-$C_{60}$ heteroaryl alkyl group.

The term "heteroatom" as used herein refers to any atom other than a carbon atom. Examples of the heteroatom are O, S, N, P, Si, B, Ge, Se, and any combination thereof.

The term "the third-row transition metal" used herein includes hafnium (Hf), tantalum (Ta), tungsten (W), rhenium (Re), osmium (Os), iridium (Ir), platinum (Pt), gold (Au), and the like.

As used herein, the term "Ph" refers to a phenyl group, the term "Me" refers to a methyl group, the term "Et" refers to an ethyl group, the term "tert-Bu" or "But" refers to a tert-butyl group, and the term "OMe" refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

The term "CuI" as used herein refers to copper (I) iodide, and the term "o-DCB" as used herein refers to ortho-dichlorobenzene.

The abbreviation "equiv." means "mole equivalent".

The symbols * and *' as used herein, unless defined otherwise, each refer to a binding site to a neighboring atom in a corresponding formula or moiety.

Hereinafter, a compound according to the principles and embodiments of the invention and a light-emitting device according to the principles and embodiments of the invention will be described in detail with reference to Synthesis Examples and Examples. The wording "B was used instead of A" used in describing Synthesis Examples refers to that an identical molar equivalent of B was used in place of A.

EXAMPLES

Synthesis Example 1: Synthesis of Compound 11

Compound 11 according to an embodiment may be synthesized through, for example, Reaction Scheme 1.

Reaction Scheme 1
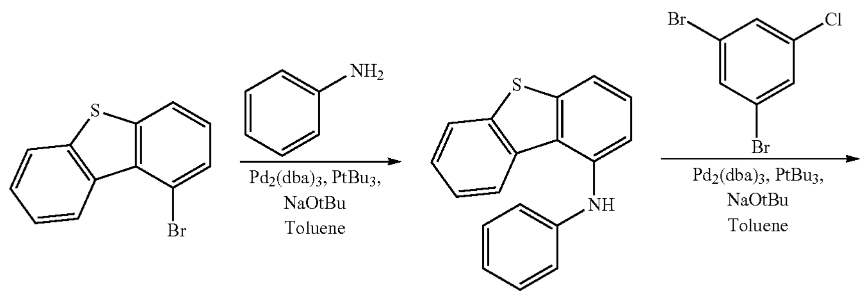
11-1
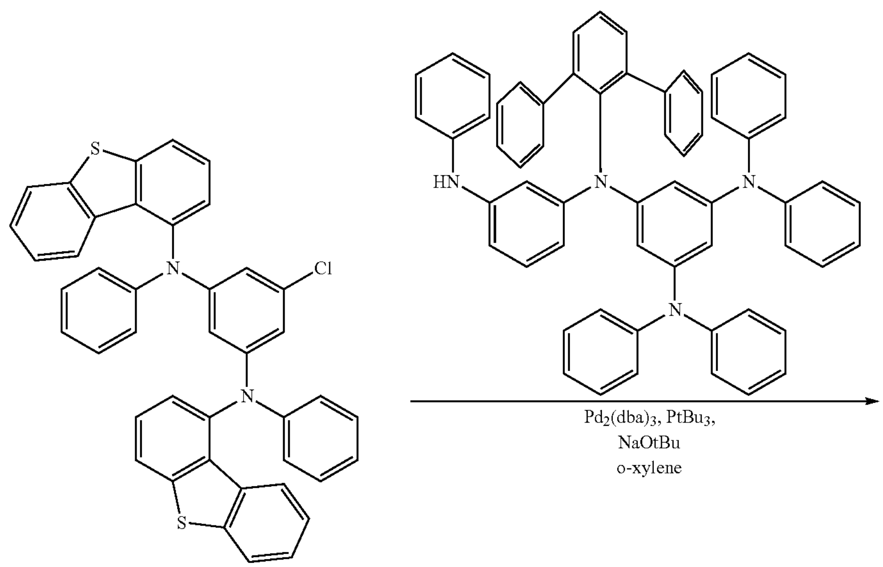
11-2
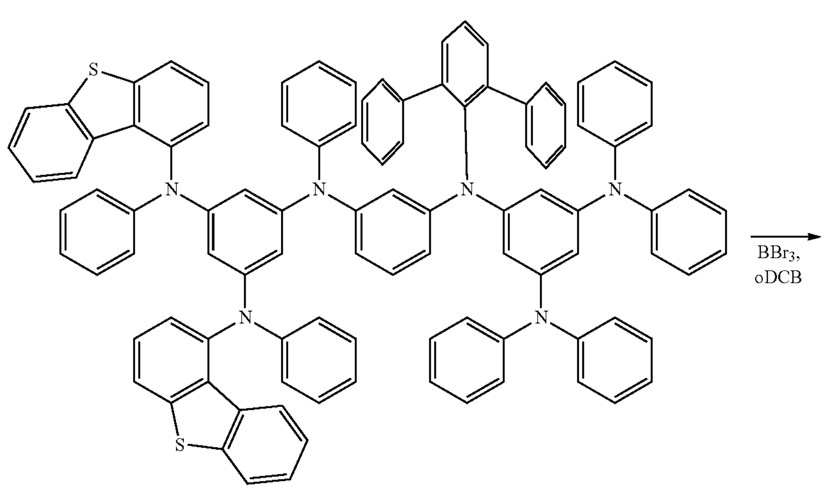
11-3

-continued

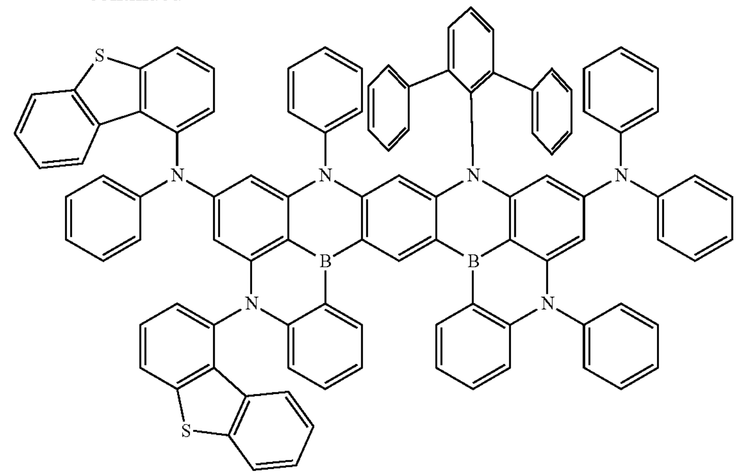

11

(1) Synthesis of Intermediate 11-1

1-bromodibenzo[b,d]thiophene (1 equiv.), aniline (2.1 equiv.), tris(dibenzylideneacetone)dipalladium(0) (0.1 equiv.), tri-tert-butylphosphine (0.2 equiv.), and sodium tert-butoxide (3 equiv.) were dissolved in toluene and then, in a nitrogen atmosphere, stirred at a temperature of 110° C. for 8 hours. Then, the reaction mixture was cooled and dried under reduced pressure to remove toluene therefrom. Afterwards, an organic layer obtained by washing the resultant product using ethyl acetate and water, three times for each, was dried using $MgSO_4$ and then dried under reduced pressure. A purification process by column chromatography and a recrystallization process were performed thereon (solvent:dichloromethane:n-Hexane) to obtain Intermediate 11-1. (yield: 73%)

(2) Synthesis of Intermediate 11-2

Intermediate 11-1 (2.1 equiv.), 3,5-dibromophenol (1 equiv.), tris(dibenzylideneacetone)dipalladium(0) (0.1 equiv.), tri-tert-butylphosphine (0.2 equiv.), and sodium tert-butoxide (4 equiv.) were dissolved in toluene and then, in a nitrogen atmosphere, stirred at a temperature of 110° C. for 12 hours. Then, the reaction mixture was cooled and dried under reduced pressure to remove toluene therefrom. Afterwards, an organic layer obtained by washing the resultant product using ethyl acetate and water, three times for each, was dried using $MgSO_4$ and then dried under reduced pressure. The, a purification process by column chromatography and a recrystallization process were performed thereon (solvent:dichloromethane:n-Hexane) to obtain Intermediate 11-2. (yield: 64%)

(3) Synthesis of Intermediate 11-3

Intermediate 11-2 (1 equiv.), N1-([1,1':3',1"-terphenyl]-2'-yl)-N3,N3,N5,N5-tetraphenyl-N1-(3-(phenylamino)phenyl)benzene-1,3,5-triamine (1.2 equiv.), Tris(dibenzylideneacetone)dipalladium(0) (0.1 equiv.), Tri-tert-butylphosphine (0.2 equiv.) and Sodium tert-butoxide (4 equiv.) were dissolved in o-xylene, and then, stirred at a temperature of 150° C. for 20 hours. Then, the reaction mixture was cooled and dried under reduced pressure to remove o-xylene therefrom. Afterwards, an organic layer obtained by washing the resultant product using ethyl acetate and water, was dried using $MgSO_4$ and then dried under reduced pressure. The, a purification process by column chromatography and a recrystallization process were performed thereon (solvent:dichloromethane:n-Hexane) to obtain Intermediate 11-3. (yield: 57%)

(4) Synthesis of Compound 11

After Intermediate 11-3 (1 equiv.) was dissolved in ortho-dichlorobenzene, a flask was cooled to 0° C. in a nitrogen atmosphere, and boron tribromide ($BBr_3$ in amount of 3 equiv.) was slowly injected therein. After completion of the dropping, the temperature was raised to 190° C. and stirred for 24 hours. Subsequently, after cooling to 0° C., triethylamine was slowly dropped into the flask until the exotherm stopped to terminate the reaction. Afterwards, hexane was added to precipitate and the solid was filtered therefrom to obtain a solid content. The obtained solid was purified by silica filtration, and then purified by recrystallization using a methylene chloride and n-hexane (MC/Hex) mixed solvent to obtain Compound 11. Then, the final purification was performed thereon by sublimation purification. (Yield after sublimation: 3.3%)

Synthesis Example 2: Synthesis of Compound 35

Compound 35 according to an embodiment may be synthesized through, for example, Reaction Scheme 2.

Reaction Scheme 2
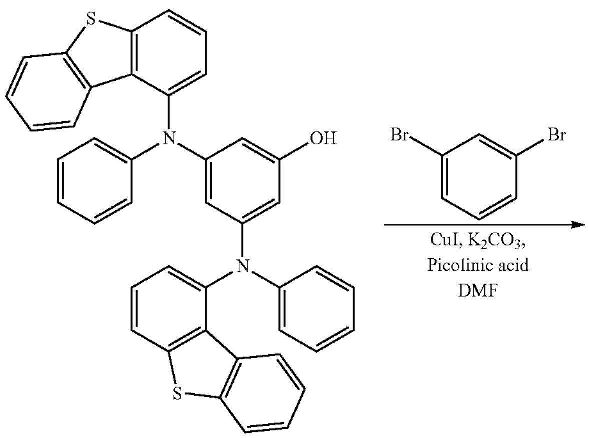
11-2
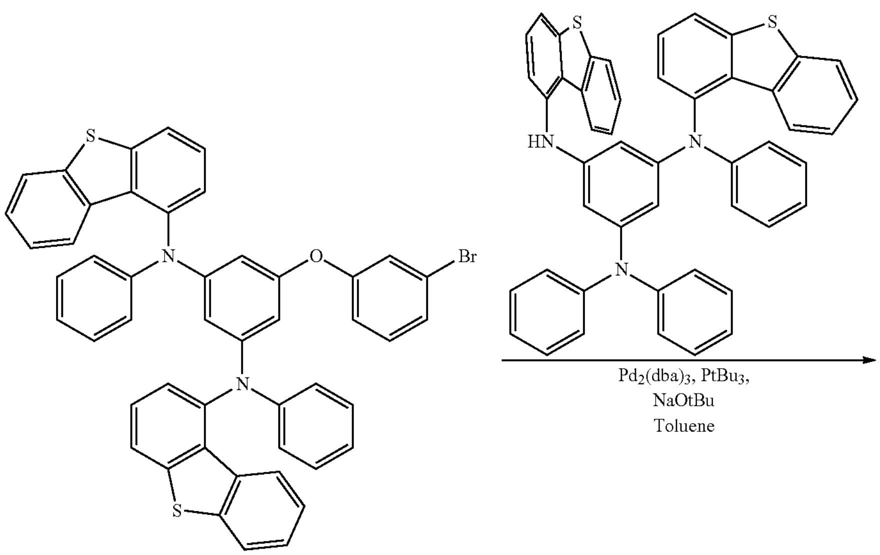
35-1
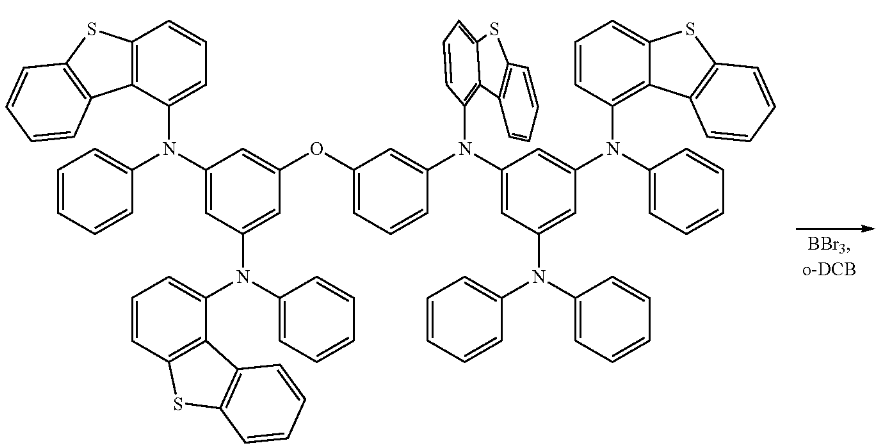
35-2

-continued

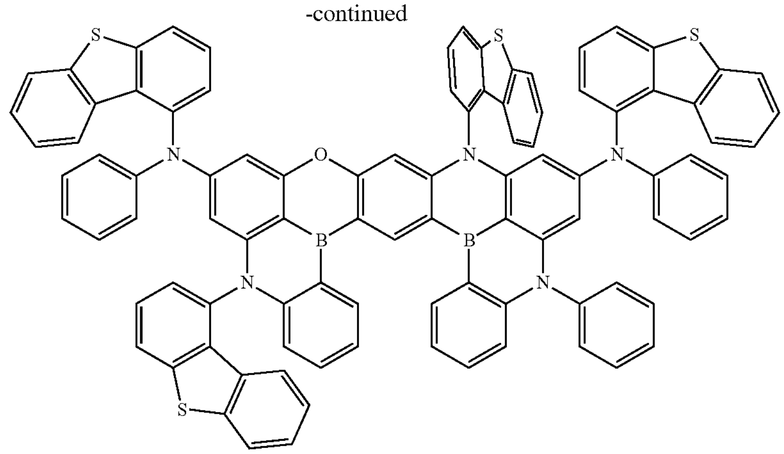

35

(1) Synthesis of Intermediate 35-1

Intermediate 11-2 (1 equiv.), 1,3-dibromobenzene (1 equiv.), CuI (0.5 equiv.), $K_2CO_3$ (3 equiv.), and picolinic acid (0.5 equiv.) were dissolved in DMF and then, stirred at a temperature of 160° C. for 20 hours. Then, the reaction mixture was cooled and dried under reduced pressure to remove DMF therefrom. Afterwards, an organic layer obtained by washing the resultant product using dichloromethane and water, was dried using $MgSO_4$ and then dried under reduced pressure. The, a purification process by column chromatography and a recrystallization process were performed thereon (solvent:dichloromethane:n-Hexane) to obtain Intermediate 35-1. (yield: 65%)

(2) Synthesis of Intermediate 35-2

Intermediate 35-1 (1 equiv.), N1,N3-bis(dibenzo[b,d]thiophen-1-yl)-N1,N5,N5-triphenylbenzene-1,3,5-triamine (1 equiv.), tris(dibenzylideneacetone)dipalladium (0) (0.05 equiv.), tri-tert-butylphosphine (0.1 equiv.), and sodium tert-butoxide (3 equiv.) were dissolved in toluene, and then, stirred in a nitrogen atmosphere at a temperature of 110° C. for 12 hours. Then, the reaction mixture was cooled and dried under reduced pressure to remove toluene therefrom. Afterwards, an organic layer obtained by washing the resultant product using ethyl acetate and water, three times for each, was dried using $MgSO_4$ and then dried under reduced pressure. The, a purification process by column chromatography and a recrystallization process were performed thereon (solvent:dichloromethane:n-Hexane) to obtain Intermediate 35-2. (yield: 64%)

(3) Synthesis of Compound 35

After Intermediate 35-2 (1 equiv.) was dissolved in ortho-dichlorobenzene, a flask was cooled to 0° C. in a nitrogen atmosphere, and $BBr_3$ (4 equiv.) was slowly injected thereinto. After completion of the dropping, the temperature was raised to 190° C. and stirred for 24 hours. Subsequently, after cooling to 0° C., triethylamine was slowly dropped into the flask until the exotherm stopped to terminate the reaction. Afterwards, hexane was added to precipitate and the solid was filtered therefrom to obtain a solid content. The obtained solid was purified by silica filtration, and then purified by recrystallization using an MC/Hex mixed solvent to obtain Compound 35. Then, the final purification was performed thereon by sublimation purification. (Yield after sublimation: 3.3%)

Synthesis Example 3: Synthesis of Compound 55

Compound 55 according to an embodiment may be synthesized through, for example, Reaction Scheme 3.

Reaction Scheme 3

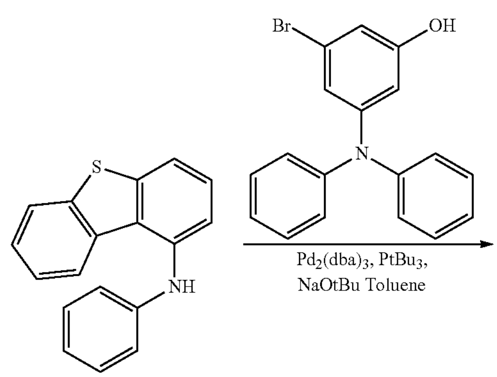

11-1

-continued

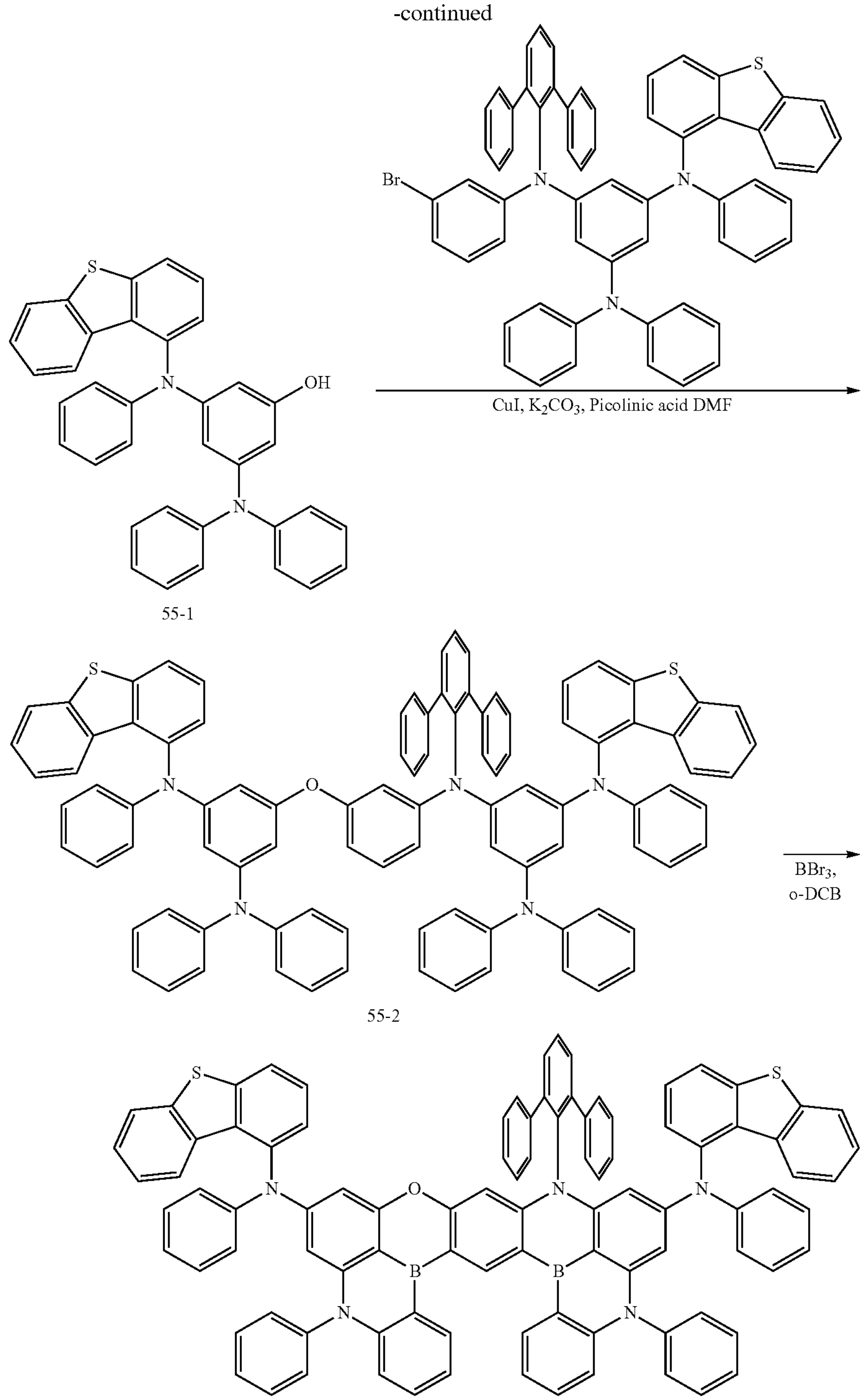

55-1

55-2

55

(1) Synthesis of Intermediate 55-1

Intermediate 11-1 (1 equiv.), 3-bromo-5-(diphenylamino) phenol (1 equiv.), tris(dibenzylideneacetone)dipalladium(0) (0.1 equiv.), tri-tert-butylphosphine (0.2 equiv.), and sodium tert-butoxide (3 equiv.) were dissolved in toluene and then, in a nitrogen atmosphere, stirred at a temperature of 110° C. for 12 hours. Then, the reaction mixture was cooled and dried under reduced pressure to remove toluene therefrom. Afterwards, an organic layer obtained by washing the resultant product using ethyl acetate and water, three times for each, was dried using $MgSO_4$ and then dried under reduced pressure. The, a purification process by column chromatography and a recrystallization process were performed thereon (solvent:dichloromethane:n-Hexane) to obtain Intermediate 55-1. (yield: 71%)

(2) Synthesis of Intermediate 55-2

Intermediate 55-1 (1 equiv.), N1-([1,1':3',1"-terphenyl]-2'-yl)-N1-(3-bromophenyl)-N3-(dibenzo[b,d]thiophen-1- yl)-N3,N5,N5-triphenylbenzene-1,3,5-triamine (1.2 equiv.), CuI (0.4 equiv.), $K_2CO_3$ (3 equiv.), and picolinic acid (0.4 equiv.) were dissolved in DMF, and then, stirred at a temperature of 160° C. for 20 hours. Then, the reaction mixture was cooled and dried under reduced pressure to remove DMF therefrom. Afterwards, an organic layer obtained by washing the resultant product using ethyl acetate and water, was dried using $MgSO_4$ and then dried under reduced pressure. The, a purification process by column chromatography and a recrystallization process were performed thereon (dichloromethane:n-Hexane) to obtain Intermediate 55-2. (yield: 61%)

(3) Synthesis of Compound 55

After Intermediate 55-2 (1 equiv.) was dissolved in ortho-dichlorobenzene, a flask was cooled to 0° C. in a nitrogen atmosphere, and $BBr_3$ (4 equiv.) was slowly injected thereinto. After completion of the dropping, the temperature was raised to 190° C. and stirred for 24 hours. Subsequently, after cooling to 0° C., triethylamine was slowly dropped into the flask until the exotherm stopped to terminate the reaction. Afterwards, hexane was added to precipitate and the solid was filtered therefrom to obtain a solid content. The obtained solid was purified by silica filtration, and then purified by recrystallization using an MC/Hex mixed solvent to obtain Compound 55. Then, the final purification was performed thereon by sublimation purification. (Yield after sublimation: 2.1%)

Synthesis Example 4: Synthesis of Compound 83

Compound 83 according to an embodiment may be synthesized through, for example, Reaction Scheme 4.

Reaction Scheme 4

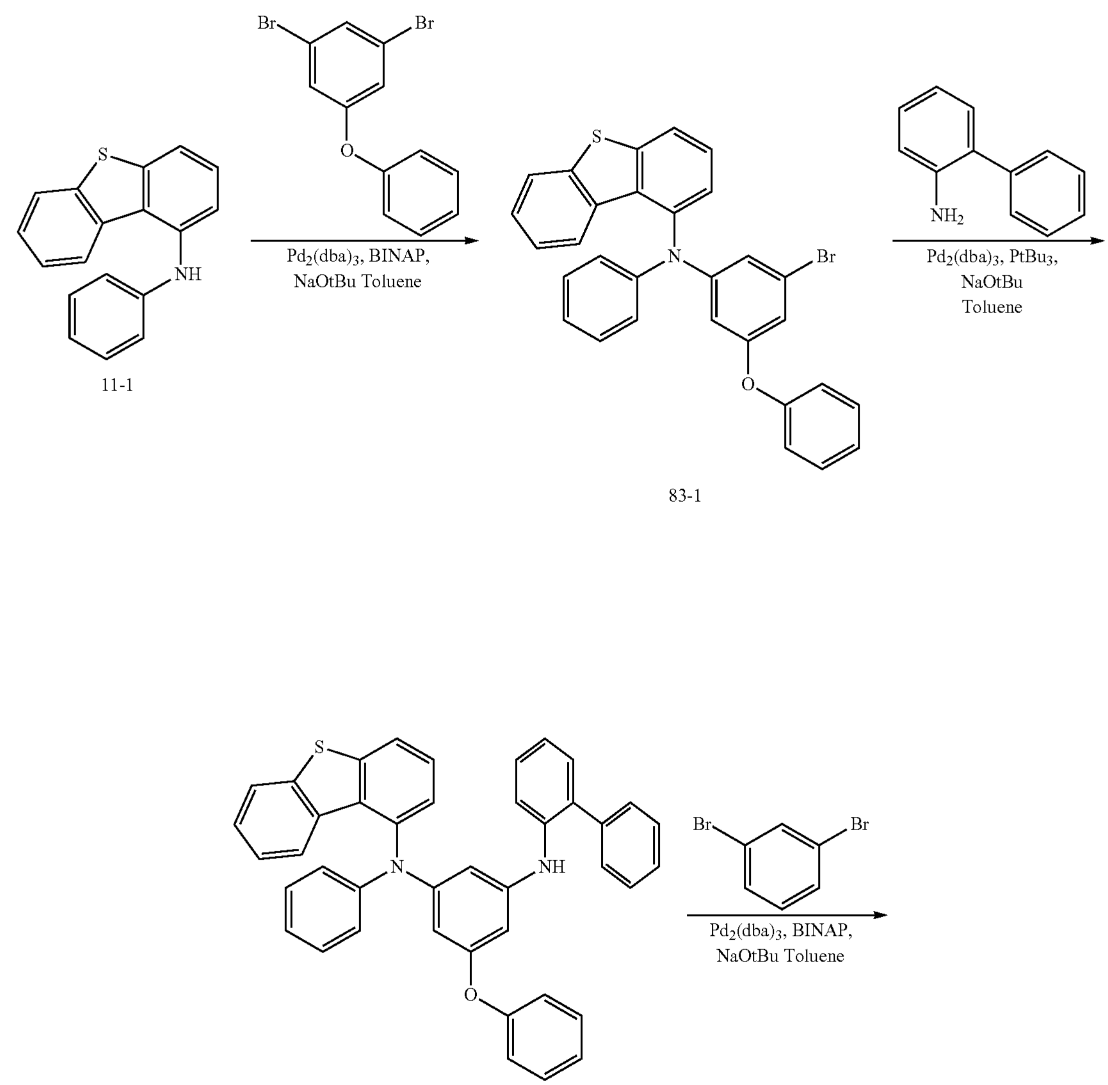

11-1

83-1

83-2

-continued

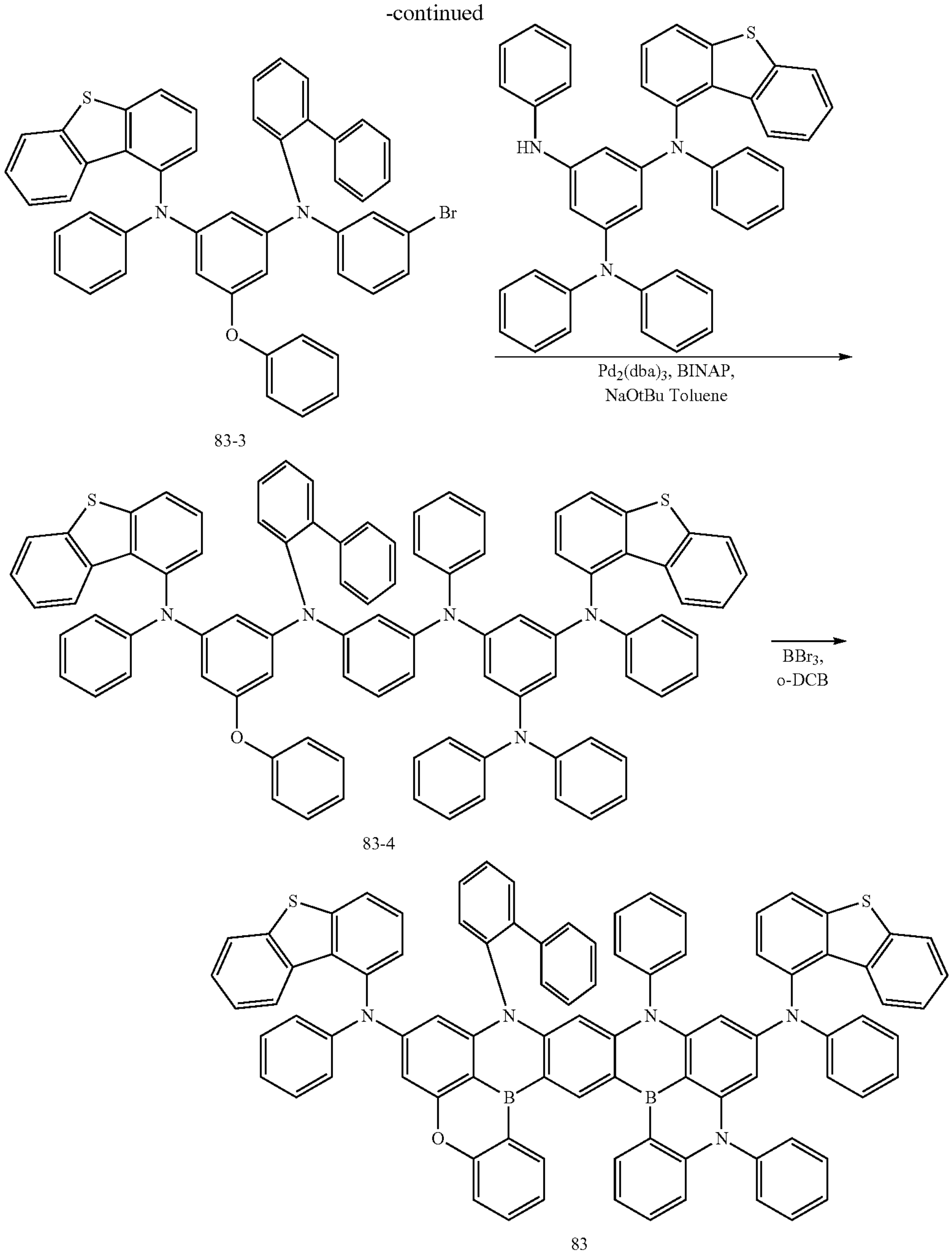

(1) Synthesis of Intermediate 83-1

Intermediate 11-1 (1 equiv.), 1,3-dibromo-5-phenoxybenzene (1 equiv.), tris(dibenzylideneacetone)dipalladium (0) (0.05 equiv.), 2,2'-Bis(diphenylphosphino)-1,1'-binaphthyl (BINAP in an amount of 0.1 equiv.), and sodium tert-butoxide (3 equiv.) were dissolved in toluene, and then, stirred in a nitrogen atmosphere at a temperature of 80° C. for 20 hours. Then, the reaction mixture was cooled and dried under reduced pressure to remove toluene therefrom. Afterwards, an organic layer obtained by washing the resultant product using ethyl acetate and water, three times for each, was dried using $MgSO_4$ and then dried under reduced pressure. The, a purification process by column chromatography and a recrystallization process were performed thereon (solvent:dichloromethane:n-Hexane) to obtain Intermediate 83-1. (yield: 60%)

(2) Synthesis of Intermediate 83-2

Intermediate 83-1 (1 equiv.), [1,1'-biphenyl]-2-amine (1.1 equiv.), tris(dibenzylideneacetone)dipalladium(0) (0.05 equiv.), tri-tert-butylphosphine (0.1 equiv.), and sodium tert-butoxide (3 equiv.) were dissolved in toluene and then, stirred in a nitrogen atmosphere at a temperature of 110° C. for 12 hours. Then, the reaction mixture was cooled and dried under reduced pressure to remove toluene therefrom. Afterwards, an organic layer obtained by washing the resultant product using ethyl acetate and water, three times for each, was dried using $MgSO_4$ and then dried under reduced pressure. The purification process by column chromatography and a recrystallization process were performed thereon (solvent:dichloromethane:n-Hexane) to obtain Intermediate 83-2. (yield: 62%)

(3) Synthesis of Intermediate 83-3

Intermediate 83-2 (1 equiv.), 1,3-dibromobenzene (1 equiv.), tris(dibenzylideneacetone)dipalladium (0) (0.05 equiv.), BINAP (0.1 equiv.), and sodium tert-butoxide (3 equiv.) were dissolved in toluene, and then, stirred in a nitrogen atmosphere at a temperature of 100° C. for 20 hours. Then, the reaction mixture was cooled and dried under reduced pressure to remove toluene therefrom. Afterwards, an organic layer obtained by washing the resultant product using ethyl acetate and water, three times for each, was dried using $MgSO_4$ and then dried under reduced pressure. The, a purification process by column chromatography and a recrystallization process were performed thereon (solvent:dichloromethane:n-Hexane) to obtain Intermediate 83-3. (yield: 77%)

(4) Synthesis of Intermediate 83-4

Intermediate 83-3 (1 equiv.), N1-(dibenzo[b,d]thiophen-1-yl)-N1,N3,N3,N5-tetraphenylbenzene-1,3,5-triamine (1.1 equiv.), tris(dibenzylideneacetone)dipalladium(0) (0.05 equiv.), tri-tert-butylphosphine (0.1 equiv.), and sodium tert-butoxide (3 equiv.) were dissolved in toluene, and then, stirred in a nitrogen atmosphere at a temperature of 110° C. for 20 hours. Then, the reaction mixture was cooled and dried under reduced pressure to remove toluene therefrom. Afterwards, an organic layer obtained by washing the resultant product using ethyl acetate and water, three times for each, was dried using $MgSO_4$ and then dried under reduced pressure. The, a purification process by column chromatography and a recrystallization process were performed thereon (solvent:dichloromethane:n-Hexane) to obtain Intermediate 83-4. (yield: 66%)

(5) Synthesis of Compound 83

After Intermediate 83-4 (1 equiv.) was dissolved in ortho-dichlorobenzene, a flask was cooled to 0° C. in a nitrogen atmosphere, and $BBr_3$ (4 equiv.) was slowly injected thereinto. After completion of the dropping, the temperature was raised to 150° C. and stirred for 24 hours. Subsequently, after cooling to 0° C., triethylamine was slowly dropped into the flask until the exotherm stopped to terminate the reaction. Afterwards, hexane was added to precipitate and the solid was filtered therefrom to obtain a solid content. The obtained solid was purified by silica filtration, and then purified by recrystallization using an MC/Hex mixed solvent to obtain Compound 83. Then, the final purification was performed thereon by sublimation purification. (yield after sublimation: 1.5%)

The molecular weight and $^1$H NMR analysis results of the compounds synthesized according to Synthesis Examples 1 to 4 are shown in Table 1.

Proton nuclear magnetic resonance ($^1$H NMR) and mass spectroscopy/fast atom bombardment (MS/FAB) of the compounds synthesized according to Synthesis Examples above are shown in Table 1.

TABLE 1

| Compound | $^1$H NMR (δ) | MS/FAB Calc | MS/FAB Found |
|---|---|---|---|
| 11 | 10.21 (1H, s) 9.23 (1H, d), 9.15 (1H, s), 7.97 (2H, d), 7.62-7.45 (12H, m), 7.40-7.22 (28H, m), 7.12-6.86 (17H, m), 6.84 (2H, d), 5.75 (2H, d) | 1461.43 | 1461.80 |
| 35 | 10.1 (1H, s), 9.32 (1H, d), 9.16 (1H, d), 7.86-7.75 (4H, m), 7.65-7.42 (28H, m), 7.01-6.60 (26H, d), 6.52 (1H, s), 5.81 (1H, s) 5.75 (2H, d) | 1446.41 | 1446.91 |
| 55 | 10.09 (1H, s), 9.27 (1H, d), 9.19 (1H, s), 7.76 (2H, d), 7.67-7.35 (23H, m), 7.13-6.78 (29H, m), 6.33 (1H, s), 5.82 (1H, s) 5.87 (2H, d) | 1386.32 | 1386.87 |
| 83 | 10.26 (1H, s), 9.19 (1H, d), 9.05 (1H, d), 7.89 (2H, d), 7.65-7.38 (21H, m), 7.23-6.81 (27H, m), 6.43 (2H, d), 5.94 (2H, d) | 1310.22 | 1310.54 |

Example 1

As an anode, a 15 Ω/cm$^2$ (1,200 Å) ITO glass substrate obtained from Corning Inc. of Corning, New York was cut to a size of 50 mm×50 mm×0.7 mm, sonicated with isopropyl alcohol and pure water each for 5 minutes, and then cleaned by exposure to ultraviolet rays and ozone for 30 minutes. The ITO glass substrate was provided to a vacuum deposition apparatus.

The compound NPD was vacuum-deposited on the ITO anode formed on the glass substrate to form a hole injection layer having a thickness of 300 Å, and then, Compound HT6 was vacuum-deposited on the hole injection layer to form a hole transport layer having a thickness of 200 Å.

A hole-transporting compound 9-(4-tert-Butylphenyl)-3,6-bis(triphenylsilyl)-9H-carbazole (CzSi) was vacuum deposited on the hole transport layer to form an emission auxiliary layer having a thickness of 100 Å.

The compounds mCP(host) and Compound 11 (dopant) were co-deposited at the weight ratio of 99:1 on the emission auxiliary layer to form an emission layer having a thickness of 200 Å.

Then, the compound Diphenyl[4-(triphenylsilyl)phenyl] phosphine oxide (TSPO1) was deposited on the emission layer to form an electron transport layer having a thickness of 200 Å, and then, electron-transporting compound 2,2',2"-(1,3,5-Benzinetriyl)-tris(1-phenyl-1-H-benzimidazole) (TPBi) was deposited on the electron transport layer to form a buffer layer having a thickness of 300 Å.

The compound lithium fluoride (LiF) was deposited on the buffer layer to form an electron injection layer having a thickness of 10 Å, and Al was vacuum-deposited thereon to form a LiF/Al electrode having a thickness of 3000 Å, thereby completing the manufacture of a light-emitting device.

NPD

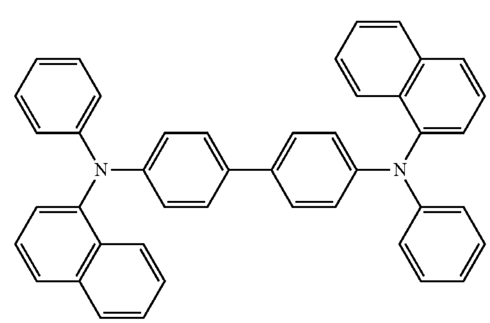

-continued
HT6
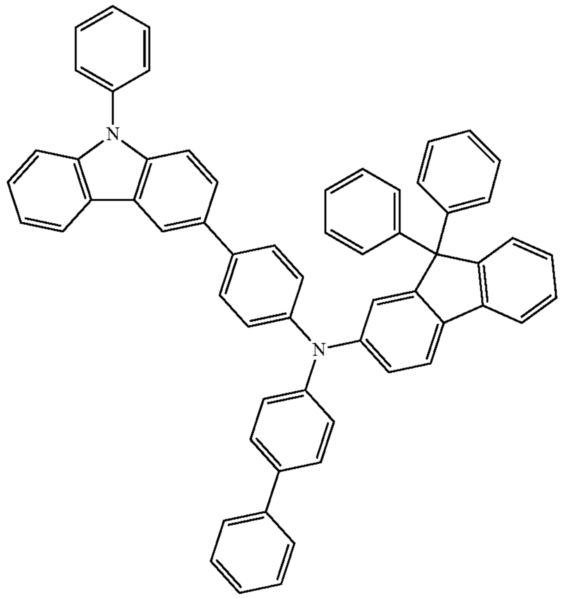
CzSi
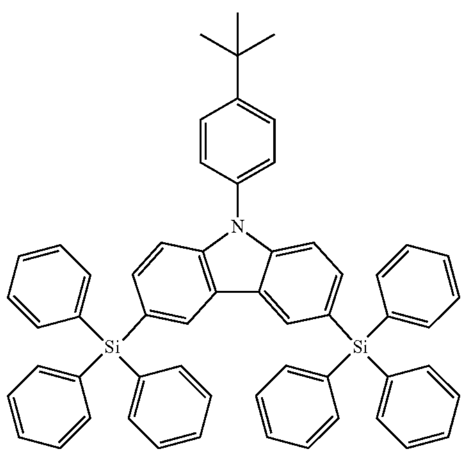
-continued
mCP
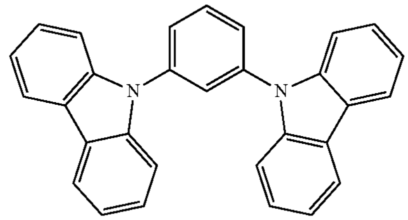
TSPO1
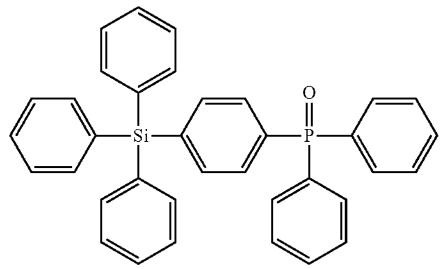
TPBi
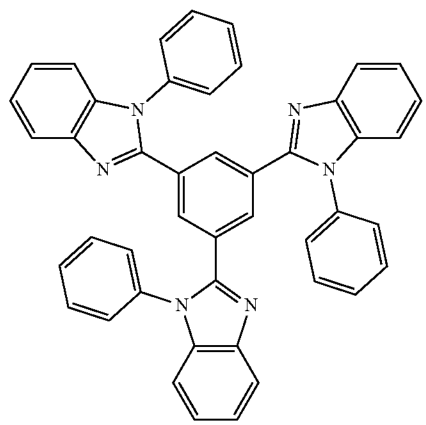
Examples 2 to 4
A light-emitting device was manufactured in the same manner as in Example 1, except that Compounds 35, 55, and 83 were used instead of Compound 11 when forming the emission layer.
35
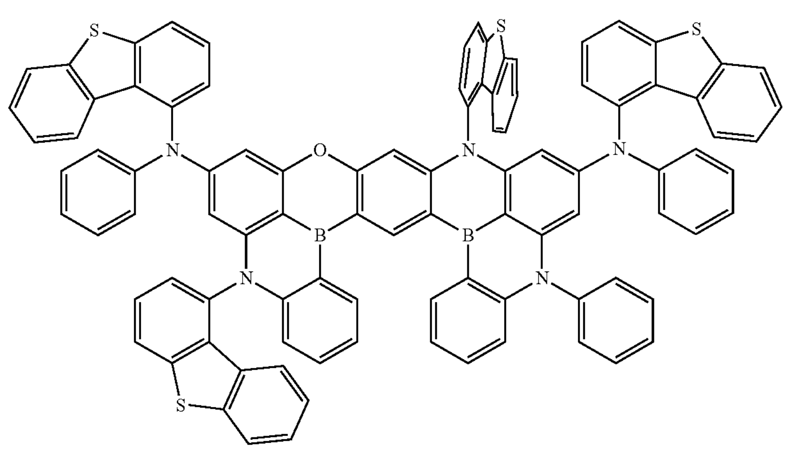

-continued
55
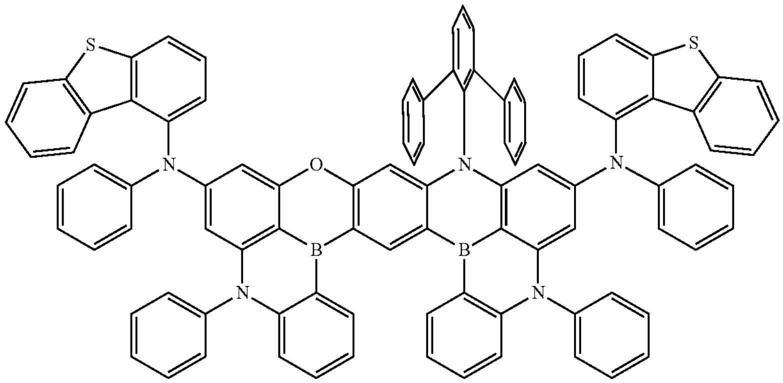
83
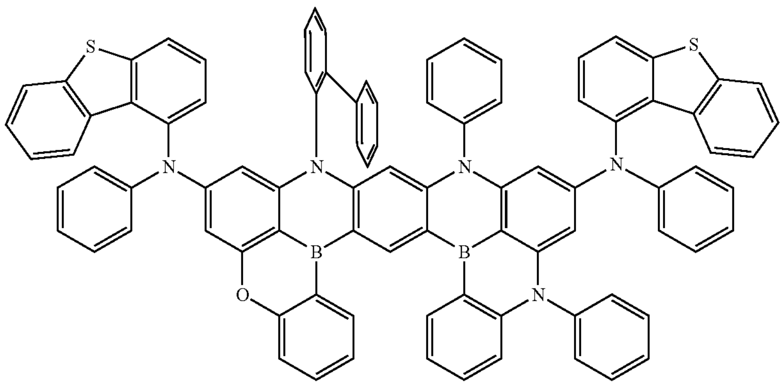
Comparative Examples 1 to 4
A light-emitting device was manufactured in the same manner as in Example 1, except that Compounds C1, C2, C3, and C4 were used instead of Compound 11 when forming the emission layer.
C1
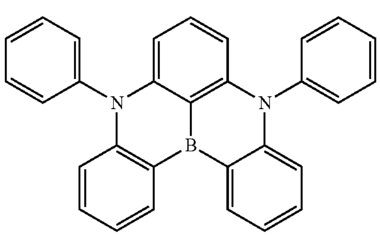
C2
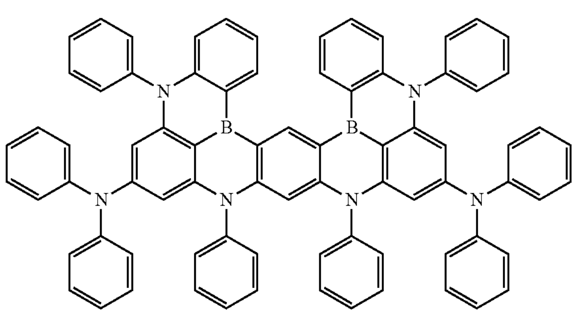
-continued
C3
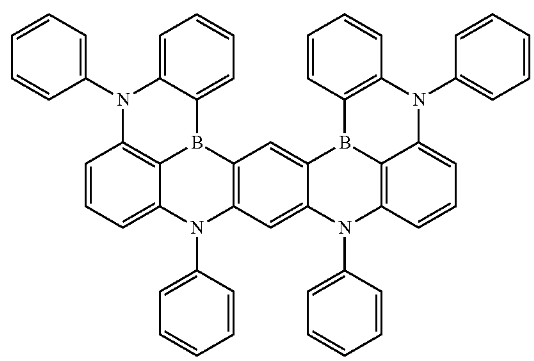
C4
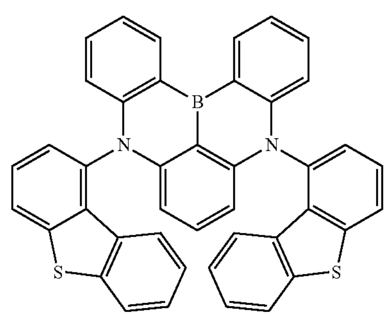

Evaluation Example 1

The T1 energy level, S1 energy level, and bond dissociation energy of the compounds synthesized according to Synthesis Examples 1 to 4 and compounds C1 to C4 were calculated by simulating the density functional theory (DFT) method based on B3LYP using the Gaussian 09 program sold by Gaussian, Inc., Wallingford Conn., and the basis set, 6-31G(d,p) may be used. The value of the HOMO energy level in the optimized structure is calculated and the T1 energy level, S1 energy level, and $\Delta E_{ST}$, are measured, and Bond Dissociation Energy (BDE) values were calculated, and results thereof are shown in Table 2.

TABLE 2

| | Compound | T1 energy level in electron volt (eV) | S1 energy level in electron volt (eV) | $\Delta E_{ST}$ in electron volt (eV) | Bond dissociation energy in electron volt (eV) |
|---|---|---|---|---|---|
| Example 1 | Compound 11 | 2.64 | 2.79 | 0.15 | +0.12 |
| Example 2 | Compound 35 | 2.67 | 2.81 | 0.14 | +0.11 |
| Example 3 | Compound 55 | 2.67 | 2.80 | 0.13 | +0.12 |
| Example 4 | Compound 83 | 2.66 | 2.80 | 0.14 | +0.13 |
| Comparative Example 1 | Compound C1 | 2.59 | 2.74 | 0.15 | +0.07 |
| Comparative Example 2 | Compound C2 | 2.52 | 2.66 | 0.14 | +0.05 |
| Comparative Example 3 | Compound C3 | 2.55 | 2.70 | 0.15 | 0 |
| Comparative Example 4 | Compound C4 | 2.56 | 2.71 | 0.15 | +0.01 |

In Table 2, bond dissociation energy was expressed as a value increased or decreased based on Comparative Example 3. From the results of Table 2, it can be seen that the fused cyclic compounds according to embodiments had significant and unexpectedly lower or equivalent level of $\Delta E_{ST}$ and significant and unexpectedly increased bond dissociation energy compared to compounds $C_1$ to $C_4$.

Evaluation Example 2

The driving voltage at a current density of 10 mA/cm$^2$, the luminescence efficiency, and the maximum quantum efficiency were measured to evaluate the characteristics of the light-emitting device according to Examples 1 to 4. The driving voltage in volt (V) and luminescence efficiency in candela per square meter (cd/A) of the light-emitting devices were measured using a source meter (sold under the trade designation Keithley Instrument, 2400 series, by Tektronix, Inc., of Beaverton, Oregon), and the maximum quantum efficiency in percent (%) was measured using the external quantum efficiency measurement device sold under the trade designation C9920-2-12 by Hamamatsu Photonics Inc., of Hamamatsu-city, Japan. In evaluating the maximum quantum efficiency, the luminance/current density was measured using a luminance meter that was calibrated for wavelength sensitivity, and the maximum quantum efficiency was converted by assuming an angular luminance distribution (Lambertian) which introduced a perfect reflecting diffuser. The evaluation results of the characteristics of the light-emitting devices are shown in Table 3 below.

TABLE 3

| | Emission layer | Driving voltage (V) | Luminiscence Efficiency (cd/A) | Maximum quantum efficiency (%) | Emission color |
|---|---|---|---|---|---|
| Example 1 | Compound 11 | 4.4 | 27.0 | 24.1 | Blue |
| Example 2 | Compound 35 | 4.5 | 24.0 | 22.5 | Blue |
| Example 3 | Compound 55 | 4.3 | 26.0 | 23.7 | Blue |
| Example 4 | Compound 83 | 4.7 | 25.5 | 23.0 | Blue |
| Comparative Example 1 | Compound C1 | 4.9 | 22.3 | 21.7 | Blue |
| Comparative Example 2 | Compound C2 | 5.1 | 21.2 | 20.3 | Blue |
| Comparative Example 3 | Compound C3 | 5.3 | 20.7 | 19.7 | Blue |
| Comparative Example 4 | Compound C4 | 5.2 | 19.8 | 17.8 | Blue |

From the results of Table 3, it can be seen that the light-emitting devices of Examples 1 to 4, wherein the fused cyclic compounds according to an embodiment of the invention were used as emission layer dopants, have significant and unexpectedly lower driving voltage, improved luminescence efficiency, and improved maximum quantum efficiency than the light-emitting devices of Comparative Examples 1 to 4. That is, when the fused cyclic compounds made according to the principles and embodiments of the invention are used in a light-emitting device, an example organic light-emitting device, a significant and unexpectedly excellent effect can be obtained in terms of driving voltage, luminescence efficiency and maximum quantum efficiency. Although not wanting to be bound by theory, because the fused cyclic compound has high stability and can have improved delayed fluorescent characteristics, a light-emitting device including the fused cyclic compound can have high efficiency and long lifespan.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting device comprising:

a first electrode;

a second electrode facing the first electrode, and an interlayer between the first electrode and the second electrode and including an emission layer, and at least one fused cyclic compound of Formula 1:

Formula 1

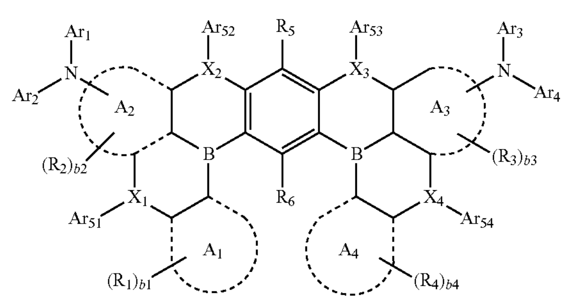

-continued

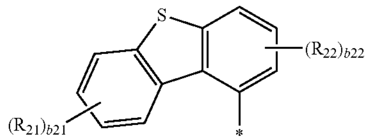

2A

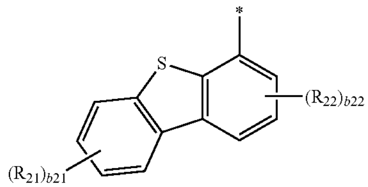

2B wherein, in Formulae 1, 2A, and 2B, $X_1$ to $X_4$ are each, independently from one another, N, O, S, or Se, with the proviso that at least one of $X_1$ to $X_4$ is N, when $X_1$ to $X_4$ is O, S, or Se, $Ar_{51}$, $Ar_{52}$, $Ar_{53}$ and $Ar_{54}$ do not exist, when $Ar_{51}$ is present, $X_1$ is N, when $Ar_{52}$ is present, $X_2$ is N, when $Ar_{53}$ is present, $X_3$ is N, and when $Ar_{54}$ is present, $X_4$ is N, ring $A_1$ to ring $A_4$ are each, independently from one another, a $C_5$-$C_{20}$ carbocyclic group or a $C_1$-$C_{20}$ heterocyclic group, $Ar_1$ to $Ar_4$ and $Ar_{51}$ to $Ar_{54}$ are each, independently from one another, a group of Formula 2A, a group of Formula 2B, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, provided that at least two of $Ar_1$ to $Ar_4$ and $Ar_{51}$ to $Ar_{54}$ are each independently a group of Formula 2A or Formula 2B, $R_1$ to $R_6$, $R_{21}$, and $R_{22}$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b1 to b4 are each, independently from one another, an integer from 1 to 10, b21 is an integer from 1 to 4, and b22 is an integer from 1 to 3,

* indicates a binding site to a neighboring atom, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group each independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group each independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof, or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group, or a $C_1$-$C_{60}$ heterocyclic group each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The light-emitting device of claim 1, wherein the emission layer comprises the at least one fused cyclic compound.

3. The light-emitting device of claim 1, wherein the emission layer, comprises a host and a dopant, an amount of the host in the emission layer is greater than an amount of the dopant in the emission layer, and the dopant includes the at least one fused cyclic compound.

4. The light-emitting device of claim 3, wherein the at least one fused cyclic compound comprises a thermally activated delayed fluorescence emitter.

5. The light-emitting device of claim 2, wherein the emission layer is configured to emit blue light having a maximum emission wavelength of about 410 nm to about 480 nm.

6. The light-emitting device of claim 1, wherein the first electrode comprises an anode, the second electrode comprises a cathode, the interlayer further includes a hole transport region between the first electrode and the emission layer and an electron transport region between the emission layer and the second electrode, the hole transport region includes a hole injection layer, a hole transport layer, an emission auxiliary layer, an electron-blocking layer, or any combination thereof, and the electron transport region includes a buffer layer, an electron control layer, a hole-blocking layer, an electron transport layer, an electron injection layer, or any combination thereof.

7. The light-emitting device of claim 1, wherein the first electrode comprises an anode, the second electrode comprises a cathode, the interlayer further includes a hole transport region between the first electrode and the emission layer, the hole transport region includes a compound of Formula 201, a compound of Formula 202, or any combination thereof, the emission layer includes the at least one fused cyclic compound of Formula 1:

Formula 201

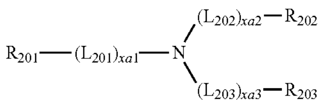

Formula 202

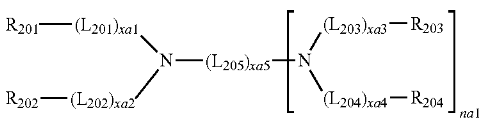

wherein, in Formulae 201 and 202, $L_{201}$ to $L_{204}$ are each, independently from one another, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{20}S$ is *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 are each, independently from one another, an integer from 0 to 5, xa5 is an integer from 1 to 10, $R_{201}$ to $R_{204}$ and $Q_{201}$ are each, independently from one another, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ are optionally linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10}$, $R_{203}$ and $R_{204}$ are optionally linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10}$, and na1 is an integer from 1 to 4.

8. The light-emitting device of claim 1, wherein in Formula 1, each of $X_1$ to $X_4$ is N, $X_1$ is O and each of $X_2$ to $X_4$ is N, $X_2$ is O and each of $X_1$, $X_3$, and $X_4$ is N, $X_3$ is O and each of $X_1$, $X_2$, and $X_4$ is N, or $X_4$ is O and each of $X_1$ to $X_3$ is N.

9. The light-emitting device of claim 1, wherein each of ring $A_1$ to ring $A_4$ in Formula 1 is a benzene group.

10. The light-emitting device of claim 9, wherein the at least one fused cyclic compound of Formula 1 comprises any two, three, four, five, or six groups of at least one of Formula 2A and Formula 2B.

11. The light-emitting device of claim 1, wherein in Formula 1, i) $Ar_1$ or $Ar_2$ is a group of Formula 2A or 2B, and $Ar_3$ or $Ar_4$ is a group of Formula 2A or 2B, ii) two of $Ar_{51}$ to $Ar_{54}$ are each, independently from one another, a group of Formula 2A or 2B, ii) three of $Ar_{51}$ to $Ar_{54}$ are each, independently from one another, a group of Formula 2A or 2B, iv) one of $Ar_1$ to $Ar_4$ is a group of Formula 2A or 2B, and one of $Ar_{51}$ to $Ar_{54}$ is a group of Formula 2A or 2B, v) one of $Ar_1$ to $Ar_4$ is a group of Formula 2A or 2B, and two of $Ar_{51}$ to $Ar_{54}$ are each independently a group of Formula 2A or 2B, vi) one of $Ar_1$ to $Ar_4$ is a group of Formula 2A or 2B, and three of $Ar_{51}$ to $Ar_{54}$ are each, independently from one another, a group of Formula 2A or 2B, vii) one of $Ar_1$ to $Ar_4$ is a group of Formula 2A or 2B, and $Ar_{51}$ to $Ar_{54}$ are each, independently from one another, a group of Formula 2A or 2B, viii) $Ar_1$ or $Ar_2$ is a group of Formula 2A or 2B, $Ar_3$ or $Ar_4$ is a group of Formula 2A or 2B, and one of $Ar_{51}$ to $Ar_{54}$ is a group of Formula 2A or 2B, ix) $Ar_1$ or $Ar_2$ is a group of Formula 2A or 2B, $Ar_3$ or $Ar_4$ is a group of Formula 2A or 2B, and two of $Ar_{51}$ to $Ar_{54}$ are each, independently from one another, a group of Formula 2A or 2B, x) $Ar_1$ or $Ar_2$ is a group of Formula 2A or 2B, $Ar_3$ or $Ar_4$ is a group of Formula 2A or 2B, and three of $Ar_{51}$ to $Ar_{54}$ are each, independently from one another, a group of Formula 2A or 2B, or xi) $Ar_1$ or $Ar_2$ is a group of Formula 2A or 2B, $Ar_3$ or $Ar_4$ is a group of Formula 2A or 2B, and $Ar_{51}$ to $Ar_{54}$ are each, independently from one another, a group of Formula 2A or 2B.

12. The light-emitting device of claim 1, wherein $Ar_1$ to $Ar_4$ and $Ar_{51}$ to $Ar_{54}$ in Formula 1 are each, independently from one another, a group of one of Formulae 2A, 2B, and 5-1 to 5-17:

5-1

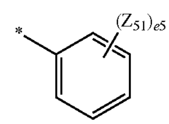

5-2

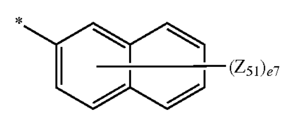

5-3

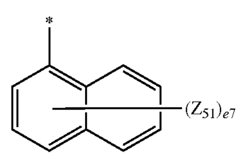

5-4

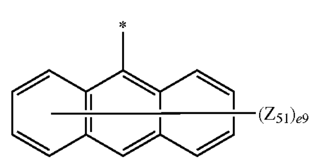

5-5

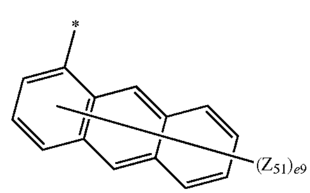

-continued 5-6

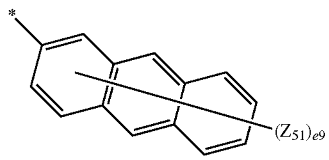

5-7

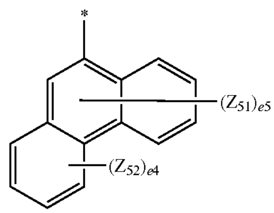

5-8

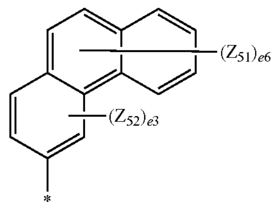

5-9

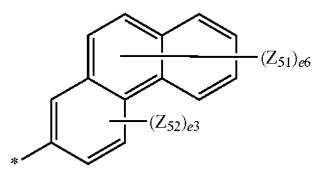

5-10

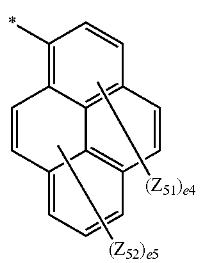

5-11

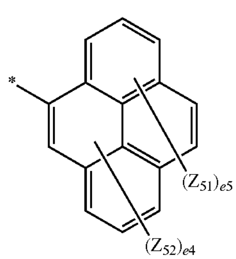

5-12

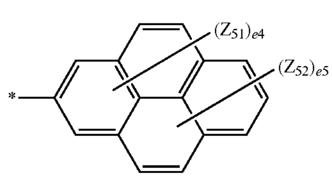

-continued 5-13

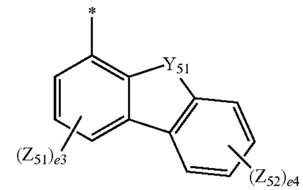

5-14

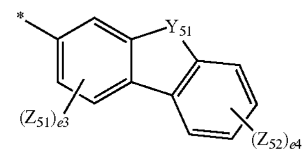

5-15

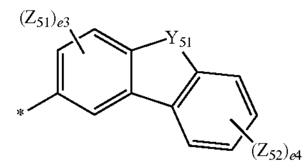

5-16

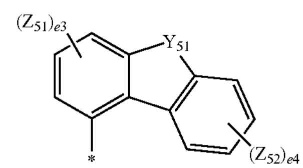

5-17

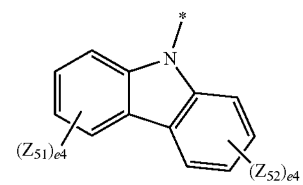

wherein, in Formulae 5-1 to 5-17, $Y_{51}$ is O, $N(Z_{53})$, $C(Z_{54})(Z_{55})$, or $Si(Z_{56})(Z_{57})$, $Z_{51}$ to $Z_{57}$ are each independently hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a pyridinyl group, a pyrazinyl group, a pyrimidinyl group, a pyridazinyl group, a triazinyl group, an isoquinolinyl group, a benzimidazolyl group, a dibenzosilolyl group, a dibenzofuranyl group, a dibenzothienyl group, a carbazolyl group, a quinolinyl group, —$Si(Q_{31})(Q_{32})(Q_{33})$, —$N(Q_{31})(Q_{32})$, or —$B(Q_{31})(Q_{32})$, e3 is an integer from 1 to 3, e4 is an integer from 1 to 4, e5 is an integer from 1 to 5, e6 is an integer from 1 to 6, e7 is an integer from 1 to 7, e9 is an integer from 1 to 9, $Q_{31}$ to $Q_{33}$ are each, independently from one another, a $C_1$-$C_{10}$ alkyl group, a $C_1$-$C_{10}$ alkoxy group, a phenyl group, a biphenyl group, a terphenyl group, or a naphthyl group, and

* indicates a binding site to a neighboring atom.

13. The light-emitting device of claim 1, wherein
$Ar_1$ to $Ar_4$ and $Ar_{51}$ to $Ar_{54}$ in Formula 1 are each, independently from one another, a group of one of Formulae 2A-1, 2B-1, and 6-1 to 6-22, and
at least two of $Ar_1$ to $Ar_4$ and $Ar_{51}$ to $Ar_{54}$ are each, independently from one another, a group of Formula 2A-1 or 2B-1:
2A-1
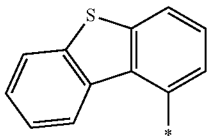
2B-1
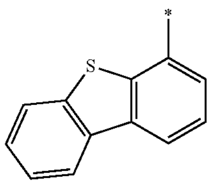
6-1
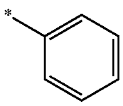
6-2
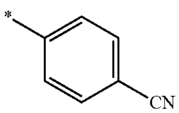
6-3
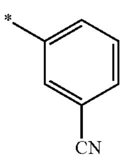
6-4
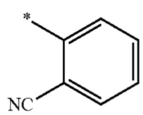
6-5
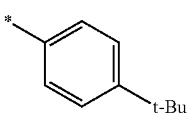
6-6
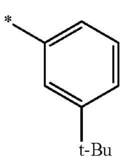
6-7
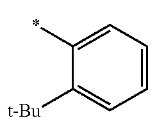
6-8
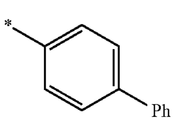
-continued
6-9
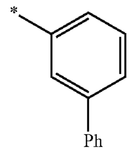
6-10
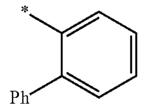
6-11
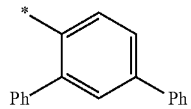
6-12
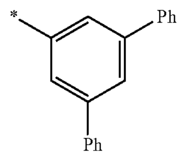
6-13
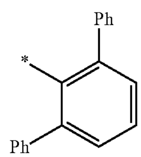
6-14
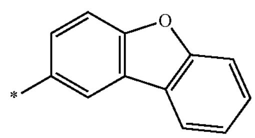
6-15
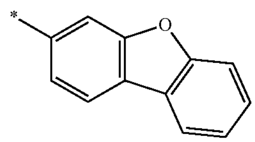
6-16
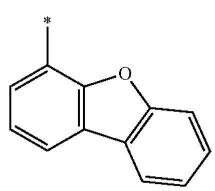
6-17
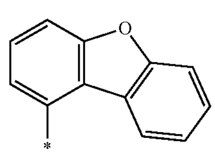
6-18
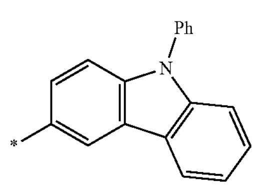

-continued 6-19

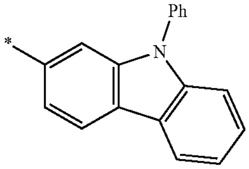

6-20

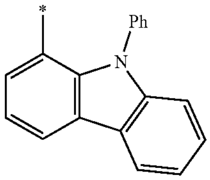

6-21

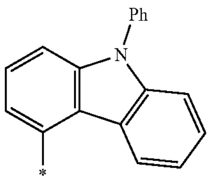

6-22

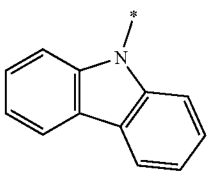

wherein, in Formulae 2A-1, 2B-1, and 6-1 to 6-22, t-Bu is a tert-butyl group,

Ph is a phenyl group, and

* indicates a binding site to a neighboring atom.

14. The light-emitting device of claim 1, wherein $Ar_1$ to $Ar_4$ and $Ar_{51}$ to $Ar_{54}$ in Formula 1 are each, independently from one another, a group of one of Formulae 2A-1, 2B-1, and 7-1 to 7-3, and at least two of $Ar_1$ to $Ar_4$ and $Ar_{51}$ to $Ar_{54}$ are each, independently from one another, a group of Formula 2A-1 or 2B-1:

2A-1

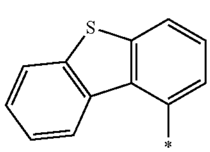

2B-1

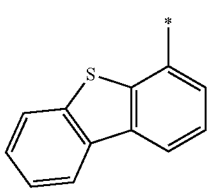

7-1

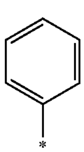

-continued 7-2

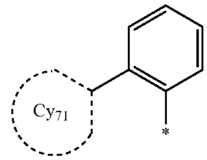

7-3

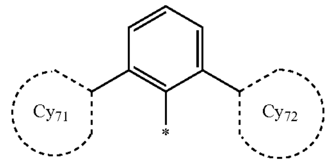

wherein, in Formulae 2A-1, 2B-1, and 7-1 to 7-3, $CY_{71}$ and $CY_{72}$ are each, independently from one another, a $C_3$-$C_{20}$ carbocyclic group unsubstituted or substituted with at least one $R_{10a}$ or a $C_1$-$C_{20}$ heterocyclic group unsubstituted or substituted with at least one $R_{10a}$, and

* indicates a binding site to a neighboring atom.

15. The light-emitting device of claim 1, wherein $R_1$ to $R_6$ in Formula 1 are each hydrogen.

16. The light-emitting device of claim 1, wherein the at least one fused cyclic compound is of Formula 1-1:

Formula 1-1

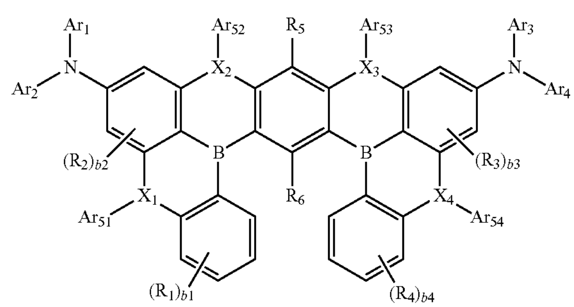

wherein, in Formula 1-1, $X_1$ to $X_4$, $Ar_1$ to $Ar_4$, $Ar_{51}$ to $Ar_{54}$, and $R_1$ to $R_6$ have, independently from one another, the same meaning as in Formula 1 of claim 1, b1 and b4 are each, independently from one another, an integer from 1 to 4, and b2 and b3 are each, independently from one another, 1 or 2.

17. The light-emitting device of claim 1, wherein the at least one fused cyclic compound is of one of Formulae 1-1A to 1-1E:

1-1A

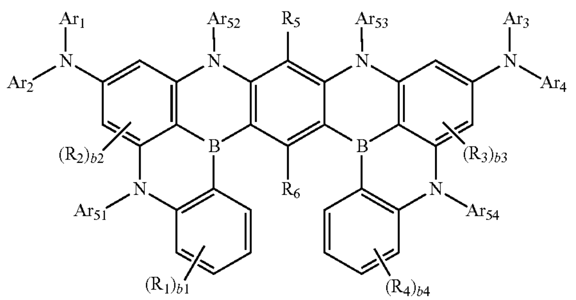

1-1B

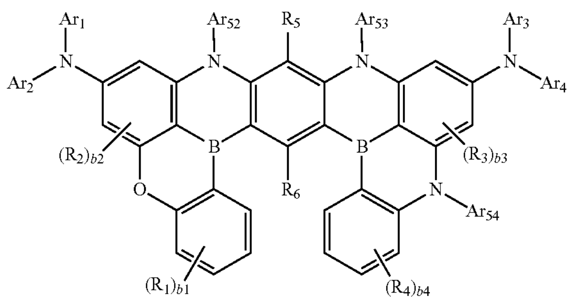

1-1C

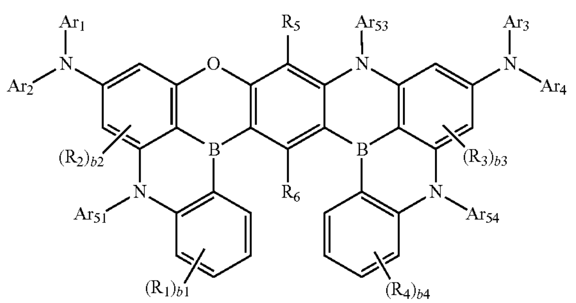

-continued 1-1D

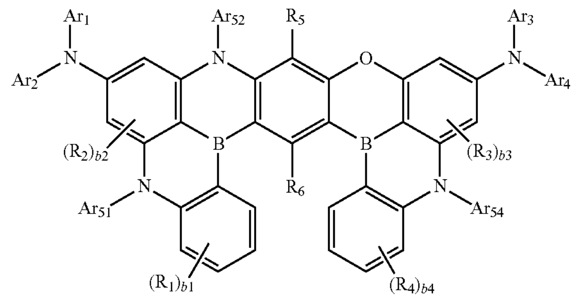

1-1E

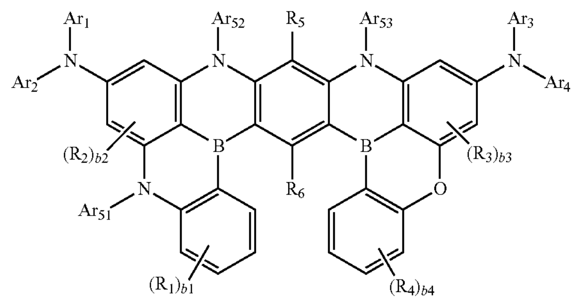

wherein, in Formulae 1-1A to 1-1E, $Ar_1$ to $Ar_4$, $Ar_{51}$ to $Ar_{54}$, and $R_1$ to $R_6$ have, independently from one another, the same meaning as Formula 1 of claim 1, b1 and b4 are each, independently from one another, an integer from 1 to 4, and b2 and b3 are each, independently from one another, 1 or 2.

18. The light-emitting device of claim 1, wherein the at least one fused cyclic compound is one of the following Compounds:

1

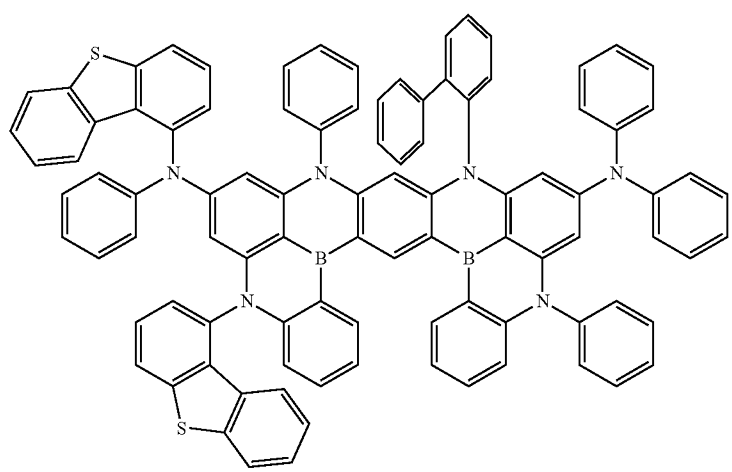

-continued
2
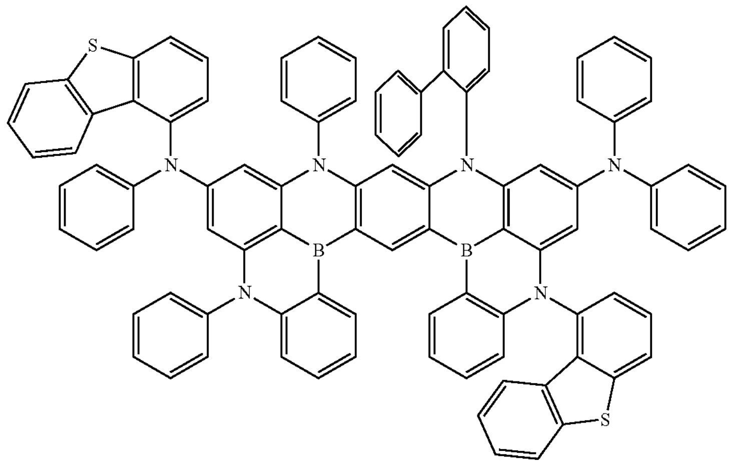
3
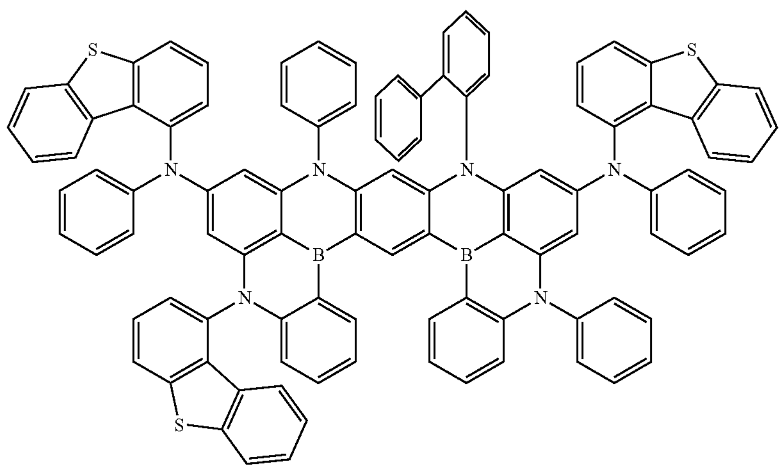
4
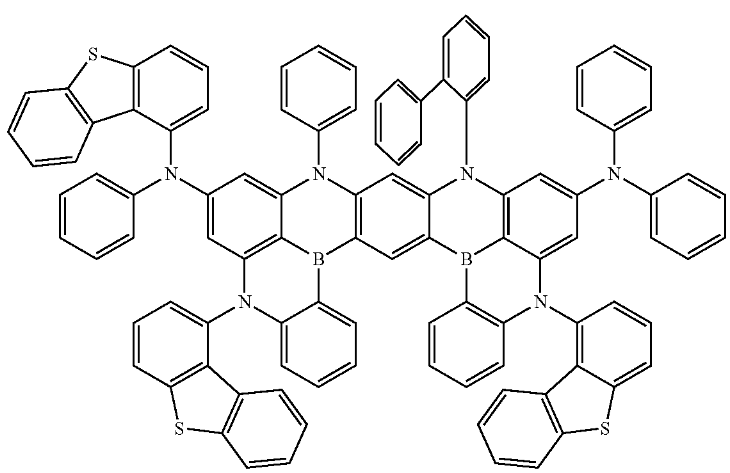

-continued
5
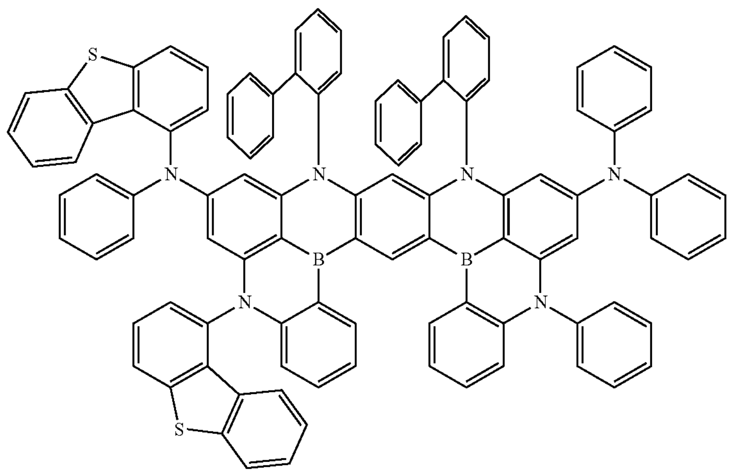
6
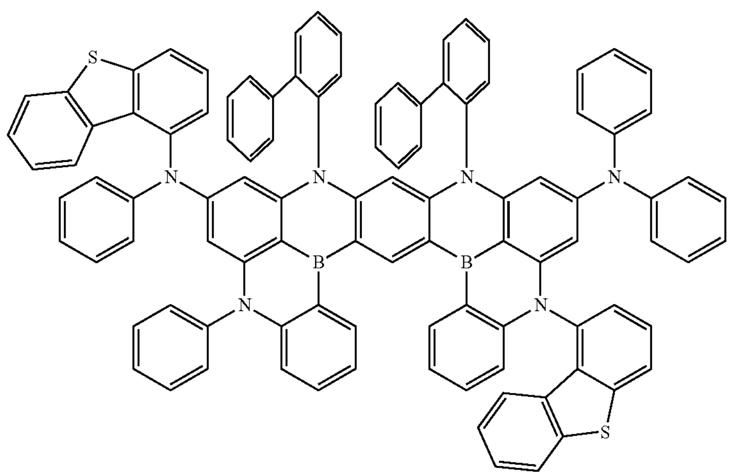
7
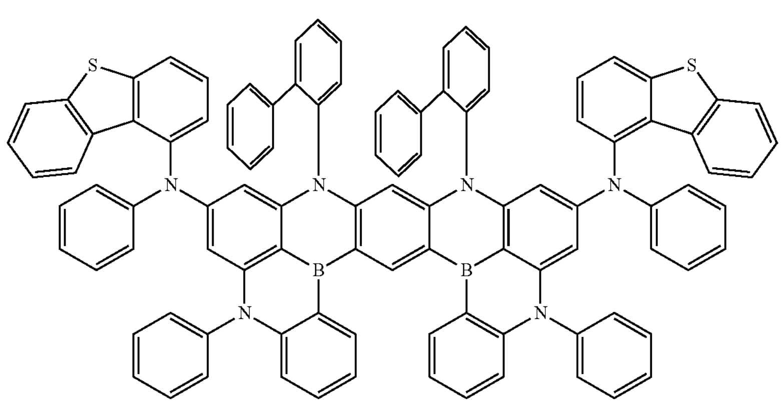

-continued
8
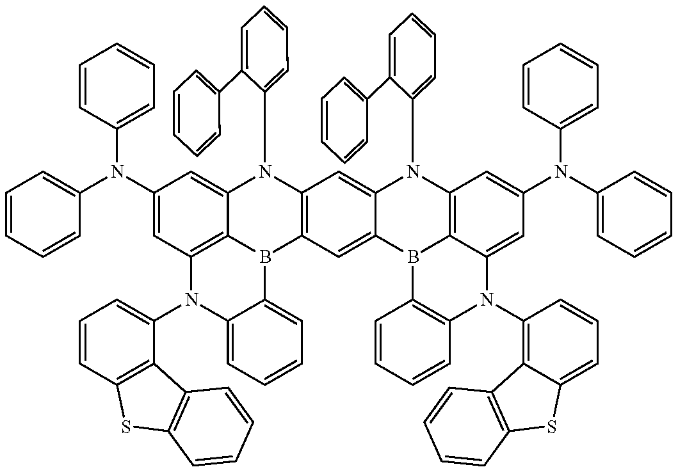
9
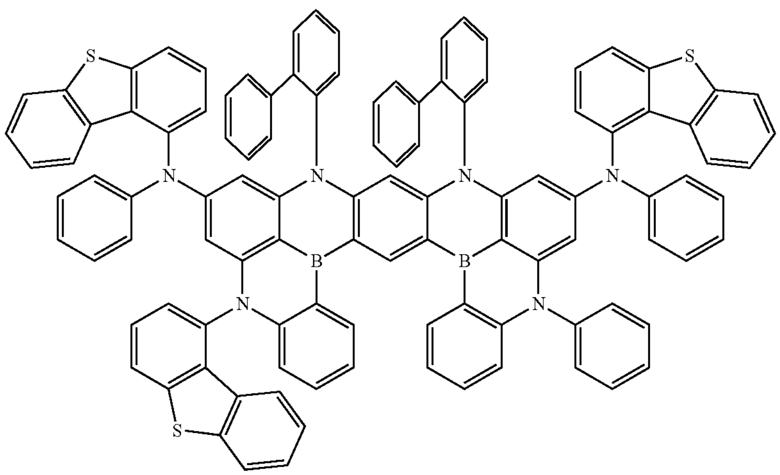
10
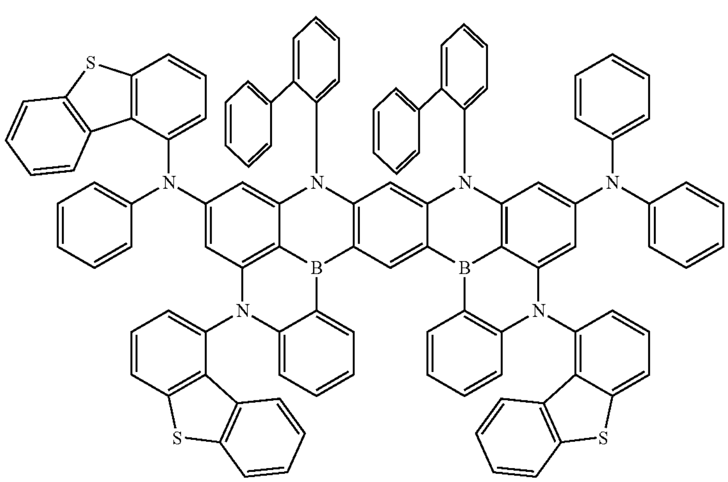

-continued
11
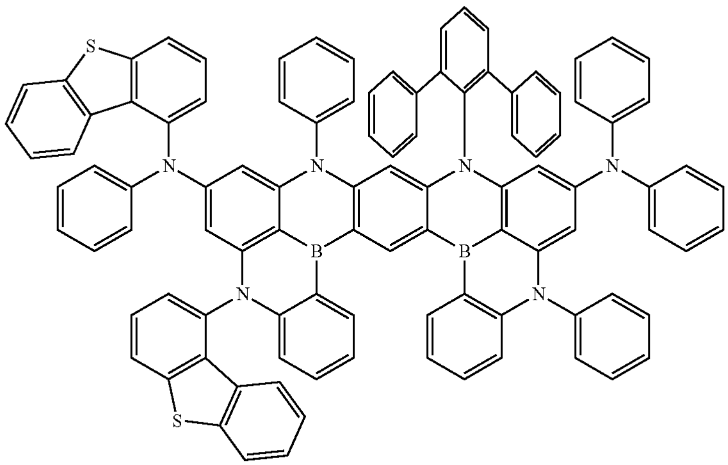
12
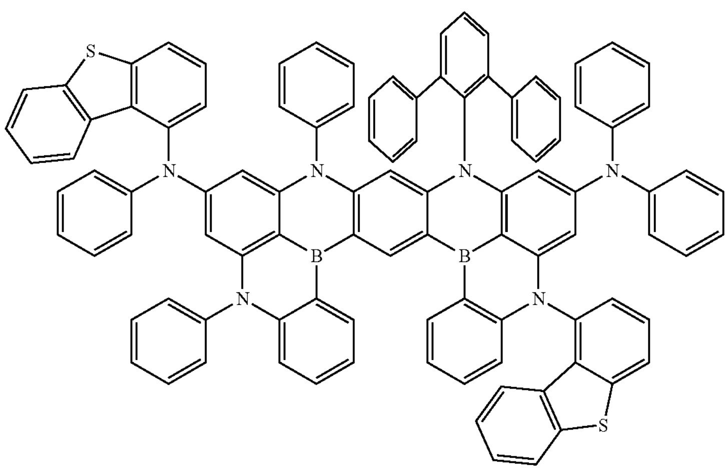
13
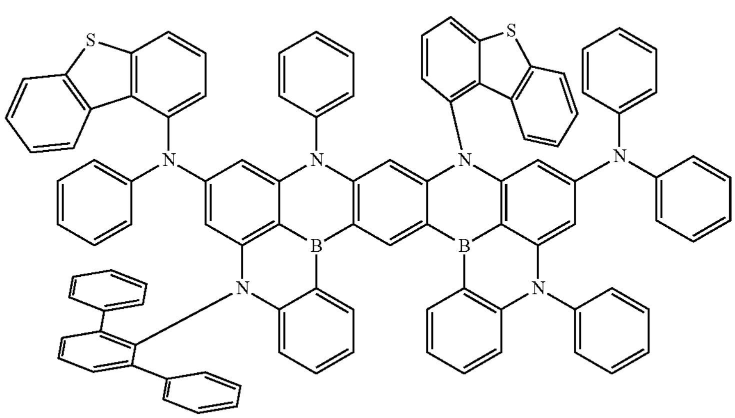

-continued
14
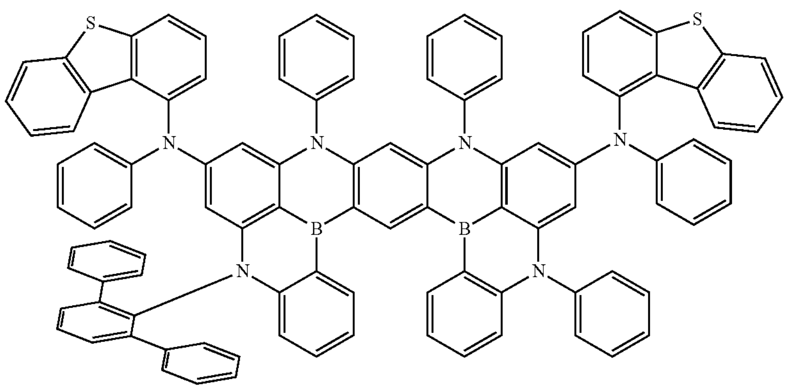
15
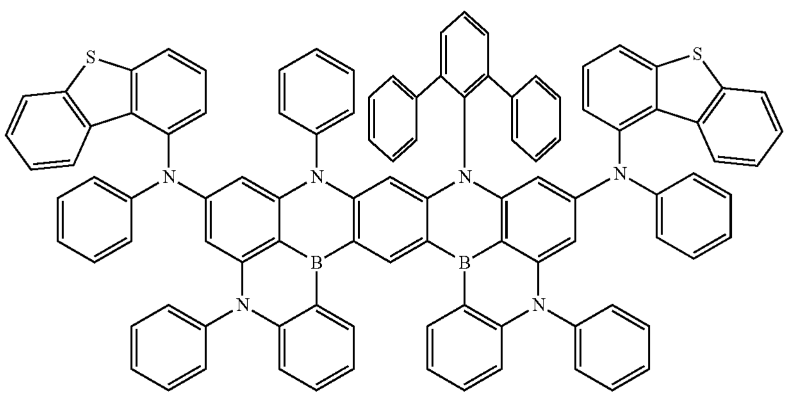
16
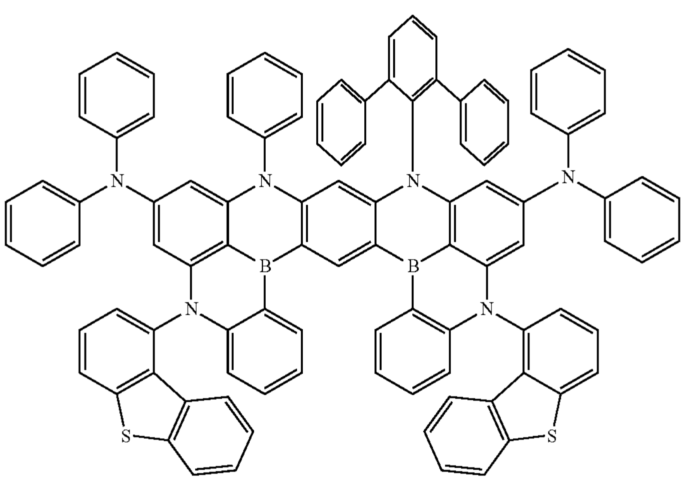

-continued
17
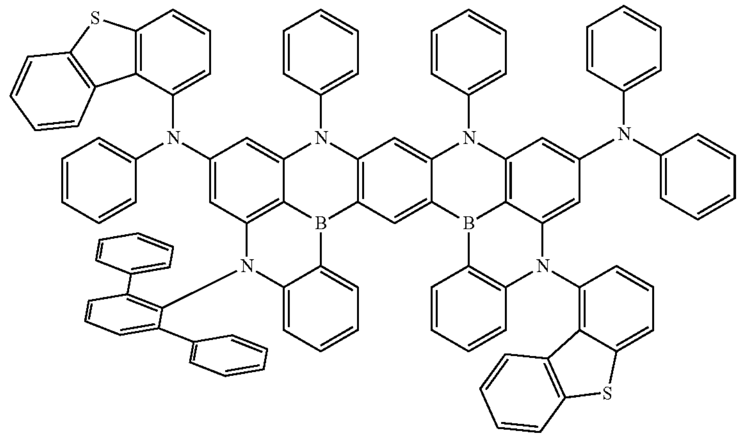
18
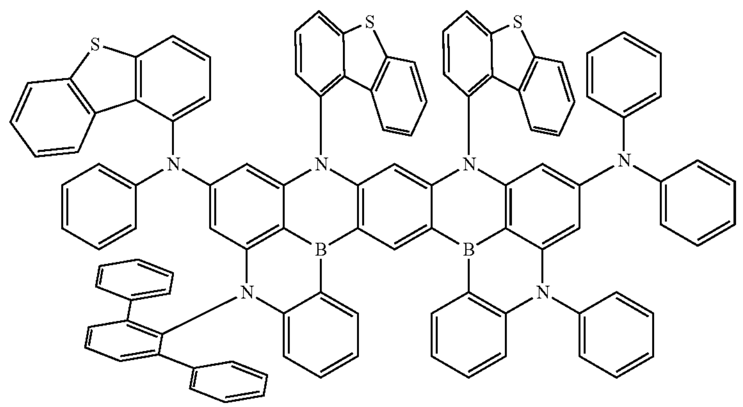
19
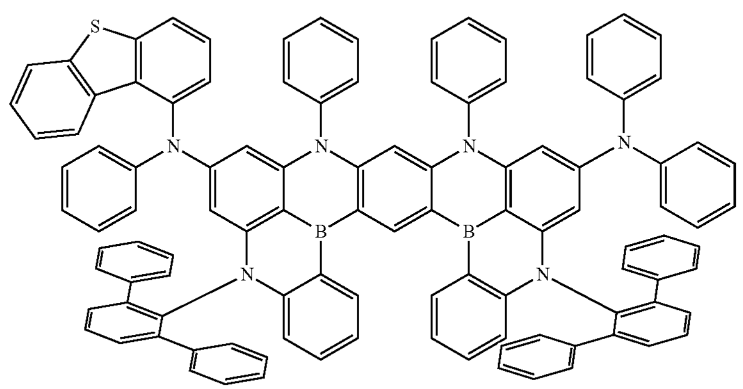
20
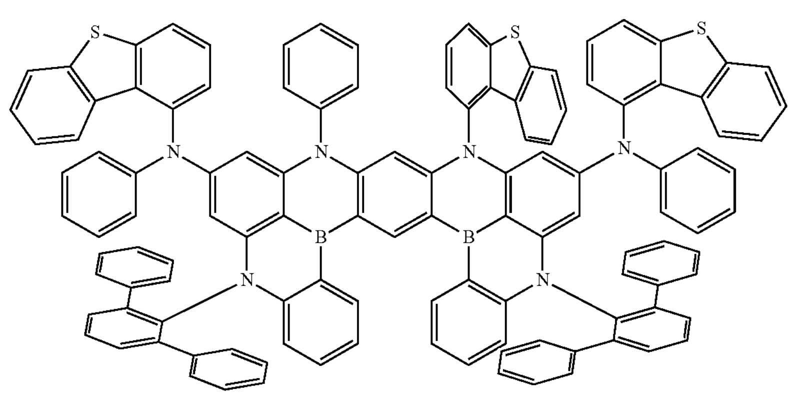

-continued
21
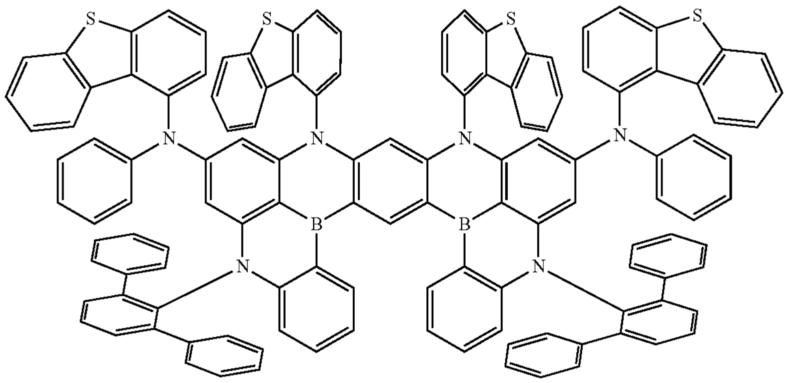
22
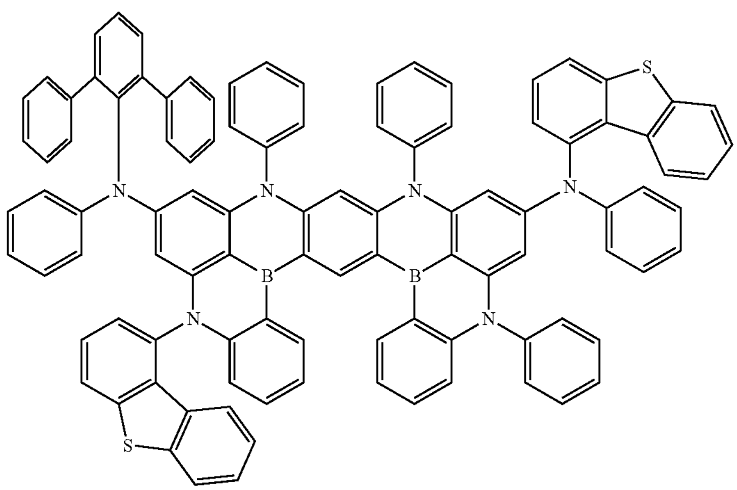
23
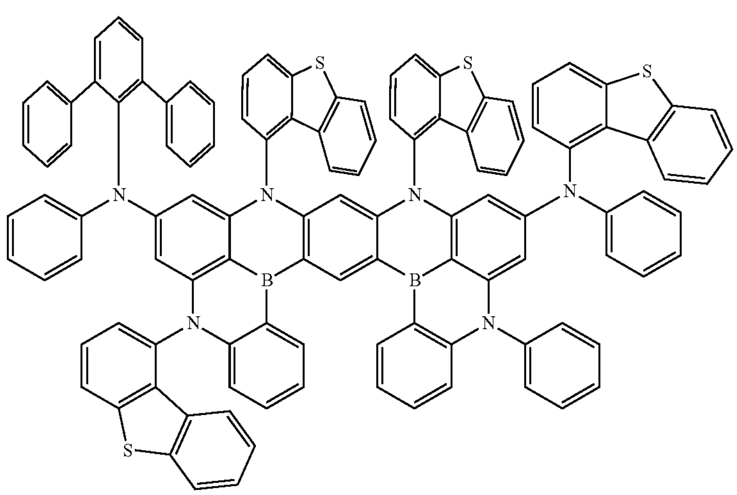

-continued
24
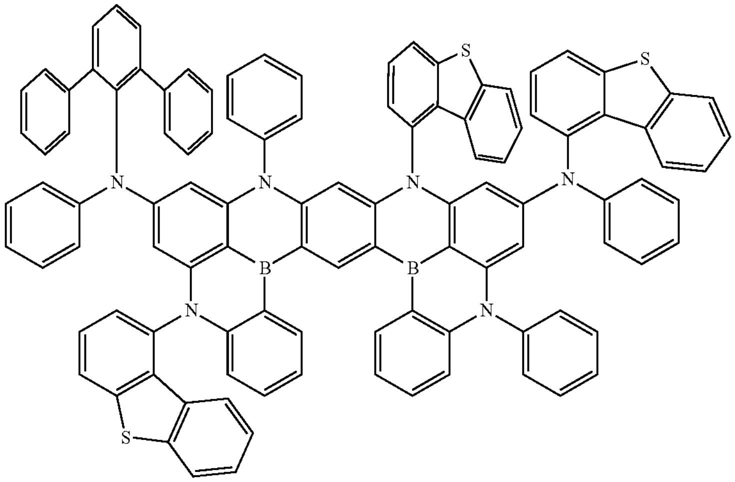
25
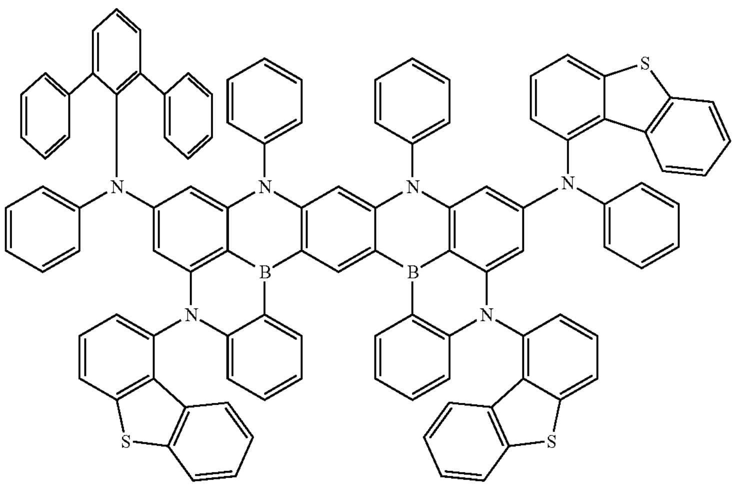
26
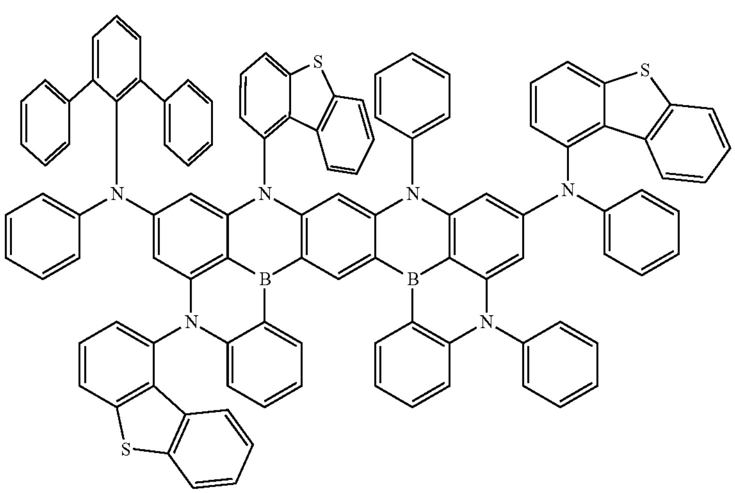

-continued
27
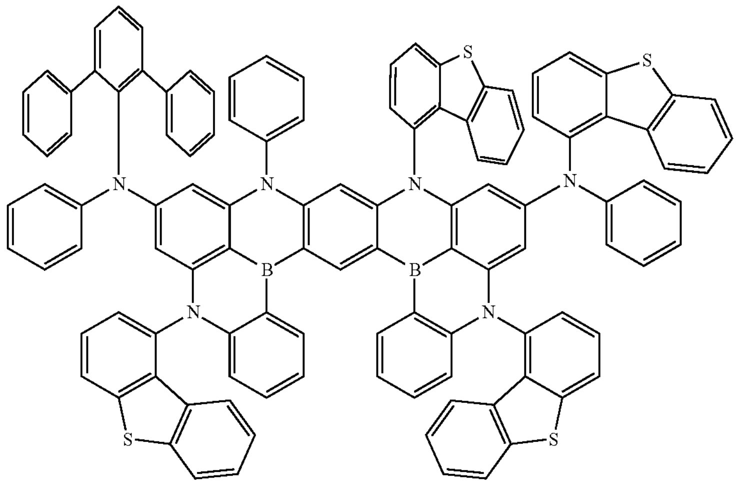
28
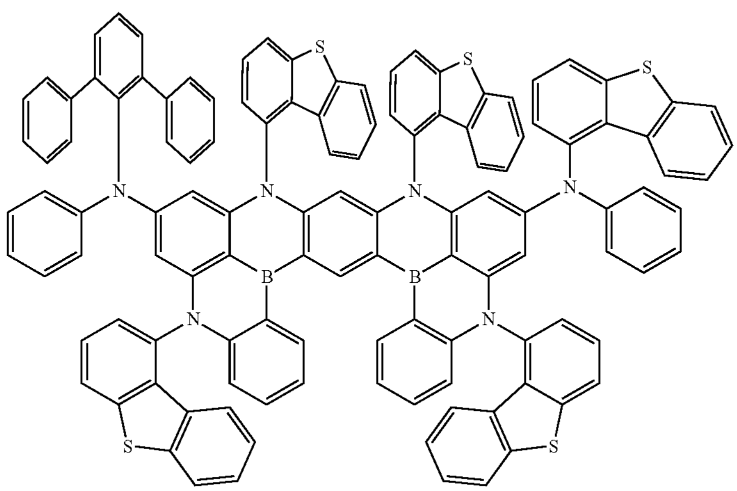
29
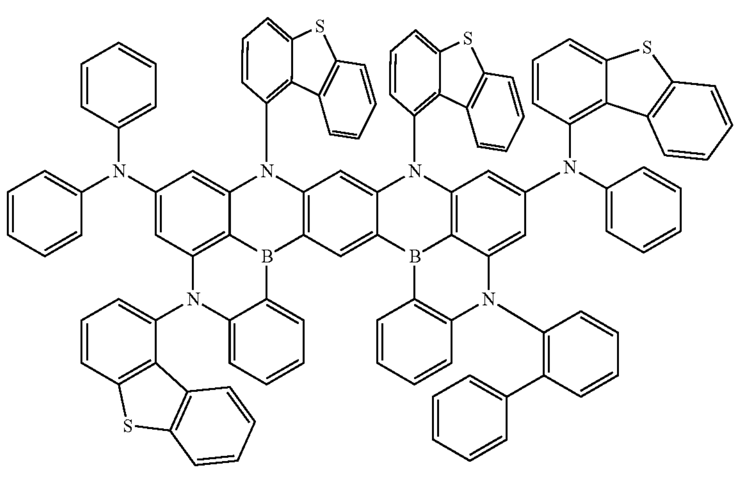

-continued
30
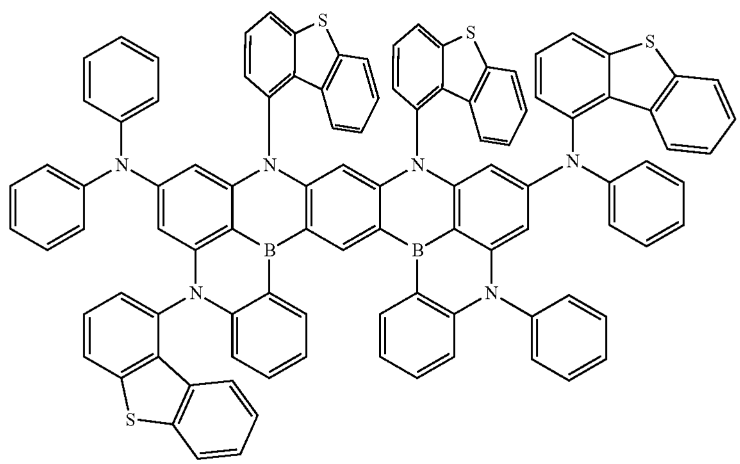
31
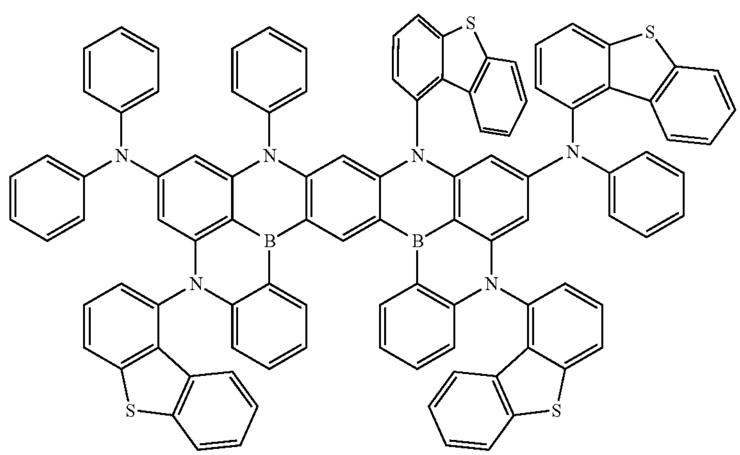
32
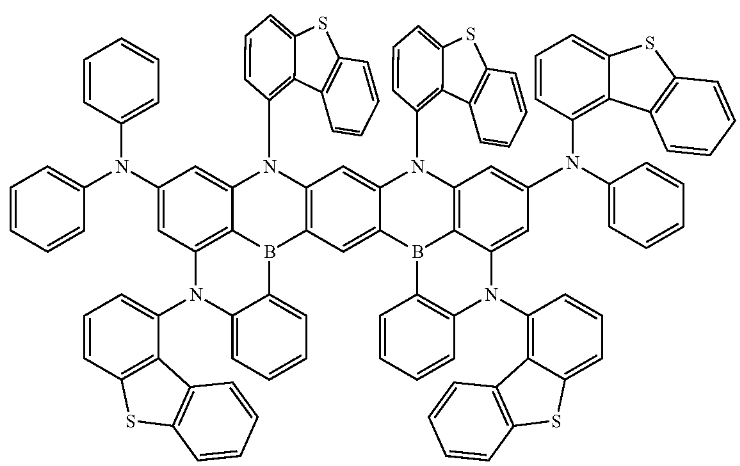

-continued
33
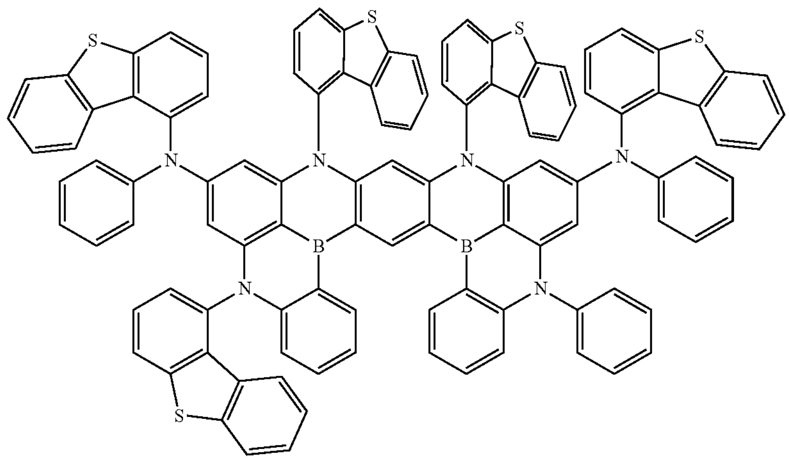
34
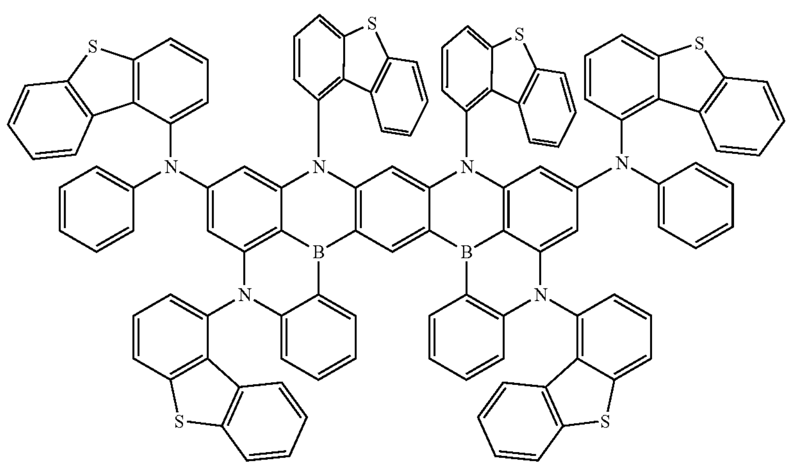
35
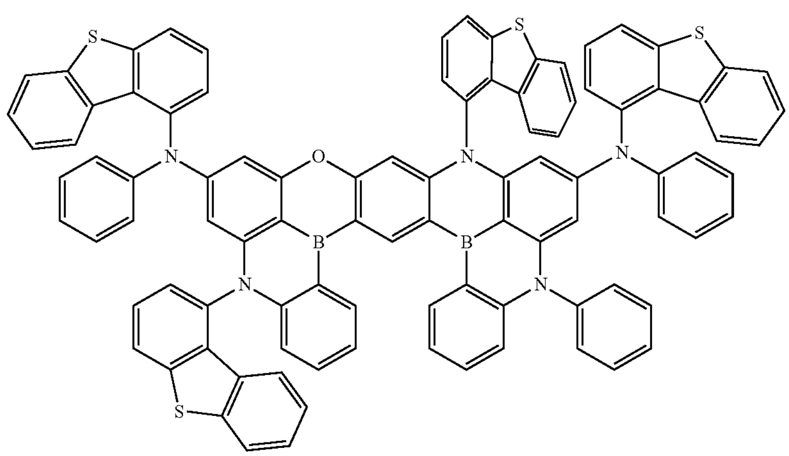

-continued
36
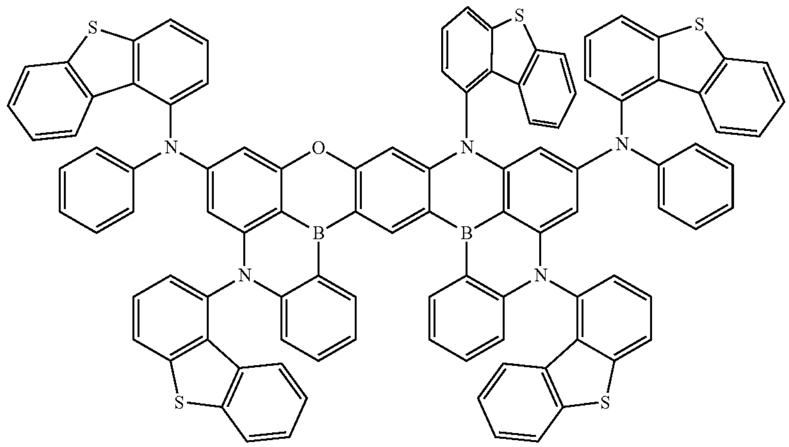
37
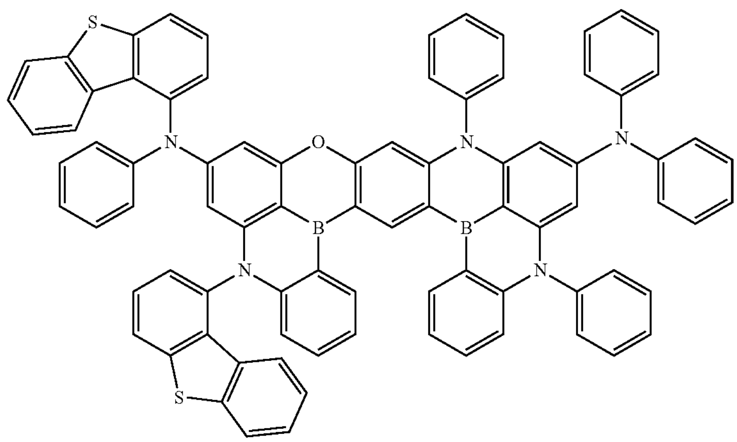
38
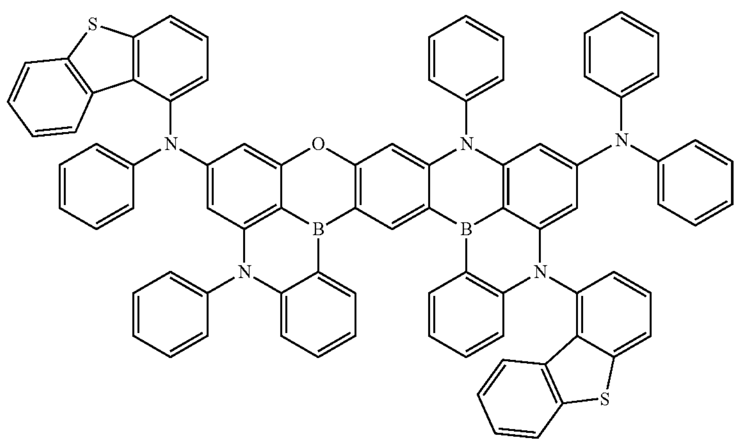

-continued
39
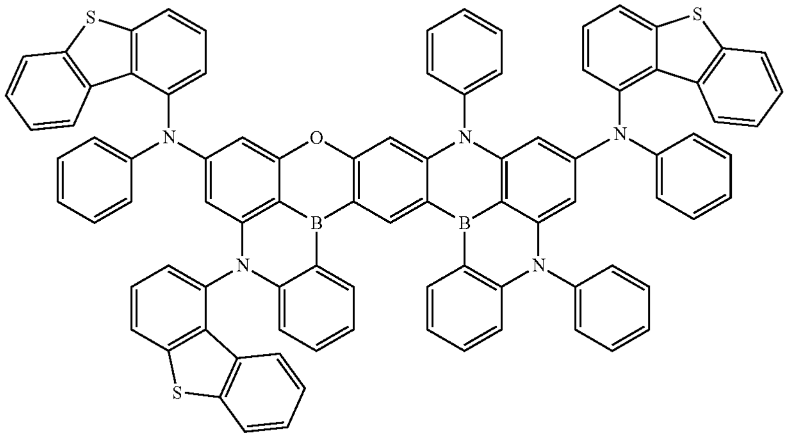
40
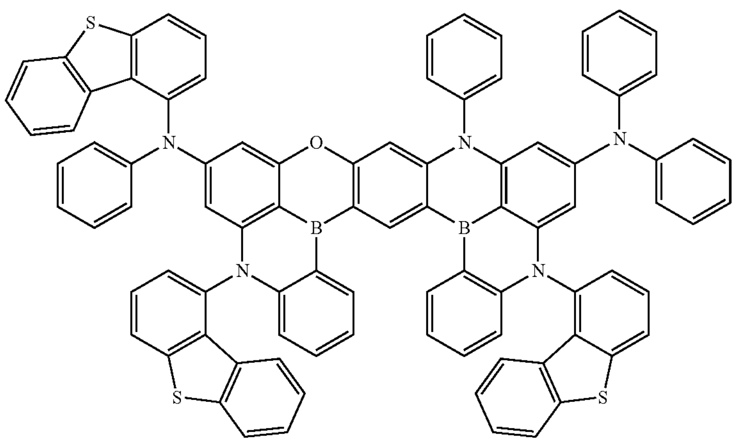
41
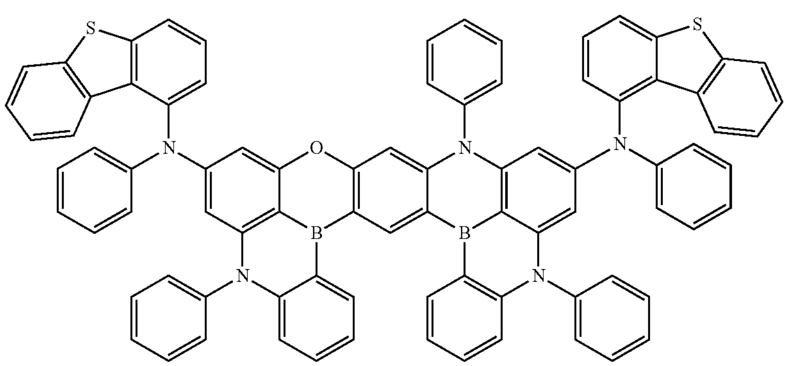

-continued
42
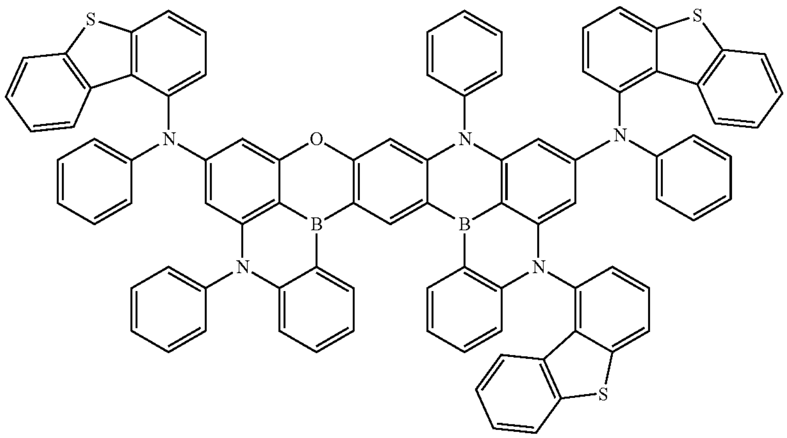
43
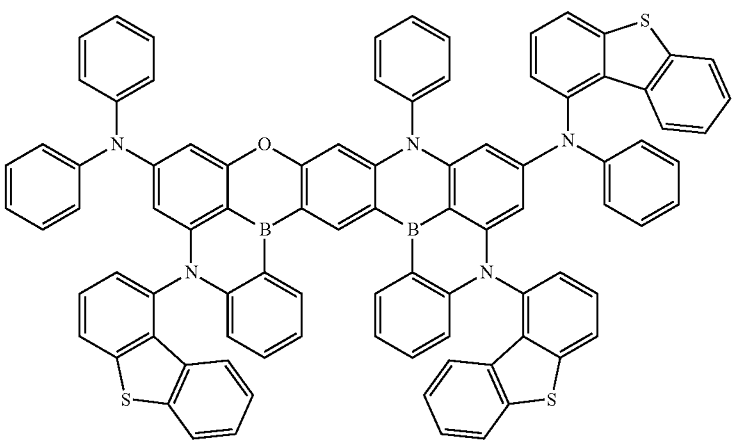
44
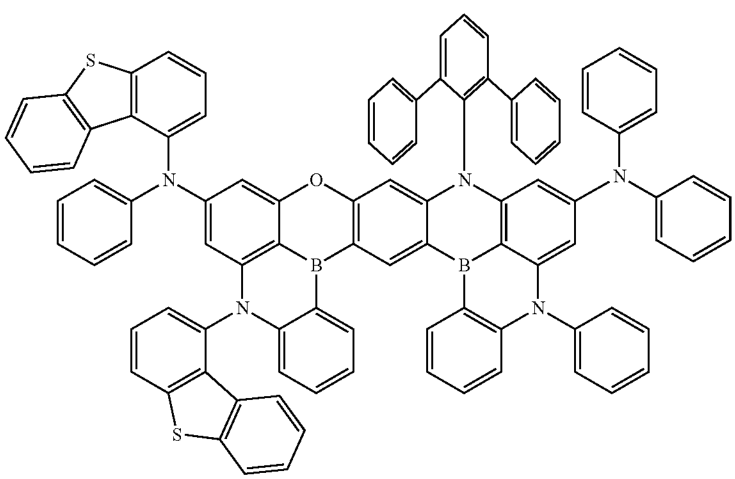

-continued
45
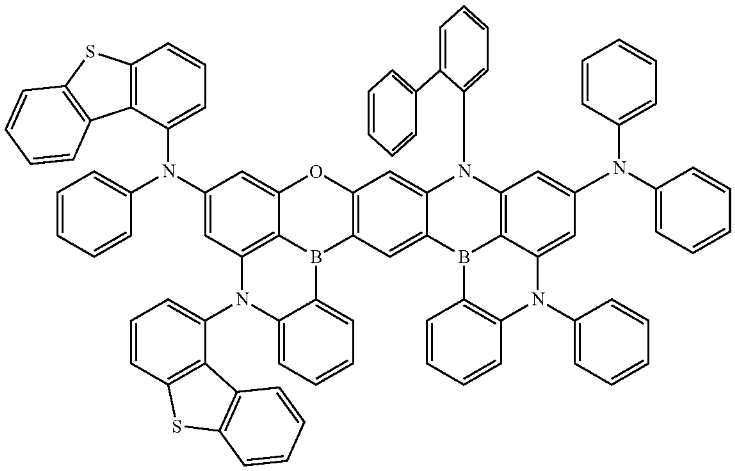
46
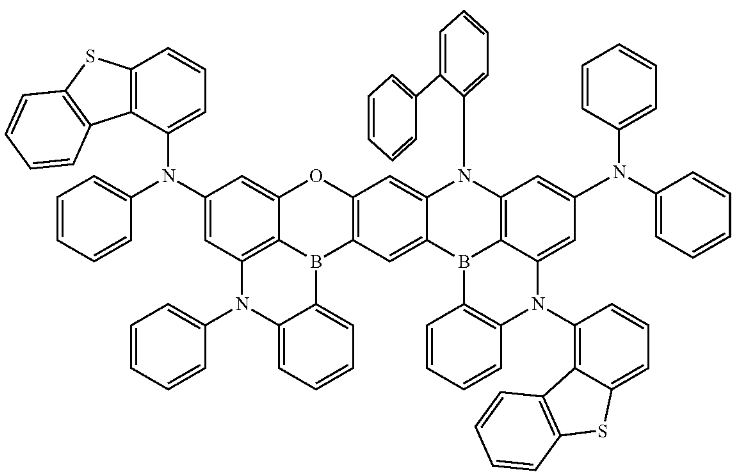
47
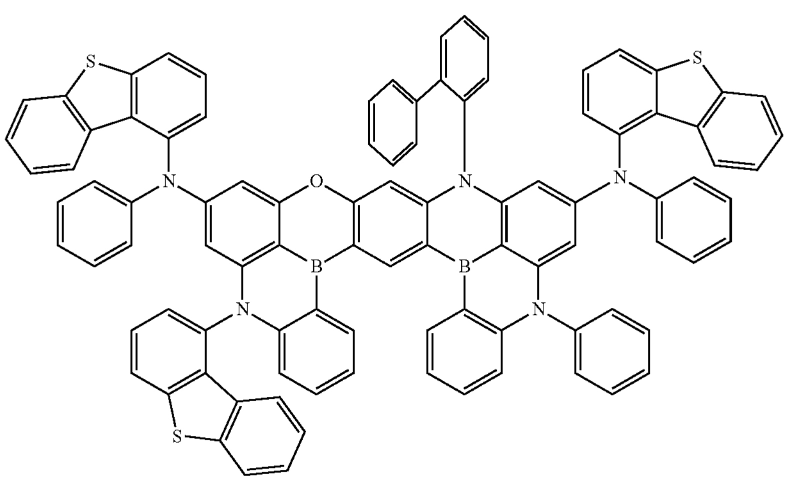

-continued
48
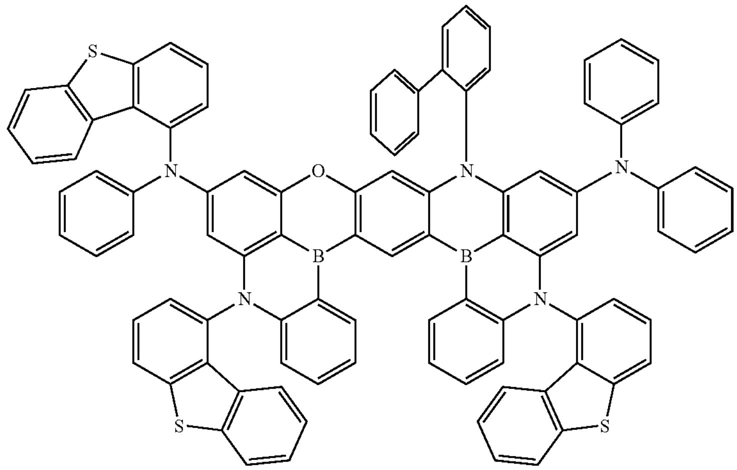
49
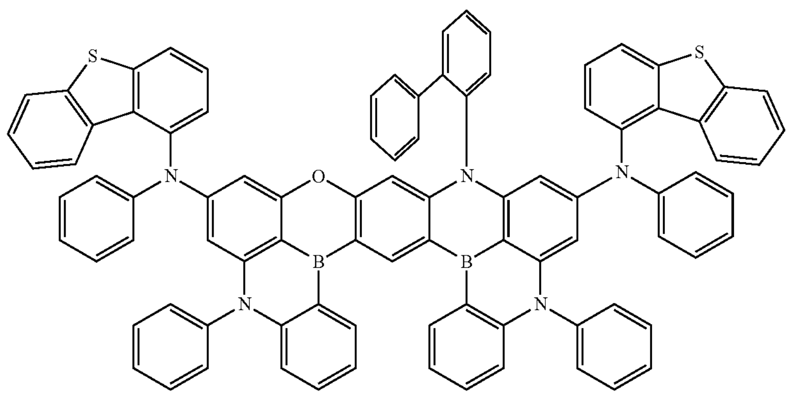
50
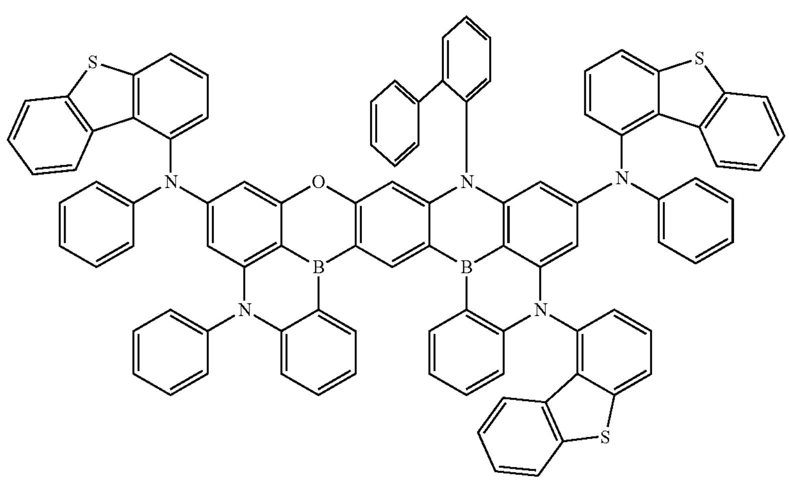

-continued
51
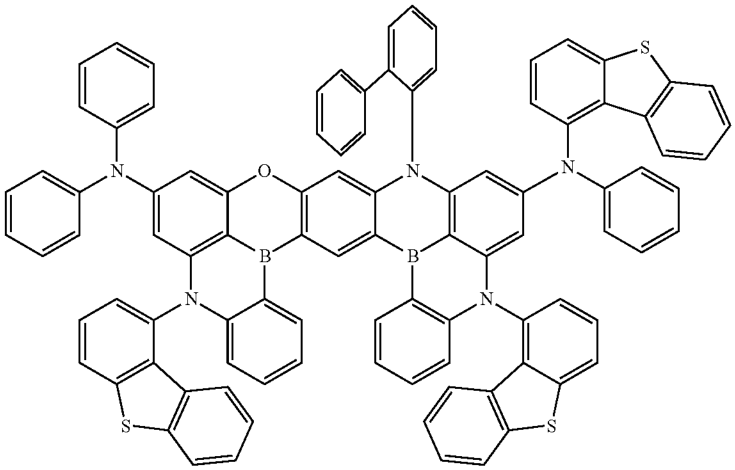
52
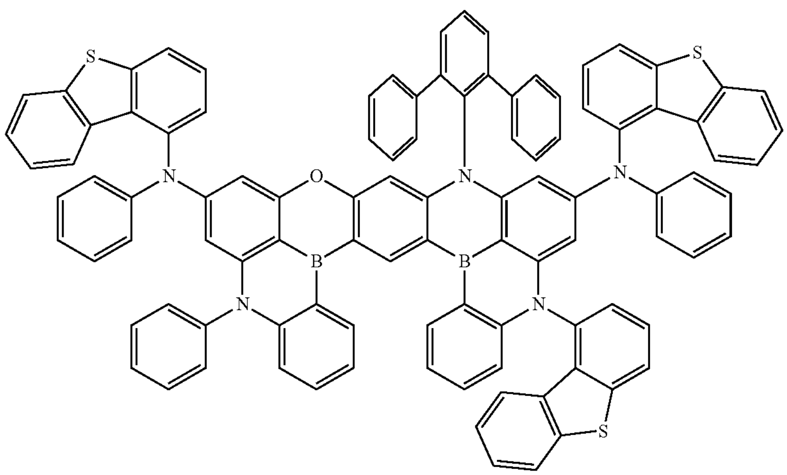
53
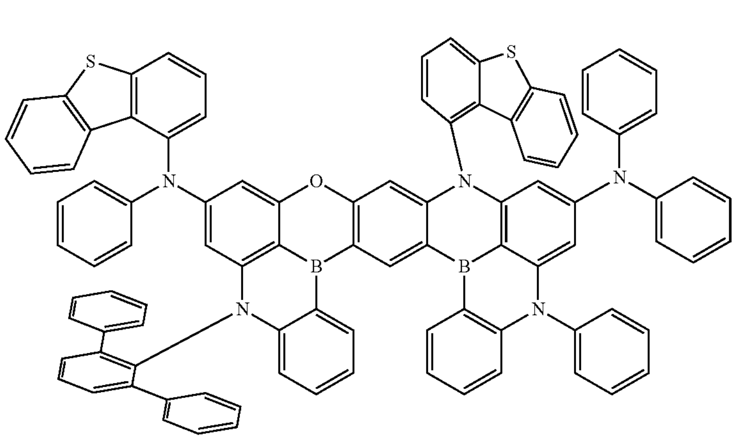

-continued
54
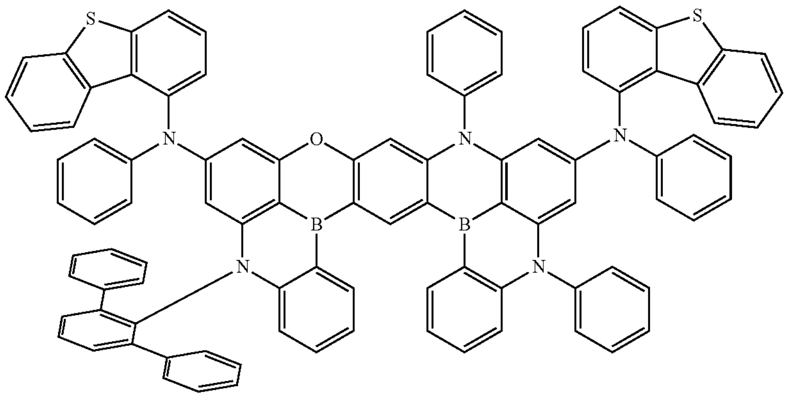
55
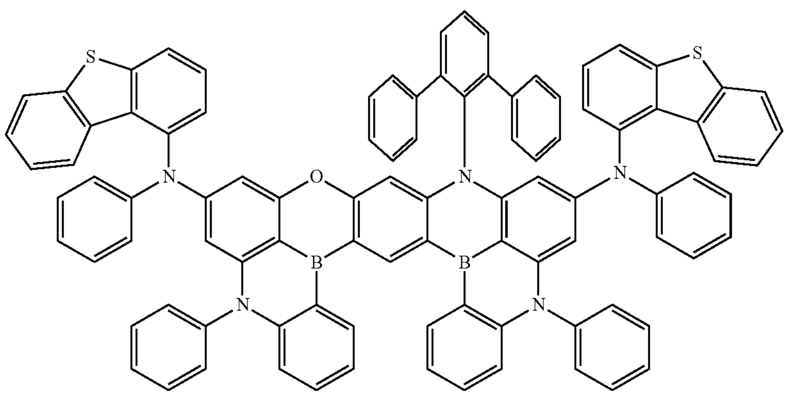
56
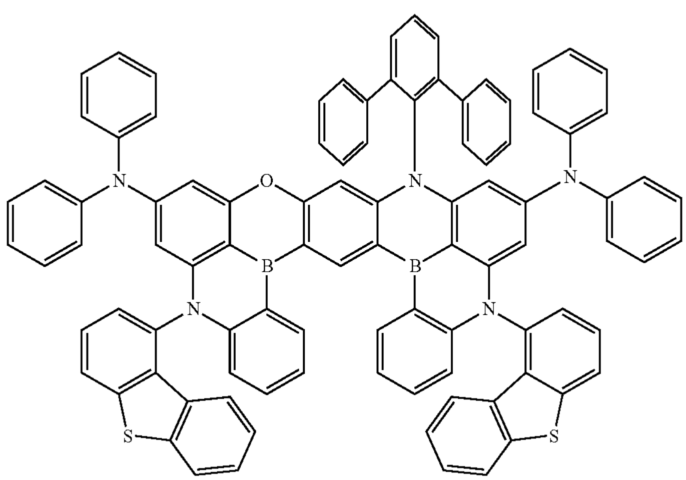

-continued
57
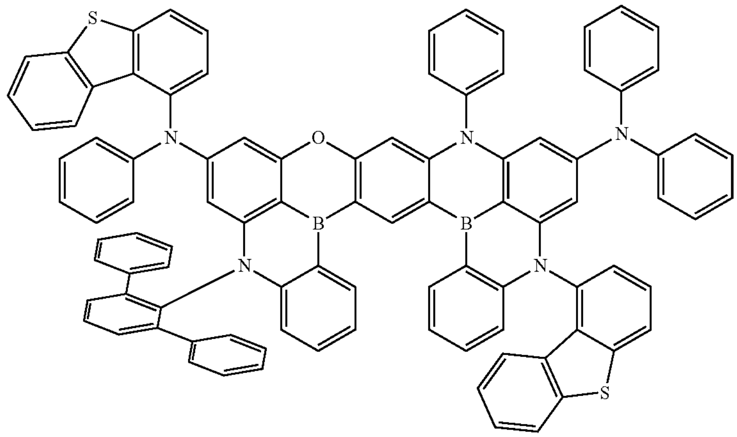
59
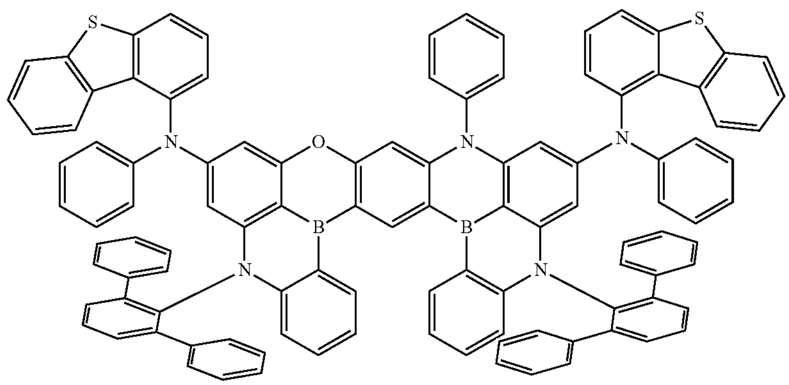
60
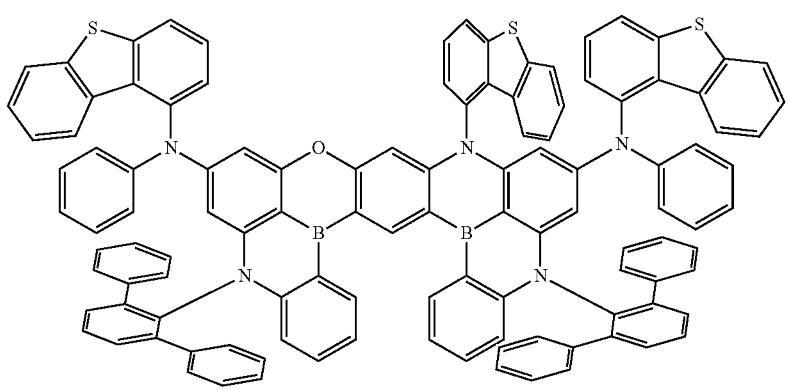

-continued
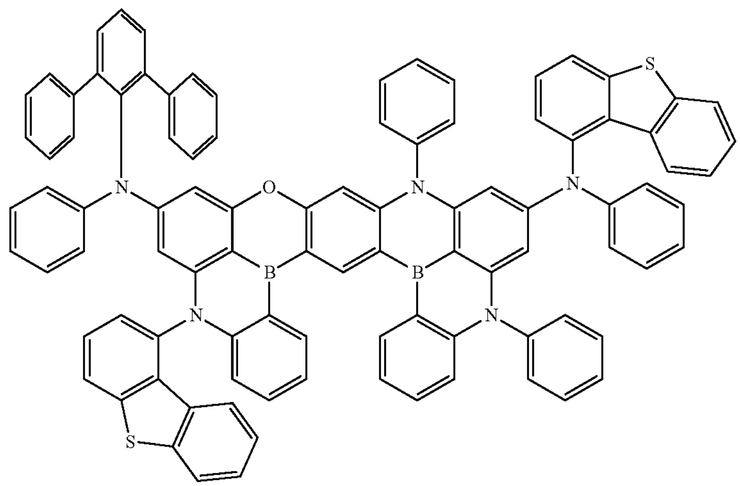
62
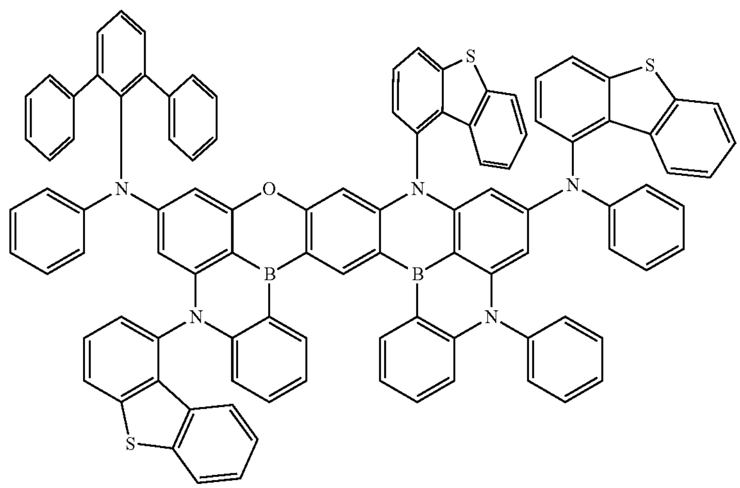
64
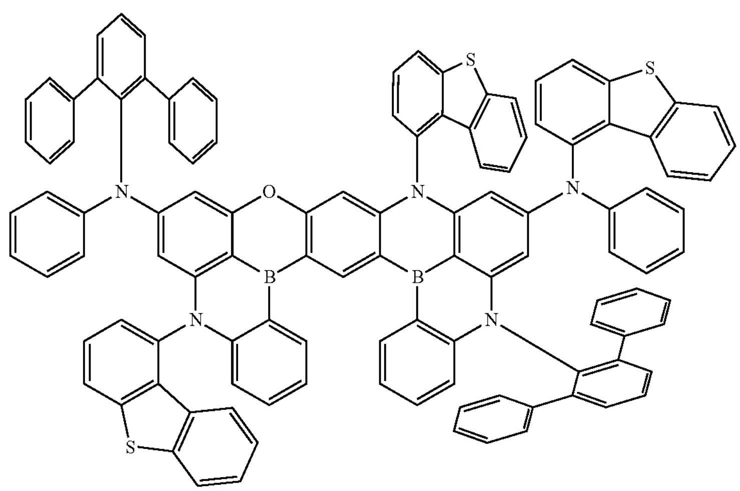

-continued
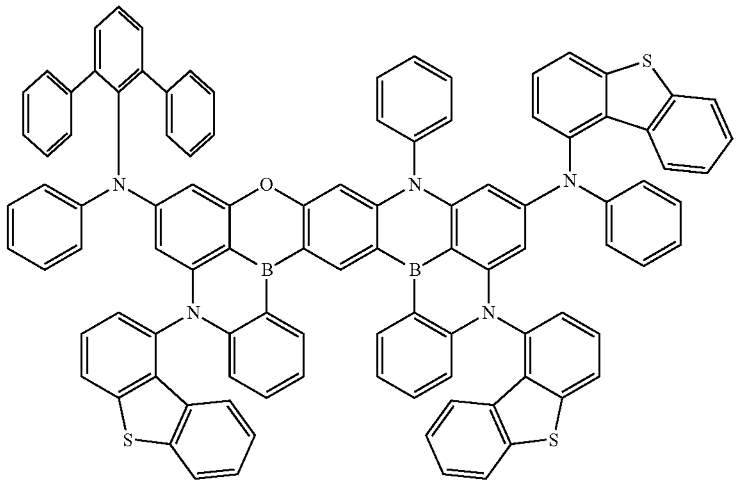
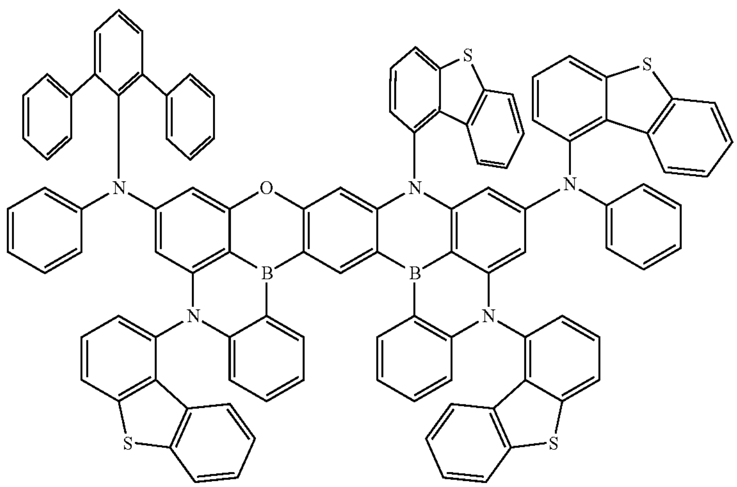
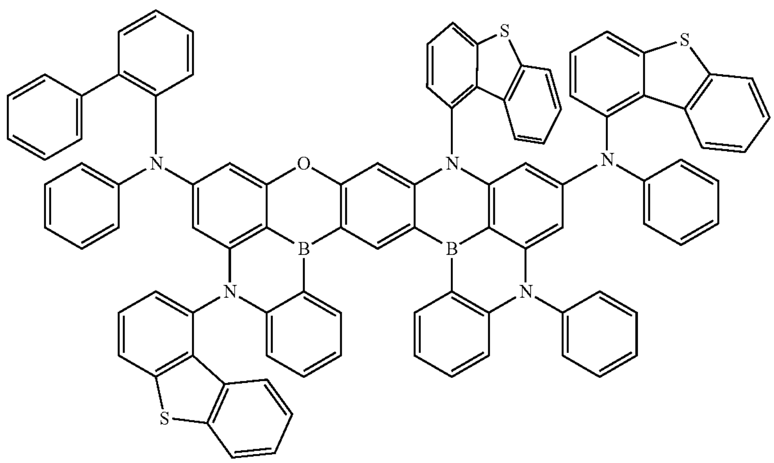

-continued
70
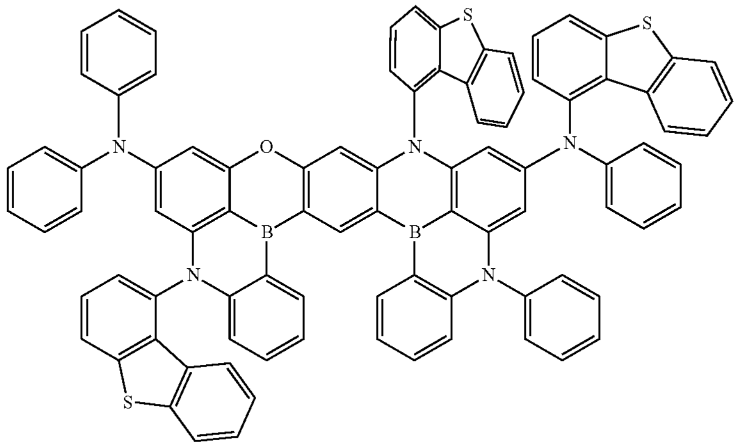
71
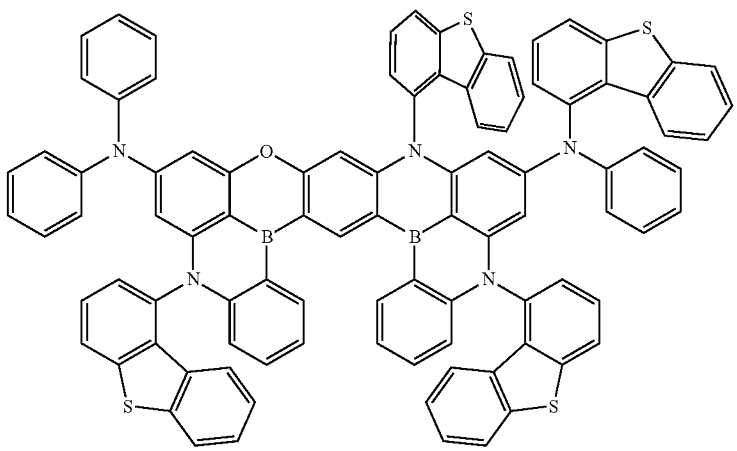
72
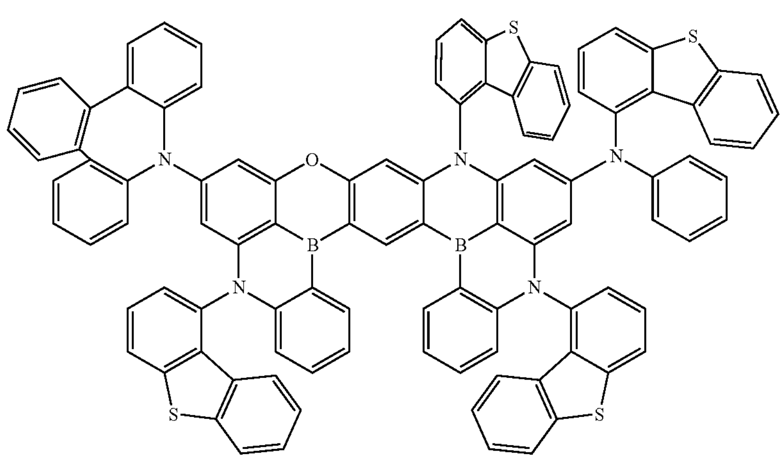

-continued
73
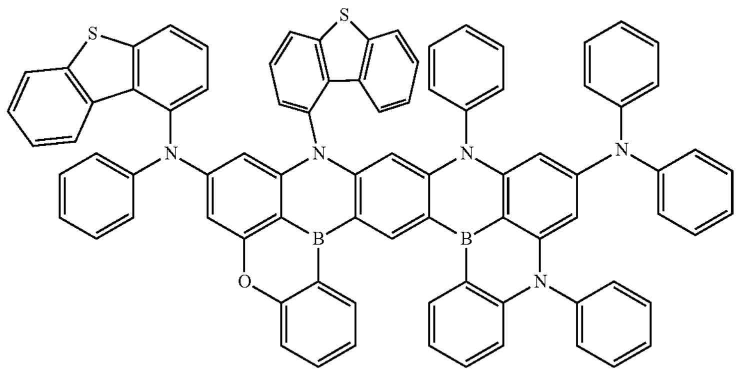
74
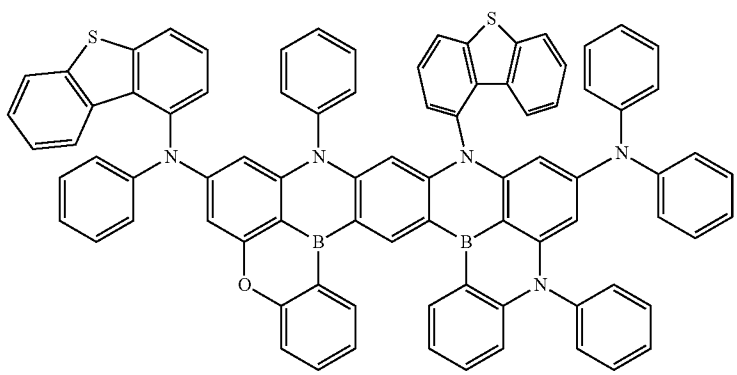
75
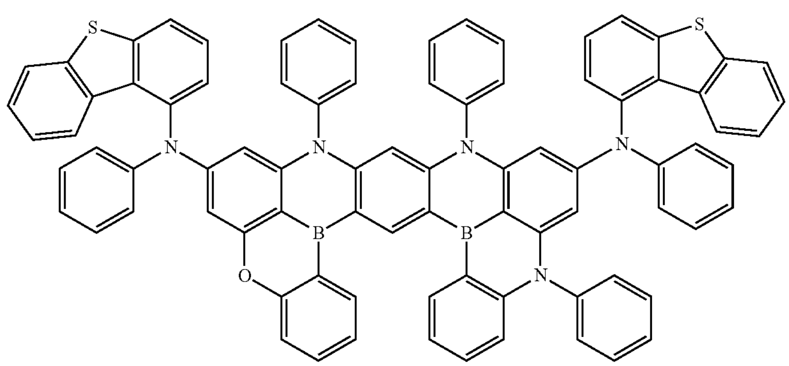
76
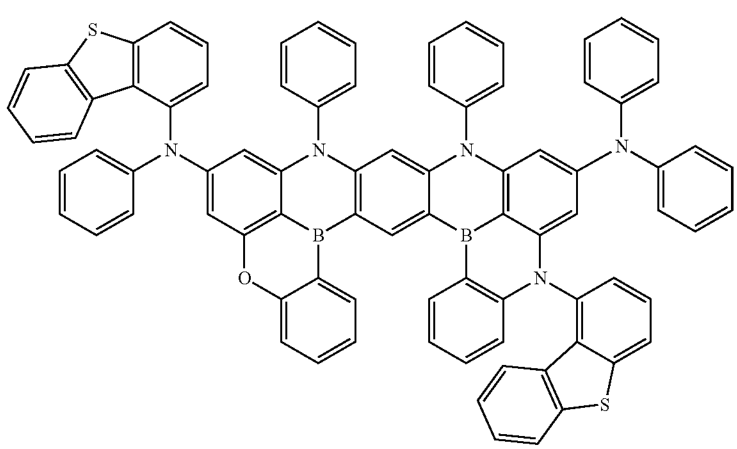

-continued
77
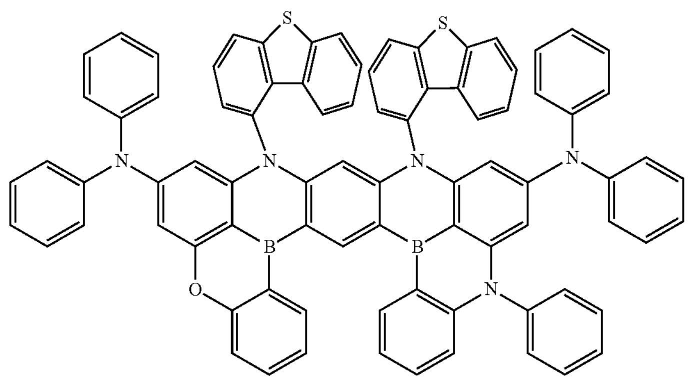
78
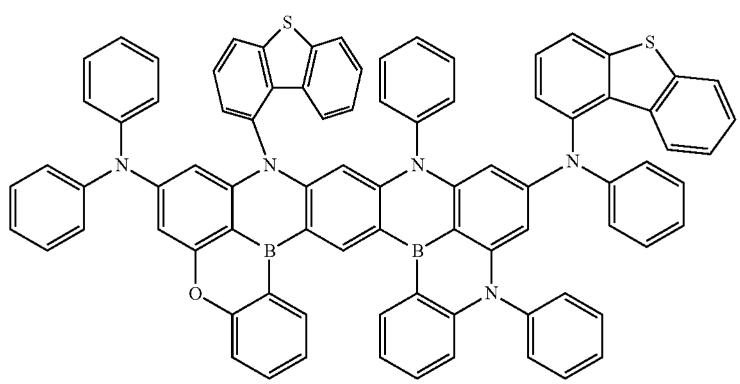
79
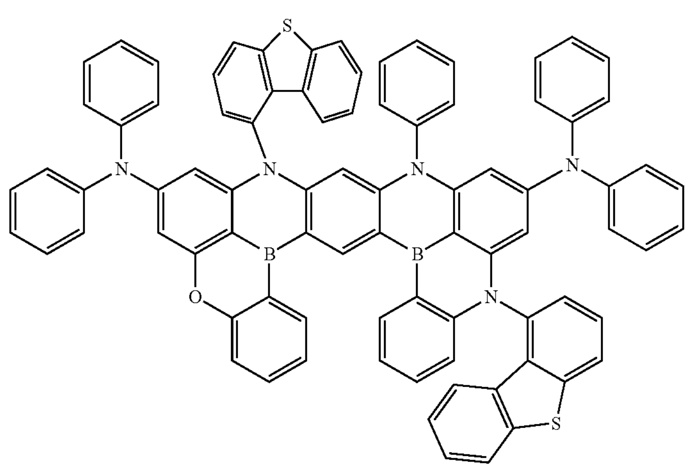

-continued
80
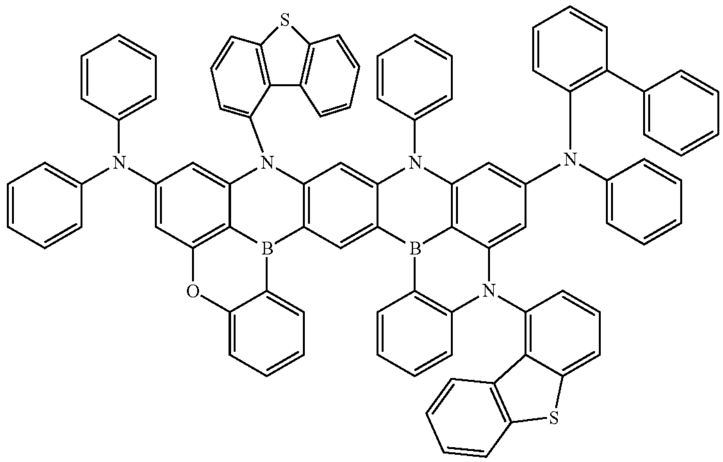
81
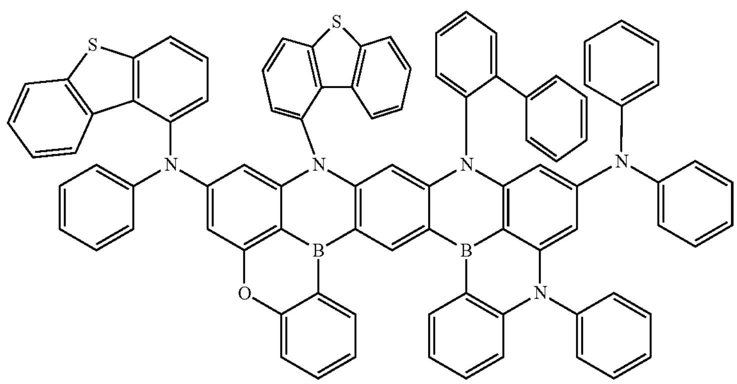
82
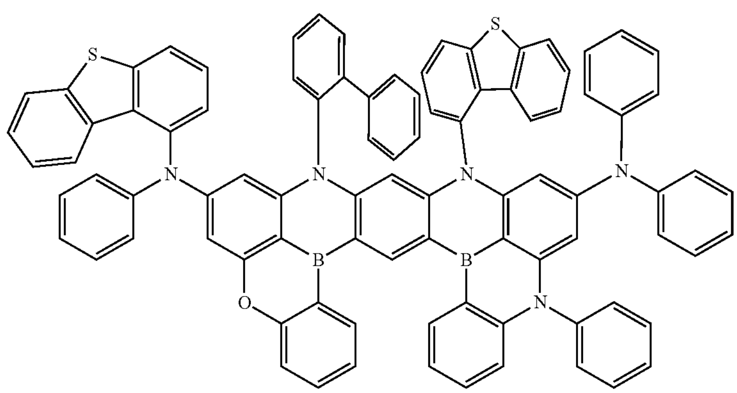
83
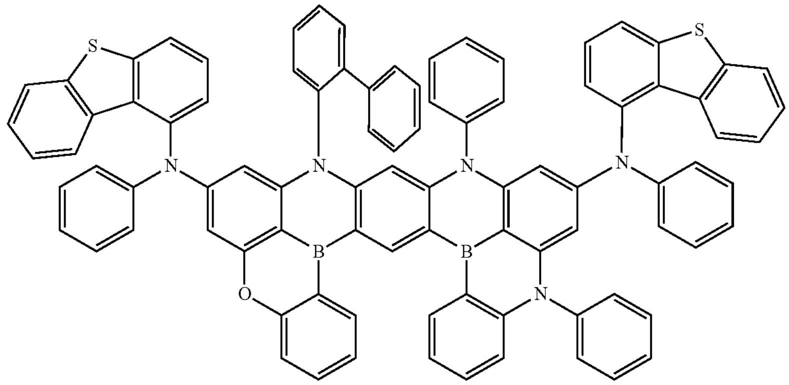

-continued
84
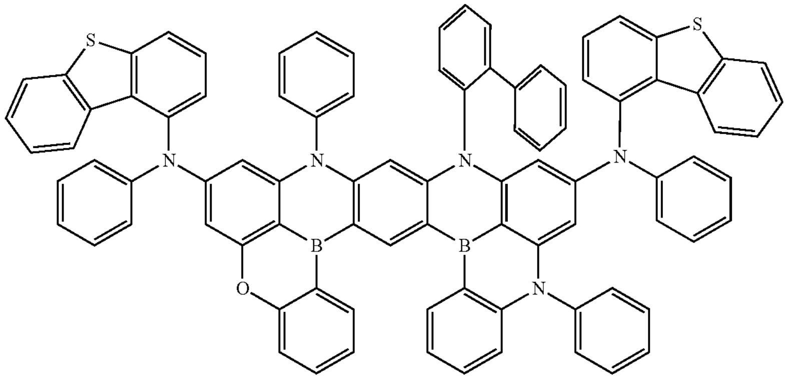
85
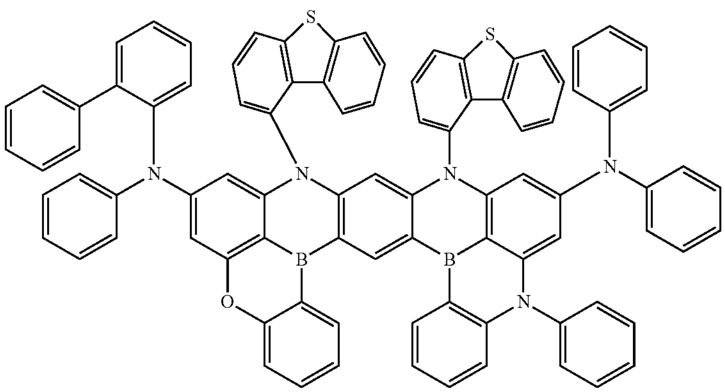
86
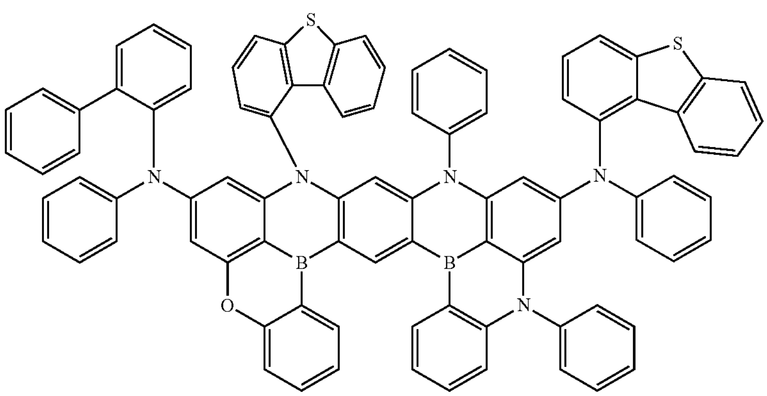
87
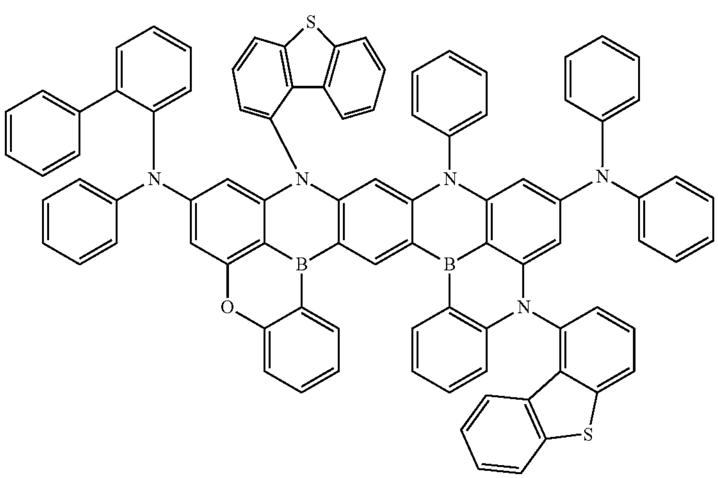

-continued
88
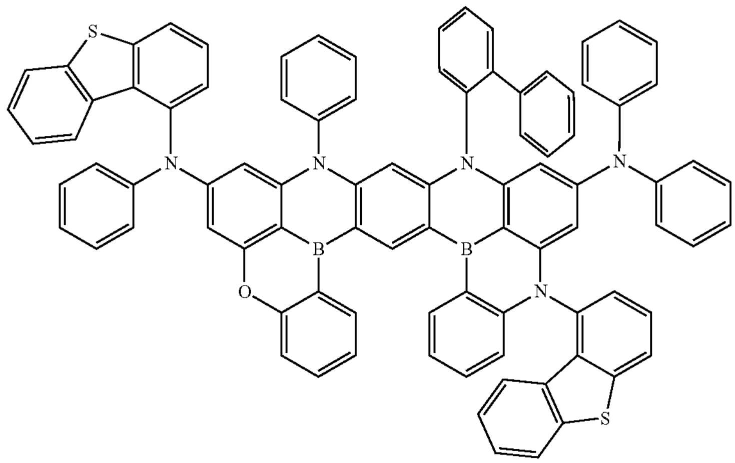
89
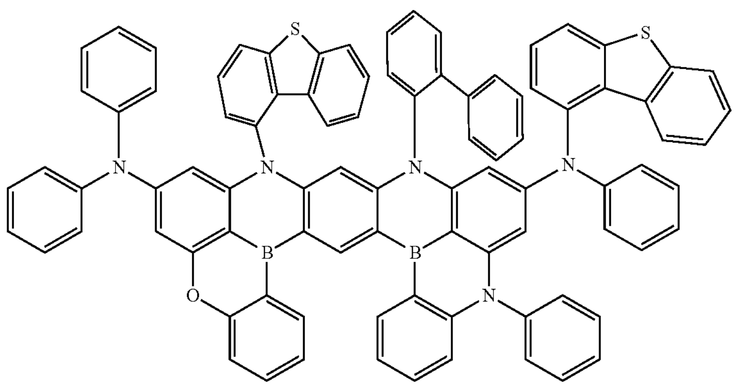
90
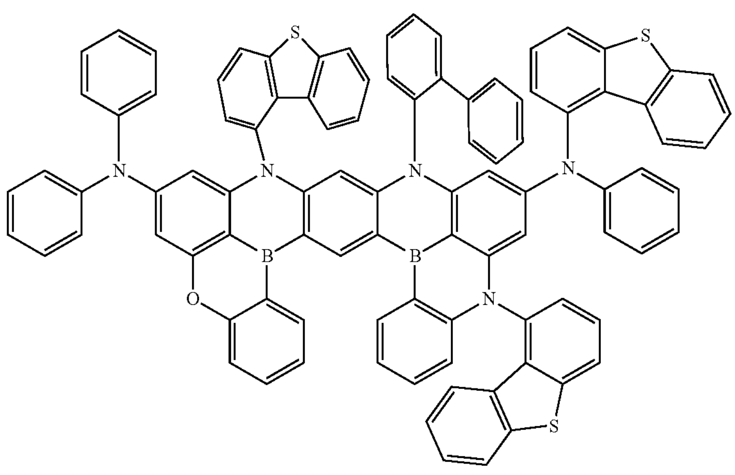

-continued
91
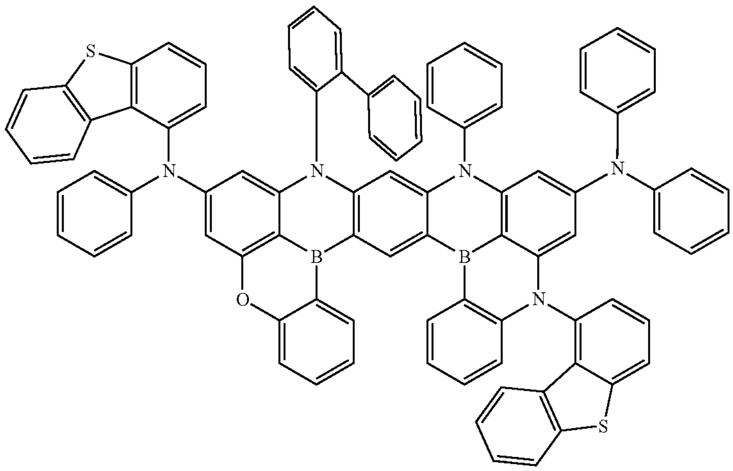
92
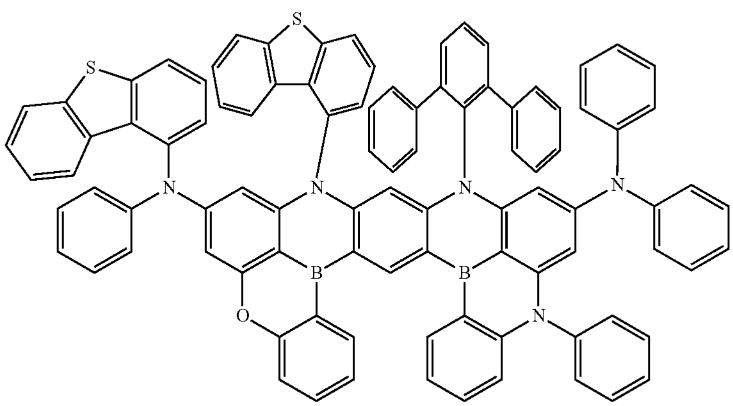
93
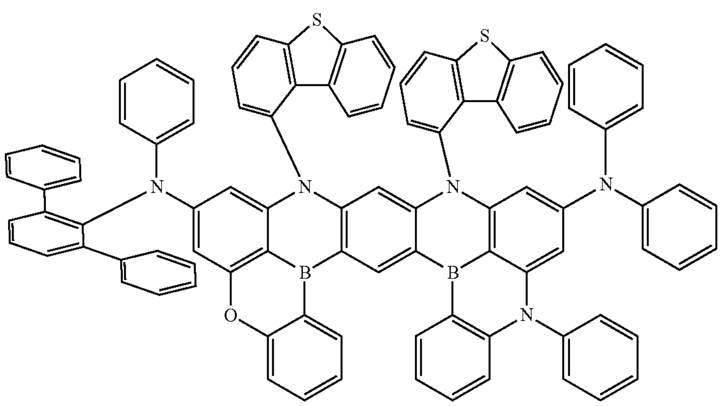
94
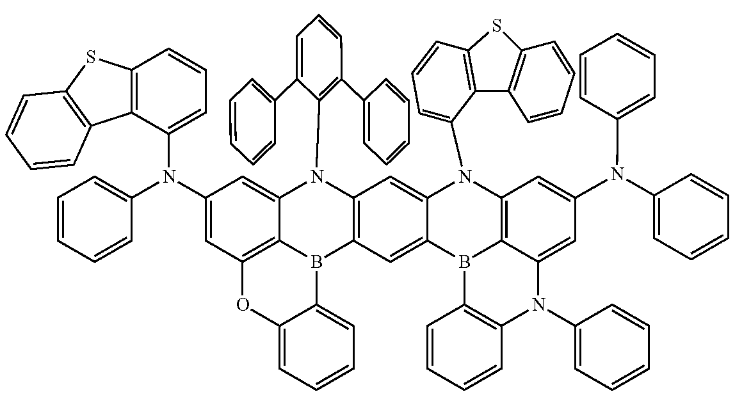

-continued
95
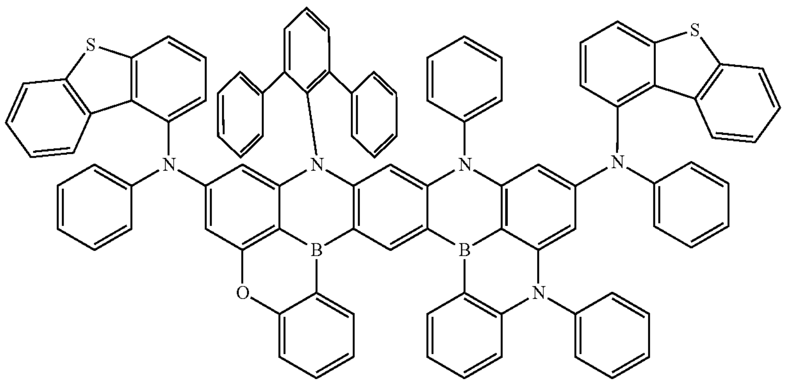
96
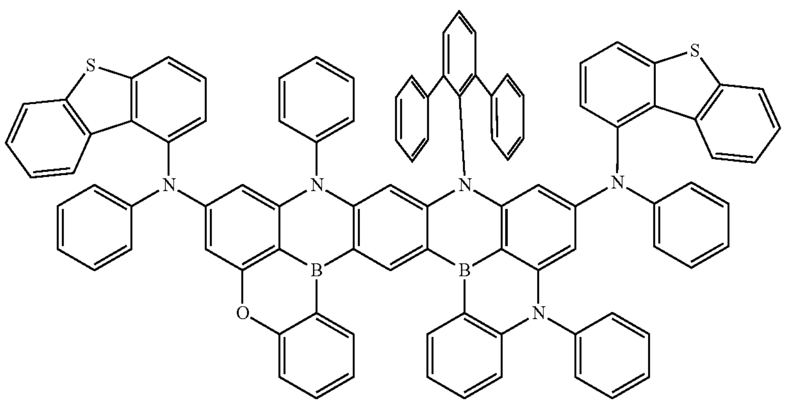
97
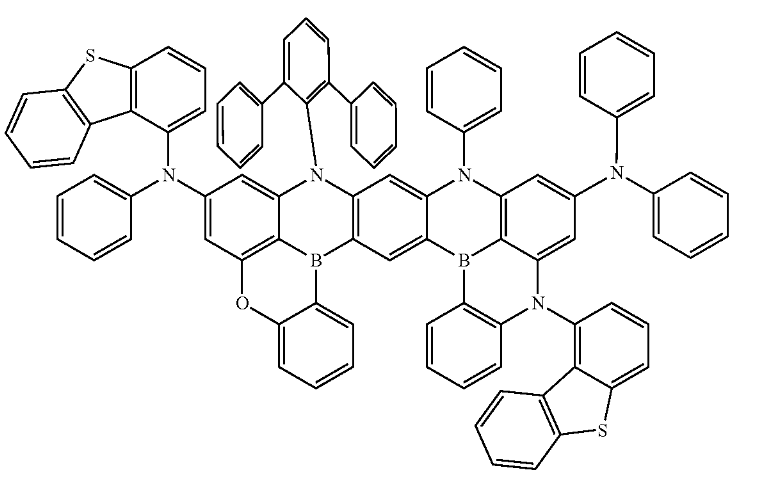
98
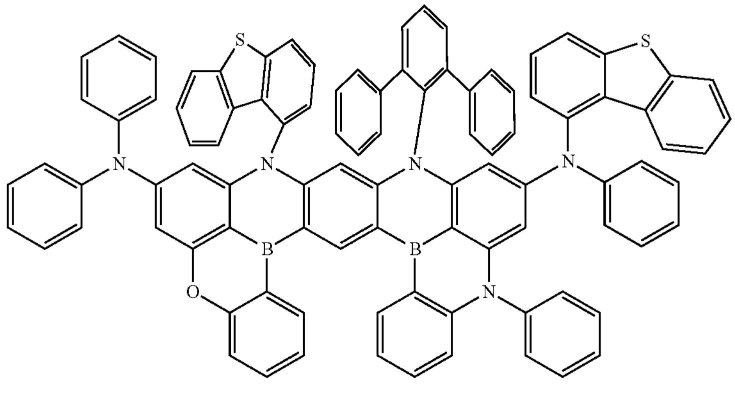

-continued
99
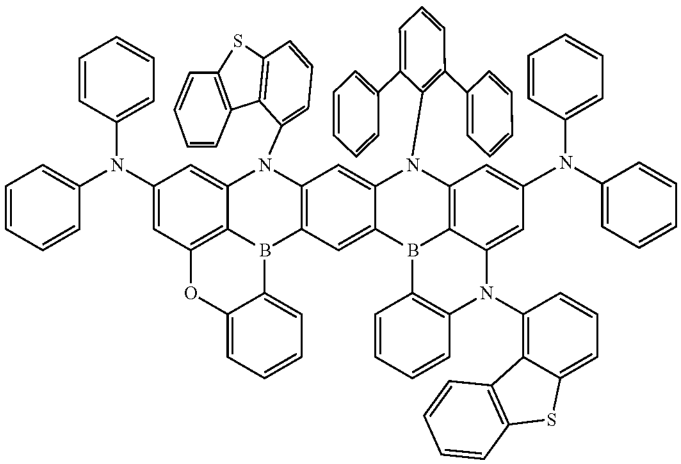
100
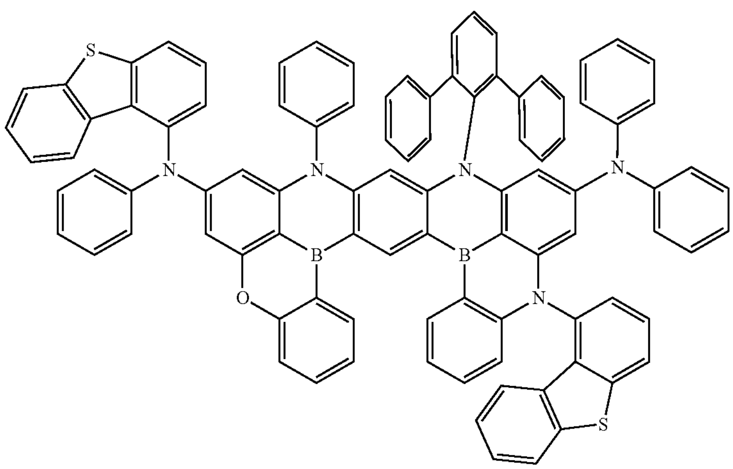
101
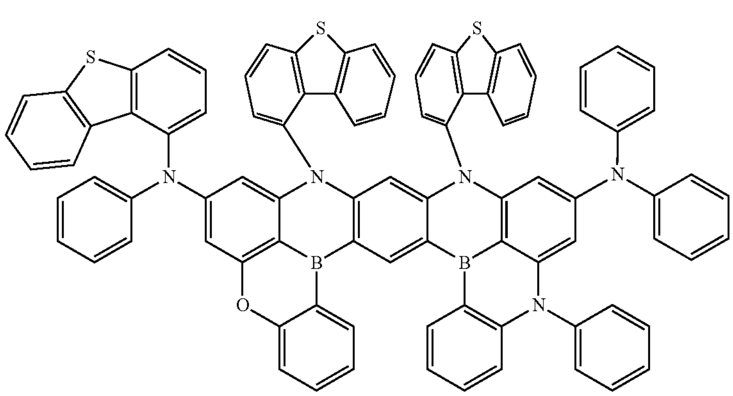

-continued
103
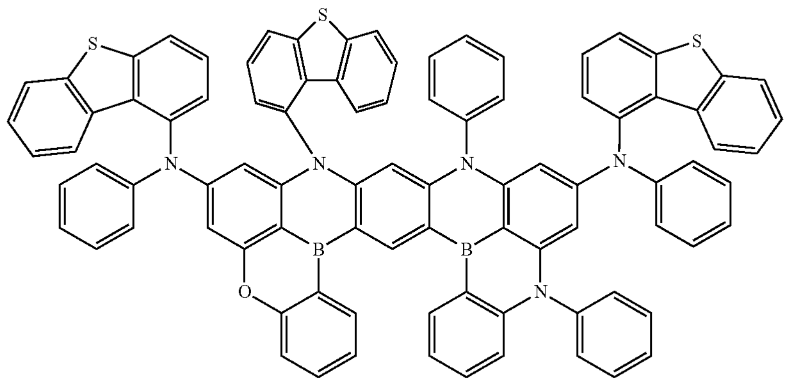
104
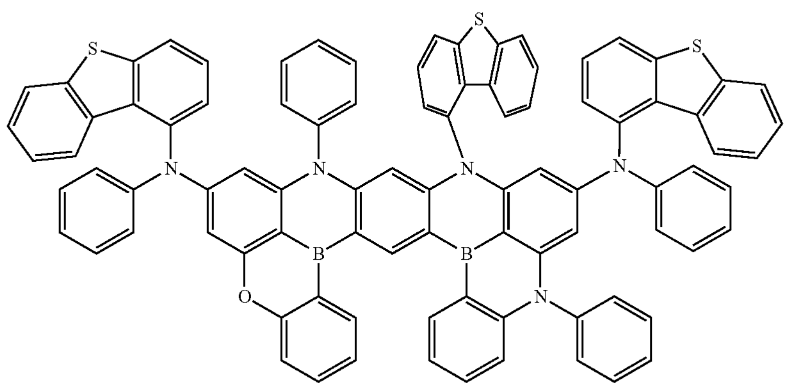
107
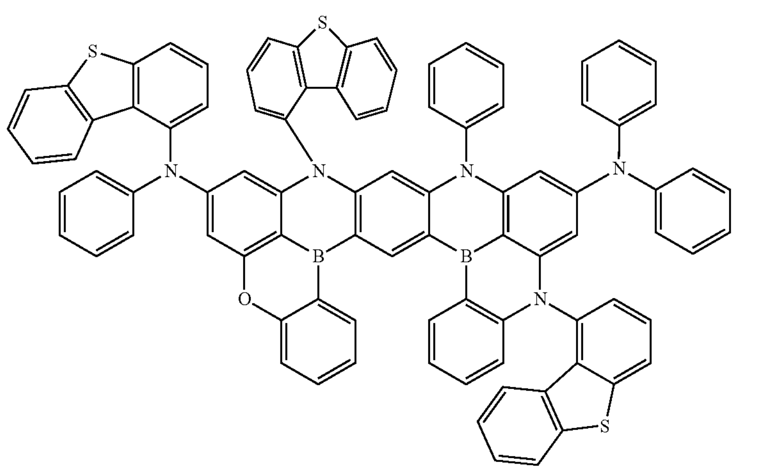

-continued
108
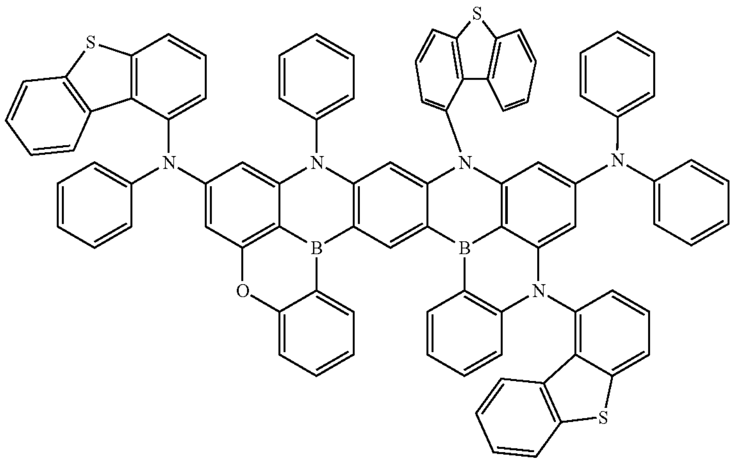
109
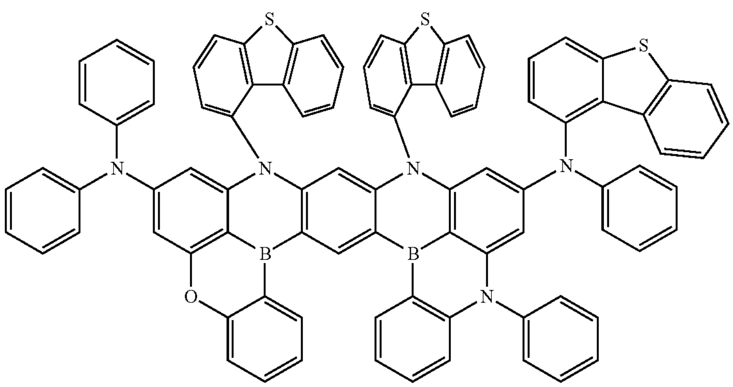
110
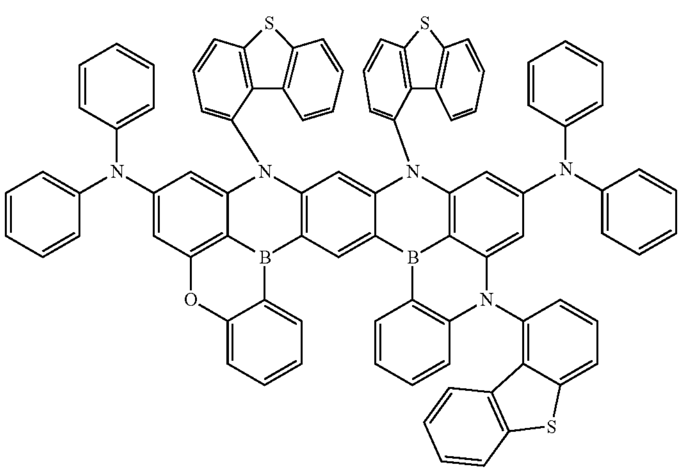

-continued
111
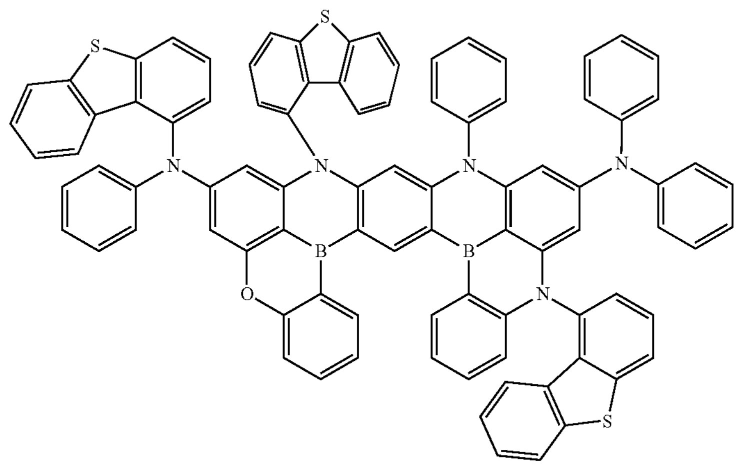
112
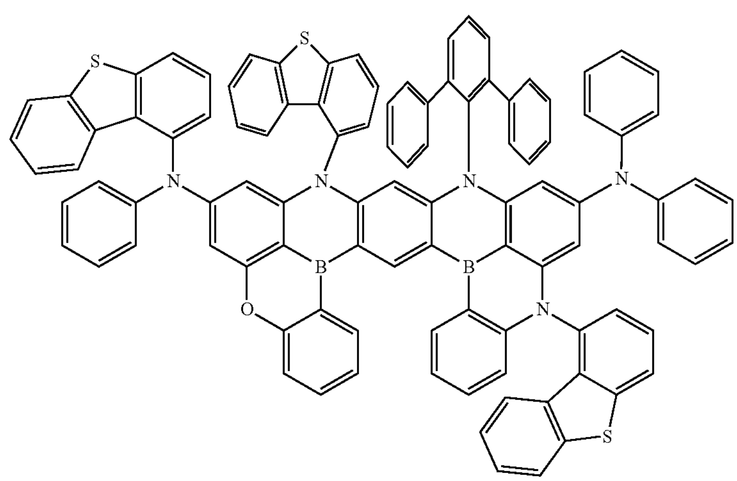
113
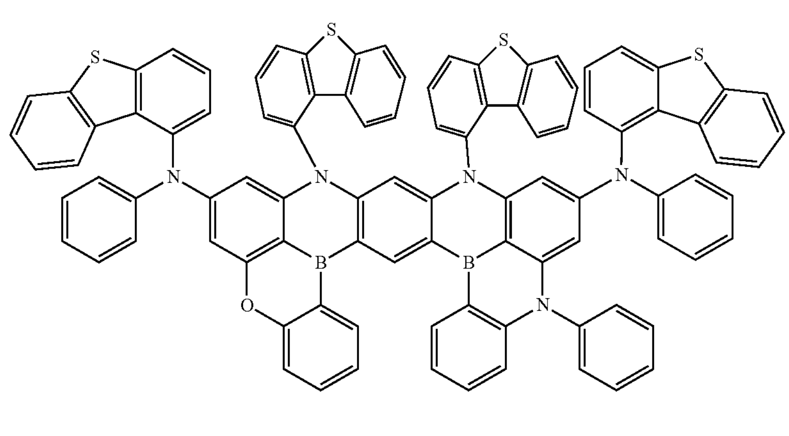

-continued
114
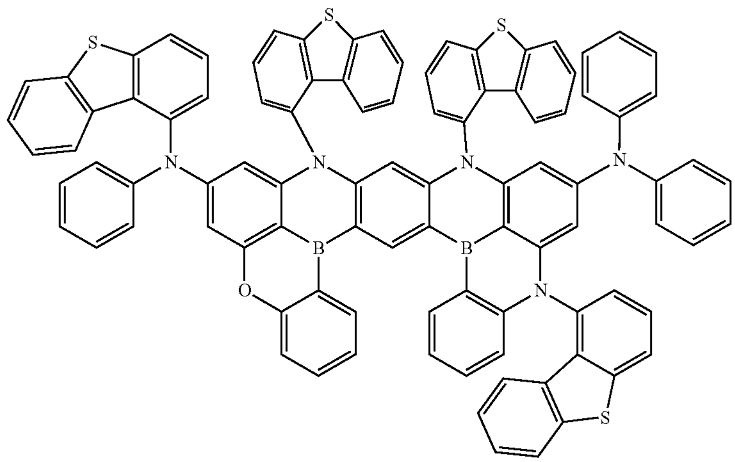
115
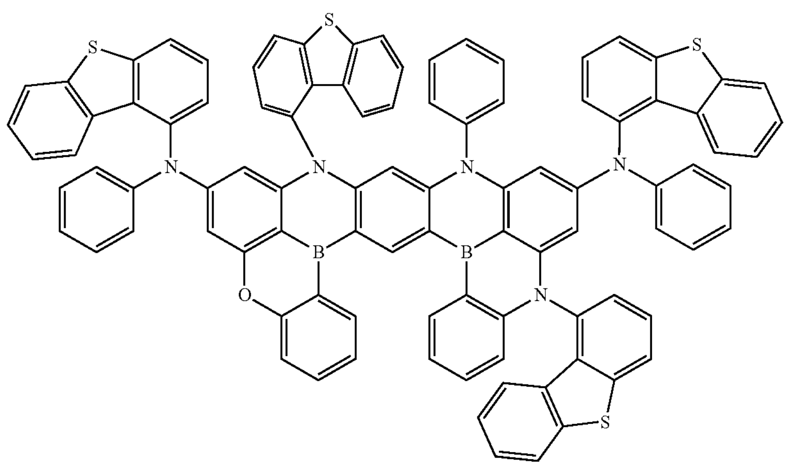
116
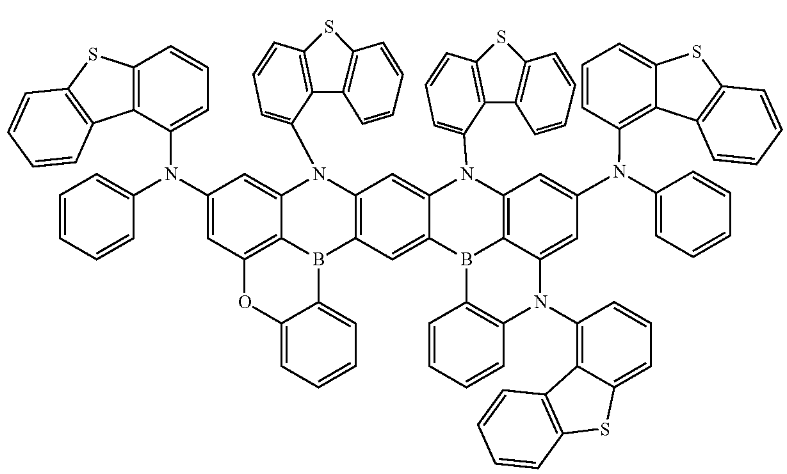

-continued
117
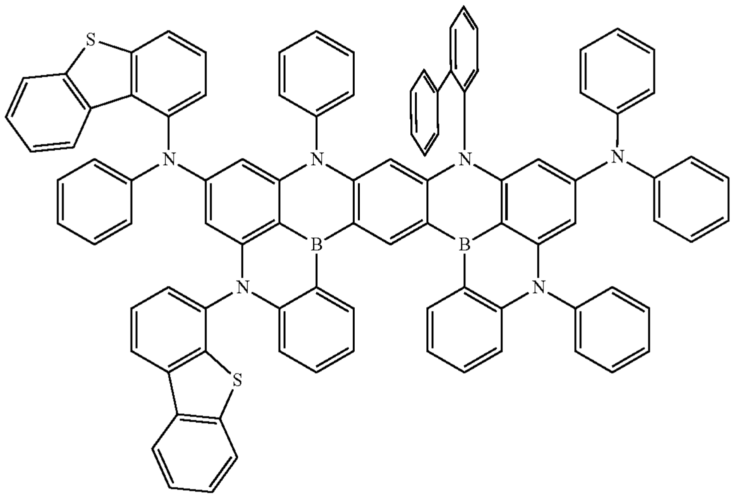
118
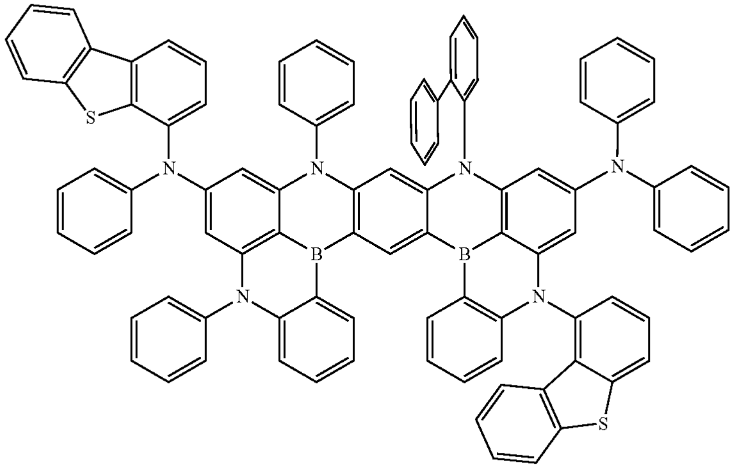
119
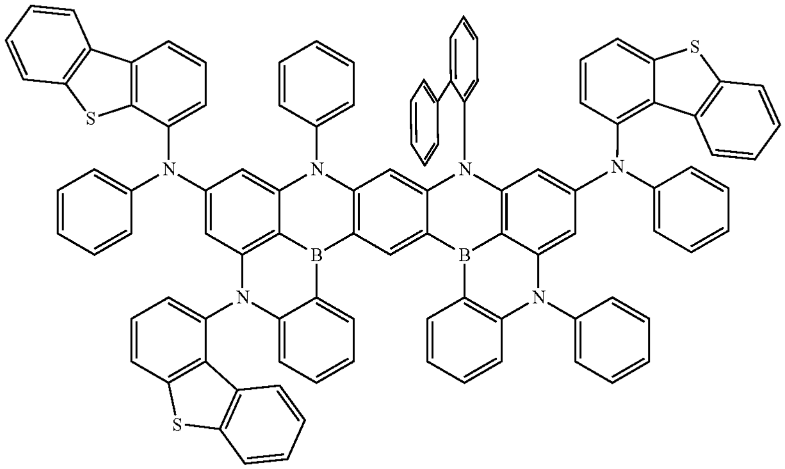

-continued
120
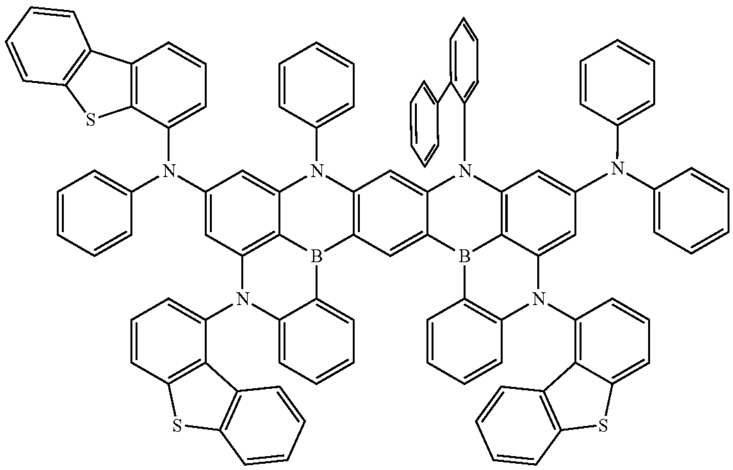
121
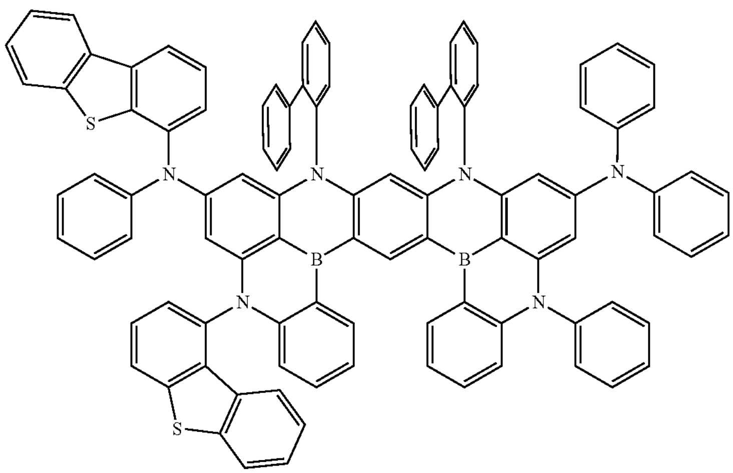
122
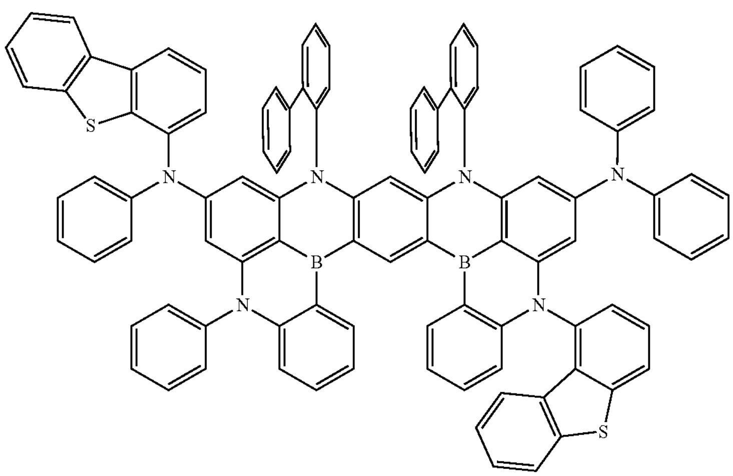

-continued
123
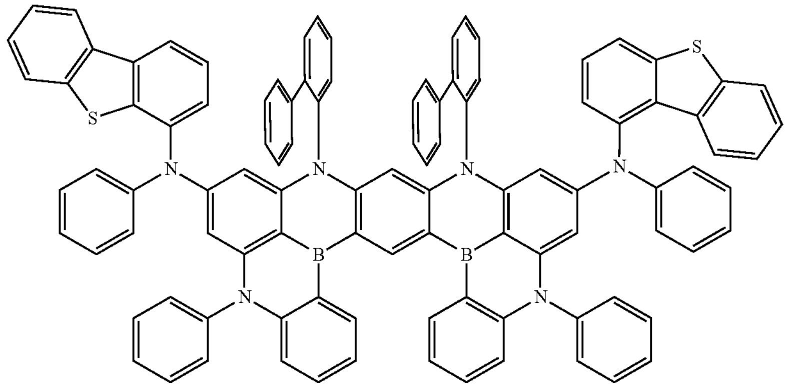
124
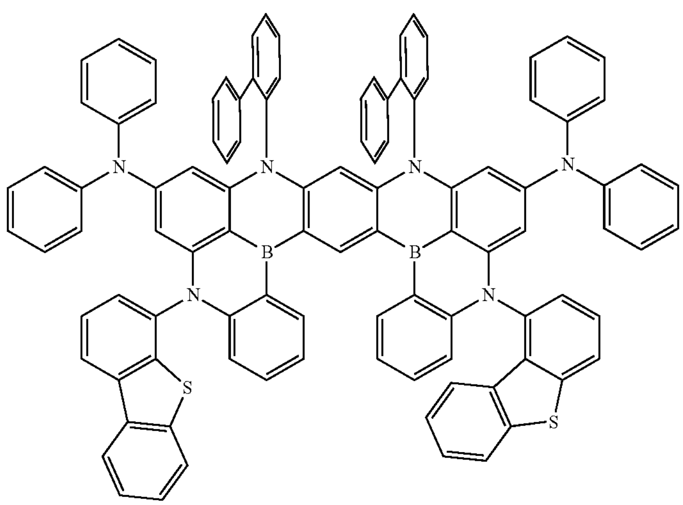
125
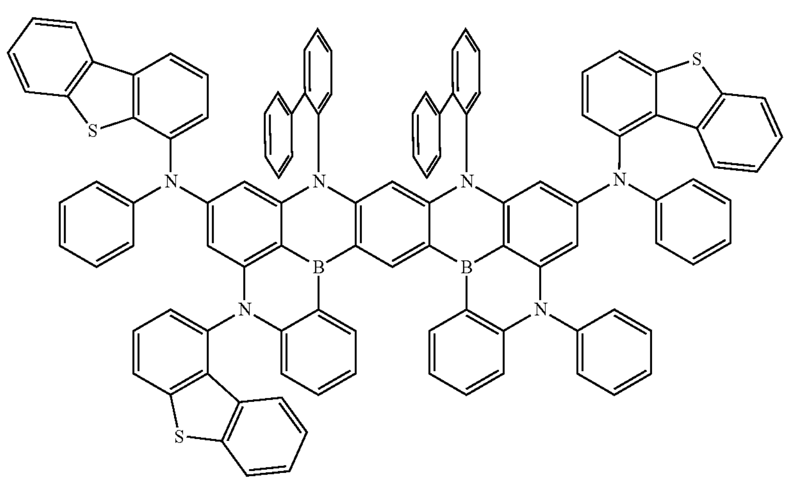

-continued
126
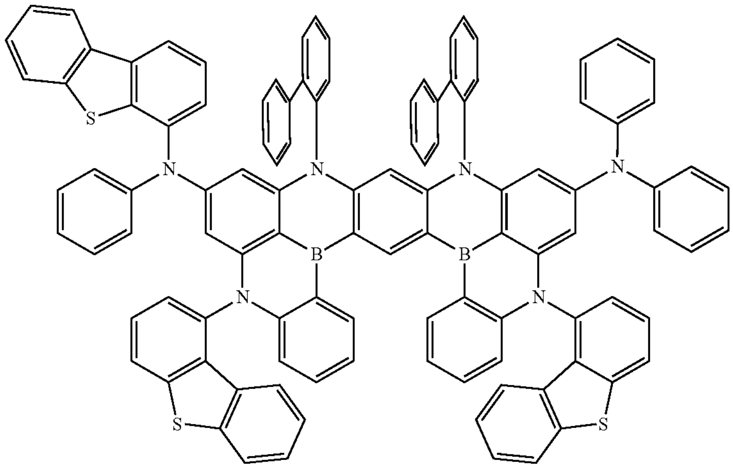
127
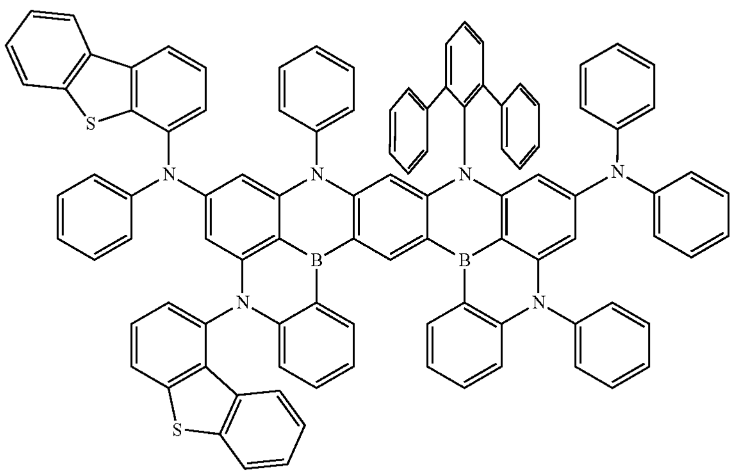
128
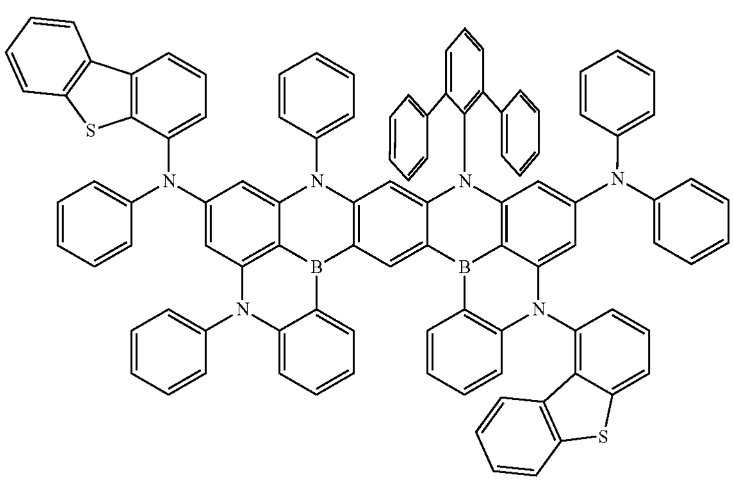

-continued
129
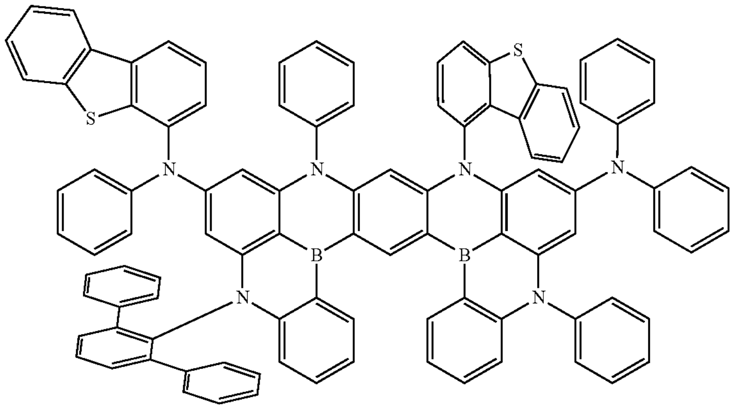
130
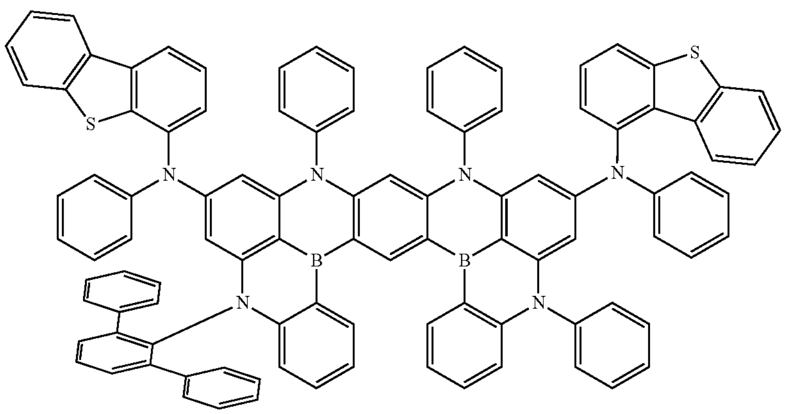
131
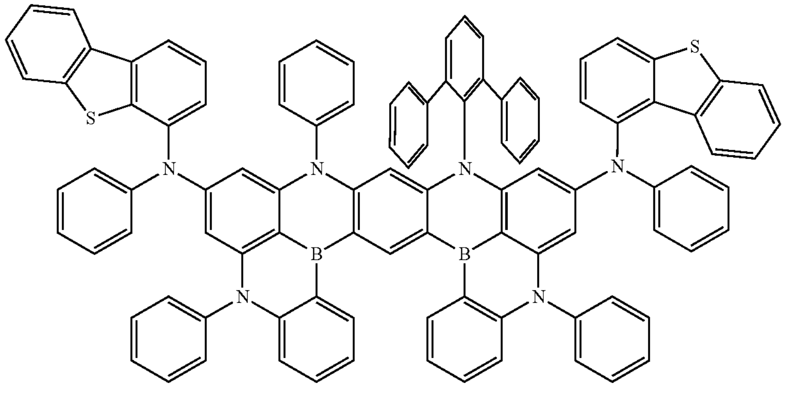

-continued
132
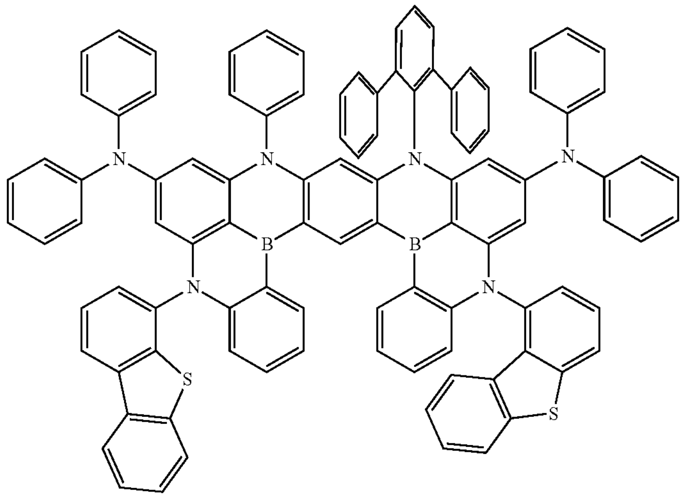
133
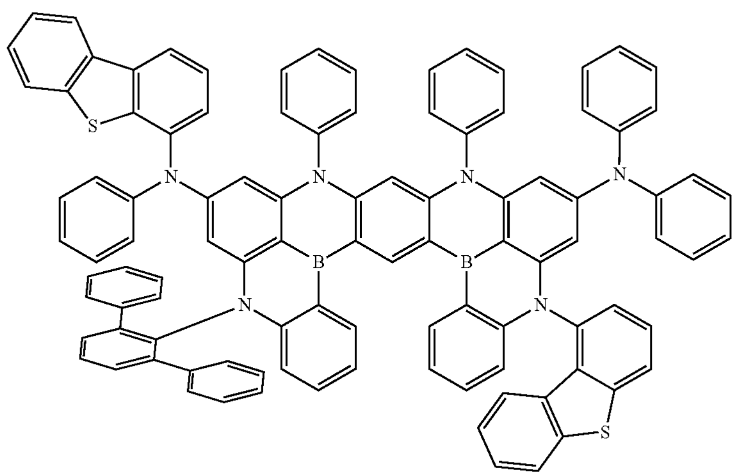
134
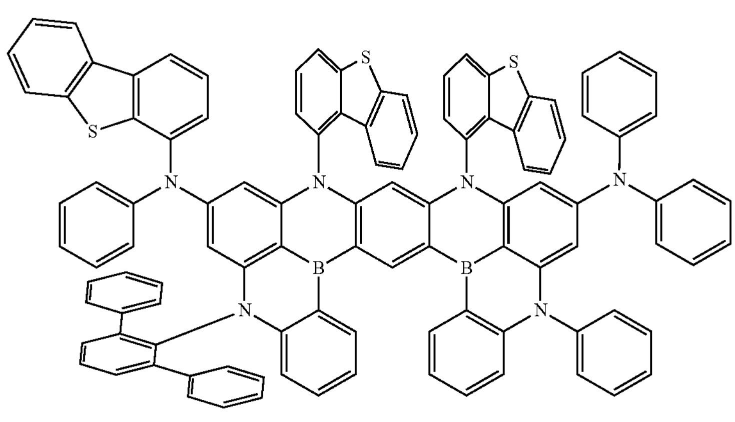

-continued
135
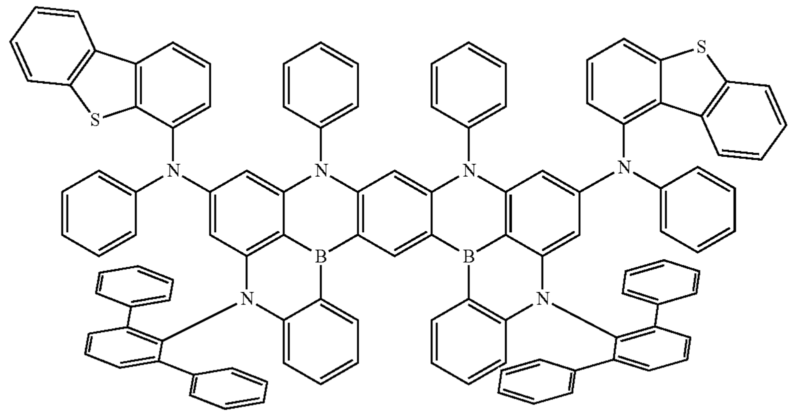
136
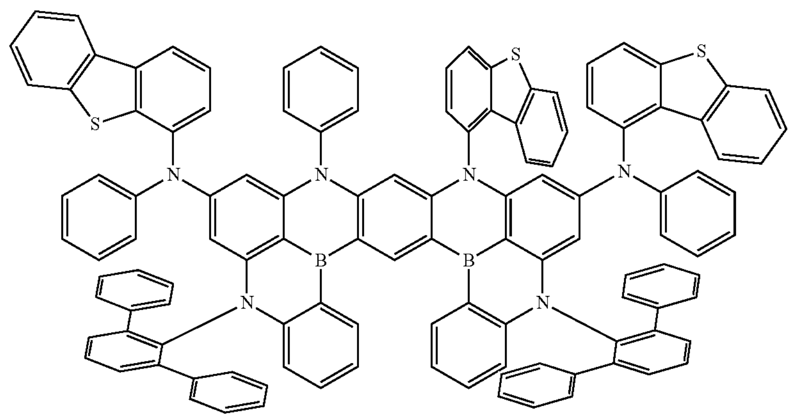
137
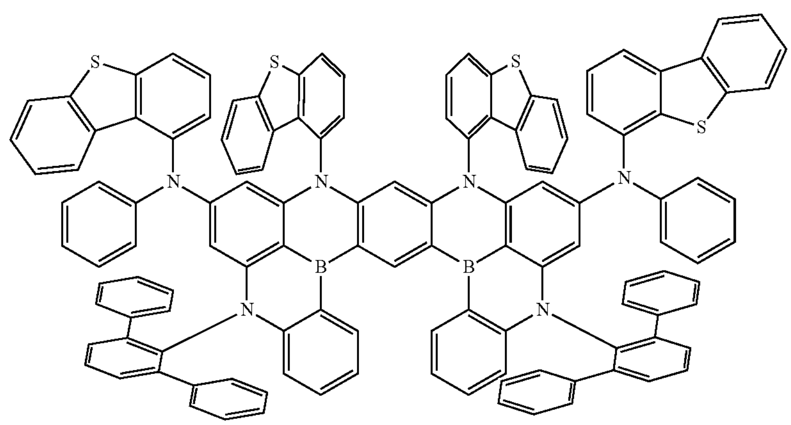

-continued
138
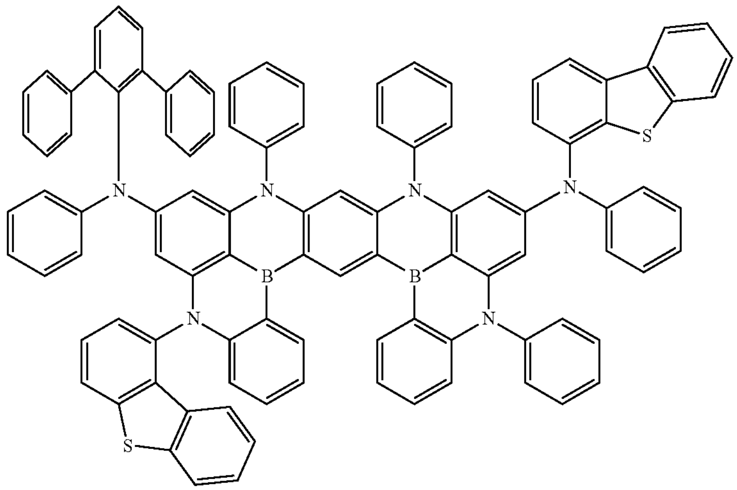
139
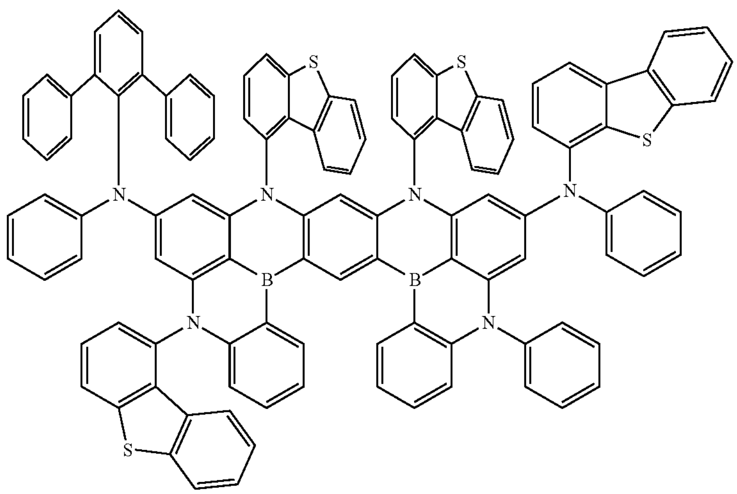
140
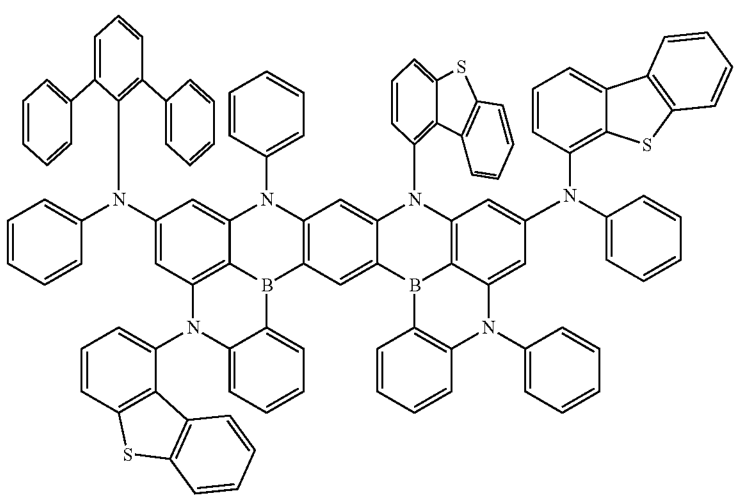

-continued
141
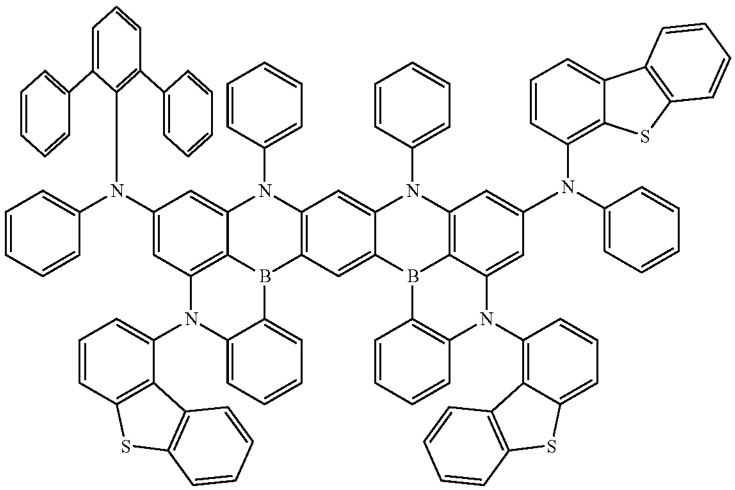
142
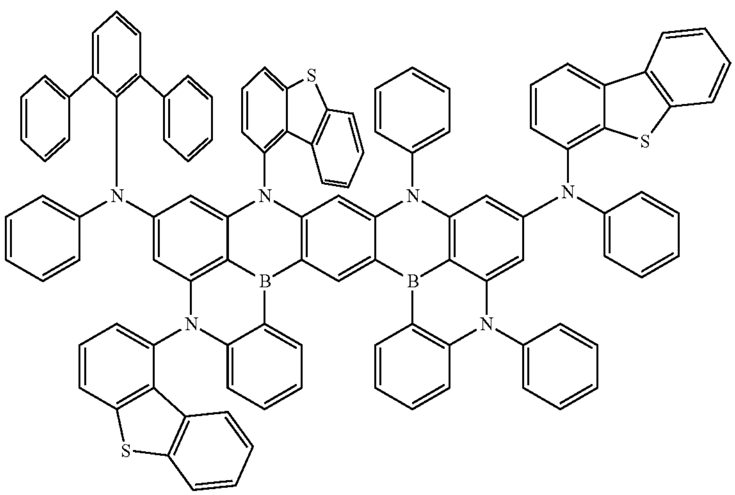
143
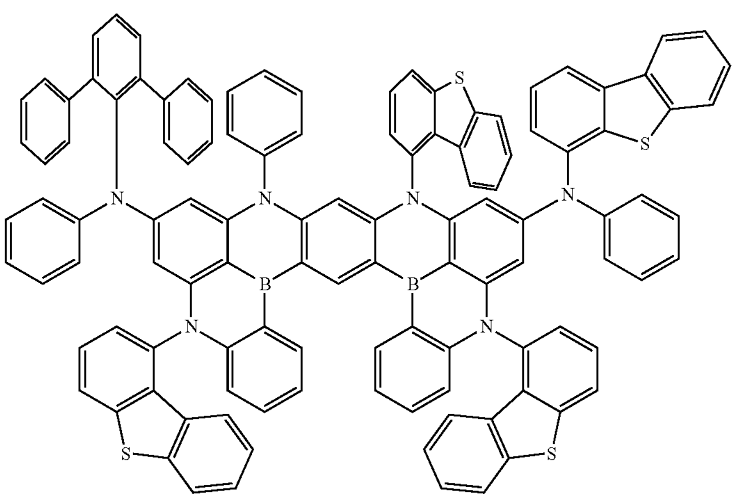

-continued
144
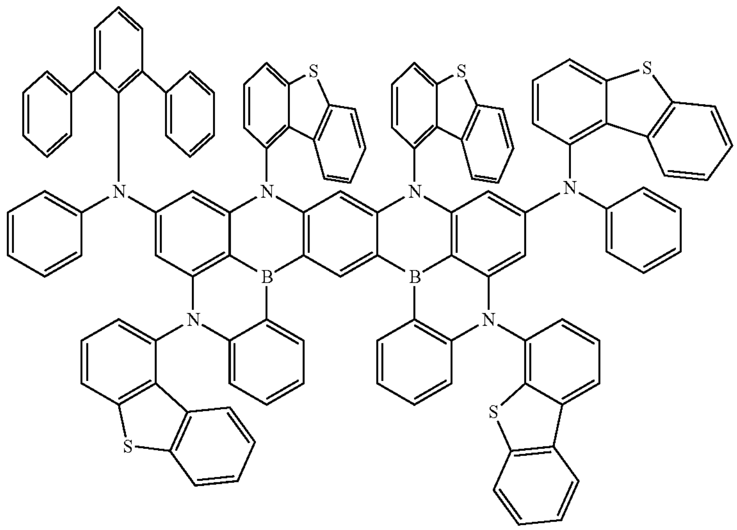
145
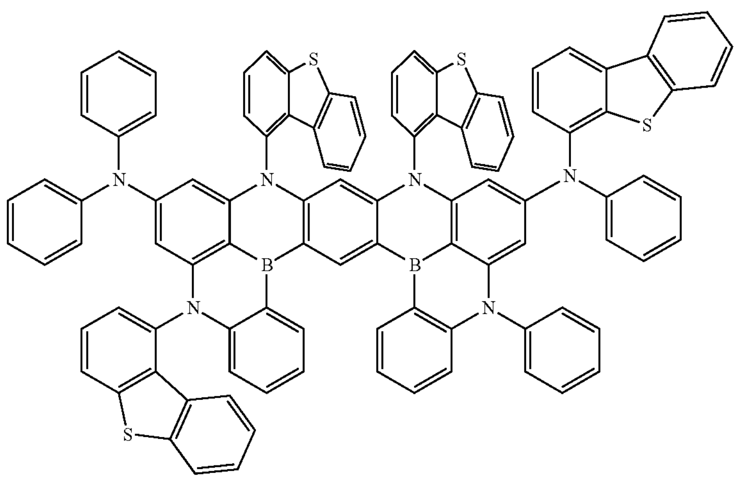
147
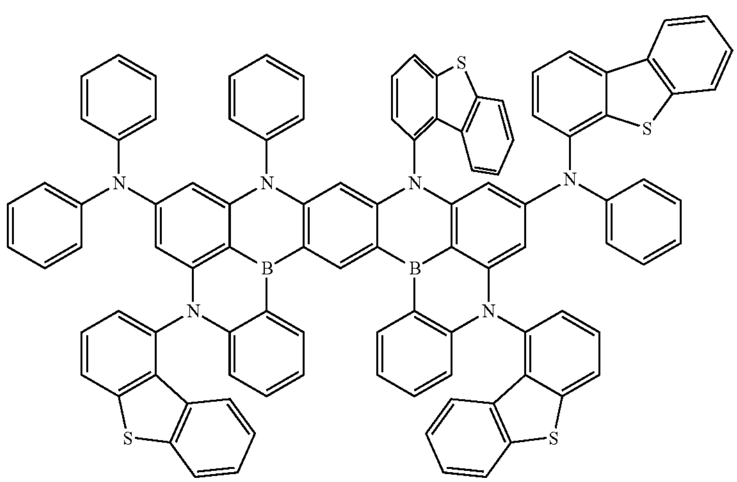

-continued
148
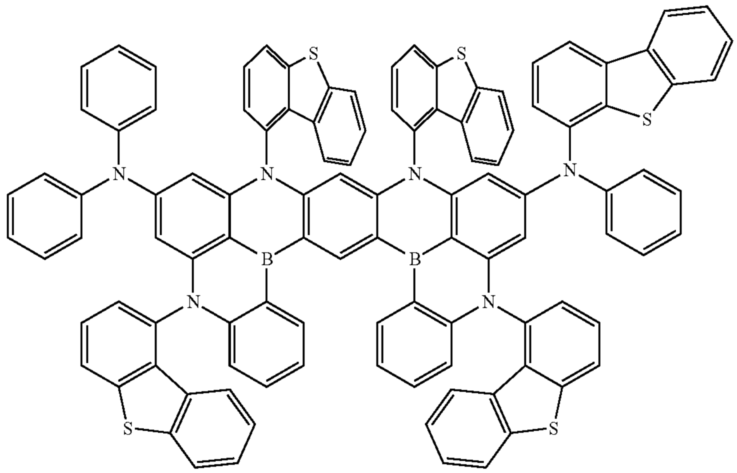
149
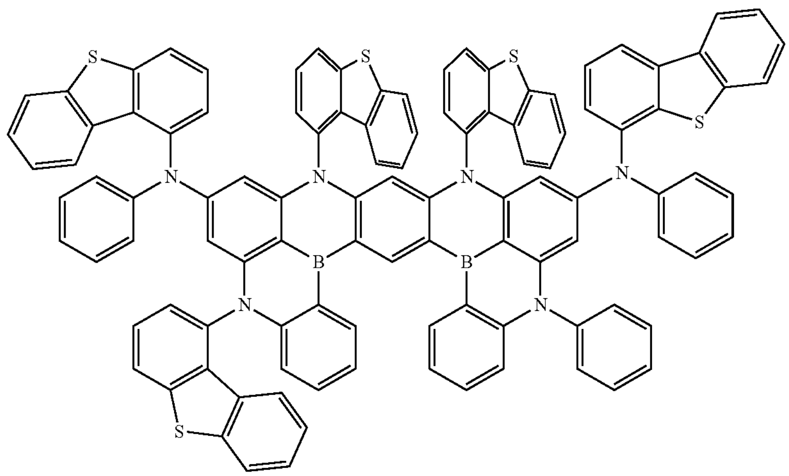
150
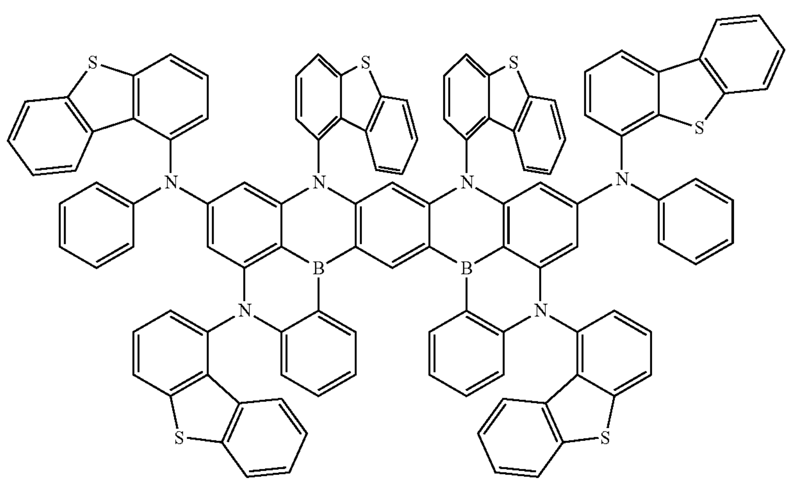

-continued
151
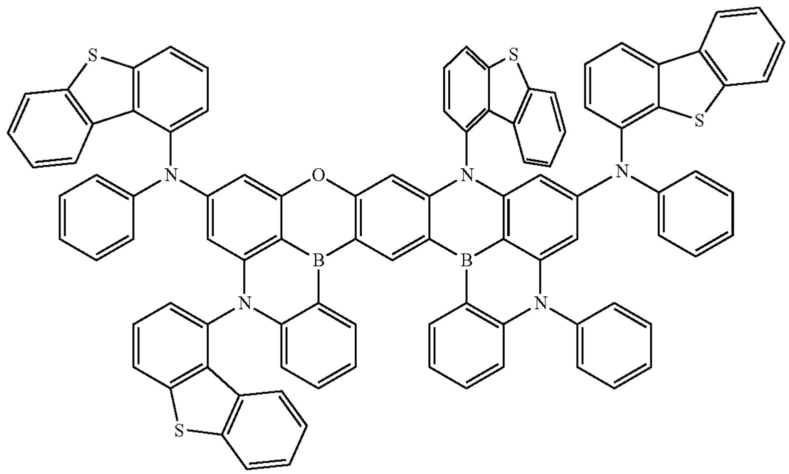
152
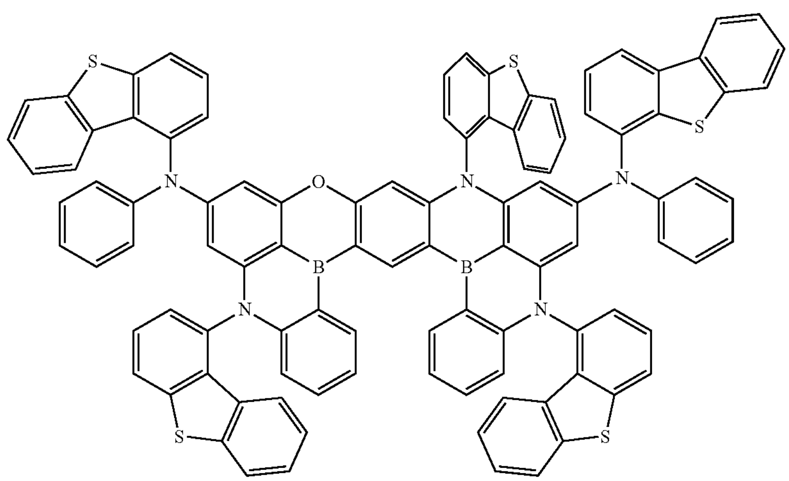
153
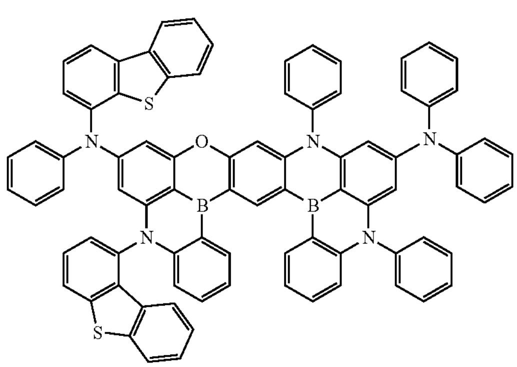
154
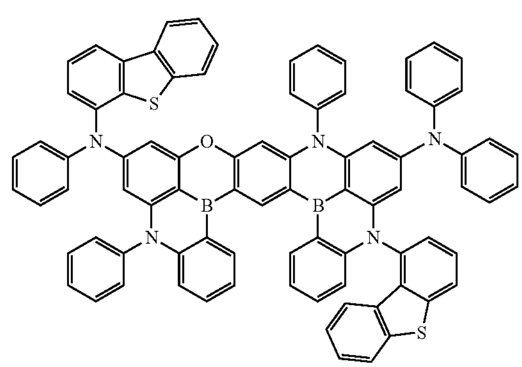

-continued
155
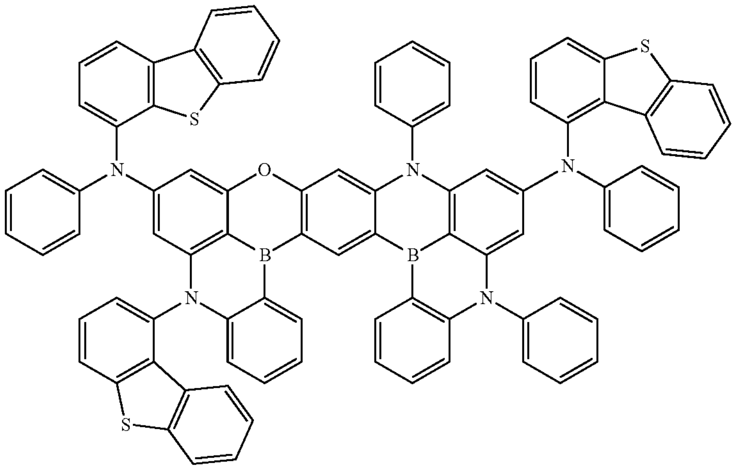
156
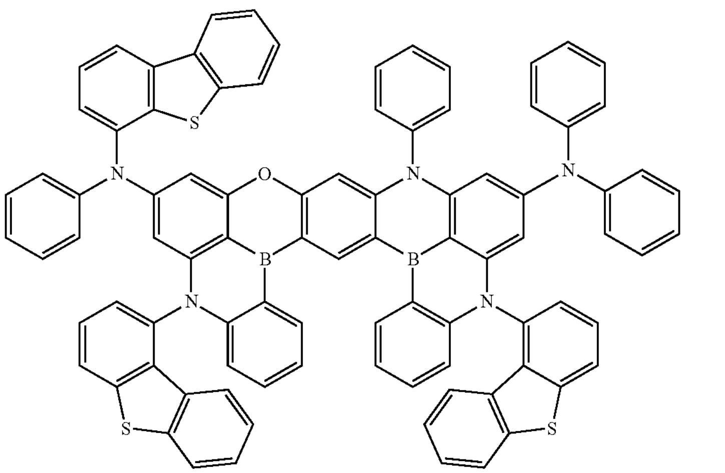
157
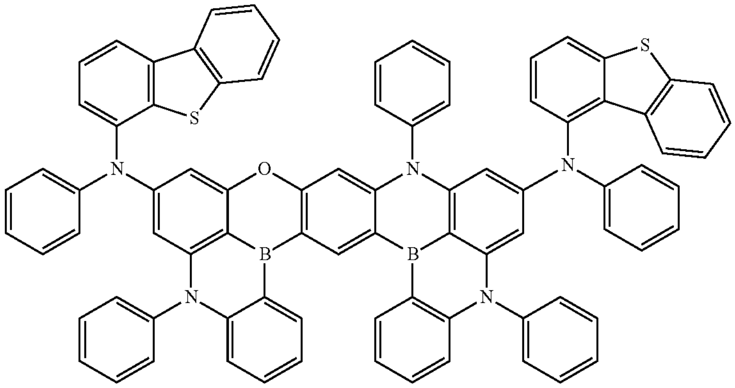

-continued
158
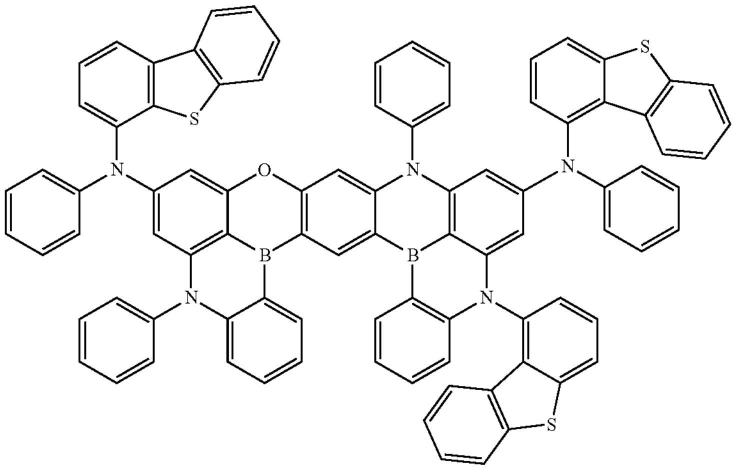
159
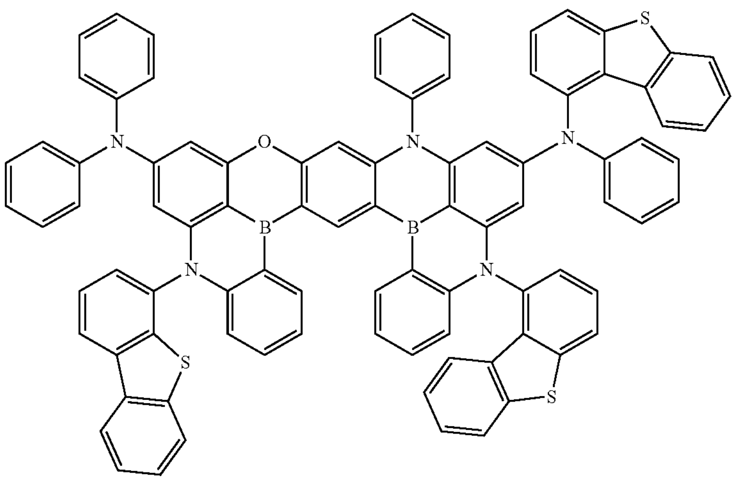
160
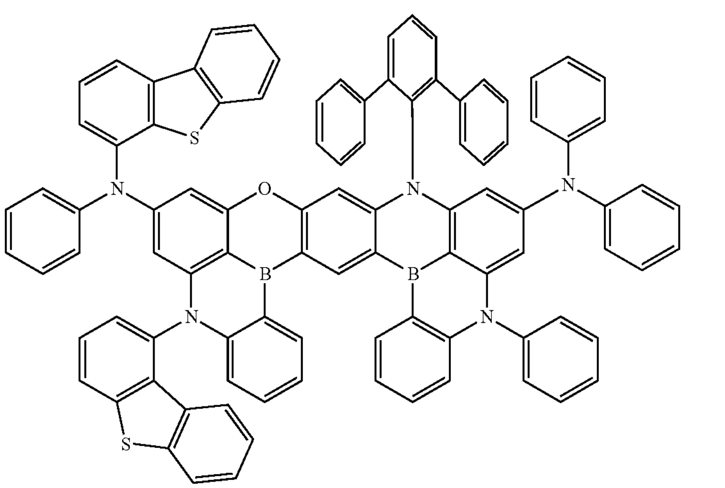

161
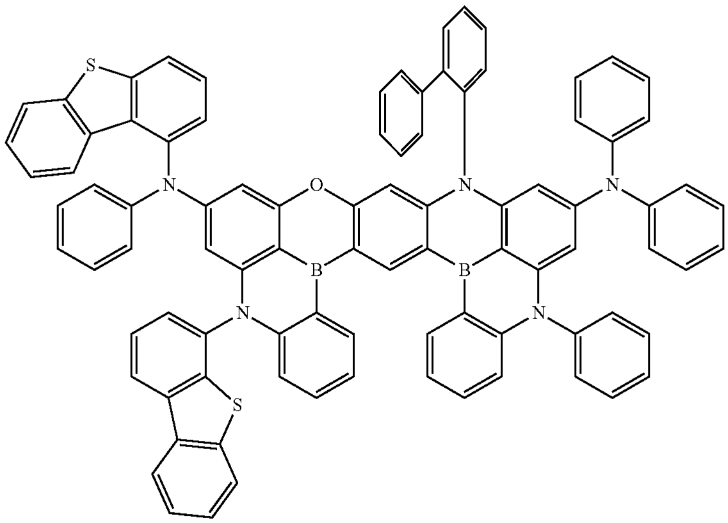
162
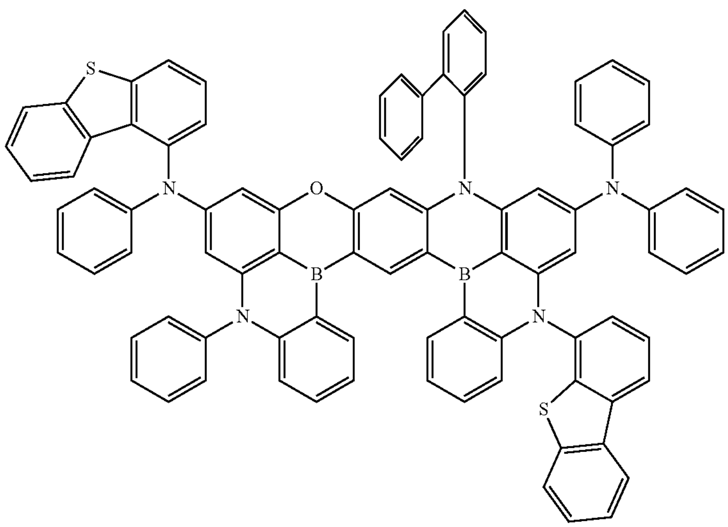
163
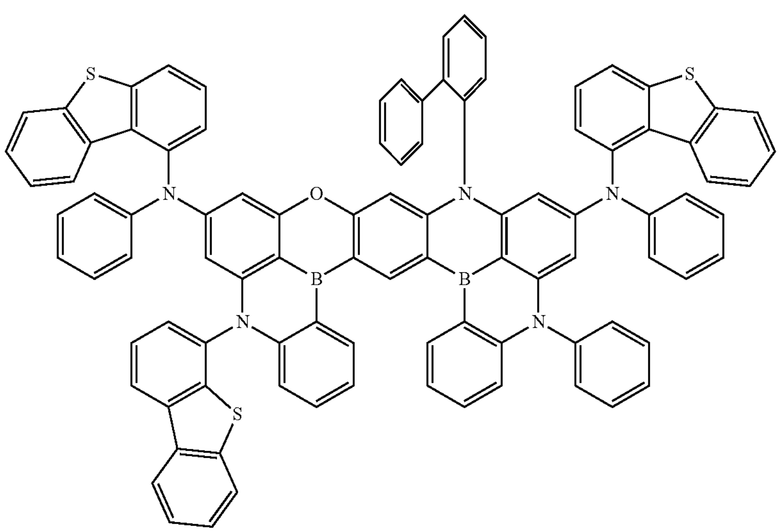

-continued
164
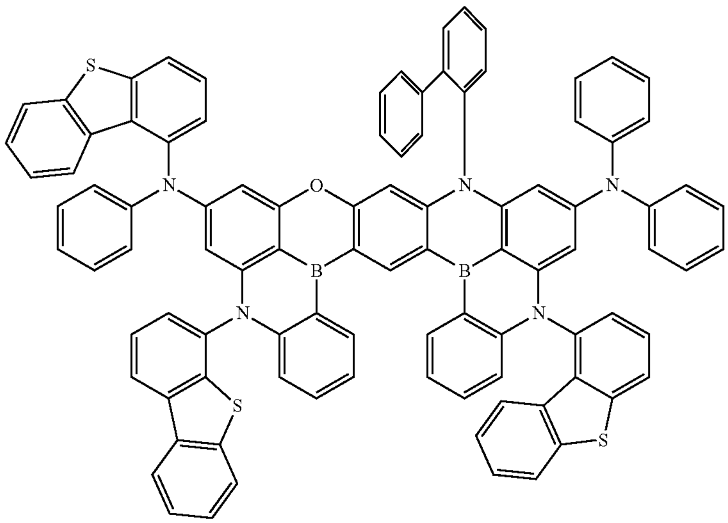
165
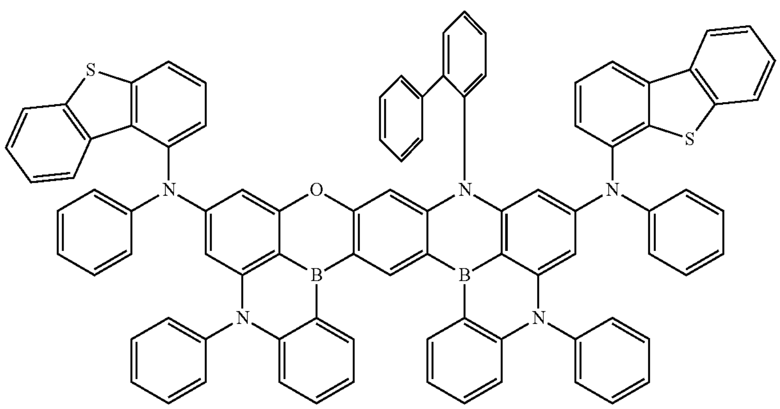
166
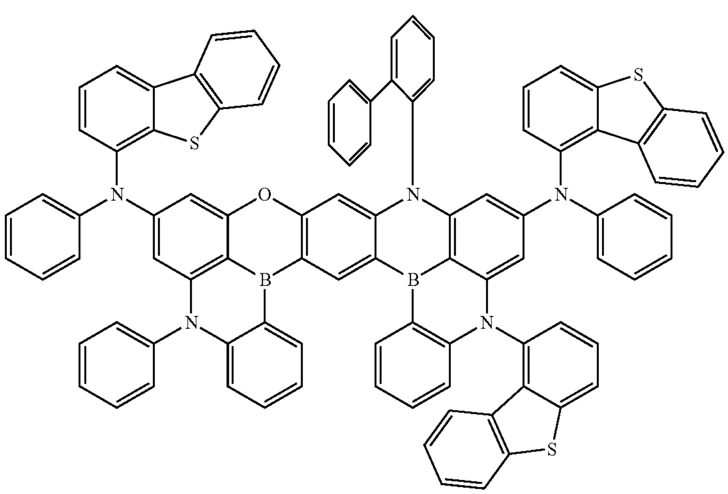

-continued
167
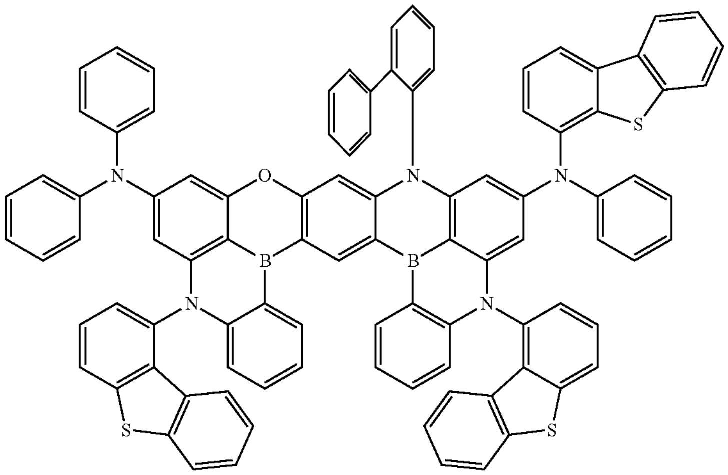
168
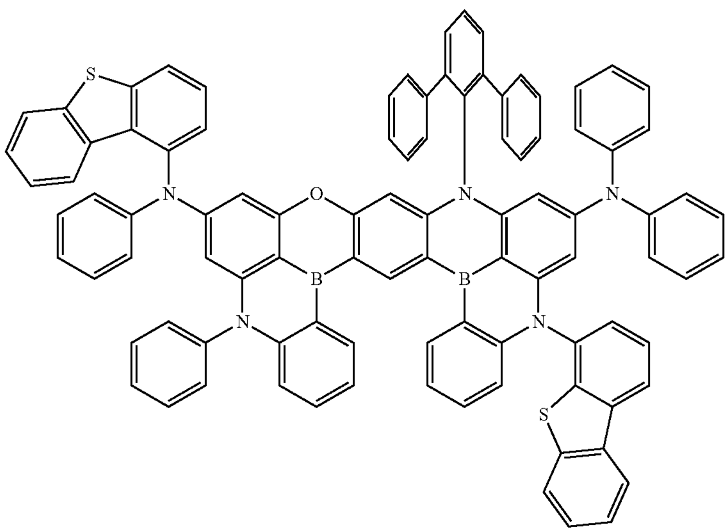
169
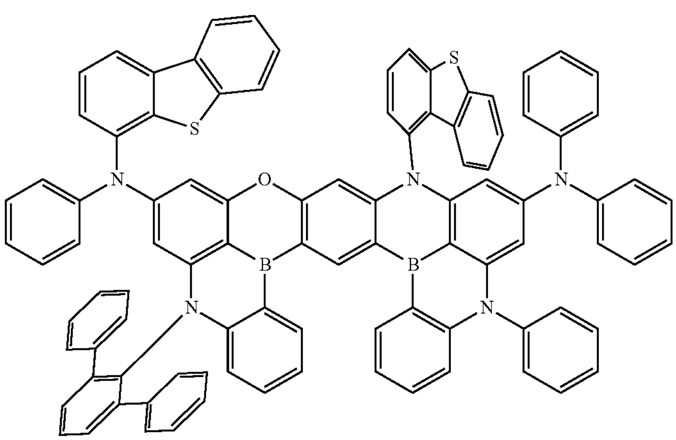

-continued
170
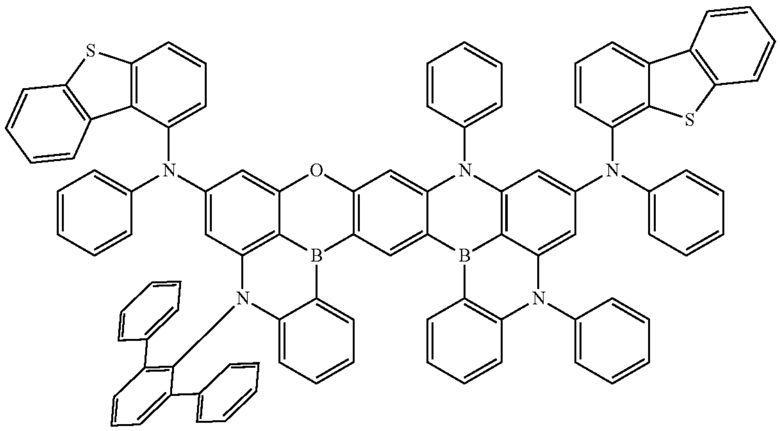
171
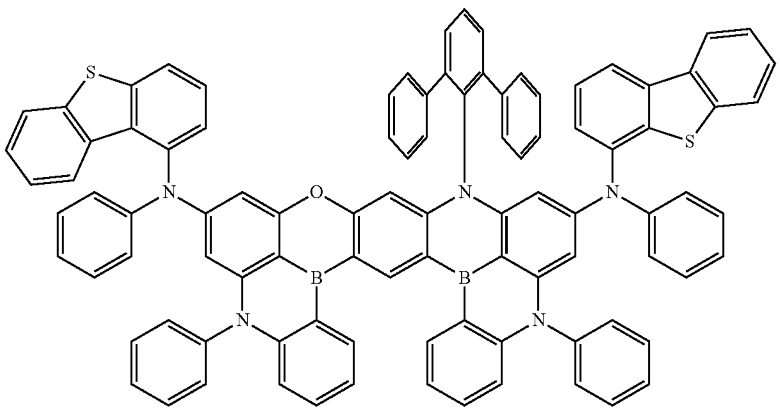
172
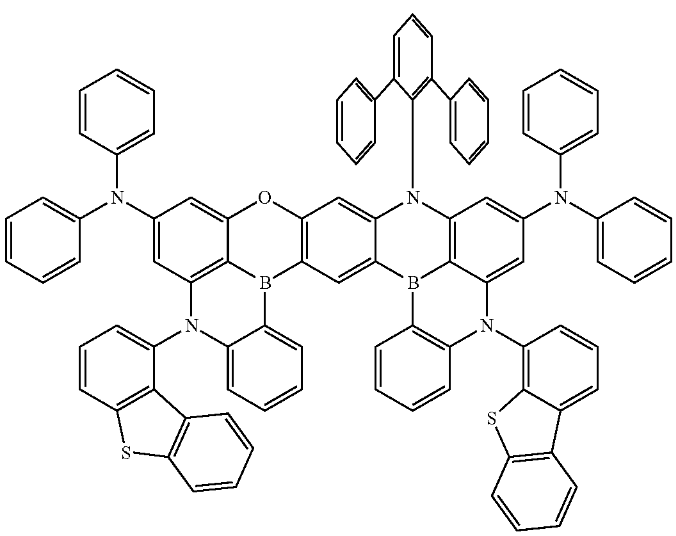

-continued
173
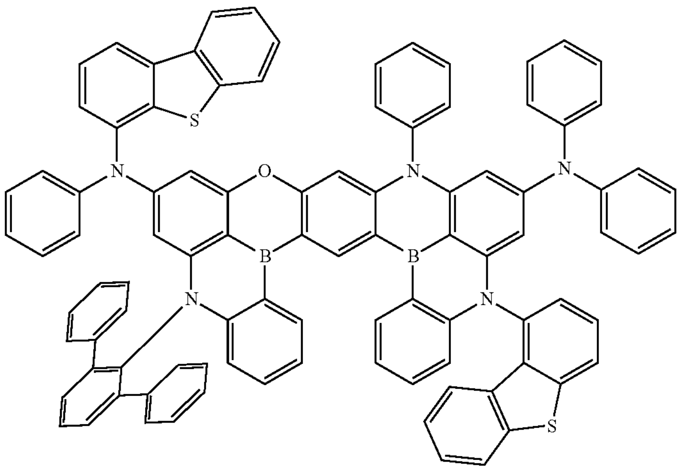
175
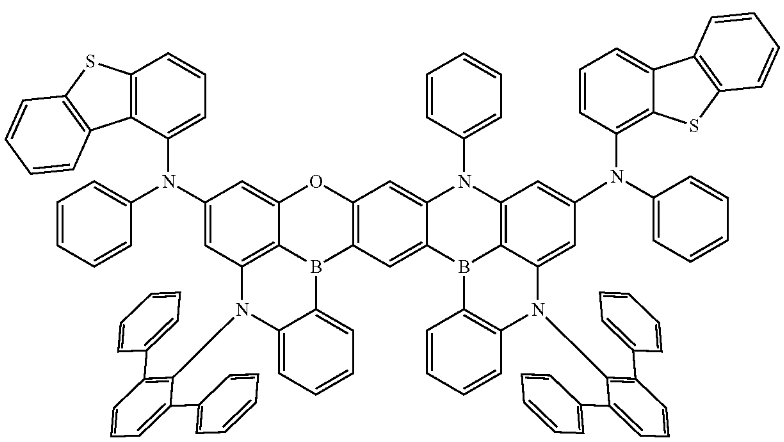
176
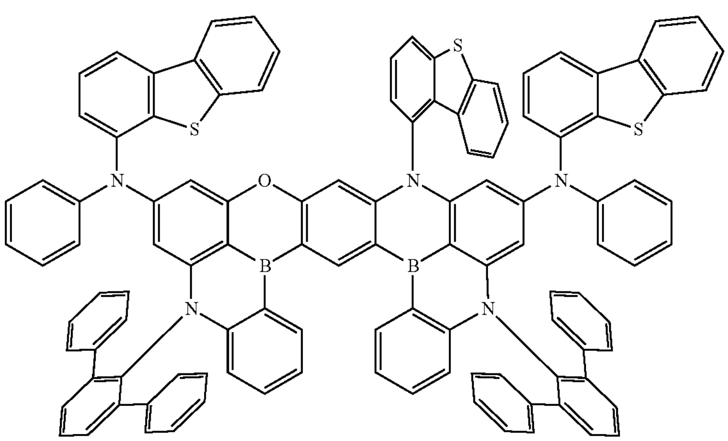

-continued
178
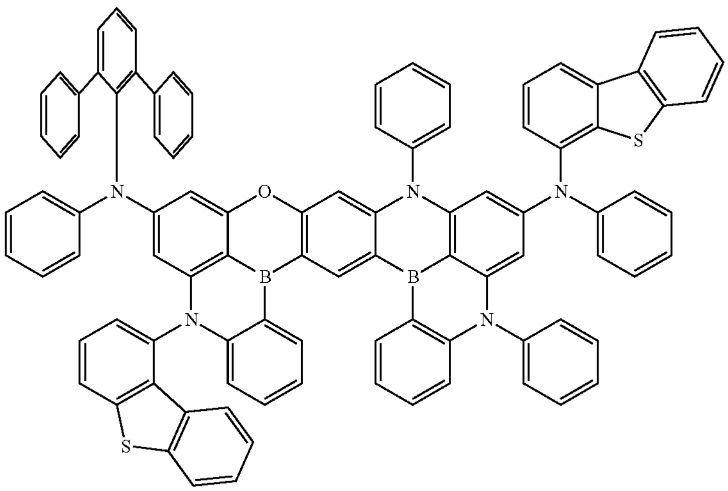
179
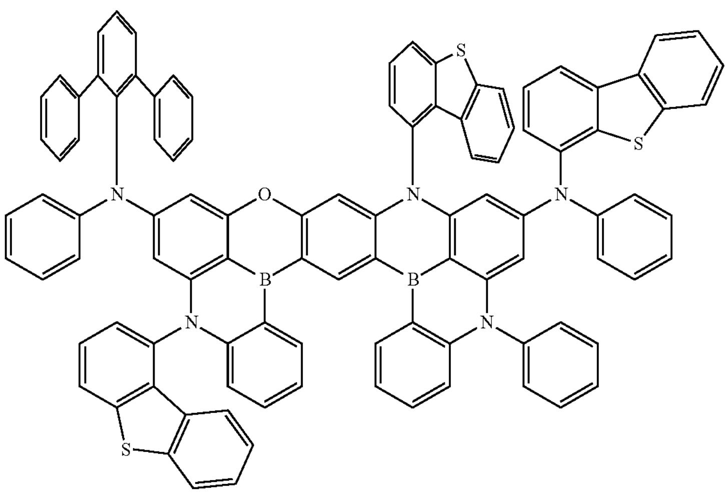
180
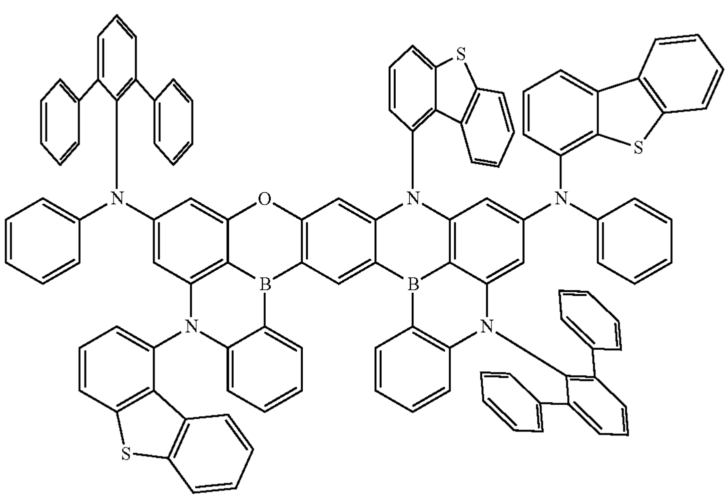

-continued
181
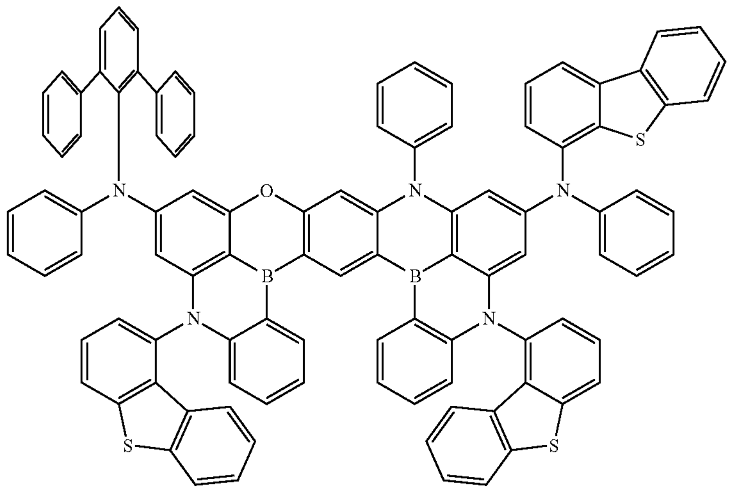
182
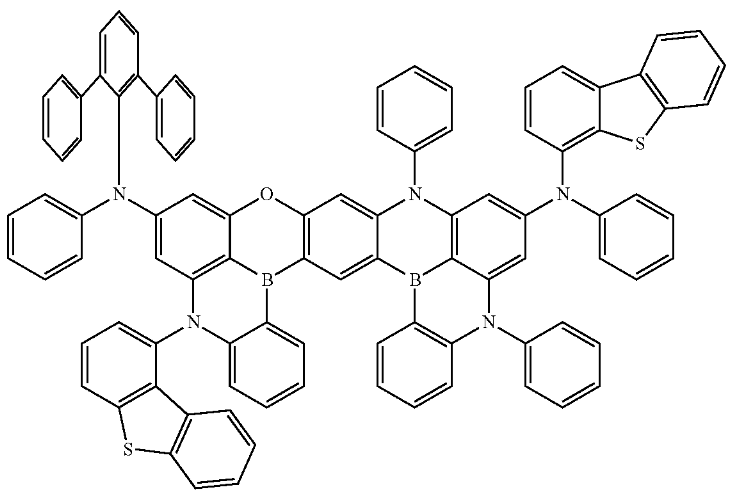
183
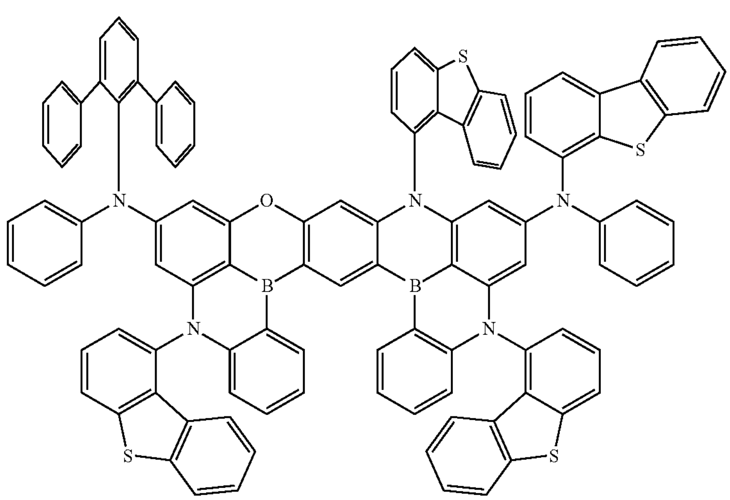

-continued
185
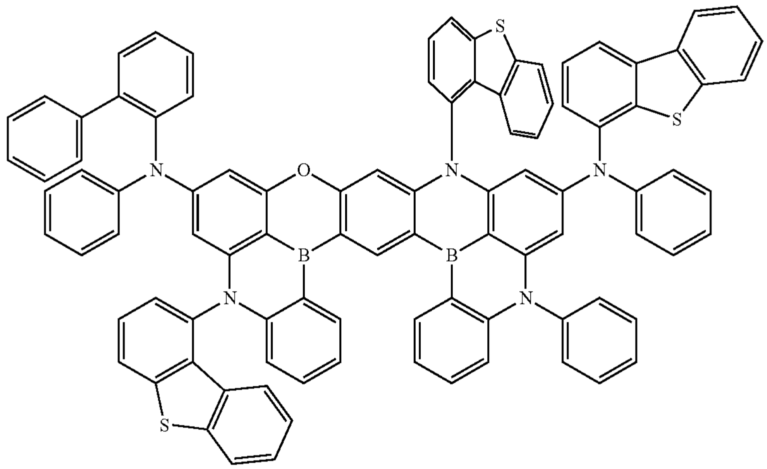
186
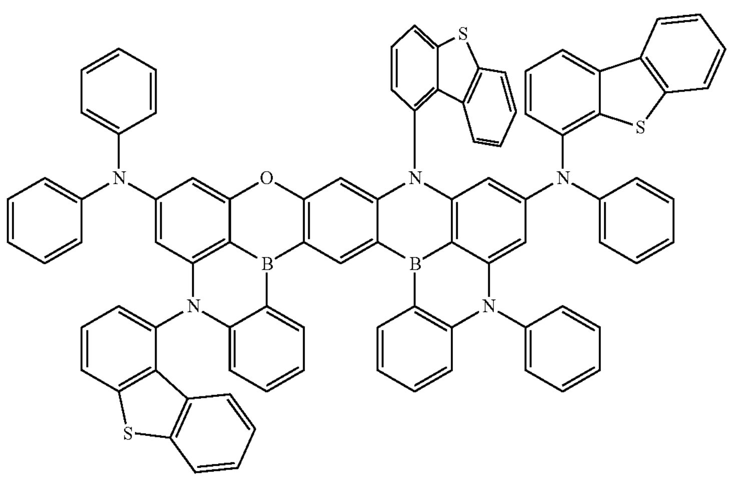
187
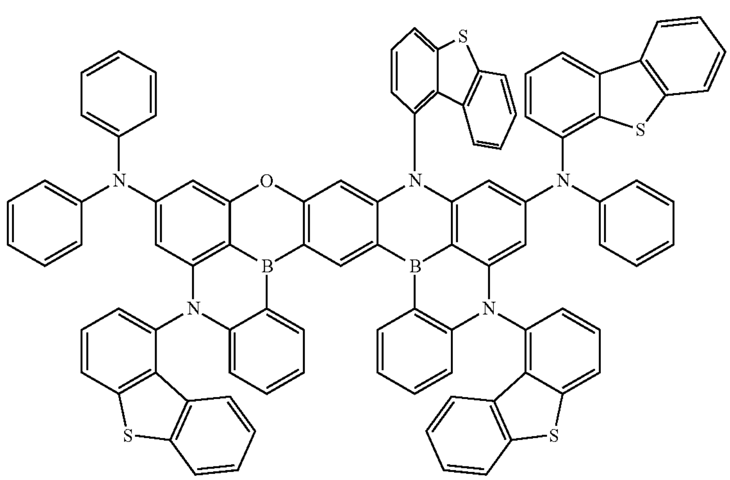

-continued
188
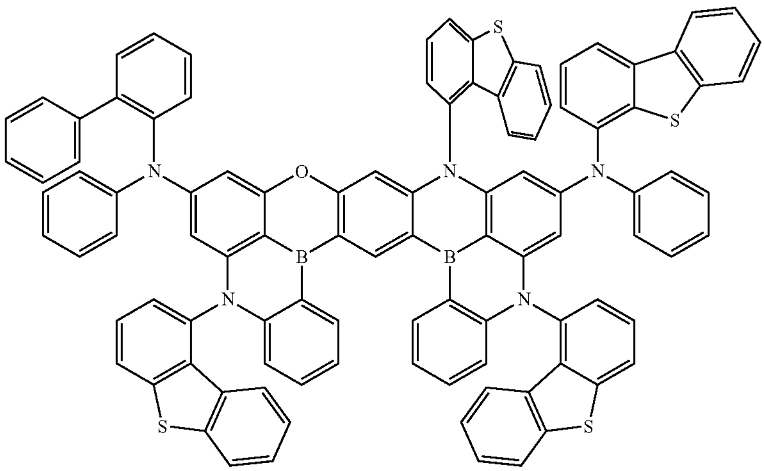
189
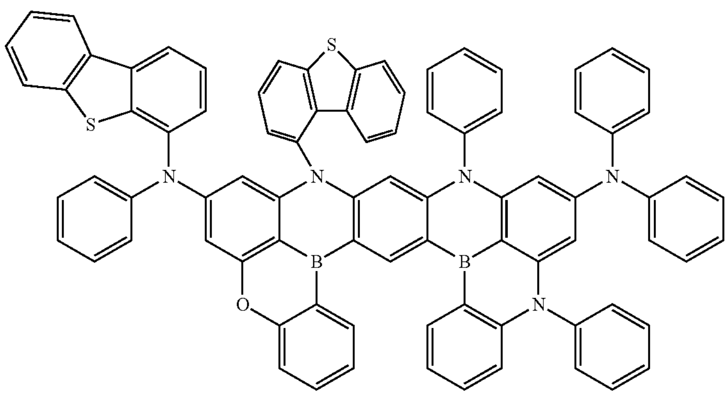
190
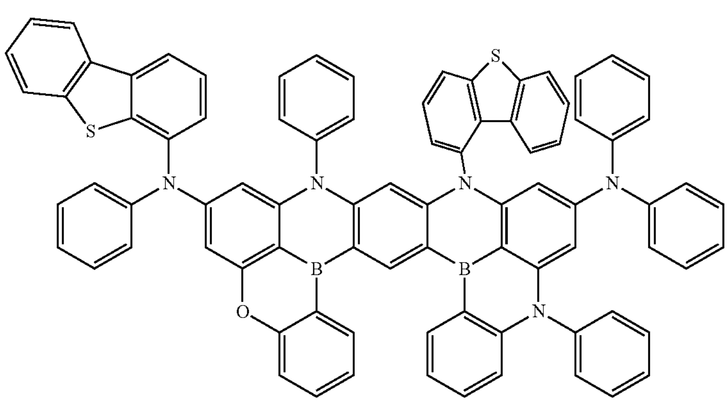

-continued
191
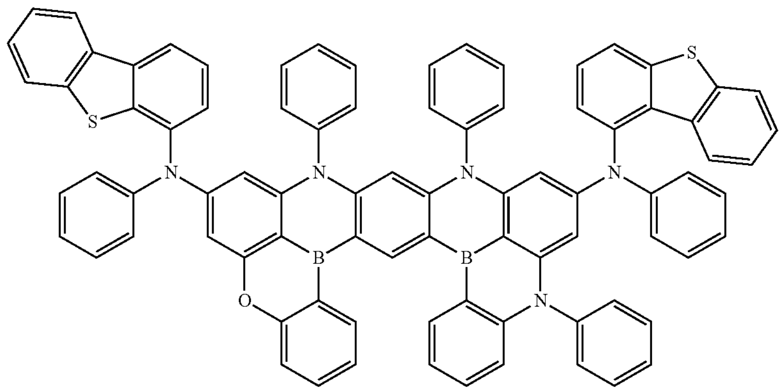
192
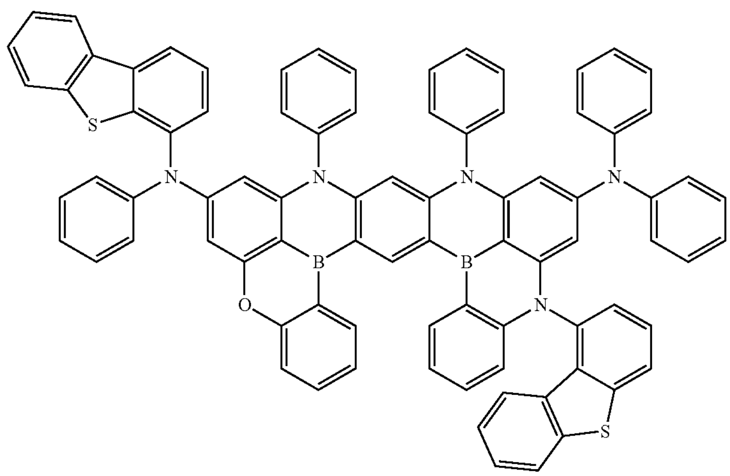
193
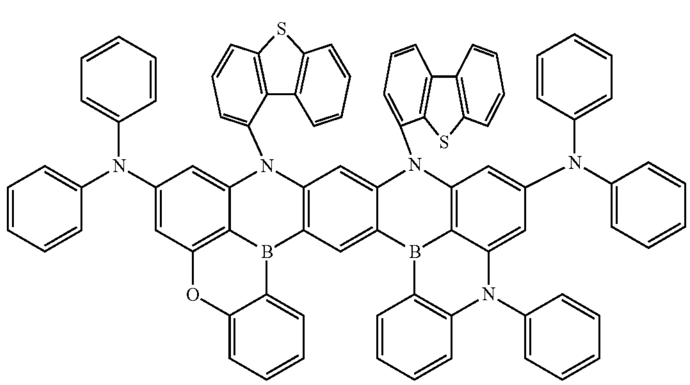

-continued
194
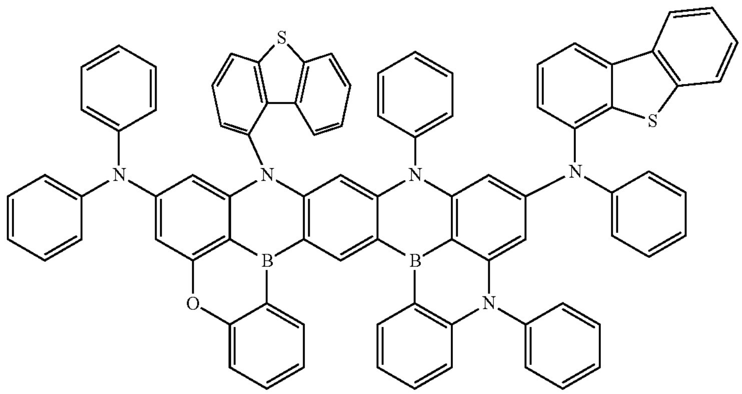
195
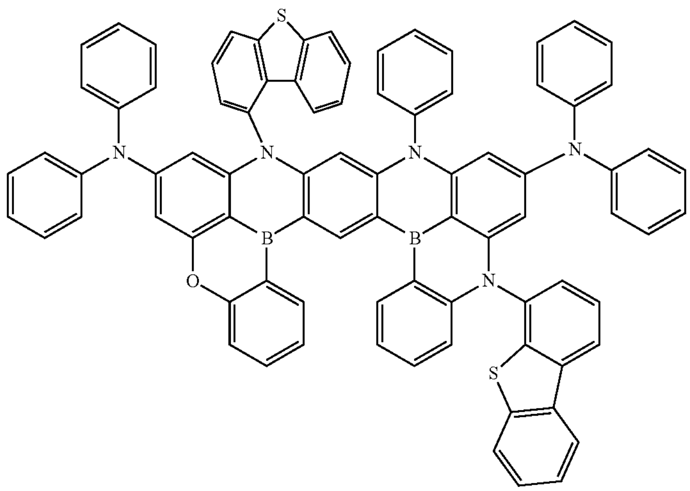
196
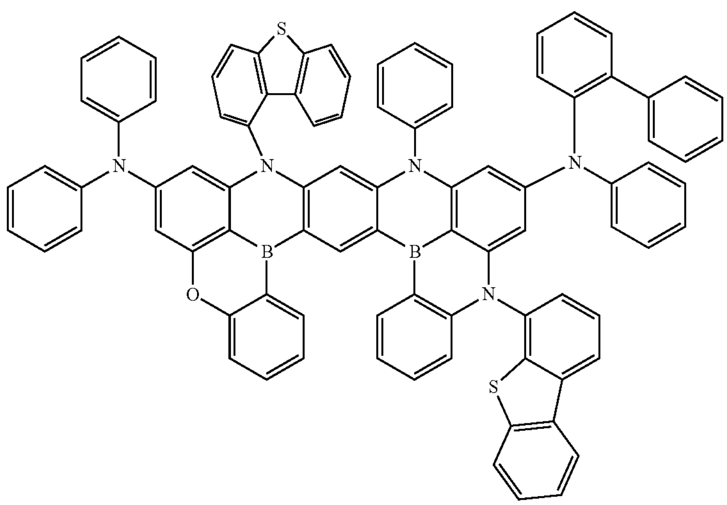

-continued
197
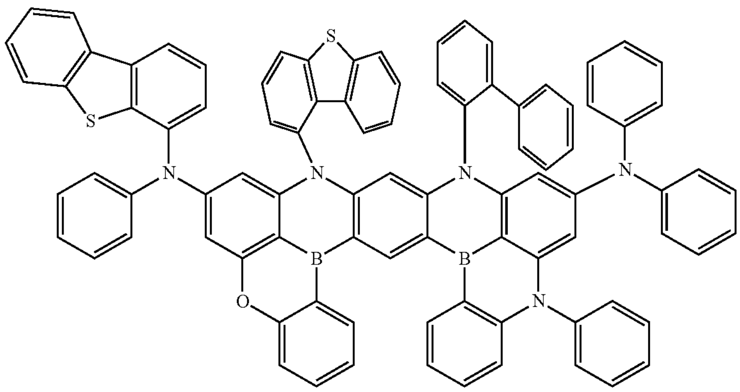
198
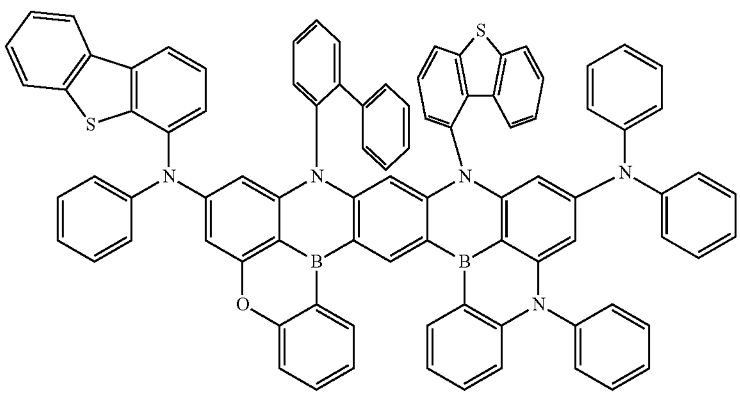
199
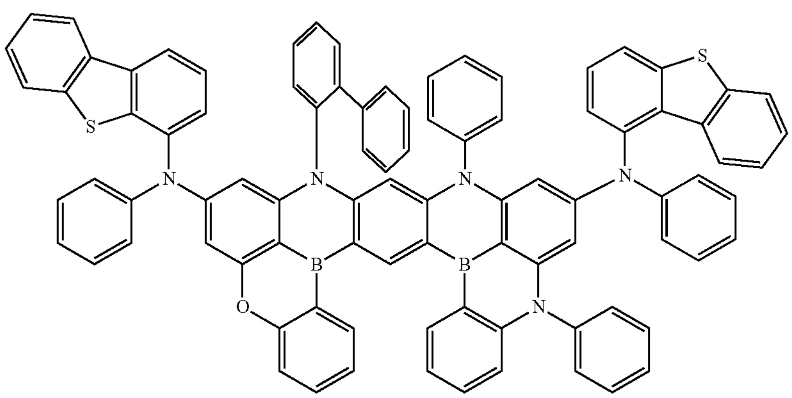

-continued
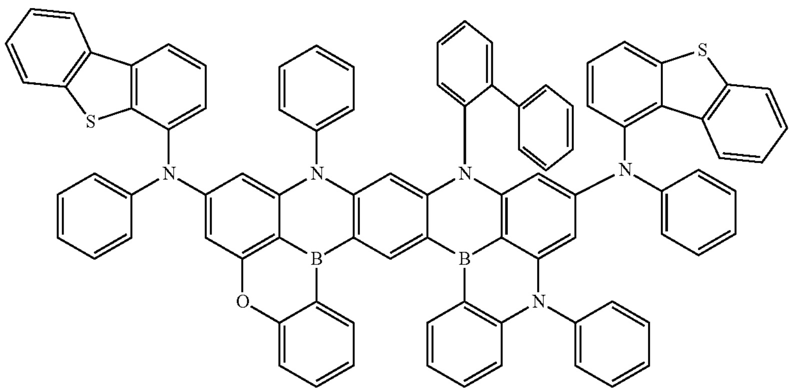
200
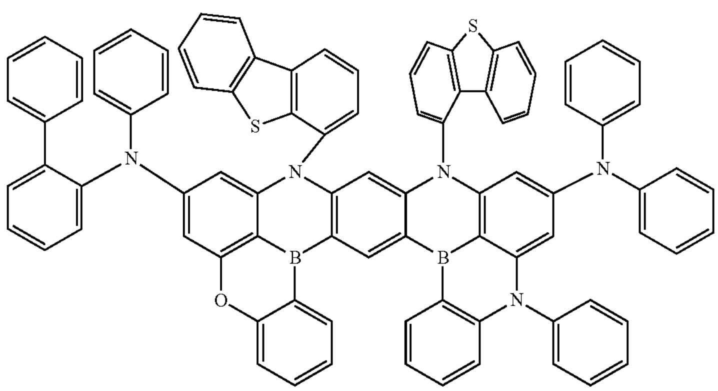
201
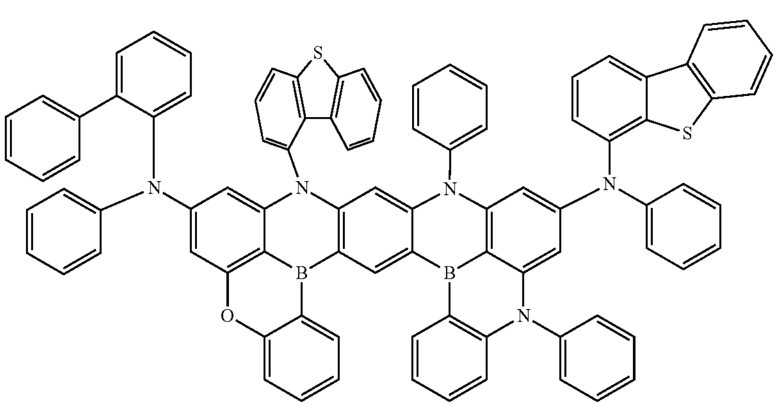
202

-continued
203
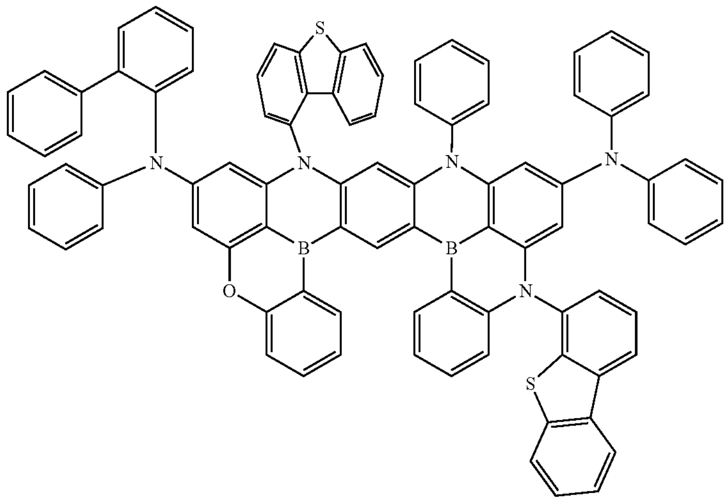
204
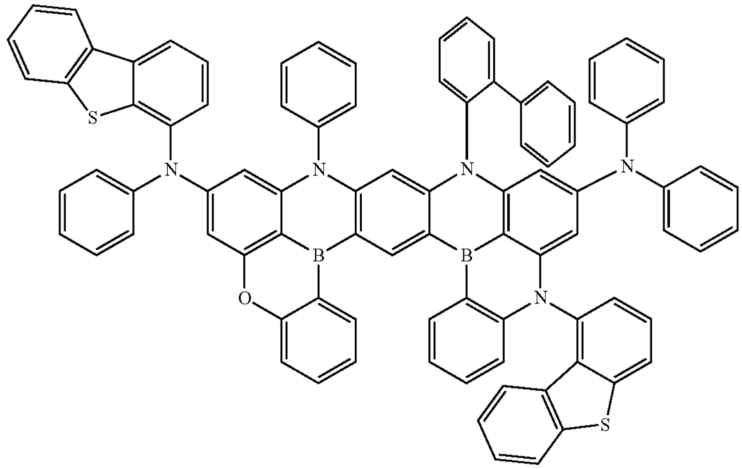
205
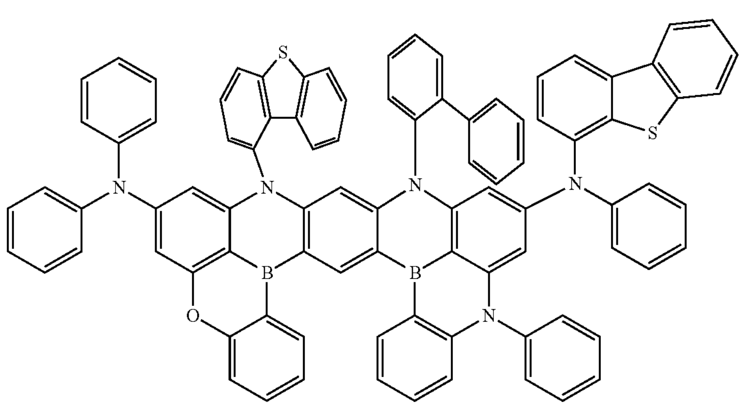

-continued
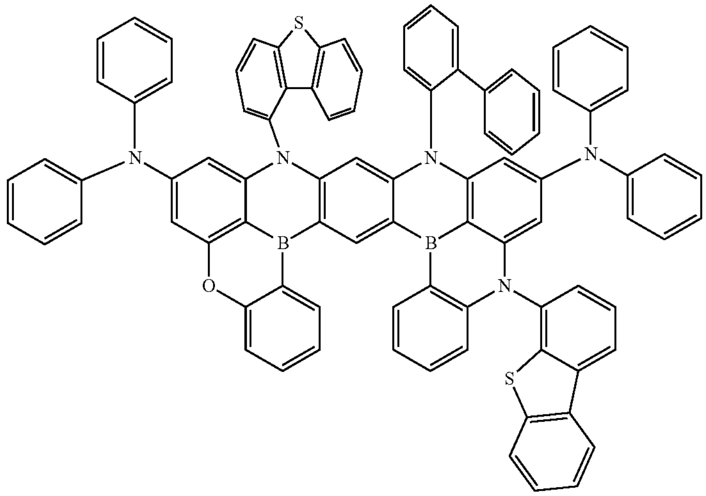
206
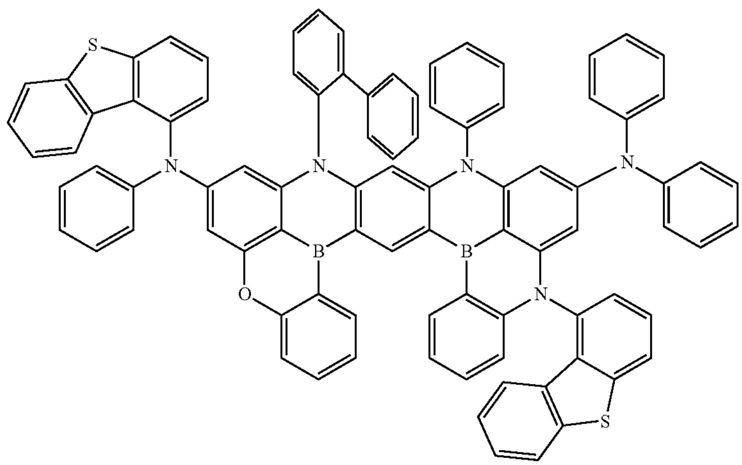
207
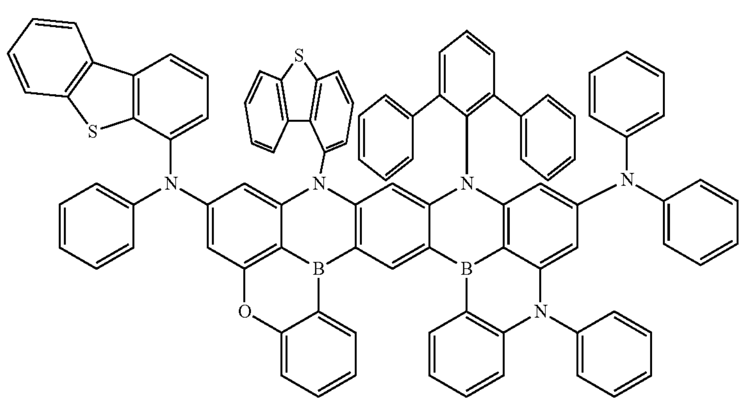
208

-continued
209
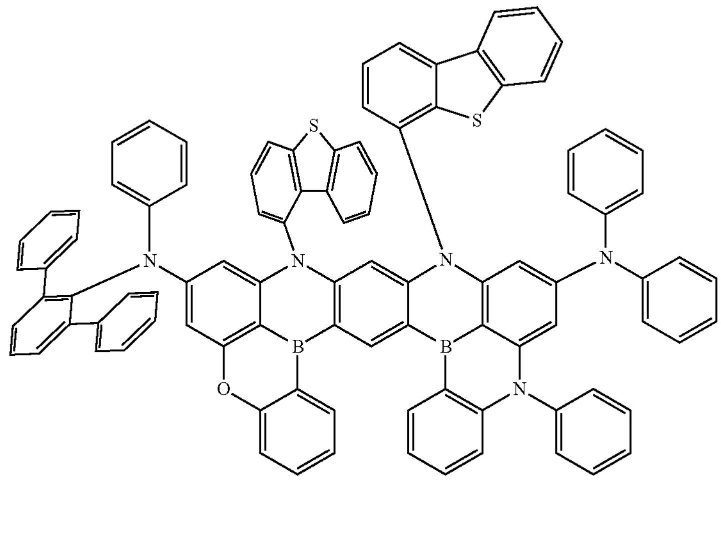
210
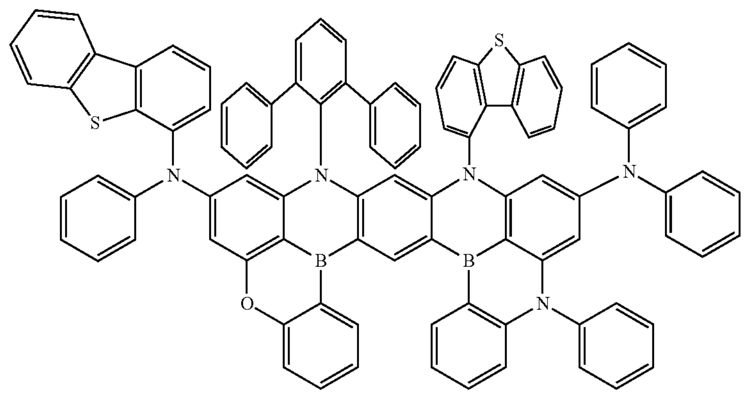
211
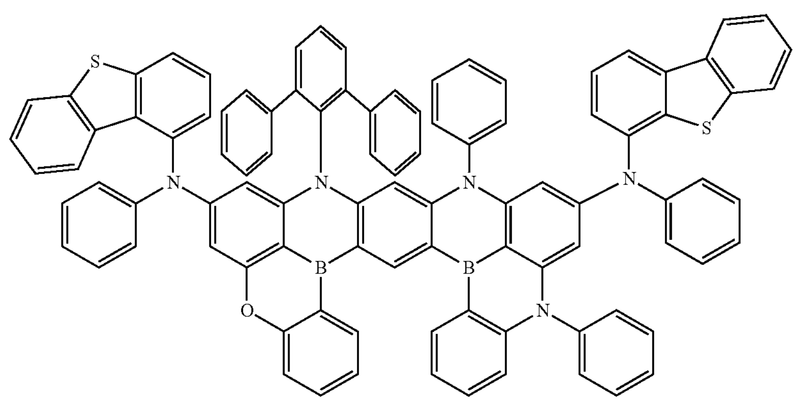

-continued
212
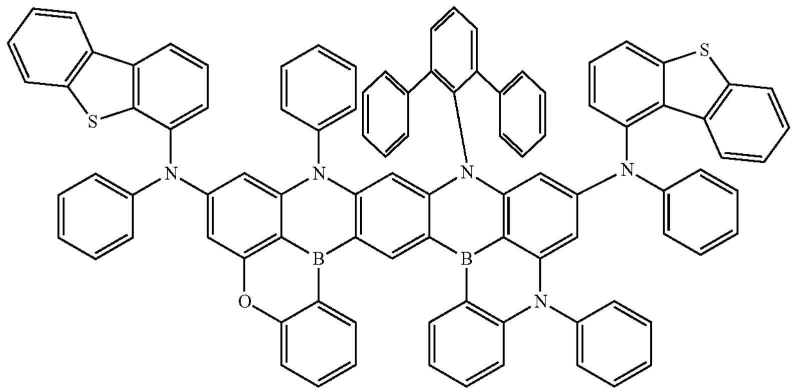
213
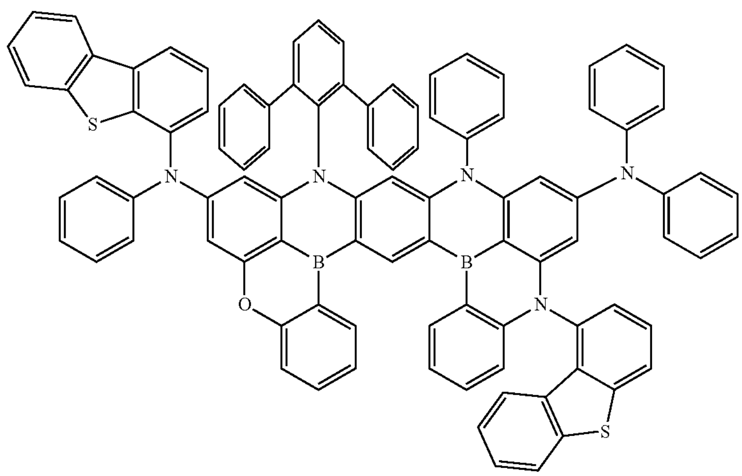
214
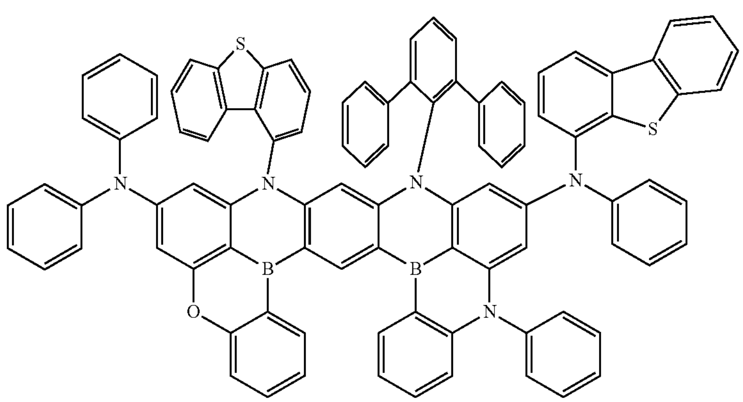

-continued
215
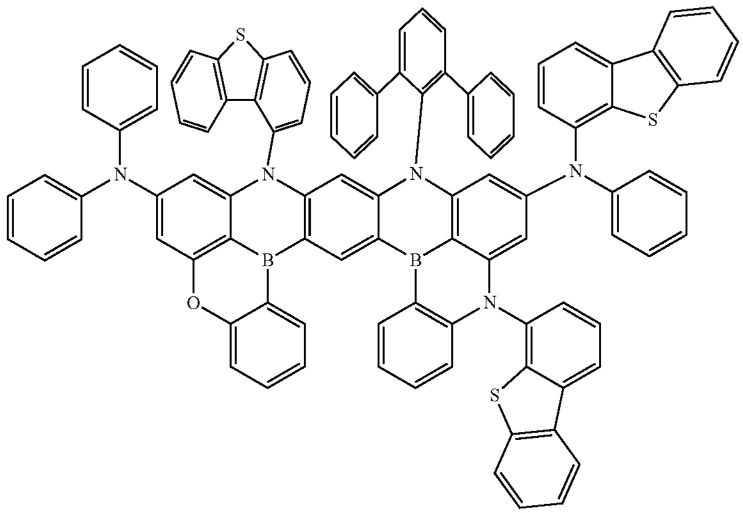
216
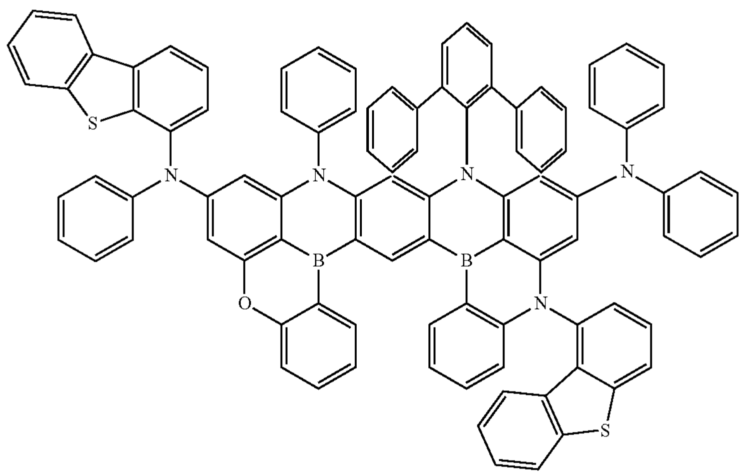
217
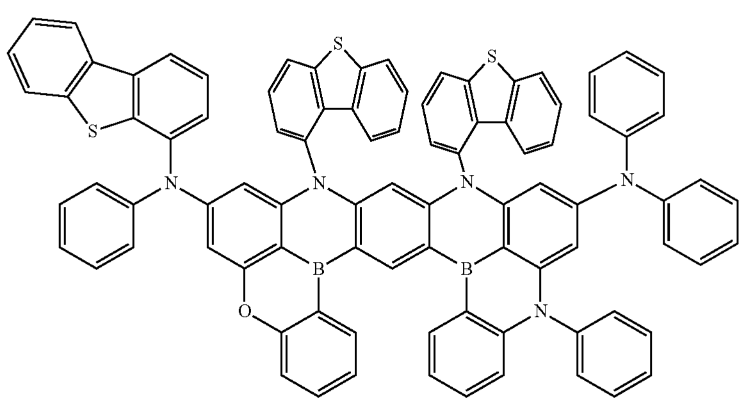

-continued
219
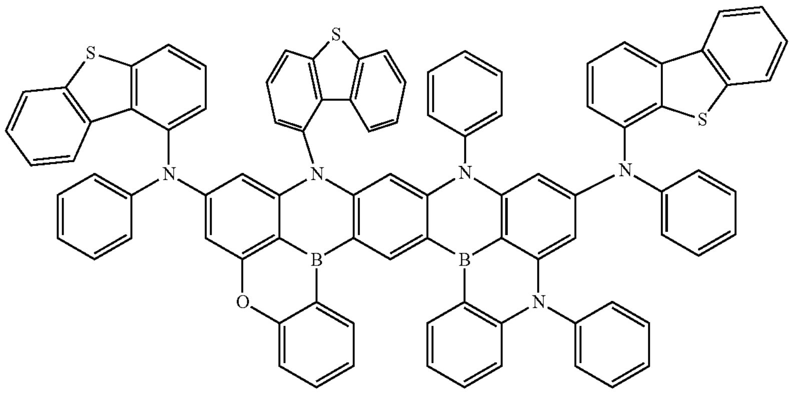
220
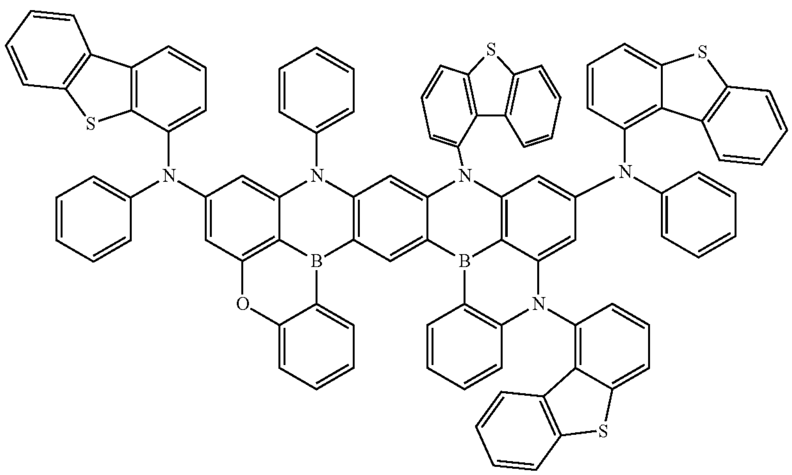
221
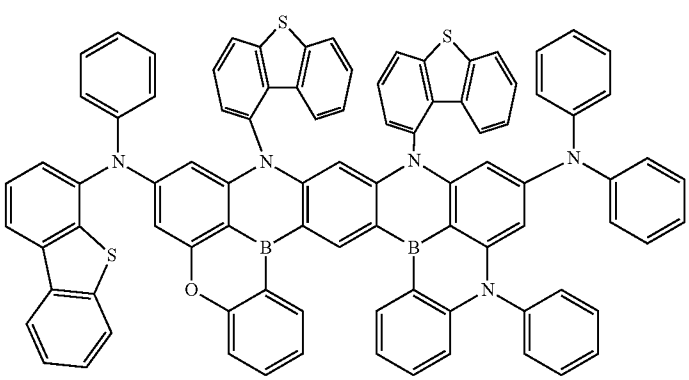
222
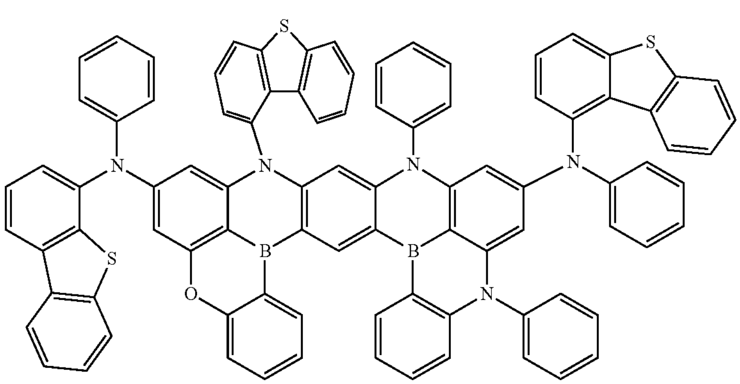

-continued
223
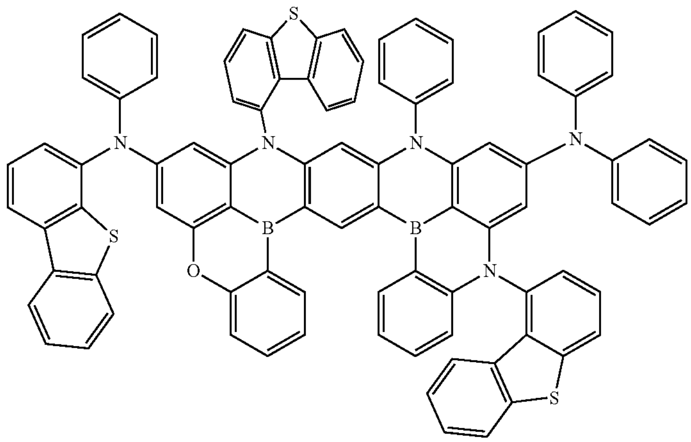
224
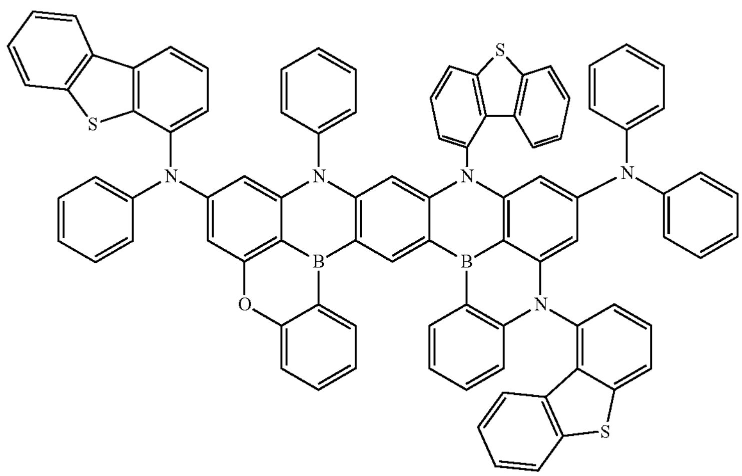
225
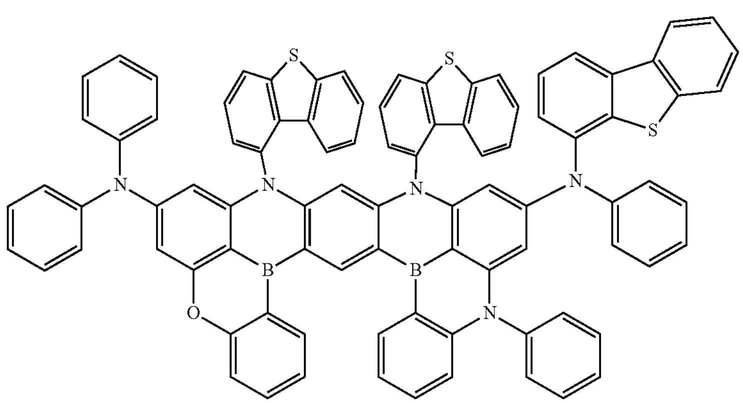

-continued
226
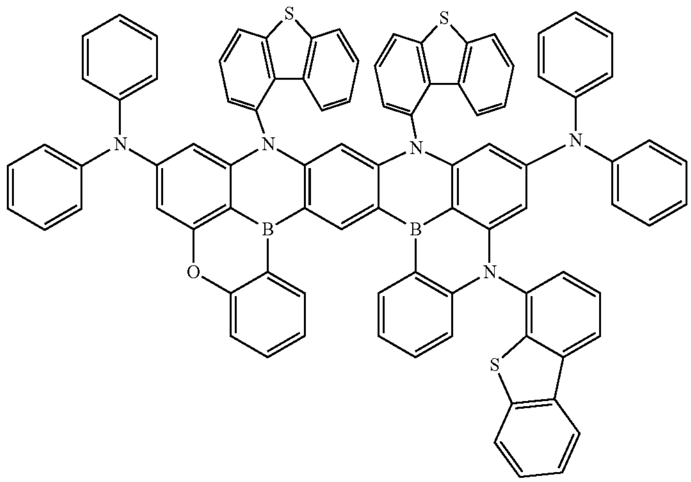
227
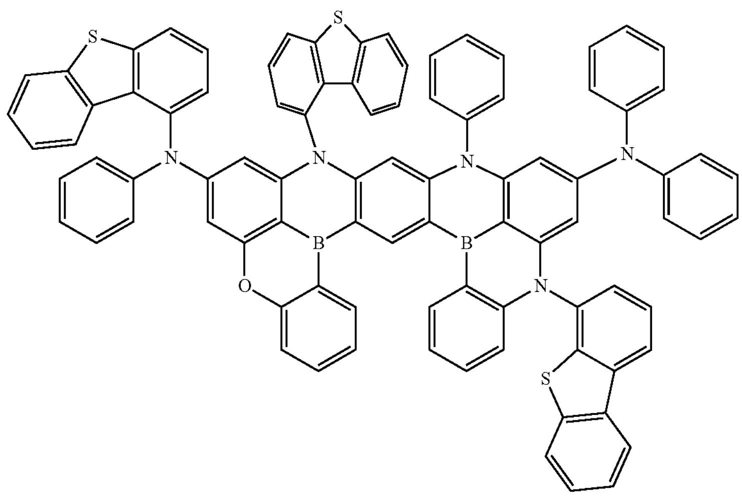
228
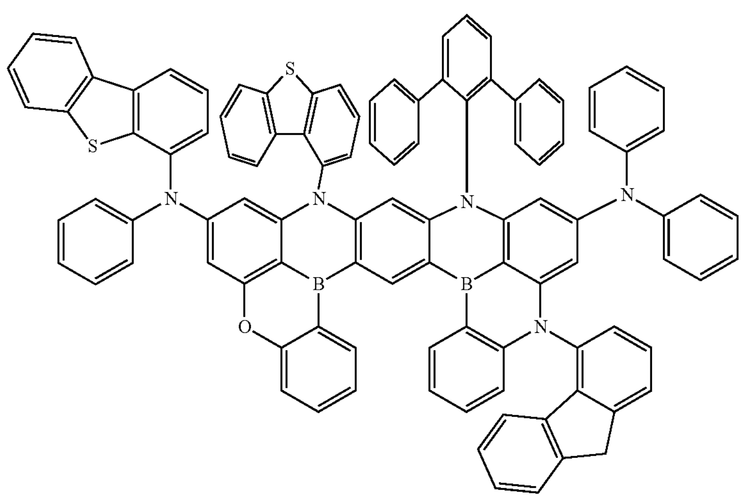

-continued
229
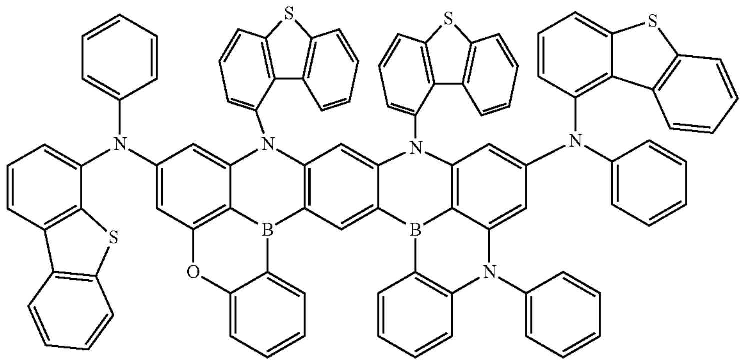
230
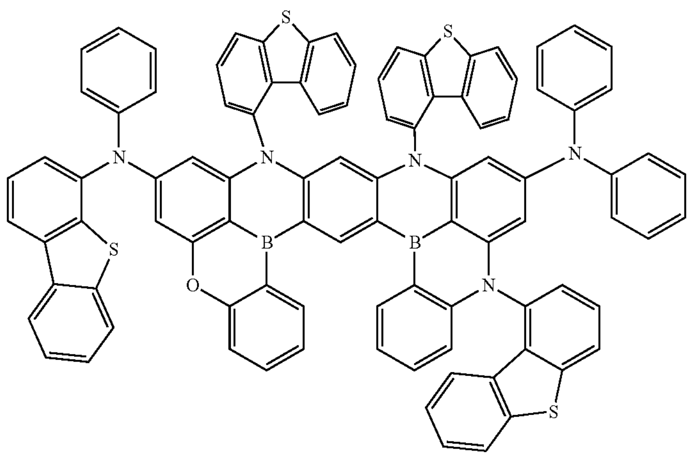
231
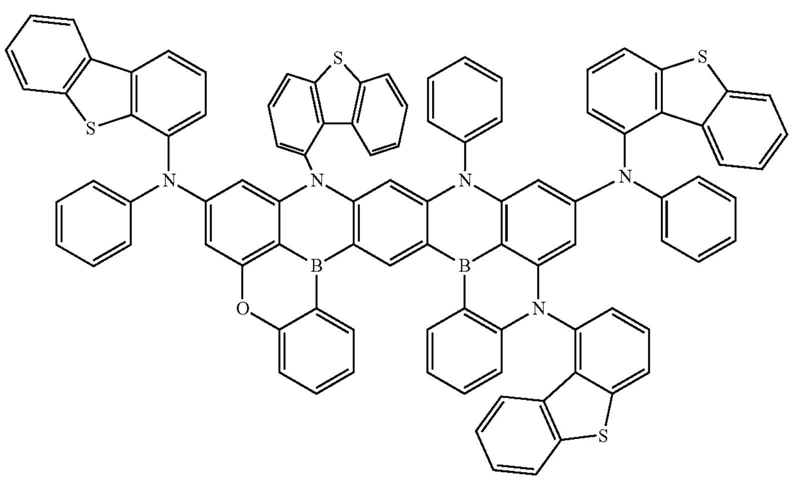

-continued
232
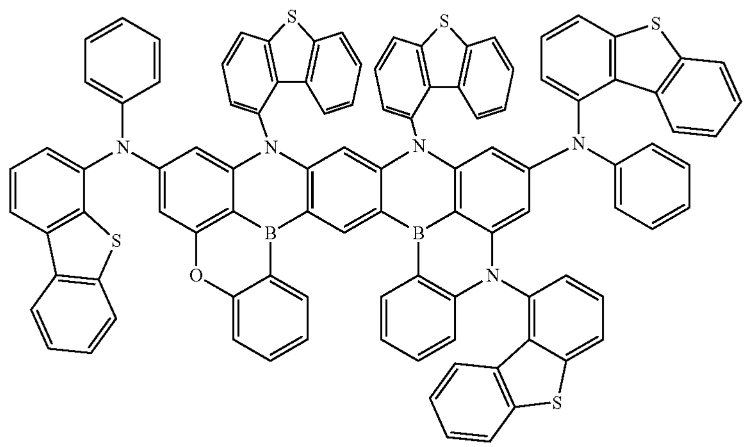
233
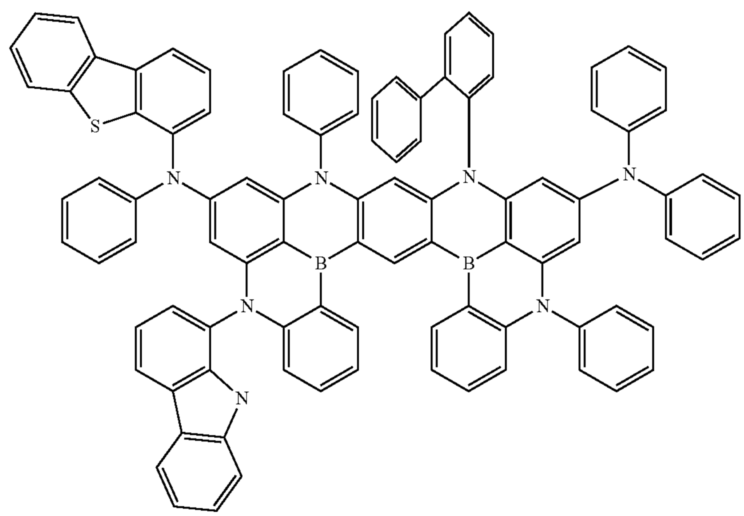
234
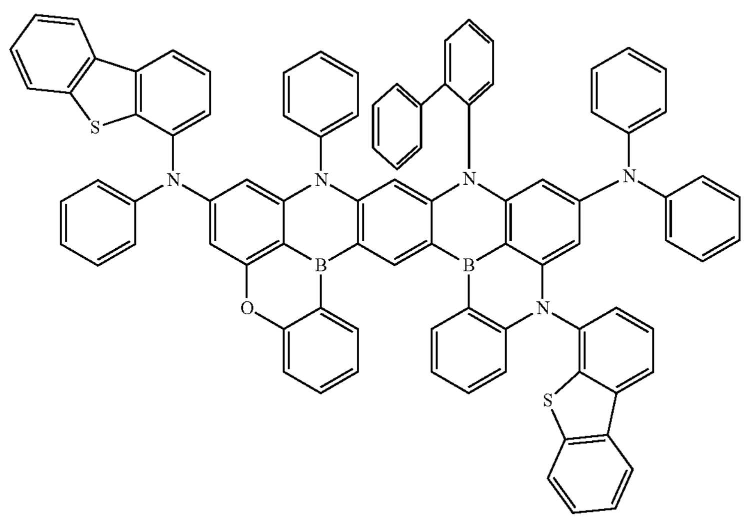

-continued
235
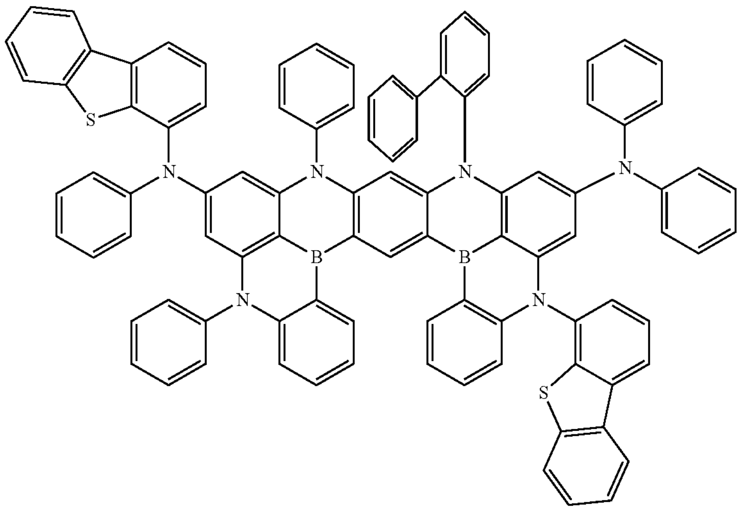
236
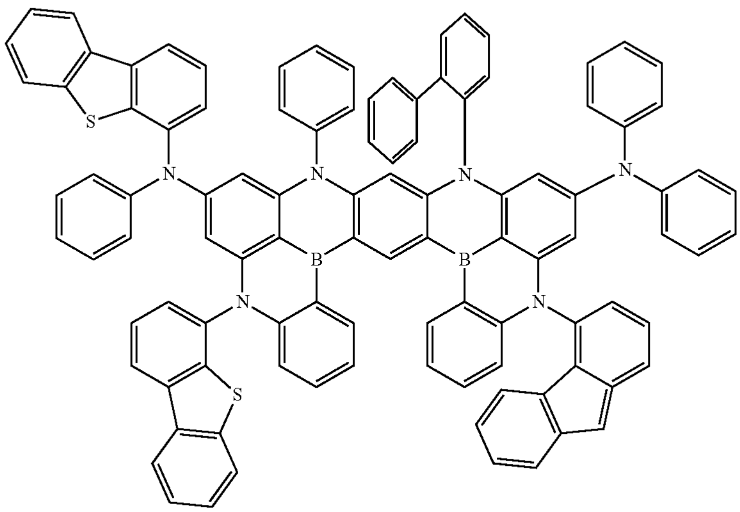
237
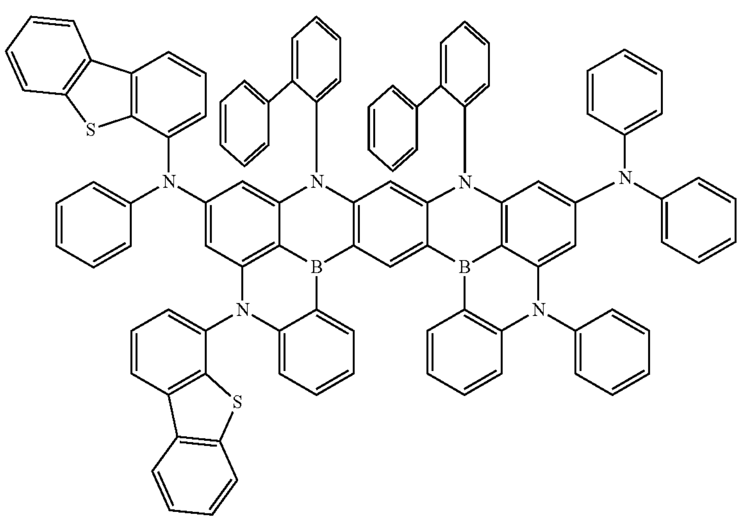

-continued
238
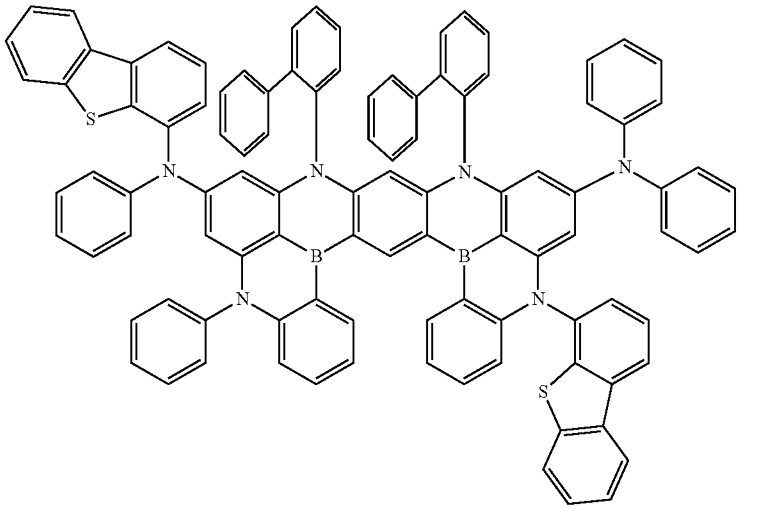
239
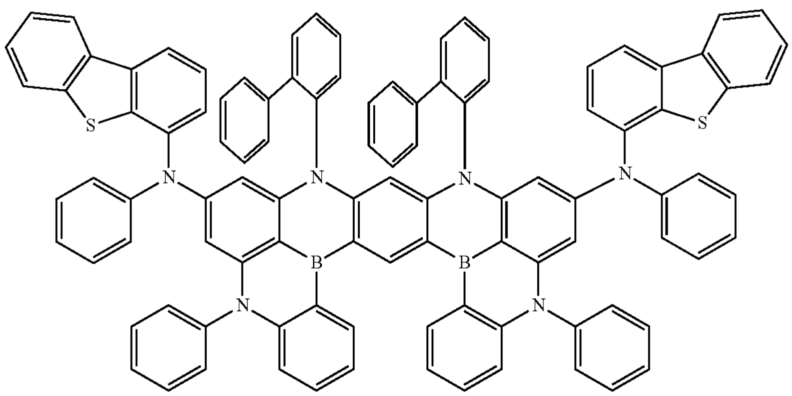
240
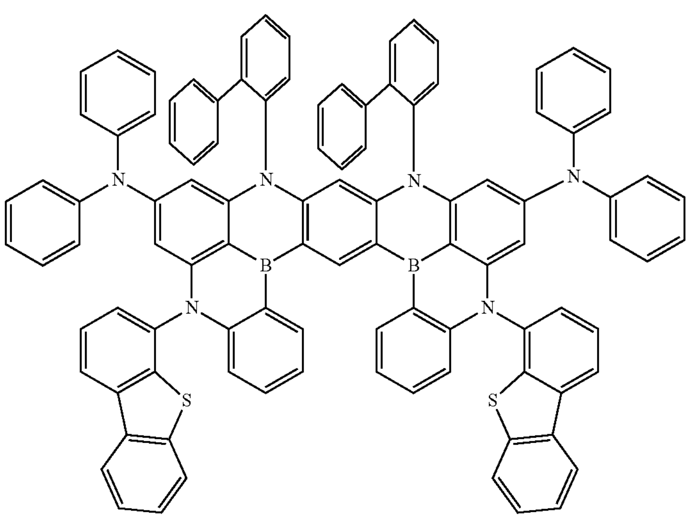

-continued
241
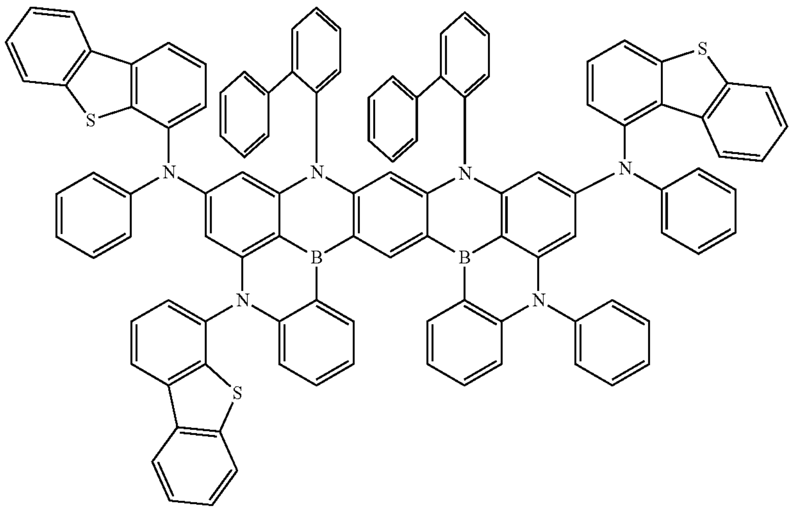
242
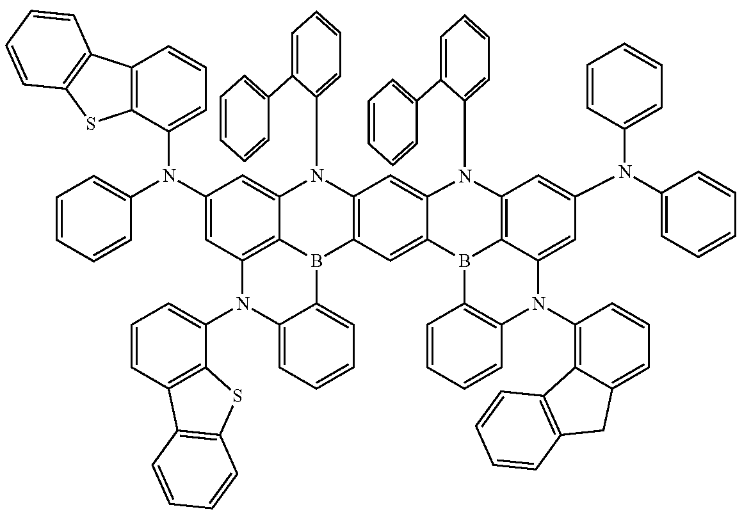
243
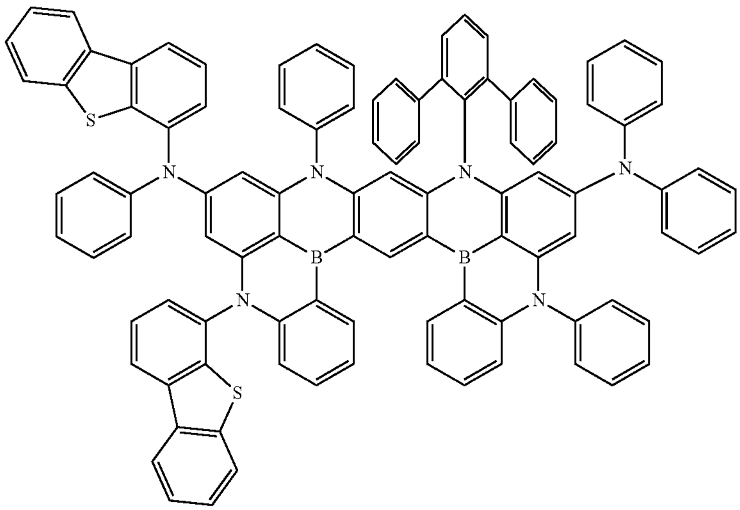

-continued
244
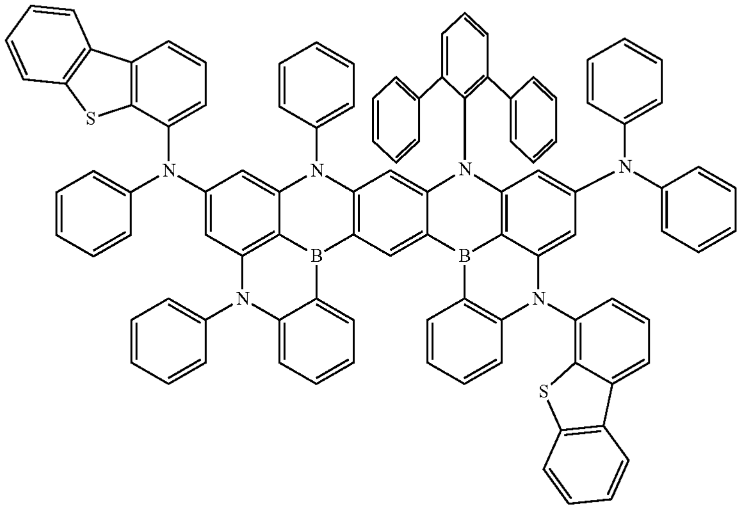
245
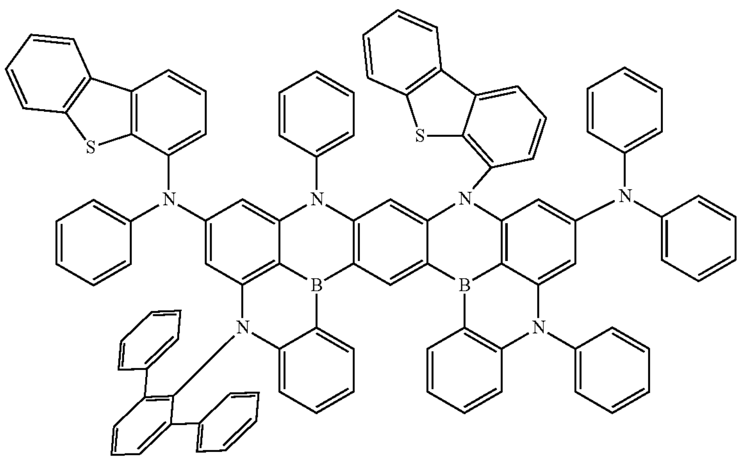
246
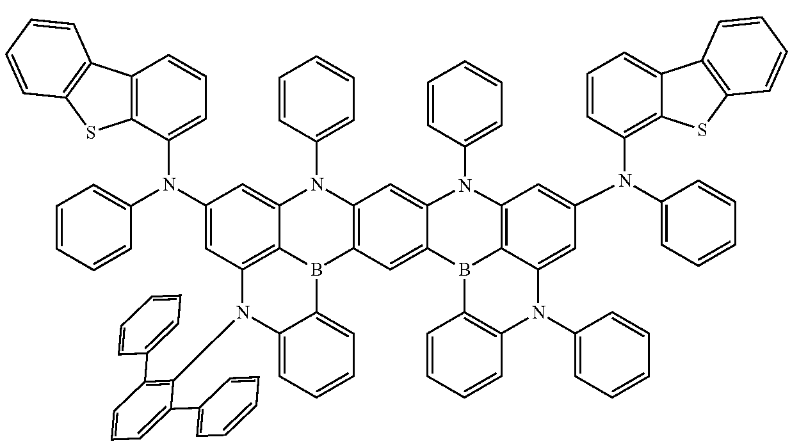

-continued
247
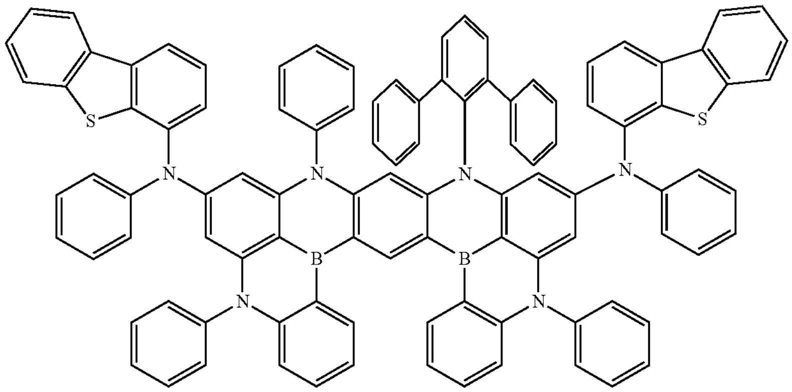
248
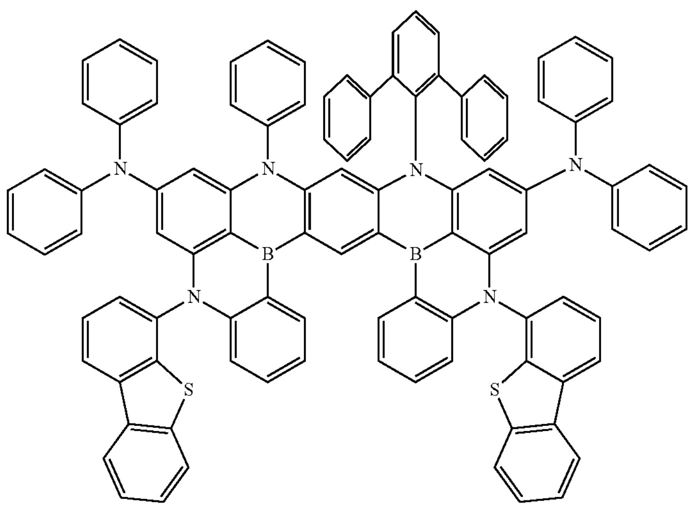
249
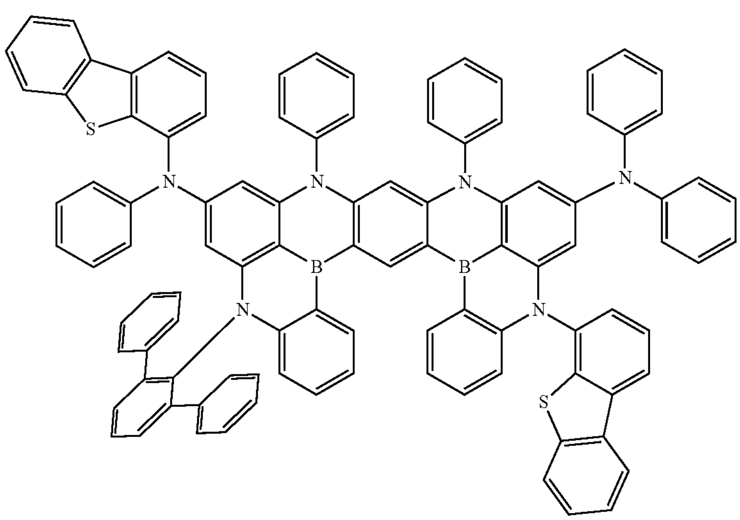

-continued
250
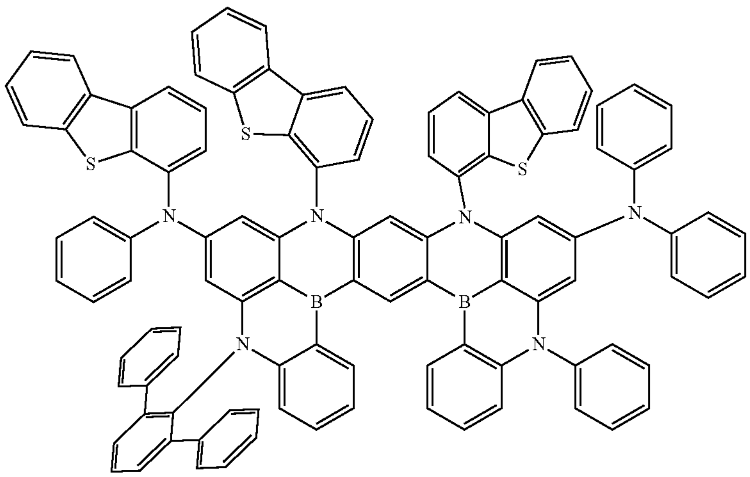
251
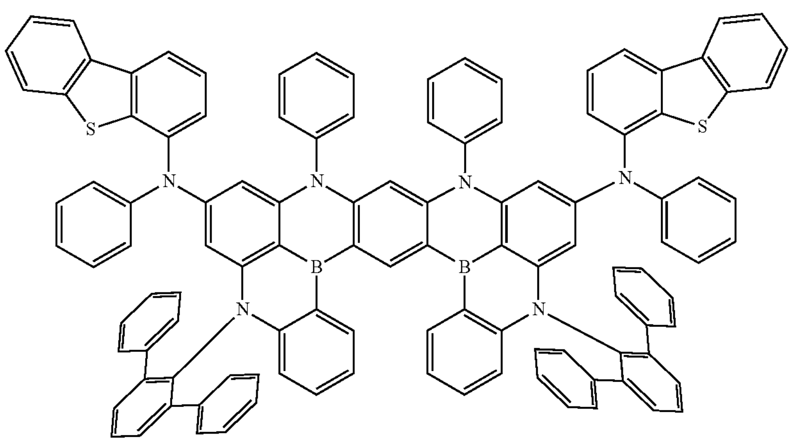
252
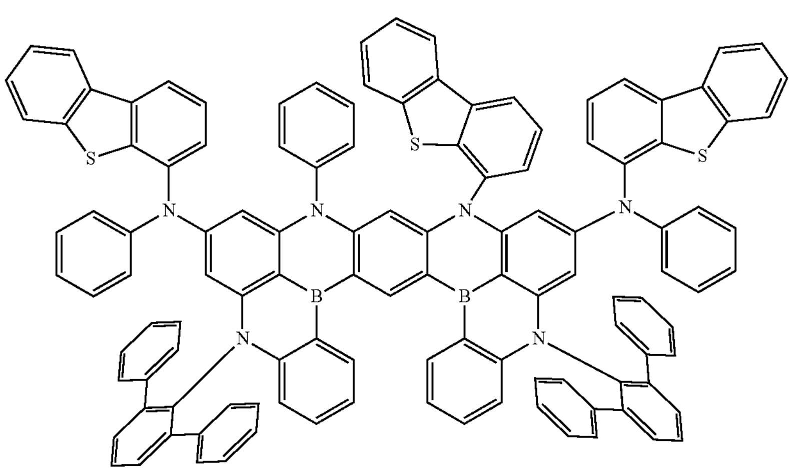

-continued
253
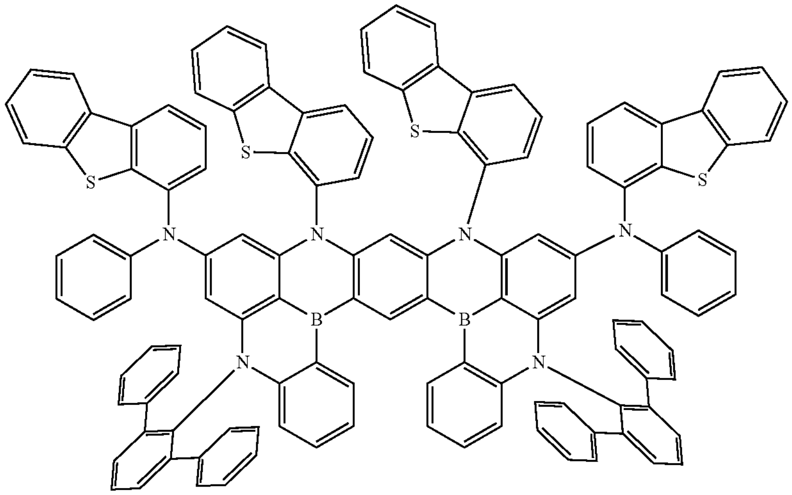
254
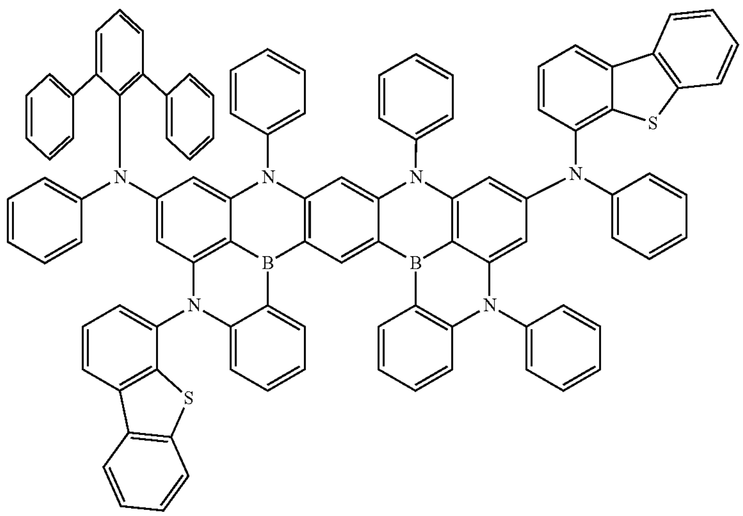
255
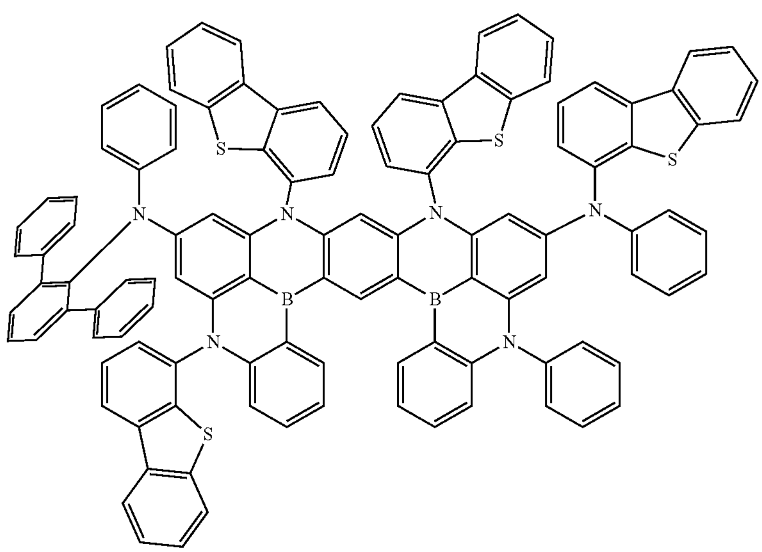

-continued
256
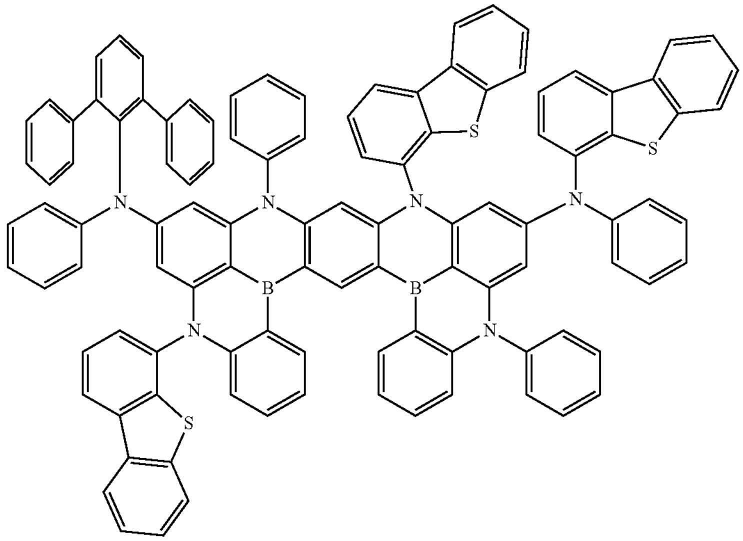
257
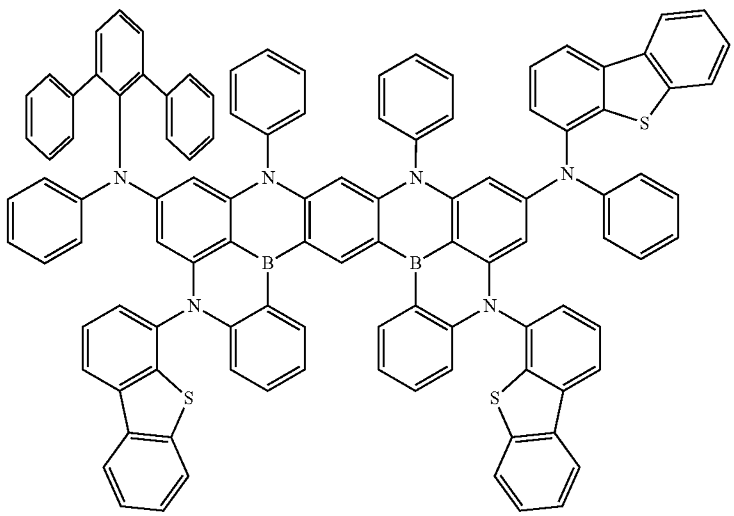
258
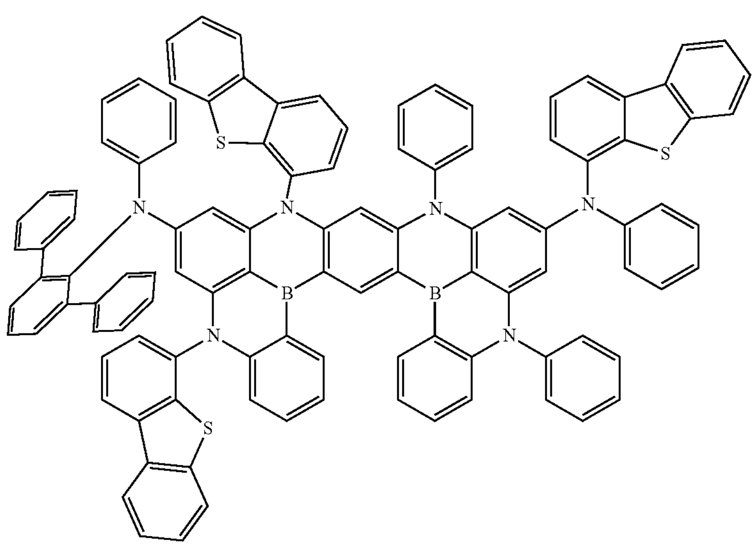

-continued
259
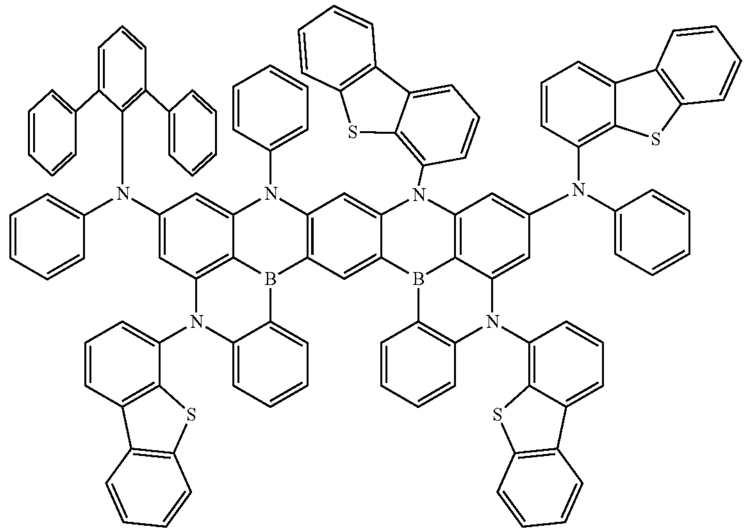
260
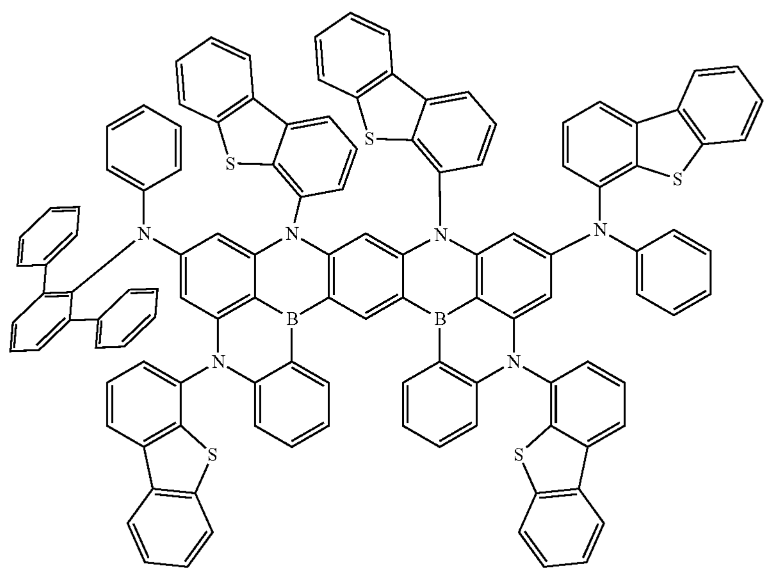
261
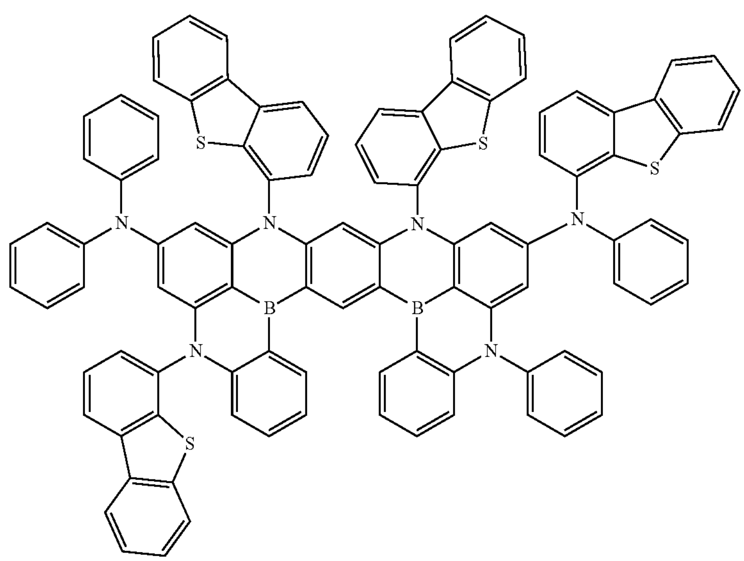

-continued
263
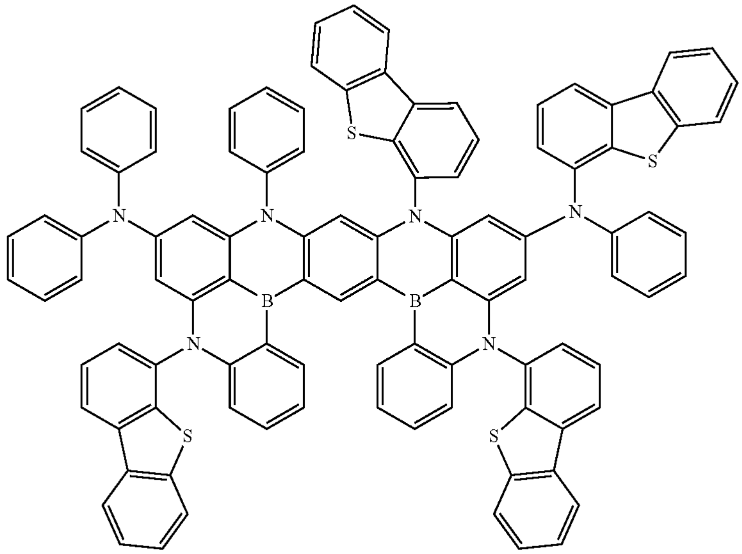
264
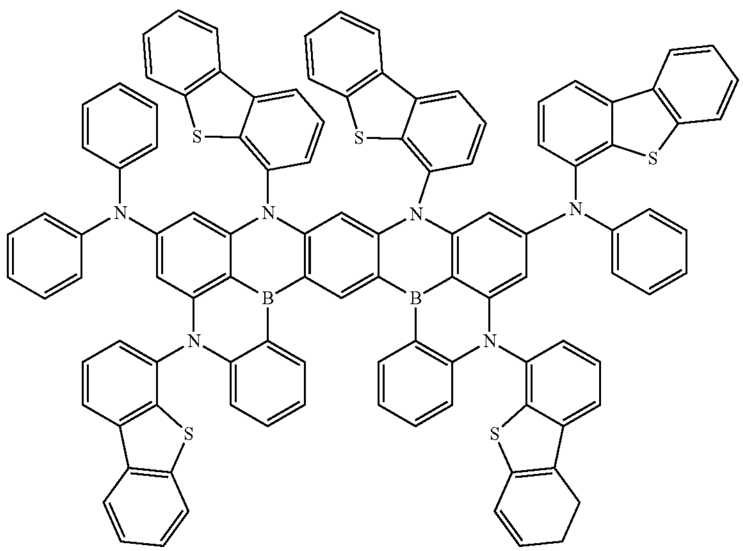
265
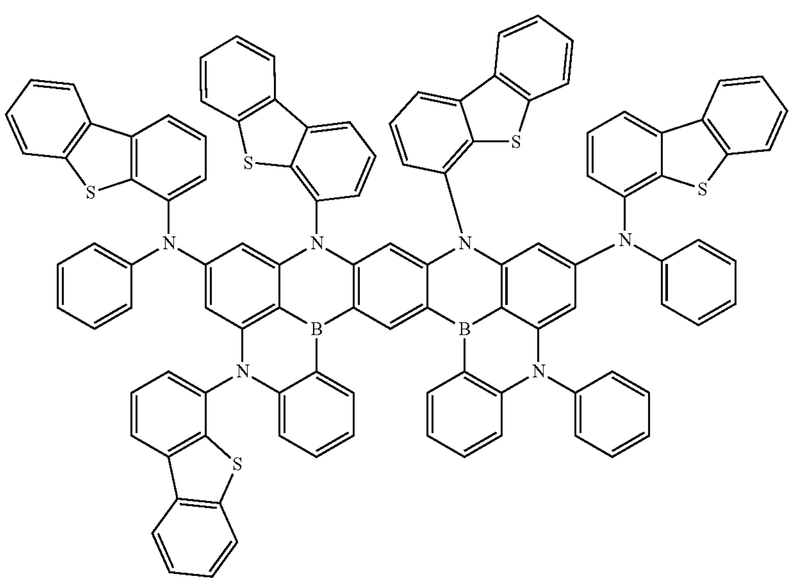

-continued
266
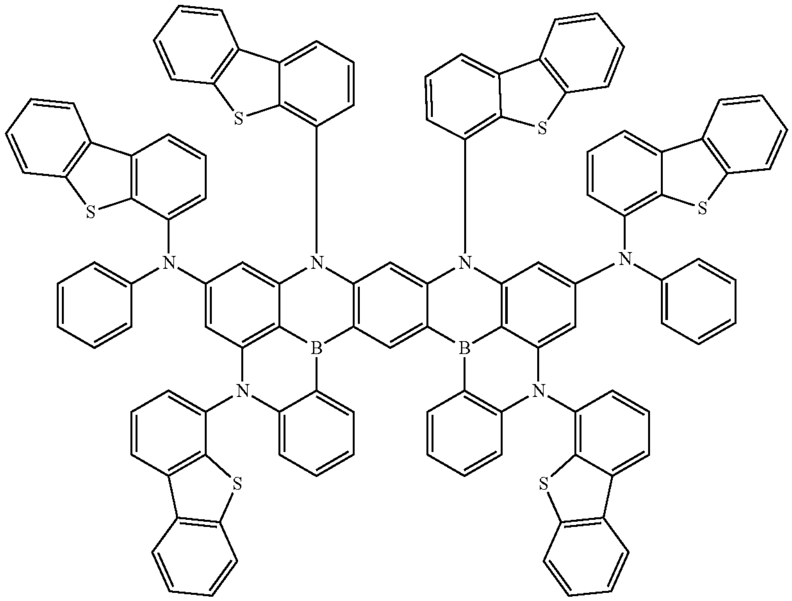
267
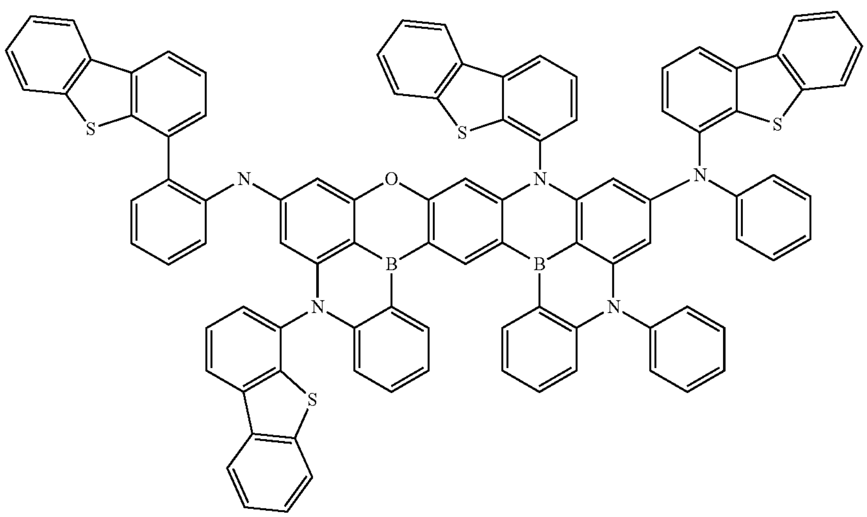
268
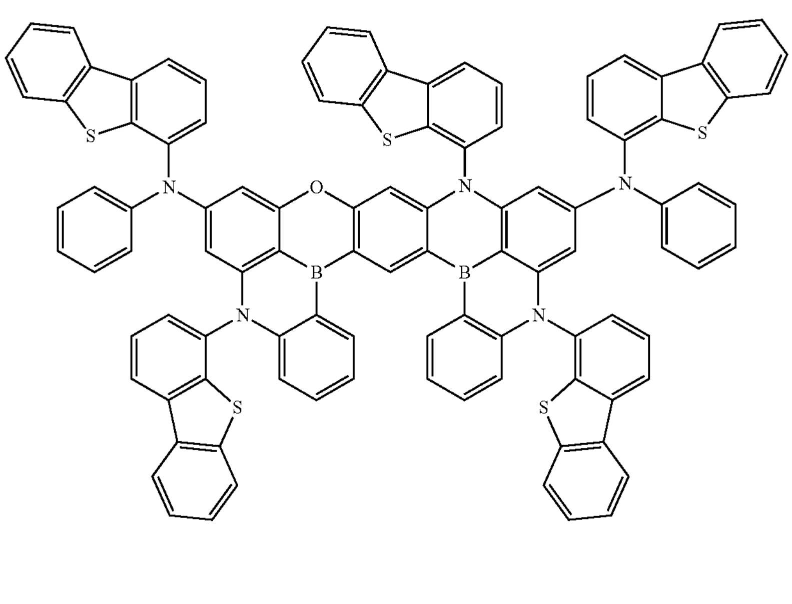

-continued
269
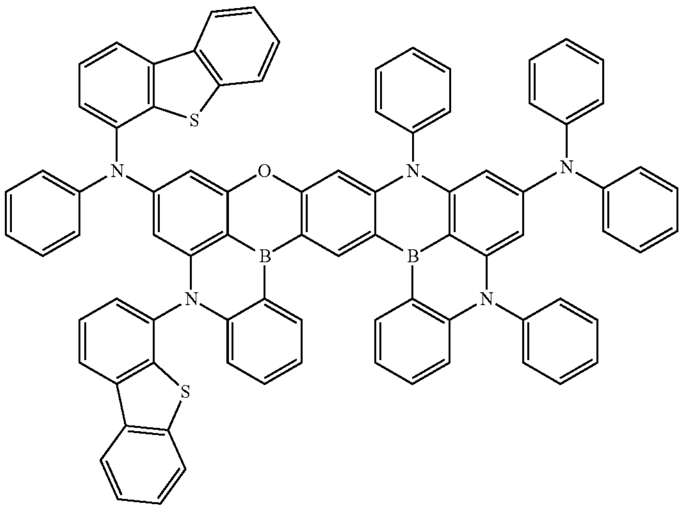
270
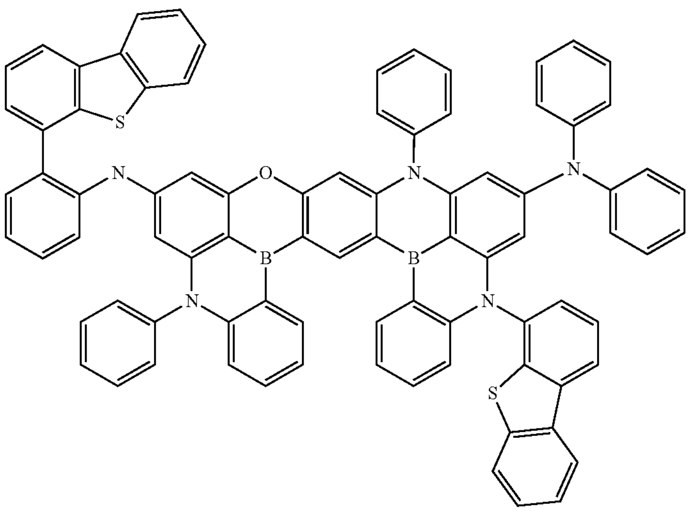
271
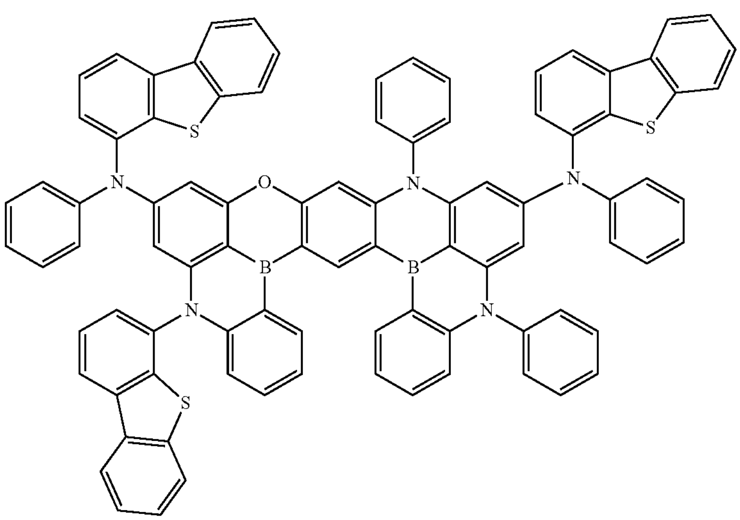

-continued
272
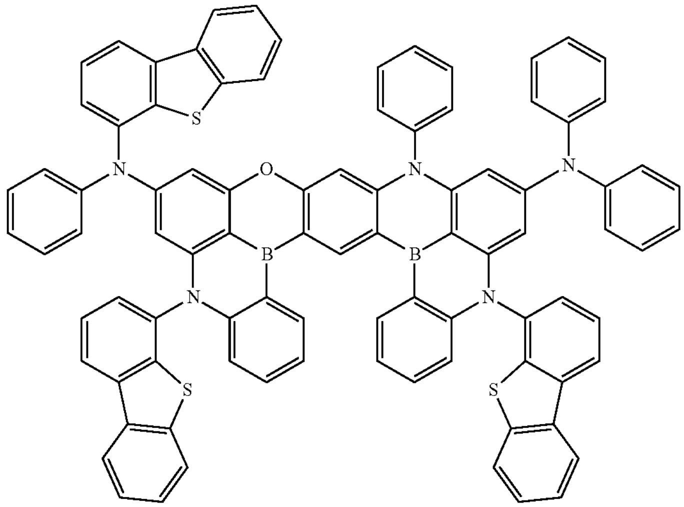
273
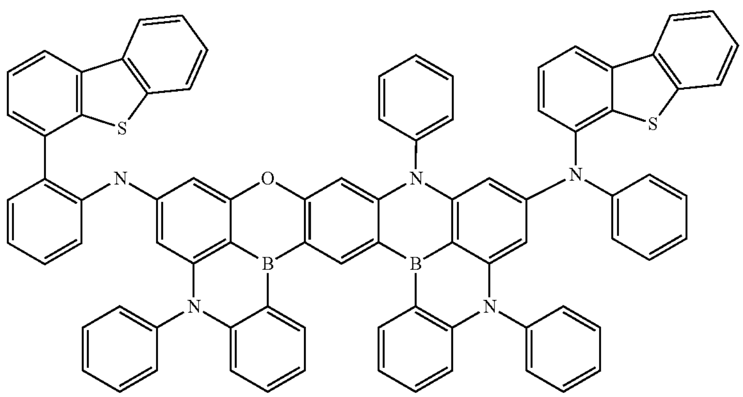
274
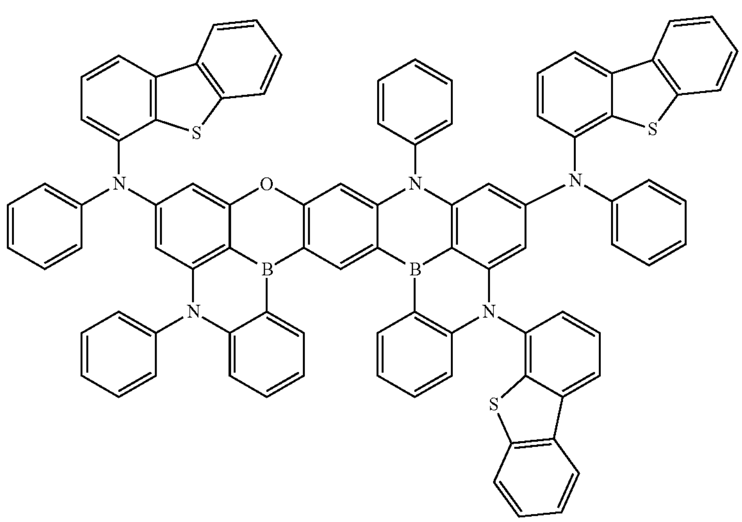

-continued
275
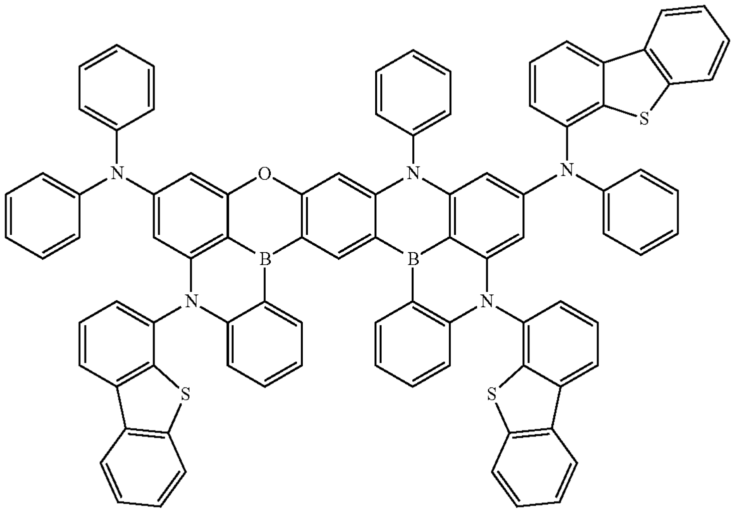
276
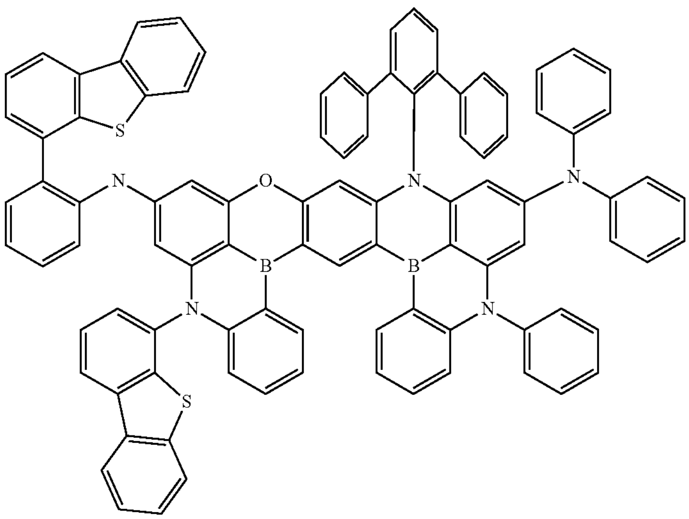
277
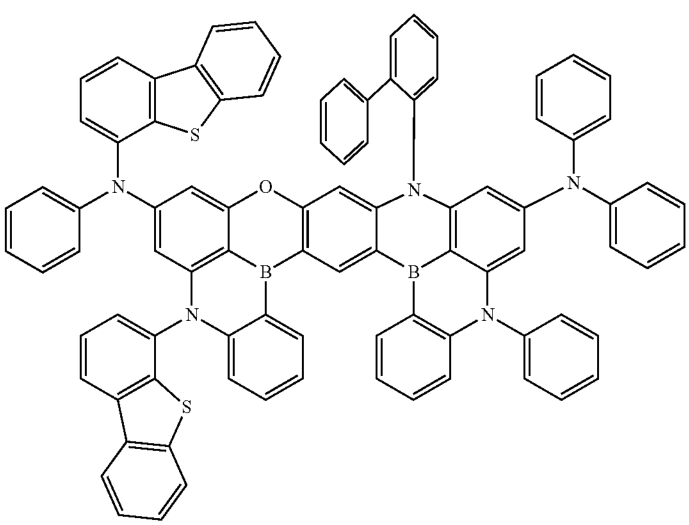

-continued
278
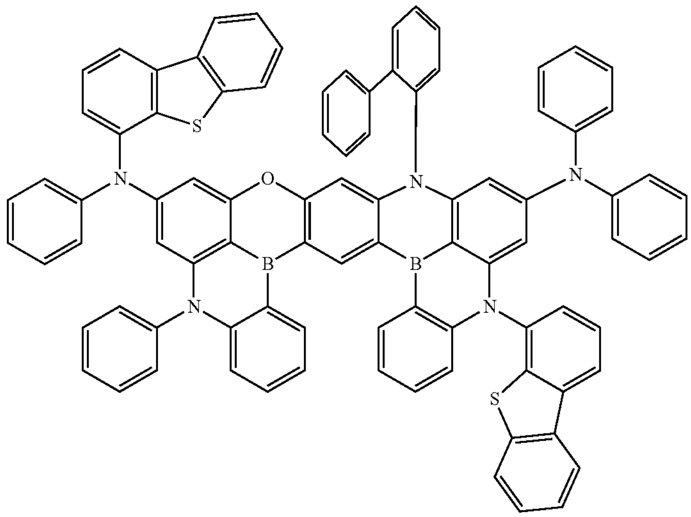
279
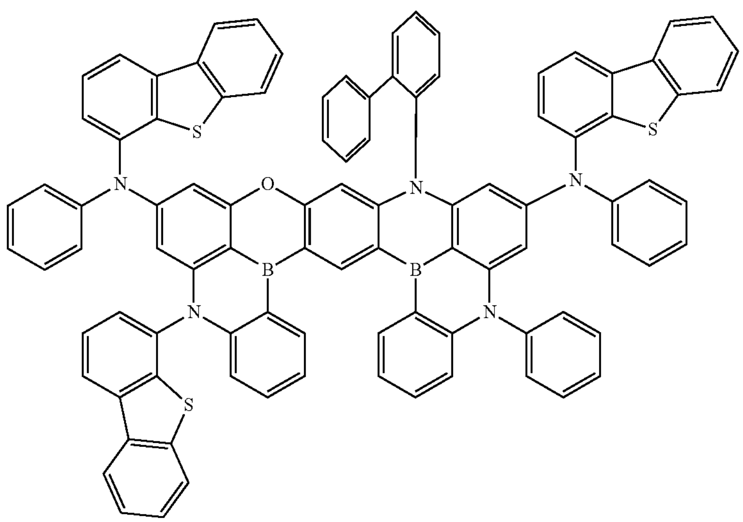
280
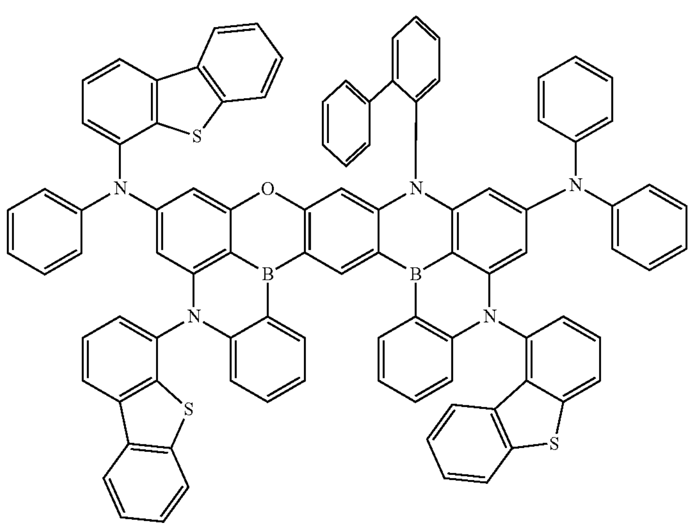

-continued
281
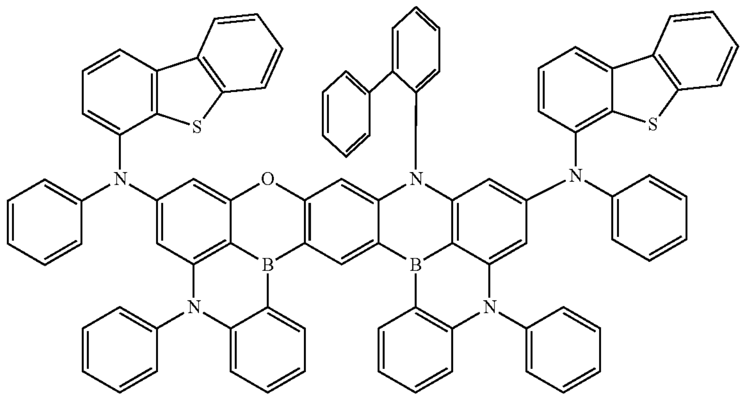
282
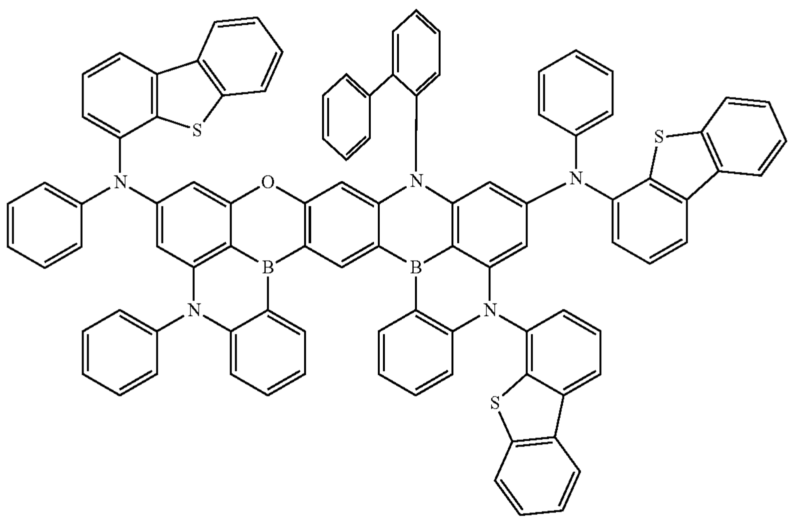
283
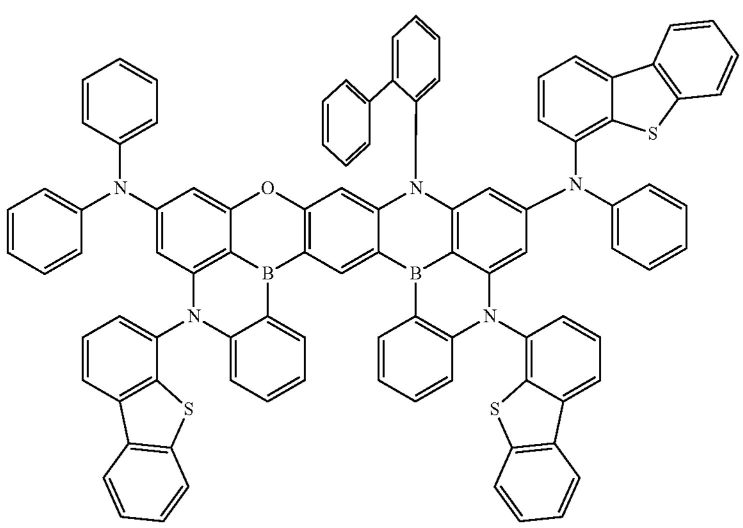

-continued
284
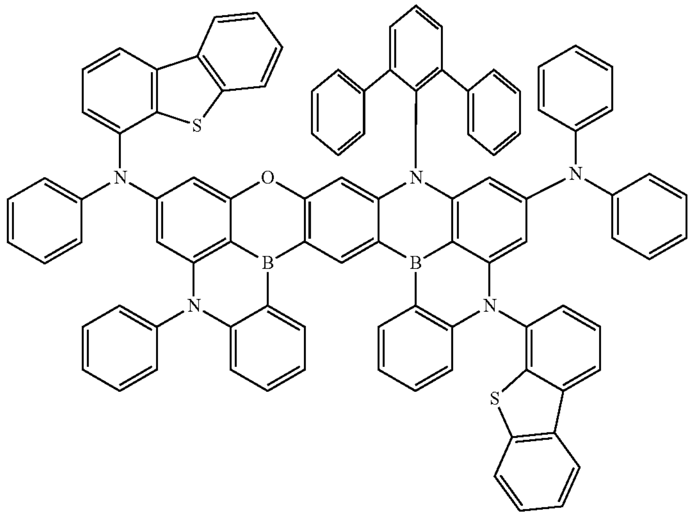
285
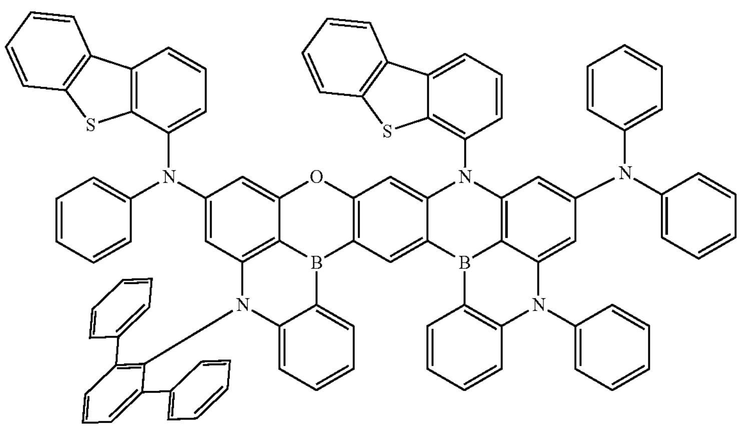
286
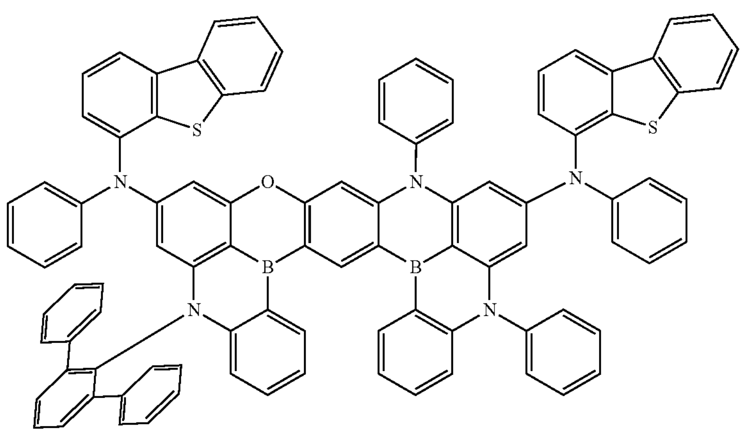

-continued
287
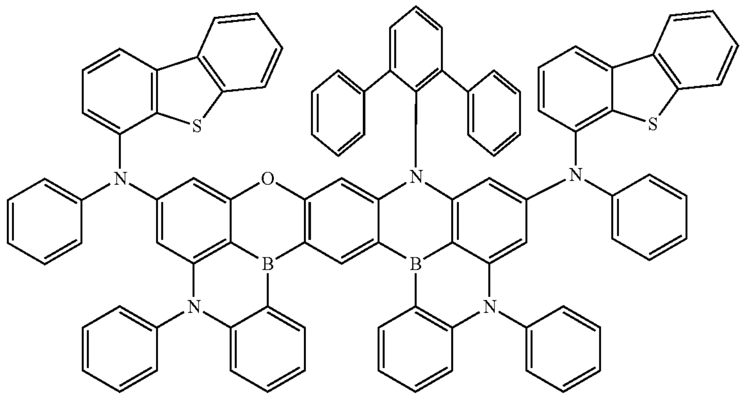
288
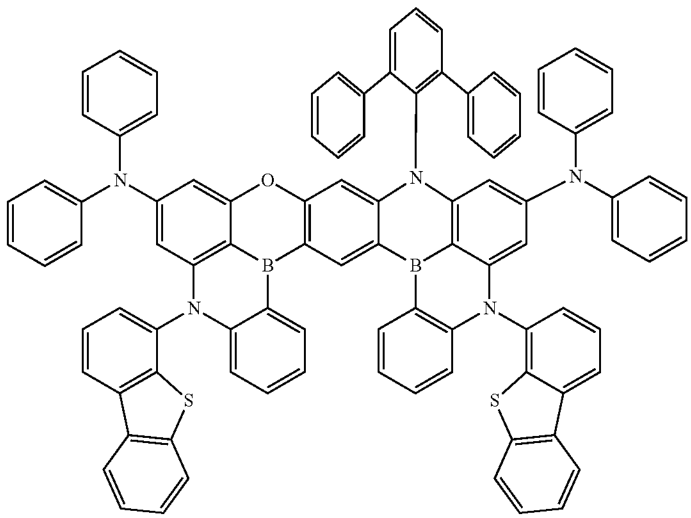
289
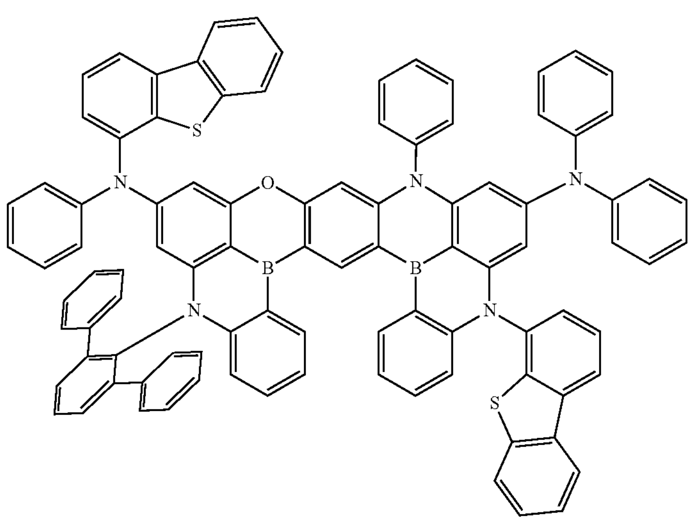

-continued
291
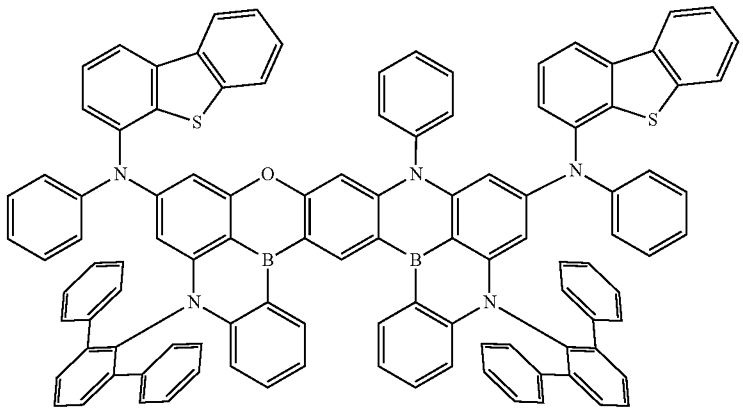
292
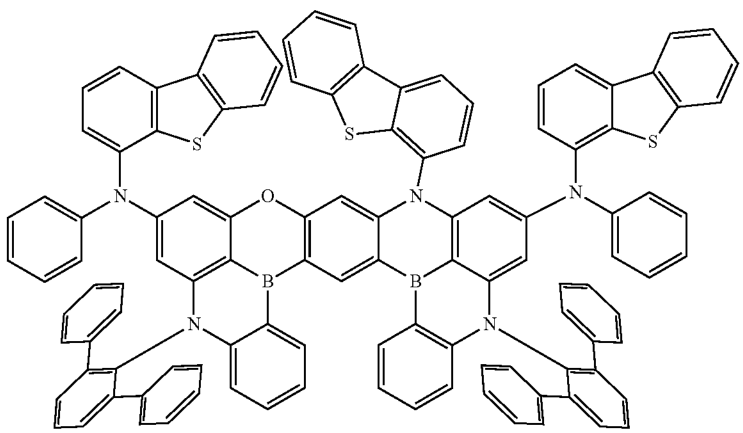
293
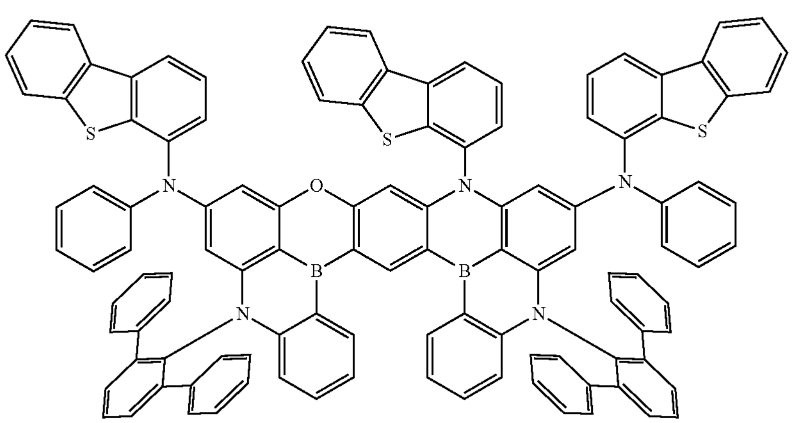

-continued
294
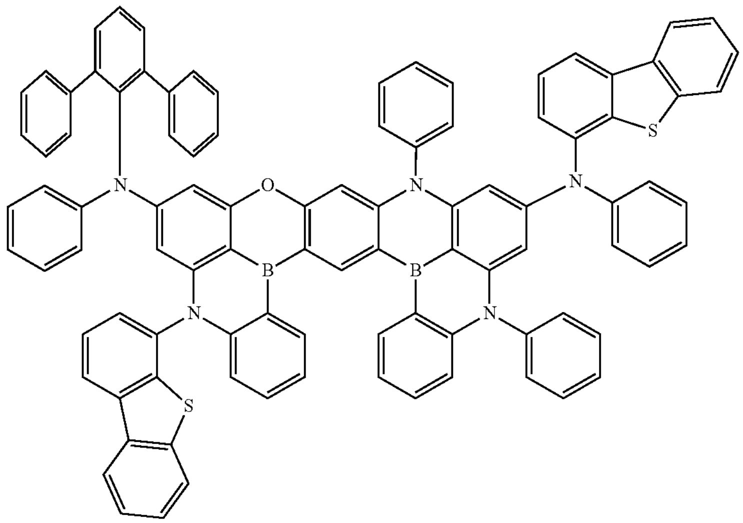
295
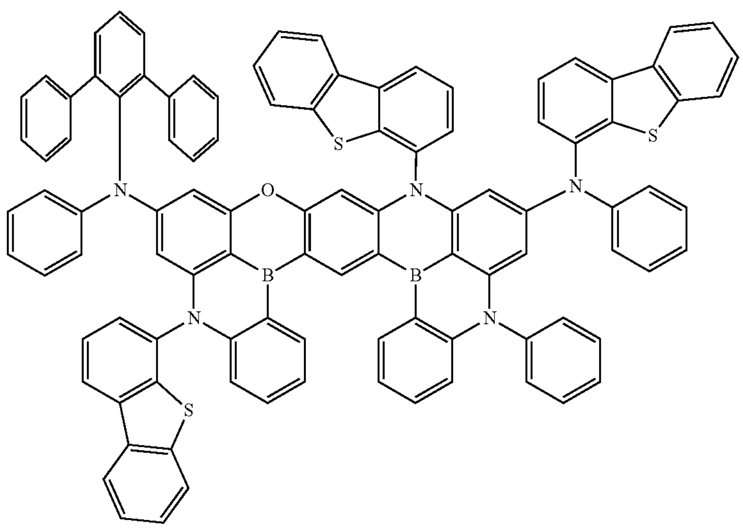
296
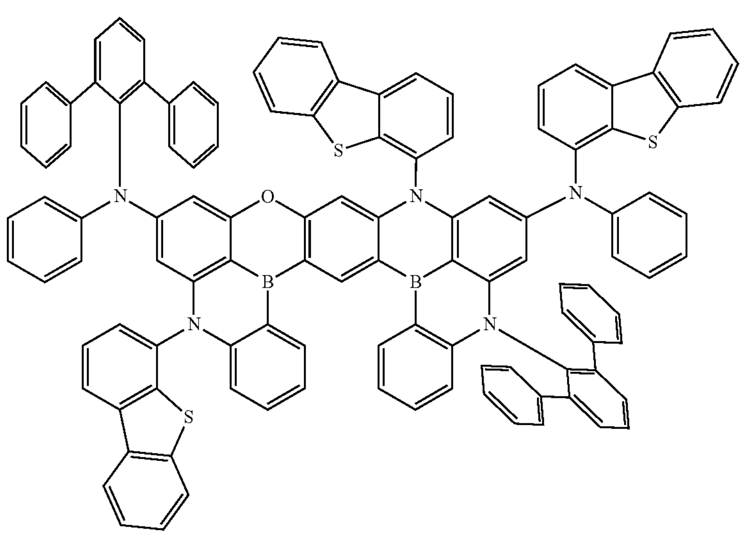

-continued
297
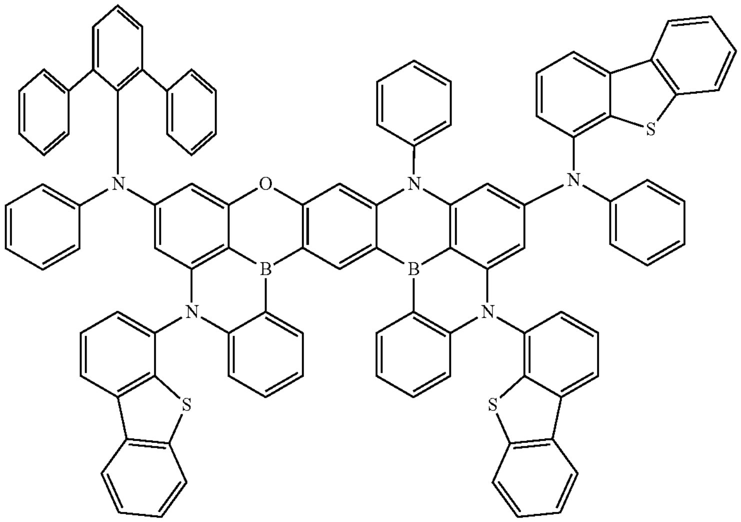
298
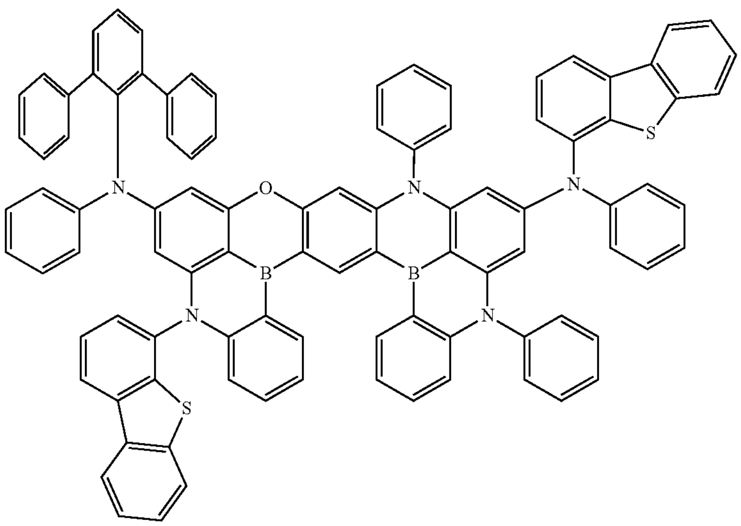
299
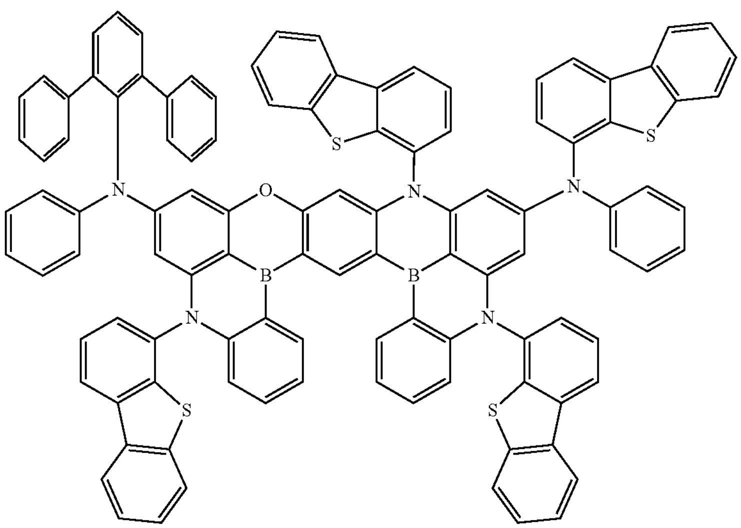

-continued
300
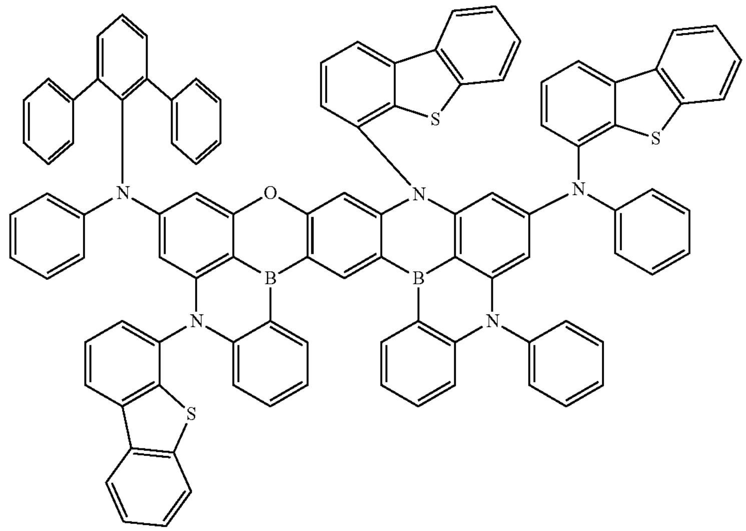
301
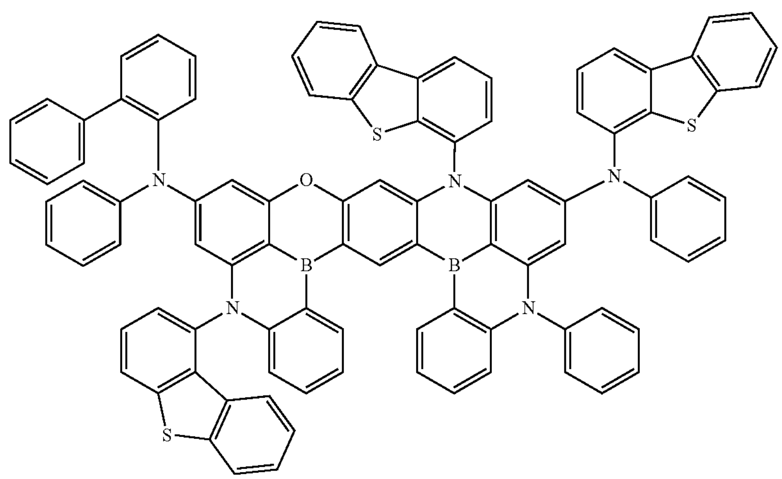
302
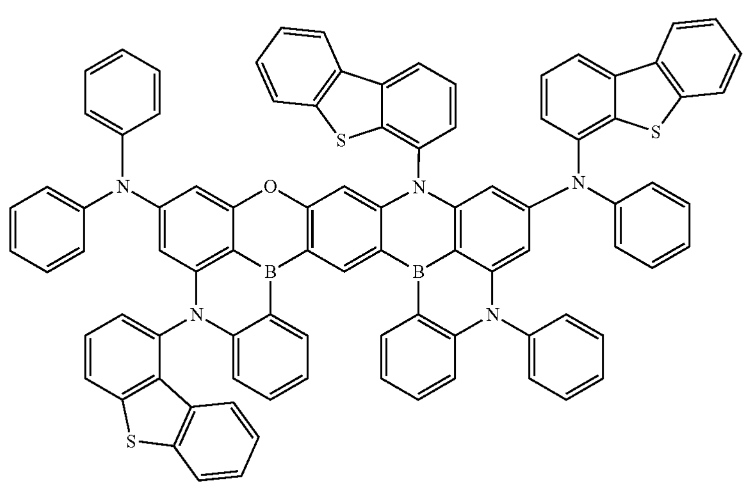

-continued
303
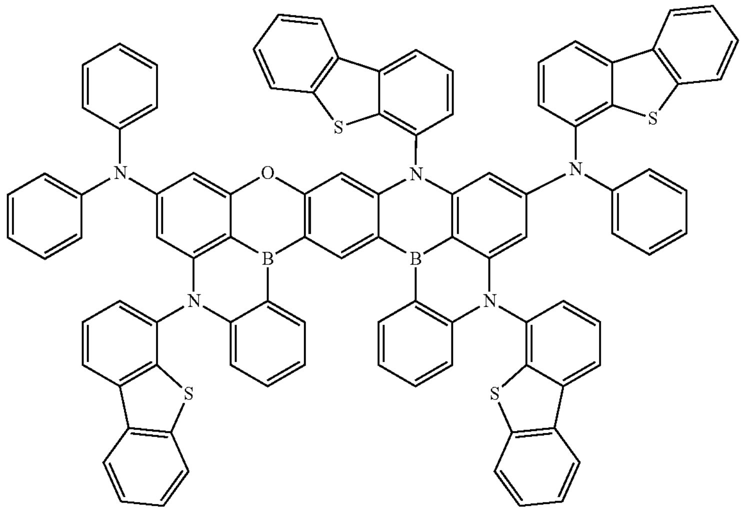
304
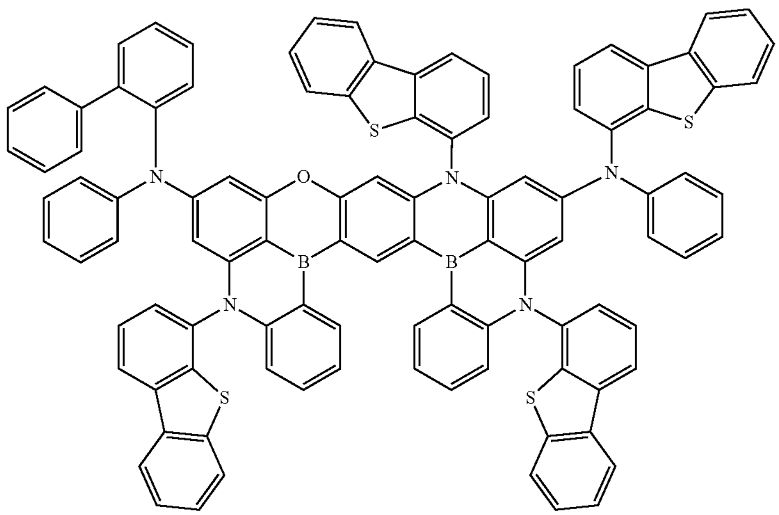
305
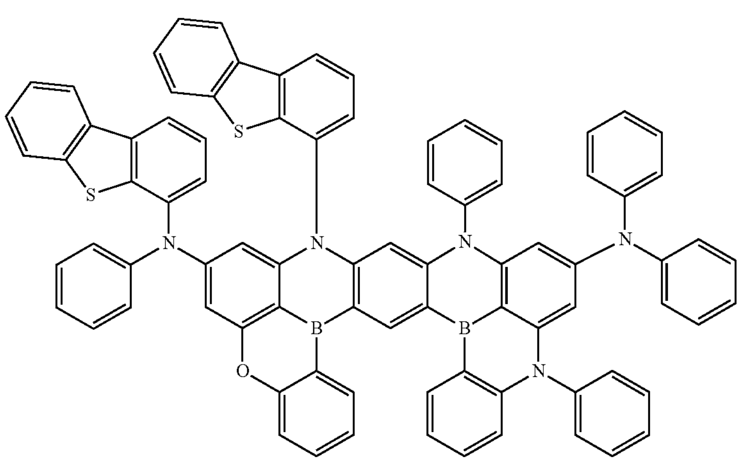

-continued
306
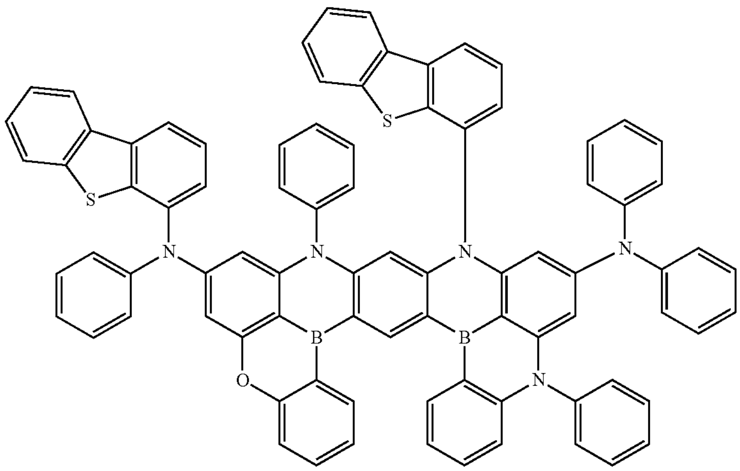
307
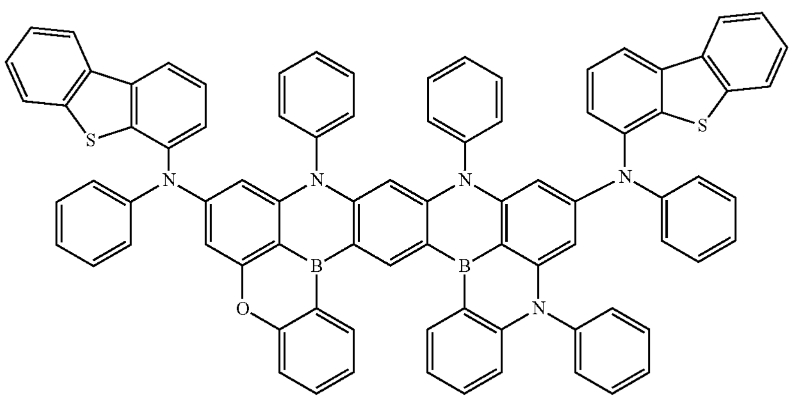
308
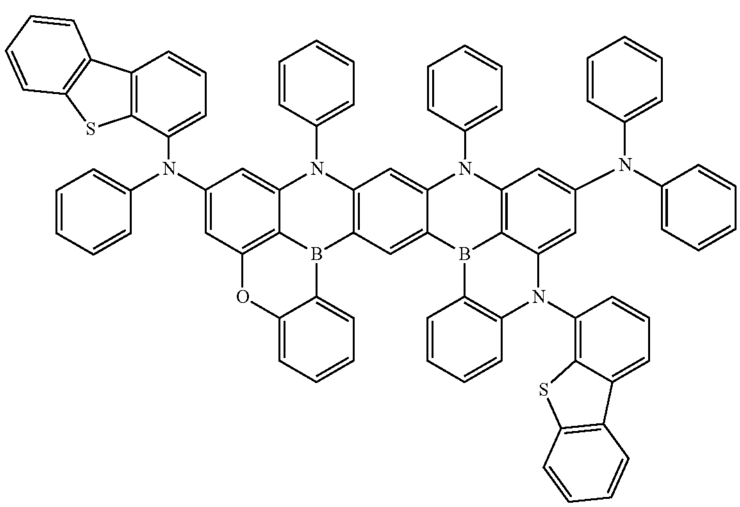

-continued
309
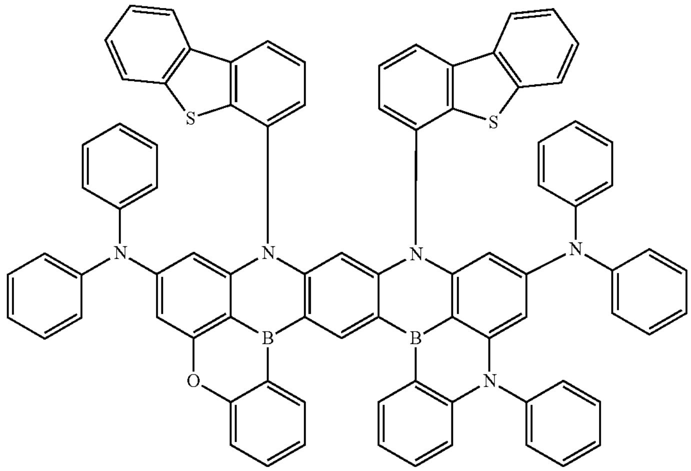
310
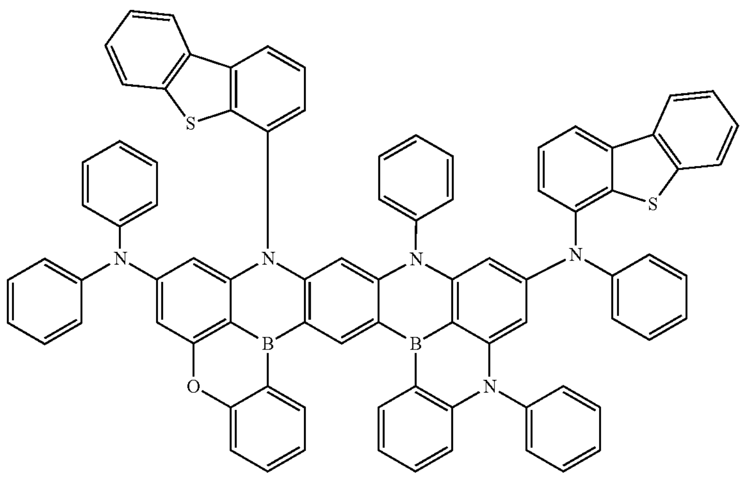
311
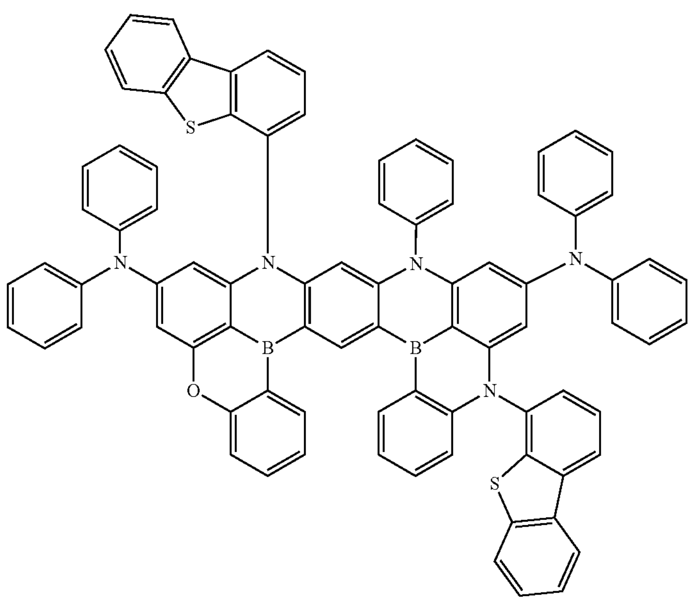

-continued
312
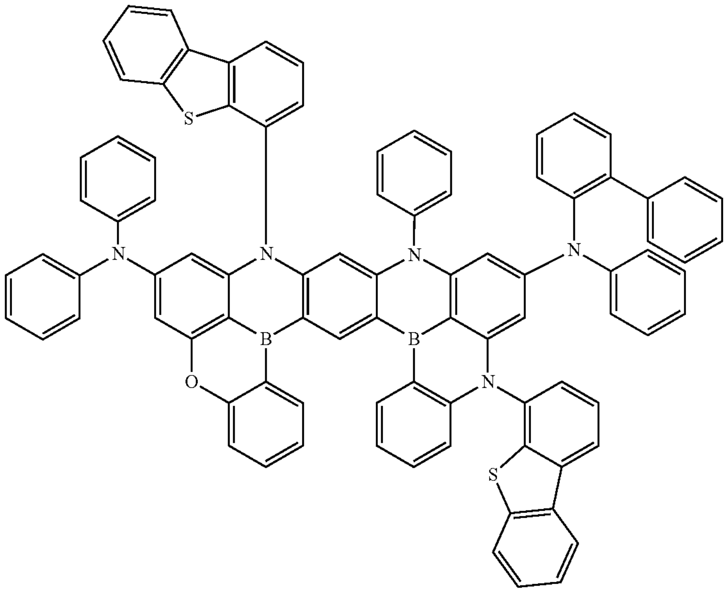
313
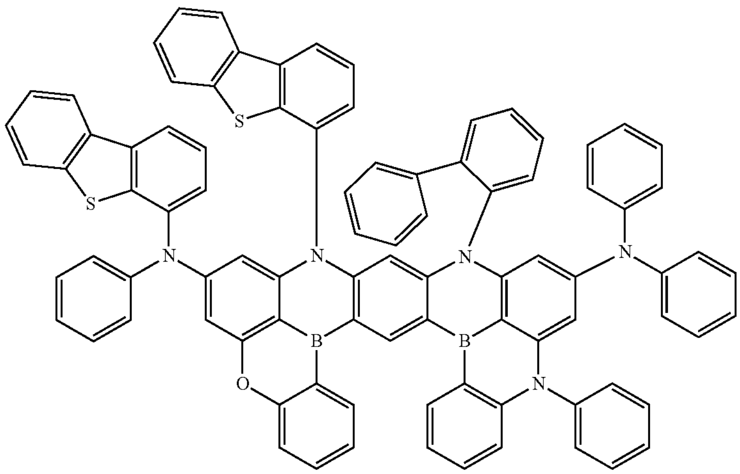
314
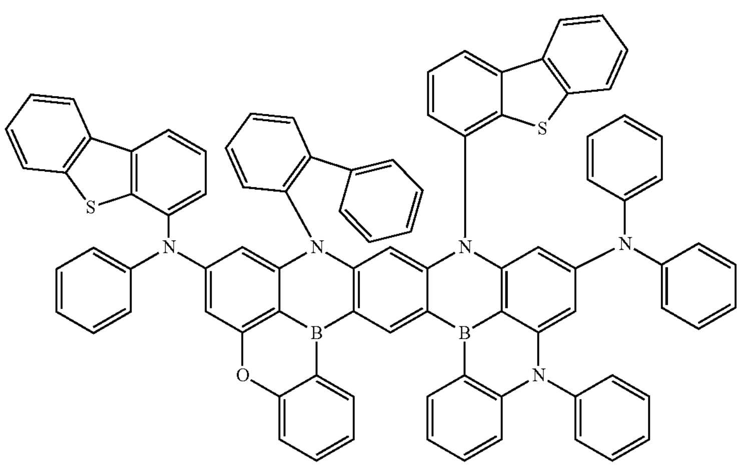

-continued
315
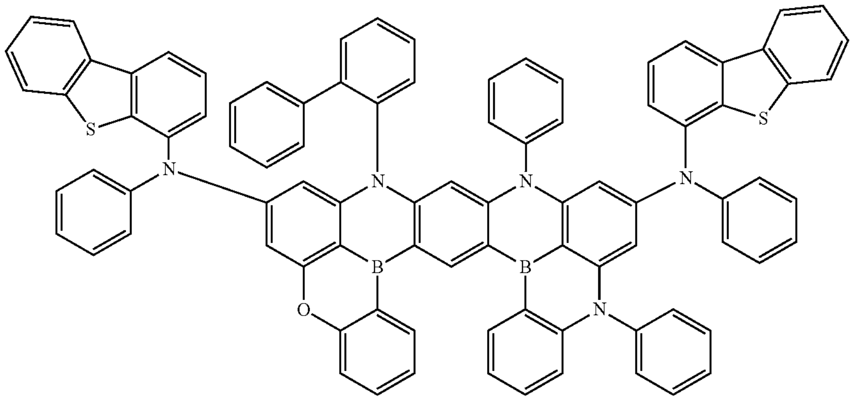
316
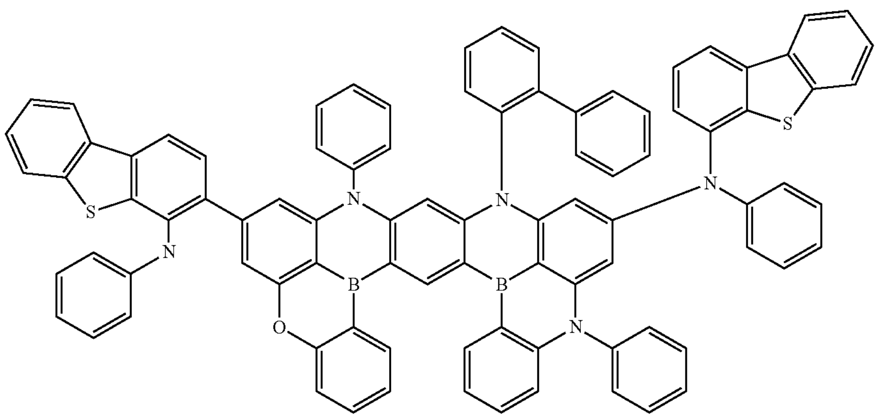
317
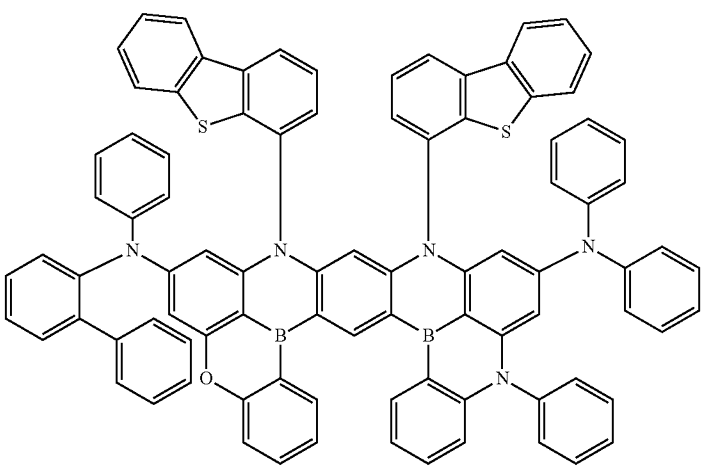

-continued
318
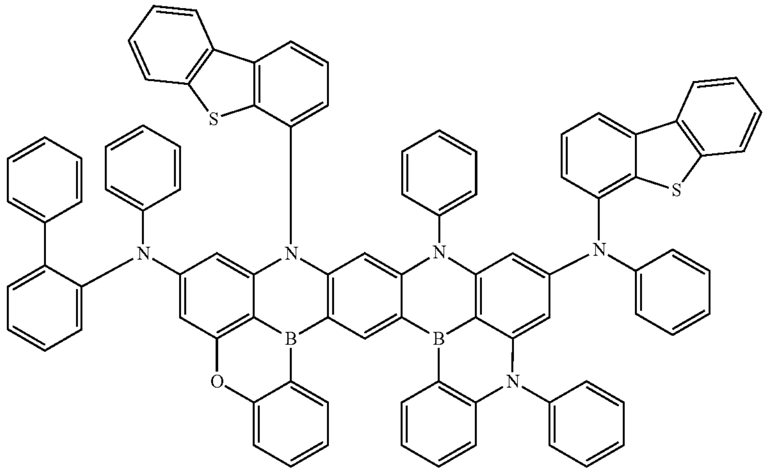
319
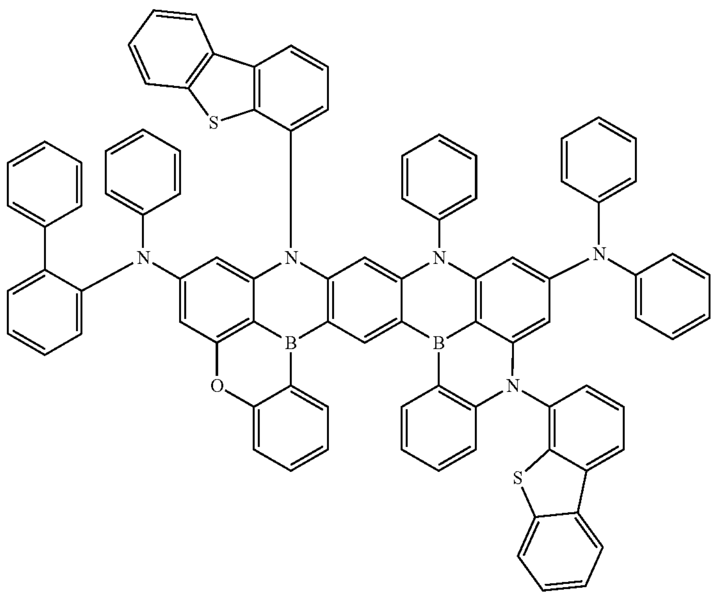
320
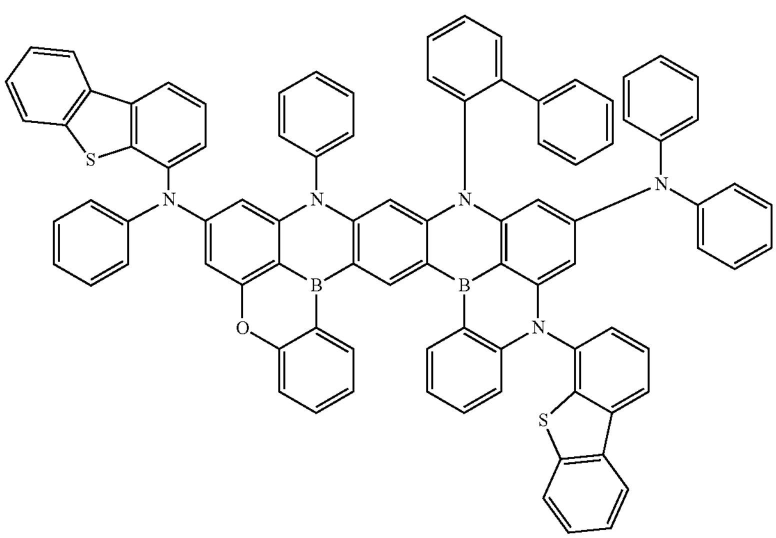

-continued
321
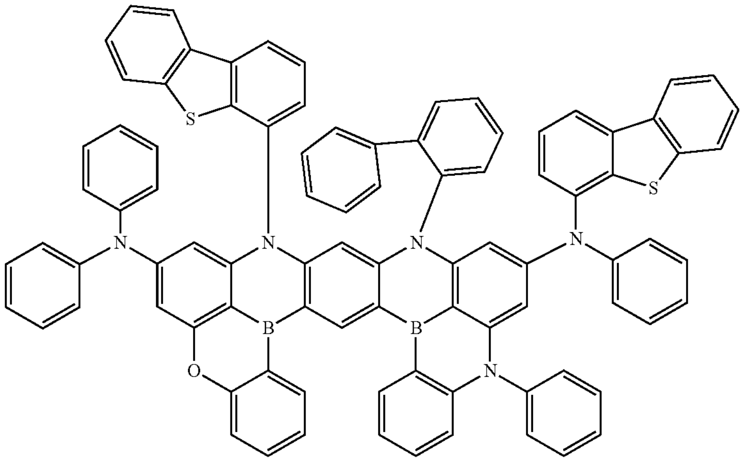
322
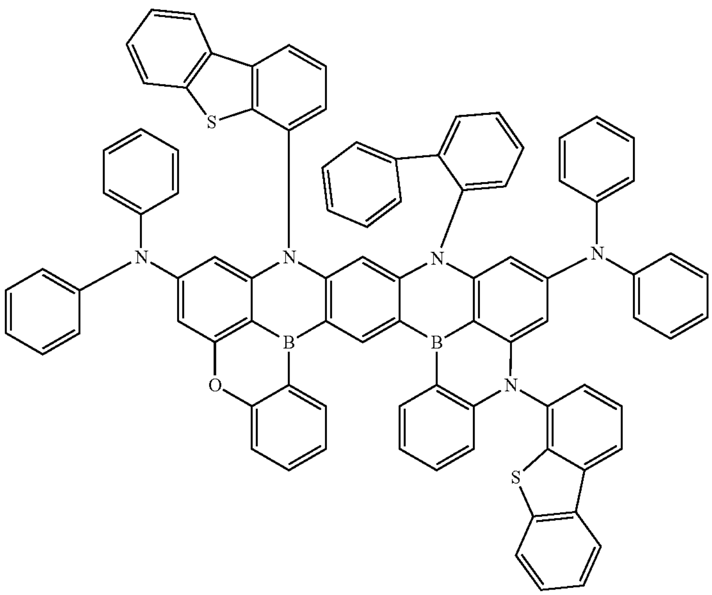
323
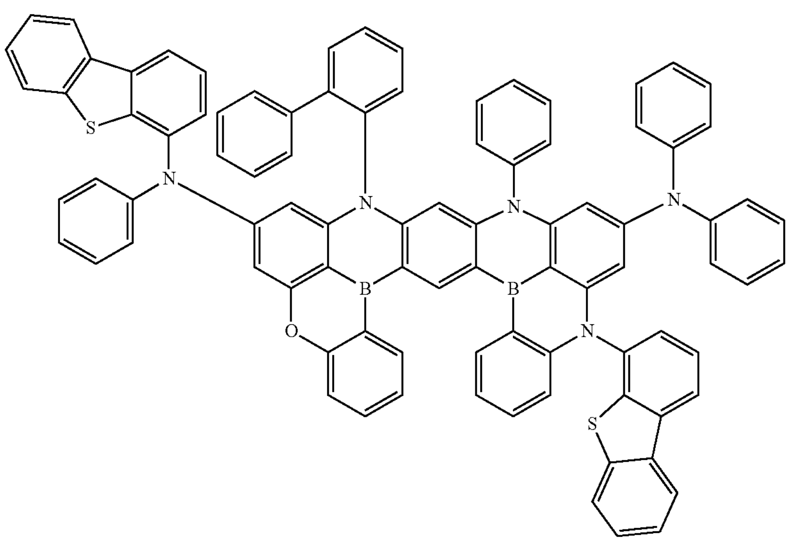

-continued
324
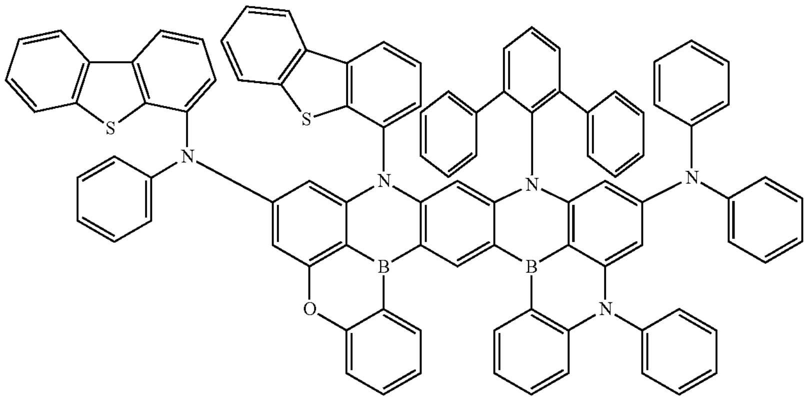
325
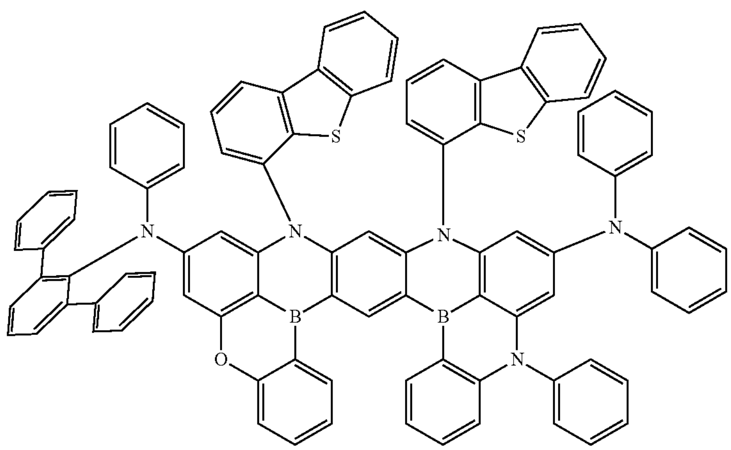
326
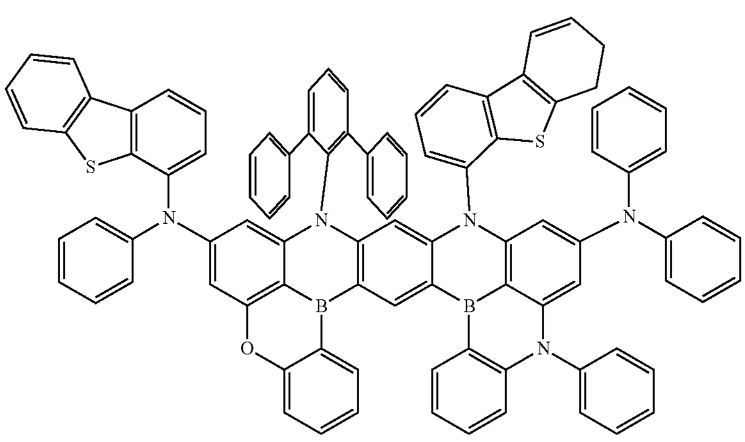

-continued
327
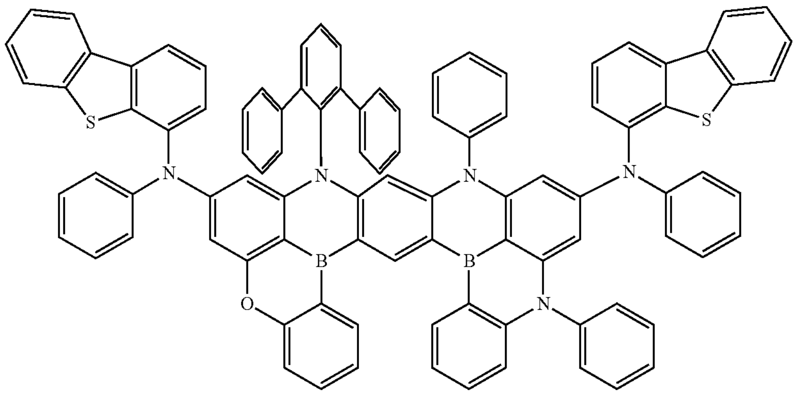
328
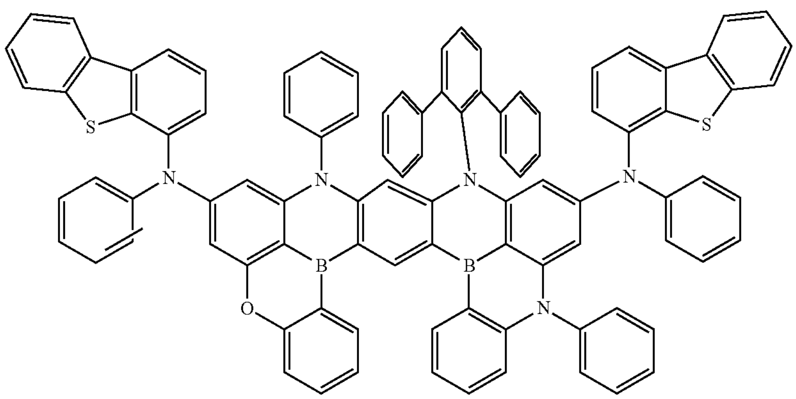
329
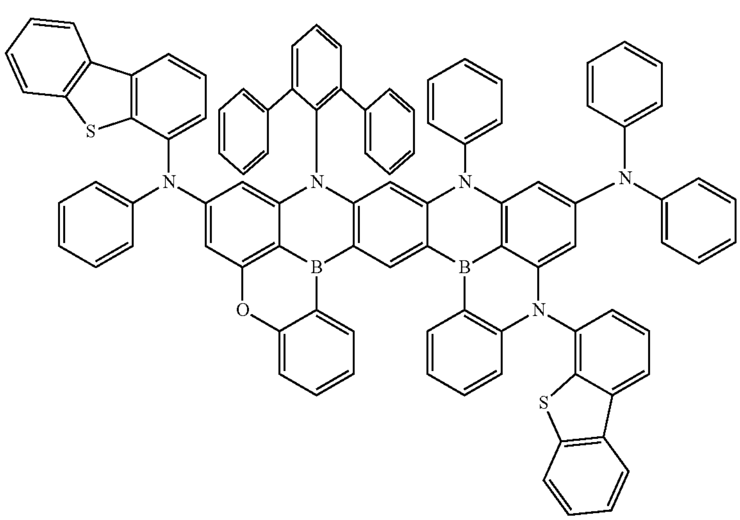

-continued
330
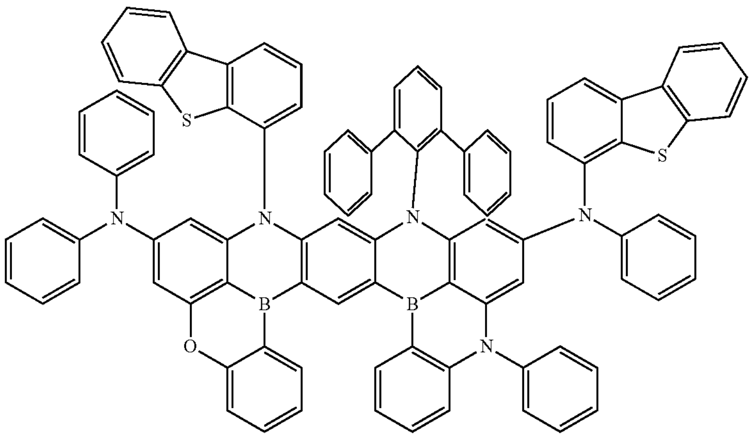
331
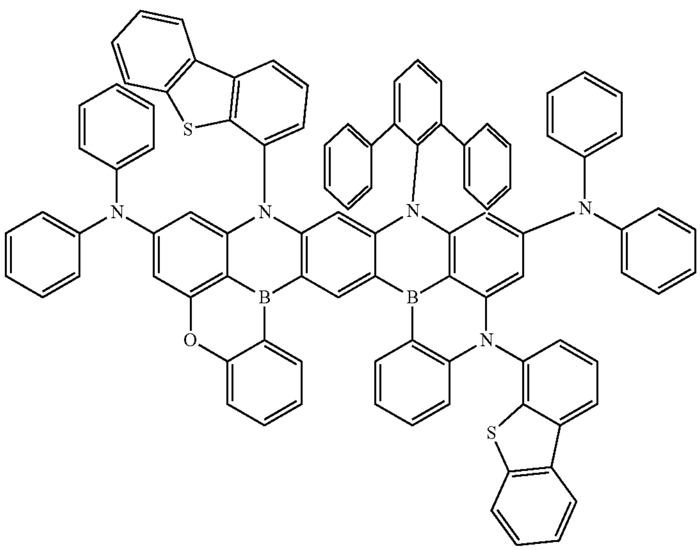
332
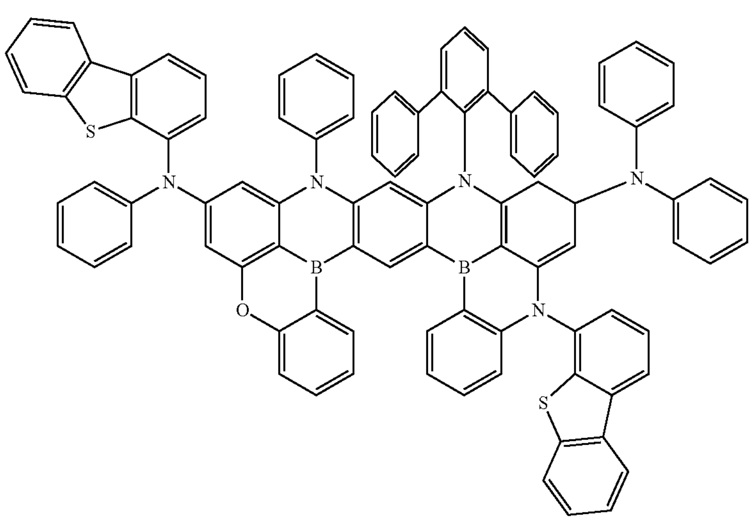

-continued
333
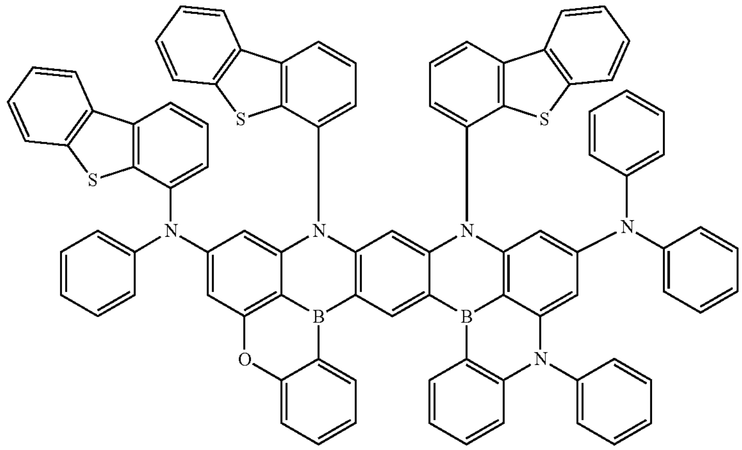
335
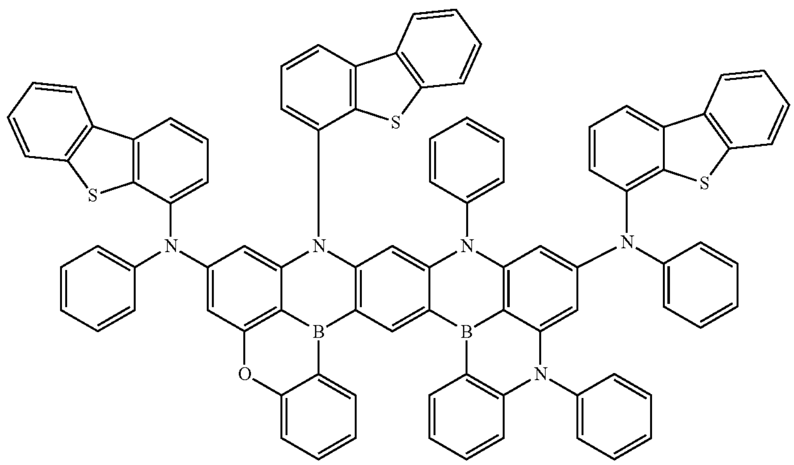
336
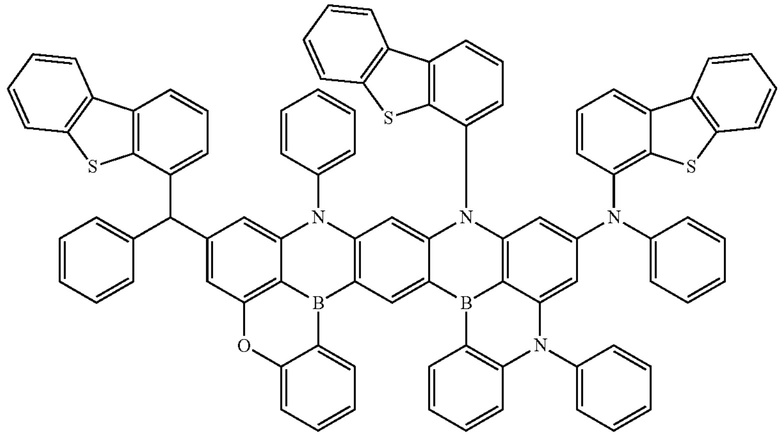

-continued
337
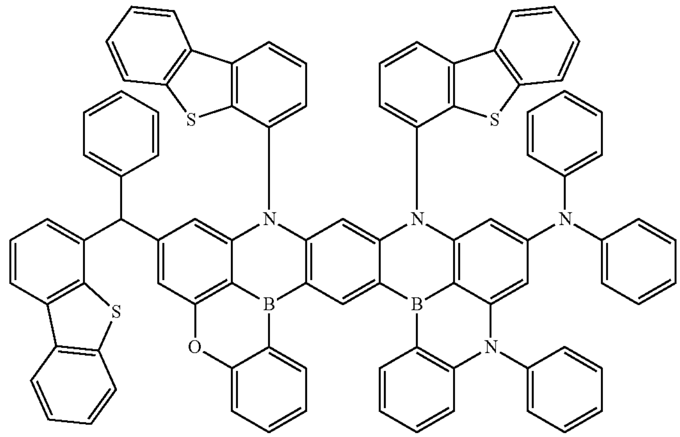
338
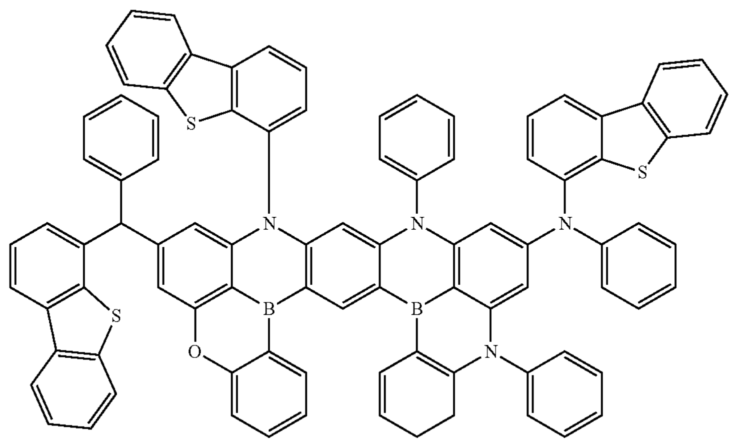
339
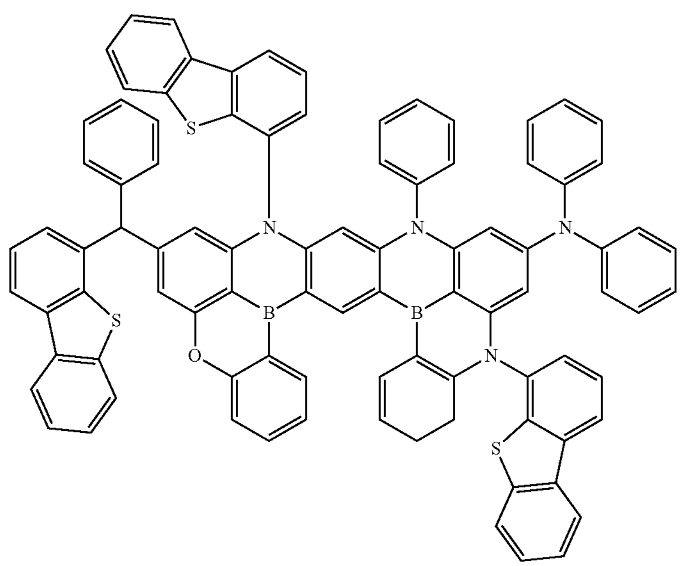

-continued
340
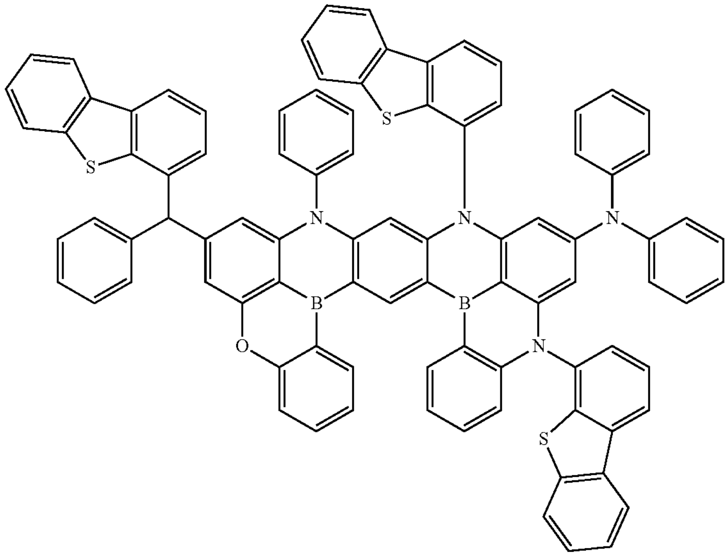
341
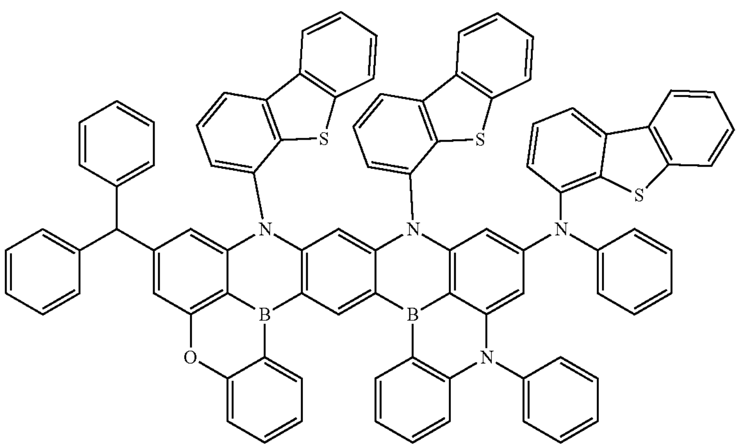
342
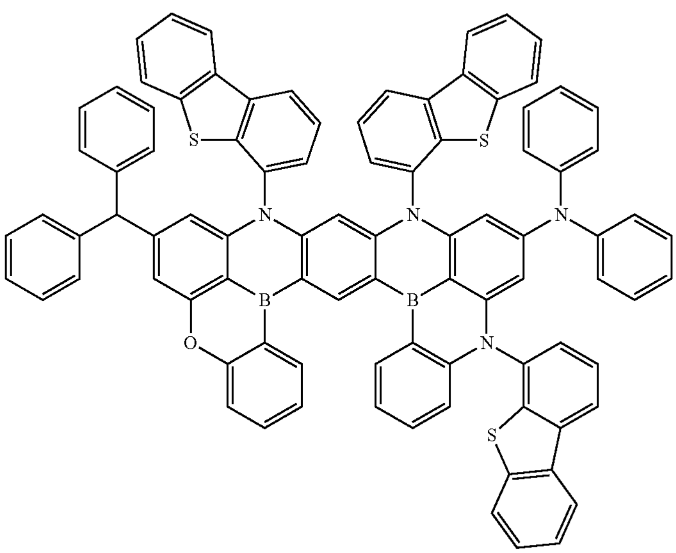

-continued
343
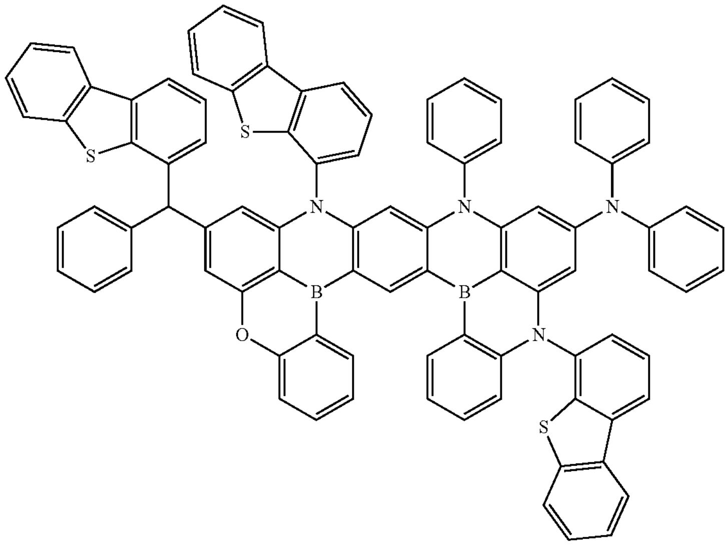
344
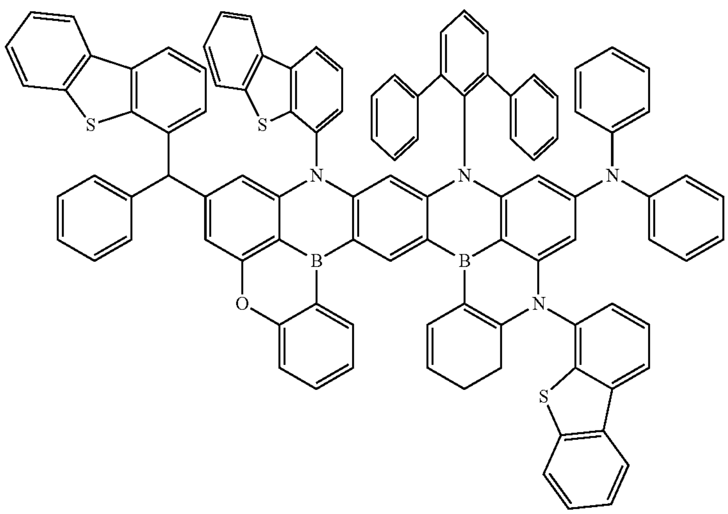
345
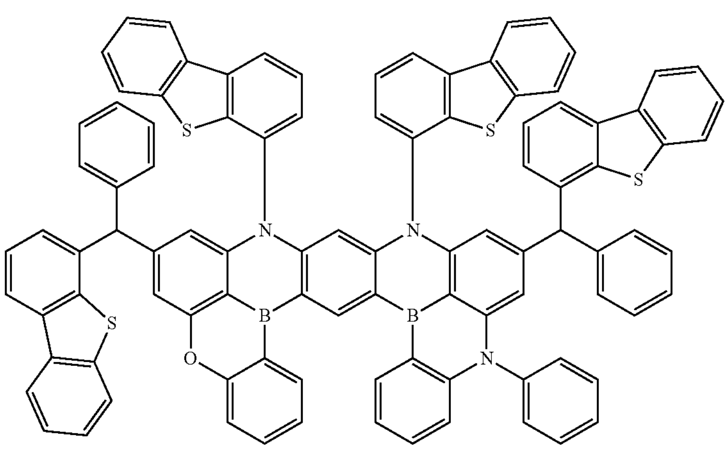

-continued
346
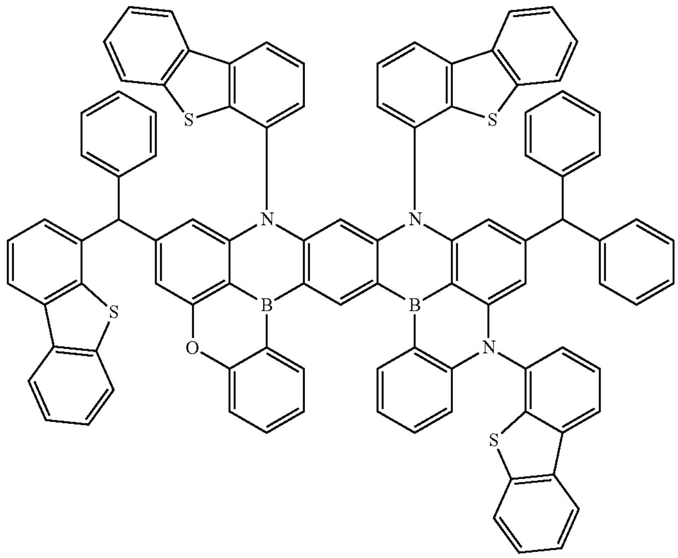
347
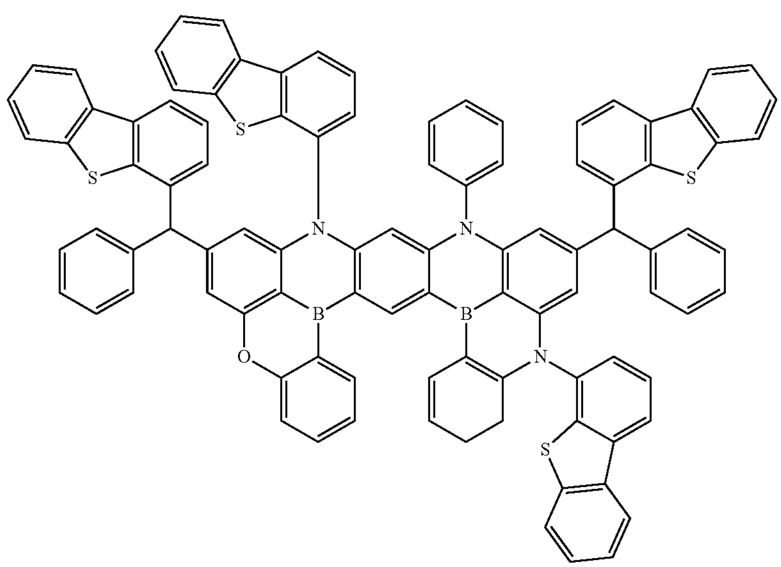

-continued
348
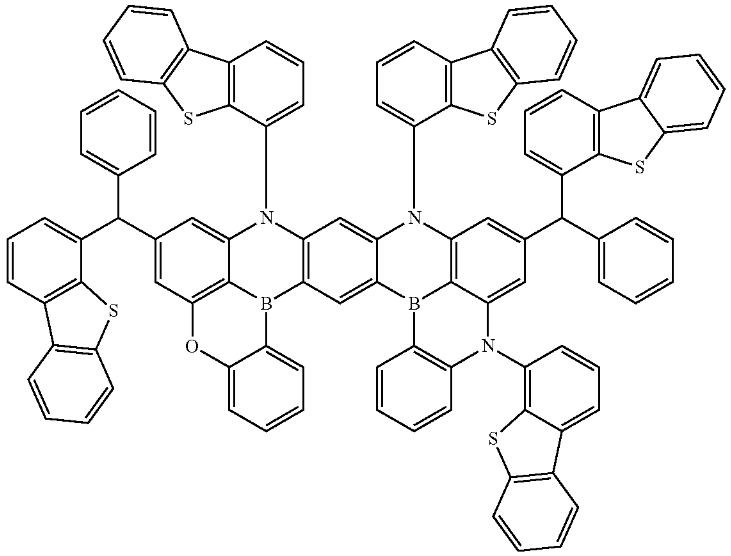
19. An electronic apparatus comprising the light-emitting device of claim 1.
20. The electronic apparatus of claim 19, wherein the electronic apparatus further comprises a color filter, a color conversion layer, a touch screen layer, a polarizing layer, or any combination thereof.
* * * * *